US009323150B2

(12) United States Patent
Hirano et al.

(10) Patent No.: US 9,323,150 B2
(45) Date of Patent: Apr. 26, 2016

(54) ACTINIC-RAY- OR RADIATION-SENSITIVE RESIN COMPOSITION, ACTINIC-RAY- OR RADIATION-SENSITIVE FILM THEREFROM AND METHOD OF FORMING PATTERN

(71) Applicant: FUJIFILM Corporation, Minato-Ku, Tokyo (JP)

(72) Inventors: Shuji Hirano, Shizuoka (JP); Hiroo Takizawa, Shizuoka (JP); Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/229,210

(22) Filed: Mar. 28, 2014

(65) Prior Publication Data

US 2014/0227636 A1 Aug. 14, 2014

Related U.S. Application Data

(63) Continuation of application No. PCT/JP2012/075867, filed on Sep. 28, 2012.

(60) Provisional application No. 61/548,032, filed on Oct. 17, 2011.

(30) Foreign Application Priority Data

Sep. 30, 2011 (JP) ................................ 2011-217048

(51) Int. Cl.

| | |
|---|---|
| ***G03F 7/004*** | (2006.01) |
| ***G03F 7/038*** | (2006.01) |
| ***C08F 212/08*** | (2006.01) |
| ***C08F 12/08*** | (2006.01) |
| ***C08F 220/28*** | (2006.01) |
| ***G03F 7/039*** | (2006.01) |
| ***G03F 7/075*** | (2006.01) |
| ***G03F 7/11*** | (2006.01) |
| ***G03F 7/20*** | (2006.01) |

(52) U.S. Cl.

CPC .............. *G03F 7/0388* (2013.01); *C08F 12/08* (2013.01); *C08F 212/08* (2013.01); *C08F 220/28* (2013.01); *G03F 7/0045* (2013.01); *G03F 7/0046* (2013.01); *G03F 7/0392* (2013.01); *G03F 7/0397* (2013.01); *G03F 7/0758* (2013.01); *G03F 7/11* (2013.01); *G03F 7/2041* (2013.01)

(58) Field of Classification Search

CPC ..... G03F 7/004; G03F 7/0045; G03F 7/0046; G03F 7/0388; G03F 7/0392; G03F 7/397; G03F 7/11; G03F 7/2041; C08F 212/08; C08F 12/08; C08F 236/10

USPC .............. 430/270.1, 913, 311, 322, 325, 329; 526/243, 242, 251

See application file for complete search history.

(56) References Cited

U.S. PATENT DOCUMENTS

| | | | | |
|---|---|---|---|---|
| 5,314,931 | A * | 5/1994 | Yamada et al. | 522/127 |
| 8,039,199 | B2 | 10/2011 | Abe | |
| 8,313,886 | B2 | 11/2012 | Harada et al. | |
| 8,642,244 | B2 | 2/2014 | Shiono et al. | |
| 8,822,561 | B2 * | 9/2014 | Ito et al. | 522/112 |
| 2010/0152400 | A1 * | 6/2010 | Iizuka et al. | 526/268 |
| 2010/0233617 | A1 | 9/2010 | Wada | |
| 2010/0248144 | A1 * | 9/2010 | Iwai et al. | 430/285.1 |
| 2011/0091809 | A1 * | 4/2011 | Saegusa et al. | 430/270.1 |

(Continued)

FOREIGN PATENT DOCUMENTS

| | | | |
|---|---|---|---|
| JP | 2008090261 | A * | 4/2008 |
| JP | 2009-093137 | A | 4/2009 |

(Continued)

OTHER PUBLICATIONS

English Translation of IPRP issued in PCT/JP2012/075867 dated Apr. 10, 2014.

(Continued)

*Primary Examiner* — Amanda C Walke

(74) *Attorney, Agent, or Firm* — Sughrue Mion, PLLC

(57) ABSTRACT

Provided is an actinic-ray- or radiation-sensitive resin composition including a resin (Aa) containing at least one repeating unit (Aa1) derived from monomers of general formula (aa1-1) below and at least one repeating unit (Aa2) derived from monomers of general formula (aa2-1) below and comprising a resin (Ab) that when acted on by an acid, changes its alkali solubility.

(aa1-1)

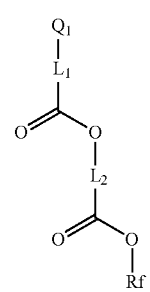

(aa2-1)

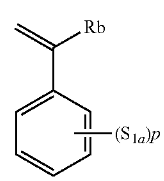

22 Claims, No Drawings

(56) References Cited

U.S. PATENT DOCUMENTS

| | | | | |
|---|---|---|---|---|
| 2011/0189607 | A1* | 8/2011 | Ohashi et al. | 430/270.1 |
| 2011/0200940 | A1* | 8/2011 | Ichikawa et al. | 430/281.1 |
| 2011/0200941 | A1* | 8/2011 | Masunaga et al. | 430/285.1 |
| 2011/0236826 | A1* | 9/2011 | Hatakeyama et al. | 430/270.1 |
| 2011/0244392 | A1* | 10/2011 | Hirano et al. | 430/270.1 |
| 2011/0250539 | A1* | 10/2011 | Sagehashi et al. | 430/270.1 |
| 2011/0318542 | A1 | 12/2011 | Mori et al. | |
| 2012/0009529 | A1* | 1/2012 | Hatakeyama | 430/325 |
| 2012/0034564 | A1* | 2/2012 | Fukuhara et al. | 430/285.1 |
| 2012/0052443 | A1* | 3/2012 | Masuyama et al. | 430/281.1 |
| 2012/0070778 | A1* | 3/2012 | Ichikawa et al. | 430/270.1 |
| 2012/0077126 | A1* | 3/2012 | Mori et al. | 430/285.1 |
| 2012/0100482 | A1* | 4/2012 | Masuyama et al. | 430/285.1 |
| 2012/0100483 | A1* | 4/2012 | Masuyama et al. | 430/285.1 |
| 2012/0156617 | A1* | 6/2012 | Kataoka et al. | 430/283.1 |
| 2013/0130178 | A1* | 5/2013 | Iizuka et al. | 430/285.1 |
| 2013/0189621 | A1* | 7/2013 | Nakashima et al. | 430/270.1 |
| 2013/0337378 | A1* | 12/2013 | Ohashi et al. | 430/270.1 |
| 2014/0030643 | A1* | 1/2014 | Takahashi et al. | 430/18 |
| 2014/0051024 | A1* | 2/2014 | Kinsho et al. | 430/270.1 |
| 2014/0080055 | A1* | 3/2014 | Hatakeyama et al. | 430/270.1 |
| 2014/0162180 | A1* | 6/2014 | Jin et al. | 430/108.1 |

FOREIGN PATENT DOCUMENTS

| | | | |
|---|---|---|---|
| JP | 2009-288771 | A | 12/2009 |
| JP | 2010-032994 | A | 2/2010 |
| JP | 2010-150367 | A | 7/2010 |
| JP | 2010-250105 | A | 11/2010 |
| JP | 2010-266857 | A | 11/2010 |
| KR | 10-2010-0114476 | A | 10/2010 |
| TW | 201042383 | A1 | 12/2010 |

OTHER PUBLICATIONS

Japanese Office Action, issue in application No. 2012-212962 dated Nov. 4, 2014.

Chinese Office Action dated Dec. 28, 2015 issued in corresponding application No. 101135966.

Korean Office Action issued in corresponding application No. 7011645 dated Feb. 1, 2016.

* cited by examiner

ACTINIC-RAY- OR RADIATION-SENSITIVE RESIN COMPOSITION, ACTINIC-RAY- OR RADIATION-SENSITIVE FILM THEREFROM AND METHOD OF FORMING PATTERN

CROSS-REFERENCE TO RELATED APPLICATIONS

This application is a Continuation Application of PCT Application No. PCT/JP2012/075867, filed Sep. 28, 2012 and based upon and claims the benefit of priority from prior Japanese Patent Application No. 2011-217048, filed Sep. 30, 2011; and U.S. Provisional Application No. 61/548,032, filed Oct. 17, 2011, the entire contents of all of which are incorporated herein by reference.

BACKGROUND OF THE INVENTION

1. Field of the Invention

The present invention relates to an actinic-ray- or radiation-sensitive resin composition, an actinic-ray- or radiation-sensitive film therefrom and a method of forming a pattern. More particularly, the present invention relates to an actinic-ray- or radiation-sensitive resin composition that is suitable for use in an ultramicrolithography process applicable to a process for manufacturing a super-LSI or a high-capacity microchip, a process for fabricating a nanoimprint mold, a process for producing a high-density information recording medium, etc., and other photofabrication processes, and relates to an actinic-ray- or radiation-sensitive film therefrom and a method of forming a pattern.

2. Description of the Related Art

Heretofore, the microfabrication by lithography using a photoresist composition is performed in the process for manufacturing semiconductor devices, such as an IC and an LSI. In recent years, the formation of an ultrafine pattern in the submicron region or quarter-micron region is increasingly required in accordance with the realization of high integration for integrated circuits. Accordingly, the trend of exposure wavelength toward a short wavelength, for example, from g-rays to i-rays and further to a KrF excimer laser light is seen. To now, an exposure equipment using an ArF excimer laser of 193 nm wavelength as a light source has been developed. Further, a method, known as a liquid-immersion method, in which the space between a projector lens and a sample is filled with a liquid of high refractive index (hereinafter also referred to as an "immersion liquid") has progressed as a technology for enhancing the resolving power (see, for example, patent references 1 and 2). Still further, the development of lithography using electron beams, X-rays, EUV light or the like, besides the excimer laser light, is now being promoted.

Especially, the electron beam lithography is positioned as the next-generation or next-next-generation pattern forming technology. Resists of high sensitivity and high resolution are required for the lithography. Specifically, increasing the sensitivity is a very important task to be attained for the shortening of wafer processing time. However, the pursuit of increasing the sensitivity with respect to the resists for electron beams is likely to invite not only the lowering of resolving power but also the deterioration of line edge roughness. Thus, there is a strong demand for the development of resists that simultaneously satisfy these properties. Herein, the line edge roughness refers to the phenomenon that the edge at an interface of resist pattern and substrate is irregularly varied in the direction perpendicular to the line direction due to the characteristics of the resist, so that when the pattern is viewed from above, the pattern edge is observed uneven. This unevenness is transferred in the etching operation using the resist as a mask to thereby cause poor electrical properties resulting in poor yield. Especially in the ultrafine region of 0.25 μm or less, the line edge roughness is now an extremely important theme in which improvement is to be attained. High sensitivity is in a relationship of trade-off with favorable line edge roughness. How to simultaneously satisfy these is a critical issue.

It is now required to attain a decrease of film thickness in order to cope with the above-mentioned demand in recent years for the formation of an ultrafine pattern in the submicron region or quarter-micron region in accordance with the realization of high integration for integrated circuits. However, a deterioration of dry etching resistance attributed to the decrease of film thickness now becomes a problem. The current situation is that no full satisfaction is attained in this respect.

With respect to development defects as well, suppression thereof is demanded. How to simultaneously satisfy characteristics, such as high sensitivity, high resolution, favorable line edge roughness and favorable dry etching resistance, and suppression of development defects is a very important task.

The electron beam lithography utilized as a nanofabrication technology is now indispensable as a method of fabricating a photomask blank used in the production of a photomask for semiconductor manufacturing.

PRIOR ART LITERATURE

Patent Reference

[Patent reference 1] Jpn. Pat. Appln. KOKAI Publication No. (hereinafter referred to as JP-A-) 2010-250105, and

[Patent reference 2] JP-A-2010-32994.

BRIEF SUMMARY OF THE INVENTION

It is an object of the present invention to provide an actinic-ray- or radiation-sensitive resin composition that can simultaneously satisfy high sensitivity, favorable roughness performance, favorable pattern shape, favorable dry etching resistance and reduction of development defects. It is another object of the present invention to provide an actinic-ray- or radiation-sensitive film from the composition. It is a further object of the present invention to provide a method of forming a pattern.

The present invention is, for example, as defined below.

[1] An actinic-ray- or radiation-sensitive resin composition comprising a resin (Aa) containing at least one repeating unit (Aa1) derived from monomers of general formula (aa1-1) below and at least one repeating unit (Aa2) derived from monomers of general formula (aa2-1) below and comprising a resin (Ab) that when acted on by an acid, changes its alkali solubility, (aa1-1)

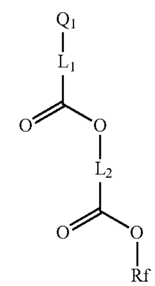

-continued (aa2-1)

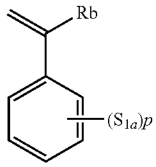

in general formula (aa1-1), $Q_1$ represents an organic group containing a polymerizable group, each of $L_1$ and $L_2$ independently represents a single bond or a bivalent connecting group, and Rf represents an organic group containing a fluorine atom, and in general formula (aa2-1), Rb represents a hydrogen atom, an optionally substituted alkyl group, or a halogen atom, $S_{1a}$, when two or more $S_{1a}$s exist, each independently, represents a substituent, and p is an integer of 0 to 5.

[2] The composition according to item [1], wherein the resin (Aa) contains at least one of repeating units of general formulae (aa1-2-1) and (aa1-3-1) below as the repeating unit (Aa1) derived from monomers of general formula (aa1-1) above, (aa1-2-1)

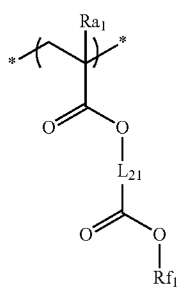

(aa1-3-1)

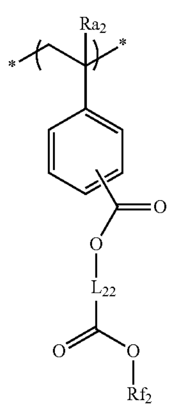

in general formulae (aa1-2-1) and (aa1-3-1), each of $Ra_1$ and $Ra_2$ independently represents a hydrogen atom or an alkyl group, each of $L_{21}$ and $L_{22}$ independently represents a single bond or a bivalent connecting group, and each of $Rf_1$ and $Rf_2$ independently represents an organic group containing a fluorine atom.

[3] The composition according to item [1] or [2], wherein the resin (Aa) contains at least one of repeating units of general formulae (aa1-2-2) and (aa1-3-2) below as the repeating unit (Aa1) derived from monomers of general formula (aa1-1) above, (aa1-2-2)

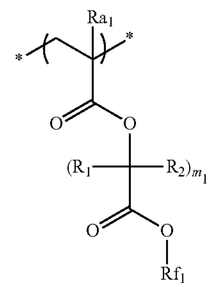

(aa1-3-2)

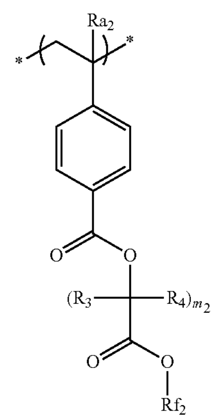

in general formulae (aa1-2-2) and (aa1-3-2), each of $Ra_1$ and $Ra_2$ independently represents a hydrogen atom or an alkyl group, each of $R_1$, $R_2$, $R_3$ and $R_4$ independently represents a hydrogen atom or an alkyl group, each of $m_1$ and $m_2$ independently is an integer of 0 to 5, and each of $Rf_1$ and $Rf_2$ independently represents an organic group containing a fluorine atom.

[4] The composition according to any of items [1] to [3], wherein the resin (Aa) contains at least one of repeating units of general formulae (aa1-2-3) and (aa1-3-3) below as the repeating unit (Aa1) derived from monomers of general formula (aa1-1) above, (aa1-2-3)

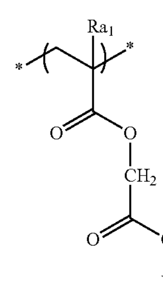

-continued (aa-1-3-3)

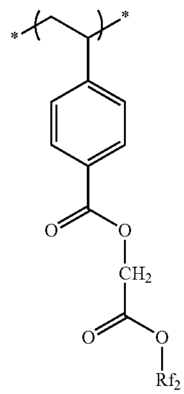

in general formulae (aa1-2-3) and (aa1-3-3), $Ra_1$ represents a hydrogen atom or a methyl group, and each of $Rf_1$ and $Rf_2$ independently represents an organic group containing a fluorine atom.

[5] The composition according to any of items [1] to [4], wherein in general formula (aa2-1) above, Rb represents a hydrogen atom; $S_{1a}$ represents an optionally substituted alkyl group, an organic group containing a silicon atom, or a halogen atom; and p is an integer of 1 to 5.

[6] The composition according to any of items [1] to [5], wherein in general formula (aa2-1) above, $S_{1a}$ represents an alkyl group, an alkyl group substituted with a halogen atom or an organic group containing a silicon atom.

[7] The composition according to any of items [1] to [6], wherein in general formula (aa2-1) above, $S_{1a}$ represents an alkyl group or any of groups of general formula (aa1-2-1) below, (S-1)

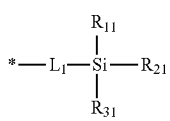

in which each of $R_{11}$, $R_{21}$ and $R_{31}$ independently represents an alkyl group, and $L_1$ represents a single bond or a bivalent connecting group.

[8] The composition according to any of items [1] to [7], further comprising a compound that when exposed to actinic rays or radiation, generates an acid.

[9] The composition according to any of items [1] to [8], wherein the resin (Ab) comprises a repeating unit (B) containing a structural moiety that when exposed to actinic rays or radiation, generates an acid.

[10] The composition according to any of items [1] to [9], wherein the resin (Ab) comprises at least one of repeating units (A) of general formula (A) below, (A)

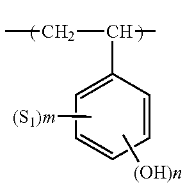

in which n is an integer of 1 to 5, and m is an integer of 0 to 4 satisfying the relationship $1 \le m+n \le 5$, and $S_1$ represents a substituent, provided that when m is 2 or greater, two or more S's may be identical to or different from each other.

[11] The composition according to item [10], wherein the resin (Ab) comprises at least a repeating unit of formula below as the at least one of repeating units (A) of general formula (A) above.

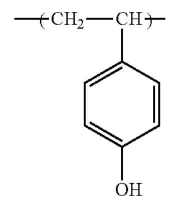

[12] The composition according to any of items [1] to [11], wherein the resin (Aa) is contained in an amount of 0.01 to 20 mass % based on total solids of the composition.

[13] The composition according to item [12], wherein the resin (Aa) is contained in an amount of 0.01 to 10 mass % based on total solids of the composition.

[14] The composition according to item [13], wherein the resin (Aa) is contained in an amount of 0.01 to 5 mass % based on total solids of the composition.

[15] The composition according to any of items [1] to [14], wherein the resin (Ab) comprises at least one of repeating units of general formulae (A1) and (A2) below, (A1)

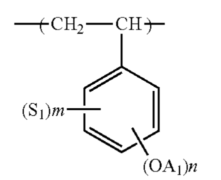

(A2)

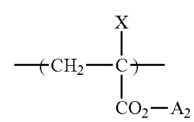

in general formula (A1)

n is an integer of 1 to 5, and m is an integer of 0 to 4 satisfying the relationship $1 \le m+n \le 5$, $S_1$ represents a substituent, provided that when m is 2 or greater, two or more $S_1$s may be identical to or different from each other, and $A_1$ represents a hydrogen atom or a group that when acted on by an acid, is cleaved, provided that at least one $A_1$ represents a group that when acted on by an acid, is cleaved, and that when n is 2 or greater, two or more $A_1$s may be identical to or different from each other, and in general formula (A2)

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group, and $A_2$ represents a group that when acted on by an acid, is cleaved.

[16] The composition according to any of items [1] to [15], wherein the resin (Ab) has a weight average molecular weight ranging from 1000 to 200,000.

[17] The composition according to item [16], wherein the resin (Ab) has a weight average molecular weight ranging from 1000 to 100,000.

[18] The composition according to item [17], wherein the resin (Ab) has a weight average molecular weight ranging from 1000 to 50,000.

[19] The composition according to item [18], wherein the resin (Ab) has a weight average molecular weight ranging from 1000 to 25,000.

[20] The composition according to any of items [1] to [19], further comprising a basic compound.

[21] The composition according to item [20], wherein the basic compound is a compound containing a functional group with proton acceptor properties, which compound when exposed to actinic rays or radiation, is decomposed to thereby produce a compound exhibiting proton acceptor properties lower than, or no proton acceptor properties due to dissipation of, the proton acceptor properties of the compound, or exhibiting acid properties derived from the proton acceptor properties of the compound.

[22] The composition according to any of items [1] to [21], further comprising a surfactant.

[23] The composition according to any of items [1] to [22], further comprising a solvent.

[24] The composition according to item [23], wherein the solvent comprises propylene glycol monomethyl ether acetate.

[25] The composition according to item [24], wherein the solvent comprises propylene glycol monomethyl ether.

[26] The composition according to any of items [1] to [25] to be exposed to EUV light.

[27] The composition according to any of items [1] to [25] to be exposed to a KrF excimer laser, electron beams or X-rays.

[28] An actinic-ray- or radiation-sensitive film formed from the composition according to any of items [1] to [27].

[29] A method of forming a pattern, comprising forming the composition according to any of items [1] to [27] into a film, exposing the film to light, and developing the exposed film.

[30] The method according to item [29], wherein the exposure is performed using EUV.

[31] A semiconductor device manufactured by a process comprising the method of item [29] or [30].

The present invention has made it feasible to provide an actinic-ray- or radiation-sensitive resin composition that can simultaneously satisfy high sensitivity, favorable roughness performance, favorable pattern shape, favorable dry etching resistance and reduction of development defects, and to provide an actinic-ray- or radiation-sensitive film from the composition and a method of forming a pattern.

DETAILED DESCRIPTION OF THE INVENTION

Embodiments of the present invention will be described in detail below.

Herein, the groups and atomic groups for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

Further, the term "actinic rays" or "radiation" means, for example, brightline spectra from a mercury lamp, far ultraviolet represented by an excimer laser, extreme ultraviolet (EUV), X-rays and electron beams (EB). Herein, the term "light" means actinic rays or radiation.

The term "exposure to light" unless otherwise specified means not only irradiation with light, such as light from a mercury lamp, far ultraviolet, X-rays or EUV light, but also lithography using particle beams, such as electron beams and ion beams.

The actinic-ray- or radiation-sensitive resin composition of the present invention comprises, specified below, a resin (Aa) containing repeating units (Aa1) and (Aa2) and a resin (Ab) that when acted on by an acid, changes its alkali solubility.

[Resin (Aa)]

The resin (Aa) contains at least one repeating unit (Aa1) derived from monomers of general formula (aa1-1) below and at least one repeating unit (Aa2) derived from monomers of general formula (aa2-1) below. The incorporation of the resin (Aa) in the composition of the present invention exerts the effect of improving development defects. One reason therefor would be that a fluorinated ester group existing at, for example, an end of a side chain of the resin is hydrolyzed by an alkali developer to thereby render the resin hydrophilic. Further, the incorporation of the resin (Aa) in the composition of the present invention exerts the effect of enhancing dry etching resistance. One reason therefor would be the presence of a benzene ring in the repeating unit (Aa2).

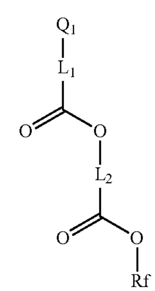

(aa1-1)

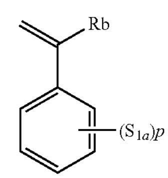

(aa2-1)

In general formula (aa1-1), $Q_1$ represents an organic group containing a polymerizable group.

Each of $L_1$ and $L_2$ independently represents a single bond or a bivalent connecting group.

Rf represents an organic group containing a fluorine atom.

In general formula (aa2-1),

Rb represents a hydrogen atom, an optionally substituted alkyl group, or a halogen atom.

$S_{1a}$, when two or more $S_{1a}$s exist, each independently, represents a substituent, and p is an integer of 0 to 5.

First, the repeating units (Aa1) derived from monomers of general formula (aa1-1) will be described.

(aa1-1)

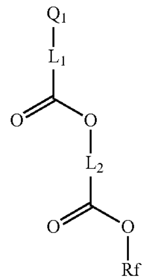

In the formula, the organic group containing a polymerizable group, represented by $Q_1$ is not particularly limited as long as a polymerizable group is contained in the group. As the polymerizable group, there can be mentioned, for example, an acrylyl group, a methacrylyl group, a styryl group, a norbornenyl group, a maleimido group, a vinyl ether group or the like. An acrylyl group, a methacrylyl group and a styryl group are most preferred.

As the bivalent connecting groups represented by $L_1$ and $L_2$, there can be mentioned, for example, a substituted or unsubstituted arylene group, a substituted or unsubstituted alkylene group, a substituted or unsubstituted cycloalkylene group, —O—, —CO—, and a bivalent connecting group resulting from a combination of two or more of these.

It is preferred for the arylene group to be, for example, one having 6 to 14 carbon atoms. As particular examples of the arylene groups, there can be mentioned a phenylene group, a naphthylene group, an anthrylene group, a phenanthrylene group, a biphenylene group, a terphenylene group and the like.

The alkylene group and cycloalkylene group are preferably, for example, those each having 1 to 15 carbon atoms. As particular examples thereof, there can be mentioned forms resulting from the abstraction of one hydrogen atom from any of linear, branched and cyclic alkyl groups, such as a methyl group, an ethyl group, an n-propyl group, an isopropyl group, an n-butyl group, a sec-butyl group, a tert-butyl group, a tert-amyl group, an n-pentyl group, an n-hexyl group, an n-heptyl group, an n-octyl group, an n-nonyl group, an n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, a cyclohexylbutyl group and an adamantyl group.

As substituents that can be introduced in these arylene, alkylene and cycloalkylene groups, there can be mentioned, for example, an alkyl group, an aralkyl group, an alkoxy group, a fluorine atom and the like.

In one form of the present invention, $L_1$ is preferably a single bond, a phenylene group, an ether group, a carbonyl group or a carbonyloxy group, and $L_2$ is preferably an alkylene group, an ether group, a carbonyl group or a carbonyloxy group.

The organic group in the organic group containing a fluorine atom, represented by Rf is a group having at least one carbon atom, preferably an organic group containing a carbon-hydrogen bond moiety. Rf is, for example, an alkyl group substituted with a fluorine atom, or a cycloalkyl group substituted with a fluorine atom.

It is preferred for the repeating unit (Aa1) in its one form to be any of repeating units of general formulae (aa1-2-1) and (aa1-3-1) below.

(aa1-2-1)

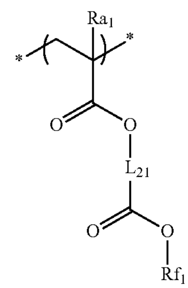

(aa1-3-1)

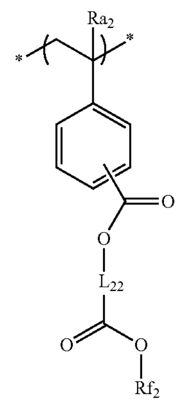

In general formulae (aa1-2-1) and (aa1-3-1), each of $Ra_1$ and $Ra_2$ independently represents a hydrogen atom or an alkyl group. Each of $Ra_1$ and $Ra_2$ is preferably a hydrogen atom or a methyl group.

Each of $L_{21}$ and $L_{22}$ independently represents a single bond or a bivalent connecting group, and has the same meaning as that of $L_2$ mentioned above in connection with general formula (aa1-1).

Each of $Rf_1$ and $Rf_2$ independently represents an organic group containing a fluorine atom, and has the same meaning as that of Rf mentioned above in connection with general formula (aa1-1).

It is preferred for the repeating unit (Aa1) in its another form to be any of repeating units of general formulae (aa1-2-2) and (aa1-3-2) below.

(aa1-2-2)

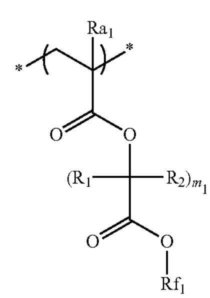

-continued (aa1-3-2)

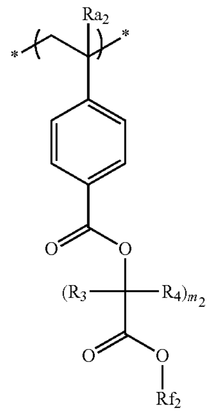

In general formulae (aa1-2-2) and (aa1-3-2), each of $Ra_1$ and $Ra_2$ independently represents a hydrogen atom or an alkyl group.

Each of $R_1$, $R_2$, $R_3$ and $R_4$ independently represents a hydrogen atom or an alkyl group.

Each of $m_1$ and $m_2$ independently is an integer of 0 to 5.

Each of $Rf_1$ and $Rf_2$ independently represents an organic group containing a fluorine atom.

Preferably, $Ra_1$ and $Ra_2$ are each a hydrogen atom or a methyl group.

Preferably, the alkyl groups represented by $R_1$, $R_2$, $R_3$ and $R_4$ are each, for example, a linear or branched alkyl group having 1 to 10 carbon atoms. As particular examples thereof, there can be mentioned a methyl group, an ethyl group, a propyl group, an isopropyl group, a butyl group, a t-butyl group and the like. A substituent may be introduced in any of these alkyl groups. As the substituent, there can be mentioned, for example, an alkoxy group, an aryl group, a halogen atom or the like.

Each of $m_1$ and $m_2$ is preferably an integer of 0 to 3, more preferably 0 or 1 and most preferably 1.

The organic groups containing a fluorine atom, represented by $Rf_1$ and $Rf_2$ are as defined above in connection with Rf of general formula (aa1-1).

It is preferred for the repeating unit (Aa1) in its further form to be any of repeating units of general formulae (aa1-2-3) and (aa1-3-3) below.

(aa1-2-3)

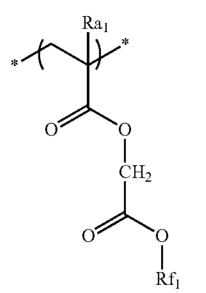

-continued (aa1-3-3)

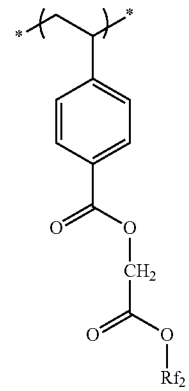

In general formulae (aa1-2-3) and (aa1-3-3), $Ra_1$ represents a hydrogen atom or a methyl group.

Each of $Rf_1$ and $Rf_2$ independently represents an organic group containing a fluorine atom, and has the same meaning as that of Rf mentioned above in connection with general formula (aa1-1).

Particular examples of the repeating units (Aa1) are shown below, which in no way limit the scope of the present invention.

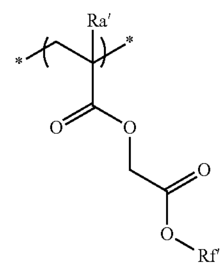

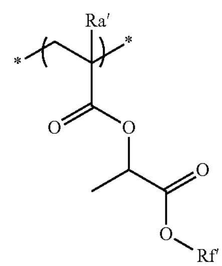

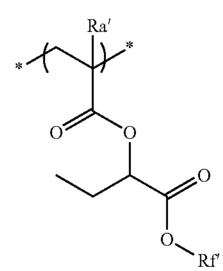

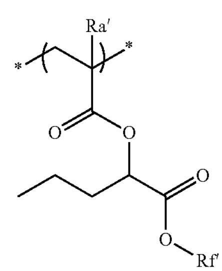

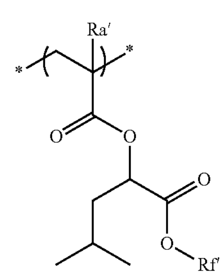

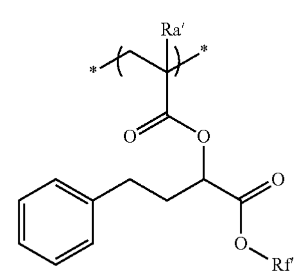

-continued
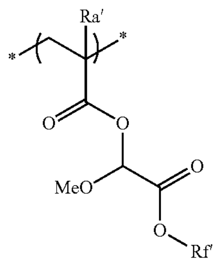
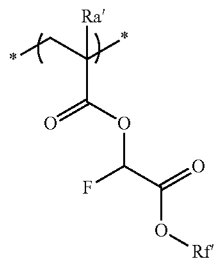
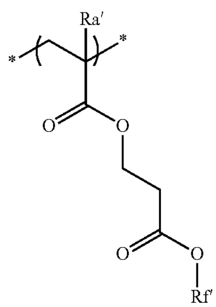
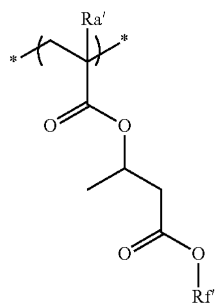
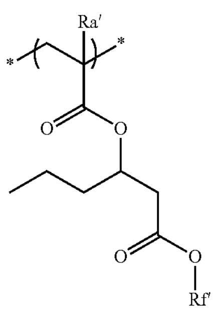
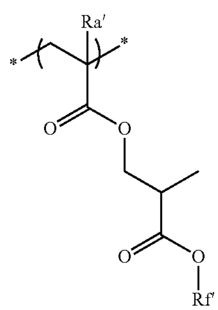
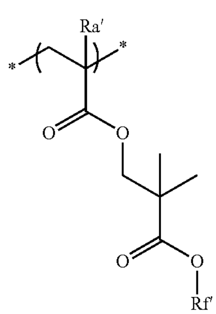
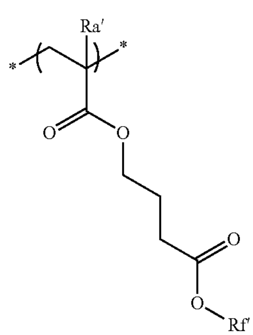
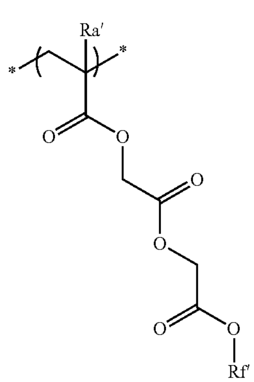
-continued
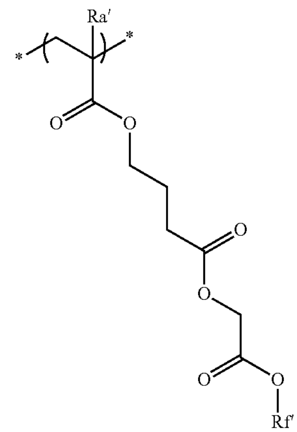
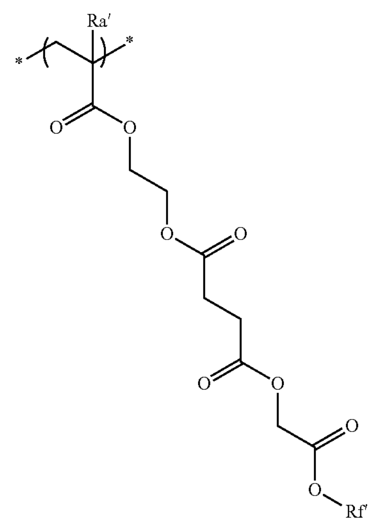
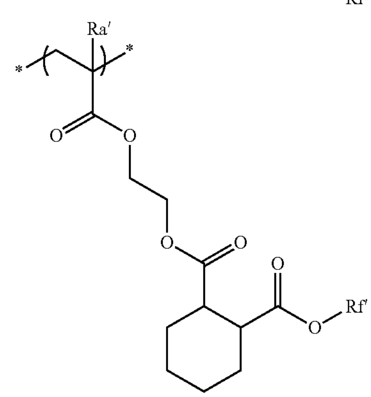
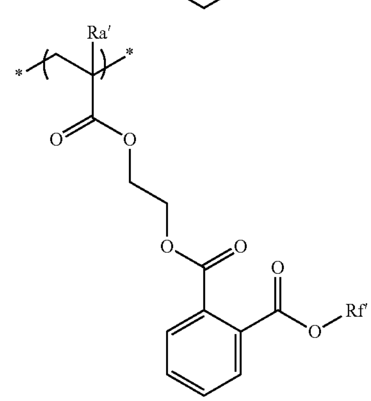

-continued
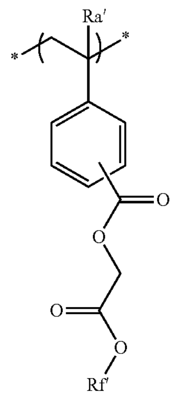
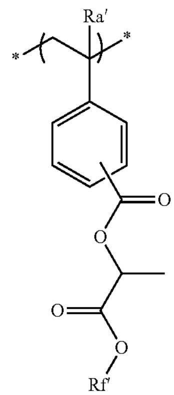
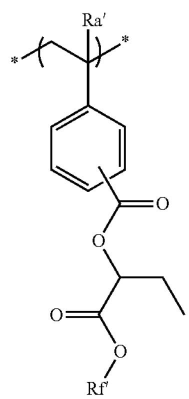
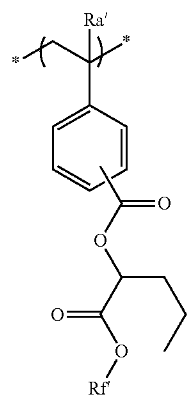
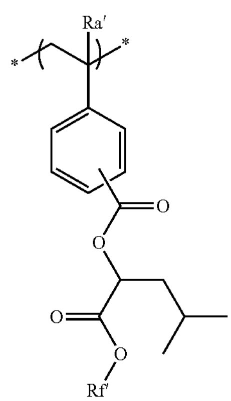
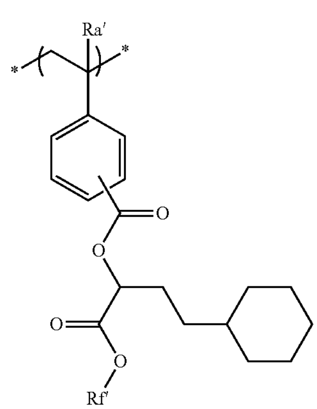
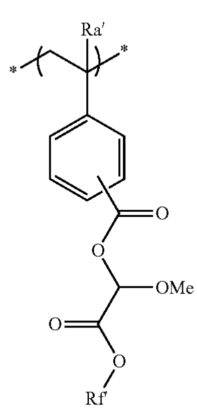
-continued
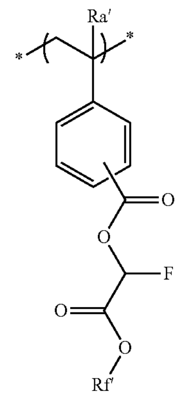
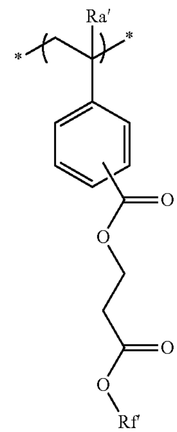
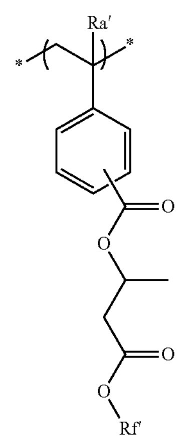
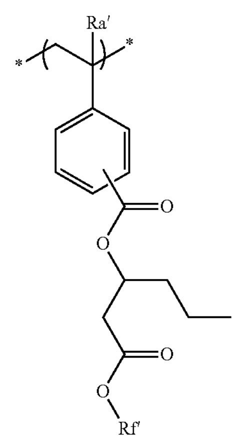
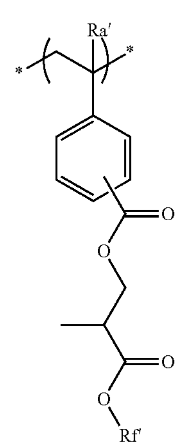
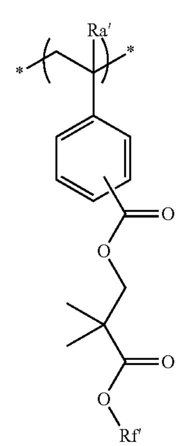

-continued
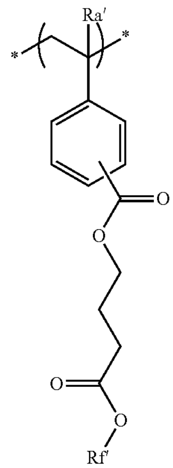
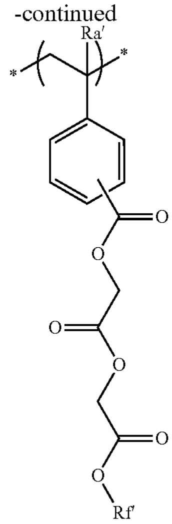
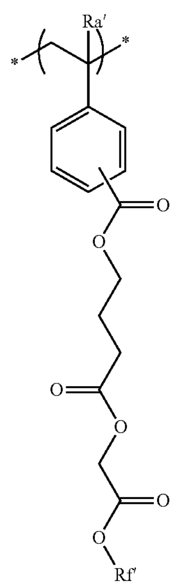
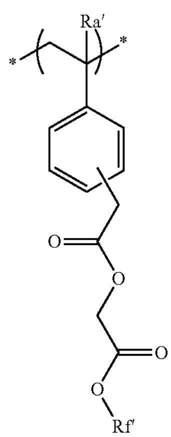
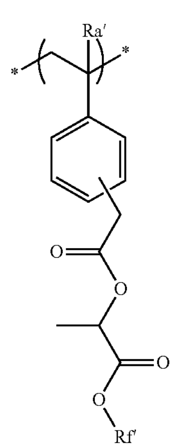
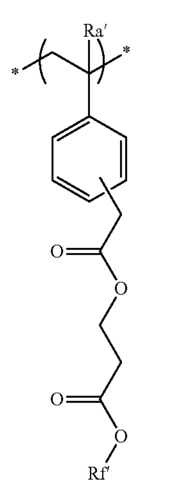
-continued
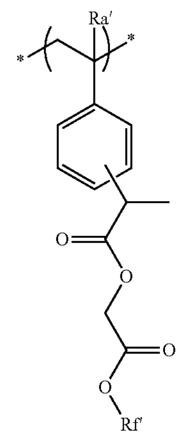
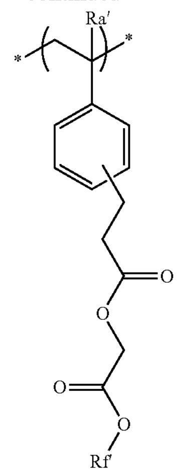
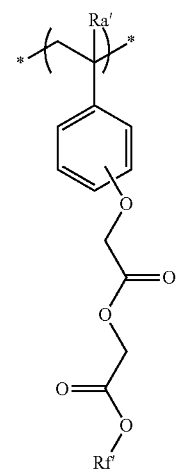
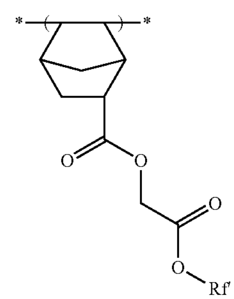
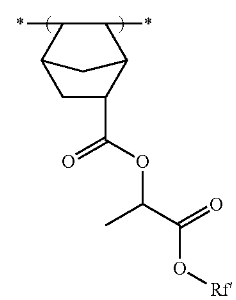
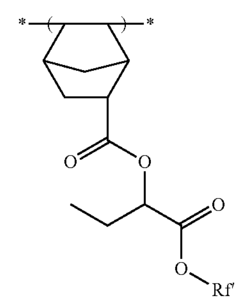
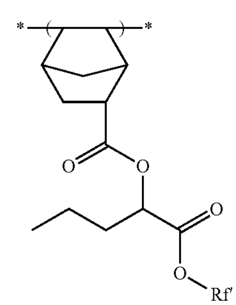
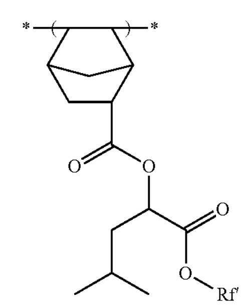

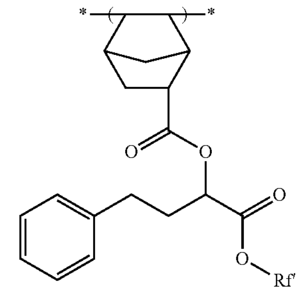
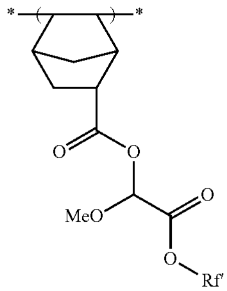
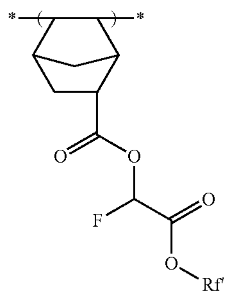
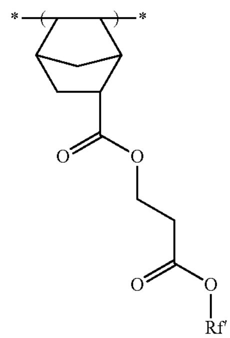
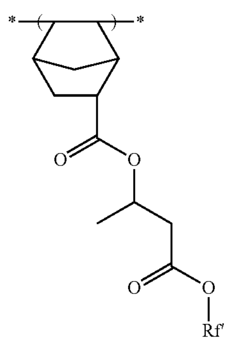
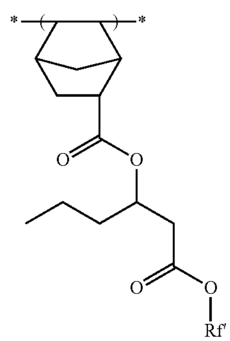
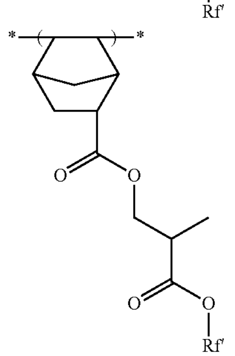
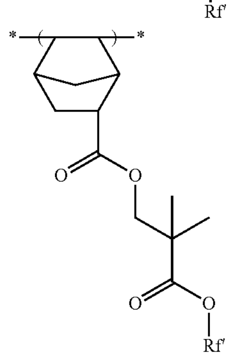
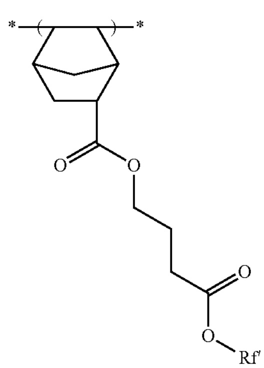
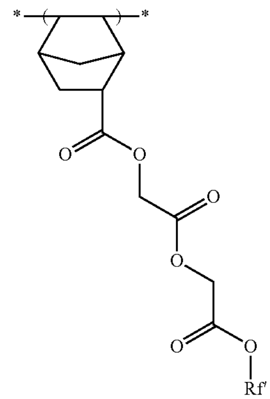
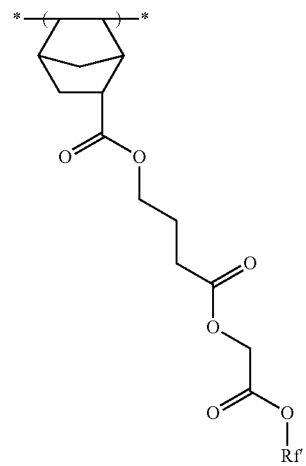
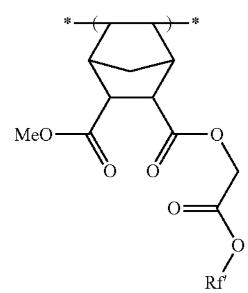
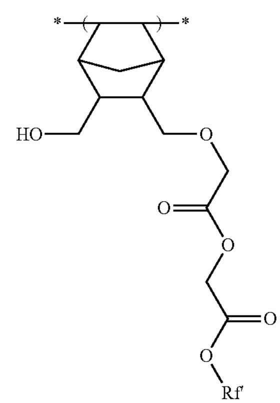
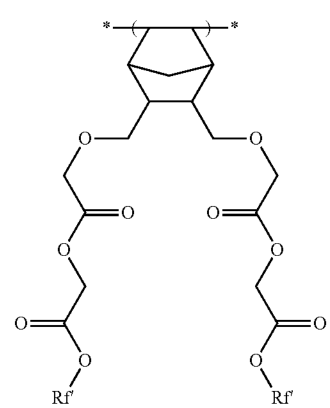

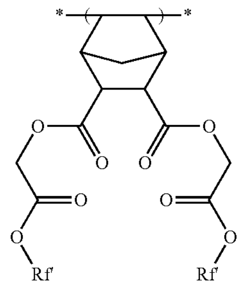
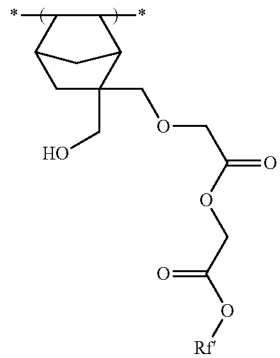
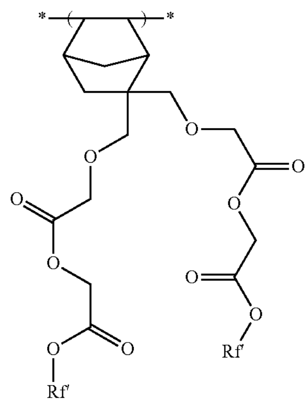
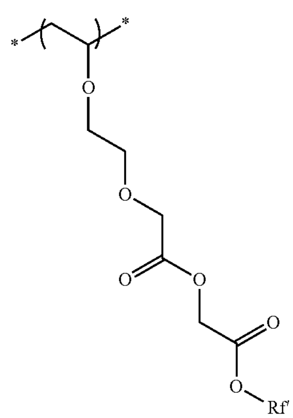
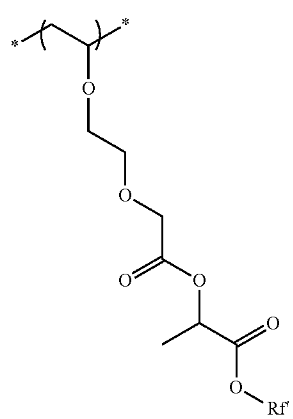
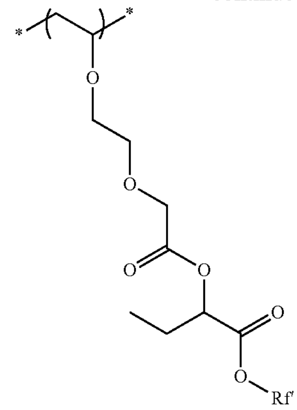
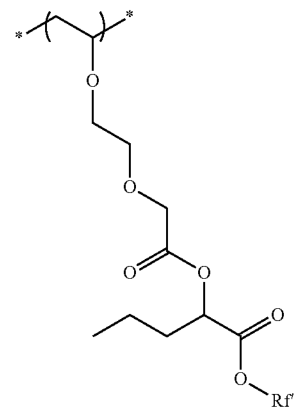
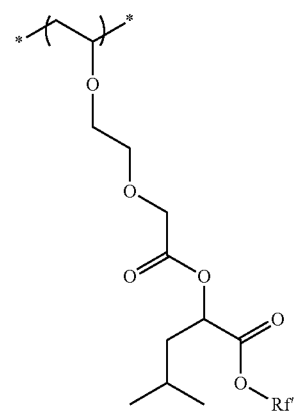
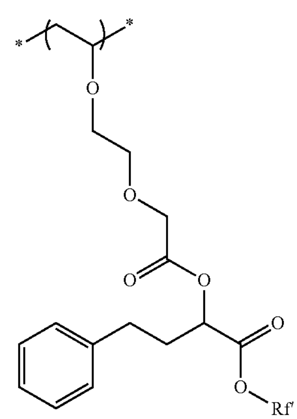

-continued
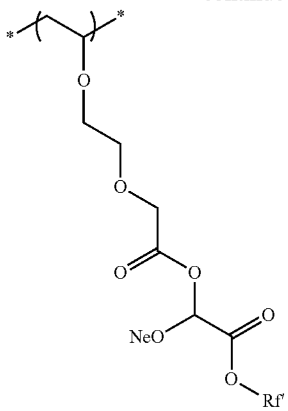
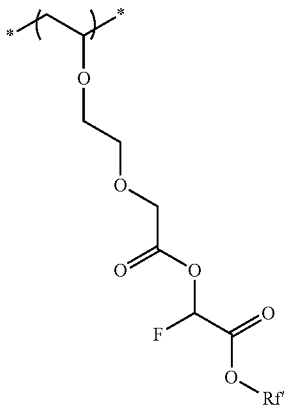
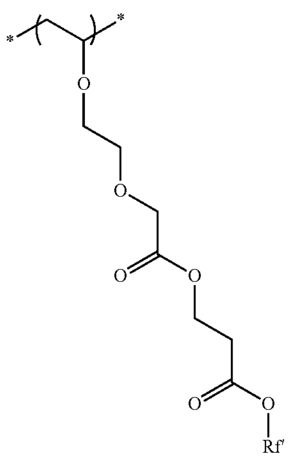
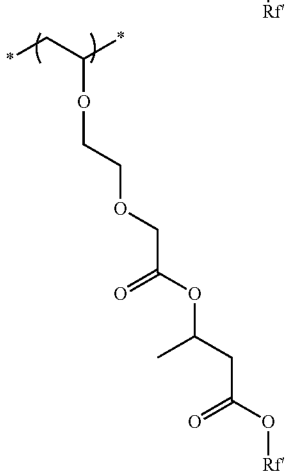
-continued
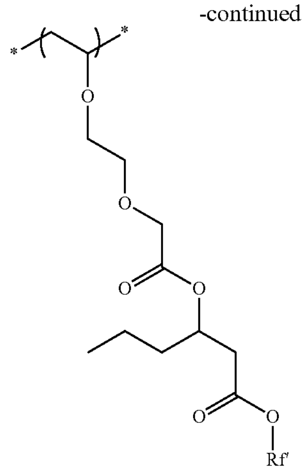
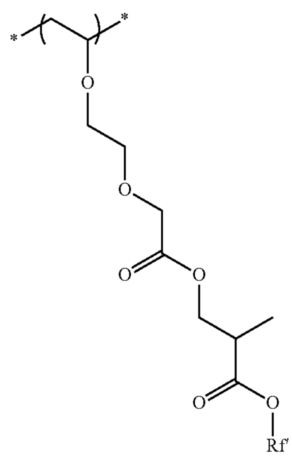
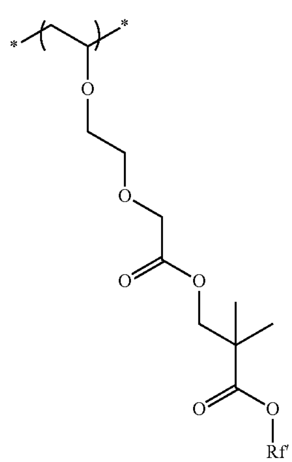

-continued
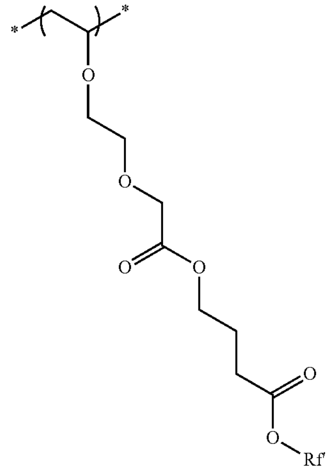
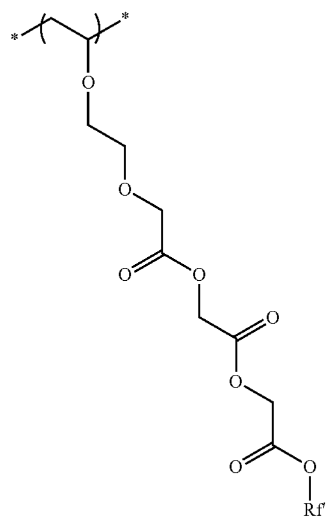
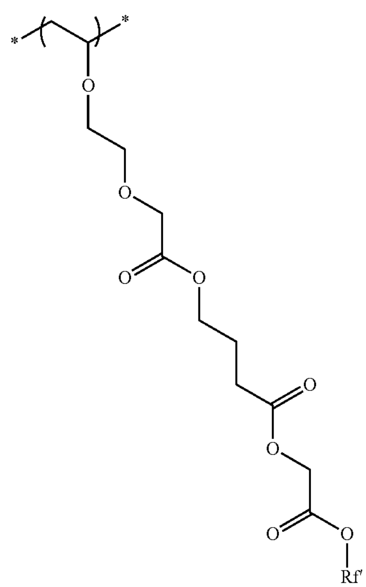
-continued
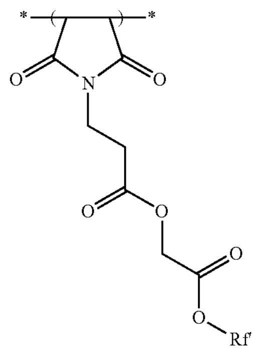
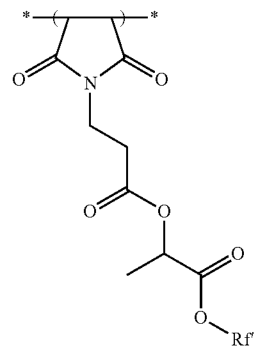
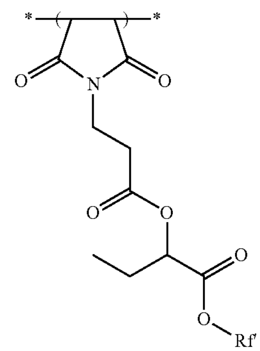
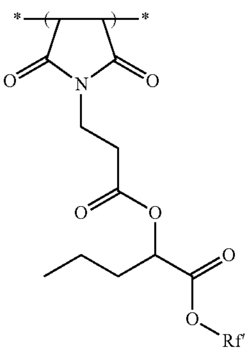
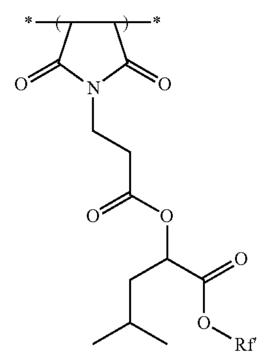
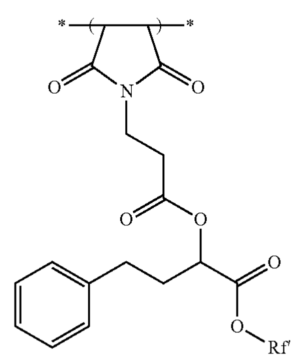

-continued
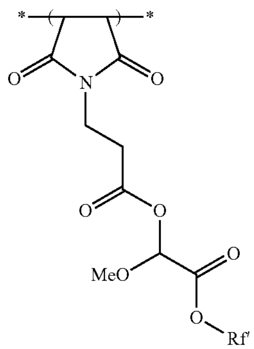
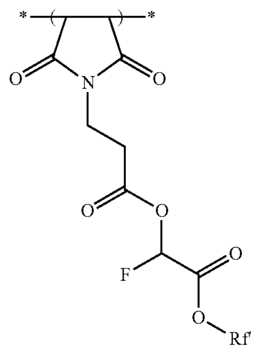
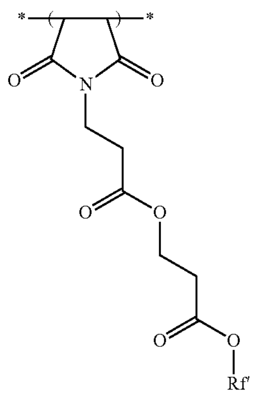
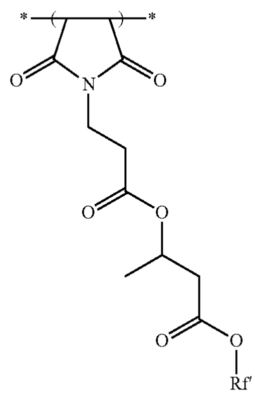
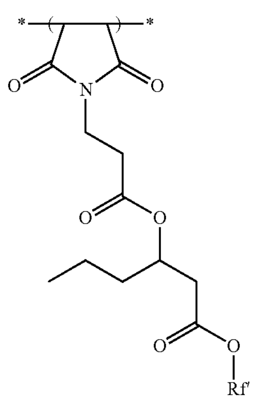
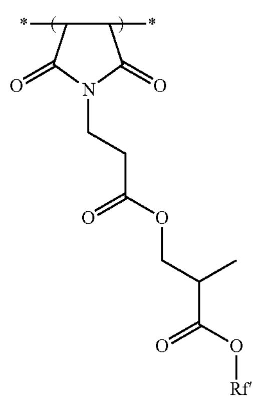
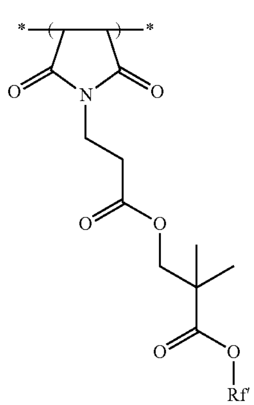
-continued
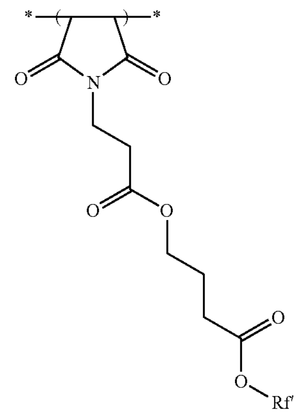
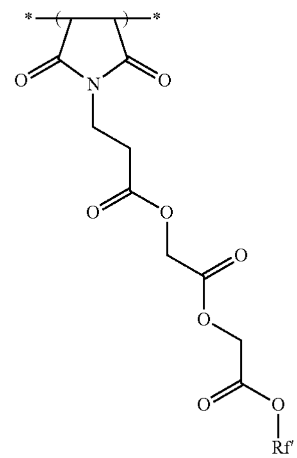
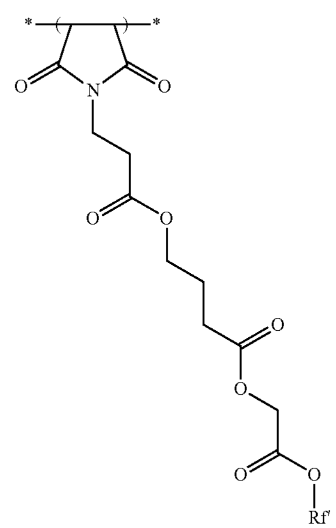
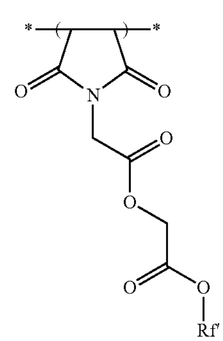
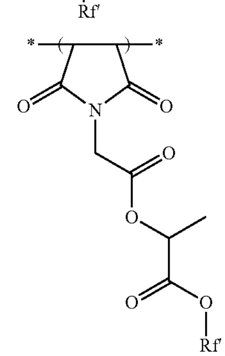

-continued

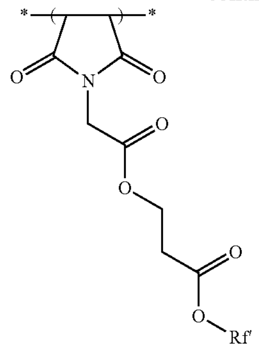

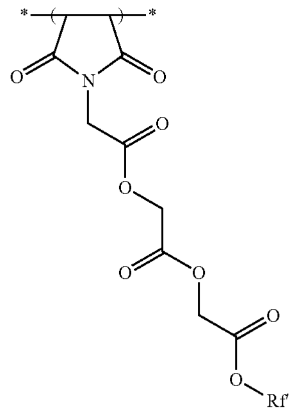

Ra' = H, $CH_3$
Rf' = $CH_2CF_3$, $CH_2C_2F_5$, $CH_2C_3F_7$, $CH_2C_4F_9$, $CH(CF_3)_2$, $CH_2CF_2CHF_2$, $CH_2(CF_2)_3CHF_2$,

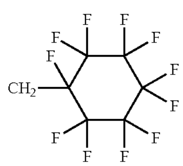

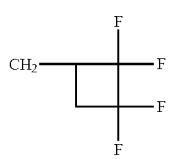

The content of repeating unit (Aa1) in the resin (Aa), based on all the repeating units of the resin (Aa), is preferably in the range of 30 to 99 mol %, more preferably 40 to 99 mol %, further more preferably 50 to 99 mol % and most preferably 70 to 99 mol %.

Below, the repeating units (Aa2) derived from monomers of general formula (aa2-1) will be described.

(aa2-1)

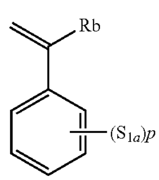

In the formula, as mentioned above, Rb represents a hydrogen atom, an optionally substituted alkyl group, or a halogen atom.

Rb is preferably a hydrogen atom, a methyl group, a trifluoromethyl group or a fluorine atom, more preferably a hydrogen atom.

$S_{1a}$, as mentioned above, represents a substituent.

As the substituent represented by $S_{1a}$, there can be mentioned, for example, an alkyl group, a cycloalkyl group, an alkoxy group, an acyl group, an acyloxy group, a halogen atom, a cyano group, an organic group containing a silicon atom, an aryl group, an aryloxy group, an aralkyl group, an aralkyloxy group, a hydroxyl group, a nitro group, a sulfonylamino group, an alkylthio group, an arylthio group, an aralkylthio group or the like.

Further, the substituent represented by $S_{1a}$ may be a group resulting from bonding of any of the above-mentioned groups to a bivalent connecting group. As the bivalent connecting group, there can be mentioned, for example, a substituted or unsubstituted alkylene group, a substituted or unsubstituted cycloalkylene group, —O— or a bivalent connecting group composed of a combination of two or more of these.

The alkyl group represented by $S_{1a}$ is preferably, for example, one having 1 to 20 carbon atoms. As such, there can be mentioned, for example, a methyl group, an ethyl group, a propyl group, an isopropyl group, an n-butyl group, an isobutyl group, a t-butyl group, a pentyl group, a hexyl group or the like. A substituent may further be introduced in the alkyl group. As preferred further introducible substituents, there can be mentioned, for example, a halogen atom, an alkoxy group, a cycloalkyl group, a hydroxyl group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, a heterocyclic residue such as a pyrrolidone residue and the like. A substituent having 12 or less carbon atoms is preferred.

The cycloalkyl group represented by $S_{1a}$ is preferably, for example, one having 3 to 10 carbon atoms. As such, there can be mentioned, for example, a cyclobutyl group, a cyclopentyl group, a cyclohexyl group, a norbornyl group, an adamantyl group or the like. A substituent may further be introduced in the cycloalkyl group. Preferred further introducible substituents include, for example, those mentioned above as being introducible in the alkyl group represented by $S_{1a}$ and an alkyl group.

The alkoxy group represented by $S_{1a}$ is preferably, for example, one having 1 to 10 carbon atoms. As such, there can be mentioned, for example, a methoxy group, an ethoxy group, a propoxy group, a butoxy group or the like. A substituent may further be introduced in the alkoxy group. Preferred further introducible substituents include, for example, those mentioned above as being introducible in the alkyl group represented by $S_{1a}$.

The acyl group represented by $S_{1a}$ is preferably, for example, one having 2 to 10 carbon atoms. As such, there can be mentioned, for example, an acetyl group, a propionyl group, a butyryl group, an isobutyryl group or the like. A substituent may further be introduced in the acyl group. Preferred further introducible substituents include, for example, those mentioned above as being introducible in the alkyl group represented by $S_{1a}$.

The acyloxy group represented by $S_{1a}$ is preferably, for example, one having 2 to 10 carbon atoms. The acyl group in the acyloxy group is, for example, any of those mentioned above with respect to the acyl group. Introducible substituents are also the same as mentioned above.

The aryl group represented by $S_{1a}$ is preferably, for example, one having 6 to 10 carbon atoms. As such, there can be mentioned, for example, a phenyl group, a xylyl group, a tolyl group, a cumenyl group, a naphthyl group, an anthracenyl group or the like. A substituent may further be introduced in the aryl group. Preferred further introducible substituents include, for example, those mentioned above as being introducible in the alkyl group and cycloalkyl group represented by $S_{1a}$.

Each of the aryloxy group and arylthio group represented by $S_{1a}$ is preferably, for example, one having 2 to 10 carbon atoms. The aryl group in the aryloxy group and arylthio group is, for example, any of those mentioned above with respect to the aryl group. Introducible substituents are also the same as mentioned above.

The aralkyl group represented by $S_{1a}$ is preferably, for example, one having 7 to 15 carbon atoms. As such, there can be mentioned, for example, a benzyl group or the like. A substituent may further be introduced in the aralkyl group. Preferred further introducible substituents include, for example, those mentioned above as being introducible in the alkyl group and cycloalkyl group represented by $S_{1a}$.

Each of the aralkyloxy group and aralkylthio group represented by $S_{1a}$ is preferably, for example, one having 7 to 15 carbon atoms. The aralkyl group in the aralkyloxy group and aralkylthio group is, for example, any of those mentioned above with respect to the aralkyl group. Introducible substituents are also the same as mentioned above.

The alkylthio group represented by $S_{1a}$ is preferably, for example, one having 1 to 10 carbon atoms. The alkyl group in the alkylthio group is, for example, any of those mentioned above with respect to the alkyl group. Introducible substituents are also the same as mentioned above.

As the halogen atom represented by $S_{1a}$, there can be mentioned a fluorine atom, a chlorine atom, a bromine atom or an iodine atom. A fluorine atom and a chlorine atom are preferred. A fluorine atom is most preferred.

The organic group in the organic group containing a silicon atom, represented by $S_{1a}$ is a group containing at least one carbon atom, in which a heteroatom, such as an oxygen atom, a nitrogen atom, a sulfur atom, a silicon atom or a halogen atom (for example, a fluorine atom, a chlorine atom, a bromine atom or the like), may be introduced. This organic group preferably has 1 to 30 carbon atoms.

It is preferred for the organic group containing a silicon atom in its one form to be expressed by general formula (S) below.

(S)

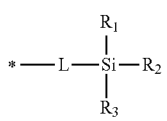

In the formula, each of $R_1$, $R_2$ and $R_3$ independently represents a hydrogen atom, an alkyl group, an alkenyl group, a cycloalkyl group, an alkoxy group, an aryl group, an aralkyl group or a halogen atom.

L represents a single bond or a bivalent connecting group.

The alkyl group represented by each of $R_1$, $R_2$ and $R_3$ is preferably, for example, one having 1 to 20 carbon atoms, in which a substituent may be introduced.

The alkenyl group represented by each of $R_1$, $R_2$ and $R_3$ is preferably, for example, one having 2 to 10 carbon atoms, in which a substituent may be introduced.

The cycloalkyl group represented by each of $R_1$, $R_2$ and $R_3$ is preferably, for example, one having 3 to 10 carbon atoms, in which a substituent may be introduced.

The alkoxy group represented by each of $R_1$, $R_2$ and $R_3$ is preferably, for example, one having 1 to 10 carbon atoms, in which a substituent may be introduced.

The aryl group represented by each of $R_1$, $R_2$ and $R_3$ is preferably, for example, one having 6 to 10 carbon atoms, in which a substituent may be introduced.

The aralkyl group represented by each of $R_1$, $R_2$ and $R_3$ is preferably, for example, one having 7 to 15 carbon atoms, in which a substituent may be introduced.

As the bivalent connecting group represented by L, there can be mentioned, for example, a substituted or unsubstituted alkylene group, —O—, —S—, —(C═O)— or a bivalent connecting group comprised of a combination of two or more of these.

$S_{1a}$ in its one form is preferably an optionally substituted alkyl group, a halogen atom or an organic group containing a silicon atom; more preferably an alkyl group, an alkyl group substituted with a halogen atom or an organic group containing a silicon atom; and further more preferably an alkyl group or any of groups of general formula (S-1) below.

(S-1)

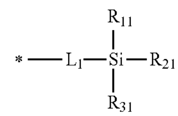

In the formula, each of $R_{11}$, $R_{21}$ and $R_{31}$ independently represents an alkyl group.

$L_1$ represents a single bond or a bivalent connecting group.

The alkyl group represented by each of $R_{11}$, $R_{21}$ and $R_{31}$ is as defined above in connection with $R_1$, $R_2$ and $R_3$ of general formula (S). The bivalent connecting group represented by $L_1$ is as defined above in connection with L of general formula (S).

As mentioned above, p is an integer of 0 to 5, and p is preferably an integer of 1 to 5.

Specific examples of the repeating units (Aa2) are shown below, which in no way limit the scope of the present invention.

Particular examples of the repeating units (Aa2) are shown below, which in no way limit the scope of the present invention. The position of substituent (corresponding to $S_{1a}$) on the benzene ring is also not limited to the following particular examples.

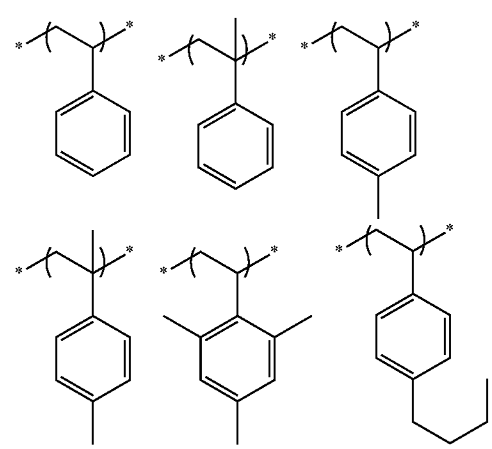

-continued
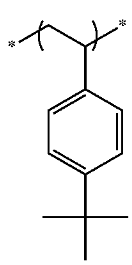
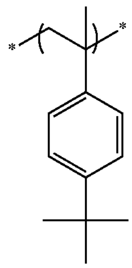
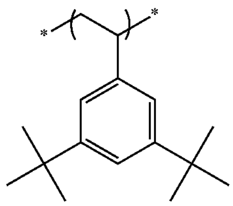
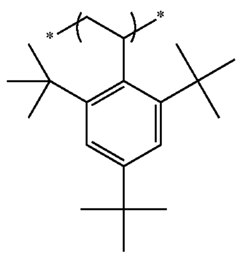
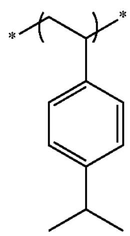
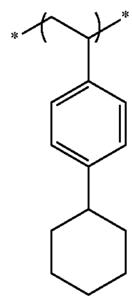
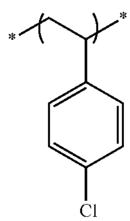
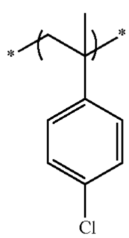
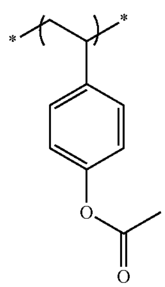
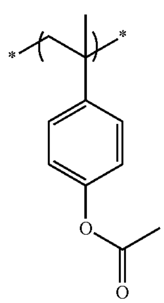
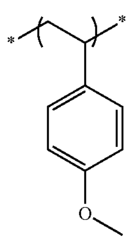
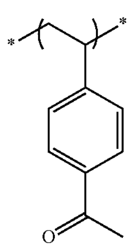
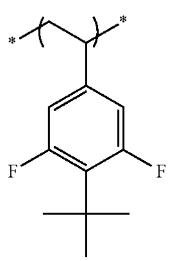
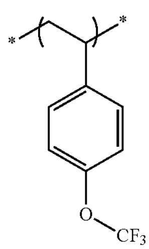
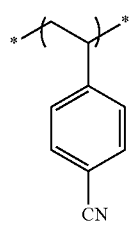
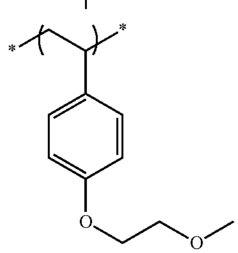
-continued
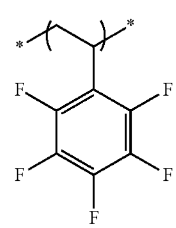
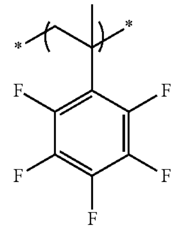
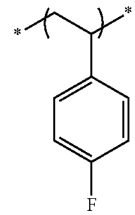
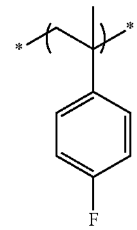
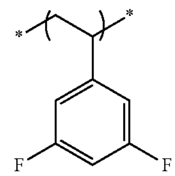
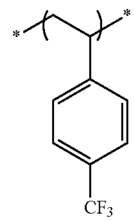
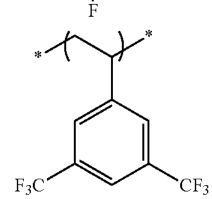
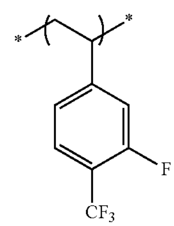
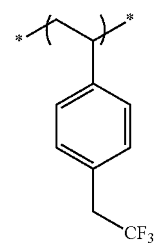
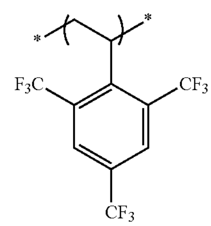
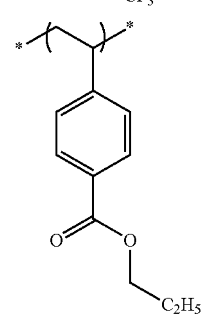
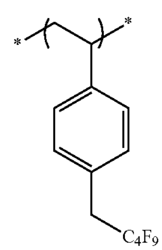
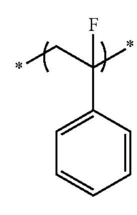
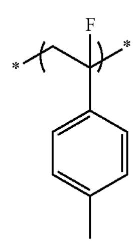
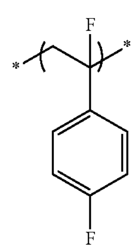
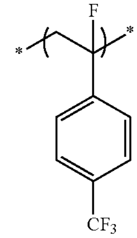
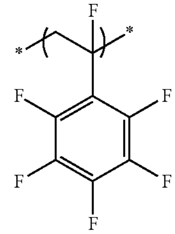

-continued
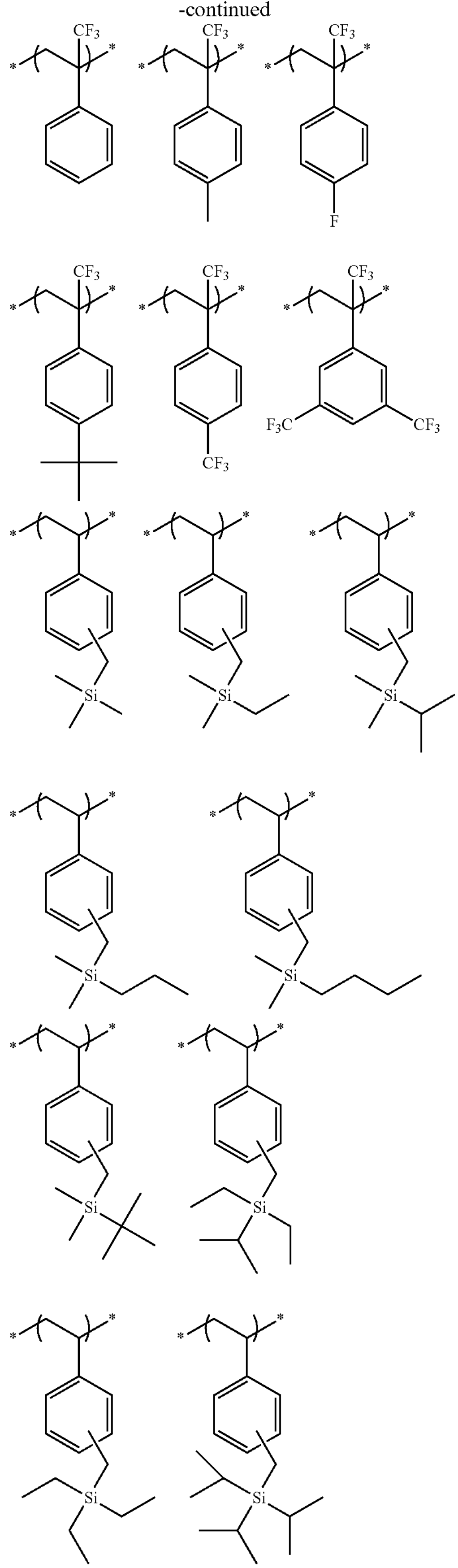
-continued
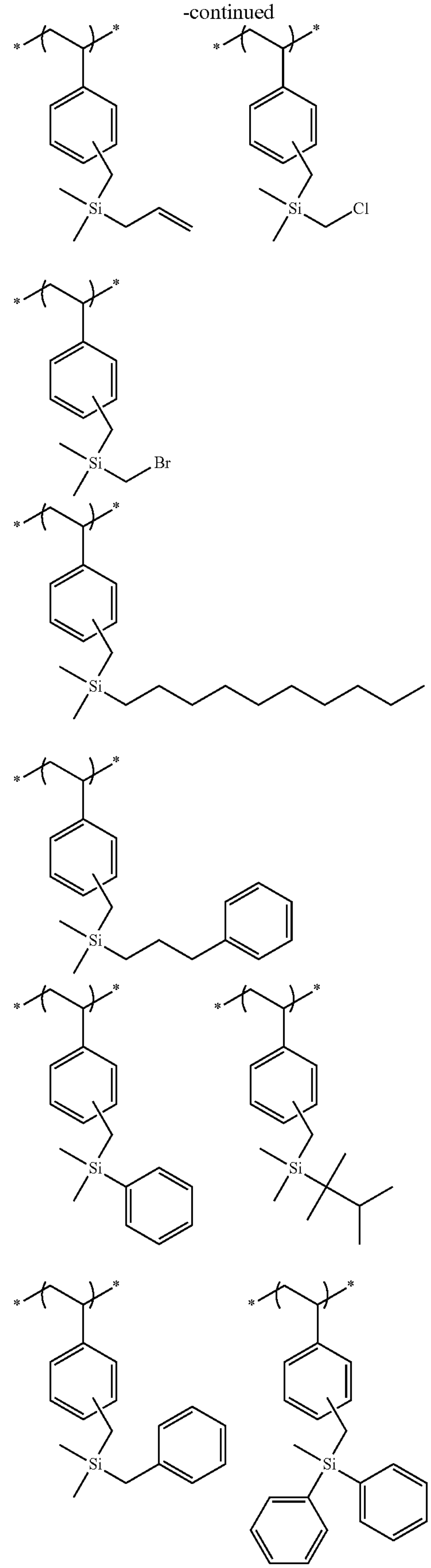

-continued
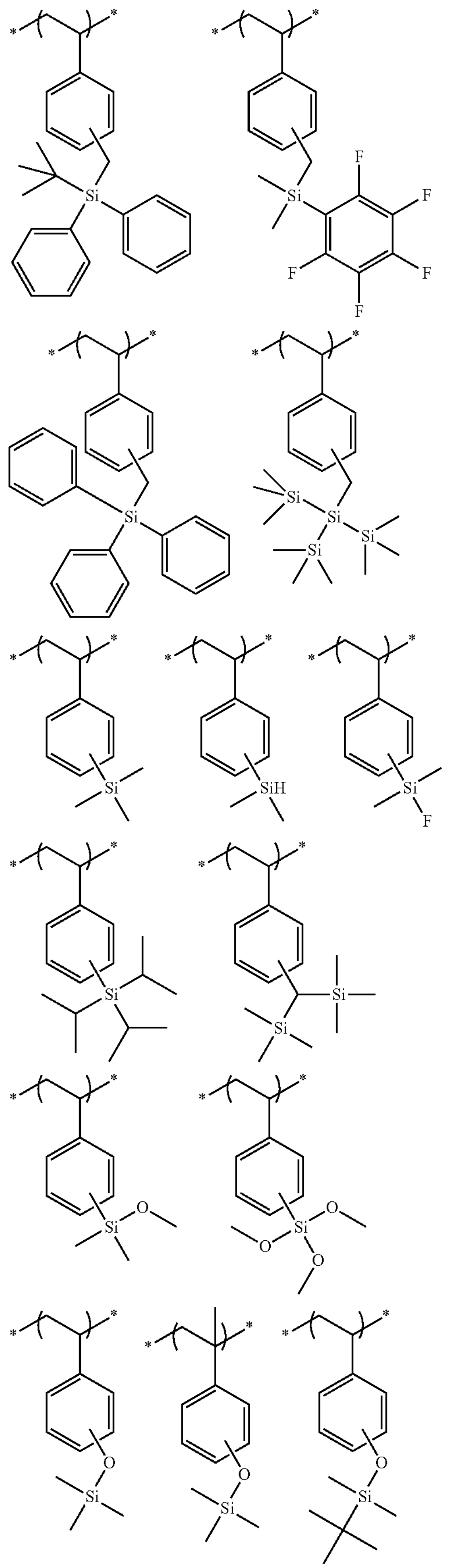
-continued
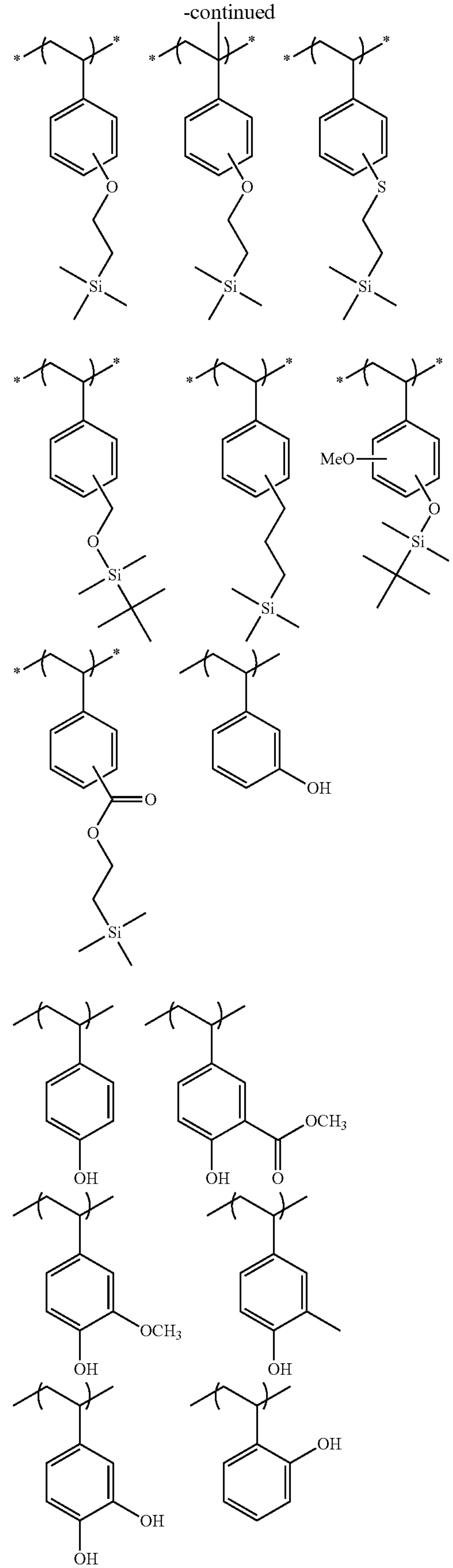

-continued
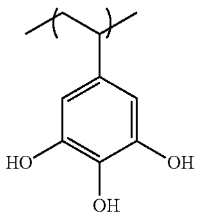
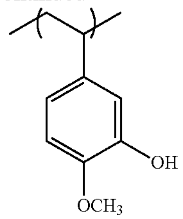
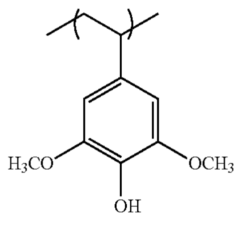
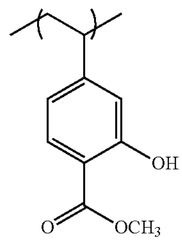
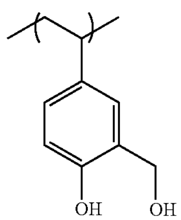
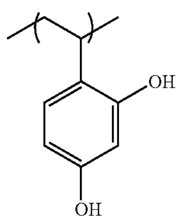
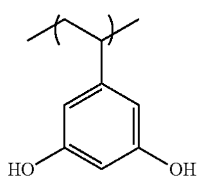
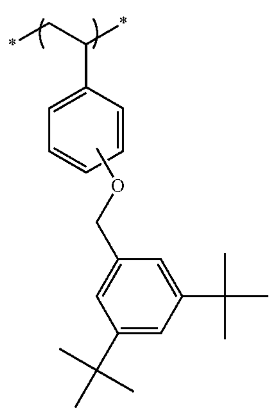
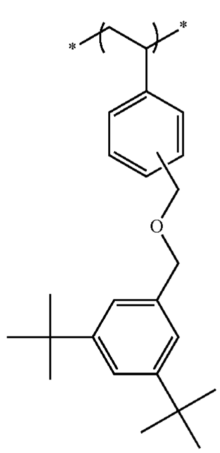
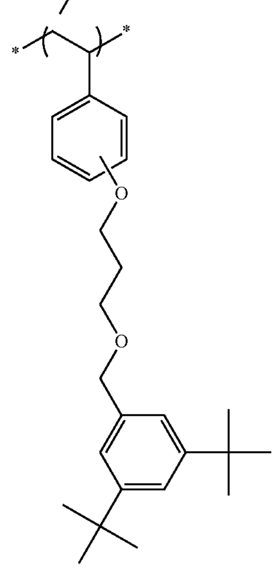
-continued
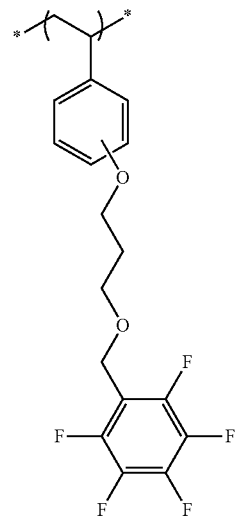
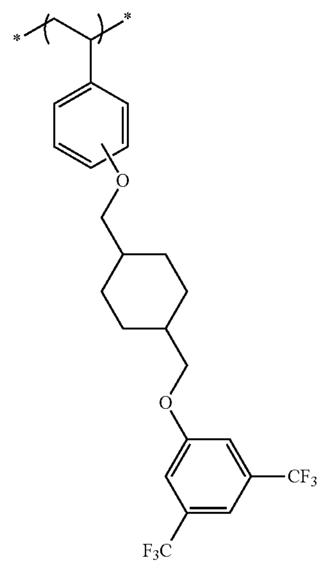
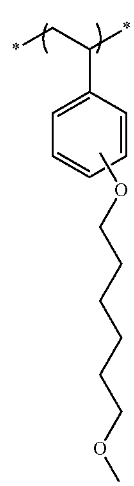

-continued

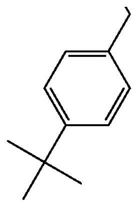

The content of repeating unit (Aa2) in the resin (Aa), based on all the repeating units of the resin (Aa), is preferably in the range of 1 to 99 mol %, more preferably 1 to 70 mol %, further more preferably 1 to 50 mol % and most preferably 1 to 30 mol %.

Any of the monomers of general formula (aa1-1) above is one containing a fluorine atom, and the resin (Aa) comprising any of the repeating units (Aa1) derived from the monomers contains a fluorine atom. Further, the resin (Aa) may comprise a repeating unit containing a fluorine atom other than the repeating units (Aa1), to be described below. In contrast, the resin (Ab) to be described hereinafter is a resin either containing no fluorine atom or in which the amount of repeating unit containing a fluorine atom is small as compared with that in the resin (Aa). Accordingly, the resin (Aa) is unevenly distributed so as to lie in a surface layer of the film formed from the actinic-ray- or radiation-sensitive resin composition of the present invention. Although the resin (Aa) is a resin unevenly distributed so as to lie in an interface as mentioned above, differently from surfactants, the resin does not necessarily have to contain hydrophilic groups within the molecules thereof and does not necessarily contribute to homogeneous mixing of polar and nonpolar substances. The incorporation of a fluorine atom in the resin (Aa) increases the hydrophobicity of the film surface, thereby contributing to reduction of development defects (blob).

Further, the uneven presence of resin (Aa) containing a fluorine atom in a film surface is effective in, in particular, the attainment of high sensitivity in the exposure to light by means of EUV. Namely, in the attainment of high sensitivity, it would be necessary to increase the amount of EUV energy absorbed in the actinic-ray- or radiation-sensitive film, that is, to increase the EUV absorption coefficient of the composition. In that event, the attainment of higher sensitivity can be realized by, rather than evenly distributing a fluorine atom whose EUV absorption coefficient is high in a film, unevenly distributing a fluorine atom so as to lie in a film surface most intensely irradiated with EUV light to thereby efficiently increase the amount of absorbed energy.

The repeating units each containing a fluorine atom, other than the repeating units (Aa1), that can be introduced in the resin (Aa) will be described below.

Any fluorine atom may be contained in the principal chain of the resin (Aa), or may be introduced in a side chain as a substituent. It is preferred for the repeating unit containing a fluorine atom to be, for example, a (meth)acrylate repeating unit or a styryl repeating unit.

It is preferred for the repeating unit containing a fluorine atom in its one form to be a repeating unit comprising, as a partial structure, an alkyl group containing a fluorine atom, a cycloalkyl group containing a fluorine atom or an aryl group containing a fluorine atom.

The alkyl group containing a fluorine atom is a linear or branched alkyl group having at least one hydrogen atom thereof substituted with a fluorine atom. This alkyl group preferably has 1 to 10 carbon atoms, more preferably 1 to 4 carbon atoms. A substituent other than the fluorine atom may further be introduced in the alkyl group containing a fluorine atom.

The cycloalkyl group containing a fluorine atom is a mono- or polycycloalkyl group having at least one hydrogen atom thereof substituted with a fluorine atom. A substituent other than the fluorine atom may further be introduced in the cycloalkyl group containing a fluorine atom.

The aryl group containing a fluorine atom is an aryl group having at least one hydrogen atom thereof substituted with a fluorine atom. As the aryl group, there can be mentioned, for example, a phenyl or naphthyl group. A substituent other than the fluorine atom may further be introduced in the aryl group containing a fluorine atom.

As preferred examples of the alkyl groups each containing a fluorine atom, cycloalkyl groups each containing a fluorine atom and aryl groups each containing a fluorine atom, there can be mentioned the groups of general formulae (F2) to (F4) below, which however in no way limit the scope of the present invention.

(F2)

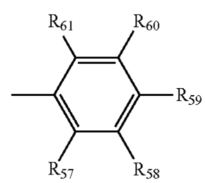

(F3)

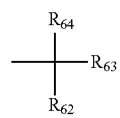

(F4)

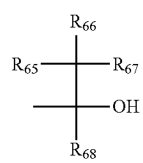

In general formulae (F2) to (F4), each of $R_{57}$ to $R_{68}$ independently represents a hydrogen atom, a fluorine atom or an alkyl group (chain), provided that at least one of each of $R_{57}$-$R_{61}$, at least one of each of $R_{62}$-$R_{64}$ and at least one of each of $R_{65}$-$R_{68}$ represent a fluorine atom or a fluoroalkyl group. $R_{62}$ and $R_{63}$ may be bonded with each other to thereby form a ring.

Specific examples of the groups of general formula (F2) include a p-fluorophenyl group, a pentafluorophenyl group, a 3,5-di(trifluoromethyl)phenyl group and the like.

Specific examples of the groups of general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of general formula (F4) include —$C(CF_3)_2OH$, —$C(C_2F_5)_2OH$, —$C(CF_3)(CF_3)OH$, —$CH(CF_3)OH$ and the like. —$C(CF_3)_2OH$ is preferred.

The partial structure containing a fluorine atom may be directly bonded to the principal chain, or may be bonded to the principal chain through a group selected from the group consisting of an alkylene group, a phenylene group, an ether group, a thioether group, a carbonyl group, an ester group, an amido group, a urethane group and a ureylene group, or through a group composed of a combination of two or more of these groups.

As preferred repeating units having a fluorine atom, there can be mentioned the repeating units represented by the general formulae below.

(C-Ia)

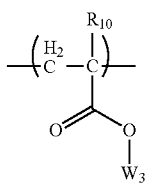

(C-Ib)

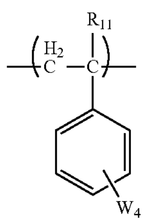

(C-Ic)

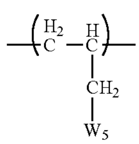

(C-Id)

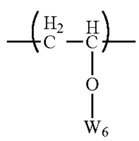

In the formulae, each of $R_{10}$ and $R_{11}$ independently represents a hydrogen atom, a fluorine atom or an alkyl group. The alkyl group is preferably a linear or branched alkyl group having 1 to 4 carbon atoms. The alkyl group may have a substituent. As a substituted alkyl group, there can be mentioned, in particular, a fluorinated alkyl group.

Each of $W_3$ to $W_6$ independently represents an organic group containing at least one fluorine atom. As such, for example, there can be mentioned the atomic groups of general formulae (F2) to (F4) above.

In another aspect, the resin (Aa) may comprise any of units of general formula (C-II) or (C-III) below.

(C-II)

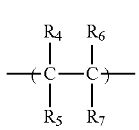

-continued (C-III)

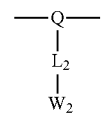

In general formula (C-II), each of $R_4$ to $R_7$ independently represents a hydrogen atom, a fluorine atom or an alkyl group. The alkyl group is preferably a linear or branched alkyl group having 1 to 4 carbon atoms. The alkyl group may have a substituent. As a substituted alkyl group, there can be mentioned, in particular, a fluorinated alkyl group. At least one of $R_4$ to $R_7$ represents a fluorine atom. $R_4$ and $R_5$, or $R_6$ and $R_7$ may cooperate with each other to thereby form a ring.

In general formula (C-III), Q represents an alicyclic structure.

$W_2$ represents an organic group containing at least one fluorine atom. As such, for example, there can be mentioned the atomic groups of general formulae (F2) to (F4) above.

$L_2$ represents a single bond or a bivalent connecting group. As the bivalent connecting group, there can be mentioned a substituted or unsubstituted arylene group, a substituted or unsubstituted alkylene group, a substituted or unsubstituted cycloalkylene group, —O—, —$SO_2$—, —CO—, —N(R)— (in the formula, R is a hydrogen atom or an alkyl group), —$NHSO_2$— or a bivalent connecting group consisting of a combination of two or more of these.

Particular examples of the repeating units each containing a fluorine atom are shown below, which in no way limit the scope of the present invention.

In the particular examples, $X_1$ represents a hydrogen atom, —$CH_3$, —F or —$CF_3$, and $X_2$ represents —F or —$CF_3$.

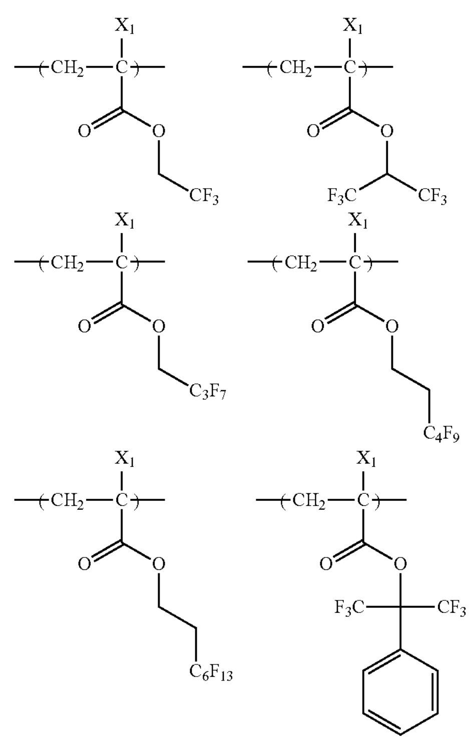

-continued
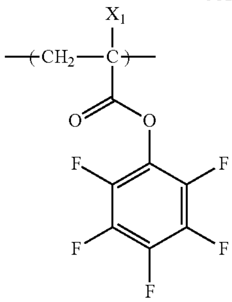
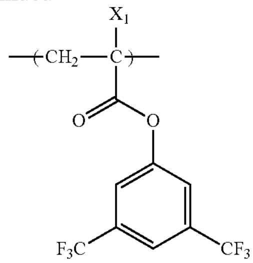
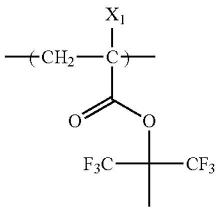
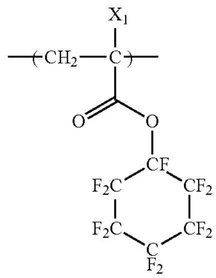
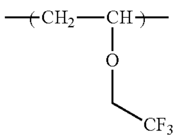
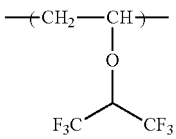
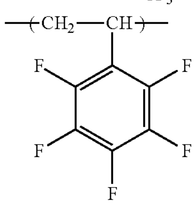
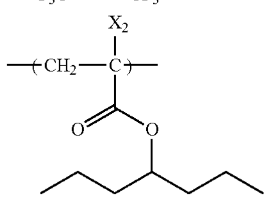
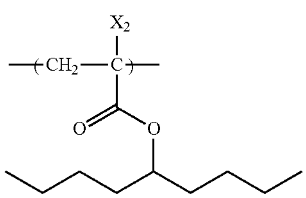
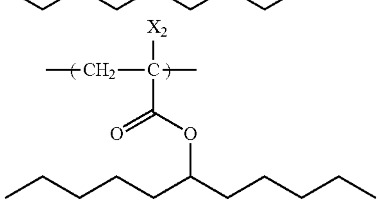
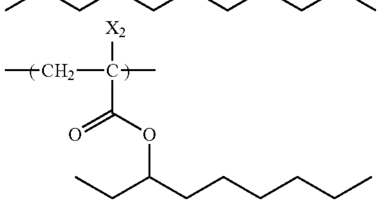
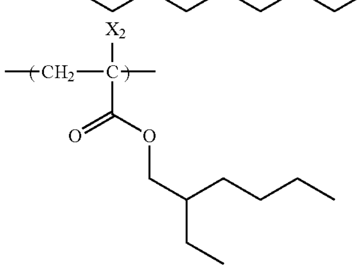
-continued
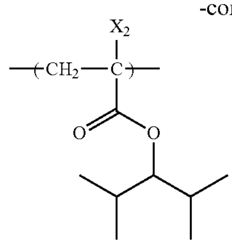
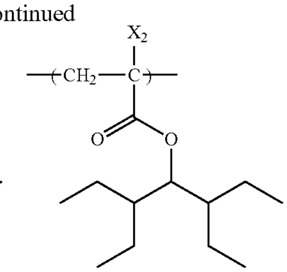
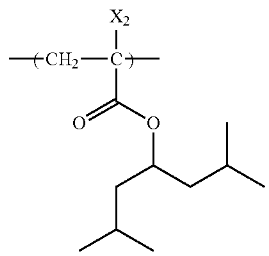
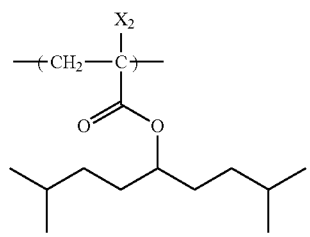
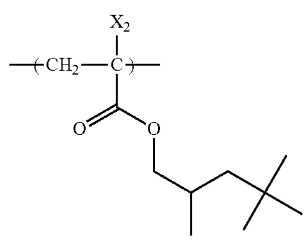
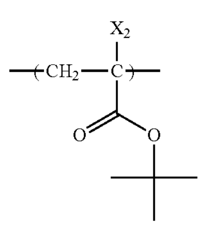
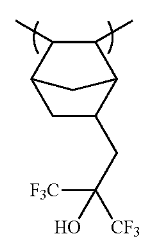
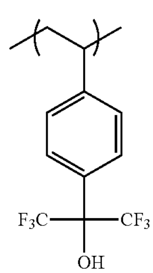
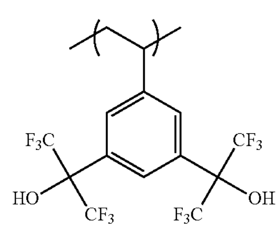

-continued

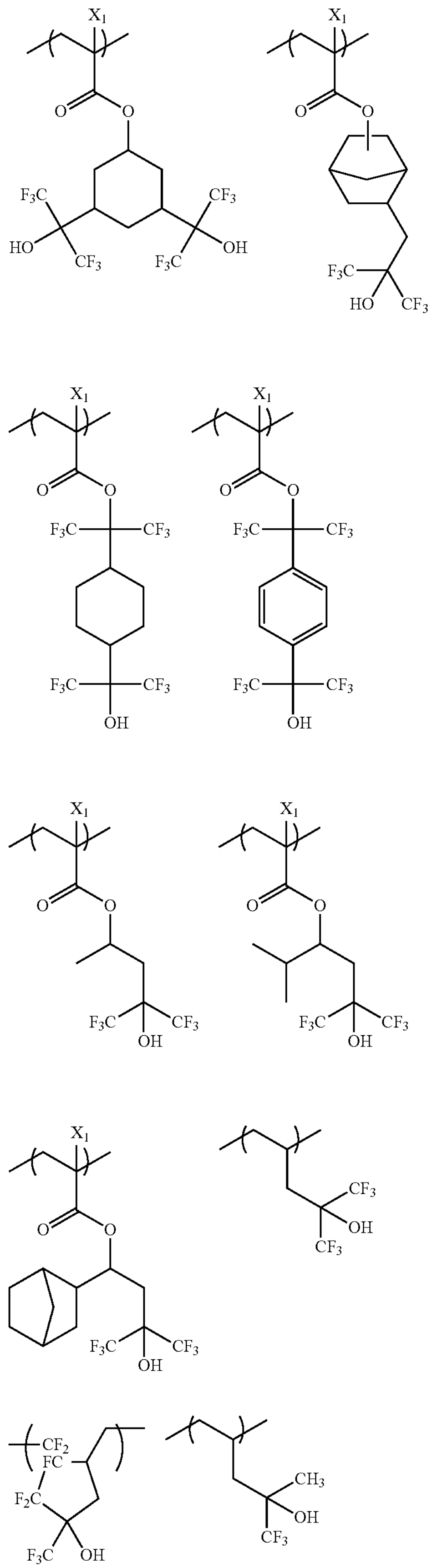

-continued

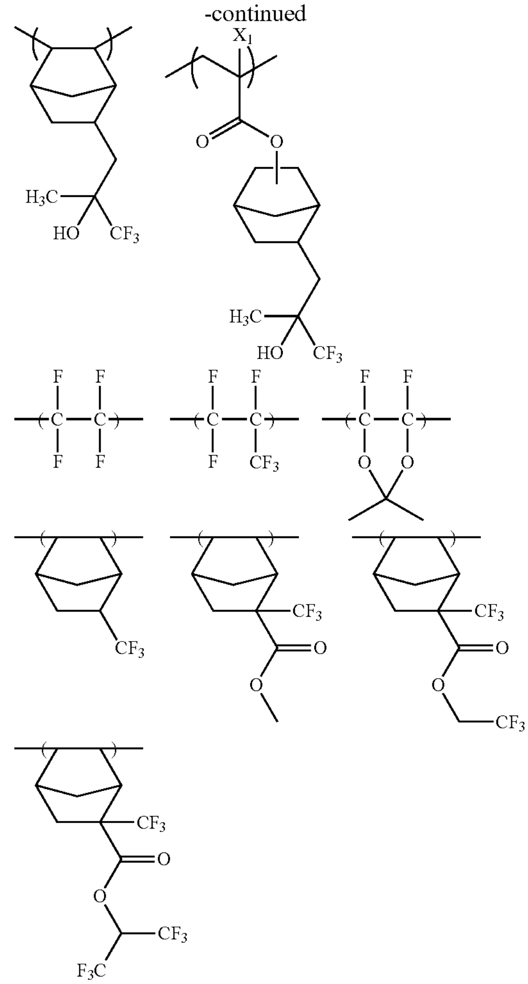

The content of repeating unit containing a fluorine atom in the resin (Aa), based on all the repeating units of the resin, is preferably in the range of 1 to 90 mol %, more preferably 5 to 85 mol %, further more preferably 10 to 80 mol % and most preferably 15 to 75 mol %.

As mentioned hereinbefore, the resin (Ab) to be described hereinafter preferably contains no fluorine atom. The content of repeating unit containing a fluorine atom in the resin (Aa) is greater than the content of optional repeating unit containing a fluorine atom in the resin (Ab). From the viewpoint of the uneven distribution of the resin (Aa) into a film surface, the content of repeating unit containing a fluorine atom in the resin (Aa) is preferably greater than the content of optional repeating unit containing a fluorine atom in the resin (Ab) by 5 mol % or more, more preferably 10 mol % or more and most preferably 15 mol % or more.

The resin (Aa) may have at least one group selected from among the following groups (x) and (z):

(x) an alkali soluble group, and (z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content of repeating units having an alkali soluble group (x) is preferably in the range of 1 to 50 mol %, more preferably 3 to 35 mol % and still more preferably 5 to 30 mol % based on all the repeating units of the polymer.

Specific examples of the repeating units having an alkali soluble group (x) will be shown below, which however in no way limit the scope of the present invention.

In the formulae, Rx represents H, $CH_3$, $CH_2OH$ or $CF_3$.

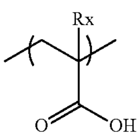

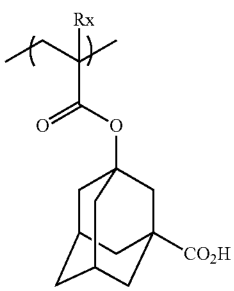

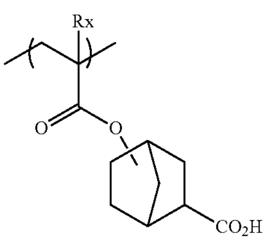

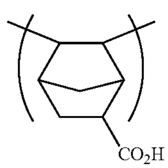

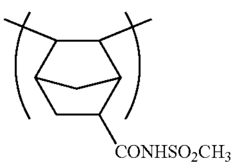

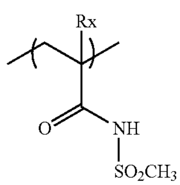

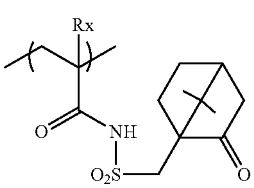

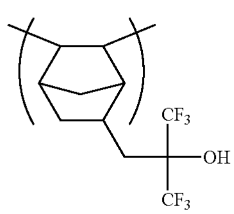

-continued

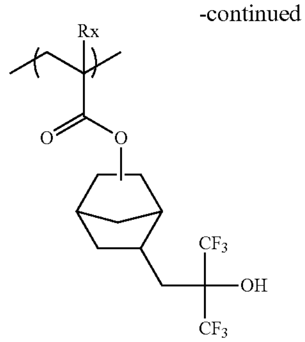

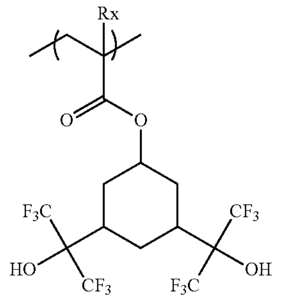

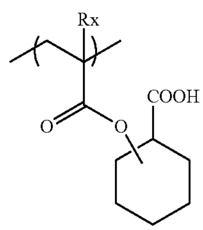

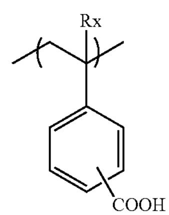

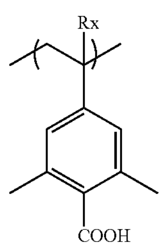

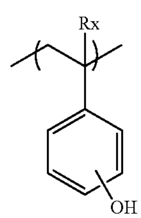

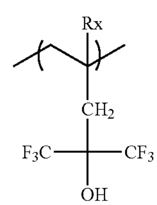

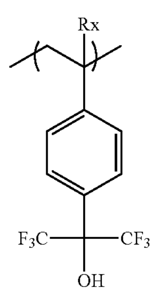

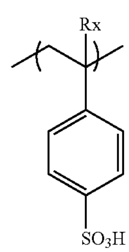

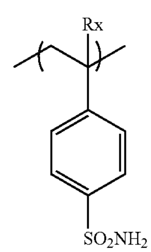

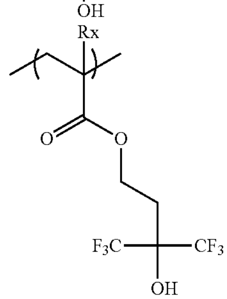

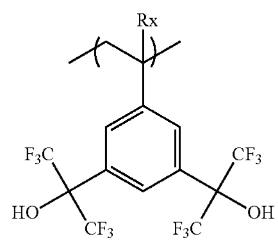

-continued

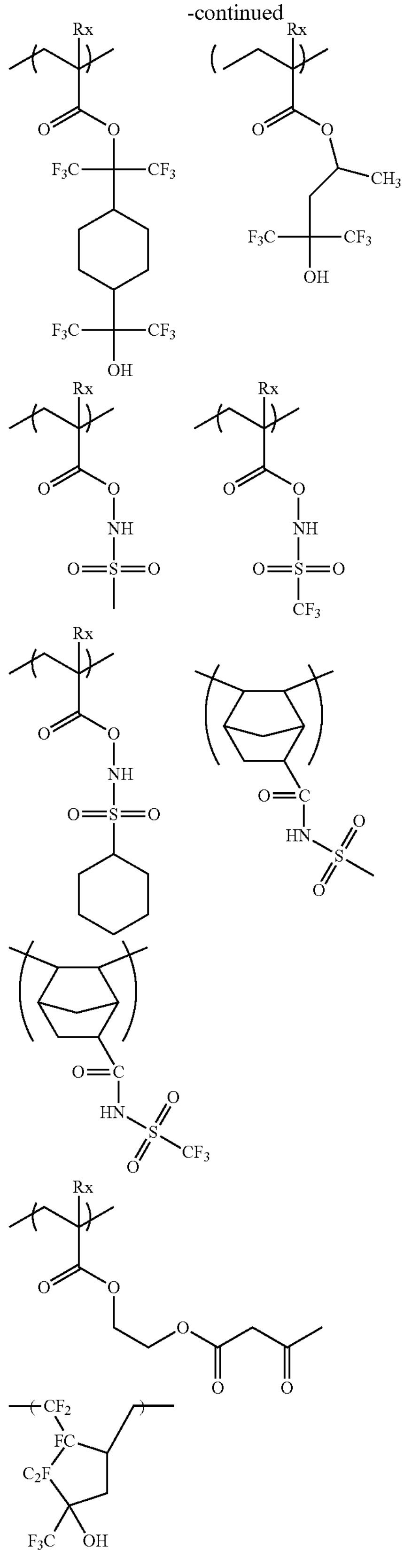

As the repeating unit containing a group (z) decomposable under the action of an acid (hereinafter also referred to as an "acid-decomposable group") introduced in the resin (Aa), there can be mentioned, for example, any of those of general formulae (AI), (A1), (A2), etc. to be described hereinafter in connection with the resin (Ab). Herein, the "acid-decomposable group" refers to a group that when acted on by an acid, is decomposed to thereby increase its solubility in an alkali developer. Details thereof will be given hereinafter in connection with the resin (Ab). It is preferred for the acid-decomposable group to be a cumyl ester group, an enol ester group, an acetal ester group, a tertiary alkyl ester group, a secondary benzyl ester group, a tertiary alkyloxy group, a tertialy alkyloxycarbonyloxy group, an acetal group or the like. A tertiary alkyl ester group, a secondary benzyl ester group, an acetal ester group and an acetal group are more preferred.

Preferably, the resin (Aa) further comprises any of the repeating units of general formula (A4) below. If so, for example, the quality of the film can be enhanced, and the film thinning in unexposed areas can further be suppressed.

(A4)

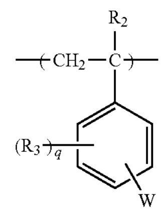

In general formula (A4), $R_2$ represents a hydrogen atom, a methyl group, a cyano group, a halogen atom or a perfluoro group having 1 to 4 carbon atoms. $R_3$ represents a hydrogen atom, an alkyl group, a cycloalkyl group, a halogen atom, an aryl group, an alkoxy group or an acyl group. In the formula, q is an integer of 0 to 4, and W represents a group that is not decomposed under the action of an acid or a hydrogen atom (hereinafter also referred to as an acid-stable group).

As preferred acid-stable group represented by W, there can be mentioned, for example, an acyl group, an alkylamido group, an alkylcarbonyloxy group, an alkyloxy group, a cycloalkyloxy group or an aryloxy group. W is more preferably an acyl group, an alkylcarbonyloxy group, an alkyloxy group, a cycloalkyloxy group or an aryloxy group.

The alkyl group represented by W is preferably one having 1 to 4 carbon atoms, such as a methyl group, an ethyl group, a propyl group, an n-butyl group, a sec-butyl group or a t-butyl group.

The cycloalkyl group represented by W is preferably one having 3 to 10 carbon atoms, such as a cyclopropyl group, a cyclobutyl group, a cyclohexyl group or an adamantyl group.

The alkenyl group represented by W is preferably one having 2 to 4 carbon atoms, such as a vinyl group, a propenyl group, an allyl group or a butenyl group.

The aryl group represented by W is preferably one having 6 to 14 carbon atoms, such as a phenyl group, a xylyl group, a tolyl group, a cumenyl group, a naphthyl group or an anthryl group.

The alkyl group contained in the acyl group, alkylamido group, alkylcarbonyloxy group and alkyloxy group represented by W can be the same as set forth above as the alkyl group represented by W.

The cycloalkyl group contained in the cycloalkyloxy group represented by W can be the same as set forth above as the cycloalkyl group represented by W.

The aryl group contained in the aryloxy group, the arylamidomethyl group or the arylamido group represented by W can be the same as set forth above as the aryl group represented by W.

As indicated in general formula (A4), any arbitrary hydrogen atom of the benzene ring of the styrene skeleton can be replaced by W. The site of substitution with W is not particularly limited. Preferably, the substitution is effected at the meta- or para-position. Most preferably, the substitution is effected at the para-position.

Non-limiting specific examples of the repeating units of general formula (A4) are shown below.

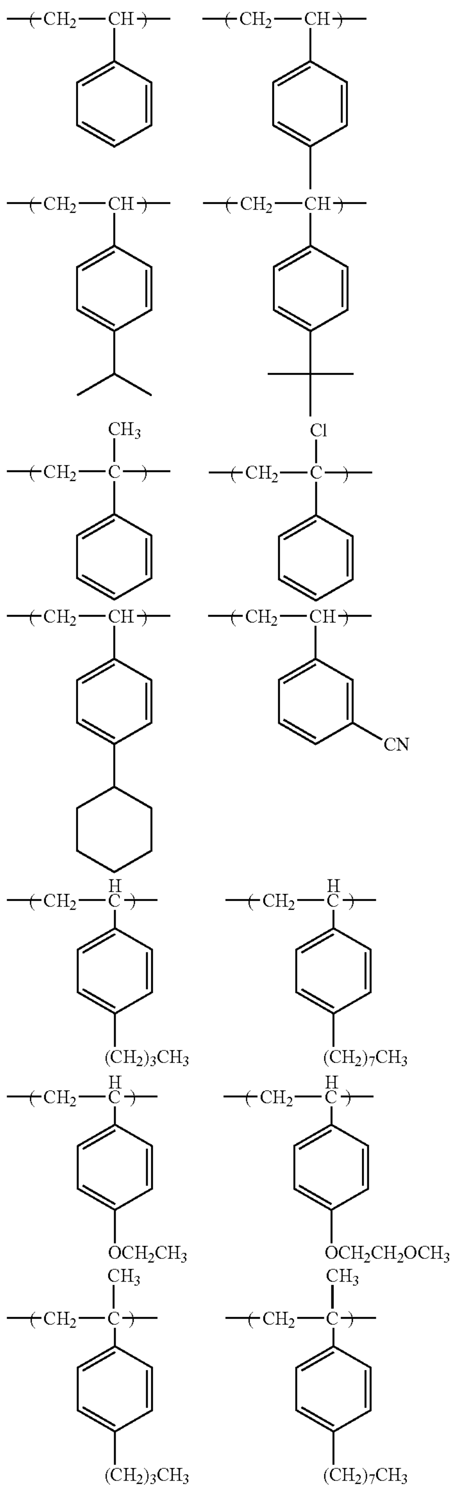

-continued

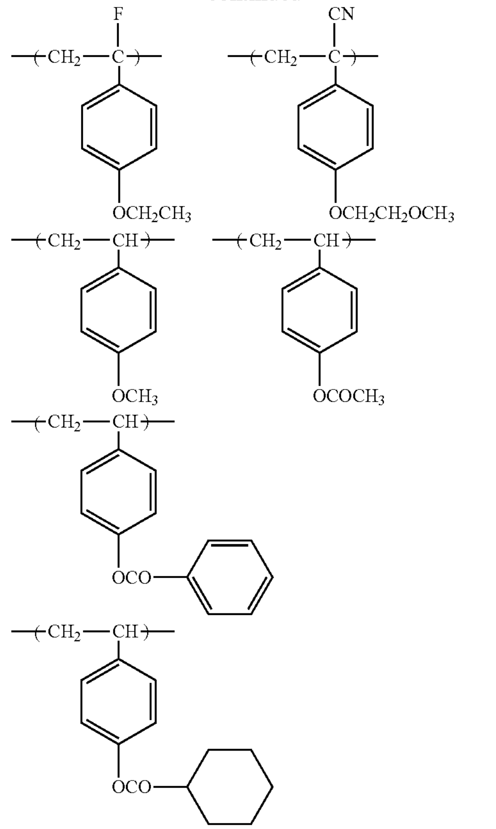

The resin (Aa) may further comprise a repeating unit of (meth)acrylic acid derivative that is not decomposed under the action of an acid. Non-limiting specific examples of the repeating units are shown below.

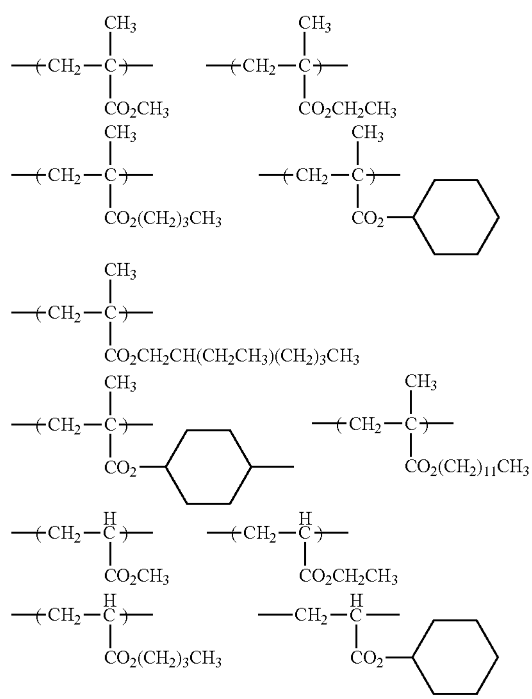

-continued

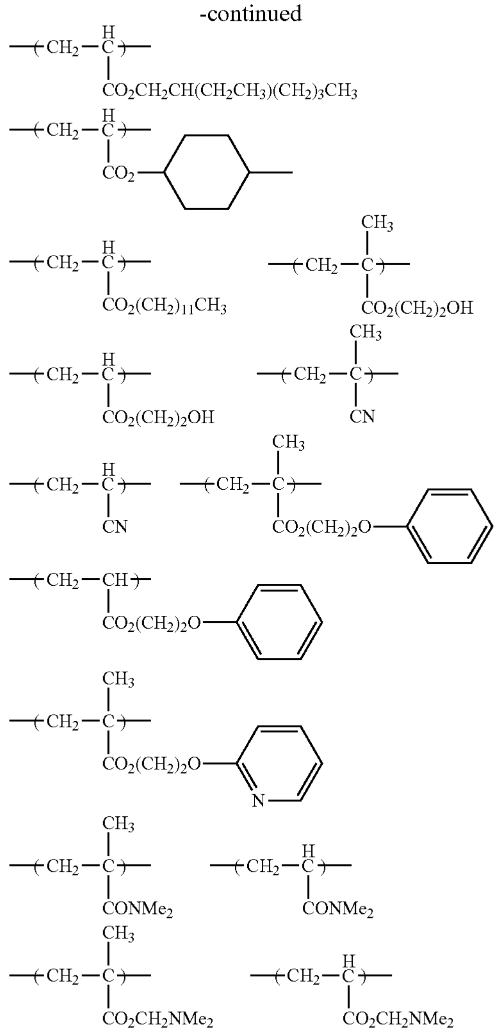

The resin (Aa) may further comprise a repeating unit containing any of acid-decomposable groups of the formula —C(=O)—$X_1$—$R_0$. In the formula, $X_1$ represents an oxygen atom, a sulfur atom, —NH—, —$NHSO_2$— or —$NHSO_2NH$—. $R_0$ is a group cleaved under the action of an acid. As such, there can be mentioned, for example, a tertiary alkyl group, such as a t-butyl group or a t-amyl group; an isobornyl group; a 1-alkoxyethyl group, such as a 1-ethoxyethyl group, a 1-butoxyethyl group, a 1-isobutoxyethyl group or a 1-cyclohexyloxyethyl group; an alkoxymethyl group, such as a 1-methoxymethyl group or a 1-ethoxymethyl group; a 3-oxoalkyl group; a tetrahydropyranyl group; a tetrahydrofuranyl group; a trialkylsilyl ester group; a 3-oxocyclohexyl ester group; a 2-methyl-2-adamantyl group; or a mevalonolactone residue.

The resin (Aa) may further contain a repeating unit containing a group that when acted on by an alkali developer, is decomposed to thereby increase its rate of dissolution in the alkali developer.

As the group that is decomposed by the action of an alkali developer to thereby increase its rate of dissolution into the alkali developer, there can be mentioned a lactone structure, a phenyl ester structure or the like.

It is preferred for the repeating unit to be any of the repeating units of general formula (AII) below.

(AII)

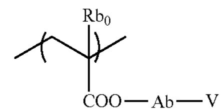

In general formula (AII), $Rb_0$ represents a hydrogen atom, a halogen atom or an optionally substituted alkyl group (preferably having 1 to 4 carbon atoms).

As preferred substituents that may be introduced in the alkyl group represented by $Rb_0$, there can be mentioned a hydroxyl group and a halogen atom. As the halogen atom represented by $Rb_0$, there can be mentioned a fluorine atom, a chlorine atom, a bromine atom or an iodine atom. $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with a monocyclic or polycyclic aliphatic hydrocarbon ring structure, an ether group, an ester group, a carbonyl group, or a bivalent connecting group resulting from combination of these. Ab is preferably a single bond or any of the bivalent connecting groups of the formula -$Ab_1$-$CO_2$—.

$Ab_1$ represents a linear or branched alkylene group or a monocyclic or polycyclic aliphatic hydrocarbon ring group, preferably a methylene group, an ethylene group, a cyclohexylene group, an adamantylene group or a norbornylene group.

V represents a group that is decomposed by the action of an alkali developer to thereby increase its rate of dissolution into the alkali developer. V is preferably a group with an ester bond. In particular, a group with a lactone structure is more preferred.

The group with a lactone structure is not limited as long as a lactone structure is introduced therein. A 5 to 7-membered ring lactone structure is preferred, and one resulting from the condensation of a 5 to 7-membered ring lactone structure with another cyclic structure effected in a fashion to form a bicyclo structure or spiro structure is especially preferred. More preferably, V is a group with any of the lactone structures of general formulae (LC1-1) to (LC1-17) above. The resin may further contain a repeating unit in which a lactone structure is directly bonded to the principal chain. Preferred lactone structures are those of formulae (LC1-1), (LC1-4), (LC1-5), (LC1-6), (LC1-13) and (LC1-14).

LC1-1

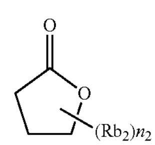

LC1-2

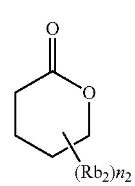

-continued

LC1-3

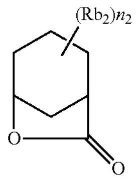

LC1-4

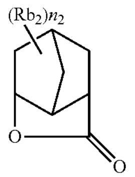

LC1-5

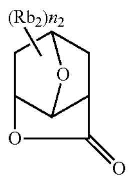

LC1-6

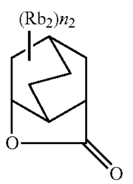

LC1-7

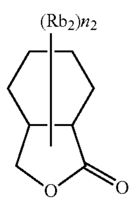

LC1-8

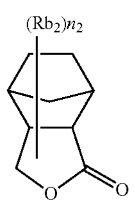

LC1-9

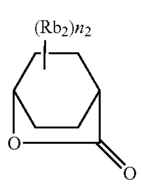

LC1-10

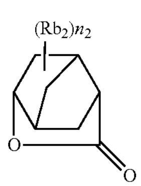

-continued

LC1-11

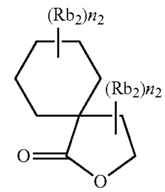

LC1-12

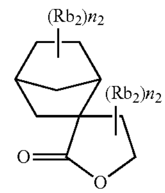

LC1-13

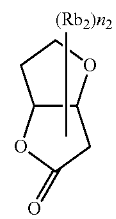

LC1-14

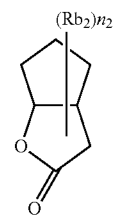

LC1-15

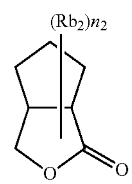

LC1-16

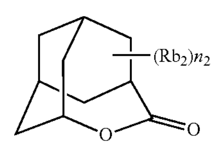

LC1-17

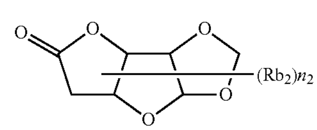

The presence of a substituent ($Rb_2$) on the portion of the lactone structure is optional. As a preferred substituent ($Rb_2$), there can be mentioned an alkyl group having 1 to 8 carbon atoms, a monovalent aliphatic hydrocarbon ring group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity thereof is preferably 90% ee or higher, more preferably 95% ee or higher.

Particular examples of the repeating units each having a lactone structure contained in the resin are shown below, which in no way limit the scope of the present invention. In the following formulae, Rx represents H, $CH_3$, $CH_2OH$ or $CF_3$.

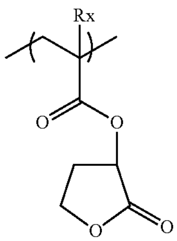
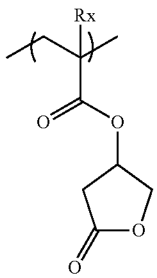
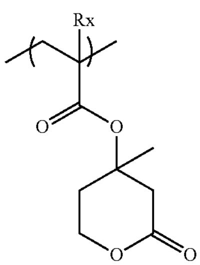
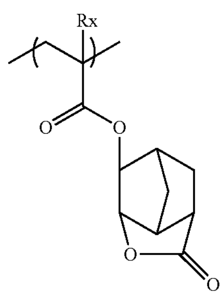
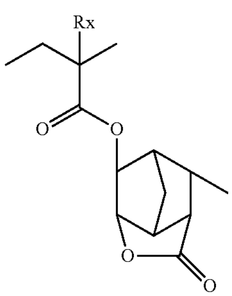
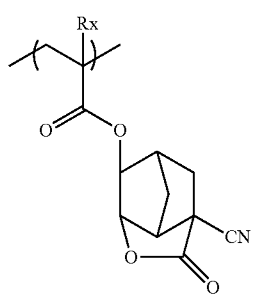
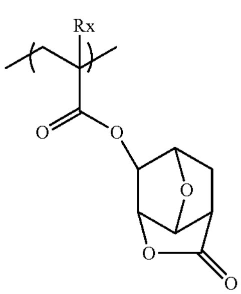
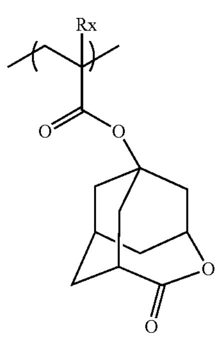

-continued

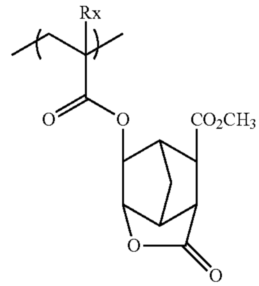
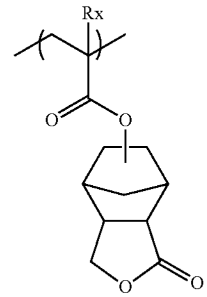
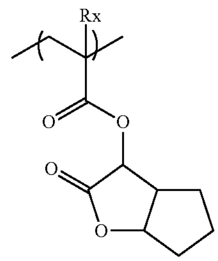
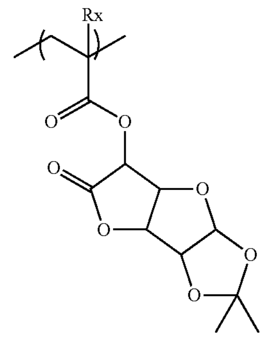
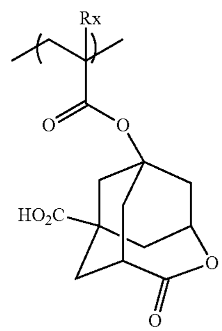
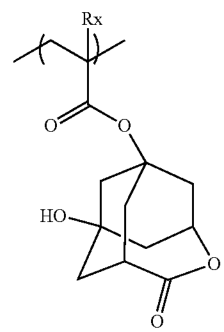
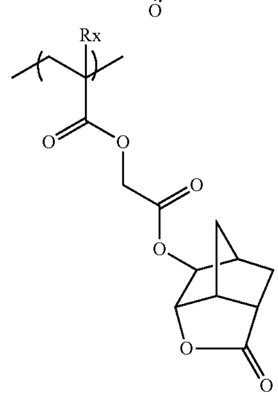
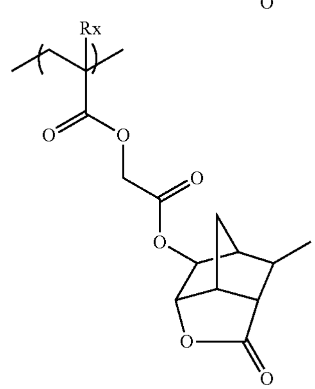

-continued
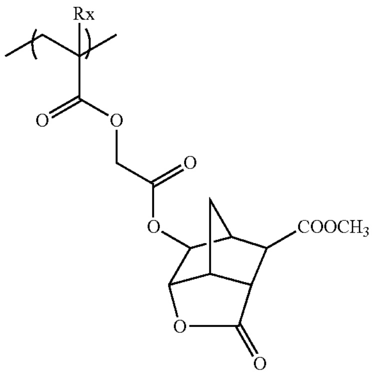
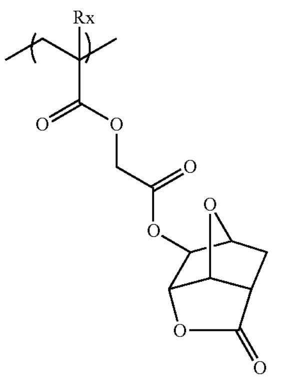
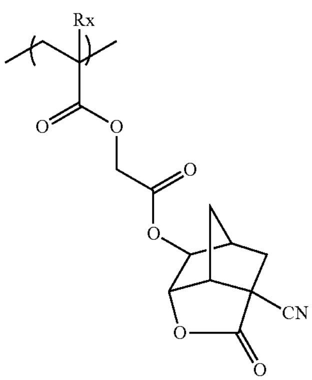
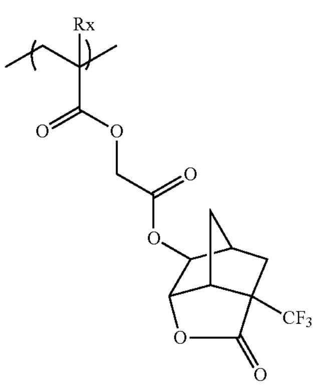
-continued
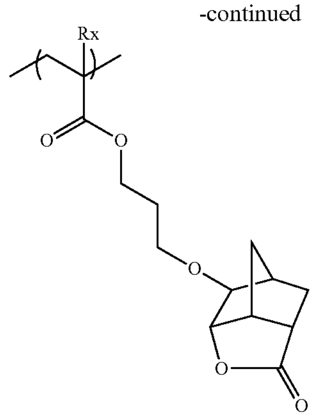
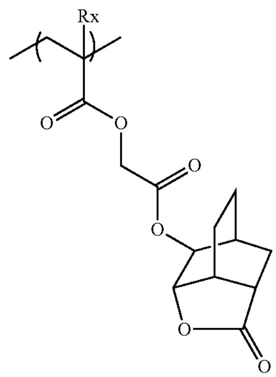
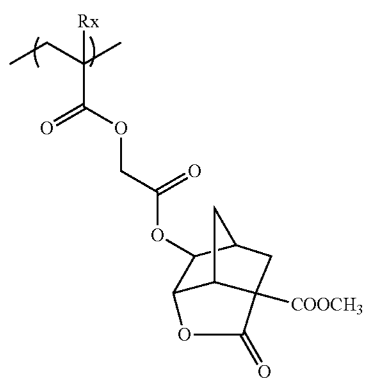
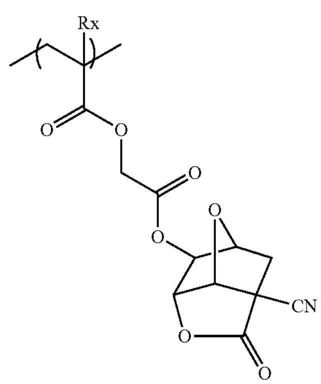

-continued

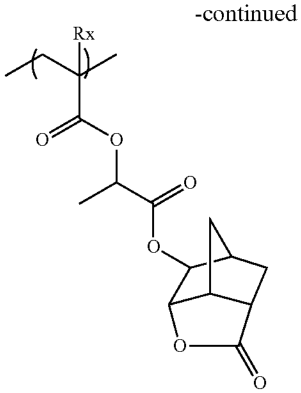

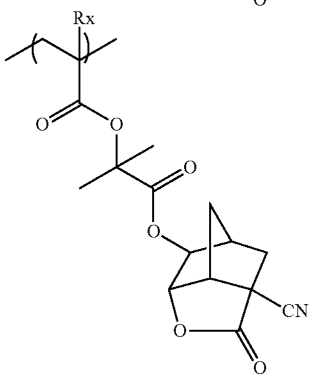

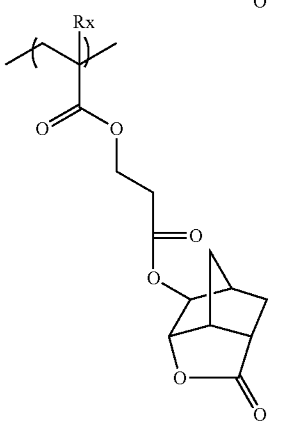

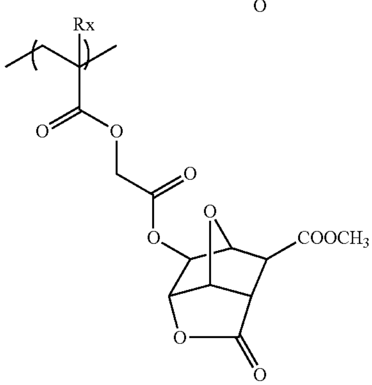

The resin (Aa) may further comprise another repeating unit containing an alkali-soluble group, such as a phenolic hydroxyl group or a carboxyl group, in order to maintain favorable developability in an alkali developer. Moreover, in order to enhance the film quality, the resin (Aa) may further comprise a hydrophobic repeating unit derived from a monomer, such as an alkyl acrylate or an alkyl methacrylate.

[Other Repeating Unit]

The resin (Aa) may further comprise a repeating unit that is other than the repeating units mentioned hereinbefore and that has a polar group. As the polar group, there can be mentioned a hydroxyl group, a cyano group, a carboxyl group, a sulfonylimido group, a bissulfonylimido group, an alcoholic hydroxyl group substituted at its α-position with an electron withdrawing group (for example, a hexafluoroisopropanol group: —$C(CF_3)_2OH$) or the like. The incorporation of this other repeating unit in the resin (Aa) can enhance the adherence to substrates and the developer affinity. The repeating unit that is other than the repeating units mentioned hereinbefore and that has a polar group is preferably a repeating unit containing a hydroxyl group or a cyano group, more preferably a repeating unit containing an alicyclic hydrocarbon structure substituted with a hydroxyl group or a cyano group, in which further preferably no acid-decomposable group is contained. In the alicyclic hydrocarbon structure substituted with a hydroxy group or a cyano group, the alicyclic hydrocarbon structure preferably consists of an adamantyl group, a diamantyl group or a norbornane group. As preferred alicyclic hydrocarbon structures substituted with a hydroxy group or a cyano group, the partial structures represented by the following general formulae (VIIa) to (VIId) can be exemplified.

(VIIa)

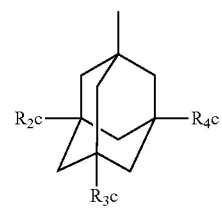

(VIIb)

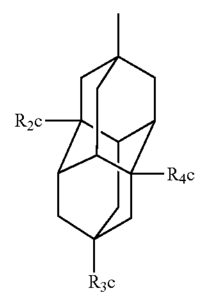

(VIIc)

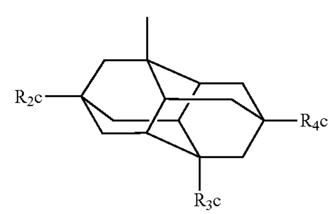

(VIId)

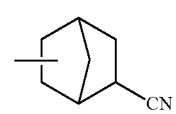

In general formulae (VIIa) to (VIIc), each of $R_2c$ to $R_4c$ independently represents a hydrogen atom, a hydroxy group or a cyano group, with the proviso that at least one of the $R_2c$ to $R_4c$ represents a hydroxy group or a cyano group. Preferably, one or two of the $R_2c$ to $R_4c$ are hydroxy groups and the remainder is a hydrogen atom. In the general formula (VIIa), more preferably, two of the $R_2c$ to $R_4c$ are hydroxy groups and the remainder is a hydrogen atom.

As the repeating units having any of the partial structures represented by the general formulae (VIIa) to (VIId), those of the following general formulae (AIIa) to (AIId) can be exemplified.

(AIIa)

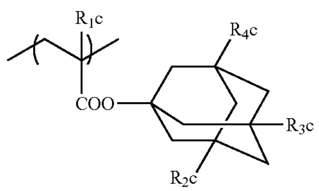

(AIIb)

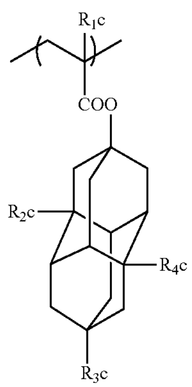

(AIIc)

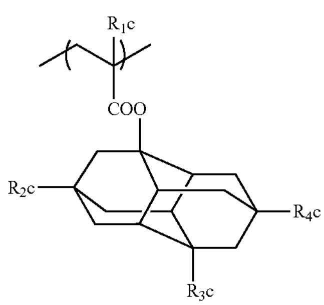

(AIId)

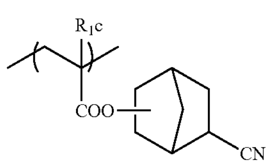

In general formulae (AIIa) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc). It is optional for the resin (Aa) to comprise a repeating unit containing a polar group. When the repeating unit is contained, the content thereof is preferably in the range of 1 to 60 mol %, more preferably 5 to 50 mol %, based on all the repeating units of the resin (Aa).

Specific examples of the repeating units each containing a polar group are shown below, which in no way limit the scope of the present invention.

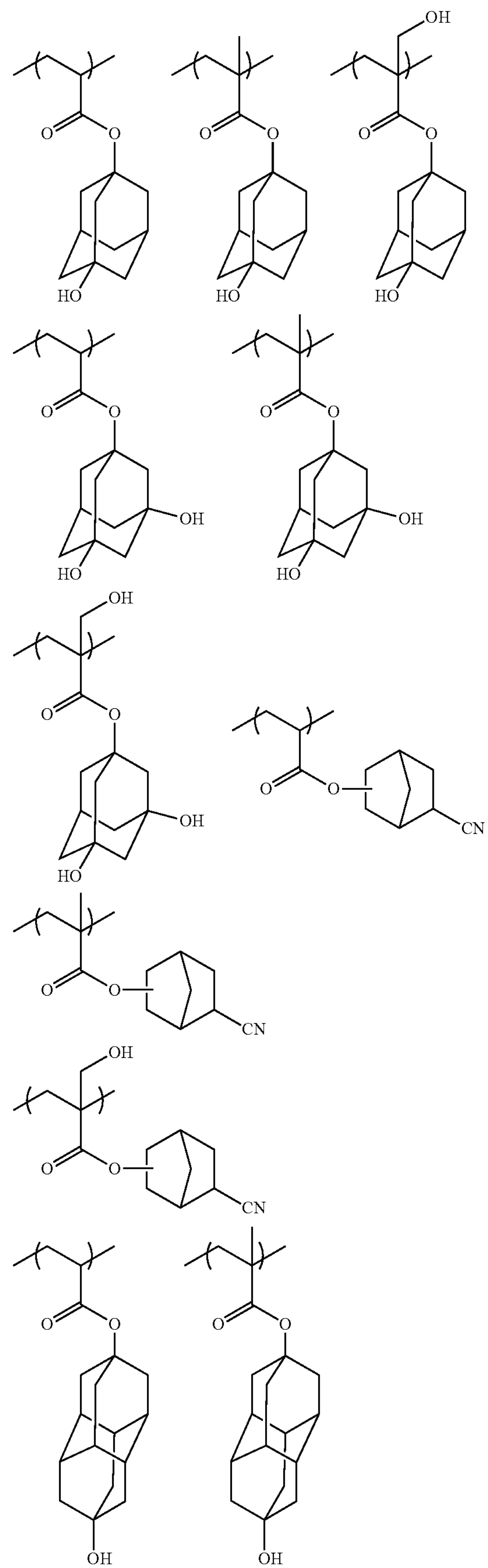

-continued

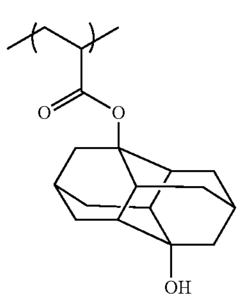

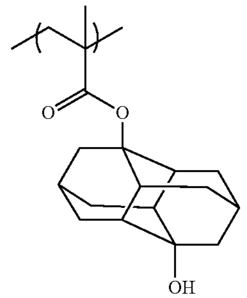

The resin (Aa) according to the present invention can further contain a repeating unit having a cyclic hydrocarbon structure in which no polar group is introduced and exhibiting no acid-decomposability. As such a repeating unit, there can be mentioned any of the repeating units of general formula (VII) below.

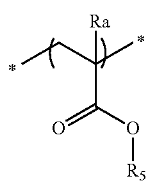

(VII)

In general formula (VII), $R_5$ represents a hydrocarbon group having at least one cyclic hydrocarbon structure in which no polar group (for example, a hydroxyl group or a cyano group) is introduced.

Ra represents a hydrogen atom, an alkyl group or a group of the formula —$CH_2$—O—$Ra_2$. In this formula, $Ra_2$ represents a hydrogen atom, an alkyl group or an acyl group. Ra is preferably a hydrogen atom, a methyl group, a hydroxyalkyl group or a trifluoromethyl group, most preferably a hydrogen atom or a methyl group.

The cyclic hydrocarbon structures introduced in $R_5$ include a monocyclic hydrocarbon group and a polycyclic hydrocarbon group. The monocyclic hydrocarbon group is preferably a monocyclic hydrocarbon group having 3 to 7 carbon atoms, more preferably a cyclopentyl group or a cyclohexyl group.

The polycyclic hydrocarbon groups include a ring-assembly hydrocarbon group and a crosslinked-ring hydrocarbon group. As preferred crosslinked-ring hydrocarbon rings, there can be mentioned a norbornyl group, an adamantyl group, a bicyclooctanyl group, a tricyclo[5.2.1.$0^{2,6}$]decanyl group and the like. As more preferred crosslinked-ring hydrocarbon rings, there can be mentioned a norbornyl group and an adamantyl group.

Substituents may be introduced in these cyclohydrocarbon groups. As preferred substituents, there can be mentioned a halogen atom (bromine, chlorine or fluorine atom) and an alkyl group (methyl, ethyl, butyl or t-butyl group). A further substituent may be introduced in this alkyl group. As the optional further substituent, there can be mentioned a halogen atom, an alkyl group, a hydroxyl group with its hydrogen atom replaced or an amino group with its hydrogen atom replaced.

As a substituent for the replacement of the hydrogen atom, there can be mentioned, for example, an alkyl group, a monovalent aliphatic hydrocarbon ring group, an aralkyl group, a substituted methyl group, a substituted ethyl group, an acyl group, an alkoxycarbonyl group or an aralkyloxycarbonyl group. Preferred alkyl groups include alkyl groups each having 1 to 4 carbon atoms. Preferred substituted methyl groups include methoxymethyl, methoxythiomethyl, benzyloxymethyl, t-butoxymethyl and 2-methoxyethoxymethyl groups. Preferred substituted ethyl groups include 1-ethoxyethyl and 1-methyl-1-methoxyethyl groups. Preferred acyl groups include aliphatic acyl groups having 1 to 6 carbon atoms, such as formyl, acetyl, propionyl, butyryl, isobutyryl, valeryl and pivaloyl groups. Preferred alkoxycarbonyl groups include alkoxycarbonyl groups each having 1 to 4 carbon atoms and the like. It is optional for the resin (Aa) to contain the repeating unit with a cyclohydrocarbon structure containing no polar group, which repeating unit does not exhibit any acid decomposability. When the repeating unit is contained, the content thereof is preferably in the range of 1 to 40 mol %, more preferably 5 to 20 mol %, based on all the repeating units of the resin (Aa).

Particular examples of the repeating units with a cyclohydrocarbon structure containing no polar group, which repeating units do not exhibit any acid decomposability are shown below. The examples in no way limit the scope of the present invention. In the formulae, Ra represents H, $CH_3$, $CH_2OH$ or $CF_3$.

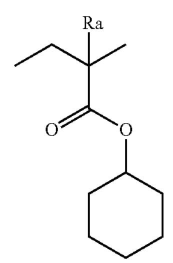

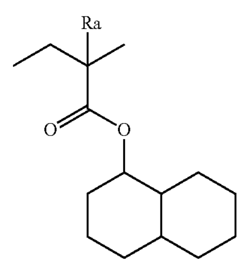

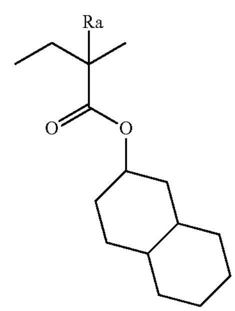

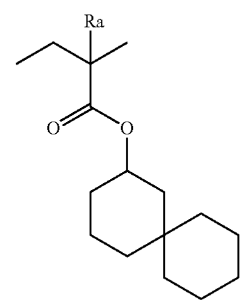

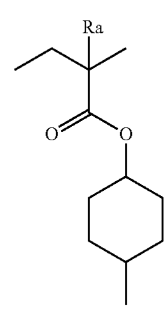

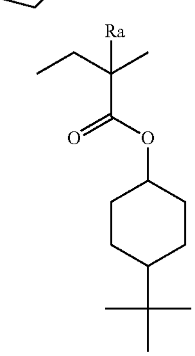

-continued
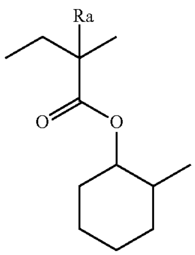
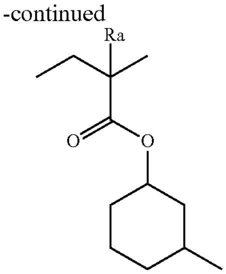
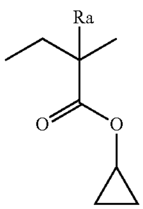
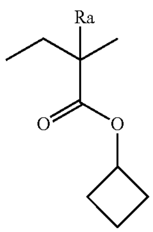
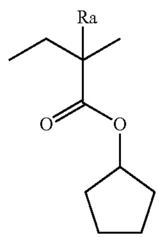
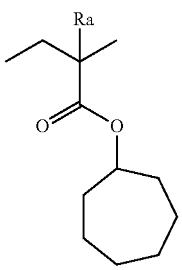
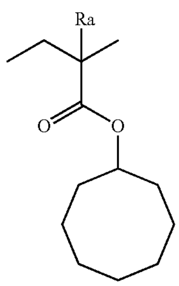
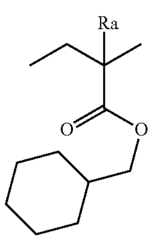
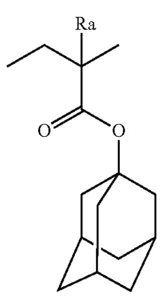
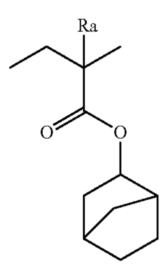
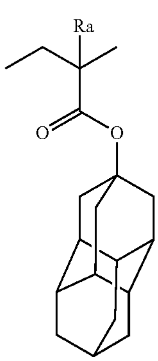
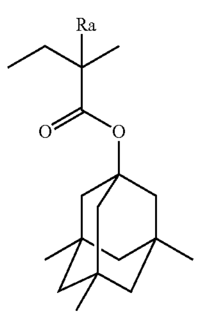
-continued
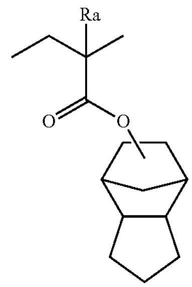
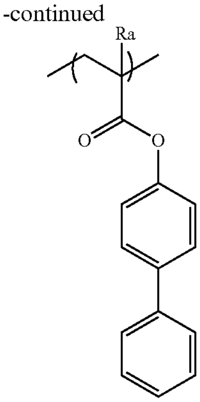
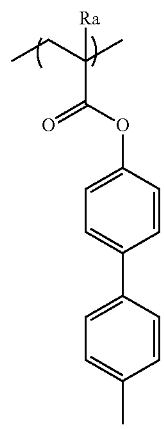
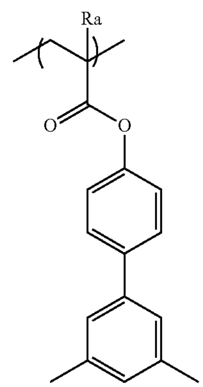
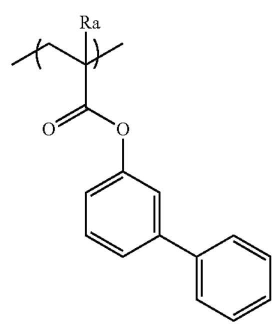
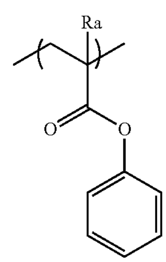
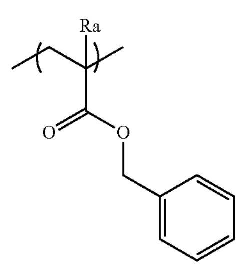
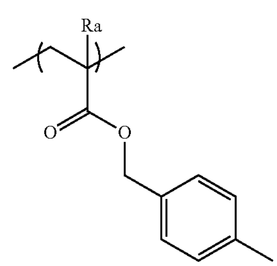
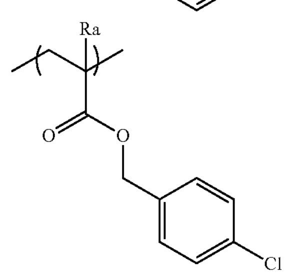

-continued

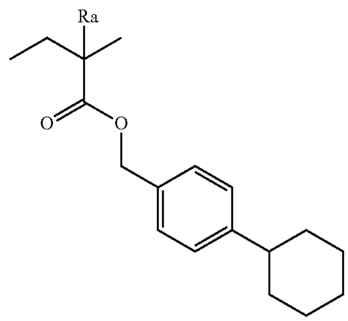

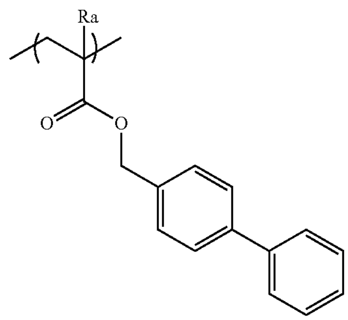

The resin (Aa) according to the present invention can contain, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would allow fine regulation of the required properties of the resin for use in the composition of the present invention, especially:

(1) solubility in application solvents, (2) film forming easiness (glass transition point), (3) alkali developability, (4) film thinning (selections of hydrophilicity/hydrophobicity and alkali-soluble group), (5) adhesion of unexposed area to substrate, (6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters, styrenes, crotonic esters and the like. As other compounds, there can be mentioned maleic anhydride, maleimide, acrylonitrile, methacrylonitrile and maleironitrile.

In addition, any unsaturated compound capable of addition polymerization that is copolymerizable with monomers corresponding to the above various repeating structural units may be copolymerized therewith.

Nonlimiting preferred specific examples of the repeating units derived from such other polymerizable monomers are shown below.

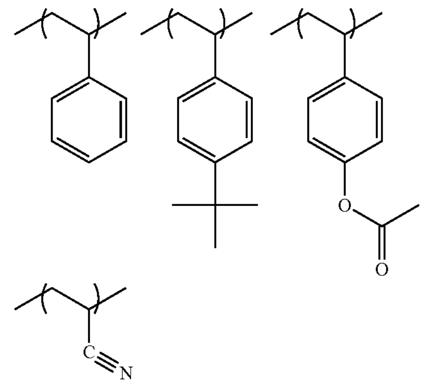

In the resin (P) for use in the composition of the present invention, the molar ratios of individual repeating structural units contained are appropriately determined from the viewpoint of regulation of not only the dry etching resistance of the resist but also the standard developer adaptability, substrate adhesion, resist profile and generally required properties of the resist such as the resolving power, heat resistance and sensitivity.

The content of the repeating units having an acid-decomposable group is preferably in the range of 0 to 95 mol %, more preferably 10 to 60 mol % and further more preferably 15 to 50 mol %, based on all the repeating units of the resin (Aa).

The content of the repeating units of general formula (A1) is preferably in the range of 0 to 90 mol %, more preferably 0 to 85 mol % and further more preferably 0 to 80 mol %, based on all the repeating units of the resin (Aa).

The content of the repeating units of general formula (A2) is preferably in the range of 0 to 90 mol %, more preferably 0 to 75 mol % and further more preferably 0 to 60 mol %, based on all the repeating units of the resin (Aa).

The content of the repeating units of general formula (A3) is preferably in the range of 0 to 70 mol %, more preferably 1 to 50 mol % and further more preferably 5 to 40 mol %, based on all the repeating units of the resin (Aa).

The content of repeating unit expressed by general formula (A4) in the resin (Aa), based on all the repeating units of the resin, is preferably in the range of 0 to 50 mol %, more preferably 0 to 40 mol % and most preferably 0 to 30 mol %.

When the repeating unit containing a group that is decomposed by the action of an alkali developer to thereby increase its rate of dissolution in the alkali developer is contained in the resin (Aa), the content of thereof, based on all the repeating units of the resin, is preferably in the range of 0.5 to 80 mol %, more preferably 1 to 60 mol % and further more preferably 2 to 40 mol %.

The resin (Aa) may further have other repeating units. Preferred forms of the other repeating units are as follows:

(cy1) repeating unit that contains a fluorine atom and/or a silicon atom, being stable in an acid and insoluble in an alkali developer, (cy2) repeating unit that contains neither a fluorine atom nor a silicon atom, being stable in an acid and insoluble in an alkali developer, (cy3) repeating unit that contains a fluorine atom and/or a silicon atom, having a polar group other than the aforementioned groups (x) and (z), and (cy4) repeating unit that contains neither a fluorine atom nor a silicon atom, having a polar group other than the aforementioned groups (x) and (z).

The expression "insoluble in an alkali developer" with respect to the repeating units (cy1) and (cy2) means that the repeating units (cy1) and (cy2) contain neither an alkali-soluble group nor a group that produces an alkali-soluble group by the action of an acid or an alkali developer (for example, an acid-decomposable group or a polarity converting group).

It is preferred for the repeating units (cy1) and (cy2) to have an alicyclic hydrocarbon structure having no polar group.

Preferred forms of the repeating units (cy1) to (cy4) will be shown below.

The repeating units (cy1) and (cy2) are preferably those of general formula (CIII) below.

(CIII)

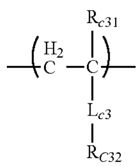

In general formula (CIII), $R_{c31}$ represents a hydrogen atom, an alkyl group, an alkyl group substituted with a fluorine atom, a cyano group or —$CH_2$—O—$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, especially preferably a hydrogen atom or a methyl group.

$R_{c32}$ represents a group having any of an alkyl group, a cycloalkyl group, an alkenyl group and a cycloalkenyl group. These groups may optionally be substituted with a fluorine atom or a silicon atom.

$L_{c3}$ represents a single bond or a bivalent connecting group.

In general formula (CIII), the alkyl group represented by $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

Preferably, $R_{c32}$ represents an unsubstituted alkyl group or an alkyl group substituted with a fluorine atom.

The bivalent connecting group represented by $L_{c3}$ is preferably an alkylene group (preferably having 1 to 5 carbon atoms), an oxy group, a phenylene group or an ester bond (—COO—).

The repeating units (cy1) and (cy2) are preferably those of general formula (C4) or (C5) below.

It is preferred for the repeating unit (CIII) to be the repeating unit of general formula (C4) or (C5) below.

(C4)

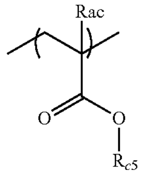

-continued (C5)

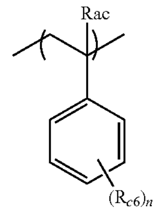

In general formula (C4), $R_{c5}$ represents a hydrocarbon group having at least one cyclic structure in which neither a hydroxyl group nor a cyano group is contained.

Rac represents a hydrogen atom, an alkyl group that may be substituted with a fluorine atom, a cyano group or a group of the formula —$CH_2$—O—$Rac_2$ in which $Rac_2$ represents a hydrogen atom, an alkyl group or an acyl group. Rac is preferably a hydrogen atom, a methyl group, a hydroxymethyl group and a trifluoromethyl group, especially preferably a hydrogen atom and a methyl group.

The cyclic structures contained in $R_{c5}$ include a monocyclic hydrocarbon group and a polycyclic hydrocarbon group. As the monocyclic hydrocarbon group, there can be mentioned, for example, a cycloalkyl group having 3 to 12 carbon atoms or a cycloalkenyl group having 3 to 12 carbon atoms. Preferably, the monocyclic hydrocarbon group is a monocyclic hydrocarbon group having 3 to 7 carbon atoms.

The polycyclic hydrocarbon groups include ring-assembly hydrocarbon groups and crosslinked-ring hydrocarbon groups. As the crosslinked-ring hydrocarbon rings, there can be mentioned, for example, bicyclic hydrocarbon rings, tricyclic hydrocarbon rings and tetracyclic hydrocarbon rings. Further, the crosslinked-ring hydrocarbon rings include condensed-ring hydrocarbon rings, for example, condensed rings resulting from condensation of multiple 5- to 8-membered cycloalkane rings. As preferred crosslinked-ring hydrocarbon rings, there can be mentioned, for example, a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

In the general formula (C5), Rac has the same meaning as in the general formula (C4).

$R_{c6}$ represents an alkyl group, a cycloalkyl group, an alkenyl group, a cycloalkenyl group, an alkoxycarbonyl group or an alkylcarbonyloxy group. These groups may be substituted with a fluorine atom or a silicon atom.

The alkyl group represented by $R_{c6}$ is preferably a linear or branched alkyl group having 1 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The alkoxycarbonyl group is preferably an alkoxycarbonyl group having 2 to 20 carbon atoms.

The alkylcarbonyloxy group is preferably an alkylcarbonyloxy group having 2 to 20 carbon atoms.

In the formula, n is an integer of 0 to 5. When n is 2 or greater, the plurality of $R_{c6}$s may be identical to or different from each other.

It is preferred for $R_{c6}$ to represent an unsubstituted alkyl group or an alkyl group substituted with a fluorine atom. A trifluoromethyl group and a t-butyl group are especially preferred.

The repeating units (cy1) and (cy2) are preferably those of general formula (CII-AB) below.

(CII-AB)

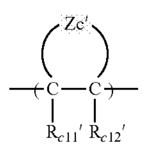

In general formula (CII-AB), each of $R_{c11}$, and $R_{c12}$, independently represents a hydrogen atom, a cyano group, a halogen atom or an alkyl group.

Zc' represents an atomic group for forming an alicyclic structure which contains two bonded carbon atoms (C—C).

Further preferably, general formula (CII-AB) is either general formula (CII-AB1) or general formula (CII-AB2) below.

CII-AB1

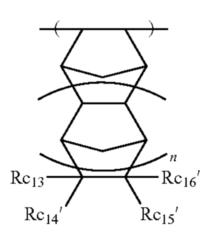

CII-AB2

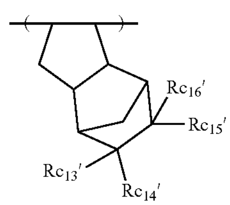

In general formulae (CII-AB1) and (CII-AB2), each of $Rc_{13}$' to $Rc_{16}$' independently represents a hydrogen atom, a halogen atom, an alkyl group or a cycloalkyl group. At least two of $Rc_{13}$' to $Rc_{16}$' may be bonded to each other to thereby form a ring.

n is 0 or 1.

Specific examples of the repeating units (cy1) and (cy2) will be shown below, which however in no way limit the scope of the present invention. In the formulae, Ra represents H, $CH_3$, $CH_2OH$, $CF_3$ or CN.

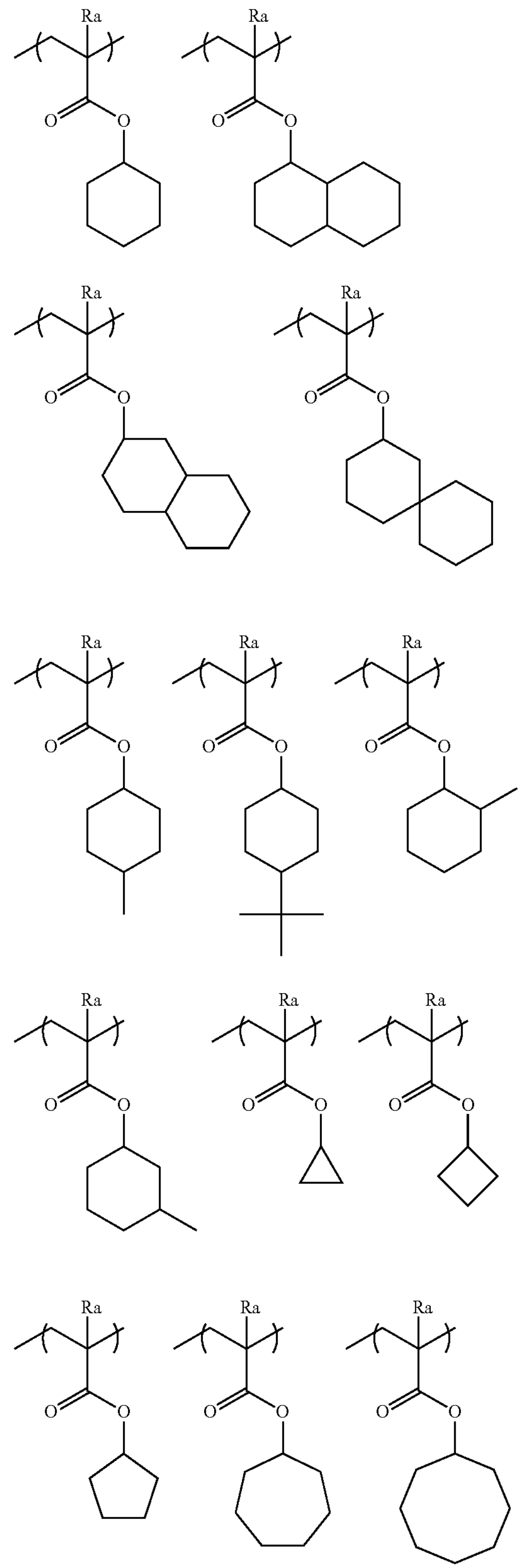

-continued

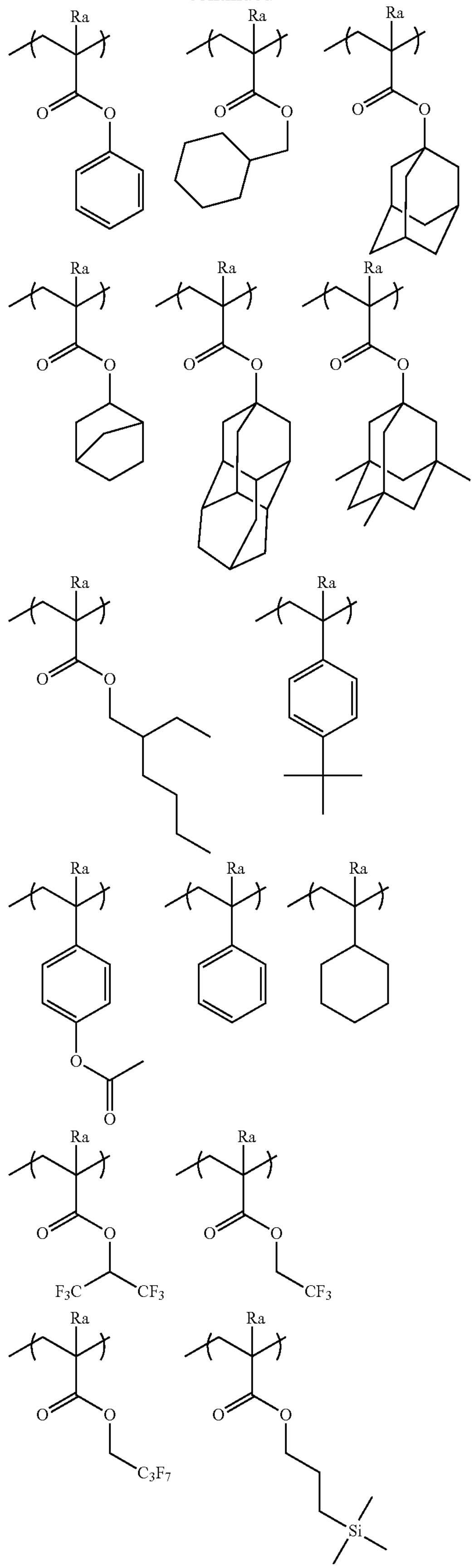

-continued

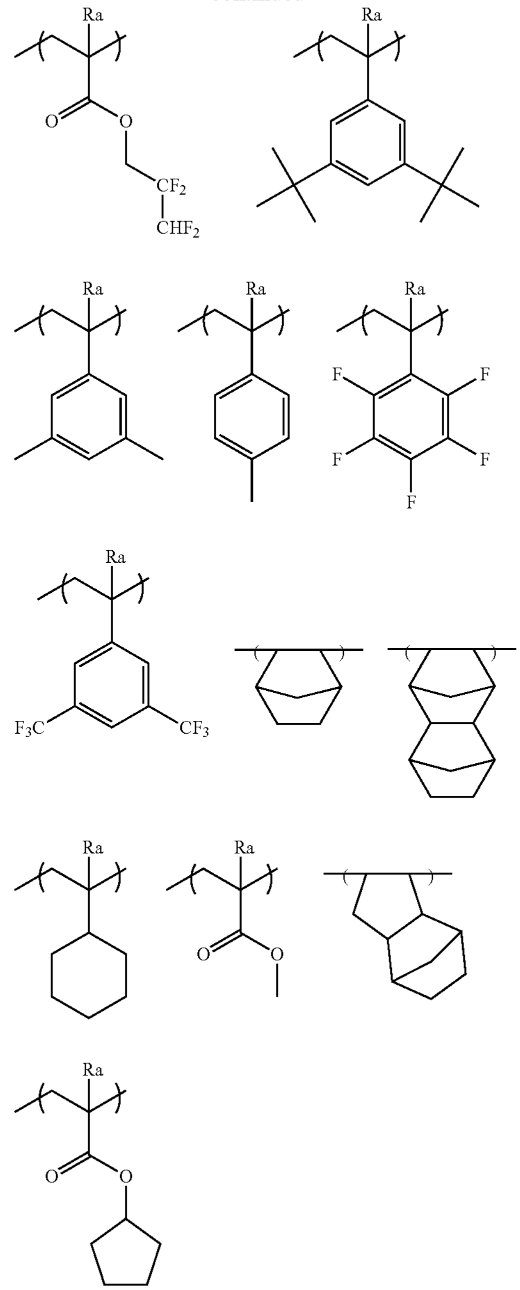

It is preferred for the repeating units (cy3) and (cy4) to be repeating units each having a hydroxyl group or a cyano group as a polar group. This increases the affinity to developers. The repeating units each having a hydroxyl group or a cyano group are preferably repeating units with an alicyclic hydrocarbon structure substituted with a hydroxyl group or a cyano group. The alicyclic hydrocarbon structure of the alicyclic hydrocarbon structure substituted with a hydroxyl group or a cyano group is preferably an adamantyl group, a diadamantyl group or a norbornyl group. As preferred alicyclic hydrocarbon structures substituted with a hydroxyl group or a cyano group, there can be mentioned a monohydroxyadamantyl group, a dihydroxyadamantyl group, a monohydroxydiadamantyl group, a dihydroxydiadamantyl group, a cyanated norbornyl group and the like.

As the repeating units with the above atomic groups, there can be mentioned those of general formulae (CAIIa) to (CAIId) below.

(CAIIa)

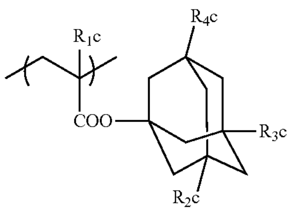

(CAIIb)

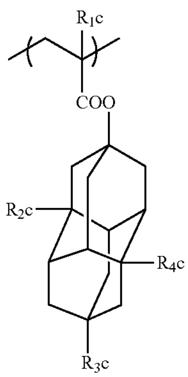

(CAIIc)

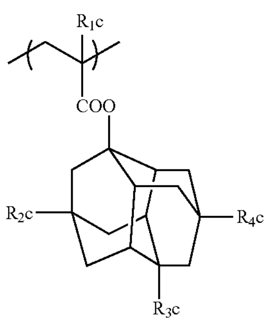

(CAIId)

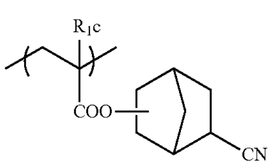

In general formulae (CAIIa) to (CAIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, providing that at least one of the $R_2c$ to $R_4c$ represents a hydroxyl group or a cyano group. Preferably, one or two of the $R_2c$ to $R_4c$ are hydroxyl groups and the remainder is a hydrogen atom. In general formulae (CAIIa) to (CAIIc), more preferably, two of the $R_2c$ to $R_4c$ are hydroxyl groups and the remainder is a hydrogen atom.

Specific examples of the repeating units (cy3) and (cy4) will be shown below, which however in no way limit the scope of the present invention.

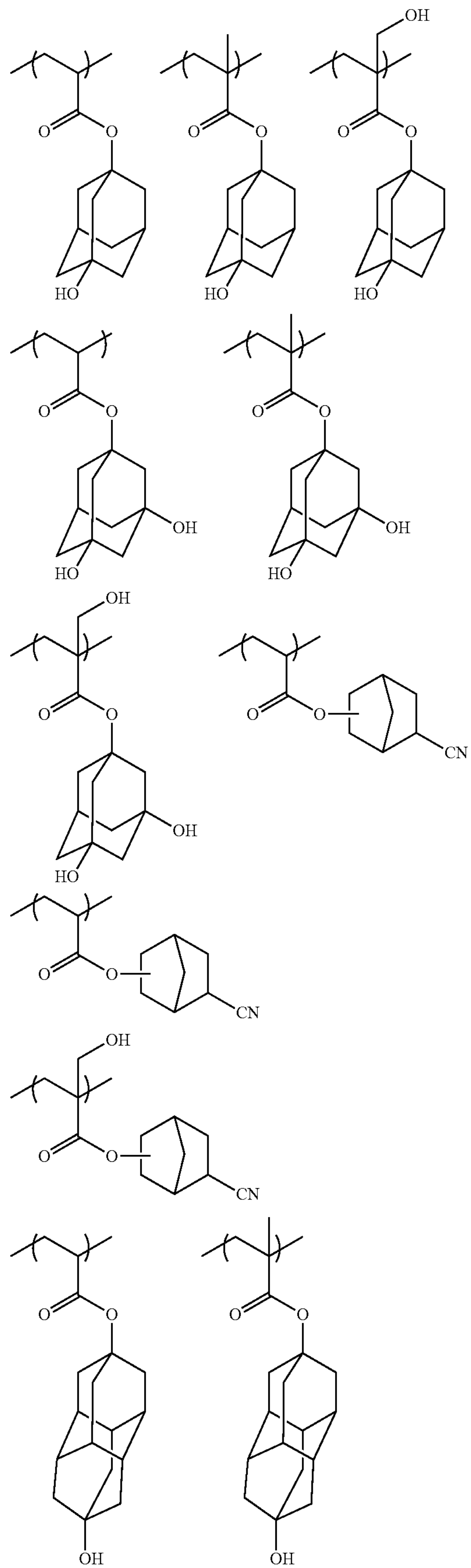

-continued

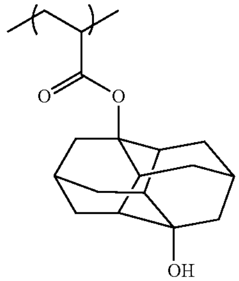

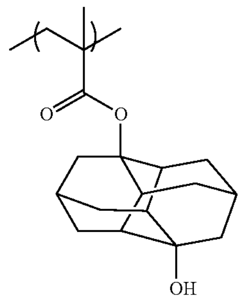

The content of repeating unit (cy1) to (cy4), based on all the repeating units of the resin (Aa), is preferably in the range of 5 to 40 mol %, more preferably 5 to 30 mol % and further more preferably 10 to 25 mol %.

A plurality of repeating units (cy1) to (cy4) may be contained in the resin (Aa).

When the resin (Aa) has a silicon atom, the content ratio of silicon atom(s) is preferably in the range of 2 to 50 mass %, more preferably 2 to 30 mass %, based on the molecular weight of the resin (Aa).

The repeating unit containing a silicon atom preferably exists in the resin (Aa) in an amount of 10 to 90 mass %, more preferably 20 to 80 mass %, based on all the repeating units of the resin (Aa).

The weight average molecular weight of the resin (Aa) in terms of standard polystyrene molecular weight is preferably in the range of 1000 to 100,000, more preferably 1000 to 50,000 and still more preferably 2000 to 15,000.

The resins (Aa) can be synthesized and purified in the same manner as to be described hereinafter in connection with the resins (Ab). Impurities, such as metals, should naturally be of low quantity in the resin (Aa), as for the resin (Ab). The content ratio of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 3, more preferably 1 to 2, still more preferably 1 to 1.8 and most preferably 1 to 1.5.

A variety of commercially available products can be used as the hydrophobic resin (HR), and also the resin can be synthesized in accordance with conventional methods (for example, radical polymerization).

In the composition of the present invention, two or more types of resins (Aa) may be used in combination. Further, the resin (Aa) may be blended with another polymer unevenly distributable into a film surface before use. The other polymer is, for example, any of polymers prepared for liquid-immersion exposure which are disclosed in JP-A-2010-32994 and JP-A-2010-250105.

Specific examples of the resins (Aa) are shown below.

(Aa-1)

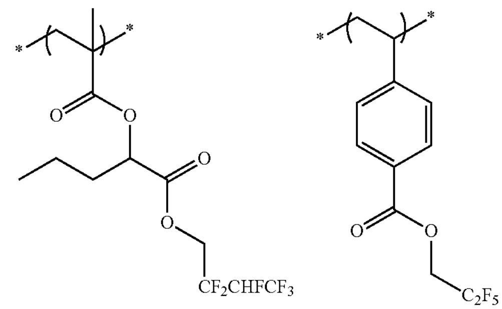

(Aa-2)

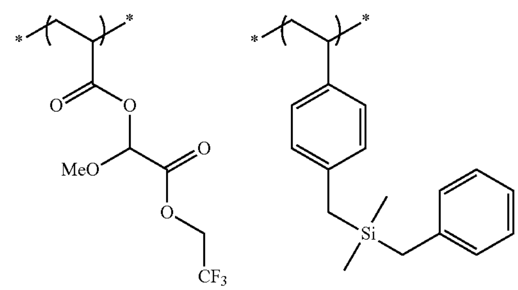

(Aa-3)

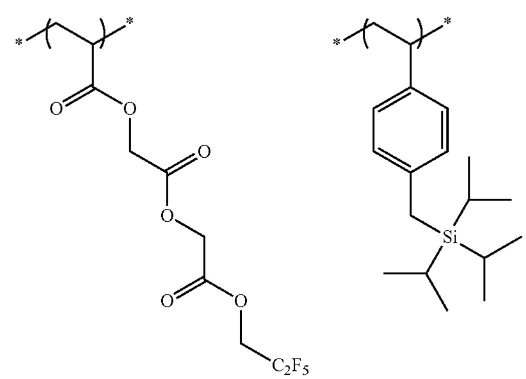

(Aa-4)

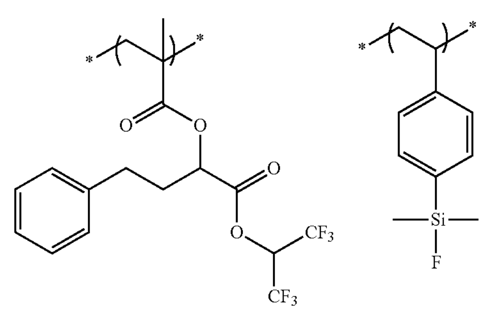

-continued
(Aa-5)
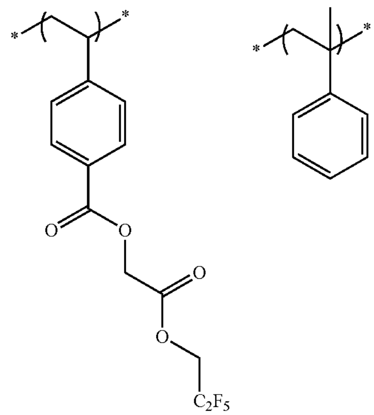
(Aa-6)
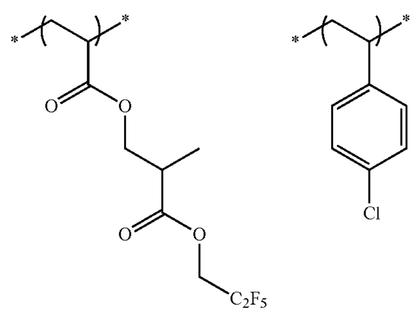
(Aa-7)
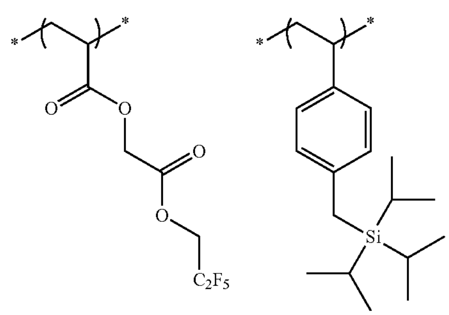
(Aa-8)
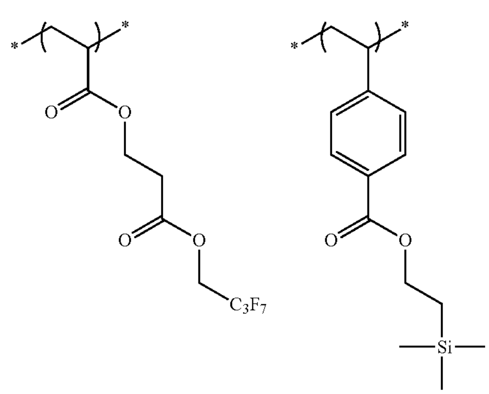
-continued
(Aa-9)
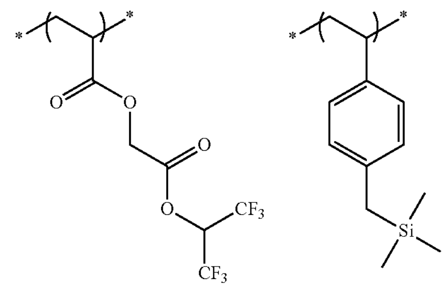
(Aa-10)
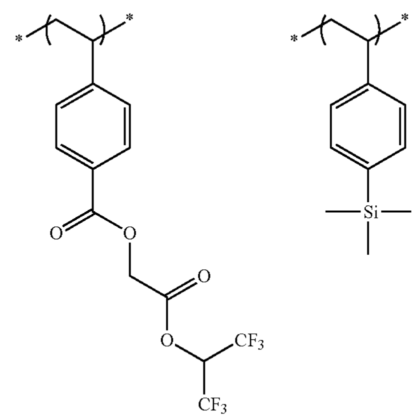
(Aa-11)
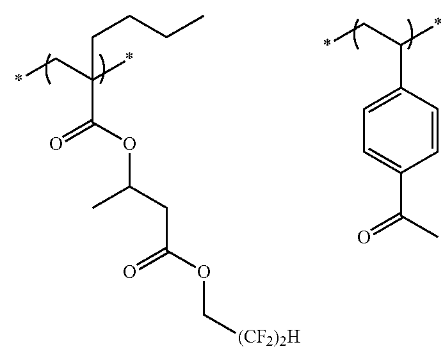
(Aa-12)
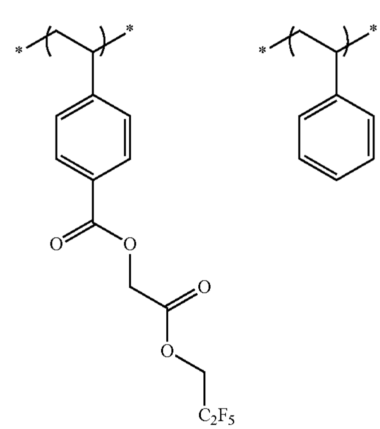

-continued
(Aa-13)
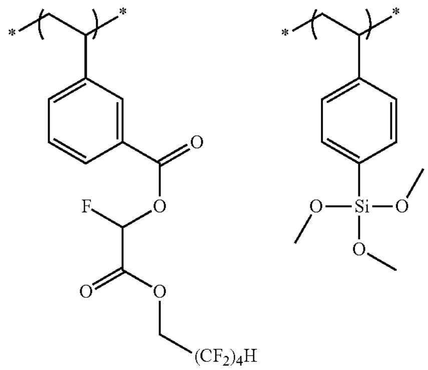
(Aa-14)
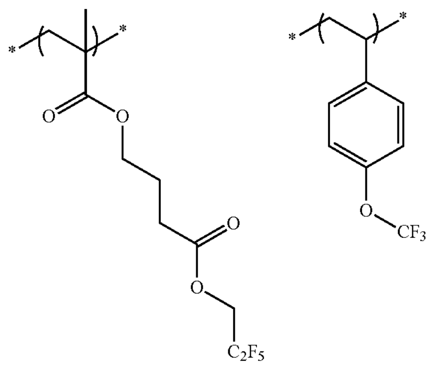
(Aa-15)
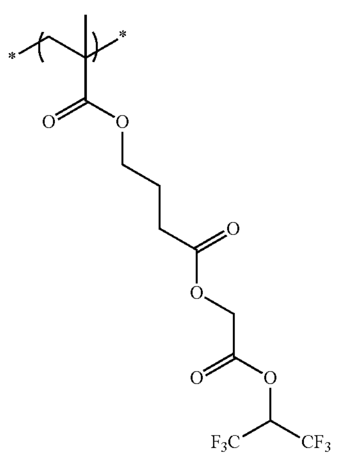
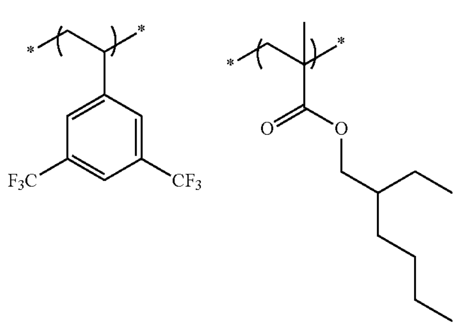
-continued
(Aa-16)
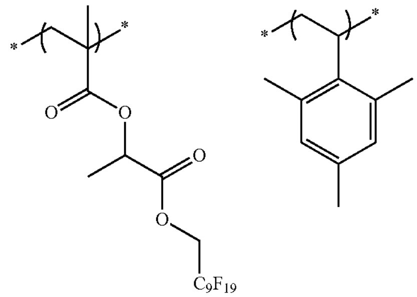
(Aa-17)
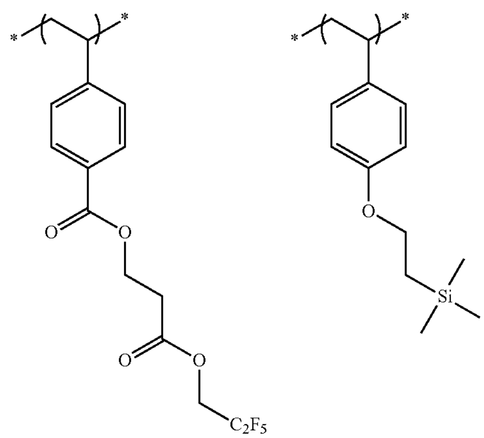
(Aa-18)
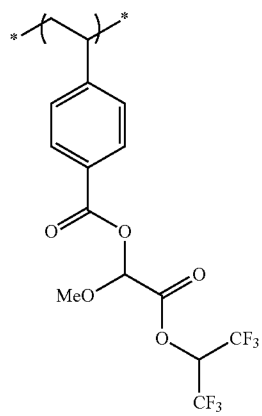
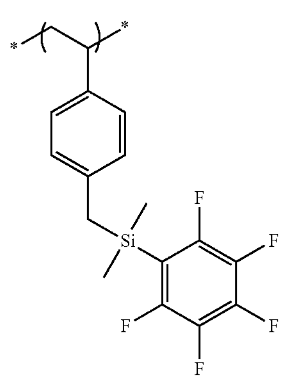

-continued
(Aa-19)
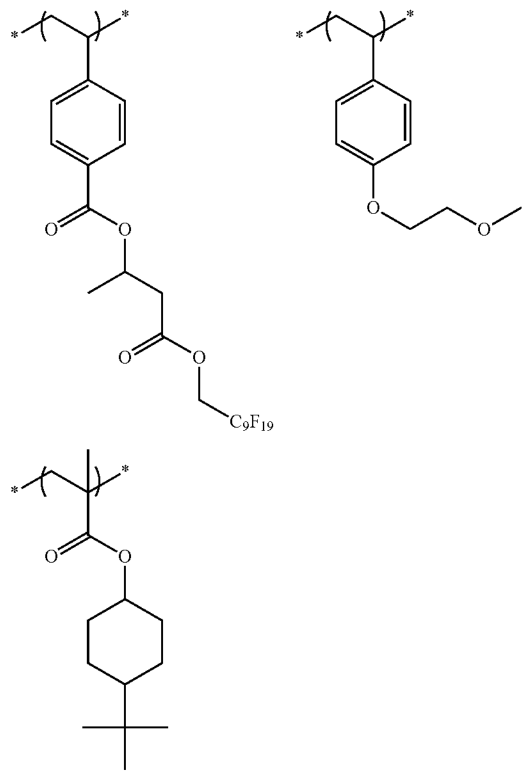
(Aa-20)
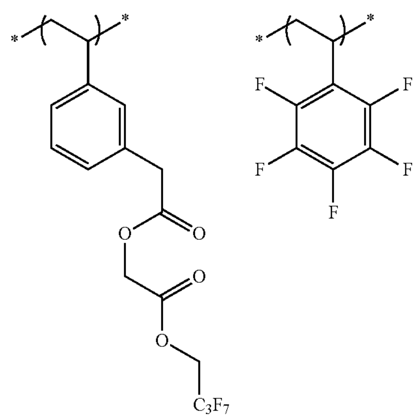
(Aa-21)
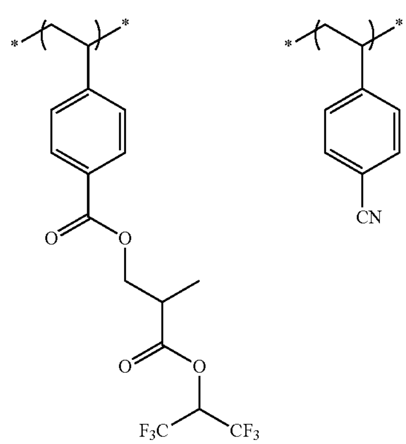
-continued
(Aa-22)
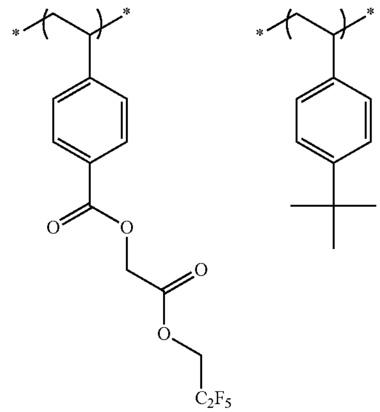
(Aa-23)
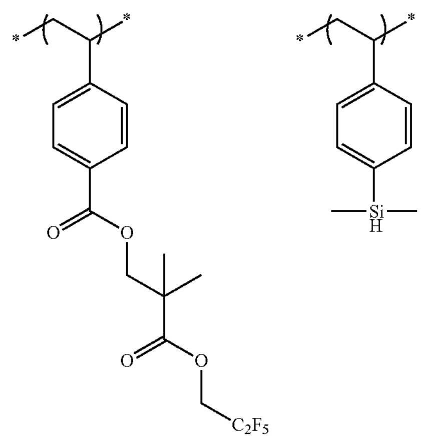
(Aa-24)
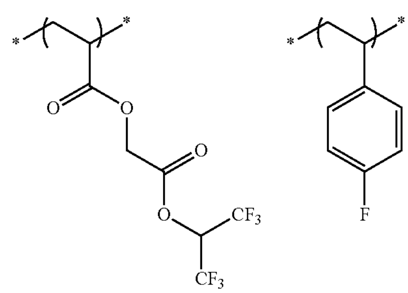
(Aa-25)
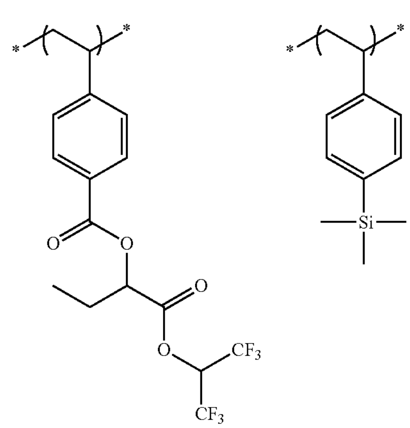

-continued
(Aa-26)
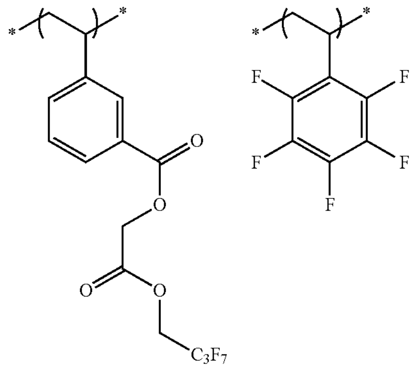
(Aa-27)
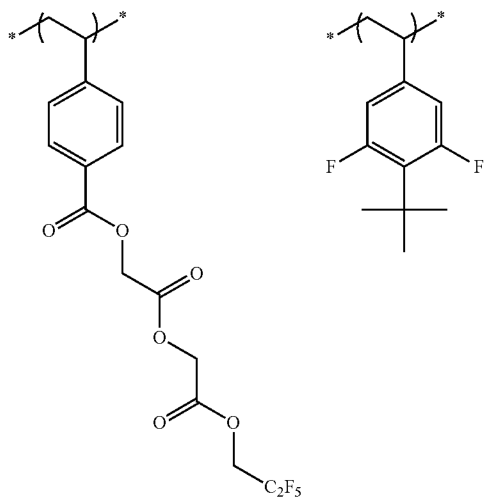
(Aa-28)
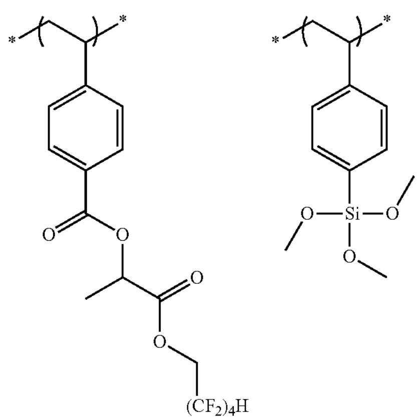
(Aa-29)
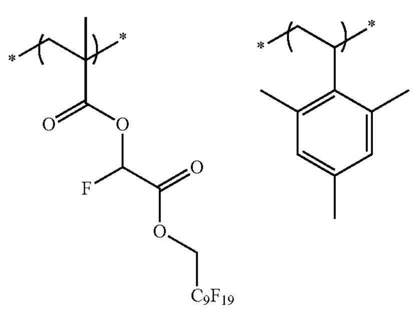
-continued
(Aa-30)
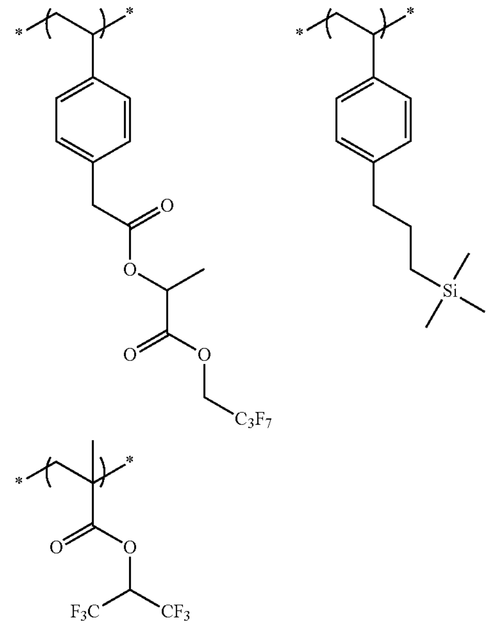
(Aa-31)
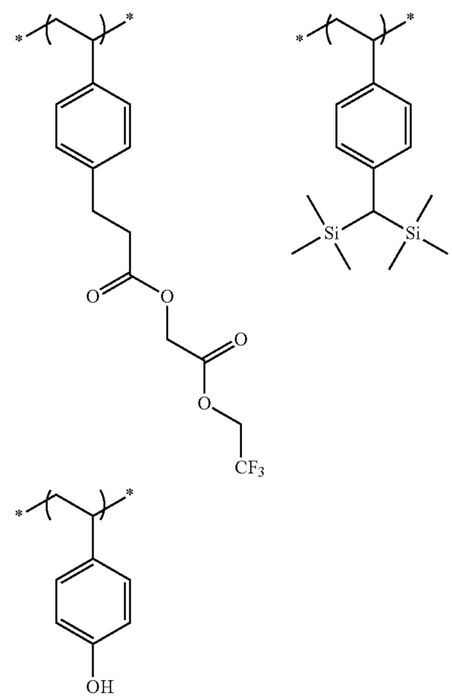
(Aa-32)
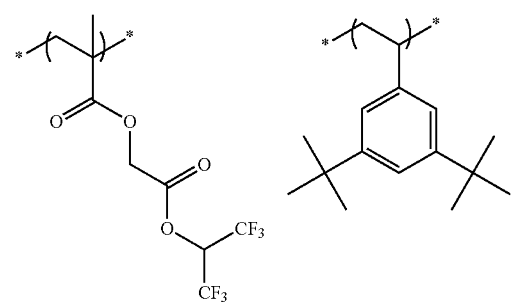

-continued
(Aa-33)
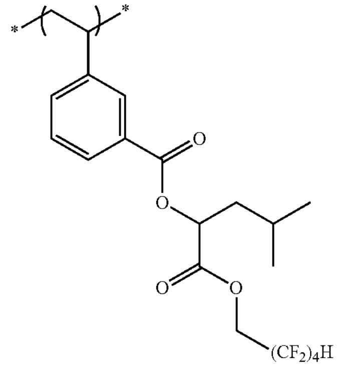
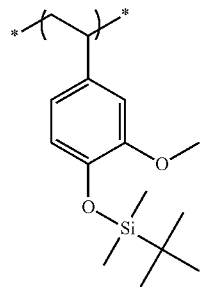
(Aa-34)
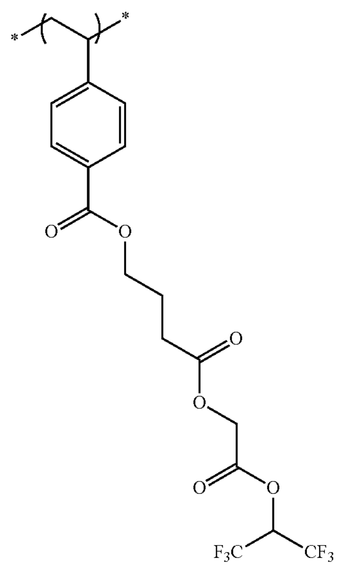
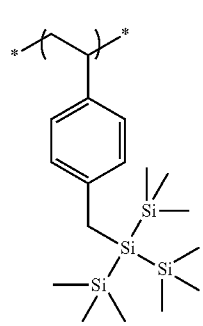
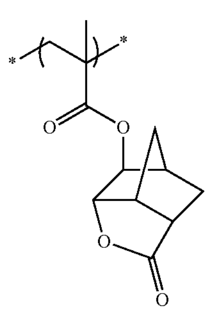
-continued
(Aa-35)
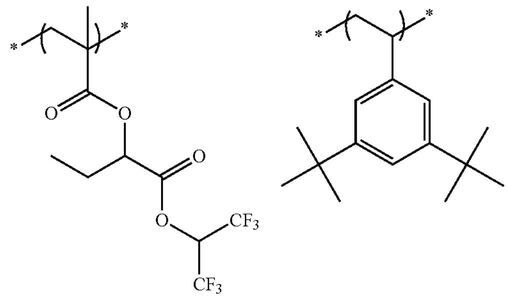
(Aa-36)
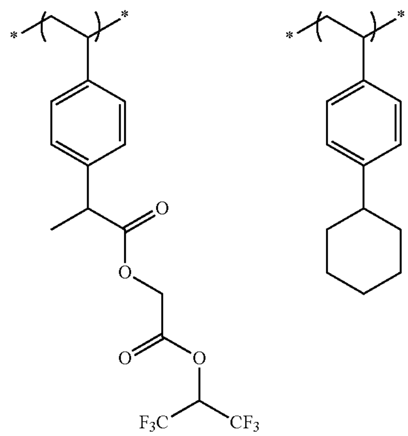
(Aa-37)
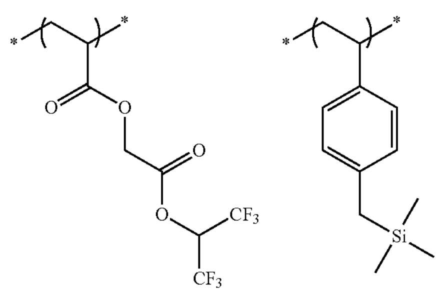
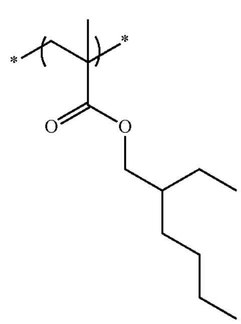

-continued
(Aa-38)
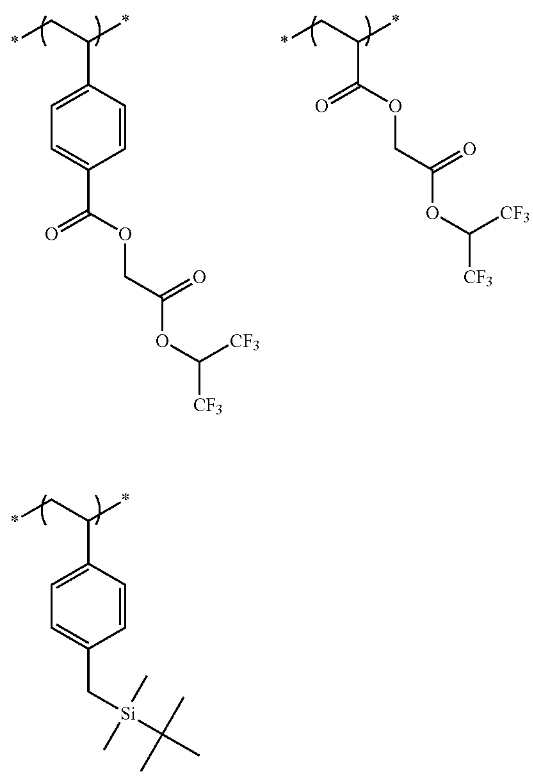
(Aa-39)
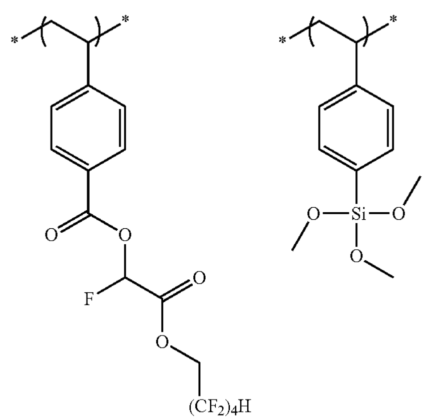
(Aa-40)
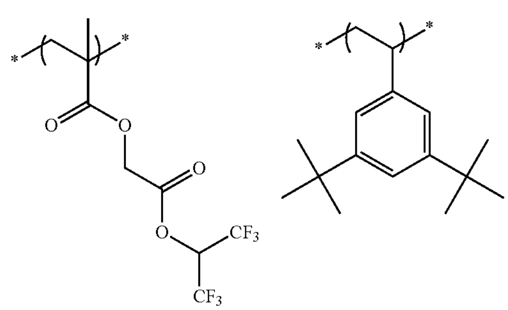
-continued
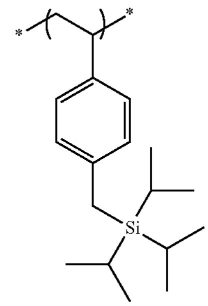
(Aa-41)
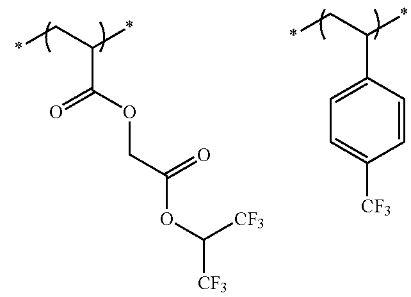
(Aa-42)
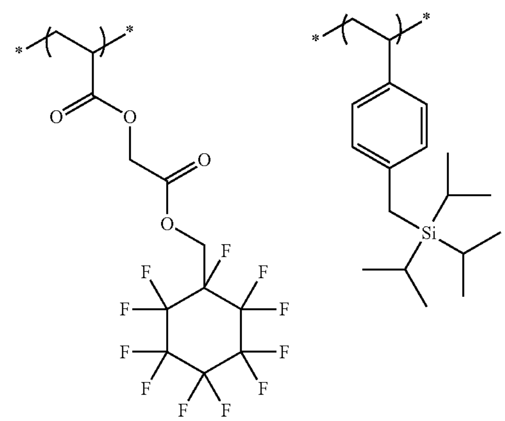
(Aa-43)
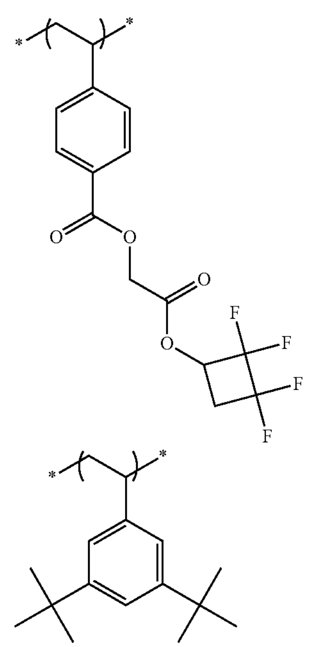

(Aa-44)
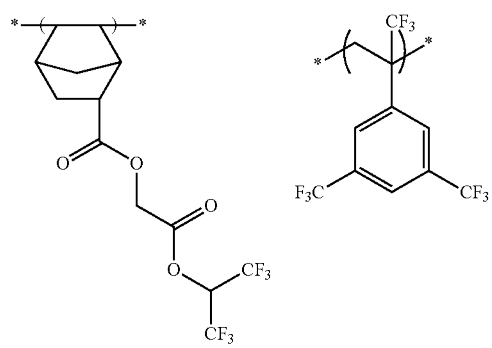
(Aa-45)
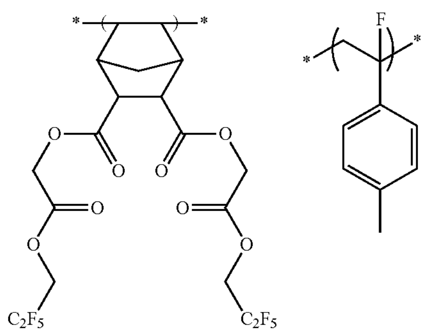
(Aa-46)
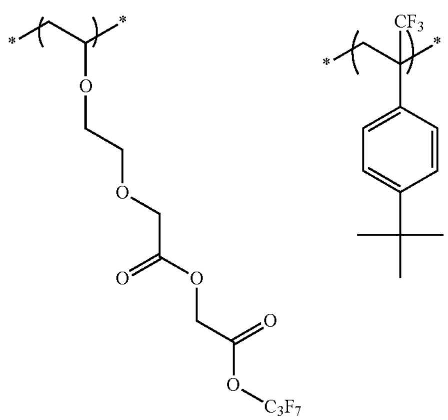
(Aa-47)
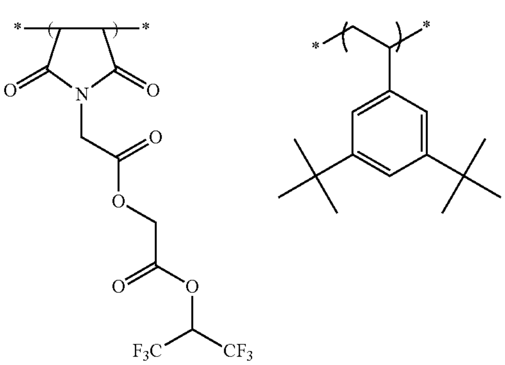
(Aa-48)
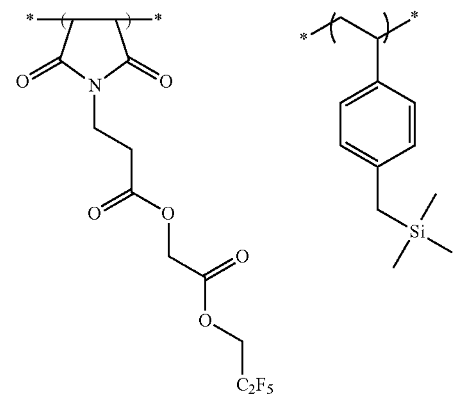
(Aa-49)
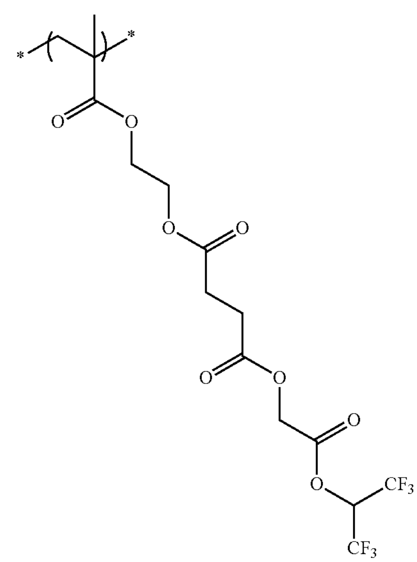
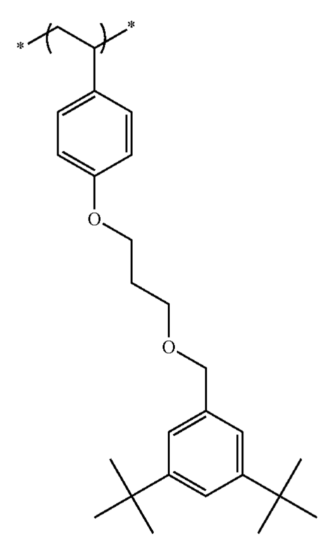

-continued
(Aa-50)
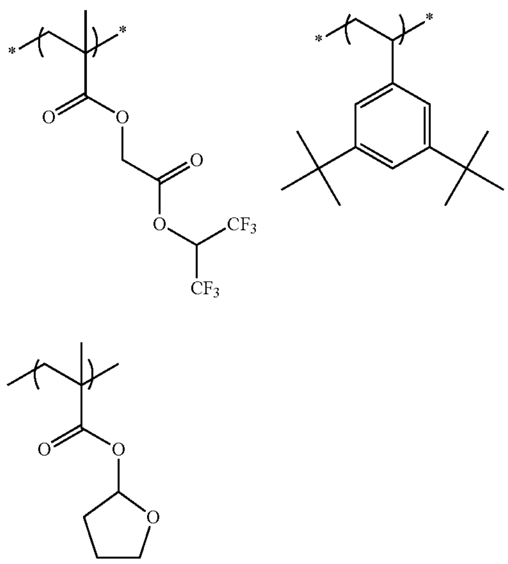
(Aa-51)
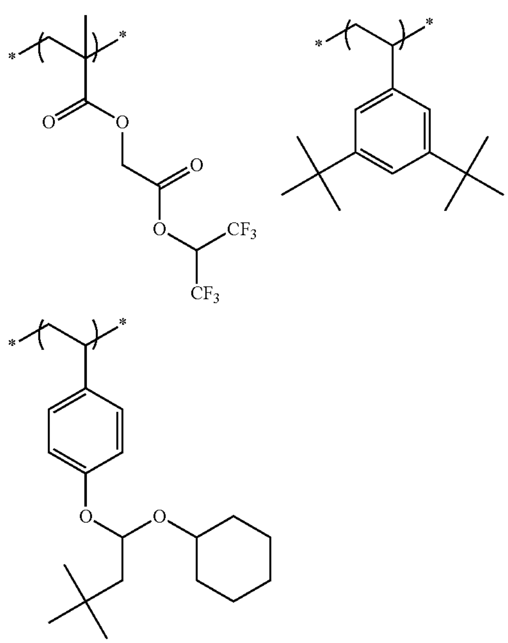
(Aa-52)
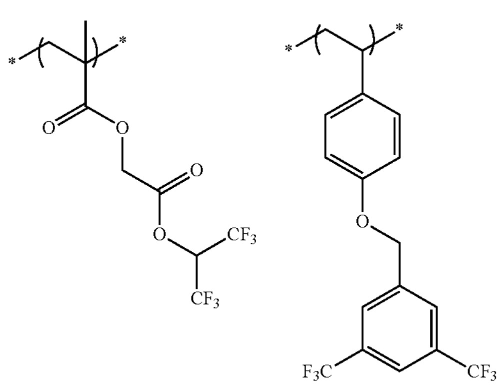
-continued
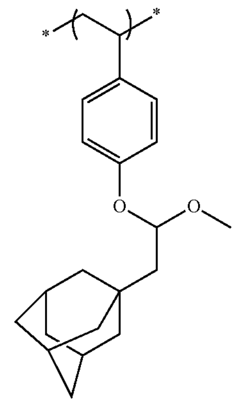
(Aa-53)
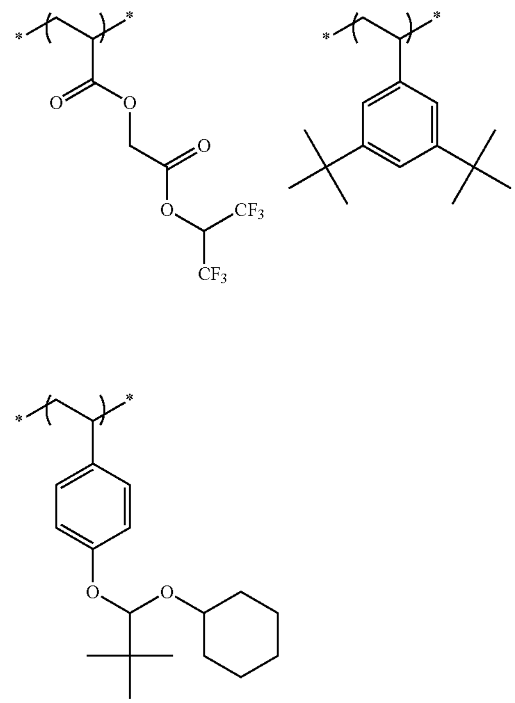
(Aa-54)
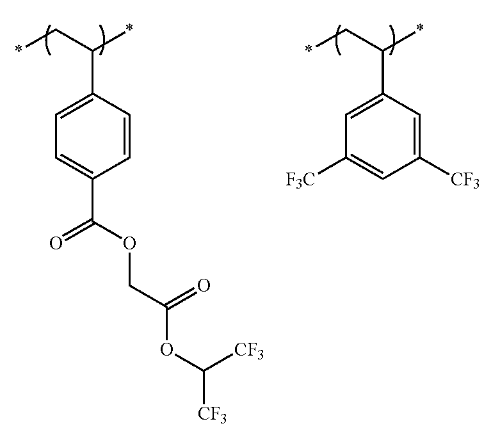

-continued
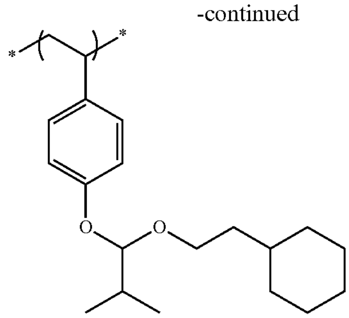
(Aa-55)
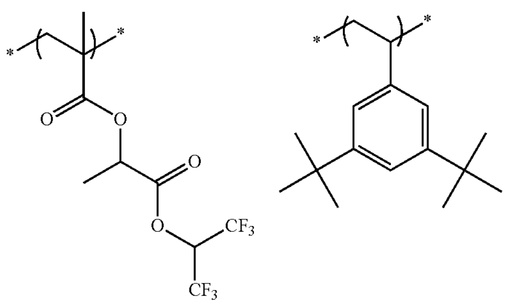
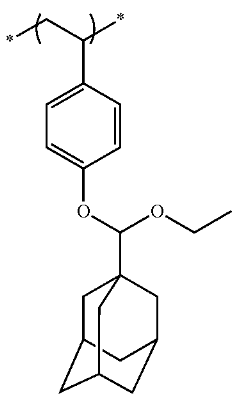
(Aa-56)
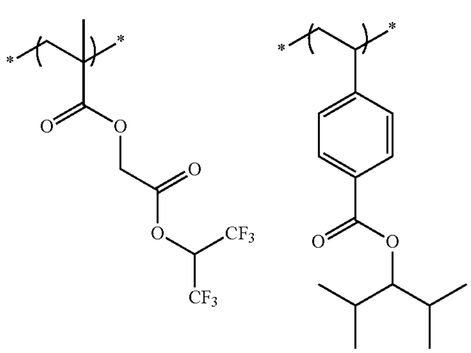
-continued
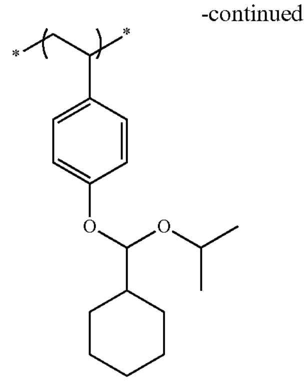
(Aa-57)
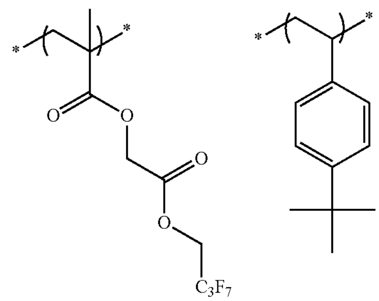
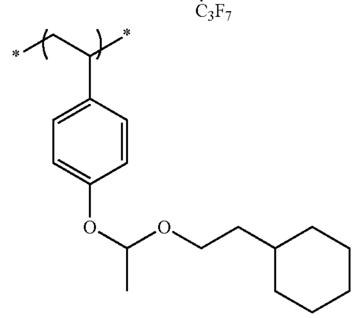
(Aa-58)
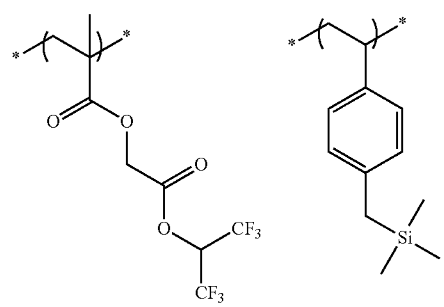
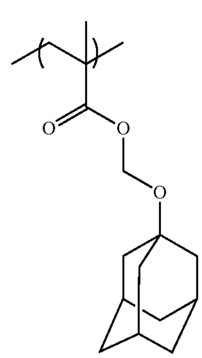

-continued
(Aa-59)
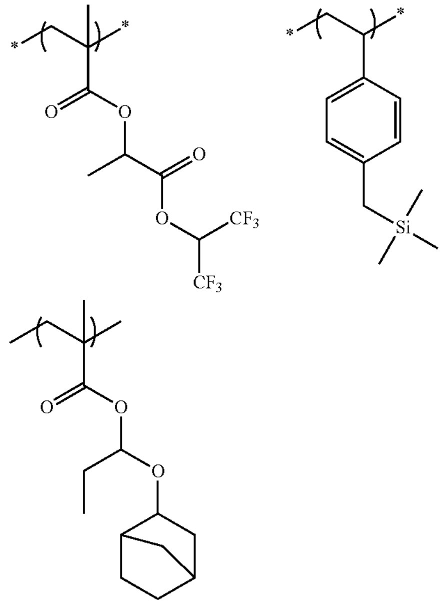
(Aa-60)
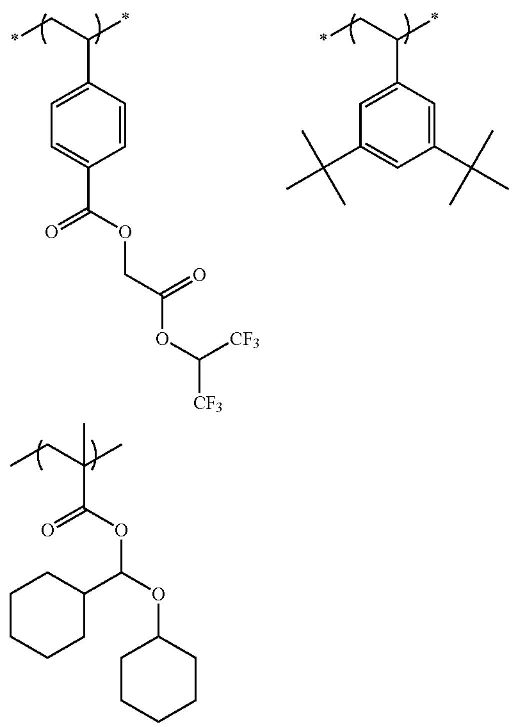
(Aa-61)
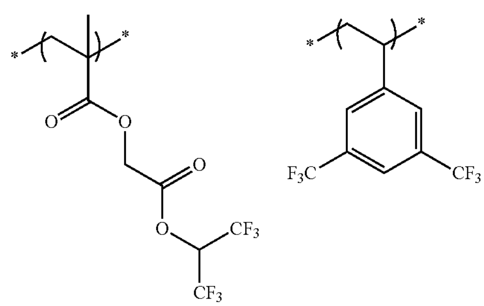
-continued
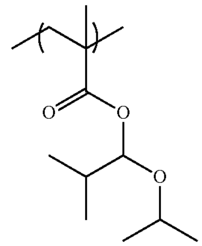
(Aa-62)
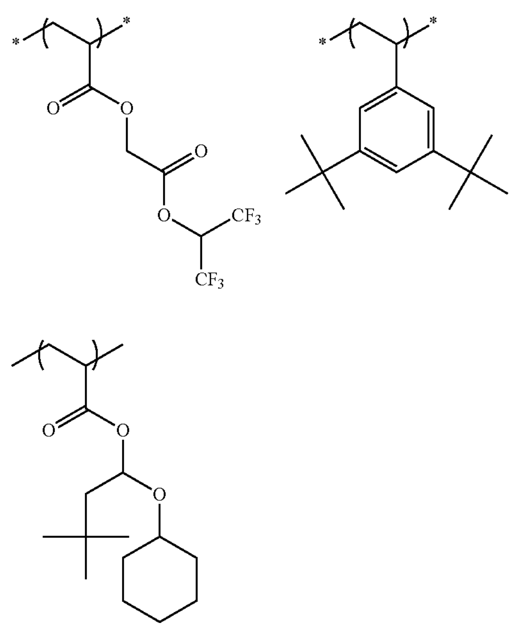
(Aa-63)
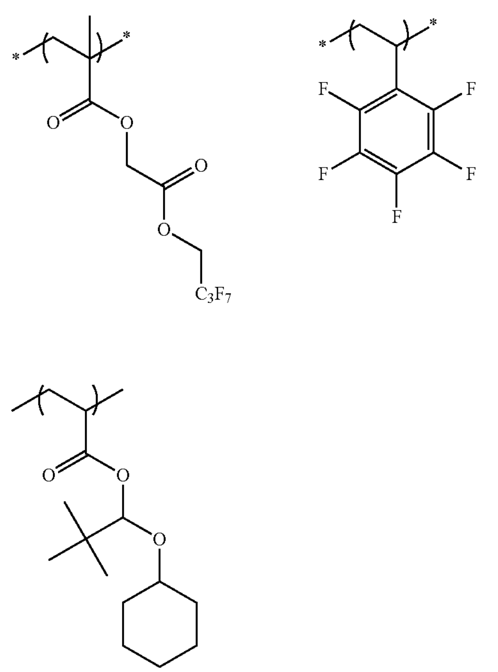

-continued
(Aa-64)
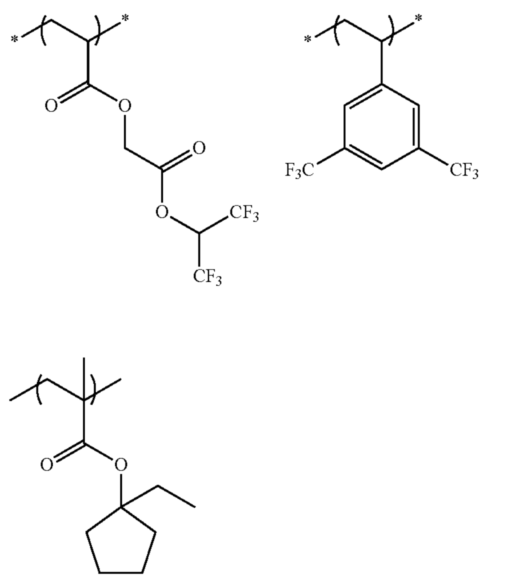
(Aa-65)
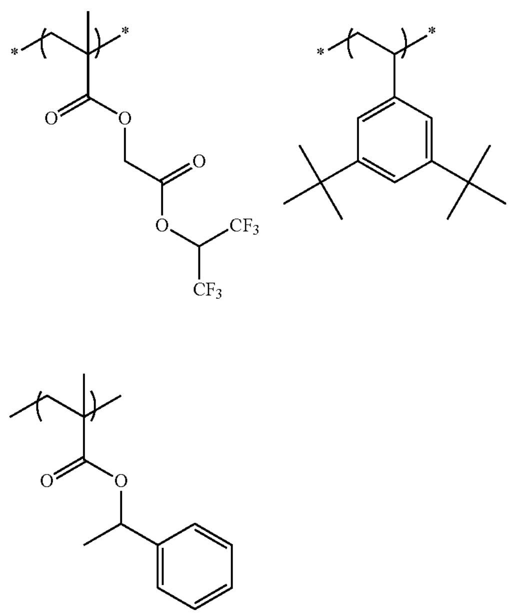
(Aa66)
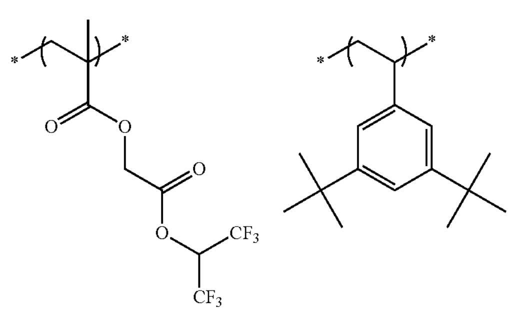
-continued
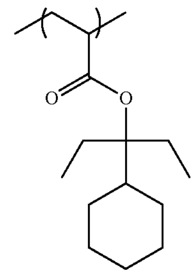
(Aa-67)
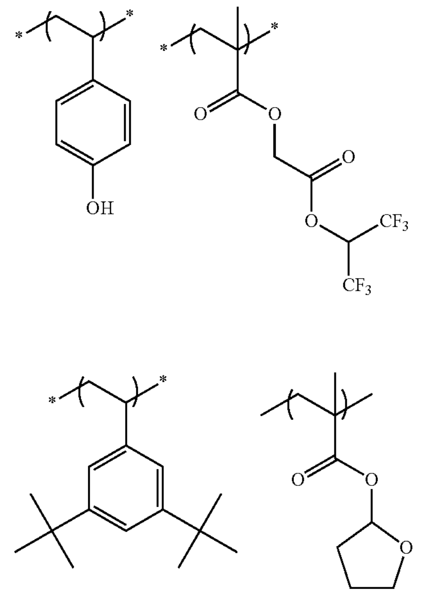
(Aa-68)
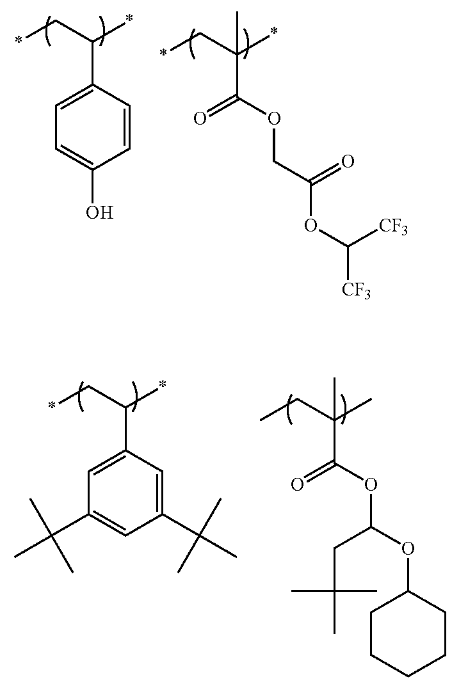

-continued (Aa-69)

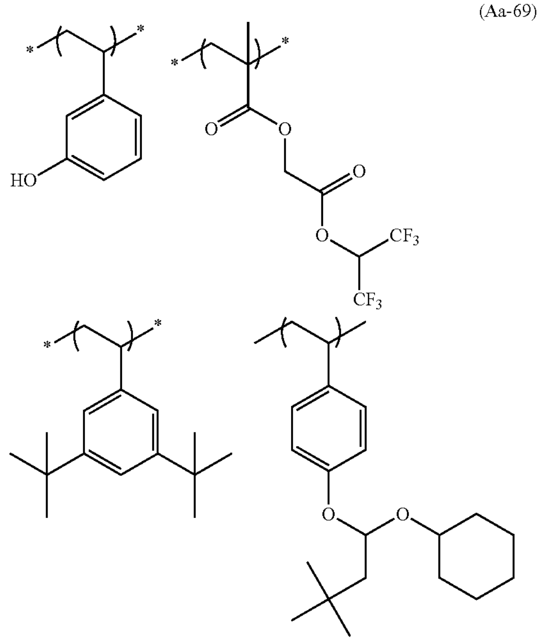

(Aa-70)

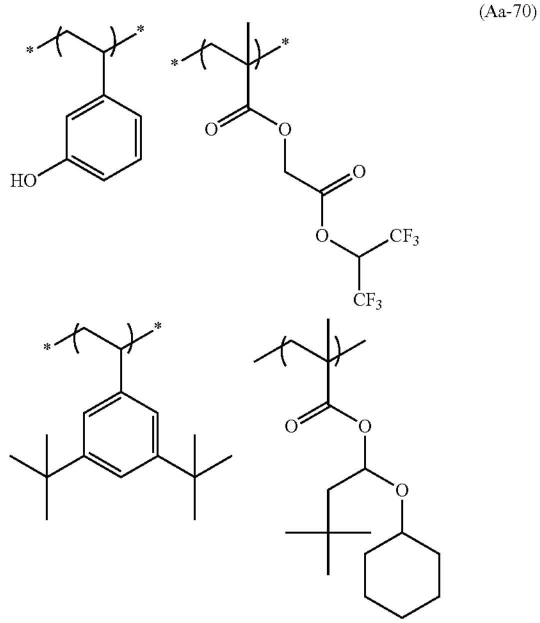

The content of resin (Aa) is preferably in the range of 0.01 to 20 mass %, more preferably 0.01 to 10 mass % and most preferably 0.01 to 5 mass %, based on the total solids of the composition of the present invention.

[Resin (Ab)]

The resin (Ab) is a resin that when acted on by an acid, changes its alkali solubility.

The resin (Ab) is preferably insoluble or poorly soluble in an alkali developer.

The resin (Ab) preferably comprises a repeating unit containing an acid-decomposable group.

As the acid-decomposable group, there can be mentioned, for example, a group resulting from protection of the hydrogen atom of an alkali-soluble group, such as a carboxyl group, a phenolic hydroxyl group, a sulfonic acid group or a thiol group, with a group that is cleaved under the action of an acid.

As the acid eliminable group, there can be mentioned, for example, —$C(R_{36})(R_{37})(R_{38})$, —$C(R_{36})(R_{37})(OR_{39})$, —C(═O)—O—$C(R_{36})(R_{37})(R_{38})$, —$C(R_{01})(R_{02})(OR_{39})$, —$C(R_{01})(R_{02})$—C(═O)—O—$C(R_{36})(R_{37})(R_{38})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ to $R_{02}$ independently represents a hydrogen atom, an alkyl group, a cycloalkyl group, an aryl group, an aralkyl group or an alkenyl group.

It is preferred for the resin (Ab) in its one form to contain any of repeating units of general formula (AI) below as a repeating unit containing an acid-decomposable group.

(AI)

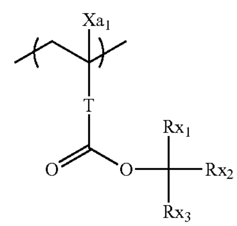

In the general formula (AI), $Xa_1$ represents a hydrogen atom, an optionally substituted methyl group or any of the groups of the formula —$CH_2$—$R_9$. $R_9$ represents a hydroxyl group or a monovalent organic group. The monovalent organic group is, for example, an alkyl group having 5 or less carbon atoms or an acyl group. Preferably, the monovalent organic group is an alkyl group having 3 or less carbon atoms, more preferably a methyl group. $Xa_1$ preferably represents a hydrogen atom, a methyl group, a trifluoromethyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

At least two of $Rx_1$ to $Rx_3$ may be bonded with each other to thereby form a cycloalkyl group (monocyclic or polycyclic).

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —$CH_2$— group or —$(CH_2)_3$— group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of at least two of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group. A monocyclic alkyl group having 5 to 6 carbon atoms is especially preferred.

In a preferred embodiment, $Rx_1$ is a methyl group or an ethyl group, and $Rx_2$ and $Rx_3$ are bonded with each other to thereby form any of the above-mentioned cycloalkyl groups.

Each of these groups may have a substituent. As the substituent, there can be mentioned, for example, an alkyl group (1 to 4 carbon atoms), a halogen atom, a hydroxyl group, an alkoxy group (1 to 4 carbon atoms), a carboxyl group, an alkoxycarbonyl group (2 to 6 carbon atoms) or the like. The number of carbon atoms of the substituent is preferably 8 or less.

It is preferred for the resin (Ab) in its other form to contain at least one of repeating units of general formulae (A1) and (A2) below.

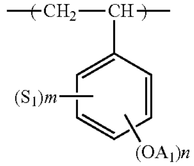

(A1)

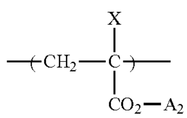

(A2)

In general formula (A1), n is an integer of 1 to 5, and m is an integer of 0 to 4 satisfying the relationship 1≤m+n≤5, $S_1$ represents a substituent (other than a hydrogen atom), provided that when m is 2 or greater, two or more S's may be identical to or different from each other, and $A_1$ represents a hydrogen atom or a group that when acted on by an acid, is cleaved, provided that at least one $A_1$ represents a group that when acted on by an acid, is cleaved, and that when n is 2 or greater, two or more $A_1$s may be identical to or different from each other.

In general formula (A2)

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group, and $A_2$ represents a group that when acted on by an acid, is cleaved.

First, the repeating units of general formula (A1) will be described.

As mentioned above, n is an integer of 1 to 5, and n is preferably 1 or 2, more preferably 1.

As mentioned above, m is an integer of 0 to 4 satisfying the relationship 1≤m+n≤5, and m is preferably 0 to 2, more preferably 0 or 1 and most preferably 0.

As mentioned above, $S_1$ represents a substituent (other than a hydrogen atom). This substituent is, for example, any of those to be described hereinafter in connection with $S_1$ of general formula (A).

As mentioned above, $A_1$ represents a hydrogen atom or a group that when acted on by an acid, is cleaved, provided that at least one $A_1$ represents a group that when acted on by an acid, is cleaved.

As the group that when acted on by an acid, is cleaved, there can be mentioned, for example, a tertiary alkyl group, such as a t-butyl group or a t-amyl group, a t-butoxycarbonyl group, a t-butoxycarbonylmethyl group, or any of acetal groups of the formula —$C(L_1)(L_2)$—O—$Z_2$.

The acetal groups of the formula —$C(L_1)(L_2)$—O—$Z_2$ will be described below. In the formula, each of $L_1$ and $L_2$ independently represents a hydrogen atom, an alkyl group, a cycloalkyl group or an aralkyl group. $Z_2$ represents an alkyl group, a cycloalkyl group or an aralkyl group. $Z_2$ and $L_1$ may be bonded to each other to thereby form a 5-membered or 6-membered ring.

The alkyl group may be a linear or branched one.

The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, an n-pentyl group, an n-hexyl group, an n-heptyl group, an n-octyl group, an n-nonyl group or an n-decyl group.

The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group or a t-decyl group.

Further substituents may be introduced in these alkyl groups. As such substituents, there can be mentioned, for example, a hydroxyl group; a halogen atom, such as a fluorine, chlorine, bromine or iodine atom; a nitro group; a cyano group; an amido group; a sulfonamido group; an alkyl group, such as a methyl group, an ethyl group, a propyl group, an isopropyl group, an n-butyl group, a sec-butyl group, a hexyl group, a 2-ethylhexyl group, an octyl group or a dodecyl group; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group.

It is especially preferred for the alkyl group to be an ethyl group, an isopropyl group, an isobutyl group, a cyclohexylethyl group, a phenylmethyl group or a phenylethyl group.

The cycloalkyl may be monocyclic or polycyclic. When polycyclic, the cycloalkyl group may be a bridged one. Namely, in that case, the cycloalkyl group may have a bridged structure. The carbon atoms of each of the cycloalkyl groups may be partially replaced with a heteroatom, such as an oxygen atom.

The monocycloalkyl group is preferably one having 3 to 8 carbon atoms. As such a cycloalkyl group, there can be mentioned, for example, a cyclopropyl group, a cyclopentyl group, a cyclohexyl group, a cyclobutyl group or a cyclooctyl group.

As the polycycloalkyl group, there can be mentioned a group with, for example, a bicyclo, tricyclo or tetracyclo structure. This polycycloalkyl group is preferably one having 6 to 20 carbon atoms. As such a cycloalkyl group, there can be mentioned, for example, an adamantyl group, a norbornyl group, an isobornyl group, a camphonyl group, a dicyclopentyl group, an α-pinanyl group, a tricyclodecanyl group, a tetracyclododecyl group or an androstanyl group.

As the aralkyl group represented by $L_1$, $L_2$ or $Z^2$, there can be mentioned, for example, one having 7 to 15 carbon atoms, such as a benzyl group or a phenethyl group.

Substituents may further be introduced in these aralkyl groups. As preferred substituents, there can be mentioned an alkoxy group, a hydroxyl group, a halogen atom, a nitro group, an acyl group, an acylamino group, a sulfonylamino group, an alkylthio group, an arylthio group and an aralkylthio group. As substituted aralkyl groups, there can be mentioned, for example, an alkoxybenzyl group, a hydroxybenzyl group and a phenylthiophenethyl group. The substituents introducible in these aralkyl groups preferably each have up to 12 carbon atoms.

As the 5-membered or 6-membered ring formed by the mutual bonding of $Z_2$ and $L_1$, there can be mentioned, for example, a tetrahydropyran ring or a tetrahydrofuran ring. Of these, a tetrahydropyran ring is especially preferred.

It is preferred for $Z_2$ to be a linear or branched alkyl group. If so, the effects of the present invention can be striking.

Non-limiting specific examples of the repeating units of general formula (A1) are shown below.

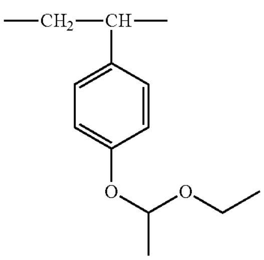

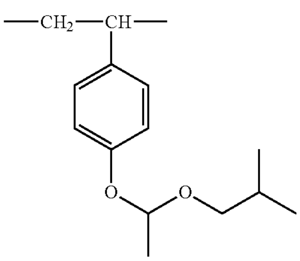

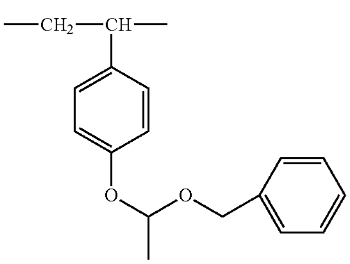

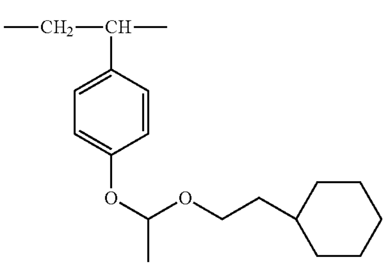

-continued

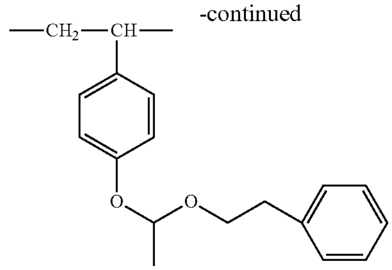

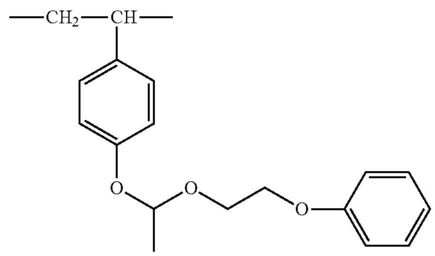

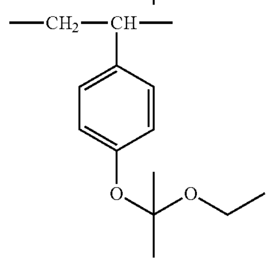

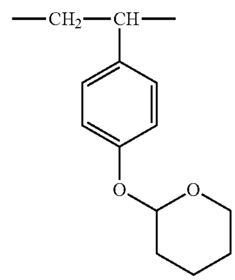

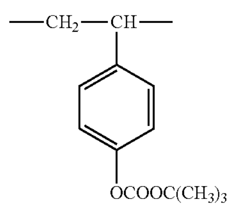

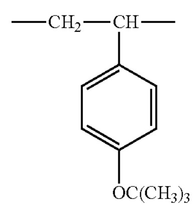

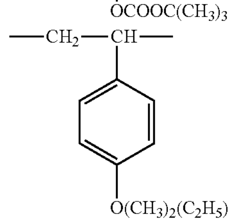

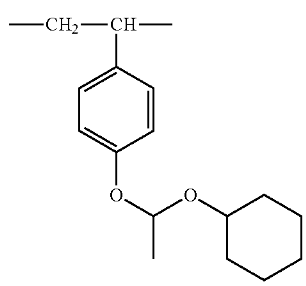

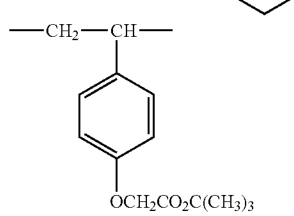

-continued
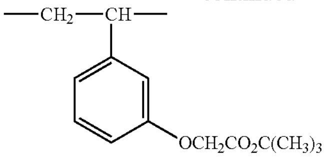
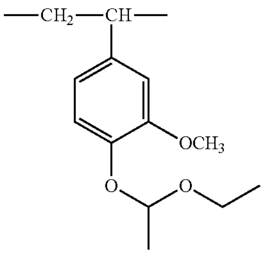
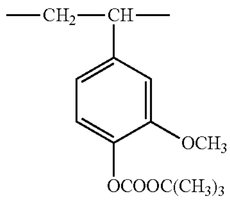
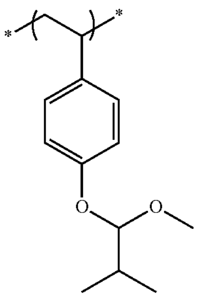
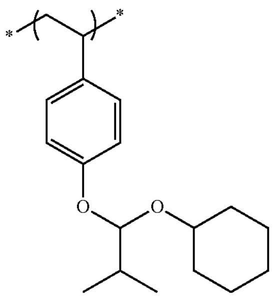
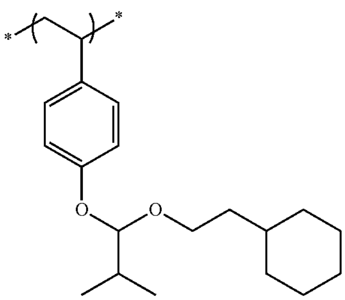
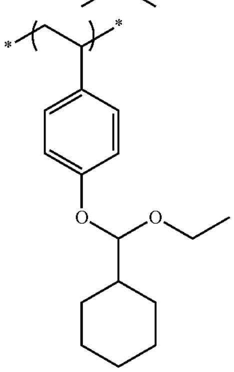
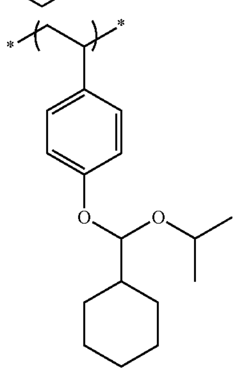
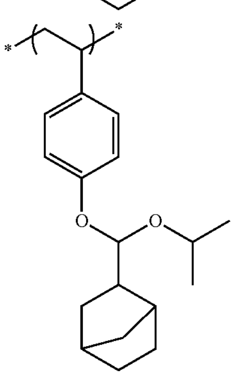
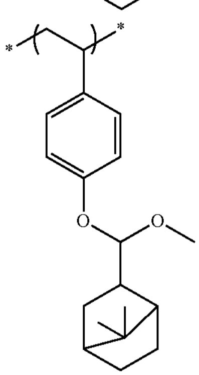
-continued
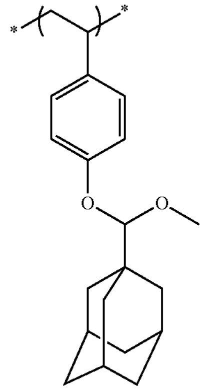
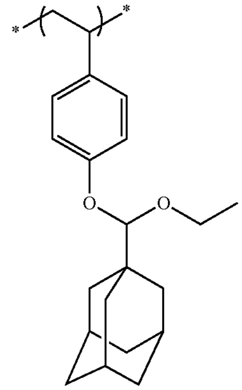
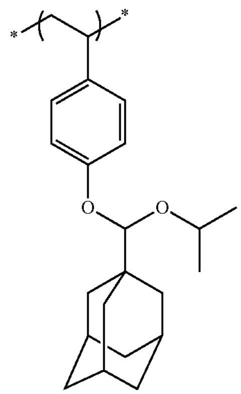
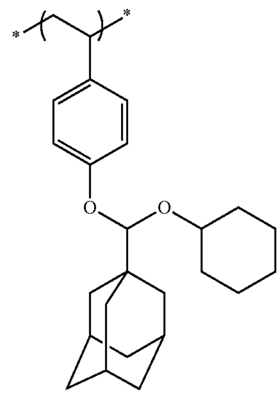
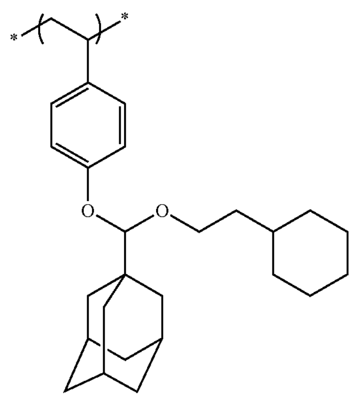
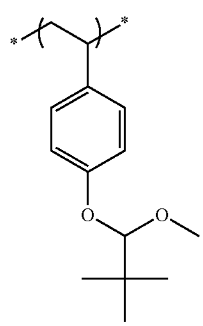
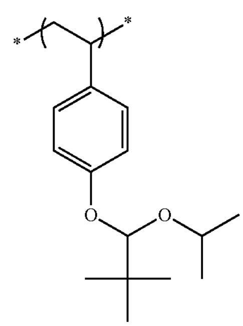

-continued

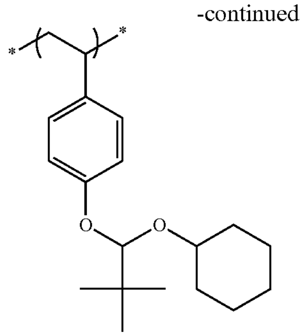

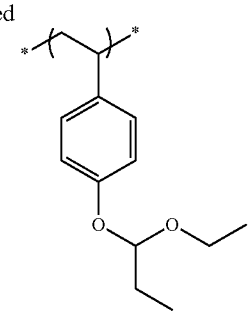

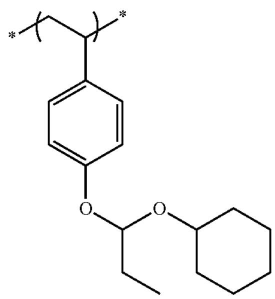

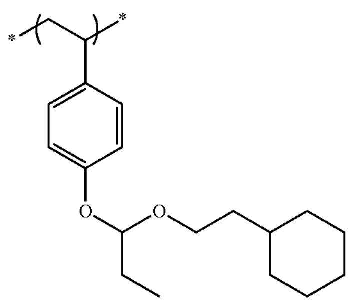

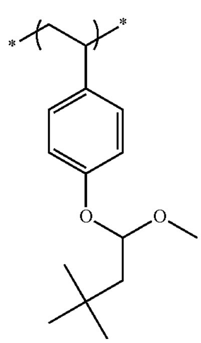

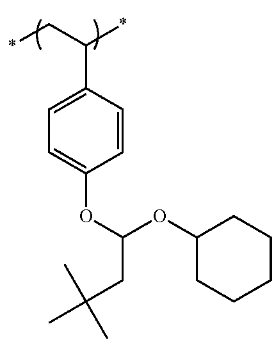

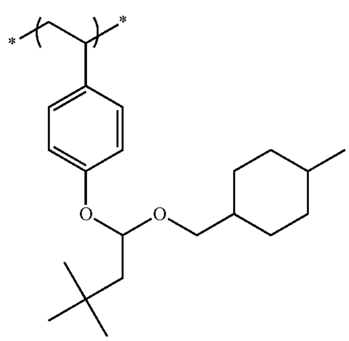

-continued

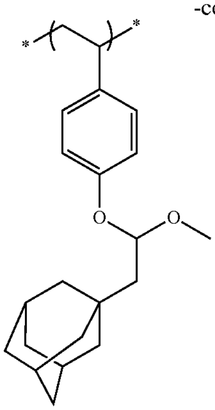

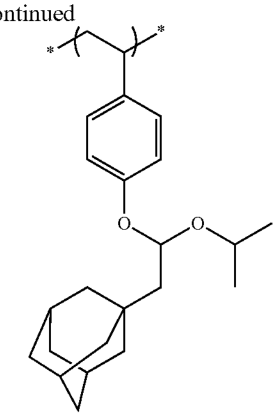

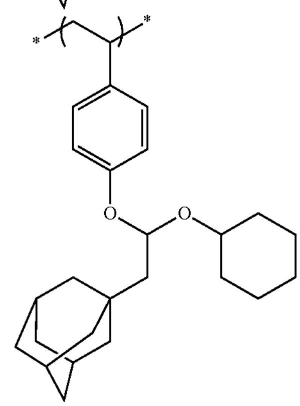

Below, the repeating units of general formula (A2) will be described.

As mentioned above, X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group.

The alkyl group represented by X may contain a substituent, and may be linear or branched. The linear alkyl group preferably has 1 to 30 carbon atoms, more preferably 1 to 20 carbon atoms. As the linear alkyl group, there can be mentioned, for example, a methyl group, an ethyl group, an n-propyl group, an n-butyl group, a sec-butyl group, an n-pentyl group, an n-hexyl group, an n-heptyl group, an n-octyl group, an n-nonyl group, an n-decyl group or the like. The branched alkyl group preferably has 3 to 30 carbon atoms, more preferably 3 to 20 carbon atoms. As the branched alkyl group, there can be mentioned, for example, an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, a t-decyl group or the like.

The alkoxy group represented by X may contain a substituent, and is, for example, the above-mentioned alkoxy group having 1 to 8 carbon atoms. For example, there can be mentioned a methoxy group, an ethoxy group, a propoxy group, a butoxy group, a pentyloxy group, a hexyloxy group, a cyclohexyloxy group or the like.

As the halogen atom represented by X, there can be mentioned a fluorine atom, a chlorine atom, a bromine atom or an iodine atom. A fluorine atom is preferred.

The acyl group represented by X may contain a substituent, and is, for example, one having 2 to 8 carbon atoms. As preferred examples thereof, there can be mentioned a formyl group, an acetyl group, a propanoyl group, a butanoyl group, a pivaloyl group, a benzoyl group or the like.

The acyloxy group represented by X may contain a substituent, and is preferably one having 2 to 8 carbon atoms. For example, there can be mentioned an acetoxy group, a propionyloxy group, a butyryloxy group, a valeryloxy group, a pivaloyloxy group, a hexanoyloxy group, an octanoyloxy group, a benzoyloxy group or the like.

The cycloalkyl group represented by X may contain a substituent and may be monocyclic or polycyclic or a bridged one. For example, the cycloalkyl group may have a bridged structure. The monocycloalkyl group is preferably a cycloalkyl group having 3 to 8 carbon atoms. As such a cycloalkyl group, there can be mentioned, for example, a cyclopropyl group, a cyclopentyl group, a cyclohexyl group, a cyclobutyl group, a cyclooctyl group or the like. As the polycycloalkyl group, there can be mentioned a group with, for example, a bicyclo, tricyclo or tetracyclo structure having 5 or more carbon atoms. This polycycloalkyl group is preferably a cycloalkyl group having 6 to 20 carbon atoms. As such, there can be mentioned, for example, an adamantyl group, a norbornyl group, an isobornyl group, a camphonyl group, a bicyclopentyl group, an α-pinanyl group, a tricyclodecanyl group, a tetracyclododecyl group, an androstanyl group or the like. The carbon atoms of each of the cycloalkyl groups may be partially replaced with a heteroatom, such as an oxygen atom.

The aryl group represented by X may contain a substituent, and is preferably one having 6 to 14 carbon atoms, such as a phenyl group, a xylyl group, a tolyl group, a cumenyl group, a naphthyl group or an anthracenyl group.

The alkyloxycarbonyl group represented by X may contain a substituent, and is preferably one having 2 to 8 carbon atoms. For example, there can be mentioned a methoxycarbonyl group, an ethoxycarbonyl group or a propoxycarbonyl group.

The alkylcarbonyloxy group represented by X may contain a substituent, and is preferably one having 2 to 8 carbon atoms. For example, there can be mentioned a methylcarbonyloxy group or an ethylcarbonyloxy group.

The aralkyl group represented by X may contain a substituent, and is preferably one having 7 to 16 carbon atoms. For example, there can be mentioned a benzyl group.

As substituents further introducible in the alkyl group, alkoxy group, acyl group, cycloalkyl group, aryl group, alkyloxycarbonyl group, alkylcarbonyloxy group and aralkyl group represented by X, there can be mentioned an alkyl group, a hydroxyl group, an alkoxy group, a halogen atom (a fluorine atom, a chlorine atom, a bromine atom or an iodine atom), a cyano group, a nitro group, an acyl group, an acyloxy group, a cycloalkyl group, an aryl group, a carboxyl group, an alkyloxycarbonyl group, an alkylcarbonyloxy group, an aralkyl group and the like.

As mentioned above, $A_2$ represents a group that when acted on by an acid, is cleaved. Namely, each of the repeating units of general formula (A2) contains the group of the formula "—$COOA_2$" as an acid-decomposable group. $A_2$ is, for example, the same as mentioned above in connection with $A_1$ of general formula (A1).

$A_2$ is preferably a hydrocarbon group (preferably 20 or less carbon atoms, more preferably 4 to 12 carbon atoms), more preferably a t-butyl group, a t-amyl group or a hydrocarbon group with an alicyclic structure (for example, an alicyclic group per se or an alkyl group substituted with an alicyclic group).

It is preferred for $A_2$ to be a tertiary alkyl group or a tertiary cycloalkyl group.

The alicyclic structure may be monocyclic or polycyclic. For example, there can be mentioned a monocyclo, bicyclo, tricyclo or tetracyclo structure having 5 or more carbon atoms, or the like. The number of carbon atoms thereof is preferably in the range of 6 to 30, most preferably 7 to 25. A substituent may be introduced in this hydrocarbon group with an alicyclic structure.

Examples of the alicyclic structures are shown below.

(1)

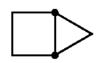

(2)

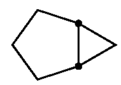

(3)

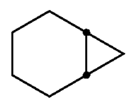

(4)

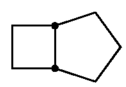

(5)

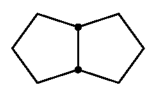

(6)

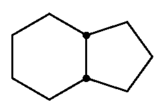

(7)

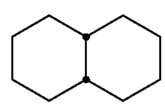

(8)

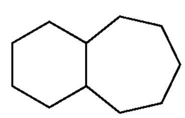

(9)

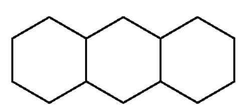

(10)

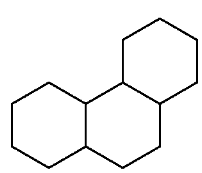

(11)

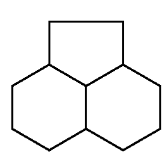

-continued
(12)
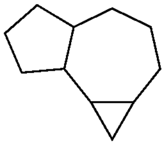
(13)
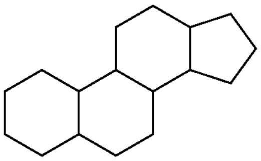
(14)
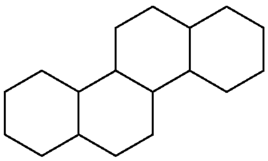
(15)
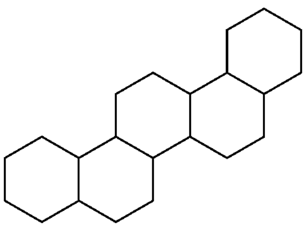
(16)
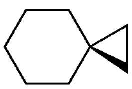
(17)
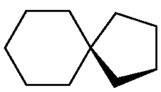
(18)
(19)
(20)
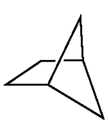
(21)
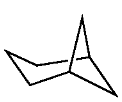
(22)
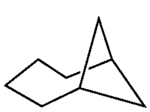
(23)
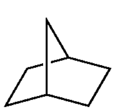
-continued
(24)
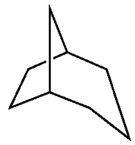
(25)
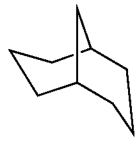
(26)
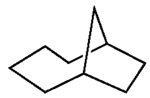
(27)
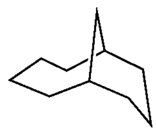
(28)
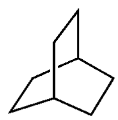
(29)
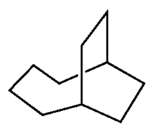
(30)
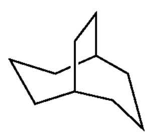
(31)
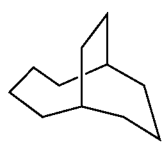
(32)
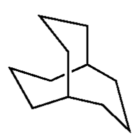
(33)
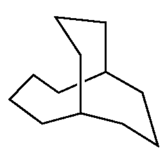
(34)
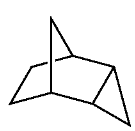

-continued (35)

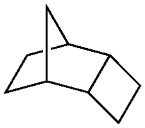

(36)

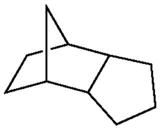

(37)

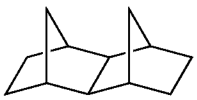

(38)

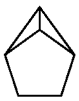

(39)

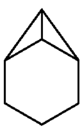

(40)

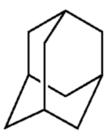

(41)

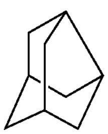

(42)

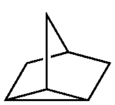

(43)

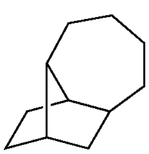

(44)

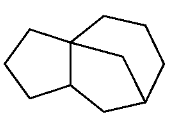

(45)

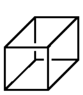

(46)

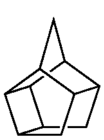

-continued (47)

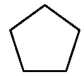

(48)

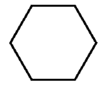

(49)

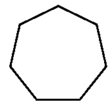

(50)

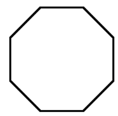

In the present invention, preferred examples of these alicyclic structures include, expressed as monovalent alicyclic groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. An adamantyl group, a decalin residue, a norbornyl group, a cedrol group, a cyclohexyl group, a cycloheptyl group, a cyclooctyl group, a cyclodecanyl group and a cyclododecanyl group are more preferred.

As substituents that can be introduced in alicycles of these structures, there can be mentioned an alkyl group, a halogen atom, a hydroxyl group, an alkoxy group, a carboxyl group and an alkoxycarbonyl group. The alkyl group is preferably a lower alkyl group, such as a methyl group, an ethyl group, a propyl group, an isopropyl group or a butyl group. More preferably, the alkyl group is a methyl group, an ethyl group, a propyl group or an isopropyl group. As the alkoxy group, there can be mentioned one having 1 to 4 carbon atoms, such as a methoxy group, an ethoxy group, a propoxy group or a butoxy group. Further substituents may be introduced in these alkyl and alkoxy groups. As further substituents introducible in the alkyl and alkoxy groups, there can be mentioned a hydroxyl group, a halogen atom and an alkoxy group.

The acid-decomposable group with an alicyclic structure is preferably any of those of general formulae (pI) to (pV) below.

(pI)

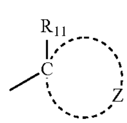

(pII)

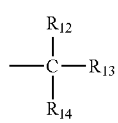

(pIII)

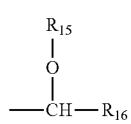

-continued (pIV)

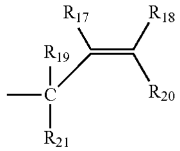

(pV)

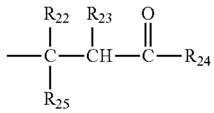

In the general formulae (pI) to (pV), $R_{11}$ represents a methyl group, an ethyl group, an n-propyl group, an isopropyl group, an n-butyl group, an isobutyl group or a sec-butyl group, and Z represents an atomic group required for formation of an alicyclic hydrocarbon group in cooperation with a carbon atom.

Each of $R_{12}$ to $R_{16}$ independently represents an alicyclic hydrocarbon group or a linear or branched alkyl group having 1 to 4 carbon atoms, provided that at least one of $R_{12}$ to $R_{14}$ or either $R_{15}$ or $R_{16}$ represents an alicyclic hydrocarbon 1 group.

Each of $R_{17}$ to $R_{21}$ independently represents a hydrogen atom or an alicyclic hydrocarbon group or a linear or branched alkyl group having 1 to 4 carbon atoms, provided that at least one of $R_{17}$ to $R_{21}$ represents an alicyclic hydrocarbon group. Either $R_{19}$ or $R_{21}$ represents an alicyclic hydrocarbon group or a linear or branched alkyl group having 1 to 4 carbon atoms.

Each of $R_{22}$ to $R_{25}$ independently represents a hydrogen atom or an alicyclic hydrocarbon group or a linear or branched alkyl group having 1 to 4 carbon atoms, provided that at least one of $R_{22}$ to $R_{25}$ represents an alicyclic hydrocarbon group. $R_{23}$ and $R_{24}$ may be bonded to each other to thereby form a ring.

In general formulae (pI) to (pV), each of the alkyl groups represented by $R_{12}$ to $R_{25}$ is a linear or branched alkyl group having 1 to 4 carbon atoms, which may be substituted or unsubstituted. As the alkyl group, there can be mentioned, for example, a methyl group, an ethyl group, an n-propyl group, an isopropyl group, an n-butyl group, an isobutyl group, a sec-butyl group, a t-butyl group or the like.

As further substituents introducible in these alkyl groups, there can be mentioned an alkoxy group having 1 to 4 carbon atoms, a halogen atom (a fluorine atom, a chlorine atom, a bromine atom or an iodine atom), an acyl group, an acyloxy group, a cyano group, a hydroxyl group, a carboxyl group, an alkoxycarbonyl group, a nitro group and the like.

As the alicyclic hydrocarbon groups represented by $R_{11}$ to $R_{25}$ and the alicyclic hydrocarbon groups formed by Z and a carbon atom, there can be mentioned those set forth above as alicyclic structures.

It is preferred for the repeating units of general formula (A2) in one form thereof to be the repeating units of the formula below.

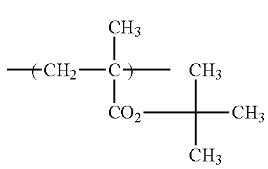

It is preferred for the repeating units of general formula (A2) in another form thereof to be the repeating units of general formula (A3) below.

(A3)

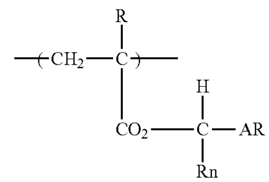

In general formula (A3),

AR represents an aryl group.

Rn represents an alkyl group, a cycloalkyl group or an aryl group. Rn and AR may be bonded to each other to thereby form a nonaromatic ring.

R represents a hydrogen atom, an alkyl group, a cycloalkyl group, a halogen atom, a cyano group or an alkyloxycarbonyl group.

Below, the repeating units of general formula (A3) will be described.

As mentioned above, AR represents an aryl group. The aryl group represented by AR is preferably one having 6 to 20 carbon atoms, such as a phenyl group, a naphthyl group, an anthryl group or a fluorene group. An aryl group having 6 to 15 carbon atoms is more preferred.

When AR is a naphthyl group, an anthryl group or a fluorene group, the position of bonding of AR to the carbon atom to which Rn is bonded is not particularly limited. For example, when AR is a naphthyl group, the carbon atom may be bonded to whichever position, α-position or β-position, of the naphthyl group. When AR is an anthryl group, the carbon atom may be bonded to any of the 1-position, 2-position and 9-position of the anthryl group.

One or more substituents may be introduced in each of the aryl groups represented by AR. As particular examples of such substituents, there can be mentioned a linear or branched alkyl group having 1 to 20 carbon atoms, such as a methyl group, an ethyl group, a propyl group, an isopropyl group, an n-butyl group, an isobutyl group, a t-butyl group, a pentyl group, a hexyl group, an octyl group or a dodecyl group; an alkoxy group containing any of these alkyl groups as its part; a cycloalkyl group, such as a cyclopentyl group or a cyclohexyl group; a cycloalkoxy group containing such a cycloalkyl group as its part; a hydroxyl group; a halogen atom; an aryl group; a cyano group; a nitro group; an acyl group; an acyloxy group; an acylamino group; a sulfonylamino group; an alkylthio group; an arylthio group; an aralkylthio group; a thiophenecarbonyloxy group; a thiophenemethylcarbonyloxy group; and a heterocyclic residue, such as a pyrrolidone residue. Among these substituents, a linear or branched alkyl group having 1 to 5 carbon atoms and an alkoxy group containing the alkyl group as its part are preferred. A paramethyl group and a paramethoxy group are more preferred.

When a plurality of substituents are introduced in the aryl group represented by AR, at least two members of the plurality of substituents may be bonded to each other to thereby form a ring. The ring is preferably a 5- to 8-membered one, more preferably a 5- or 6-membered one. Further, this ring may be a heteroring containing a heteroatom, such as an oxygen atom, a nitrogen atom or a sulfur atom, as a ring member.

A substituent may further be introduced in this ring. The substituent is the same as the further substituent mentioned below as being introducible in Rn.

From the viewpoint of roughness performance, it is preferred for each of the repeating units of general formula (A3) to contain two or more aromatic rings. Generally, the number of aromatic rings introduced in the repeating unit is preferably up to 5, more preferably up to 3.

Also, from the viewpoint of roughness performance, it is preferred for AR of each of the repeating units of general formula (A3) to contain two or more aromatic rings. More preferably, AR is a naphthyl group or a biphenyl group. Generally, the number of aromatic rings introduced in AR is preferably up to 5, more preferably up to 3.

As mentioned above, Rn represents an alkyl group, a cycloalkyl group or an aryl group.

The alkyl group represented by Rn may be in the form of a linear or branched chain. As a preferred alkyl group, there can be mentioned an alkyl group having 1 to 20 carbon atoms, such as a methyl group, an ethyl group, a propyl group, an isopropyl group, an n-butyl group, an isobutyl group, a t-butyl group, a pentyl group, a hexyl group, an octyl group or a dodecyl group. The alkyl group represented by Rn more preferably has 1 to 5 carbon atoms, further more preferably 1 to 3 carbon atoms.

As the cycloalkyl group represented by Rn, there can be mentioned, for example, one having 3 to 15 carbon atoms, such as a cyclopentyl group or a cyclohexyl group.

The aryl group represented by Rn is preferably, for example, one having 6 to 14 carbon atoms, such as a phenyl group, a xylyl group, a tolyl group, a cumenyl group, a naphthyl group or an anthryl group.

Substituents may further be introduced in the alkyl group, cycloalkyl group and aryl group represented by Rn. As such substituents, there can be mentioned, for example, an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue, such as a pyrrolidone residue. Among these substituents, an alkoxy group, a hydroxyl group, a halogen atom, a nitro group, an acyl group, an acyloxy group, an acylamino group and a sulfonylamino group are especially preferred.

As mentioned above, R represents a hydrogen atom, an alkyl group, a cycloalkyl group, a halogen atom, a cyano group or an alkyloxycarbonyl group.

The alkyl group and cycloalkyl group represented by R are, for example, the same as mentioned above in connection with Rn. Substituents may be introduced in the alkyl group and cycloalkyl group. The substituents are, for example, the same as set forth above in connection with Rn.

When R is a substituted alkyl group or cycloalkyl group, it is especially preferred for R to be, for example, a trifluoromethyl group, an alkyloxycarbonylmethyl group, an alkylcarbonyloxymethyl group, a hydroxymethyl group or an alkoxymethyl group.

As the halogen atom represented by R, there can be mentioned a fluorine atom, a chlorine atom, a bromine atom or an iodine atom. A fluorine atom is most preferred.

As the part of alkyl group contained in the alkyloxycarbonyl group represented by R, there can be employed, for example, any of the structures mentioned above as the alkyl group represented by R.

Preferably, Rn and AR are bonded to each other to thereby form a nonaromatic ring. In particular, this can enhance the roughness performance.

The nonaromatic ring that may be formed by the mutual bonding of Rn and AR is preferably a 5- to 8-membered ring, more preferably a 5- or 6-membered ring.

The nonaromatic ring may be an aliphatic ring or a heteroring containing a heteroatom, such as an oxygen atom, a nitrogen atom or a sulfur atom, as a ring member.

A substituent may be introduced in the nonaromatic ring. The substituent is, for example, the same as the further substituent mentioned above as being introducible in Rn.

Non-limiting specific examples of the repeating units of general formula (A2) or the monomers corresponding thereto are shown below.

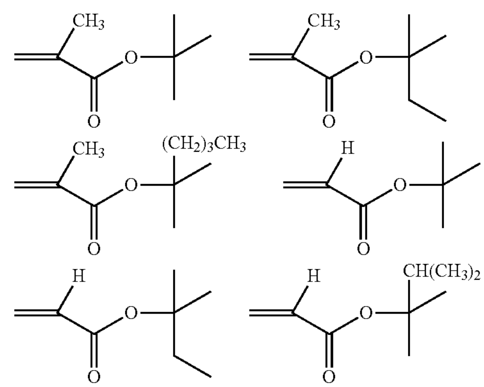

1

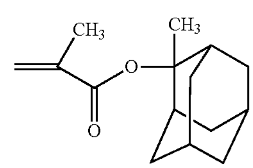

2

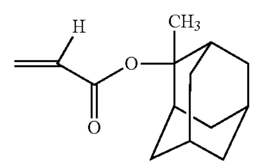

3

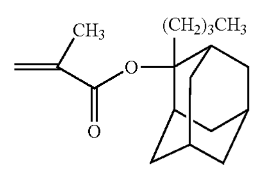

4

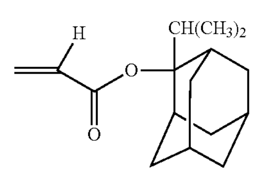

5

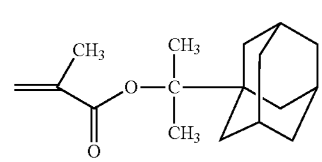

-continued
6
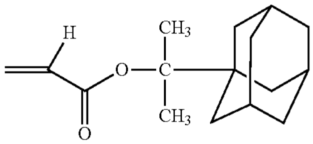
7
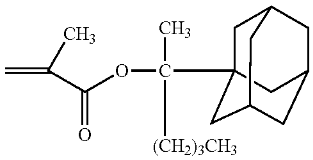
8
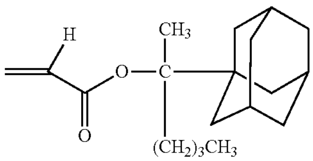
9
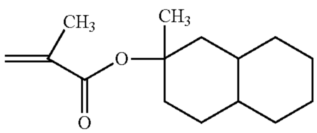
10
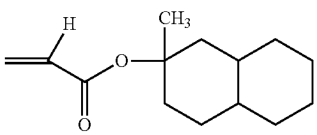
11
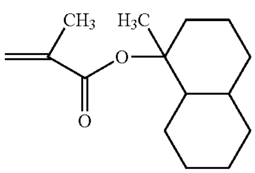
12
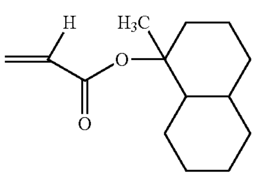
13
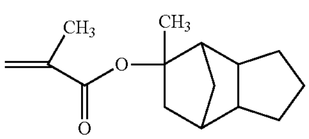
14
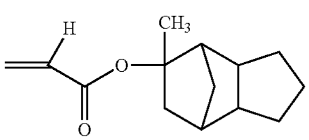
15
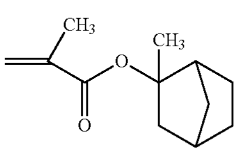
-continued
16
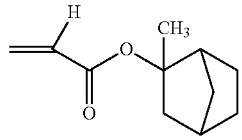
17
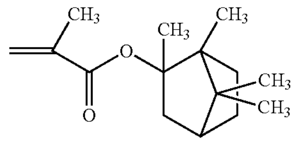
18
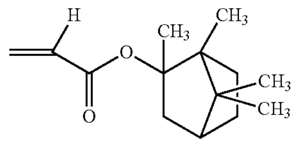
19
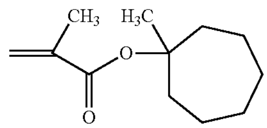
20
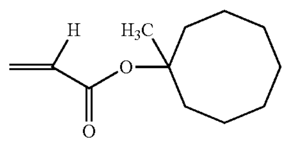
21
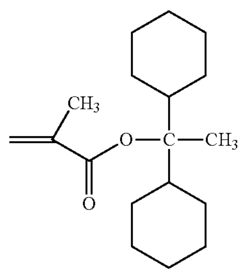
22
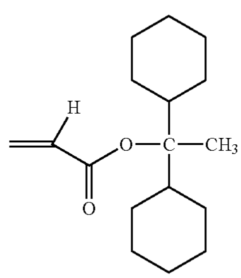
23
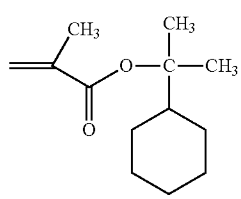
24
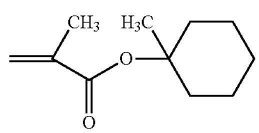

-continued
25
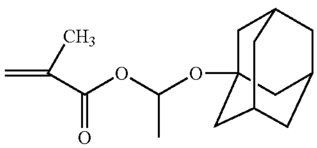
26
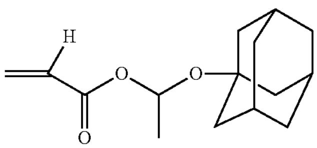
27
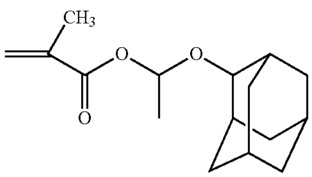
28
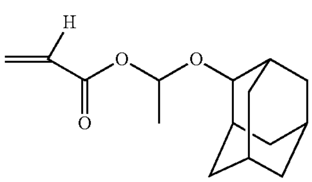
29
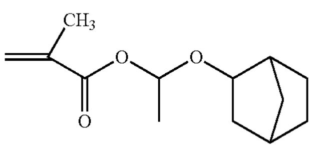
30
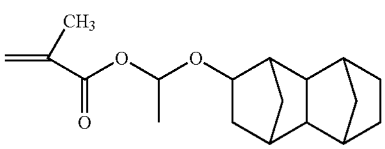
31
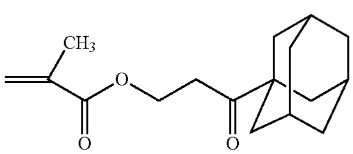
32
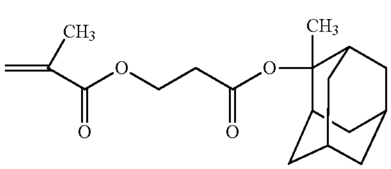
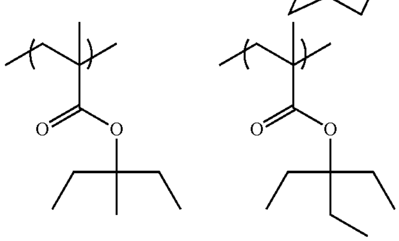
-continued
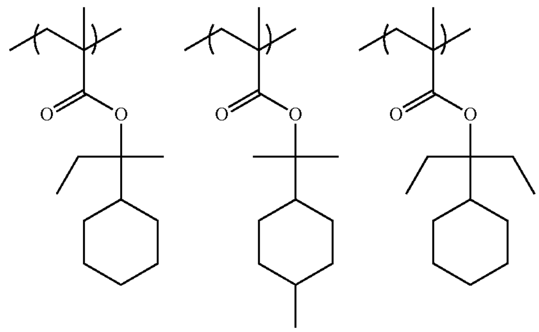
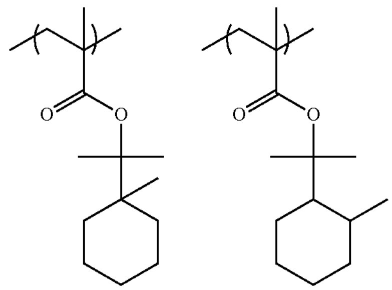
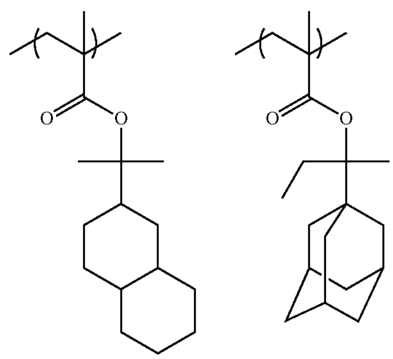
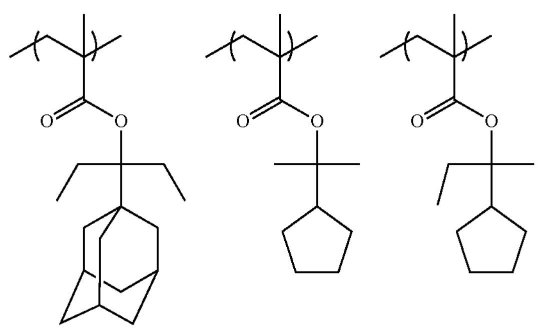
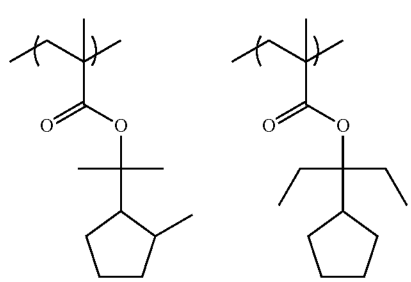

-continued
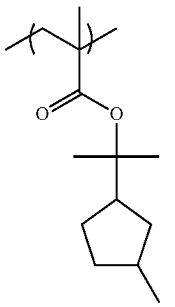
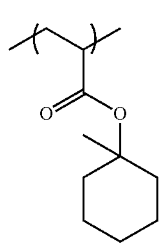
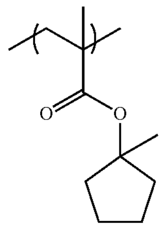
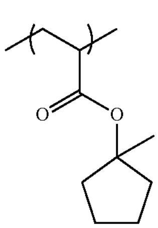
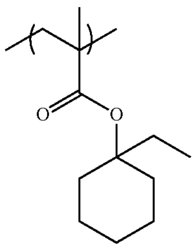
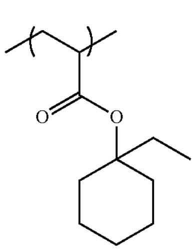
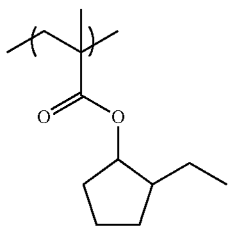
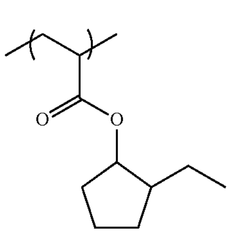
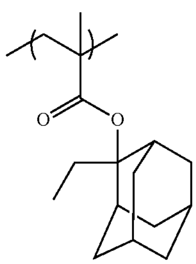
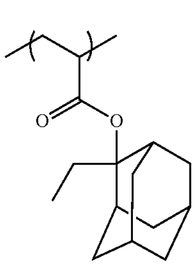
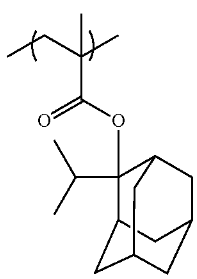
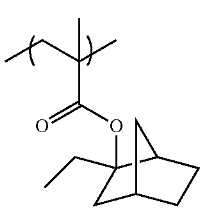
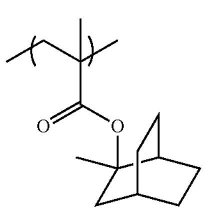
-continued
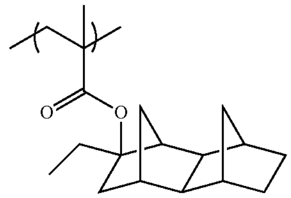
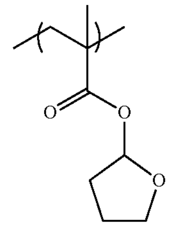
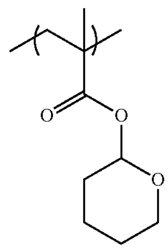
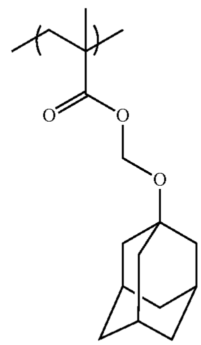
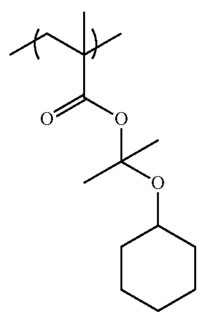
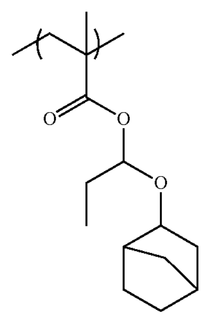
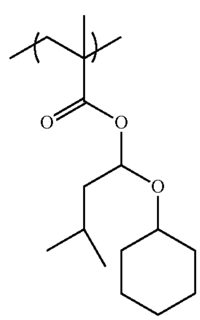
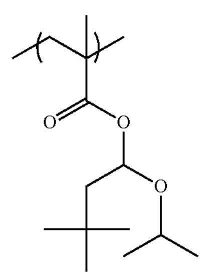
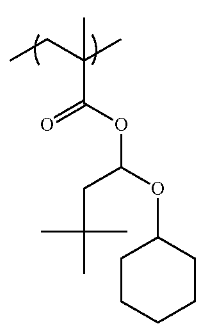
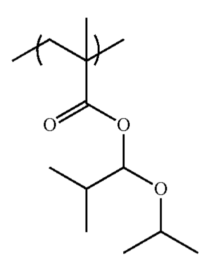

-continued
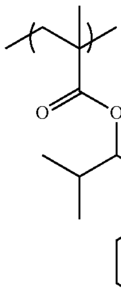
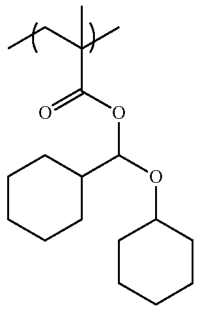
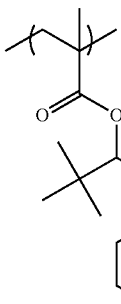
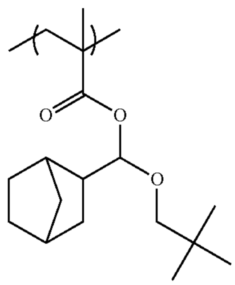
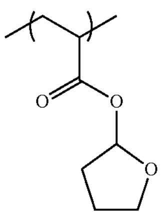
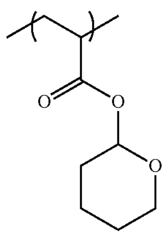
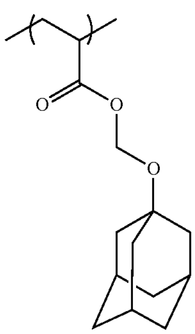
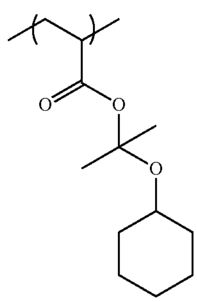
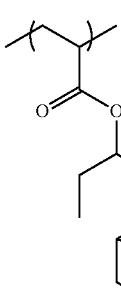
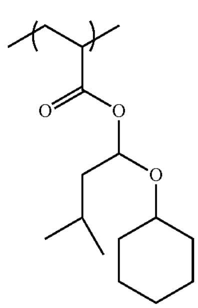
-continued
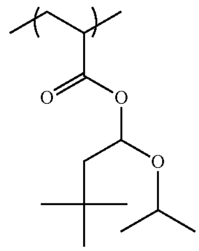
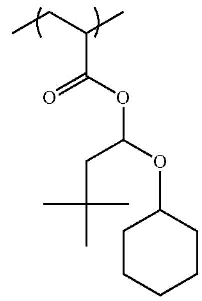
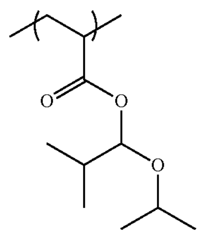
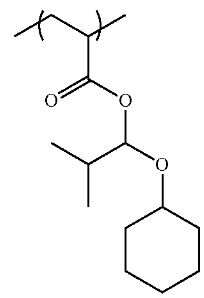
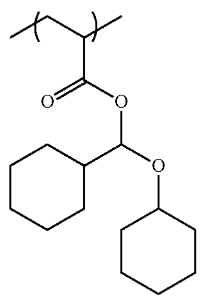
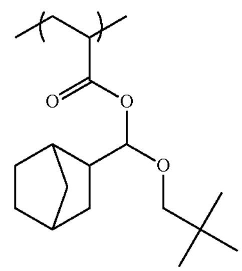
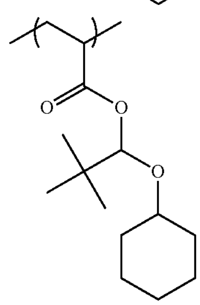
Non-limiting specific examples of the repeating units of general formula (A3) are shown below.
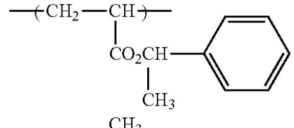
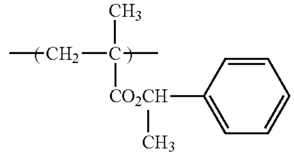
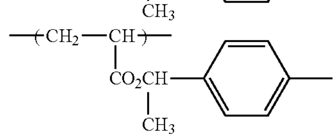

-continued
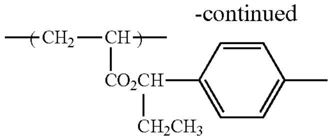
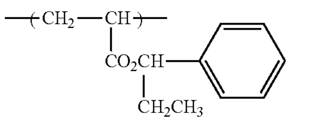
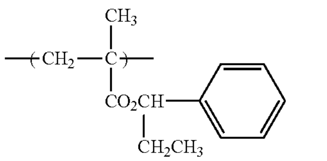
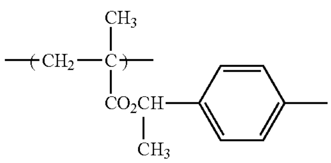
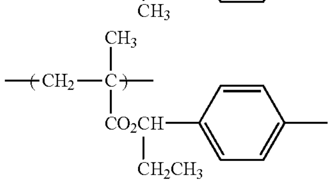
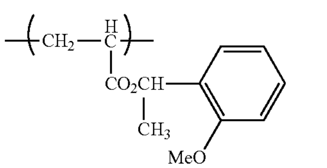
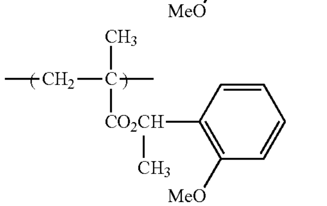
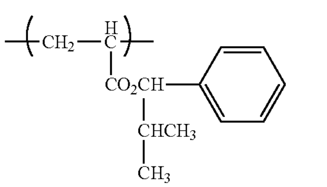
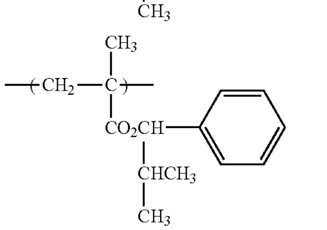
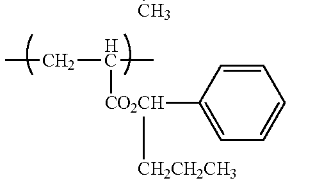
-continued
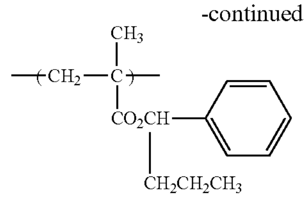
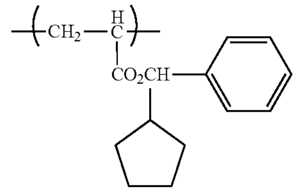
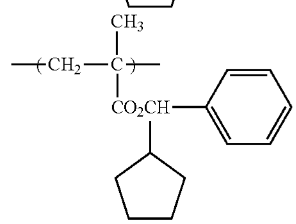
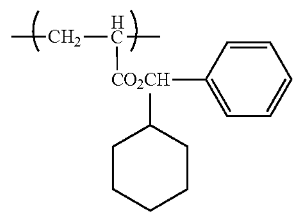
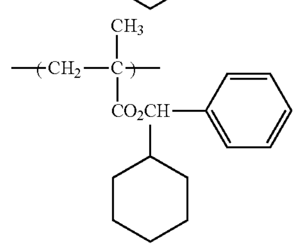
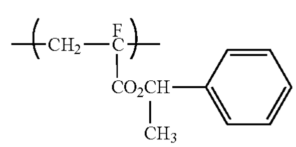
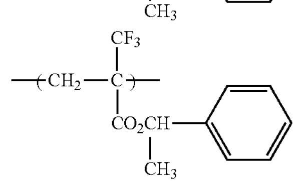
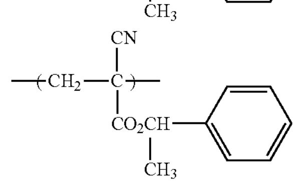
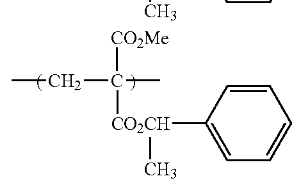

-continued
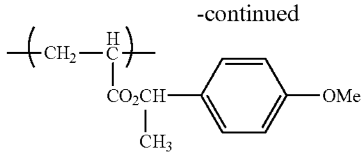
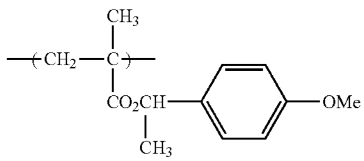
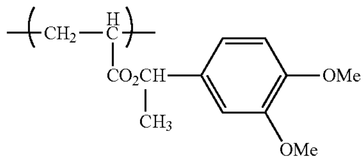
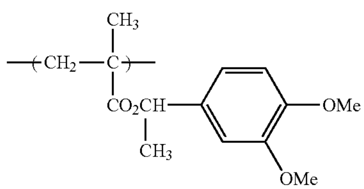
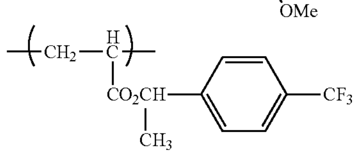
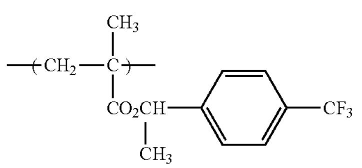
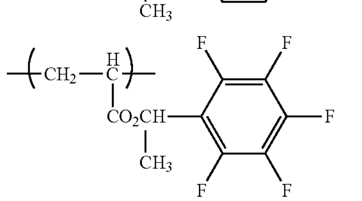
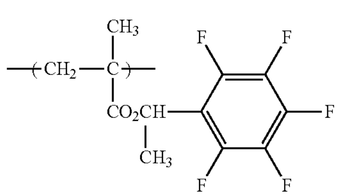
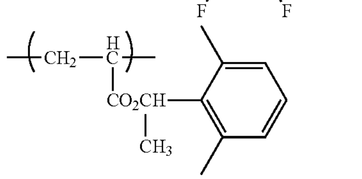
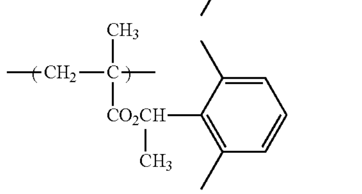
-continued
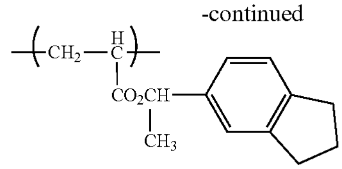
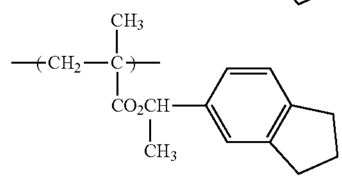
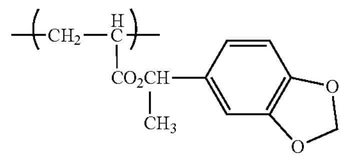
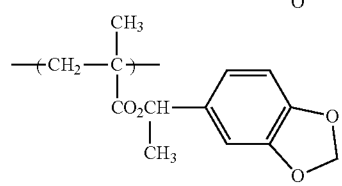
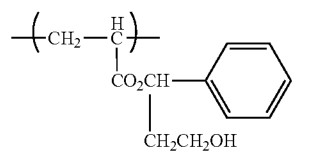
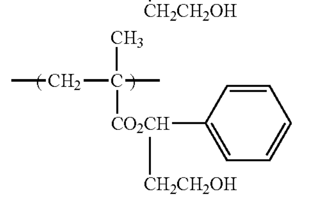
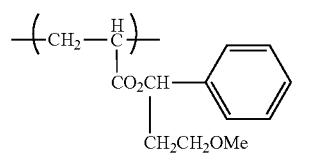
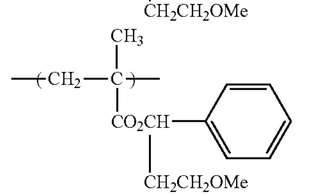
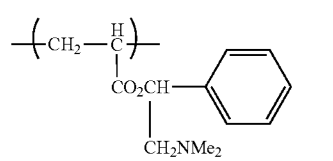
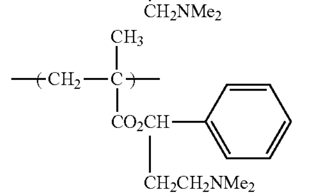

-continued
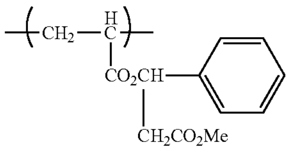
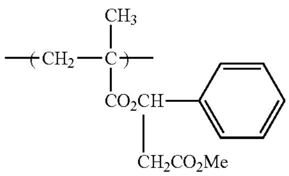
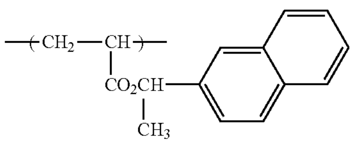
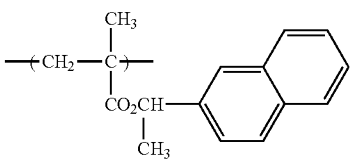
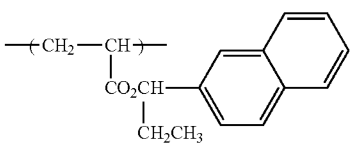
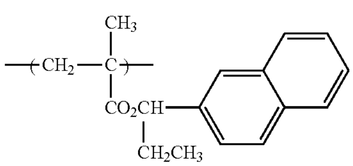
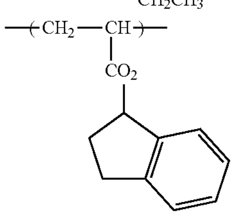
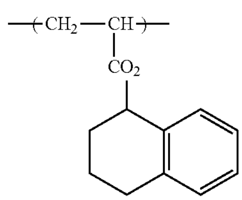
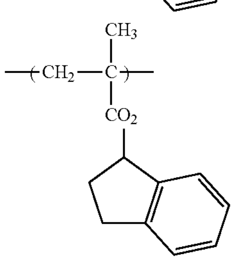
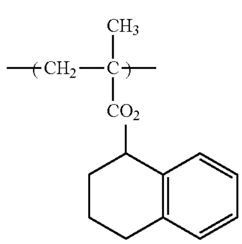
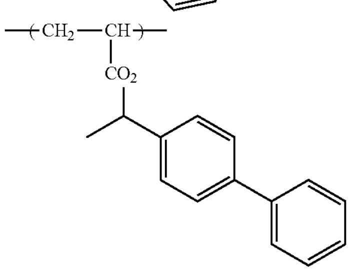
-continued
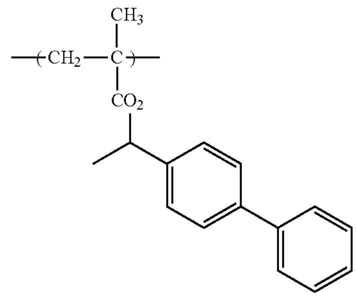
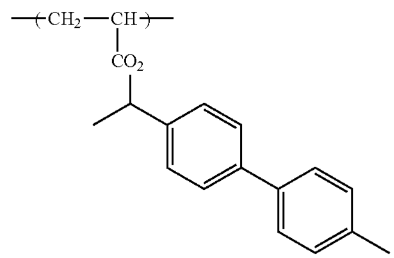
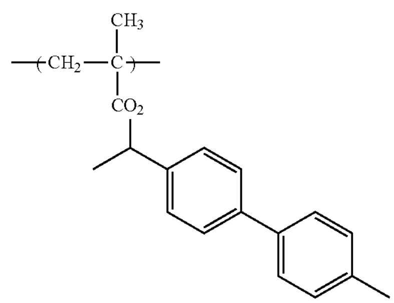
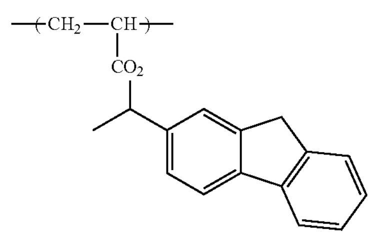
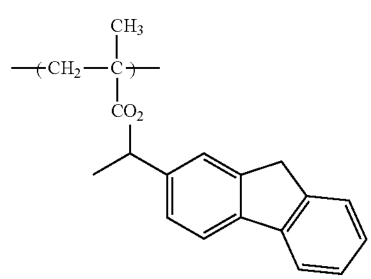
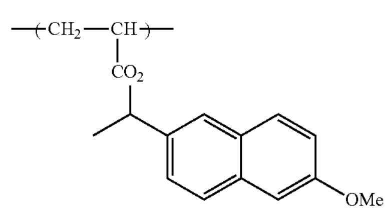

-continued
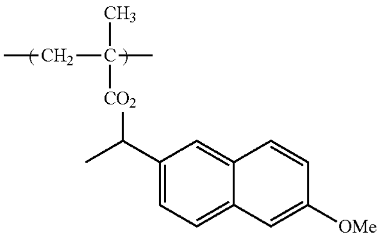
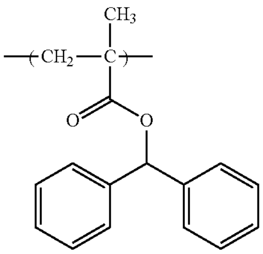
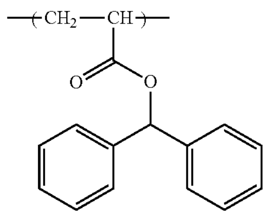
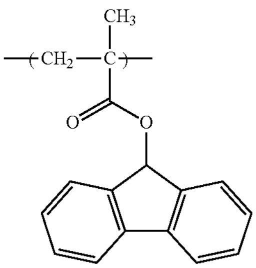
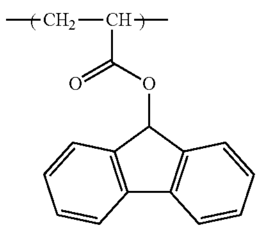
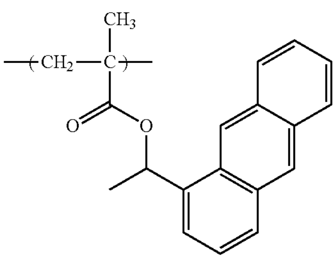
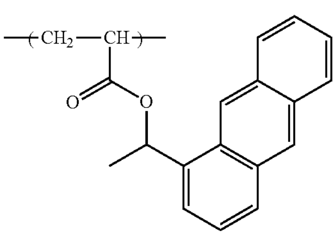
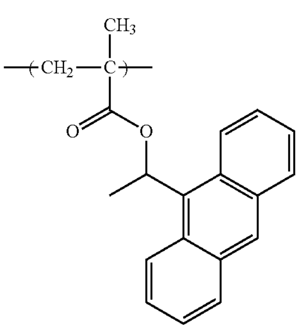
-continued
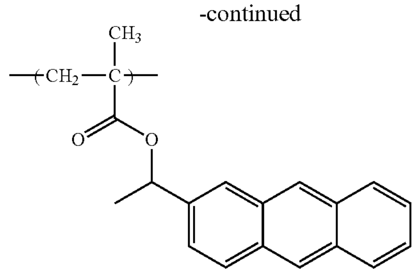
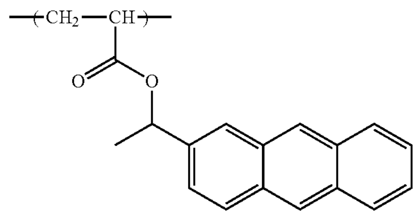
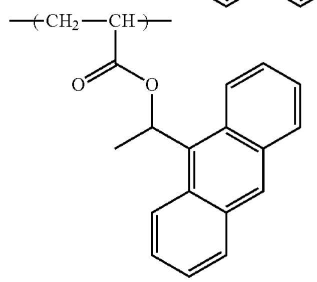
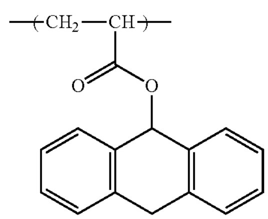
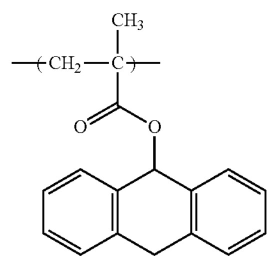
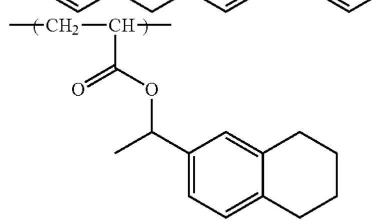
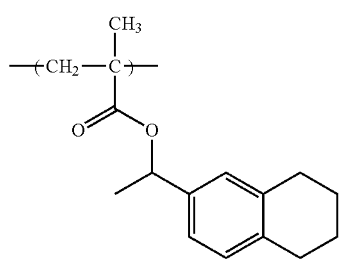
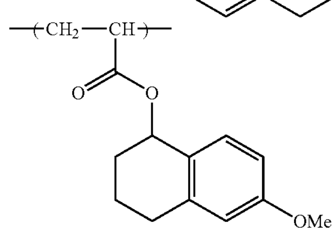

-continued
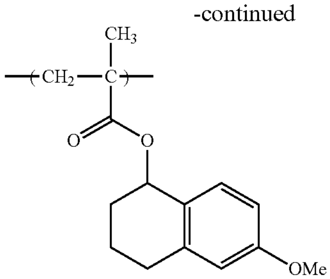
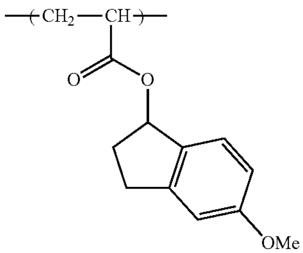
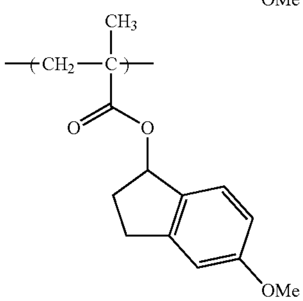
Among these, the repeating units below are especially preferred.
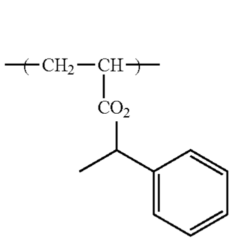
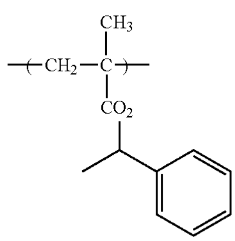
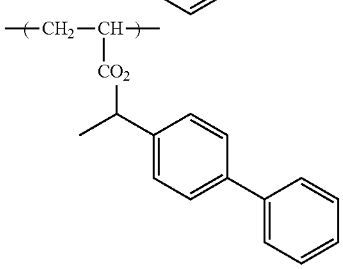
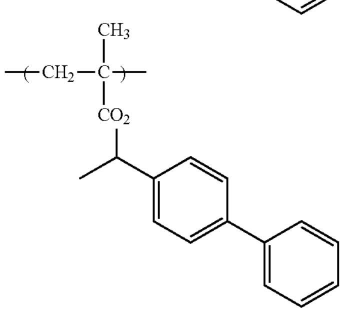
-continued
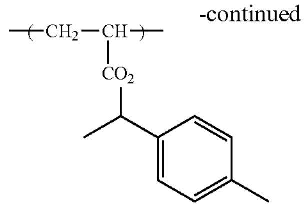
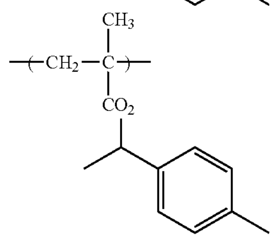
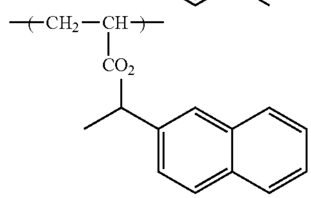
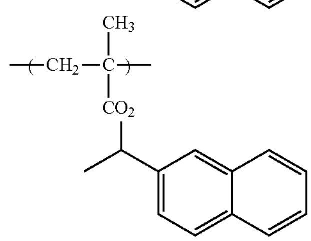
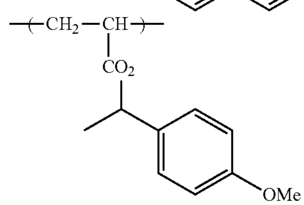
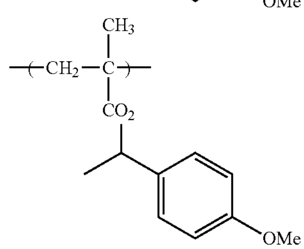
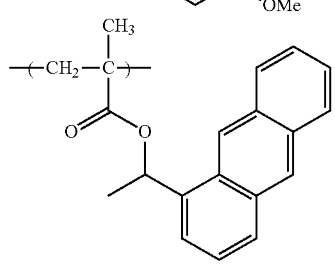
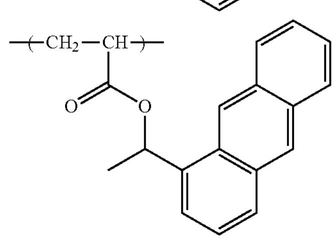

-continued

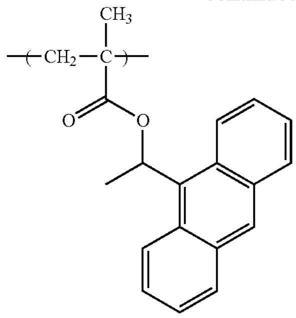

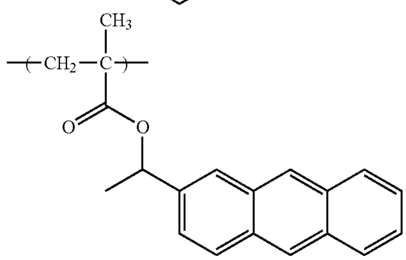

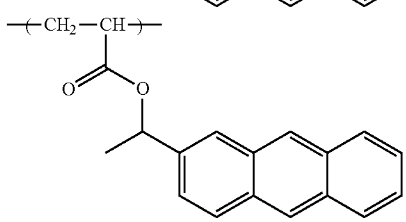

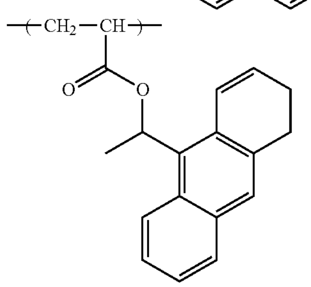

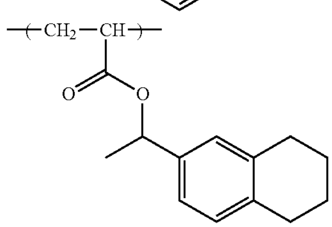

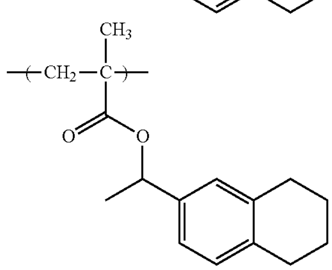

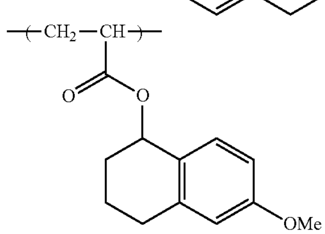

-continued

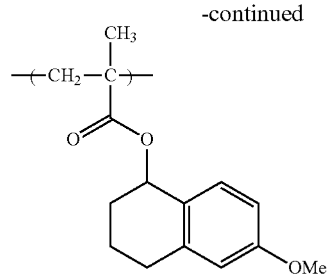

In some aspects, it is preferred for the repeating units of general formula (A2) to be those of t-butyl methacrylate and ethylcyclopentyl methacrylate.

The monomers corresponding to the repeating units of general formula (A2) can be synthesized by performing an esterification between (meth)acrylic chloride and an alcohol compound in a solvent, such as THF, acetone or methylene chloride, in the presence of a basic catalyst, such as triethylamine, pyridine or DBU. Alternatively, commercially available monomers may be used.

The resin (Ab) may further comprise any of repeating units of general formula (A5) below.

(A5)

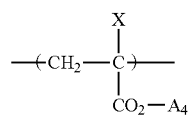

In formula (A5),

X represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group, being similar to X of general formula (A2b).

$A_4$ represents a hydrocarbon group not cleaved under the action of an acid.

As the hydrocarbon group not cleaved under the action of an acid, represented by $A_4$ in general formula (A5), there can be mentioned any of hydrocarbon groups other than the above acid-decomposable groups, for example, an alkyl group (preferably 1 to 15 carbon atoms) not cleaved under the action of an acid, a cycloalkyl group (preferably 31 to 15 carbon atoms) not cleaved under the action of an acid, an aryl group (preferably 6 to 15 carbon atoms) not cleaved under the action of an acid and the like.

The hydrocarbon group not cleaved under the action of an acid, represented by $A_4$ may further be substituted with a hydroxyl group, an alkyl group, a cycloalkyl group, an aryl group or the like.

It is also preferred for the resin (Ab) to further comprise any of repeating units of general formula (A6) below.

(A6)

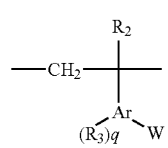

In general formula (A6), $R_2$ represents a hydrogen atom, a methyl group, a cyano group, a halogen atom or a perfluoro group having 1 to 4 carbon atoms.

$R_3$ represents a hydrogen atom, an alkyl group, a cycloalkyl group, a halogen atom, an aryl group, an alkoxy group or an acyl group.

In the formula, q is an integer of 0 to 4.

Ar represents a (q+2)-valent aromatic ring.

W represents a group not decomposed under the action of an acid or a hydrogen atom.

The aromatic ring represented by Ar is preferably a benzene ring, a naphthalene ring or an anthracene ring, more preferably a benzene ring.

W may represent a group not decomposed under the action of an acid (hereinafter also referred to as an acid-stable group). As such, there can be mentioned groups other than the above acid-decomposable groups. For example, there can be mentioned a halogen atom, an alkyl group, a cycloalkyl group, an alkenyl group, an aryl group, an acyl group, an alkylamido group, an arylamidomethyl group, an arylamido group or the like. The acid-stable group is preferably an acyl group or an alkylamido group, more preferably an acyl group, an alkylcarbonyloxy group, an alkyloxy group, a cycloalkyloxy group or an aryloxy group.

With respect to the acid-stable group represented by W, the alkyl group is preferably one having 1 to 4 carbon atoms, such as a methyl group, an ethyl group, a propyl group, an n-butyl group, a sec-butyl group or a t-butyl group. The cycloalkyl group is preferably one having 3 to 10 carbon atoms, such as a cyclopropyl group, a cyclobutyl group, a cyclohexyl group or an adamantyl group. The alkenyl group is preferably one having 2 to 4 carbon atoms, such as a vinyl group, a propenyl group, an allyl group or a butenyl group. The aryl group is preferably one having 6 to 14 carbon atoms, such as a phenyl group, a xylyl group, a tolyl group, a cumenyl group, a naphthyl group or an anthracenyl group. The site of W on the benzene ring is not limited. Preferably, W is positioned at the meta- or para-position of the styrene skeleton. Most preferably, W is positioned at the para-position.

Nonlimiting specific examples of the repeating units of general formula (A6) are shown below.

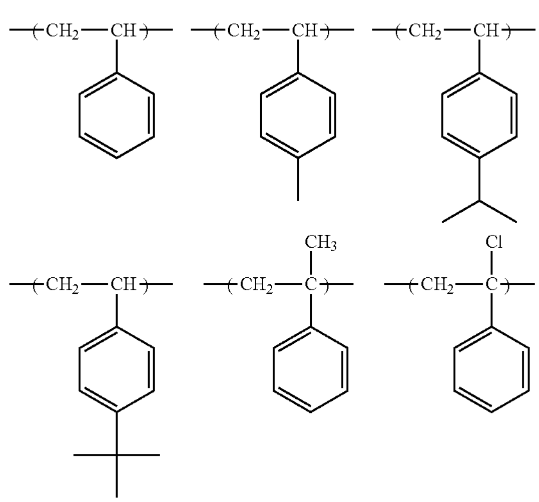

-continued

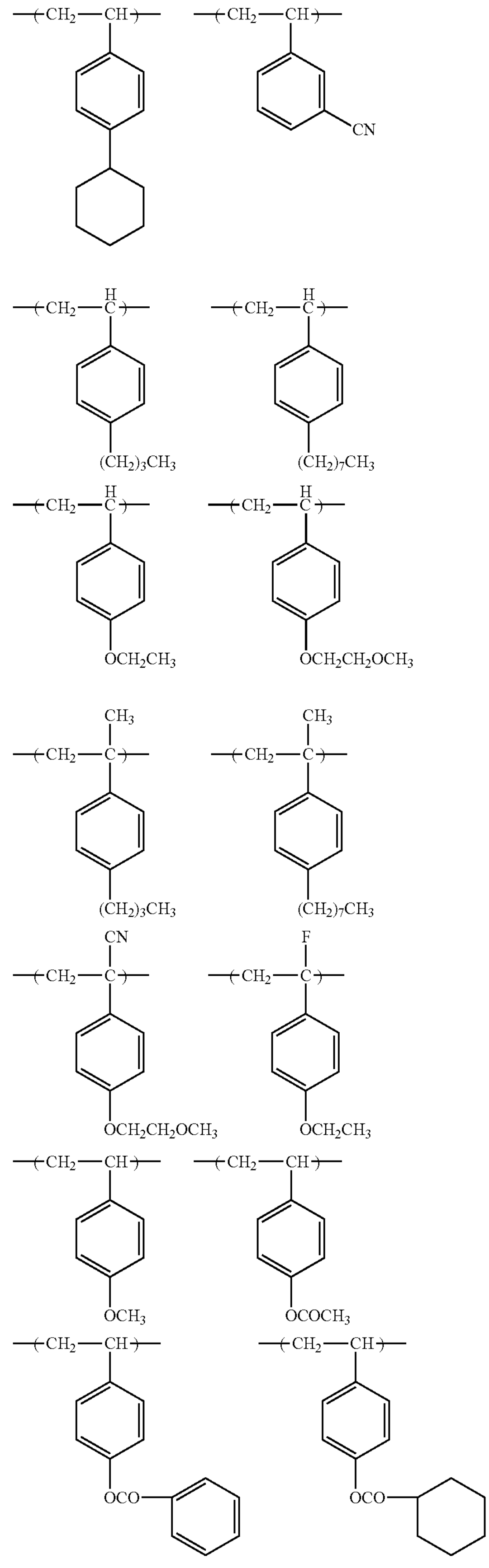

-continued

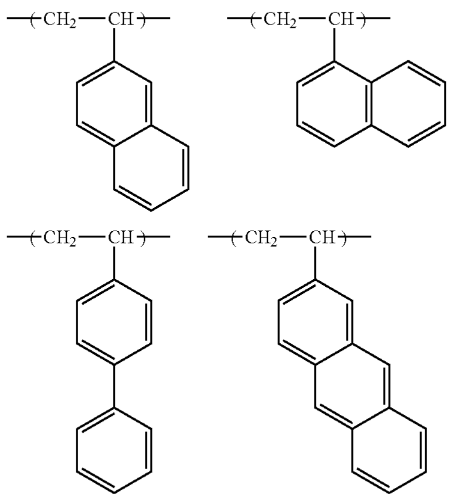

It is also preferred for the resin (Ab) to further comprise a repeating unit of (meth)acrylic acid derivative not decomposed under the action of an acid. Nonlimiting specific examples thereof are shown below.

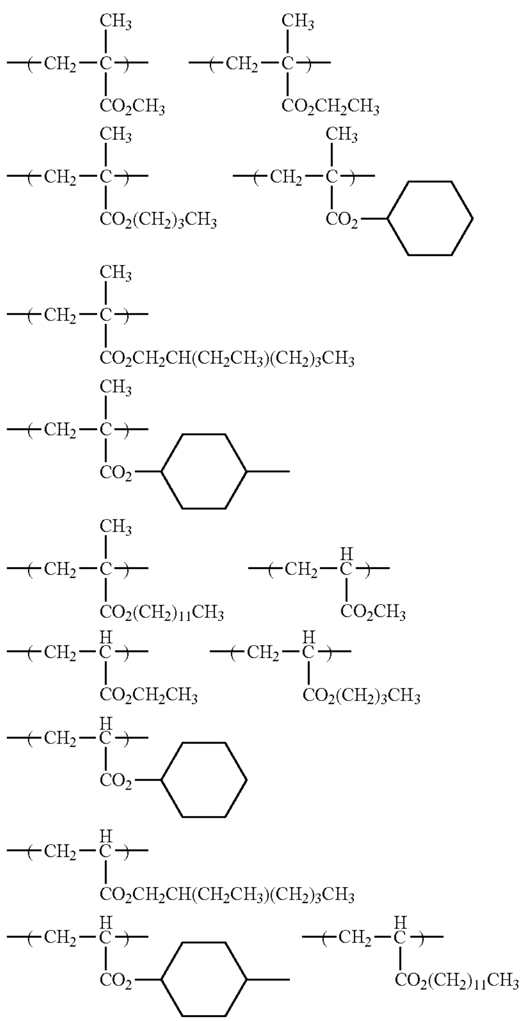

-continued

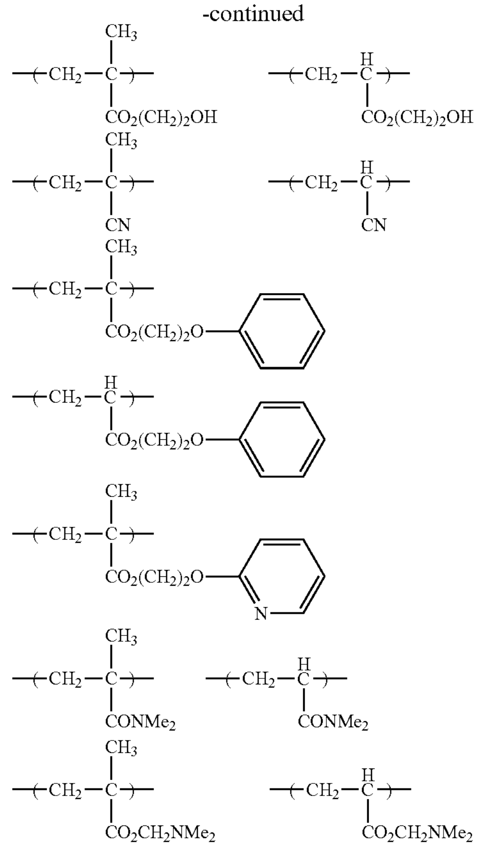

The content of the repeating units having an acid-decomposable group is preferably in the range of 5 to 95 mol %, more preferably 10 to 60 mol % and further more preferably 15 to 50 mol %, based on all the repeating units of the resin (Ab).

The content of the repeating units of general formula (A1) is preferably in the range of 0 to 90 mol %, more preferably 10 to 70 mol % and further more preferably 20 to 50 mol %, based on all the repeating units of the resin (Ab).

The content of the repeating units of general formula (A2) is preferably in the range of 0 to 90 mol %, more preferably 5 to 75 mol % and further more preferably 10 to 60 mol %, based on all the repeating units of the resin (Ab).

The content of the repeating units of general formula (A3) is preferably in the range of 0 to 90 mol %, more preferably 5 to 75 mol % and further more preferably 10 to 60 mol %, based on all the repeating units of the resin (Ab).

The content of the repeating units of general formula (A5) is preferably in the range of 0 to 50 mol %, more preferably 0 to 40 mol % and further more preferably 0 to 30 mol %, based on all the repeating units of the resin (Ab).

The resin (Ab) may further comprise any of the repeating units of general formula (A6). The incorporation of the repeating units is preferred from the viewpoint of an enhancement of film quality, suppression of any film thinning in nonexposed areas, etc. The content of repeating unit expressed by general formula (A6), based on all the repeating units of the resin, is preferably in the range of 0 to 50 mol %, more preferably 0 to 40 mol % and most preferably 0 to 30 mol %.

The resin (Ab) may be prepared by copolymerization with another appropriate polymerizable monomer for the introduction of an alkali-soluble group, such as a phenolic hydroxyl group or a carboxyl group, in order to maintain a favorable developability in an alkali developer, or by copolymerization with another hydrophobic polymerizable monomer, such as an alkyl acrylate or an alkyl methacrylate, in order to realize an enhancement of film quality.

The monomers corresponding to the repeating units of general formula (A2) can be synthesized by performing an esterification between (meth)acrylic chloride and an alcohol compound in a solvent, such as THF, acetone or methylene chloride, in the presence of a basic catalyst, such as triethylamine, pyridine or DBU. Alternatively, commercially available monomers may be used.

The monomers corresponding to the repeating units of general formula (A1) can be synthesized by acetalizing a hydroxylated styrene monomer and a vinyl ether compound in a solvent, such as THF or methylene chloride, in the presence of an acidic catalyst, such as p-toluenesulfonic acid or a pyridine salt of p-toluenesulfonic acid, or by effecting t-Boc protection with t-butyl dicarbonate in the presence of a basic catalyst, such as triethylamine, pyridine or DBU. Alternatively, commercially available monomers may be used.

It is preferred for the resin (Ab) in its one form to comprise any of repeating units of general formula (A) below,

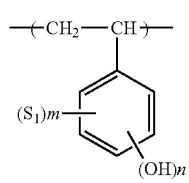

(A)

In the formula, n is an integer of 1 to 5, and m is an integer of 0 to 4 satisfying the relationship $1 \leq m+n \leq 5$. Preferably, n is 1 or 2, and 1 is more preferred. Preferably, m is 0 to 2, and 0 or 1 is more preferred and 0 most preferred.

$S_1$ represents a substituent, provided that when m is 2 or greater, two or more $S_1$s may be identical to or different from each other.

As the substituent represented by $S_1$, there can be mentioned, for example, an alkyl group, an alkoxy group, an acyl group, an acyloxy group, an aryl group, an aryloxy group, an aralkyl group, an aralkyloxy group, a hydroxyl group, a halogen atom, a cyano group, a nitro group, a sulfonylamino group, an alkylthio group, an arylthio group or an aralkylthio group.

As preferred alkyl groups including cycloalkyl groups, there can be mentioned, for example, linear or branched alkyl groups and cycloalkyl groups each having 1 to 20 carbon atoms, such as a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group and a dodecyl group. Substituents may further be introduced in these groups.

As preferred further introducible substituents, there can be mentioned an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, a heterocyclic residue such as a pyrrolidone residue and the like. A substituent having 12 or less carbon atoms is preferred.

As substituted alkyl groups, there can be mentioned, for example, a cyclohexylethyl group, an alkylcarbonyloxymethyl group, an alkylcarbonyloxyethyl group, a cycloalkylcarbonyloxymethyl group, a cycloalkylcarbonyloxyethyl group, an arylcarbonyloxyethyl group, an aralkylcarbonyloxyethyl group, an alkyloxymethyl group, a cycloalkyloxymethyl group, an aryloxymethyl group, an aralkyloxymethyl group, an alkyloxyethyl group, a cycloalkyloxyethyl group, an aryloxyethyl group, an aralkyloxyethyl group, an alkylthiomethyl group, a cycloalkylthiomethyl group, an arylthiomethyl group, an aralkylthiomethyl group, an alkylthioethyl group, a cycloalkylthioethyl group, an arylthioethyl group, an aralkylthioethyl group and the like.

The alkyl and cycloalkyl groups in these groups are not particularly limited. Substituents, such as the above-mentioned alkyl group, cycloalkyl group and alkoxy group, may further be introduced therein.

Examples of the above alkylcarbonyloxyethyl group and cycloalkylcarbonyloxyethyl group include a cyclohexylcarbonyloxyethyl group, a t-butylcyclohexylcarbonyloxyethyl group, an n-butylcyclohexylcarbonyloxyethyl group and the like.

The aryl group is also not particularly limited. In general, there can be mentioned one having 6 to 14 carbon atoms, such as a phenyl group, a xylyl group, a tolyl group, a cumenyl group, a naphthyl group or an anthracenyl group. Substituents, such as the above-mentioned alkyl group, cycloalkyl group and alkoxy group, may further be introduced therein.

As the above aryloxyethyl group, for example, there can be mentioned a phenyloxyethyl group, a cyclohexylphenyloxyethyl group or the like. Substituents may further be introduced in these groups.

The aralkyl group is also not particularly limited. For example, there can be mentioned a benzyl group.

As the above aralkylcarbonyloxyethyl group, for example, there can be mentioned a benzylcarbonyloxyethyl group or the like. Substituents may further be introduced in these groups.

Examples of the repeating units of general formula (A) are shown below.

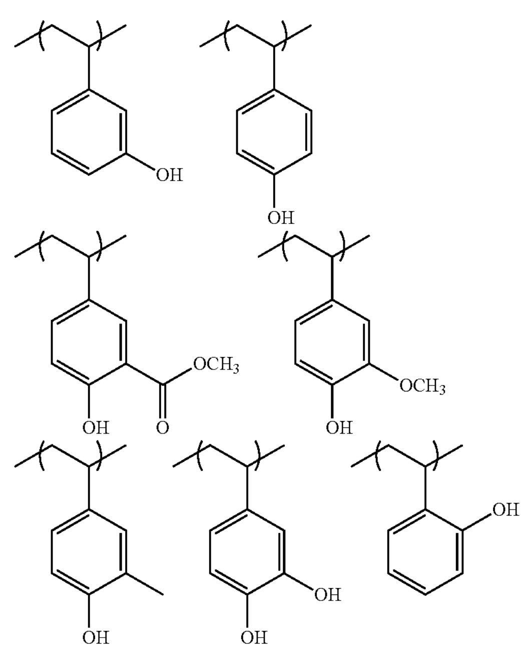

-continued

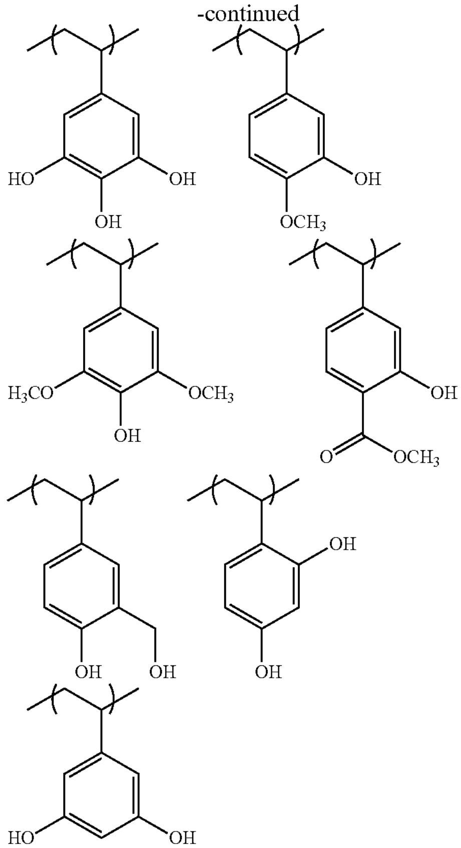

The resin (Ab) in its one form comprises at least the repeating unit of the formula below as the repeating unit expressed by general formula (A).

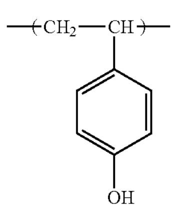

The content of repeating unit expressed by general formula (A) in the resin (Ab), based on all the repeating units of the resin (Ab), is preferably in the range of 0 to 90 mol %, more preferably 5 to 80 mol %, further more preferably 10 to 70 mol % and most preferably 20 to 60 mol %.

It is also preferred for the resin (Ab) to comprise any of repeating units of general formulae below. In the general formulae, j is an integer of 0 to 3, preferably 0 to 2 and more preferably 0 or 1.

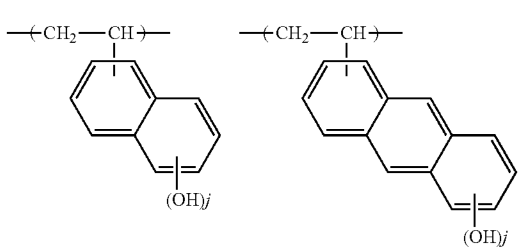

-continued

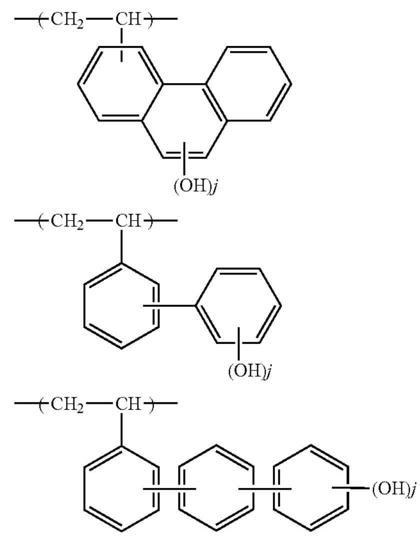

Particular examples of the repeating units of these general formulae are shown below.

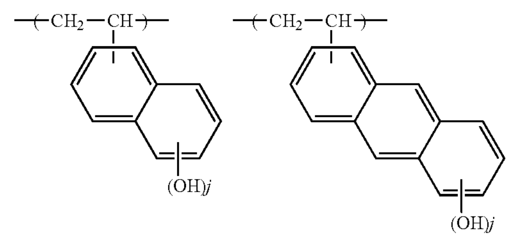

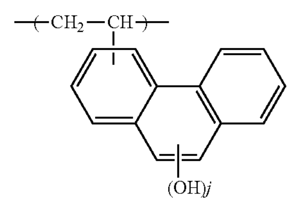

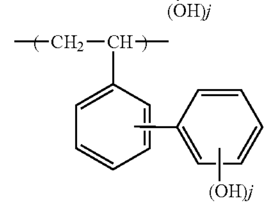

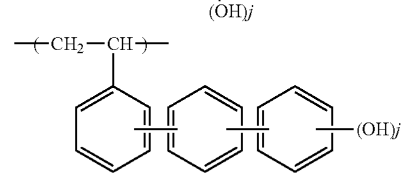

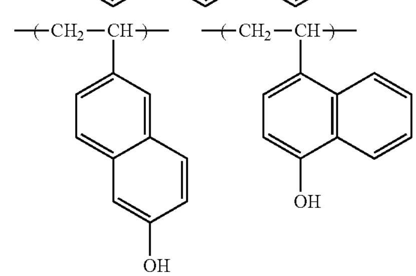

-continued

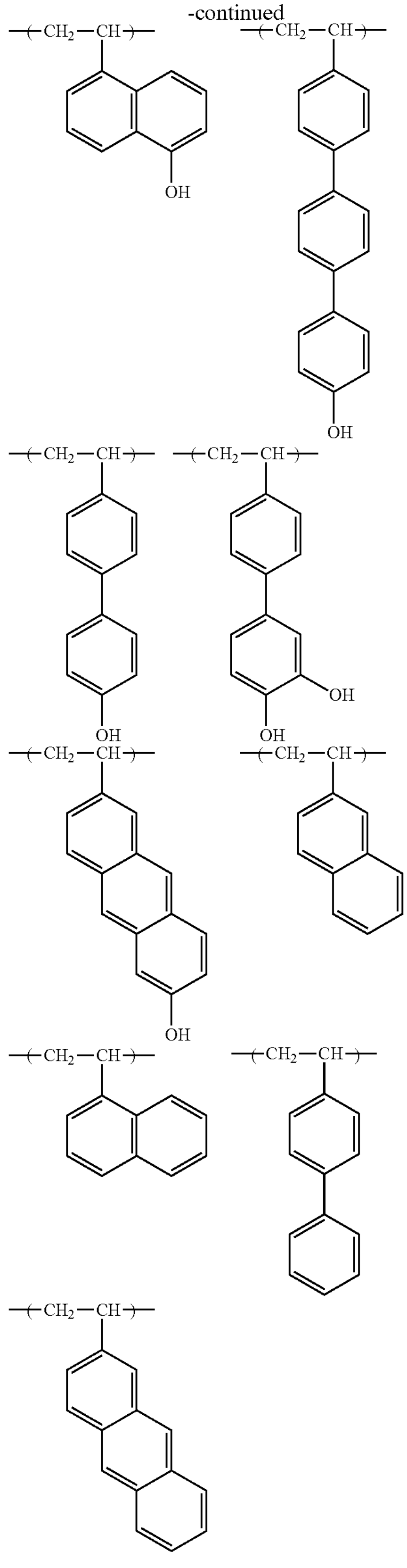

The resin (Ab) in its one form may comprise a repeating unit (B) (hereinafter referred to as an "acid generating repeating unit (B)" or a "repeating unit (B)") containing a structural moiety that when exposed to actinic rays or radiation, is decomposed to thereby generate an acid.

This structural moiety may be, for example, a structural moiety that when exposed to actinic rays or radiation, is decomposed to thereby generate an acid anion in the repeating unit (B), or a structural moiety that releases an acid anion to thereby generate a cation structure in the repeating unit (B).

It is preferred for this structural moiety to be, for example, an ionic structural moiety with a sulfonium salt structure or an iodonium salt structure.

This structural moiety may be, for example, the same as that represented by A in general formulae (B1), (B2) and (B3) to be described below.

In some aspect, it is preferred for the repeating unit (B) to be at least one member selected from the group consisting of repeating units of general formulae (B1), (B2) and (B3) below. Among these, the repeating units of general formulae (B1) and (B3) below are more preferred. The repeating units of general formula (B1) below are most preferred.

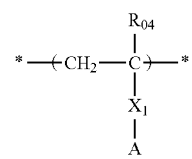

(B1)

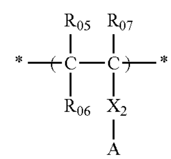

(B2)

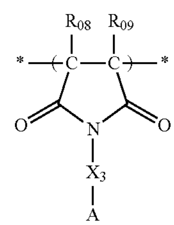

(B3)

In general formulae (B1), (B2) and (B3),

A represents a structural moiety that when exposed to actinic rays or radiation, is decomposed to thereby generate an acid anion.

Each of $R_{04}$, $R_{05}$ and $R_{07}$ to $R_{09}$ independently represents a hydrogen atom, an alkyl group, a cycloalkyl group, a halogen atom, a cyano group or an alkoxycarbonyl group.

$R_{06}$ represents a cyano group, a carboxyl group, —CO—$OR_{25}$ or —CO—$N(R_{26})(R_{27})$. $R_{25}$ represents an alkyl group, a cycloalkyl group, an alkenyl group, a cycloalkenyl group, an aryl group or an aralkyl group. Each of $R_{26}$ and $R_{27}$ independently represents a hydrogen atom, an alkyl group, a cycloalkyl group, an alkenyl group, a cycloalkenyl group, an aryl group or an aralkyl group. $R_{26}$ and $R_{27}$ may be bonded to each other to thereby form a ring in cooperation with the nitrogen atom.

Each of $X_1$, $X_2$ and $X_3$ independently represents a single bond, an arylene group, an alkylene group, a cycloalkylene group, —O—, —$SO_2$—, —CO—, —$N(R_{33})$— or a bivalent connecting group composed of a combination of two or more of these. $R_{33}$ represents a hydrogen atom, an alkyl group, a cycloalkyl group, an alkenyl group, a cycloalkenyl group, an aryl group or an aralkyl group.

The alkyl group represented by each of $R_{04}$, $R_{05}$ and $R_{07}$ to $R_{09}$ preferably has 20 or less carbon atoms, more preferably 8 or less carbon atoms. As the alkyl group, there can be mentioned, for example, a methyl group, an ethyl group, a propyl group, an isopropyl group, an n-butyl group, a sec-butyl group, a hexyl group, a 2-ethylhexyl group, an octyl group or a dodecyl group. A substituent may further be introduced in this alkyl group.

The cycloalkyl group represented by each of $R_{04}$, $R_{05}$ and $R_{07}$ to $R_{09}$ may be monocyclic or polycyclic. This cycloalkyl group preferably has 3 to 8 carbon atoms. As the cycloalkyl group, there can be mentioned, for example, a cyclopropyl group, a cyclopentyl group or a cyclohexyl group.

As the halogen atom represented by each of $R_{04}$, $R_{05}$ and $R_{07}$ to $R_{09}$, there can be mentioned a fluorine atom, a chlorine atom, a bromine atom or an iodine atom. Among these, a fluorine atom is most preferred.

The alkyl group contained in the alkoxycarbonyl group represented by each of $R_{04}$, $R_{05}$ and $R_{07}$ to $R_{09}$ is preferably, for example, any of those set forth above as the alkyl group represented by each of $R_{04}$, $R_{05}$ and $R_{07}$ to $R_{09}$.

The alkyl groups represented by $R_{25}$ to $R_{27}$ and $R_{33}$ are preferably, for example, those set forth above as being represented by $R_{04}$, $R_{05}$ and $R_{07}$ to $R_{09}$.

The cycloalkyl groups represented by $R_{25}$ to $R_{27}$ and $R_{33}$ are preferably, for example, those set forth above as being represented by $R_{04}$, $R_{05}$ and $R_{07}$ to $R_{09}$.

The alkenyl group represented by each of $R_{25}$ to $R_{27}$ and $R_{33}$ preferably has 2 to 6 carbon atoms. As this alkenyl group, there can be mentioned, for example, a vinyl group, a propenyl group, an allyl group, a butenyl group, a pentenyl group or a hexenyl group.

The cycloalkenyl group represented by each of $R_{25}$ to $R_{27}$ and $R_{33}$ preferably has 3 to 6 carbon atoms. As this cycloalkenyl group, there can be mentioned, for example, a cyclohexenyl group.

The aryl group represented by each of $R_{25}$ to $R_{27}$ and $R_{33}$ may be a monocyclic aromatic group or a polycyclic aromatic group. This aryl group preferably has 6 to 14 carbon atoms. A substituent may further be introduced in the aryl group. Aryl groups may be bonded to each other to thereby form a bi-ring. As the aryl group represented by each of $R_{25}$ to $R_{27}$ and $R_{33}$, there can be mentioned, for example, a phenyl group, a tolyl group, a chlorophenyl group, a methoxyphenyl group or a naphthyl group.

The aralkyl group represented by each of $R_{25}$ to $R_{27}$ and $R_{33}$ preferably has 7 to 15 carbon atoms. A substituent may further be introduced in this aralkyl group. As the aralkyl group represented by each of $R_{25}$ to $R_{27}$ and $R_{33}$, there can be mentioned, for example, a benzyl group, a phenethyl group or a cumyl group.

The ring formed by the mutual bonding of $R_{26}$ and $R_{27}$ in cooperation with the nitrogen atom is preferably a 5- to 8-membered ring. In particular, there can be mentioned, for example, pyrrolidine, piperidine or piperazine.

The arylene group represented by each of $X_1$ to $X_3$ preferably has 6 to 14 carbon atoms. As this arylene group, there can be mentioned, for example, a phenylene group, a tolylene group or a naphthylene group. A substituent may further be introduced in this arylene group.

The alkylene group represented by each of $X_1$ to $X_3$ preferably has 1 to 8 carbon atoms. As this alkylene group, there can be mentioned, for example, a methylene group, an ethylene group, a propylene group, a butylene group, a hexylene group or an octylene group. A substituent may further be introduced in this alkylene group.

The cycloalkylene group represented by each of $X_1$ to $X_3$ preferably has 5 to 8 carbon atoms. As this cycloalkylene group, there can be mentioned, for example, a cyclopentylene group or a cyclohexylene group. A substituent may further be introduced in this cycloalkylene group.

As preferred substituents that can be introduced in the individual groups of the repeating units of general formulae (B1) to (B3) above, there can be mentioned, for example, a hydroxyl group; a halogen atom (fluorine, chlorine, bromine or iodine); a nitro group; a cyano group; an amido group; a sulfonamido group; any of the alkyl groups mentioned above as being represented by $R_{04}$, $R_{05}$ and $R_{07}$ to $R_{09}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. Each of these substituents preferably has 8 or less carbon atoms.

A represents a structural moiety that when exposed to actinic rays or radiation, is decomposed to thereby generate an acid anion. For example, there can be mentioned any of the structural moieties introduced in a photoinitiator for photocationic polymerization, a photoinitiator for photoradical polymerization, a photo-achromatic agent and photo-discoloring agent for dyes and any of generally known compounds that when exposed to light, generate an acid, employed in microresists, etc.

A is preferably an ionic structural moiety with a sulfonium salt structure or an iodonium salt structure. In particular, A is preferably any of the groups of general formulae (ZI) and (ZII) below.

ZI

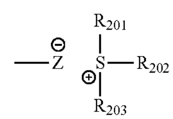

ZII

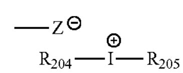

In general formula (ZI), each of $R_{201}$, $R_{202}$ and $R_{203}$ independently represents an organic group.

The number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

$Z^-$ represents the acid anion generated by the decomposition upon exposure to actinic rays or radiation. $Z^-$ preferably represents a normucleophilic anion. As the normucleophilic anion represented by $Z^-$, there can be mentioned, for example, a sulfonate anion, a carboxylate anion, a sulfonylimido anion, a bis(alkylsulfonyl)imido anion, a tris(alkylsulfonyl)methyl anion or the like.

The normucleophilic anion means an anion whose capability of inducing a nucleophilic reaction is extremely low and is an anion capable of inhibiting any temporal decomposition by intramolecular nucleophilic reaction. This would realize an enhancement of the temporal stability of the resin and the composition.

As the organic groups represented by $R_{201}$, $R_{202}$ and $R_{203}$, there can be mentioned, for example, corresponding groups of general formulae (ZI-1), (ZI-2) and (ZI-3).

As preferred groups of general formula (ZI), there can be mentioned the following groups of (ZI-1), (ZI-2), (ZI-3) and (ZI-4).

The (ZI-1) groups are groups of general formula (ZI) wherein at least one of $R_{201}$ to $R_{203}$ is an aryl group, namely, groups containing an arylsulfonium as a cation.

In the (ZI-1) group, all of the $R_{201}$ to $R_{203}$ may be aryl groups. It is also appropriate that the $R_{201}$ to $R_{203}$ are partially an aryl group and the remainder is an alkyl group or a cycloalkyl group.

As the (ZI-1) group, there can be mentioned, for example, a group corresponding to each of a triarylsulfonium, a diarylalkylsulfonium, an aryldialkylsulfonium, a diarylcycloalkylsulfonium and an aryldicycloalkylsulfonium.

The aryl group of the arylsulfonium is preferably a phenyl group or a naphthyl group, more preferably a phenyl group. The aryl group may be one having a heterocyclic structure containing an oxygen atom, a nitrogen atom, a sulfur atom or the like. As the heterocyclic structure, there can be mentioned, for example, a pyrrole, a furan, a thiophene, an indole, a benzofuran, a benzothiophene or the like. When the arylsulfonium has two or more aryl groups, the two or more aryl groups may be identical to or different from each other.

The alkyl group or cycloalkyl group contained in the arylsulfonium according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group.

Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in two or more of $R_{201}$ to $R_{203}$. When $R_{201}$ to $R_{203}$ represent a phenyl group, the substituent preferably lies at the p-position of the phenyl group.

Now, the (ZI-2) groups will be described.

The (ZI-2) groups are groups of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C═O at the 2-position of the alkyl group is preferred. The 2-oxocycloalkyl group is preferably a group having >C═O at the 2-position of the cycloalkyl group.

As preferred alkoxy groups of the alkoxycarbonylmethyl group, there can be mentioned alkoxy groups having 1 to 5 carbon atoms (for example, a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Now, the (ZI-3) groups will be described.

The (ZI-3) groups are those represented by the following general formula (ZI-3) which have a phenacylsulfonium salt structure.

ZI-3

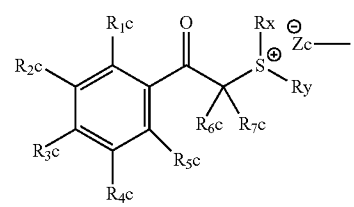

In general formula (ZI-3), each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded to each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a normucleophilic anion. There can be mentioned the same normucleophilic anions as mentioned with respect to the $Z^-$ of general formula (ZI).

With respect to particular structures of the cation moieties of general formula (ZI-3), reference can be made to the structures of the cation moieties of acid generators set forth by way of example in Paragraphs 0047 and 0048 of JP-A-2004-233661 and set forth by way of example in Paragraphs 0040 to 0046 of JP-A-2003-35948.

Next, the (ZI-4) groups will be described.

The (ZI-4) groups are the groups of general formula (ZI-4) below. These groups are effective in the suppression of outgassing.

ZI-4

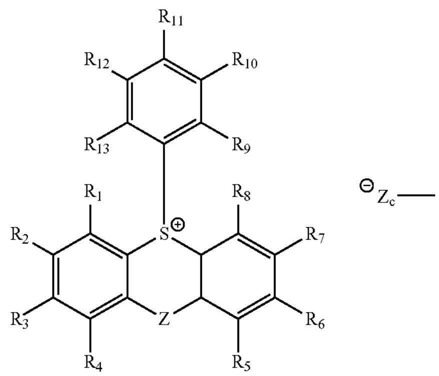

In general formula (ZI-4), each of $R_1$ to $R_{13}$ independently represents a hydrogen atom or a substituent. Preferably, at least one of $R_1$ to $R_{13}$ is a substituent containing an alcoholic hydroxyl group. In the present invention, the alcoholic hydroxyl group refers to a hydroxyl group bonded to a carbon atom of an alkyl group.

Z represents a single bond or a bivalent connecting group.

$Zc^-$ represents a normucleophilic anion. There can be mentioned the same normucleophilic anions as mentioned with respect to the $Z^-$ of general formula (ZI).

When $R_1$ to $R_{13}$ represent substituents containing an alcoholic hydroxyl group, it is preferred for the $R_1$ to $R_{13}$ to represent the groups of the formula —W—Y, wherein Y represents a hydroxyl-substituted alkyl group and W represents a single bond or a bivalent connecting group.

As preferred alkyl group represented by Y, there can be mentioned an ethyl group, a propyl group and an isopropyl group. Especially preferably, Y contains the structure of —$CH_2CH_2OH$.

The bivalent connecting group represented by W is not particularly limited. W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R_1$ to $R_{13}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R_1$ to $R_{13}$ may have two or more alcoholic hydroxyl groups. The number of alcoholic hydroxyl groups contained in each of the substituents containing an alcoholic hydroxyl group represented by $R^1$ to $R^{13}$ is in the range of 1 to 6, preferably 1 to 3 and more preferably 1.

The number of alcoholic hydroxyl groups contained in any of the (ZI-4) groups as the total of those of $R^1$ to $R^{13}$ is in the range of 1 to 10, preferably 1 to 6 and more preferably 1 to 3.

When $R_1$ to $R_{13}$ do not contain any alcoholic hydroxyl group, each of $R_1$ to $R_{13}$ represents, for example, a hydrogen atom, a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a phosphono group, a silyl group, a hydrazino group, a ureido group, a boronic acid group (—$B(OH)_2$), a phosphato group (—$OPO(OH)_2$), a sulfato group (—$OSO_3H$) or any of other substituents known in the art.

When $R_1$ to $R_{13}$ do not contain any alcoholic hydroxyl group, each of $R_1$ to $R_{13}$ preferably represents a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R_1$ to $R_{13}$ do not contain any alcoholic hydroxyl group, each of $R_1$ to $R_{13}$ more preferably represents a hydrogen atom, an alkyl group, a cycloalkyl group, a halogen atom or an alkoxy group.

Two members adjacent to each other among $R_1$ to $R_{13}$ may be bonded to each other to thereby form a ring structure. The ring structures include aromatic and nonaromatic hydrocarbon rings and heterocyclic rings. These ring structures may be combined with each other to thereby form a condensed ring.

In the (ZI-4) groups, preferably, at least one of $R_1$ to $R_{13}$ has a structure containing an alcoholic hydroxyl group. More preferably, at least one of $R_9$ to $R_{13}$ has a structure containing an alcoholic hydroxyl group.

Z represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether bond, a thioether bond, an amino group, a disulfide group, an acyl group, an alkylsulfonyl group, —CH═CH—, an aminocarbonylamino group, an aminosulfonylamino group or the like.

The bivalent connecting group may have a substituent. The same substituents as mentioned above with respect to $R_1$ to $R_{13}$ can be employed.

Preferably, Z is a single bond, an ether bond or a thioether bond. Most preferably, Z is a single bond.

Now, general formula (ZII) will be described.

In general formula (ZII), each of $R_{204}$ and $R_{205}$ independently represents an aryl group, an alkyl group or a cycloalkyl group.

Particular examples and preferred forms of the aryl group, alkyl group and cycloalkyl group represented by $R_{204}$ and $R_{205}$ are the same as set forth above in connection with $R_{201}$ to $R_{203}$ of the above compounds (ZI-1).

Substituents may further be introduced in the aryl group, alkyl group and cycloalkyl group represented by $R_{204}$ and $R_{205}$. The substituents are also the same as set forth above in connection with $R_{201}$ to $R_{203}$ of the above compounds (ZI-1).

$Z^-$ represents the anion structure generated by the decomposition upon exposure to actinic rays or radiation, preferably a normucleophilic anion. As such, there can be mentioned, for example, any of those set forth above in connection with $Z^-$ of general formula (ZI).

As preferred other examples of the groups A, there can be mentioned the groups of general formulae (ZCI) and (ZCII) below.

ZCI

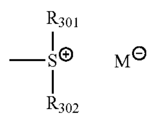

ZCII

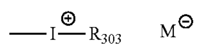

In general formulae (ZCI) and (ZCII) above, each of $R_{301}$ and $R_{302}$ independently represents an organic group. This organic group generally has 1 to 30 carbon atoms, preferably 1 to 20 carbon atoms. $R_{301}$ and $R_{302}$ may be bonded to each other to thereby form a ring structure. With respect to the ring structure, at least one selected from among an oxygen atom, a sulfur atom, an ester bond, an amido bond and a carbonyl group may be contained in the ring. As the group formed by the mutual bonding of $R_{301}$ and $R_{302}$, there can be mentioned an alkylene group, such as a butylene group or a pentylene group.

As the organic groups represented by $R_{301}$ and $R_{302}$, there can be mentioned, for example, the aryl groups, alkyl groups and cycloalkyl groups set forth above as examples of $R_{201}$ to $R_{203}$ of general formula (ZI).

M represents an atomic group capable of forming an acid with the addition of a proton. In particular, there can be mentioned the structure expressed by any of general formulae AN1 to AN3 to be described hereinafter. Among the structures, the structure of general formula AN1 is most preferred.

$R_{303}$ represents an organic group. The organic group represented by $R_{303}$ has generally 1 to 30 carbon atoms, preferably 1 to 20 carbon atoms. As particular examples of the organic groups represented by $R_{303}$, there can be mentioned the aryl groups, alkyl groups, cycloalkyl groups, etc. set forth above as particular examples of $R_{204}$ and $R_{205}$ of general formula (ZII).

Further, as the structural moiety that when exposed to actinic rays or radiation, generates an acid, there can be mentioned, for example, the structural moiety destined for a sulfonic acid precursor that is introduced in each of the following photoacid generators. The photoacid generators include, for example, the following compounds (1) to (3).

(1) Compounds photolyzed to thereby generate a sulfonic acid whose representative is an iminosulfonate or the like, as described in M. Tunooka et al., Polymer Preprints Japan, 35(8); G. Berner et al., J. Rad. Curing, 13(4); W. J. Mijs et al., Coating Technol., 55(697), 45 (1983); H. Adachi et al., Polymer Preprints Japan, 37(3); European Patent Nos. 0199,672, 84515, 199,672, 044,115 and 0101,122; U.S. Pat. Nos. 618, 564, 4,371,605 and 4,431,774; JP-A's S64-18143, H2-245756 and H4-365048; etc.

(2) Disulfone compounds as described in JP-A-S61-166544, etc.

(3) Compounds capable of generating an acid upon exposure to light, as described in V. N. R. Pillai, Synthesis, (1), 1 (1980); A. Abad et al., Tetrahedron Lett., (47) 4555 (1971); D. H. R. Barton et al., J. Chem. Soc., (C), 329 (1970); U.S. Pat. No. 3,779,778; European Patent No. 126,712; etc.

It is preferred for the repeating unit (B) to contain a structural moiety that when exposed to actinic rays or radiation, is converted to an acid anion. For example, it is preferred for A of general formulae (B1) to (B3) above to represent a structural moiety that when exposed to actinic rays or radiation, is converted to an acid anion.

Namely, it is more preferred for the repeating unit (B) to have a structure that when exposed to actinic rays or radiation, generates an acid anion in a side chain of the resin. When this structure is employed, the diffusion of generated acid anion can be inhibited to thereby enhance the resolution, roughness characteristic, etc.

It is preferred for each of the moiety —$X_1$-A of general formula (B1), moiety —$X_2$-A of general formula (B2) and moiety —$X_3$-A of general formula (B3) to be expressed by any of general formulae ($L_1$), ($L_2$) and ($L_3$) below.

$$—X_{11}\text{-}L_{11}\text{-}X_{12}—Ar_1\text{-}X_{13}\text{-}L_{12}\text{-}Z_1 \quad (L1)$$

$$—Ar_2\text{-}X_{21}\text{-}L_{21}\text{-}X_{22}\text{-}L_{22}\text{-}Z_2 \quad (L2)$$

$$—X_{31}\text{-}L_{31}\text{-}X_{32}\text{-}L_{32}\text{-}Z_3 \quad (L3).$$

First, the moieties of general formula (L1) will be described.

$X_{11}$ represents —O—, —S—, —CO—, —$SO_2$—, —NR— (R represents a hydrogen atom or an alkyl group), a bivalent nitrogen-atom-containing nonaromatic heterocyclic group or a group composed of a combination of these.

Each of $X_{12}$ and $X_{13}$ independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

With respect to —NR—, the alkyl group represented by R may be in the form of a linear or branched chain. A substituent may further be introduced in the alkyl group represented by R. Preferably, the alkyl group has 20 or less carbon atoms, more preferably 8 or less carbon atoms and still more preferably 3 or less carbon atoms. As such, there can be mentioned, for example, a methyl group, an ethyl group, a propyl group, an isopropyl group or the like. R is most preferably a hydrogen atom, a methyl group or an ethyl group.

The bivalent nitrogen-atom-containing nonaromatic heterocyclic group refers to a preferably 3- to 8-membered nonaromatic heterocyclic group having at least one nitrogen atom.

$X_{11}$ is preferably —O—, —CO—, —$SO_2$—, —NR— (R represents a hydrogen atom or an alkyl group) or a group composed of a combination of these. $X_{11}$ is most preferably —COO— or —CONR— (R represents a hydrogen atom or an alkyl group).

$L_{11}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

The alkylene group represented by $L_{11}$ may be in the form of a linear or branched chain. This alkylene group preferably has 1 to 8 carbon atoms, more preferably 1 to 6 carbon atoms and further more preferably 1 to 4 carbon atoms.

As the alkenylene group represented by $L_{11}$, there can be mentioned, for example, a group resulting from the introduction of a double bond in any position of the above-mentioned alkylene group.

The bivalent aliphatic hydrocarbon ring group represented by $L_{11}$ may be monocyclic or polycyclic. This bivalent aliphatic hydrocarbon ring group preferably has 5 to 12 carbon atoms, more preferably 6 to 10 carbon atoms.

The bivalent aromatic ring group as a connecting group may be an arylene group or a heteroarylene group. This aromatic ring group preferably has 6 to 14 carbon atoms. A substituent may further be introduced in this aromatic ring group.

The —NR— and bivalent nitrogen-atom-containing nonaromatic heterocyclic group as connecting groups are the same as mentioned above in connection with $X_{11}$.

Most preferably, $L_{11}$ is an alkylene group, a bivalent aliphatic hydrocarbon ring group or a group composed of an alkylene group combined with a bivalent aliphatic hydrocarbon ring group through —OCO—, —O— or —CONH— (for example, -alkylene-O-alkylene-, -alkylene-OCO-alkylene-, -bivalent aliphatic hydrocarbon ring group-O-alkylene- or -alkylene-CONH-alkylene-).

Particular examples of the —NR— and bivalent nitrogen-atom-containing nonaromatic heterocyclic group represented by $X_{12}$ and $X_{13}$ are the same as mentioned above in connection with $X_{11}$. Preferred examples are also the same.

Preferably, $X_{12}$ is a single bond, —S—, —O—, —CO—, —$SO_2$— or a group composed of a combination of these. A single bond, —S—, —OCO— and —$OSO_2$— are especially preferred.

Preferably, $X_{13}$ is —O—, —CO—, —$SO_2$— or a group composed of a combination of these. —$OSO_2$— is most preferred.

$Ar_1$ represents a bivalent aromatic ring group. The bivalent aromatic ring group may be an arylene group or a heteroarylene group. A substituent may further be introduced in this bivalent aromatic ring group. As the substituent, there can be mentioned, for example, an alkyl group, an alkoxy group or an aryl group.

Preferably, $Ar_1$ is an optionally substituted arylene group having 6 to 18 carbon atoms or an aralkylene group resulting from combination of an arylene group having 6 to 18 carbon atoms with an alkylene having 1 to 4 carbon atoms. A phenylene group, a naphthylene group, a biphenylene group and a phenylene group substituted with a phenyl group are especially preferred.

$L_{12}$ represents an alkylene group, an alkenylene group, a bivalent aliphatic hydrocarbon ring group, a bivalent aromatic ring group or a group composed of a combination of two or more of these, provided that the hydrogen atoms of each of these groups are partially or entirely replaced with a substituent selected from among a fluorine atom, a fluoroalkyl group, a nitro group and a cyano group. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

Preferably, $L_{12}$ is an alkylene group, bivalent aromatic ring group or group composed of a combination of these whose hydrogen atoms are partially or entirely replaced with a fluorine atom or a fluoroalkyl group (more preferably a perfluoroalkyl group). An alkylene group and bivalent aromatic ring group whose hydrogen atoms are partially or entirely replaced with a fluorine atom are especially preferred. $L_{12}$ is most preferably an alkylene group or bivalent aromatic ring group, 30 to 100% of the hydrogen atoms of which are replaced with a fluorine atom.

The alkylene group represented by $L_{12}$ may be in the form of a linear or branched chain. This alkylene group preferably has 1 to 6 carbon atoms, more preferably 1 to 4 carbon atoms.

As the alkenylene group represented by $L_{12}$, there can be mentioned, for example, a group resulting from the introduction of a double bond in any position of the above-mentioned alkylene group.

The bivalent aliphatic hydrocarbon ring group represented by $L_{12}$ may be monocyclic or polycyclic. This bivalent aliphatic hydrocarbon ring group preferably has 3 to 17 carbon atoms.

The bivalent aromatic ring group represented by $L_{12}$ is, for example, the same as mentioned above as a connecting group represented by $L_{11}$.

Particular examples of the —NR— and bivalent nitrogen-atom-containing nonaromatic heterocyclic group as connecting groups represented by $L_{12}$ are the same as mentioned above in connection with $X_{11}$. Preferred examples are also the same.

$Z_1$ represents a moiety that when exposed to actinic rays or radiation, is converted to a sulfonic acid group. In particular, there can be mentioned, for example, the structure of formula (ZI) above.

Next, the moieties of general formula (L2) will be described.

$Ar_2$ represents a bivalent aromatic ring group. The bivalent aromatic ring group may be an arylene group or a heteroarylene group. This bivalent aromatic ring group preferably has 6 to 18 carbon atoms. A substituent may further be introduced in this bivalent aromatic ring group.

$X_{21}$ represents —O—, —S—, —CO—, —$SO_2$—, —NR— (R represents a hydrogen atom or an alkyl group), a bivalent nitrogen-atom-containing nonaromatic heterocyclic group or a group composed of a combination of these.

The —NR— and bivalent nitrogen-atom-containing nonaromatic heterocyclic group represented by $X_{21}$ are, for example, the same as mentioned above in connection with $X_{11}$.

Preferably, $X_{21}$ is —O—, —S—, —CO—, —$SO_2$— or a group composed of a combination of these. —O—, —OCO— and —$OSO_2$— are especially preferred.

$X_{22}$ represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these. The —NR— and bivalent nitrogen-atom-containing nonaromatic heterocyclic group represented by $X_{22}$ are, for example, the same as mentioned above in connection with $X_{11}$.

Preferably, $X_{22}$ is —O—, —S—, —CO—, —$SO_2$— or a group composed of a combination of these. —O—, —OCO— and —$OSO_2$— are especially preferred.

$L_{21}$ represents a single bond, an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

The alkylene group, alkenylene group and bivalent aliphatic hydrocarbon ring group represented by $L_{21}$ are, for example, the same as mentioned above in connection with $L_{11}$.

The bivalent aromatic ring group represented by $L_{21}$ may be an arylene group or a heteroarylene group. This bivalent aromatic ring group preferably has 6 to 14 carbon atoms.

The —NR— and bivalent nitrogen-atom-containing nonaromatic heterocyclic group represented by $L_{21}$ are, for example, the same as mentioned above in connection with $X_{11}$.

Most preferably, $L_{21}$ is a single bond, an alkylene group, a bivalent aliphatic hydrocarbon ring group, a bivalent aromatic ring group, a group composed of a combination of two or more of these (for example, -alkylene-bivalent aromatic ring group- or -bivalent aliphatic hydrocarbon ring group-alkylene-), or a group composed of two or more of these combined through —OCO—, —COO—, —O—, —S— or the like as a connecting group (for example, -alkylene-OCO-bivalent aromatic ring group-, -alkylene-S-bivalent aromatic ring group- or -alkylene-O-alkylene-bivalent aromatic ring group-).

$L_{22}$ represents an alkylene group, an alkenylene group, a bivalent aliphatic hydrocarbon ring group, a bivalent aromatic ring group or a group composed of a combination of two or more of these, provided that the hydrogen atoms of each of these groups may be partially or entirely replaced with a substituent selected from among a fluorine atom, a fluoroalkyl group, a nitro group and a cyano group. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

Preferably, $L_{22}$ is an alkylene group, bivalent aromatic ring group or group composed of a combination of these whose hydrogen atoms are partially or entirely replaced with a fluorine atom or a fluoroalkyl group (more preferably a perfluoroalkyl group). An alkylene group and bivalent aromatic ring group whose hydrogen atoms are partially or entirely replaced with a fluorine atom are especially preferred.

Particular examples of the alkylene group, alkenylene group, bivalent aliphatic hydrocarbon ring group, bivalent aromatic ring group or group composed of a combination of two or more of these, represented by $L_{22}$ are the same as set forth above in connection with $L_{12}$ of general formula (L1).

Particular examples of the —NR— and bivalent nitrogen-atom-containing nonaromatic heterocyclic group as connecting groups represented by $L_{22}$ are the same as mentioned above in connection with $X_{11}$. Preferred examples are also the same.

$Z_2$ represents a moiety that when exposed to actinic rays or radiation, is converted to a sulfonic acid group. Particular examples of the moieties represented by $Z_2$ are the same as set forth above in connection with $Z_1$.

Now, the moieties of general formula (L3) will be described.

Each of $X_{31}$ and $X_{32}$ independently represents a single bond, —O—, —S—, —CO—, —$SO_2$—, —NR— (R represents a hydrogen atom or an alkyl group), a bivalent nitrogen-atom-containing nonaromatic heterocyclic group or a group composed of a combination of these.

The —NR— and bivalent nitrogen-atom-containing nonaromatic heterocyclic group represented by each of $X_{31}$ and $X_{32}$ are, for example, the same as mentioned above in connection with $X_{11}$.

$X_{31}$ is preferably a single bond, —O—, —CO—, —NR—(R represents a hydrogen atom or an alkyl group) or a group composed of a combination of these. $X_{31}$ is most preferably a single bond, —COO— or —CONR— (R represents a hydrogen atom or an alkyl group).

$X_{32}$ is preferably —O—, —S—, —CO—, —$SO_2$—, a bivalent nitrogen-atom-containing nonaromatic heterocyclic group or a group composed of a combination of these. $X_{32}$ is most preferably —O—, —OCO— or —$OSO_2$—.

$L_{31}$ represents a single bond, an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

The alkylene group, alkenylene group, bivalent aliphatic hydrocarbon ring group and bivalent aromatic ring group represented by $L_{31}$ are, for example, the same as set forth above in connection with $L_{21}$.

Particular examples of the —NR— and bivalent nitrogen-atom-containing nonaromatic heterocyclic group as connecting groups represented by $L_{31}$ are the same as mentioned above in connection with $X_{11}$. Preferred examples are also the same.

$L_{32}$ represents an alkylene group, an alkenylene group, a bivalent aliphatic hydrocarbon ring group, a bivalent aromatic ring group or a group composed of a combination of two or more of these. In the group composed of a combination, two or more groups combined together may be identical to or different from each other. Further, these groups may be linked to each other through —O—, —S—, —CO—, —$SO_2$—, —NR— (R represents a hydrogen atom or an alkyl group), a bivalent nitrogen-atom-containing nonaromatic heterocyclic group, a bivalent aromatic ring group or a group composed of a combination of these.

With respect to each of the alkylene group, alkenylene group, bivalent aliphatic hydrocarbon ring group, bivalent aromatic ring group or group composed of a combination of two or more of these, represented by $L_{32}$, it is preferred for the hydrogen atoms thereof to be partially or entirely replaced with a substituent selected from among a fluorine atom, a fluoroalkyl group, a nitro group and a cyano group.

Preferably, $L_{32}$ is an alkylene group, bivalent aromatic ring group or group composed of a combination of these whose hydrogen atoms are partially or entirely replaced with a fluorine atom or a fluoroalkyl group (more preferably a perfluoroalkyl group). An alkylene group and bivalent aromatic ring group whose hydrogen atoms are partially or entirely replaced with a fluorine atom are especially preferred.

The alkylene group, alkenylene group, bivalent aliphatic hydrocarbon ring group, bivalent aromatic ring group and group composed of a combination of two or more of these represented by $L_{32}$ are, for example, the same as set forth above in connection with $L_{12}$. Particular examples of the —NR— and bivalent nitrogen-atom-containing nonaromatic heterocyclic group as connecting groups represented by $L_{32}$ are the same as mentioned above in connection with $X_{11}$. Preferred examples are also the same.

When $X_{31}$ is a single bond while $L_{31}$ is an aromatic ring group and when $R_{32}$ forms a ring in cooperation with the aromatic ring group represented by $L_{31}$, the alkylene group represented by $R_{32}$ preferably has 1 to 8 carbon atoms, more preferably 1 to 4 carbon atoms and further more preferably 1 or 2 carbon atoms.

$Z_3$ represents an onium salt that when exposed to actinic rays or radiation, is converted to an imidic acid group or a methide acid group. It is preferred for the onium salt represented by $Z_3$ to be a sulfonium salt or an iodonium salt. The onium salt preferably has the structure of general formula (ZIII) or (ZIV) below.

(ZIII)

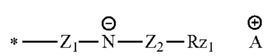

(ZIV)

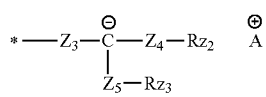

In general formulae (ZIII) and (ZIV), each of $Z_1$, $Z_2$, $Z_3$, $Z_4$ and $Z_5$ independently represents —CO— or —$SO_2$—, preferably —$SO_2$—.

Each of $Rz_1$, $Rz_2$ and $Rz_3$ independently represents an alkyl group, a monovalent aliphatic hydrocarbon ring group, an aryl group or an aralkyl group. Forms of these groups having the hydrogen atoms thereof partially or entirely replaced with a fluorine atom or a fluoroalkyl group (more preferably a perfluoroalkyl group) are preferred.

The alkyl group represented by each of $Rz_1$, $Rz_2$ and $Rz_3$ may be in the form of a linear or branched chain. This alkyl group preferably has 1 to 8 carbon atoms, more preferably 1 to 6 carbon atoms and further more preferably 1 to 4 carbon atoms.

The monovalent aliphatic hydrocarbon ring group represented by each of $Rz_1$, $Rz_2$ and $Rz_3$ preferably has 3 to 10 carbon atoms, more preferably 3 to 6 carbon atoms.

The aryl group represented by each of $Rz_1$, $Rz_2$ and $Rz_3$ preferably has 6 to 18 carbon atoms, more preferably 6 to 10 carbon atoms. This aryl group is most preferably a phenyl group.

As a preferred form of the aralkyl group represented by each of $Rz_1$, $Rz_2$ and $Rz_3$, there can be mentioned one resulting from the bonding of the above aryl group to an alkylene group having 1 to 8 carbon atoms. An aralkyl group resulting from the bonding of the above aryl group to an alkylene group having 1 to 6 carbon atoms is more preferred. An aralkyl group resulting from the bonding of the above aryl group to an alkylene group having 1 to 4 carbon atoms is most preferred.

$A^+$ represents a sulfonium cation or an iodonium cation. As preferred examples of $A^+$, there can be mentioned sulfonium cation structures of general formula (ZI) and iodonium cation structures of general formula (ZII).

Specific examples of the repeating units (B) are shown below, which however in no way limit the scope of the present invention.

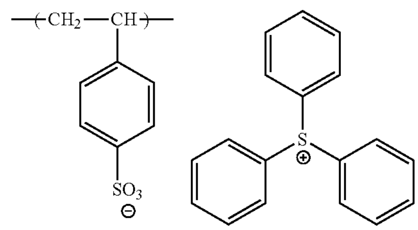

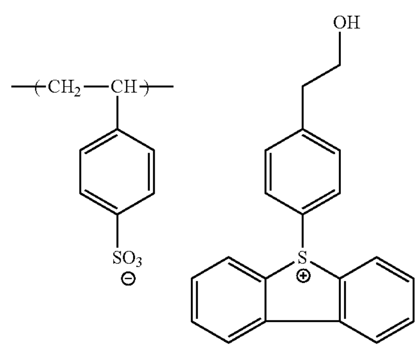

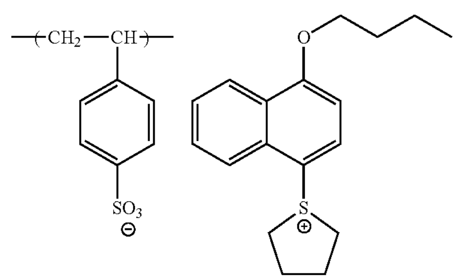

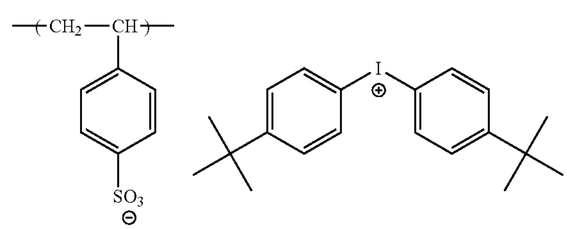

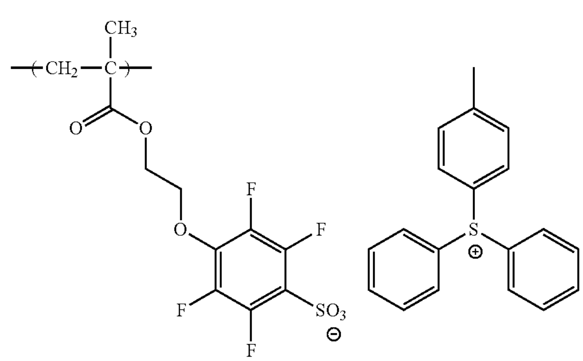

-continued
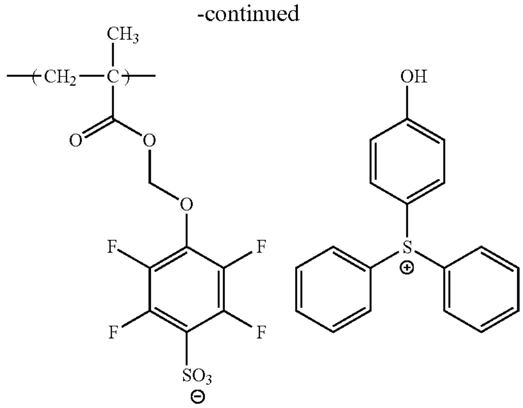
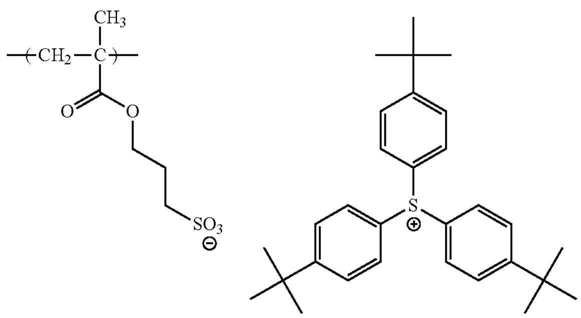
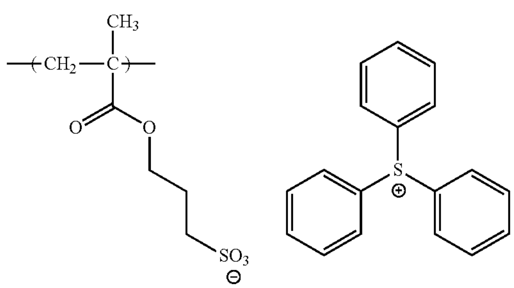
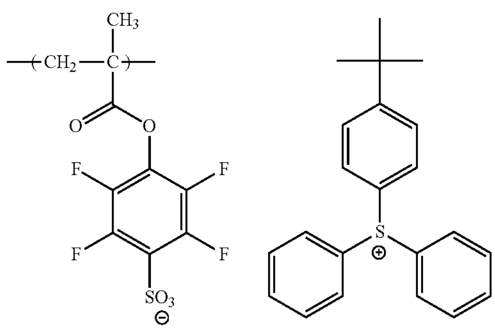
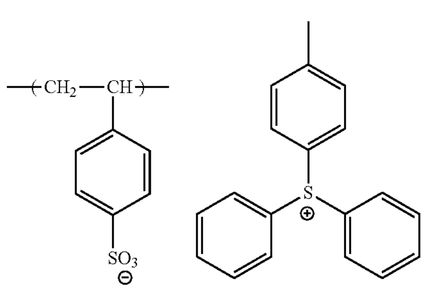
-continued
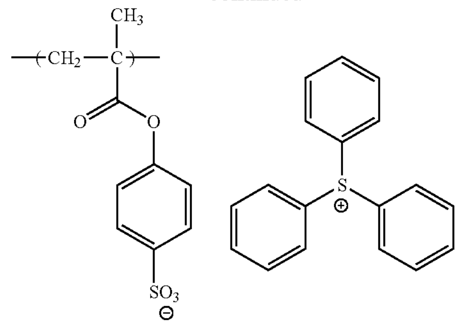
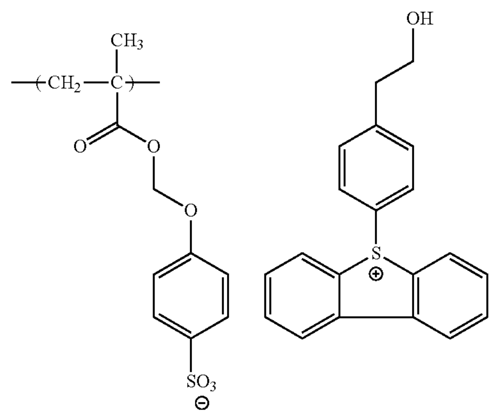
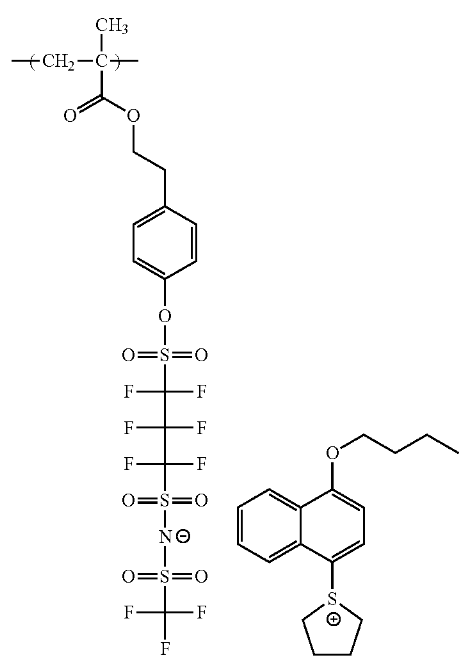

-continued
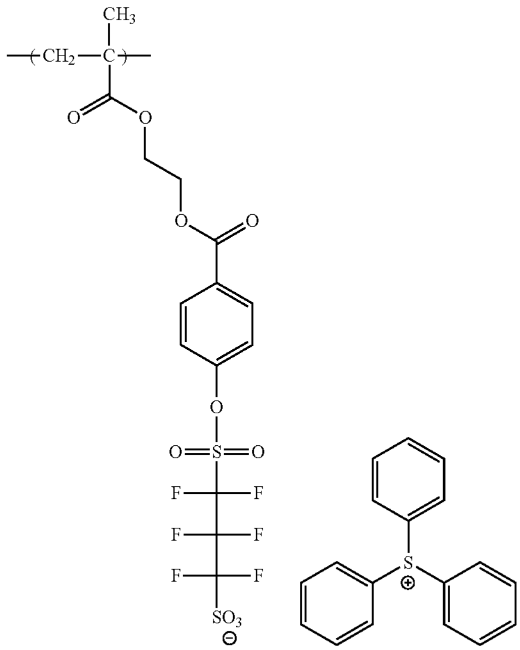
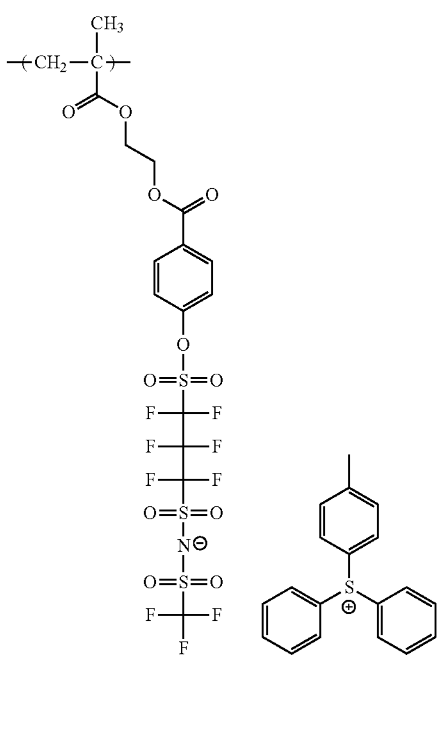
-continued
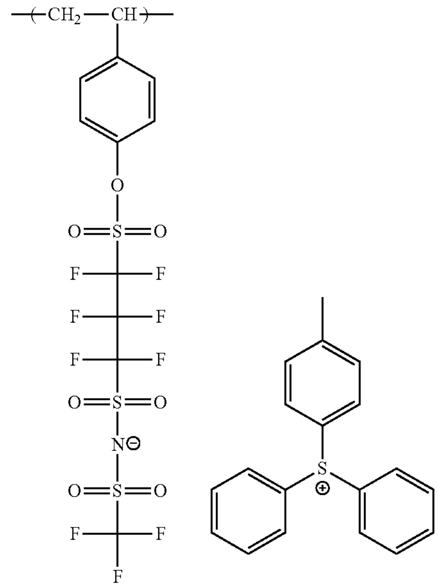
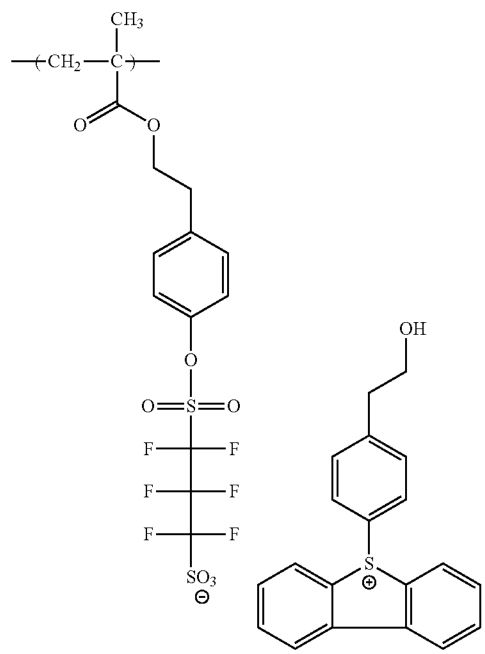
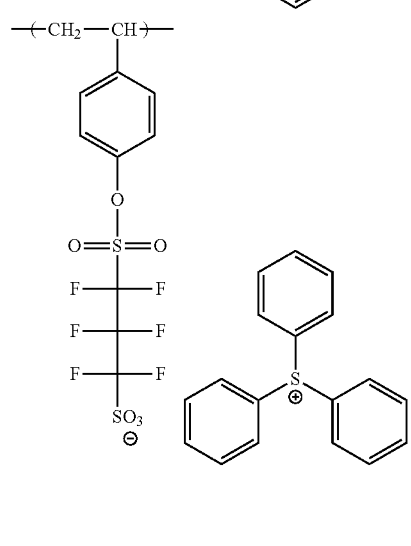

-continued
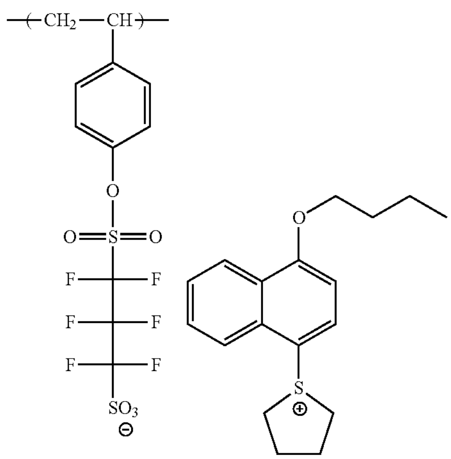
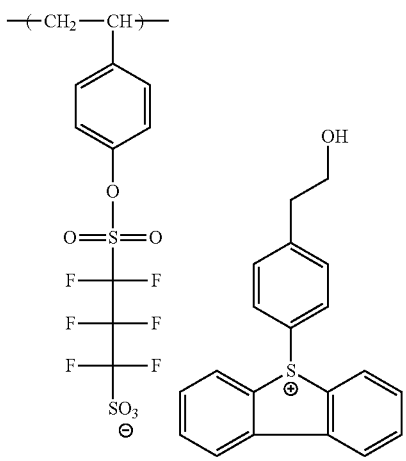
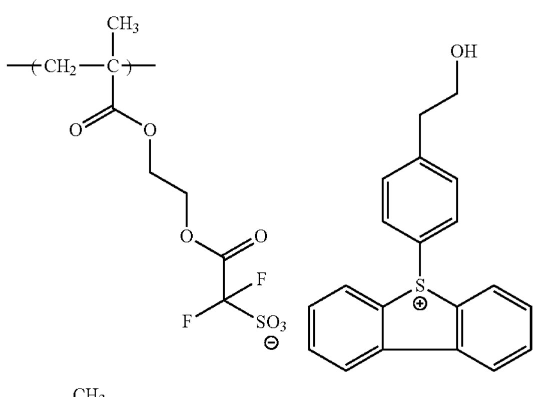
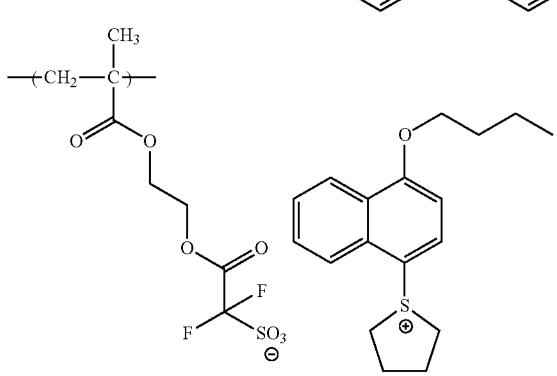
-continued
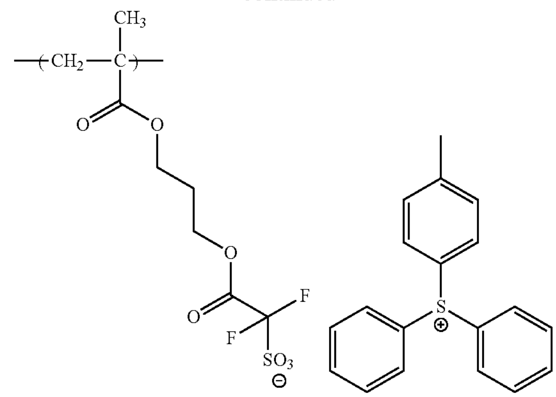
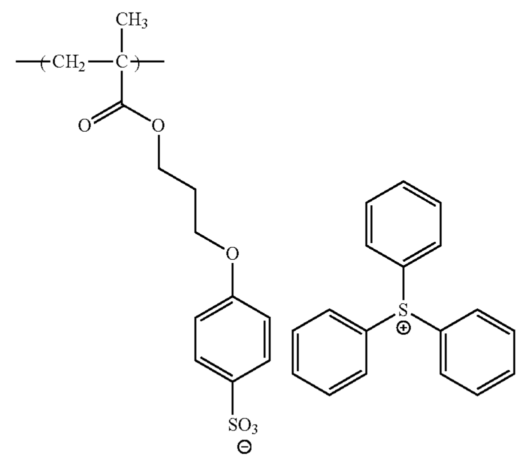
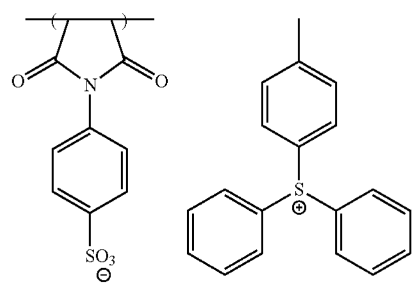
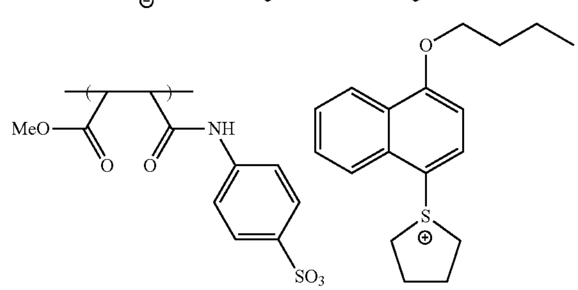
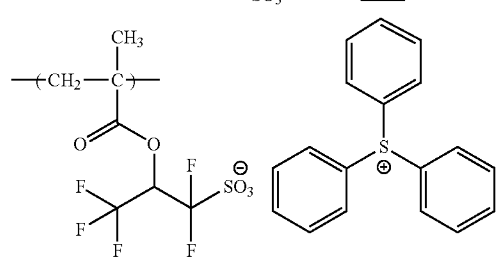

-continued
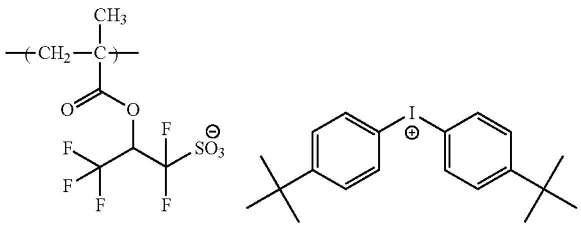
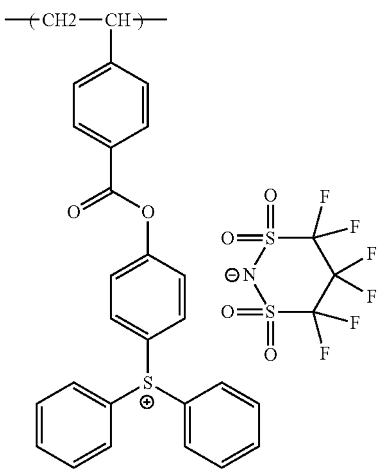
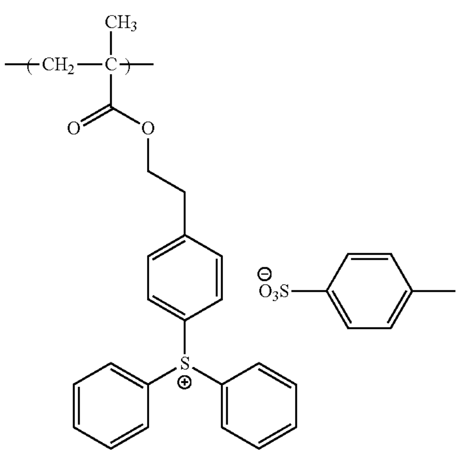
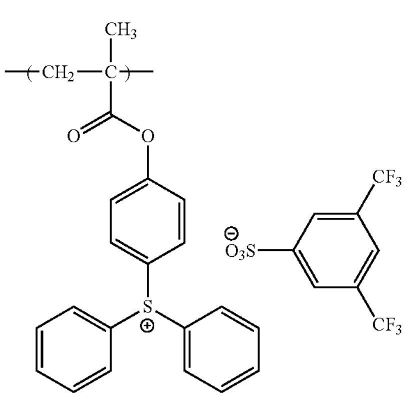
-continued
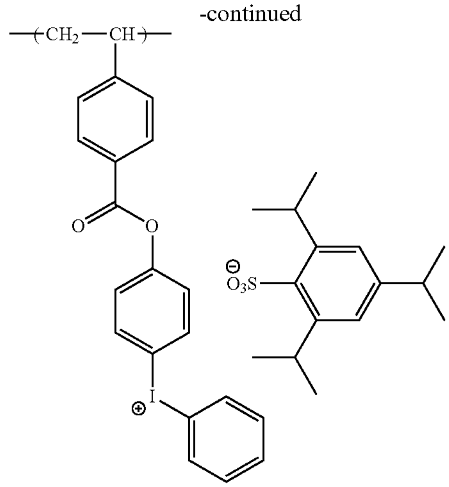
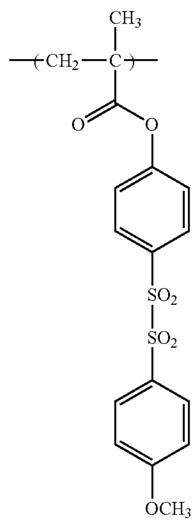
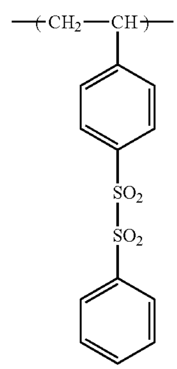
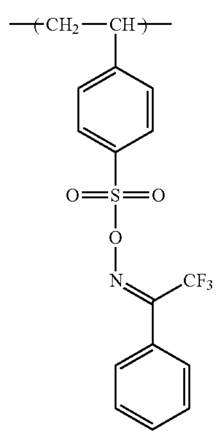
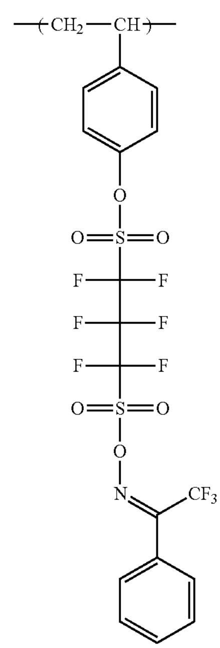

-continued
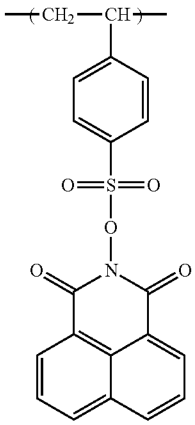
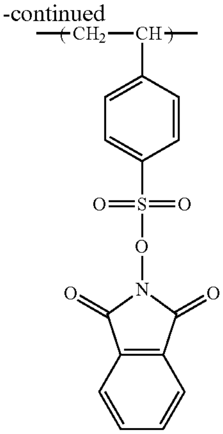
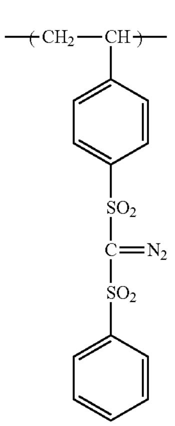
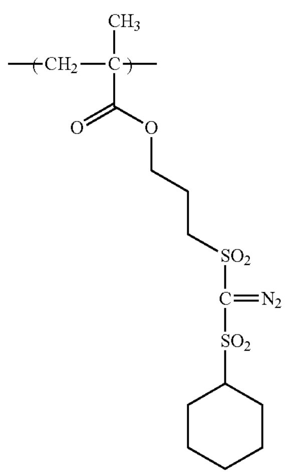
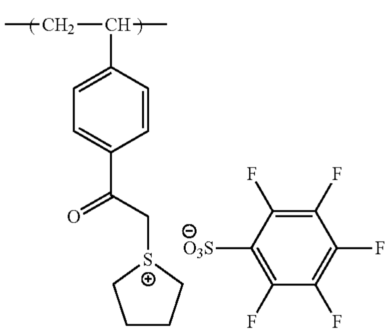
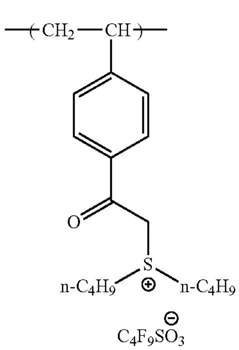
-continued
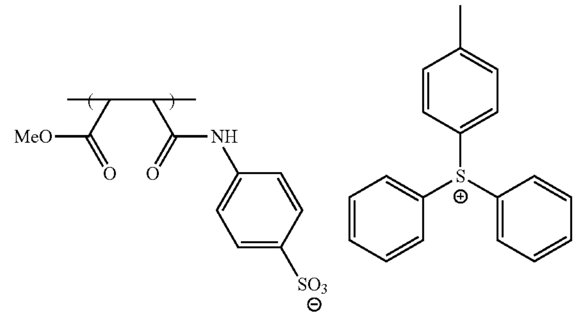
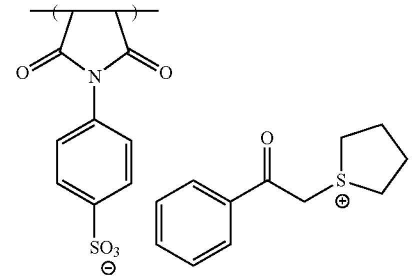
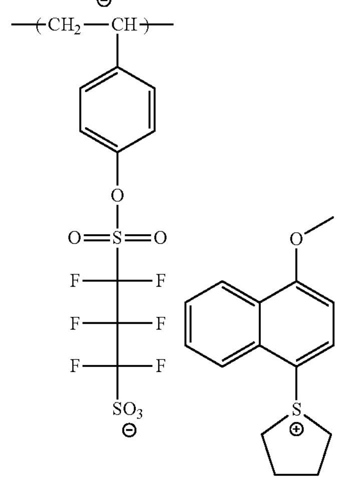
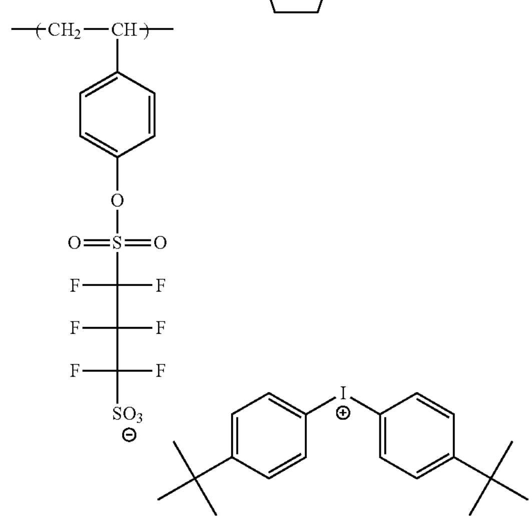
When the repeating unit (B) is contained in the resin (Ab), the content of repeating unit (B) in the resin (Ab), based on all the repeating units of the resin (Ab), is preferably in the range of 0.1 to 80 mol %, more preferably 0.5 to 60 mol % and further more preferably 1 to 40 mol %.

The weight average molecular weights (Mw) of resins (Ab) are preferably each in the range of 1000 to 200,000. Up to 200,000 is preferred from the viewpoint of the rate of dissolution of the resin per se in alkali and the sensitivity. The polydispersity index (Mw/Mn) of the resin is preferably in the range of 1.0 to 3.0, more preferably 1.0 to 2.5 and most preferably 1.0 to 2.0.

With respect to the weight average molecular weight (Mw) of the resin, it is preferably in the range of 1000 to 200,000, more preferably 1000 to 100,000, further more preferably 1000 to 50,000 and most preferably 1000 to 25,000.

The weight average molecular weight refers to a polystyrene-equivalent value determined by gel permeation chromatography.

The resin (Ab) of 2.0 or below polydispersity index can be synthesized by radical polymerization using an azo polymerization initiator. The resin (Ab) exhibiting a further preferred polydispersity index of 1.0 to 1.5 can be synthesized by, for example, a living radical polymerization.

The resin (Ab) is preferably polymerized by, for example, a generally known anion polymerization method or radical polymerization method.

In the anion polymerization method, using an alkali metal or organoalkali metal as an initiator, polymerization is generally performed in an organic solvent at −100 to 90° C. in an atmosphere of inert gas, such as nitrogen or argon. In the event of copolymerization, a block copolymer is obtained by performing polymerization while sequentially adding monomers to a reaction system, and a random copolymer is obtained by adding a mixture of monomers to a reaction system and carrying out polymerization.

The alkali metal as the polymerization initiator is, for example, lithium, sodium, potassium or cesium. As the organoalkali metal, use can be made of an alkylation, allylation or arylation product of alkali metal mentioned above. For example, there can be mentioned ethyllithium, n-butyllithium, sec-butyllithium, tert-butyllithium, ethylsodium, lithium biphenyl, lithium naphthalene, lithium triphenyl, sodium naphthalene, α-methylstyrene sodium dianion, 1,1-diphenylhexyllithium, 1,1-diphenyl-3-methylpentyllithium or the like.

In the radical polymerization method, in an atmosphere of inert gas, such as nitrogen or argon, polymerization is performed in an organic solvent at 50 to 200° C., using any of common radical polymerization initiators comprised of, for example, an azo compound, such as azobisisobutyronitrile or azobisisovaleronitrile, or an organic peroxide, such as benzoyl peroxide, methyl ethyl ketone peroxide or cumene hydroperoxide, according to necessity in combination with any of common chain transfer agents, such as 1-dodecanethiol.

As the organic solvent, there can be mentioned any of those commonly used in the anion polymerization, including an aliphatic hydrocarbon, such as n-hexane or n-heptane; an alicyclic hydrocarbon, such as cyclohexane or cyclopentane; an aromatic hydrocarbon, such as benzene or toluene; a ketone, such as methyl ethyl ketone or cyclohexanone; a polyhydric alcohol derivative, such as propylene glycol monomethyl ether acetate, propylene glycol monomethyl ether, ethylene glycol monobutyl ether acetate, ethylene glycol monobutyl ether, ethylene glycol monoethyl ether acetate, ethylene glycol monoethyl ether, propylene glycol monoethyl ether acetate or propylene glycol monoethyl ether; an ether, such as diethyl ether, tetrahydrofuran or dioxane; anisole, hexamethylphosphoramide and the like. These are used as a single solvent or a mixed solvent comprised of two or more of these. Preferred solvents are propylene glycol monomethyl ether acetate, propylene glycol monomethyl ether and cyclohexanone.

When the positive resist of the present invention is exposed to light by means of an ArF excimer laser, it is preferred to use a resin containing no aromatic ring as the resin (Ab) from the viewpoint of the transparency to ArF excimer laser light.

The resin (hereinafter also referred to as resin (A')) suitable for exposure to ArF excimer laser light will be described below.

The acid-decomposable group contained in the resin (A') can be the same as in the above resin (Ab). As a preferred repeating unit containing the acid-decomposable group, there can be mentioned any of the repeating units of general formula (A2) above.

The content of repeating unit containing the acid-decomposable group, based on all the repeating units of the resin (A'), is preferably in the range of 20 to 50 mol %, more preferably 25 to 45 mol %.

It is preferred for the resin (A') to further have a repeating unit having at least one group selected from among a lactone group, a hydroxyl group, a cyano group and an alkali soluble group.

The repeating unit having a lactone group that may be contained in the resin (A') will now be described.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-16) is more preferred. The lactone structures may be directly bonded to the principal chain of the resin.

Preferred lactone structures are those of the formulae (LC1-1), (LC1-4), (LC1-5), (LC1-6), (LC1-13) and (LC1-14). The use of these specified lactone structures would ensure improvement in the line edge roughness and development defect.

LC1-1

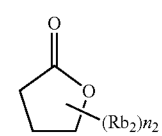

LC1-2

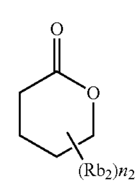

LC1-3

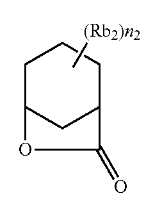

-continued

LC1-4

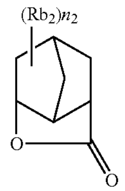

LC1-5

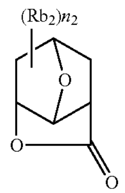

LC1-6

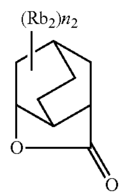

LC1-7

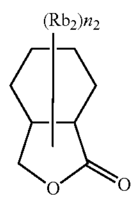

LC1-8

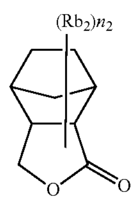

LC1-9

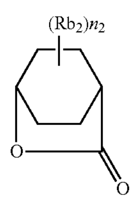

LC1-10

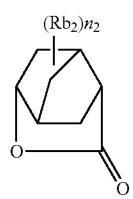

LC1-11

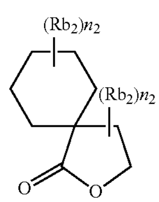

-continued

LC1-12

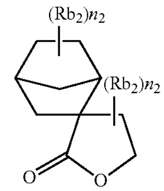

LC1-13

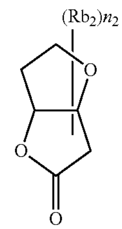

LC1-14

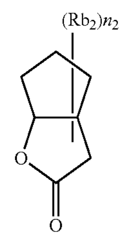

LC1-15

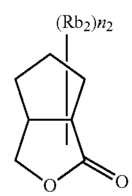

LC1-16

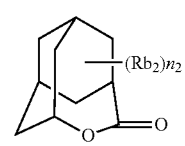

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded with each other to thereby form a ring.

As the repeating units with a lactone structure represented by any of the general formulae (LC1-1) to (LC1-16), there can be mentioned the repeating units represented by the following general formula (AII).

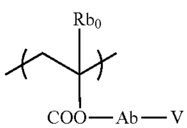

(AII)

In the general formula (AII), $Rb_0$ represents a hydrogen atom, a halogen atom or an optionally substituted alkyl group having 1 to 4 carbon atoms. As a preferred substituent optionally contained in the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. The $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula $-Ab_1-CO_2-$ are preferred.

$Ab_1$ is a linear or branched alkylene group or a cycloalkylene group of a monocyclic structure or polycyclic structure, being preferably a methylene group, an ethylene group, a cyclohexylene group, an adamantylene group or a norbornylene group.

V represents a group with a structure represented by any of the general formulae (LC1-1) to (LC1-16).

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90% or higher, more preferably 95% or higher.

The content of the repeating unit having a lactone group based on all the repeating units of the resin (A') is preferably in the range of 15 to 60 mol %, more preferably 20 to 50 mol % and still more preferably 30 to 50 mol %.

Examples of the repeating units having a lactone group will now be shown, which however in no way limit the scope of the present invention. In the formulae, Rx represents H, $CH_3$, $CH_2OH$ or $CF_3$.

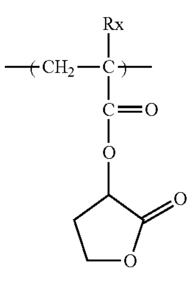

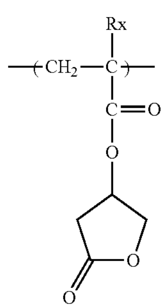

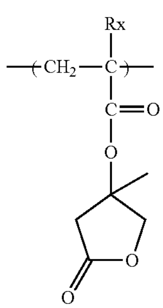

-continued

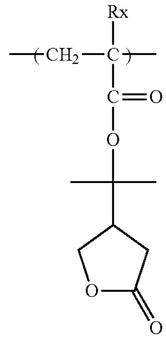

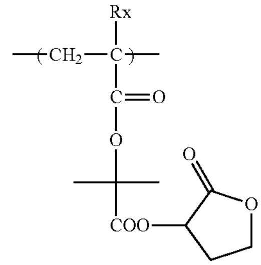

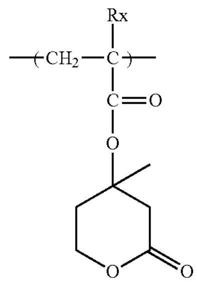

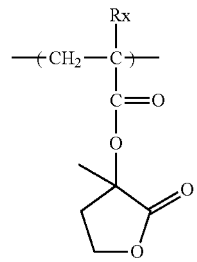

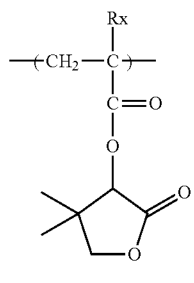

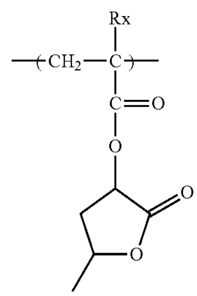

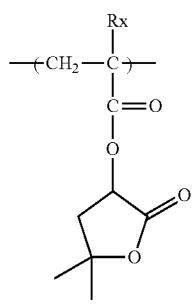

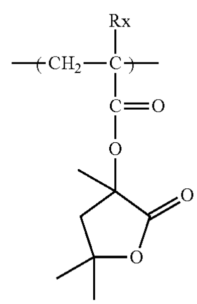

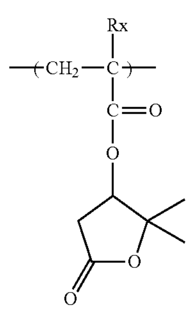

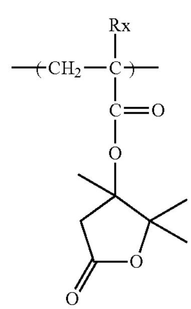

-continued
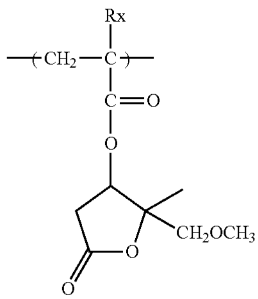
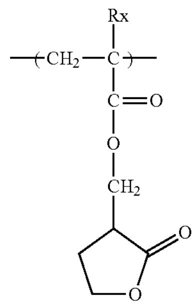
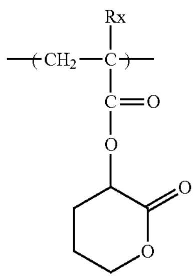
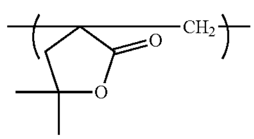
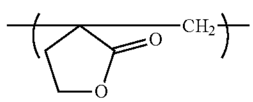
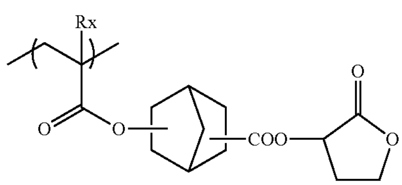
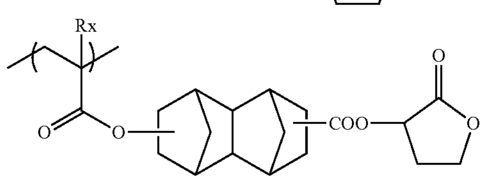
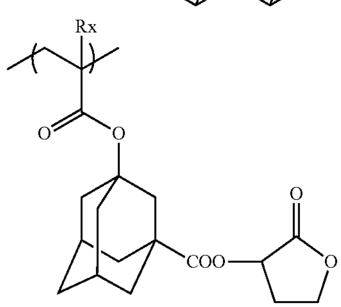
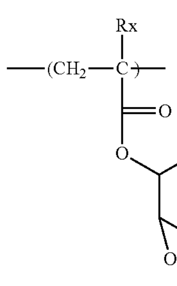
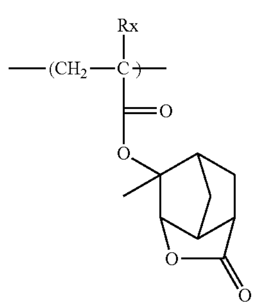
-continued
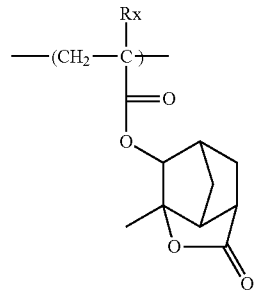
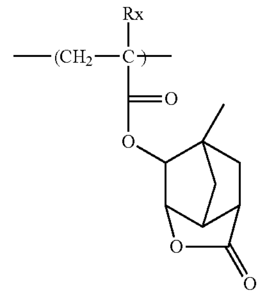
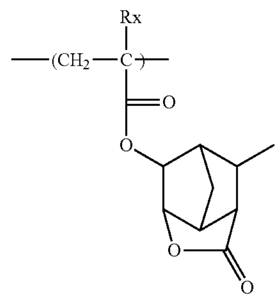
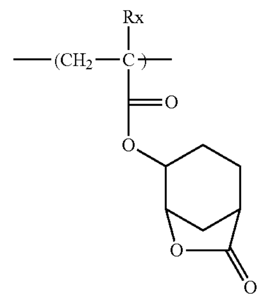
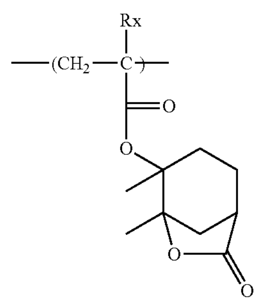
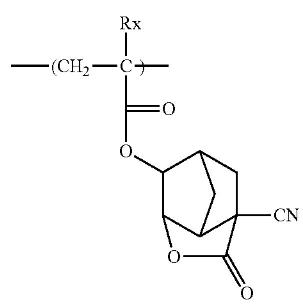
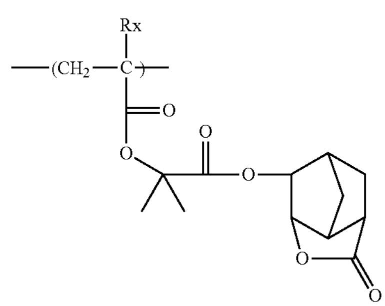

-continued
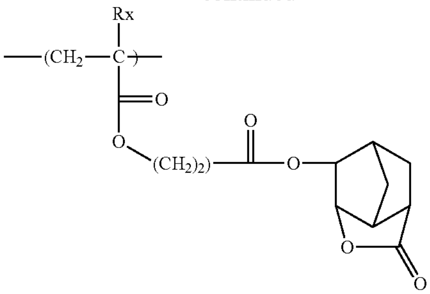
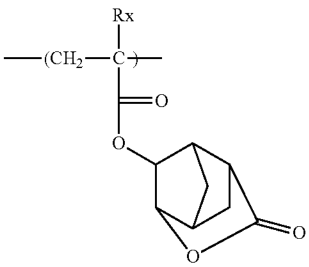
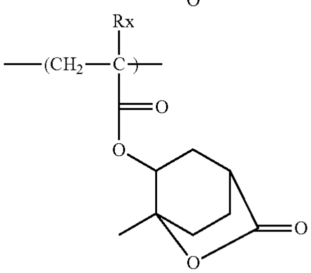
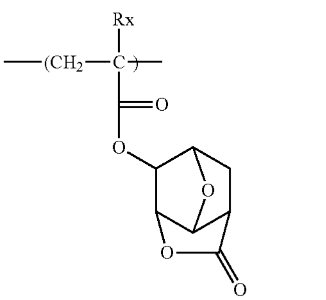
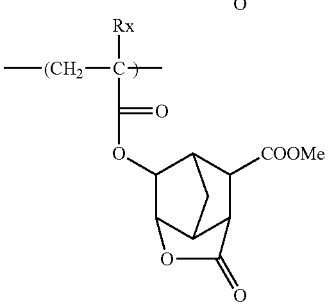
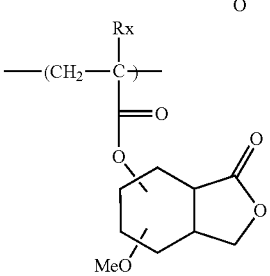
-continued
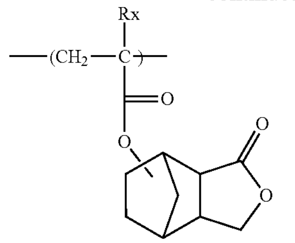
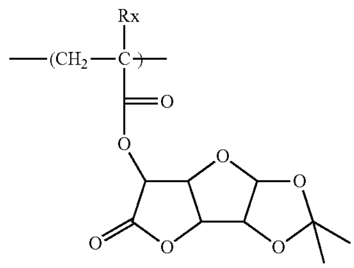
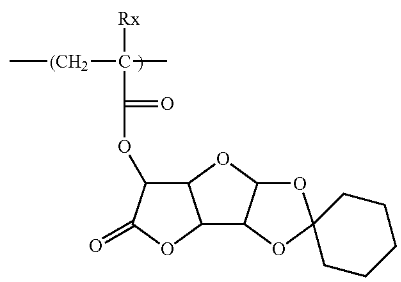
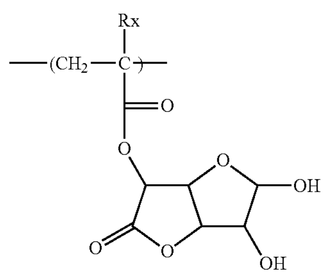
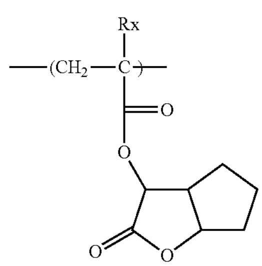
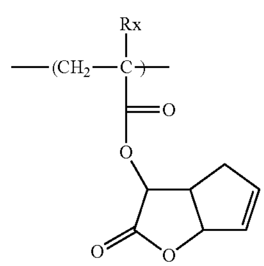
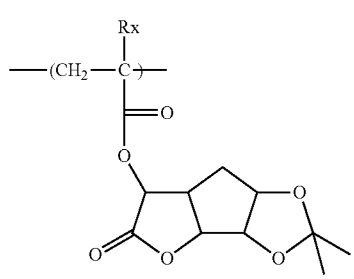

-continued

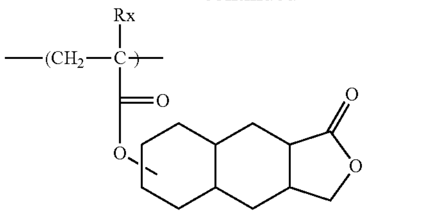

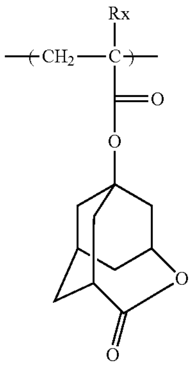

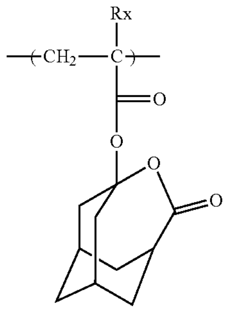

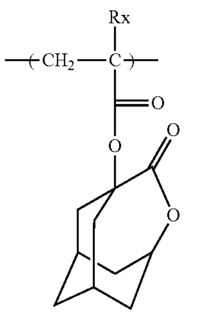

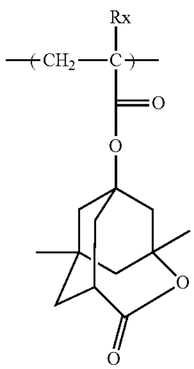

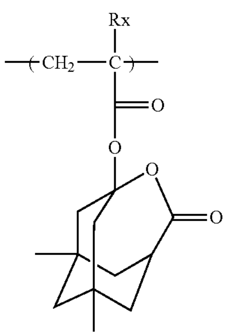

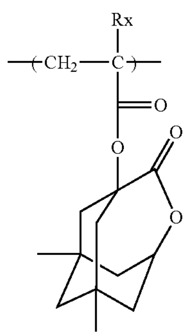

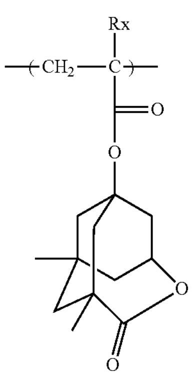

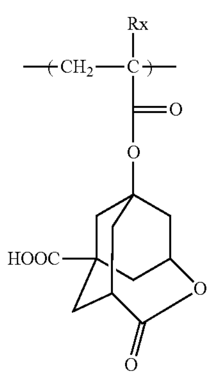

-continued

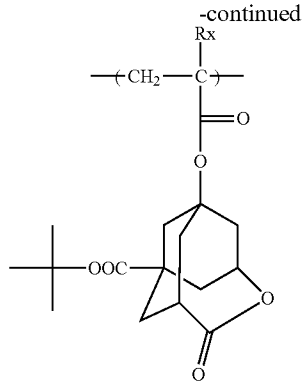

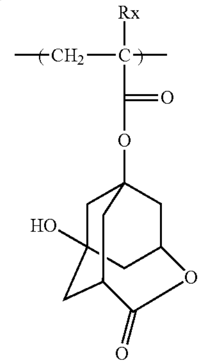

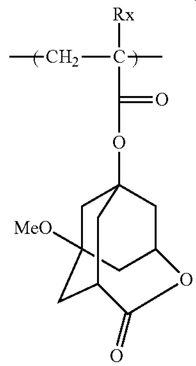

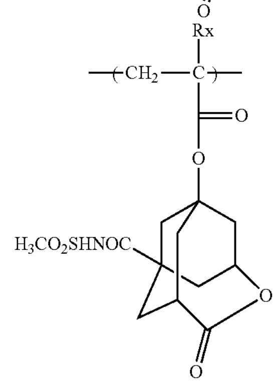

It is preferred for the resin (A') to have a repeating unit having a hydroxyl group or a cyano group. The containment of this repeating unit would realize enhancements of adhesion to substrate and developer affinity. The repeating unit having a hydroxyl group or a cyano group is preferably a repeating unit with a structure of alicyclic hydrocarbon substituted with a hydroxyl group or a cyano group. In the alicyclic hydrocarbon structure substituted with a hydroxyl group or a cyano group, the alicyclic hydrocarbon structure preferably consists of an adamantyl group, a diamantyl group or a norbornane group. As preferred alicyclic hydrocarbon structures substituted with a hydroxyl group or a cyano group, there can be mentioned the partial structures of general formulae (VIIa) to (VIId), below.

(VIIa)

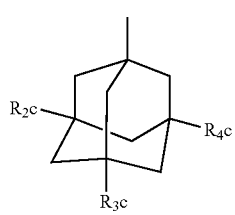

(VIIb)

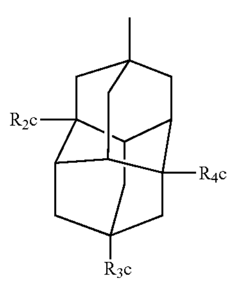

-continued (VIIc)

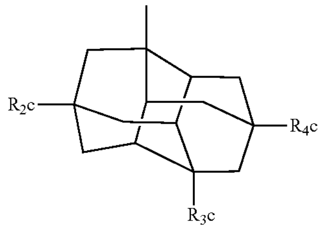

(VIId)

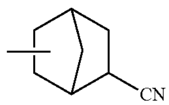

In general formulae (VIIa) to (VIIc), each of $R_2c$ to $R_4c$ independently represents a hydrogen atom, a hydroxyl group or a cyano group, providing that at least one of the $R_2c$ to $R_4c$ represents a hydroxyl group or a cyano group. Preferably, one or two of the $R_2c$ to $R_4c$ are hydroxyl groups and the remainder is a hydrogen atom. In the general formula (VIIa), more preferably, two of the $R_2c$ to $R_4c$ are hydroxyl groups and the remainder is a hydrogen atom.

As the repeating units having any of the partial structures of general formulae (VIIa) to (VIId), there can be mentioned those of general formulae (AIIa) to (AIId) below.

(AIIa)

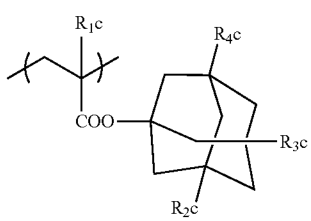

(AIIb)

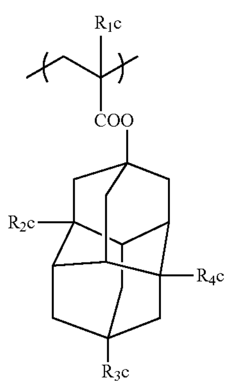

(AIIc)

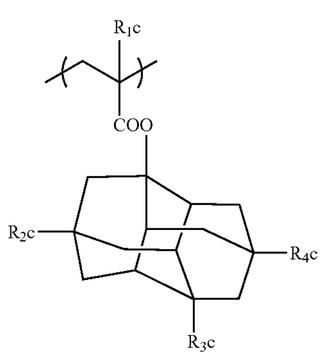

-continued (AIId)

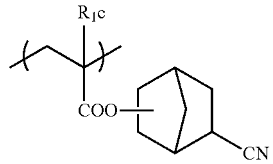

In the general formulae (AIIa) to (AIId), $R_1c$ represents a hydrogen atom, a methyl group, a trifluoromethyl group or a hydroxymethyl group.

$R_2c$ to $R_4c$ have the same meaning as those of general formulae (VIIa) to (VIIc).

The content ratio of the repeating unit having a hydroxyl group or a cyano group, based on all the repeating units of the resin (A'), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

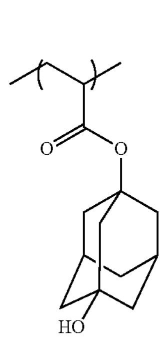

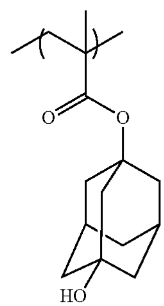

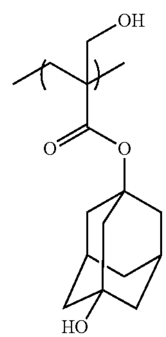

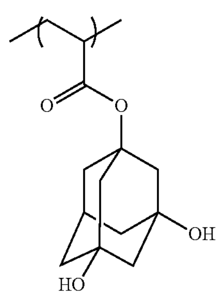

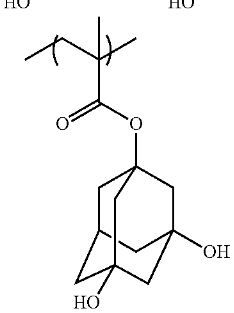

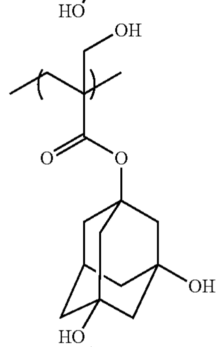

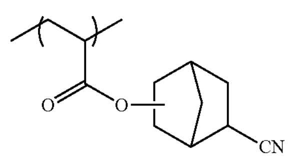

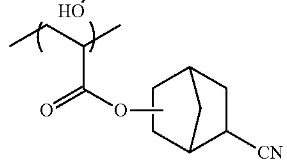

-continued

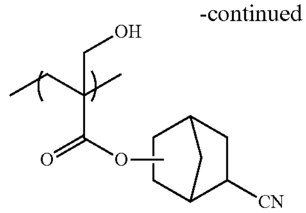

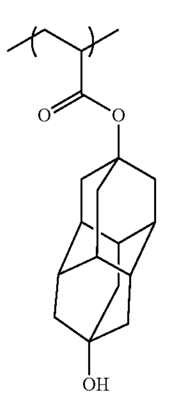

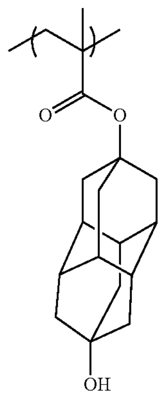

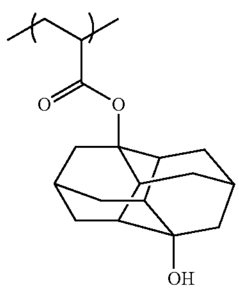

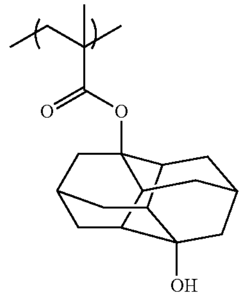

It is preferred for the resin (A') to contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a cyclohydrocarbon structure of a single ring or multiple rings. The repeating unit of acrylic acid or methacrylic acid is especially preferred.

The content ratio of the repeating unit having an alkali-soluble group based on all the repeating units of the resin (A') is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, $CH_3$, $CF_3$ or $CH_2OH$.

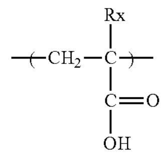

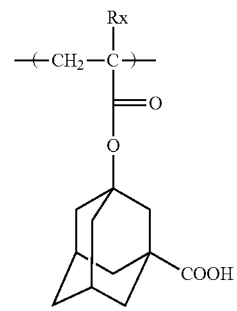

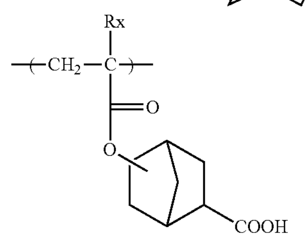

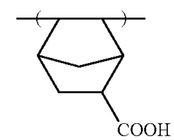

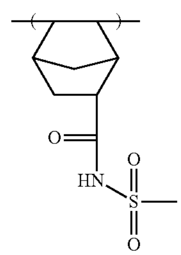

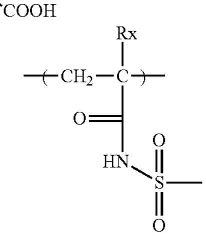

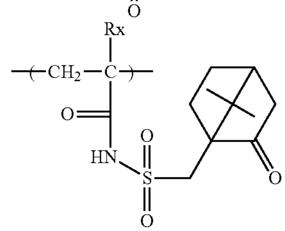

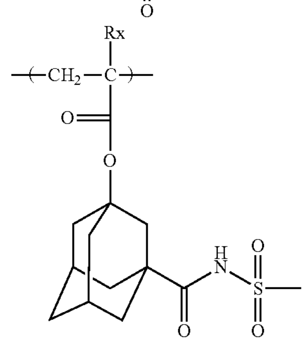

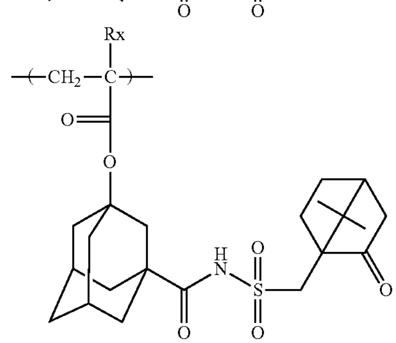

-continued

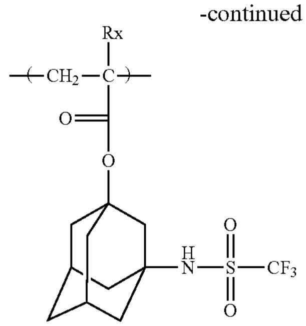

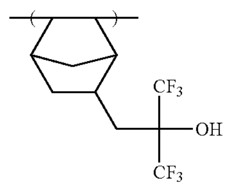

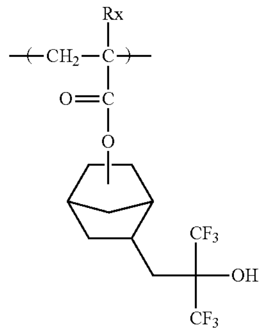

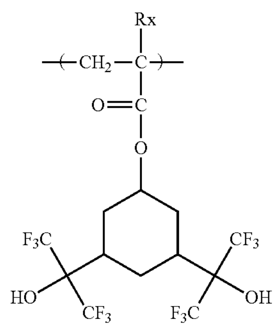

The resin (A') may further have a repeating unit having an alicyclic hydrocarbon structure and not exhibiting any acid decomposability. This would reduce any leaching of low-molecular components from a resist film into a liquid for liquid immersion at the time of liquid immersion exposure. As such a repeating unit, there can be mentioned, for example, 1-adamantyl (meth)acrylate repeating unit, diamantyl (meth) acrylate repeating unit, tricyclodecanyl (meth)acrylate repeating unit, cyclohexyl (meth)acrylate repeating unit or the like.

The resin (A') may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of the resin (A'), especially:

(1) solubility in applied solvents, (2) film forming easiness (glass transition point), (3) alkali developability, (4) film thinning (selections of hydrophilicity/hydrophobicity and alkali-soluble group), (5) adhesion of unexposed area to substrate, (6) dry etching resistance, etc.

The resin (A') can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or the latter described solvent capable of dissolving the composition of the present invention, such as propylene glycol monomethyl ether acetate, propylene glycol monomethyl ether or cyclohexanone. It is preferred to perform the polymerization with the use of the same solvent as employed in the photosensitive composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10° to 150° C., preferably 30° to 120° C. and more preferably 60° to 100° C.

The weight average molecular weight of the resin (A') in terms of polystyrene molecular weight as measured by GPC is preferably in the range of 1000 to 200,000, more preferably 2000 to 20,000, still more preferably 3000 to 15,000 and further preferably 3000 to 10,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose degree of dispersal (molecular weight distribution) is generally in the range of 1 to 3, preferably 1 to 2.6, more preferably 1 to 2 and most preferably 1.4 to 1.7. The lower the molecular weight distribution, the more excellent the resolving power and resist profile and the smoother the side wall of the resist pattern to thereby attain an excellence in roughness.

Two or more types of resins (Ab) may be used in combination.

The total amount of resins (Ab) added, based on the total solids of the positive resist composition, is generally in the range of 10 to 99 mass %, preferably 20 to 99 mass % and most preferably 30 to 99 mass %.

Nonlimiting particular examples of resins (Ab) are shown below.

(Ab-1)
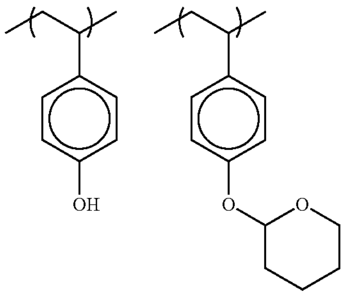
(Ab-2)
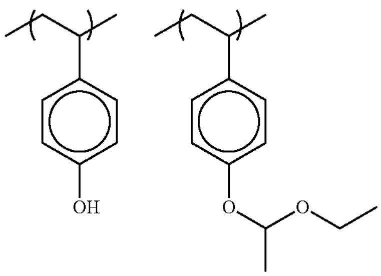
(Ab-3)
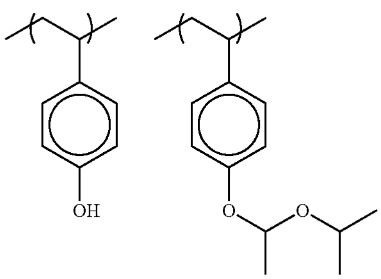
(Ab-4)
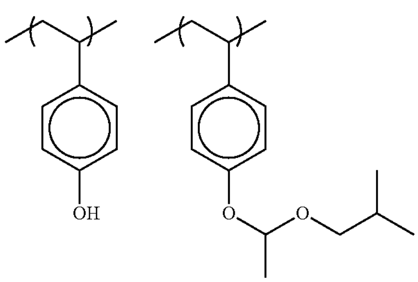
(Ab-5)
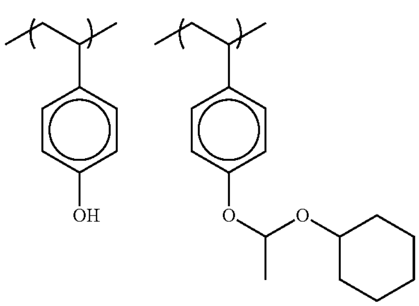
-continued
(Ab-6)
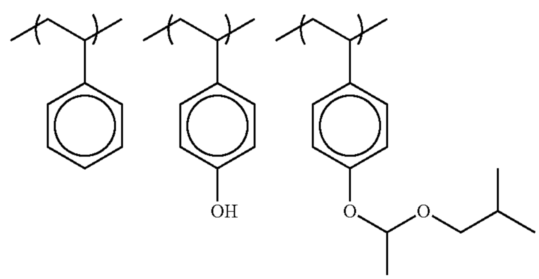
(Ab-7)
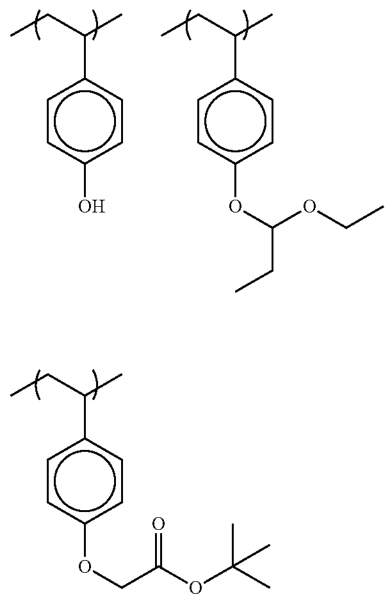
(Ab-8)
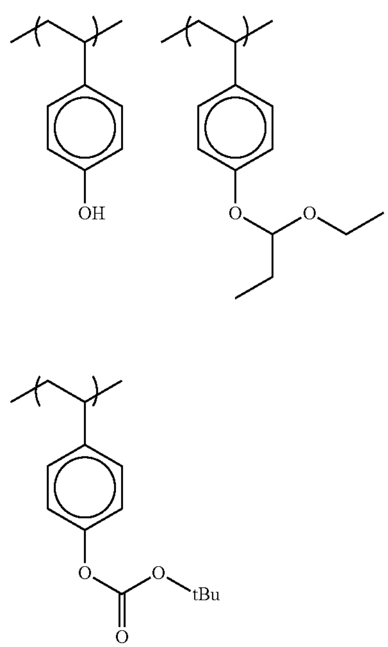

-continued
(Ab-9)
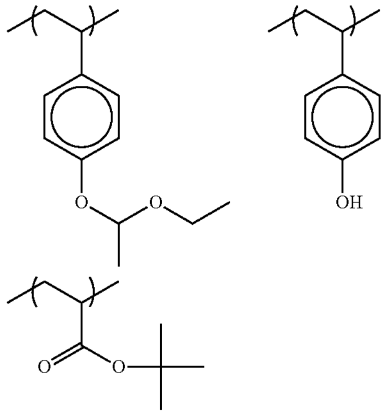
(Ab-10)
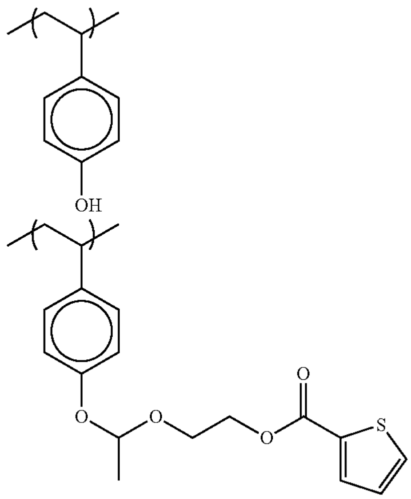
(Ab-11)
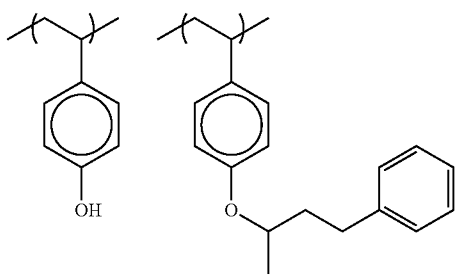
(Ab-12)
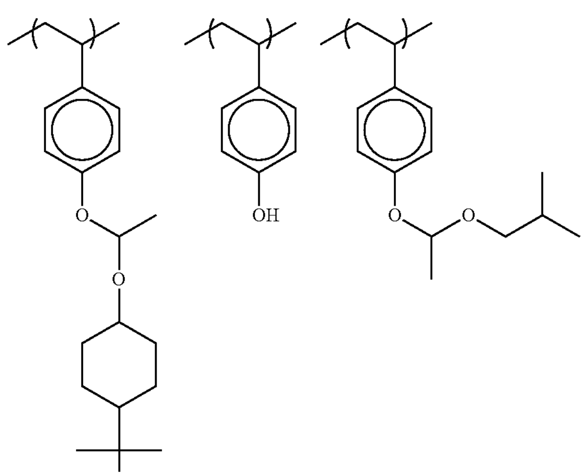
-continued
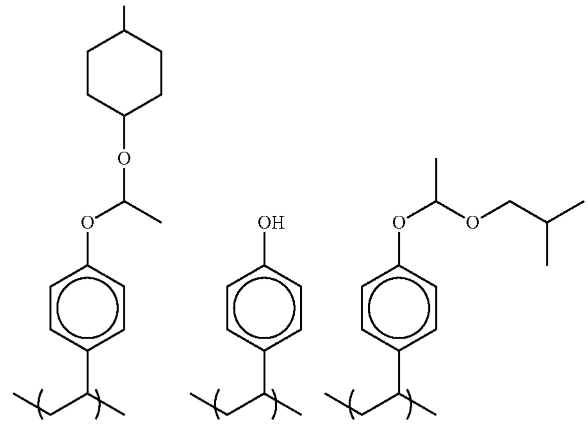
(Ab-13)
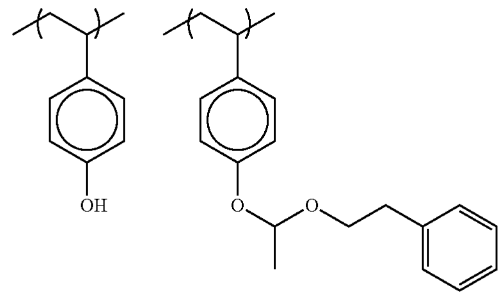
(Ab-14)
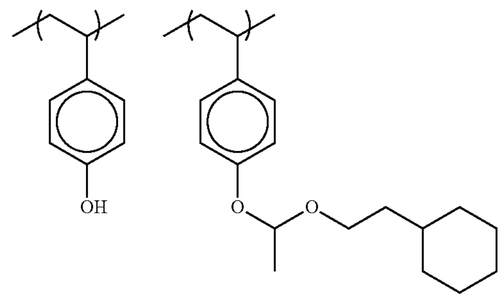
(Ab-15)
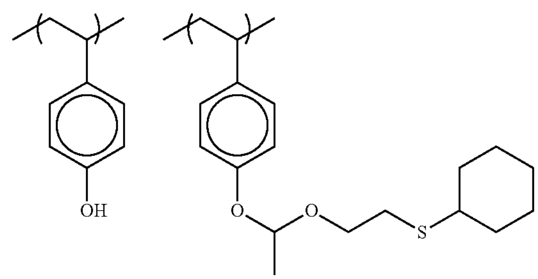
(Ab-16)
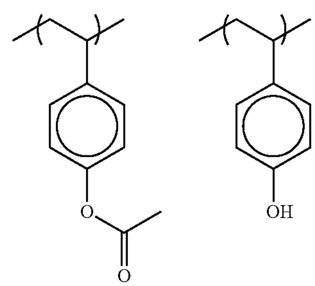

-continued
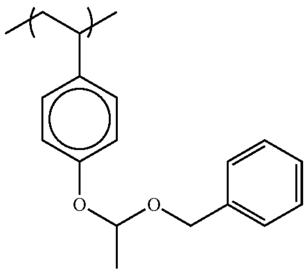
(Ab-17)
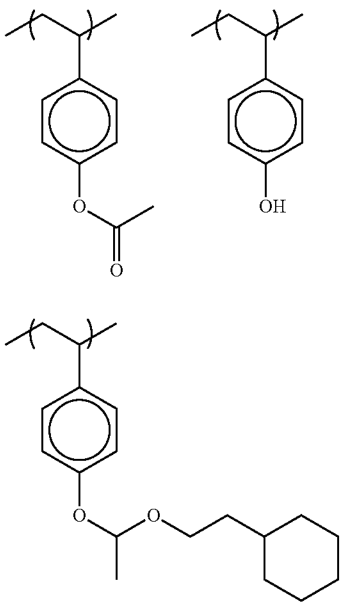
(Ab-18)
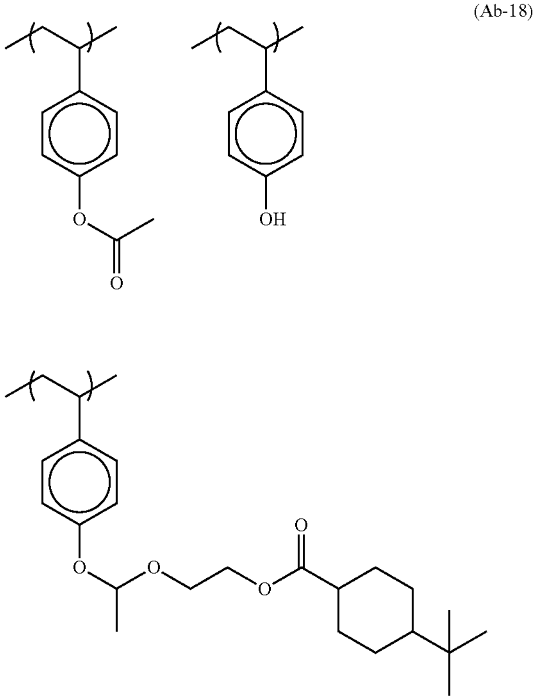
-continued
(Ab-19)
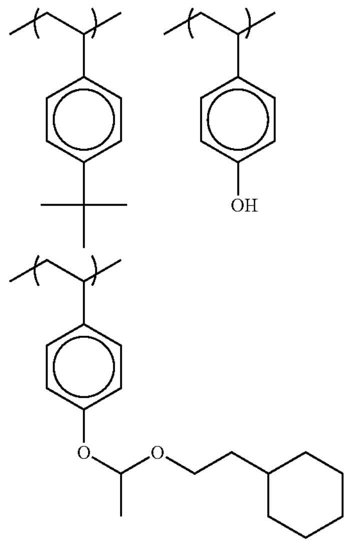
(Ab-20)
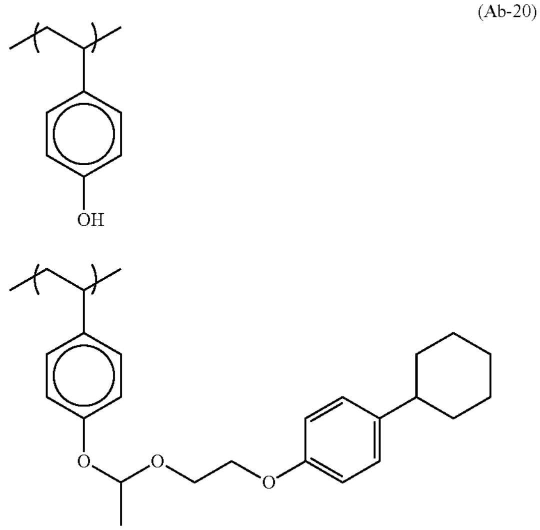
(Ab-21)
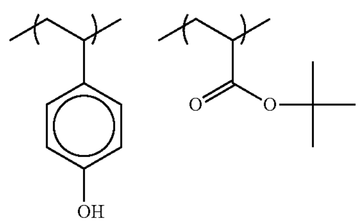
(Ab-22)
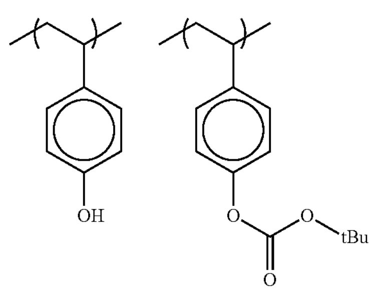

-continued
(Ab-23)
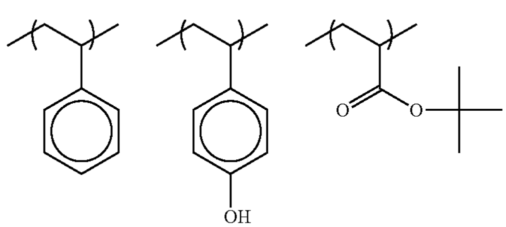
(Ab-24)
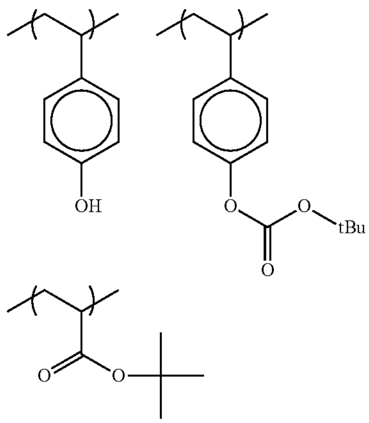
(Ab-25)
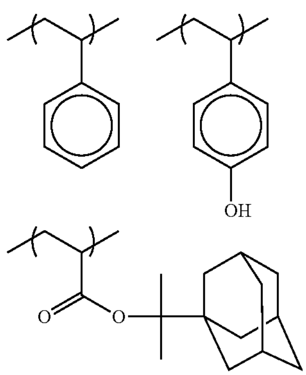
(Ab-26)
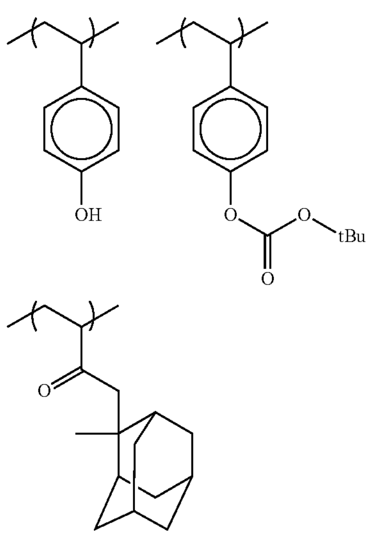
-continued
(Ab-27)
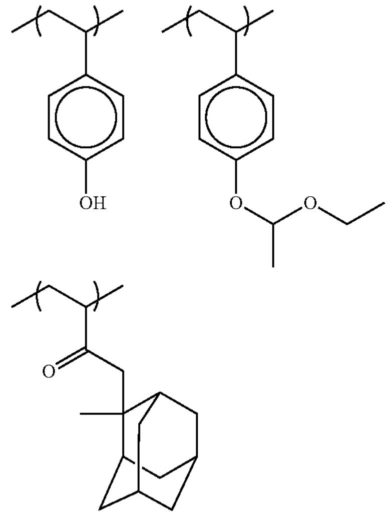
(Ab-28)
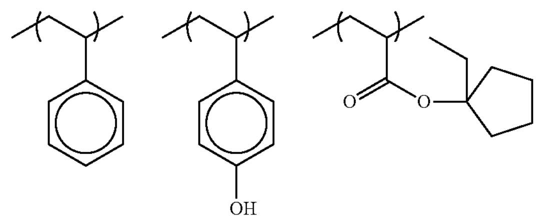
(Ab-29)
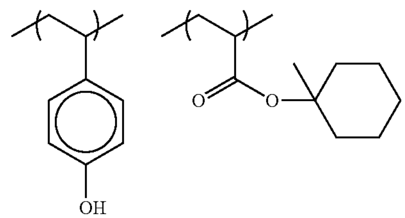
(Ab-30)
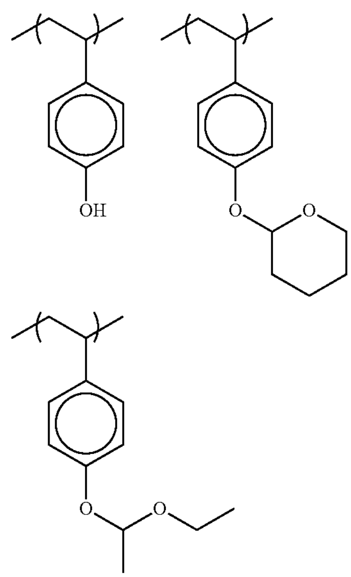

(Ab-31)
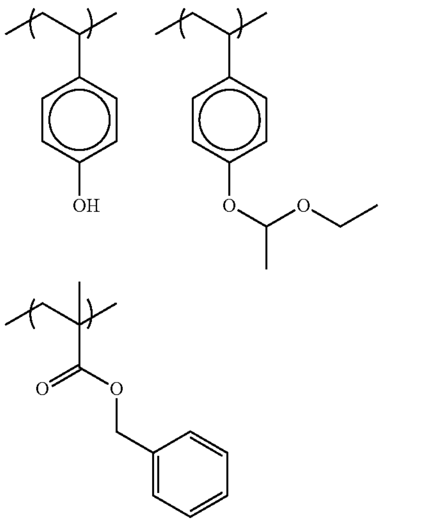
(Ab-32)
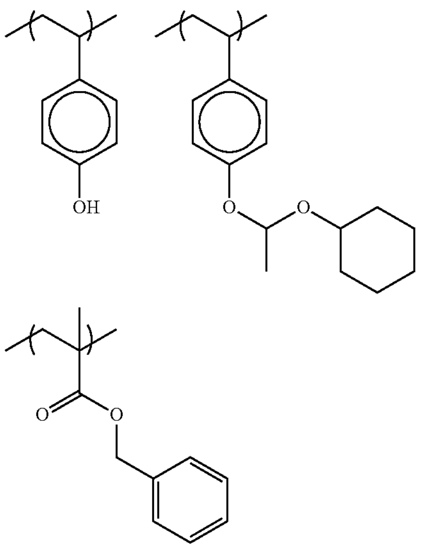
(Ab-33)
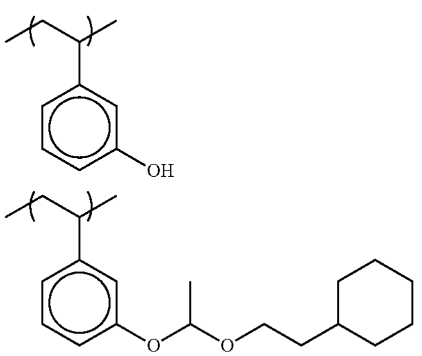
(Ab-34)
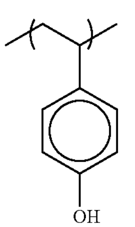
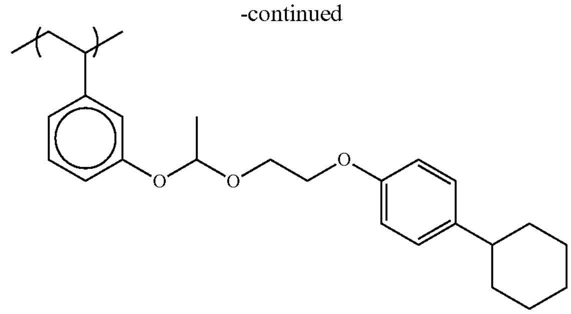
(Ab-35)
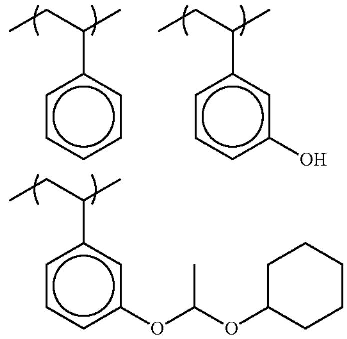
(Ab-36)
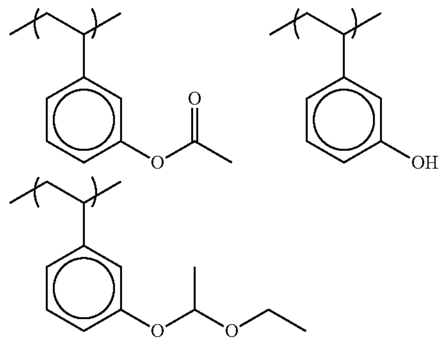
(Ab-37)
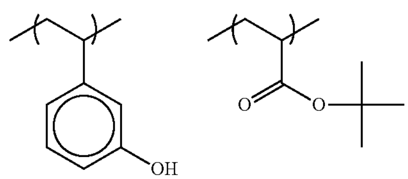
(Ab-38)
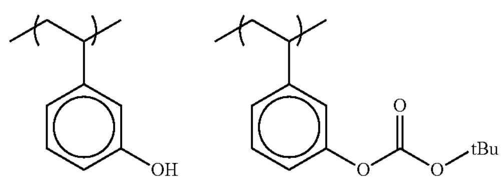
(Ab-39)
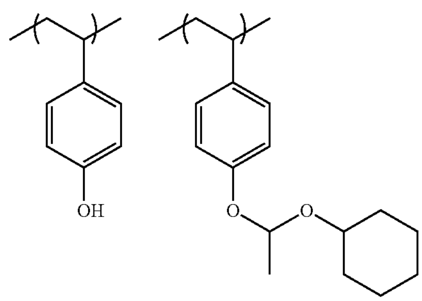

-continued
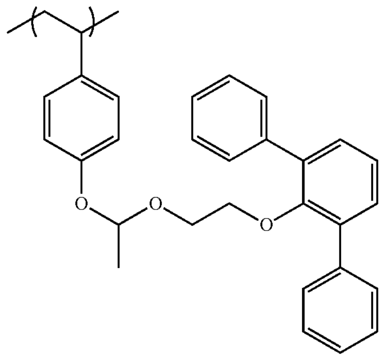
(Ab-40)
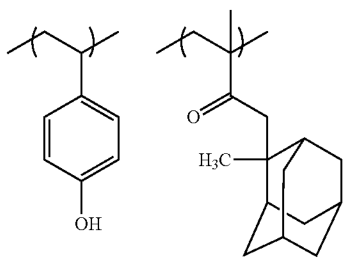
(Ab-41)
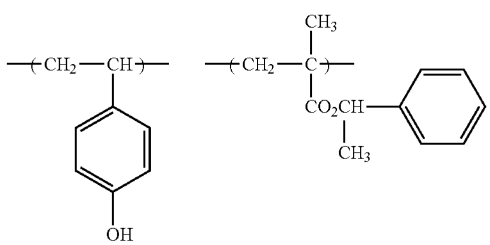
(Ab-42)
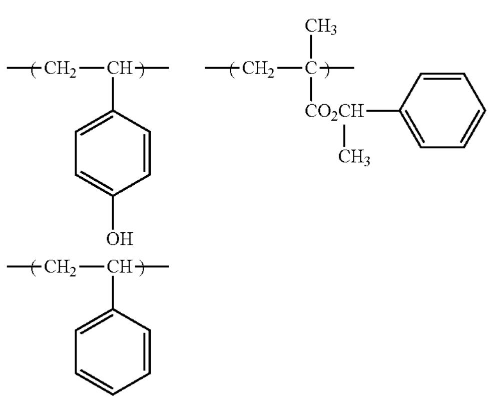
(Ab-43)
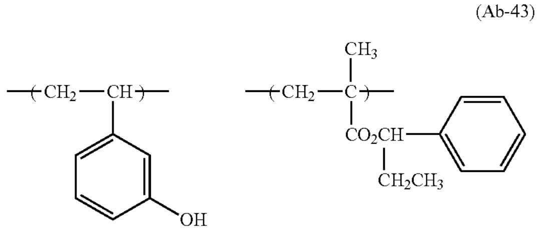
-continued
(Ab-44)
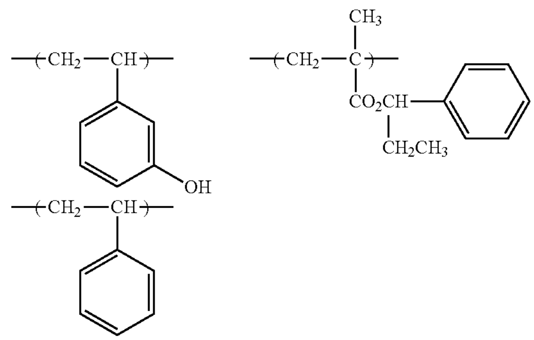
(Ab-45)
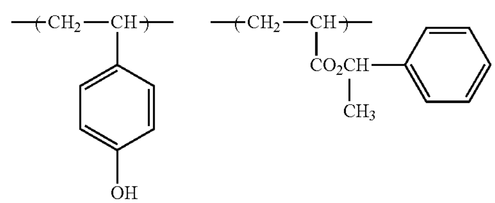
(Ab-46)
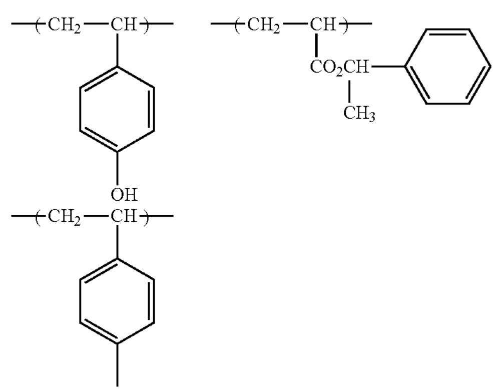
(Ab-47)
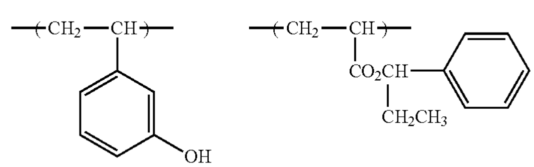
(Ab-48)
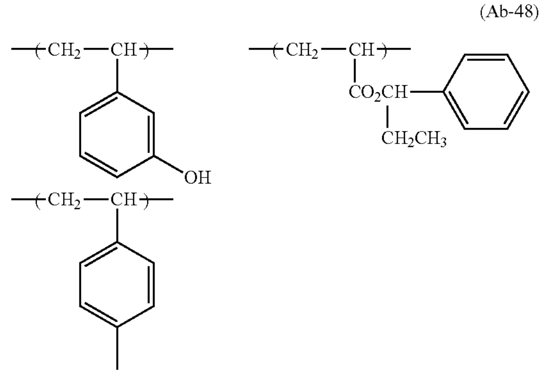

-continued
(Ab-49)
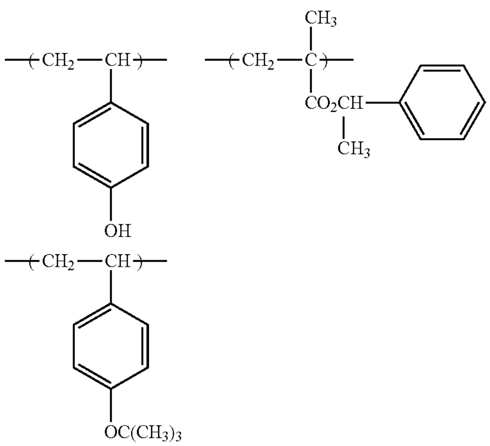
(Ab-50)
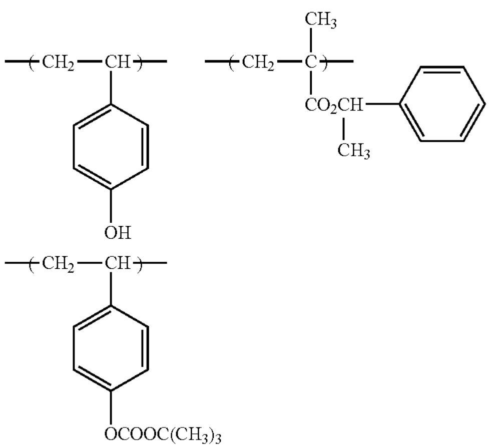
(Ab-51)
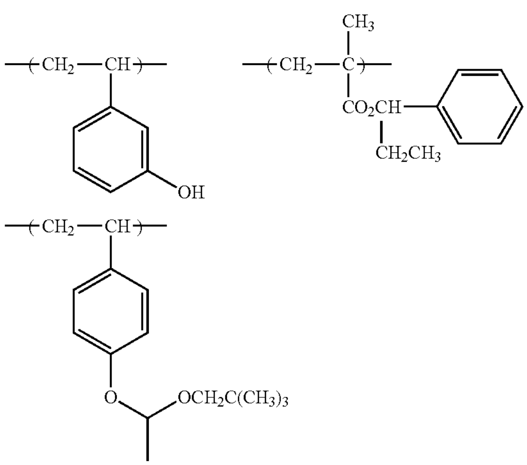
(Ab-52)
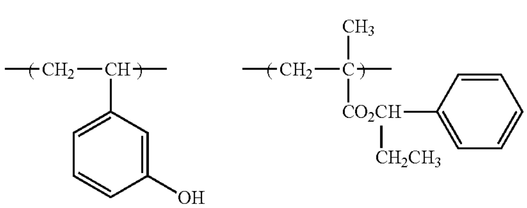
-continued
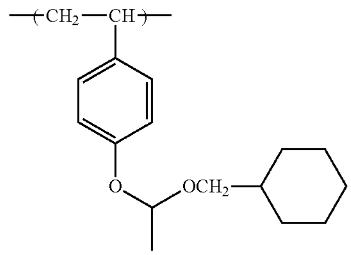
(Ab-53)
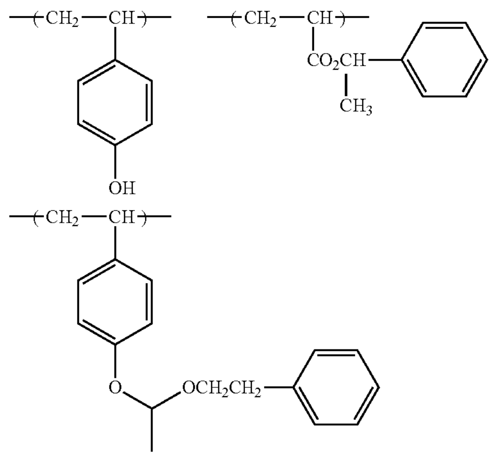
(Ab-54)
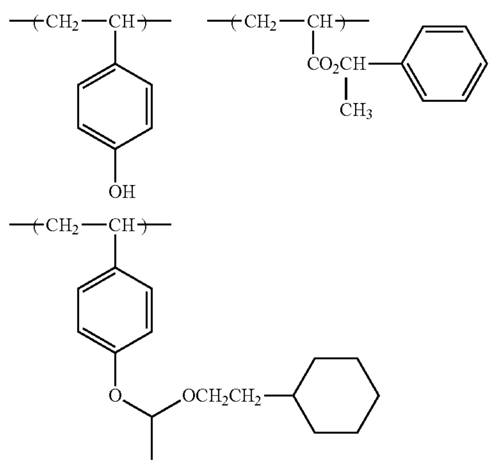
(Ab-55)
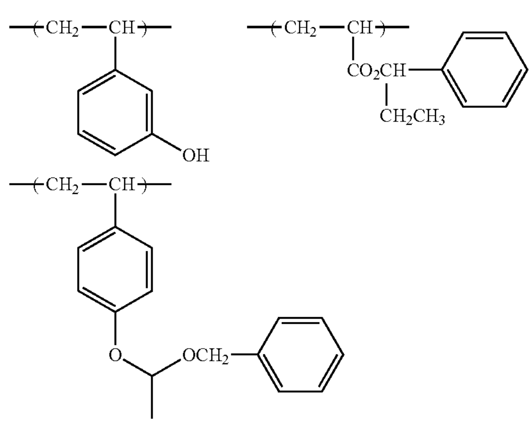

-continued
(Ab-56)
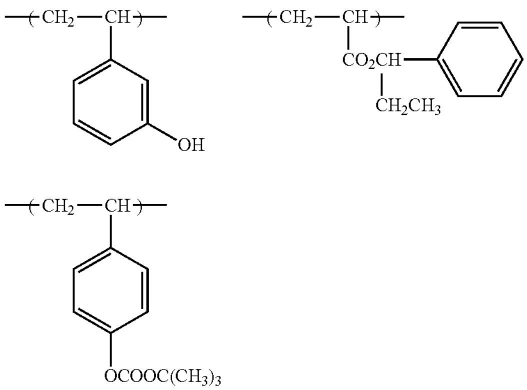
(Ab-57)
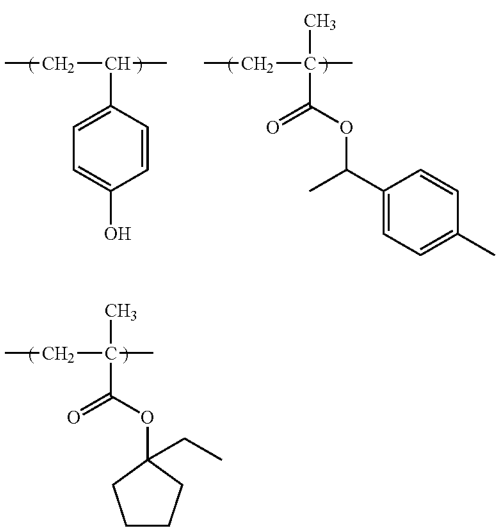
(Ab-58)
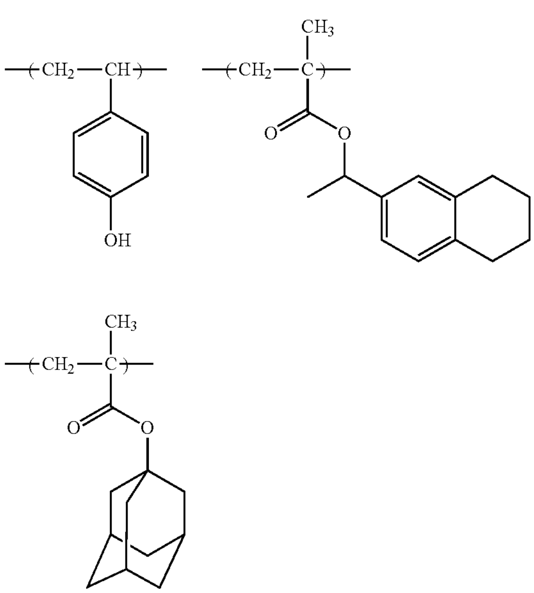
-continued
(Ab-59)
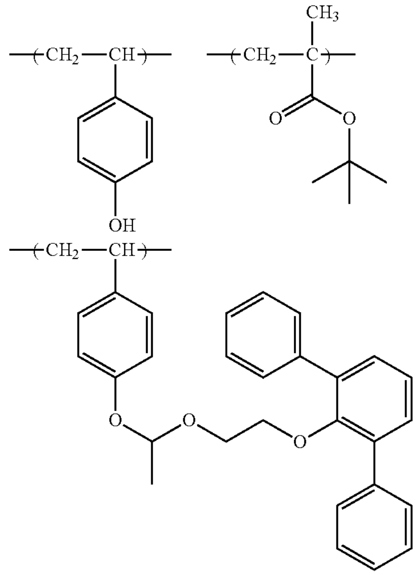
(Ab-60)
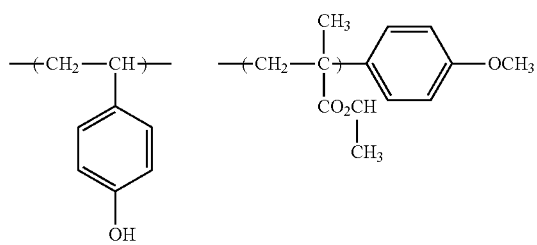
(Ab-61)
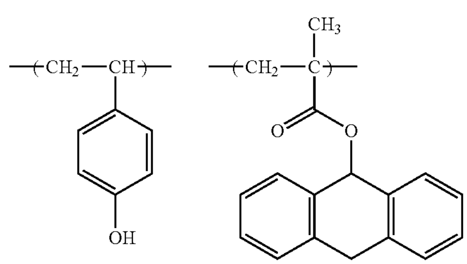
(Ab-62)
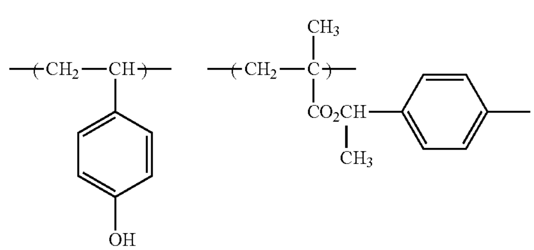
(Ab-63)
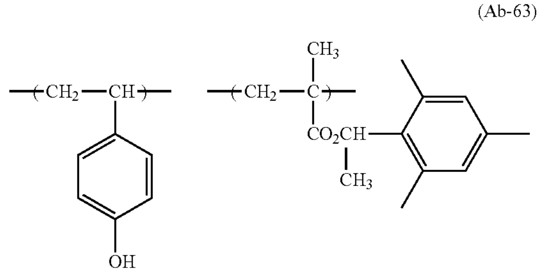

-continued
(Ab-64)
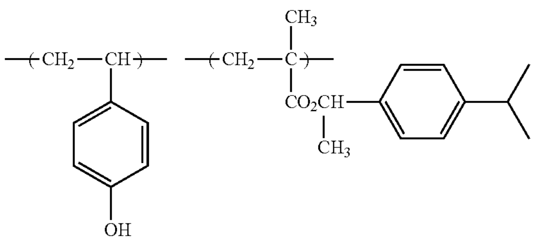
(Ab-65)
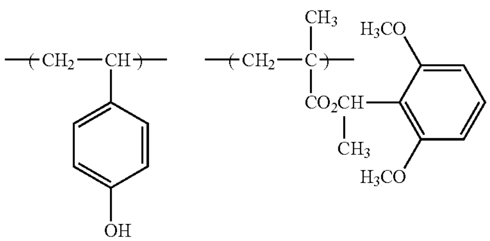
(Ab-66)
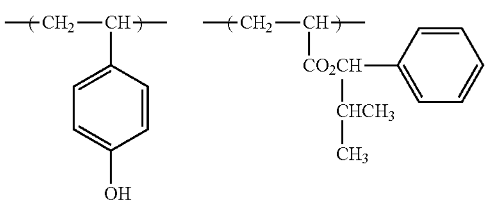
(Ab-67)
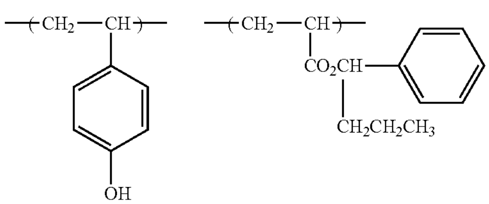
(Ab-68)
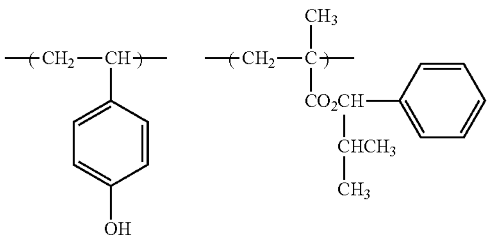
(Ab-69)
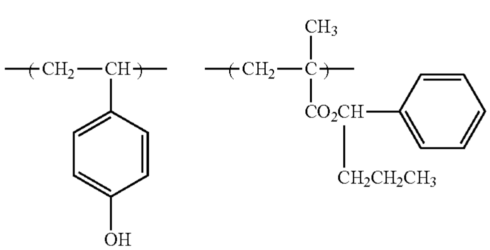
-continued
(Ab-70)
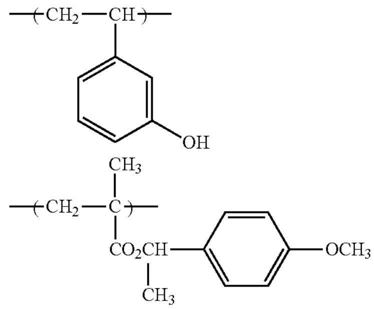
(Ab-71)
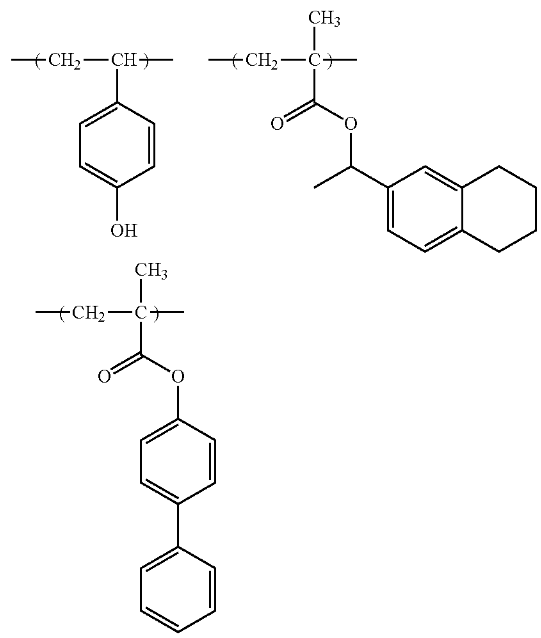
(Ab-72)
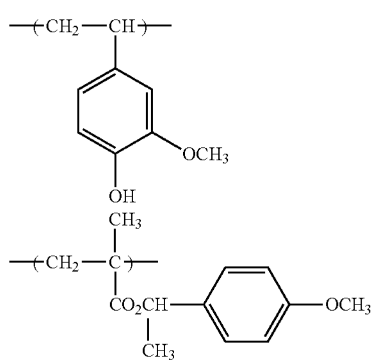
(Ab-73)
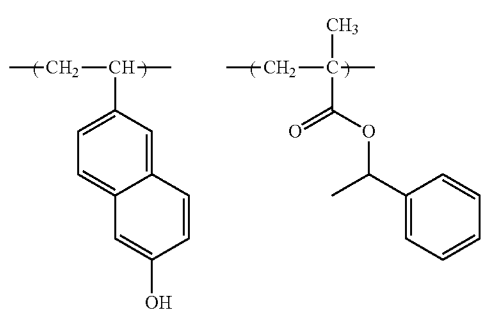

-continued
(Ab-74)
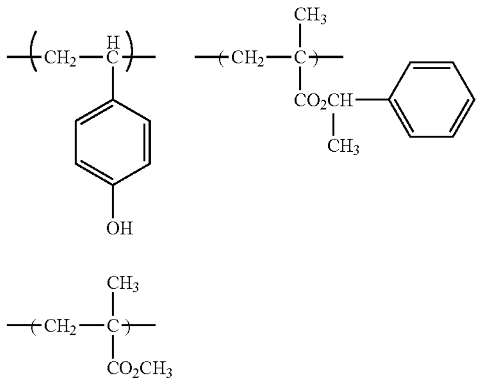
(Ab-75)
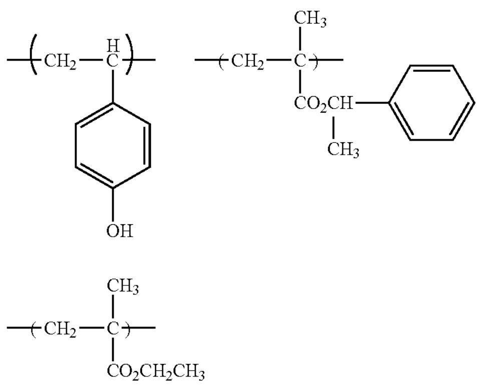
(Ab-76)
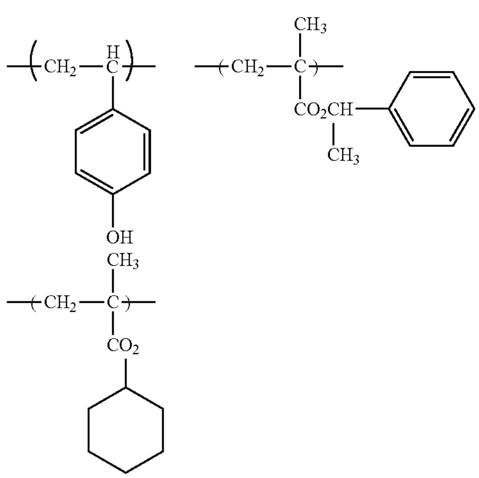
(Ab-77)
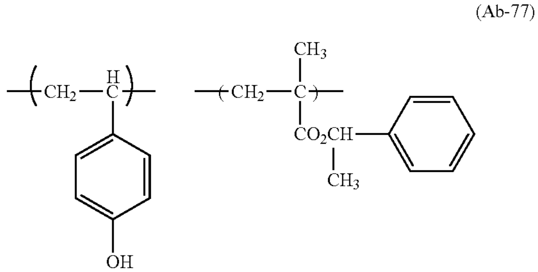
-continued
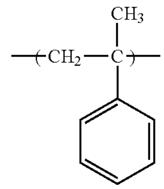
(Ab-78)
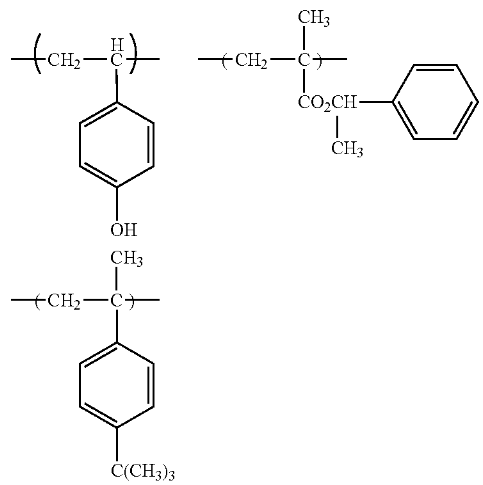
(Ab-79)
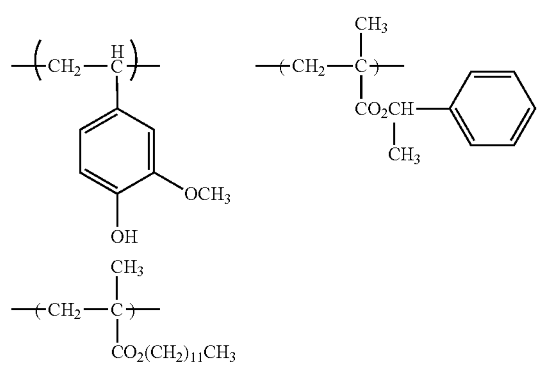
(Ab-80)
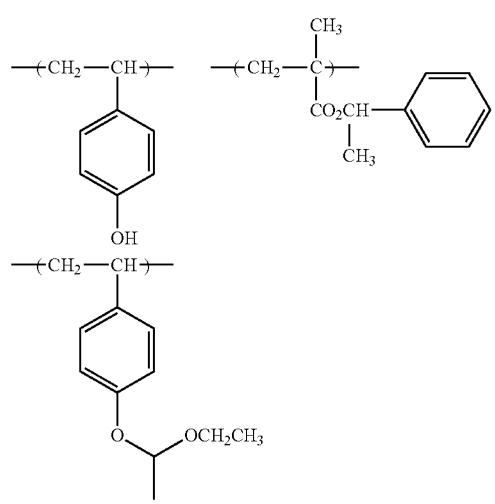

-continued
(Ab-81)
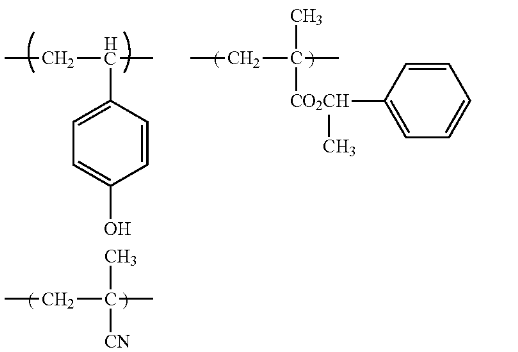
(Ab-82)
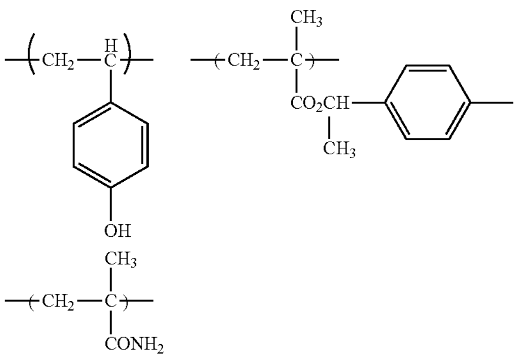
(Ab-83)
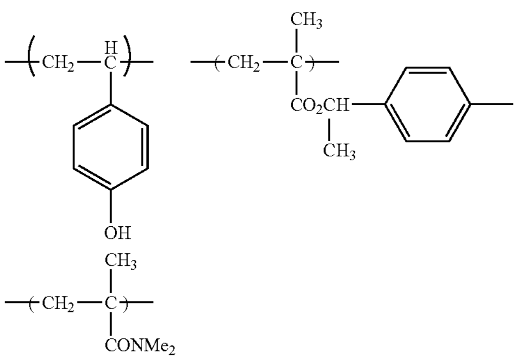
(Ab-84)
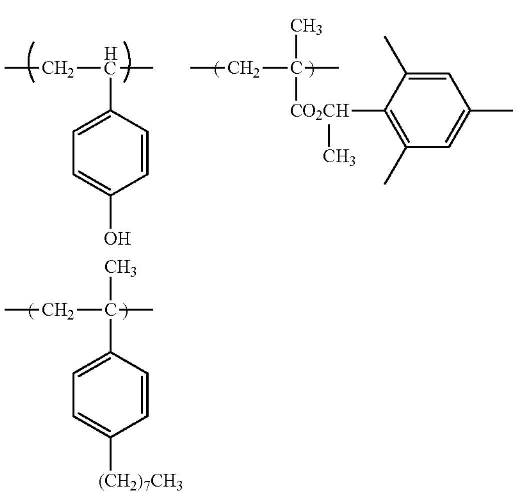
-continued
(Ab-85)
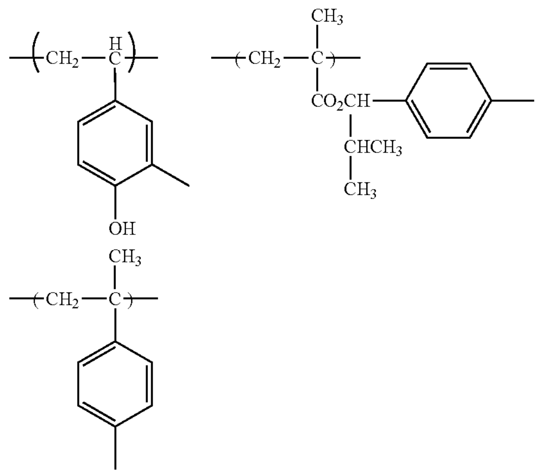
(Ab-86)
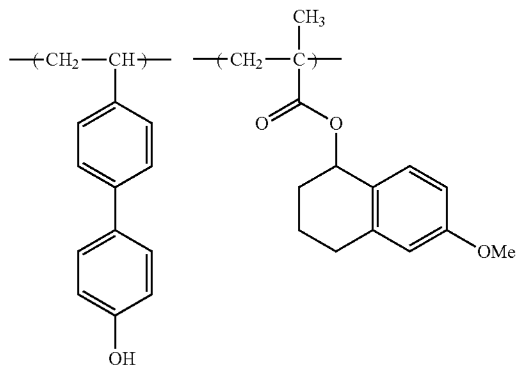
(Ab-87)
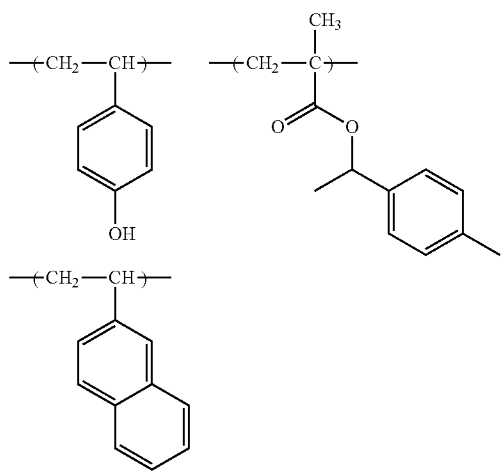
(Ab-88)
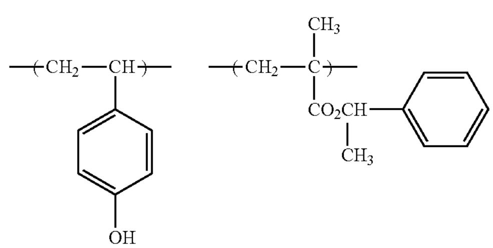

-continued
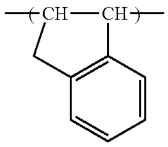
(Ab-89)
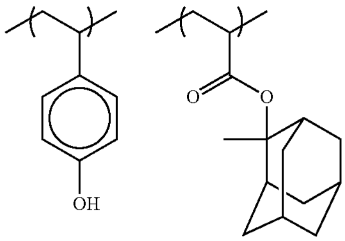
(Ab-90)
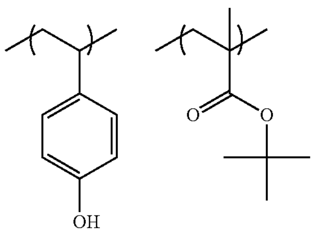
(Ab-91)
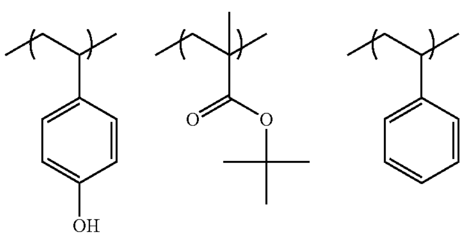
(Ab-92)
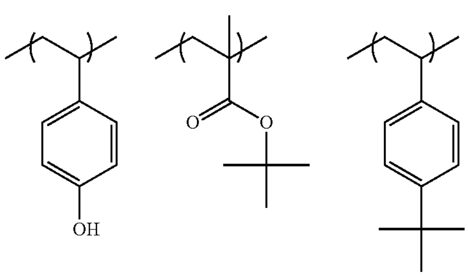
(Ab-93)
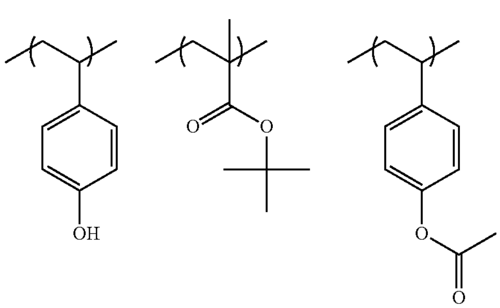
-continued
(Ab-94)
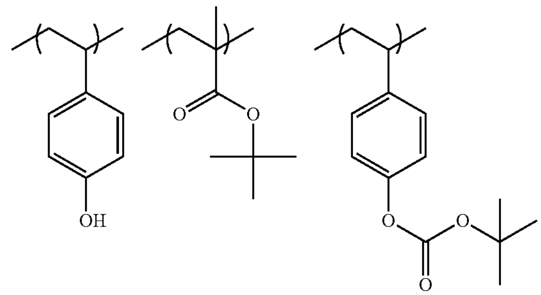
(Ab-95)
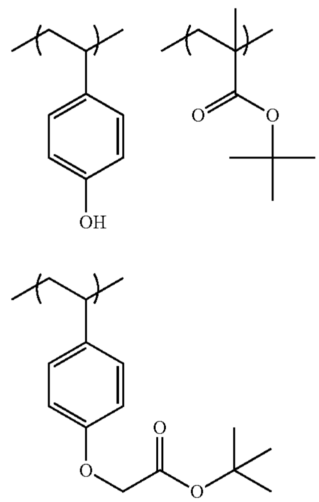
(Ab-96)
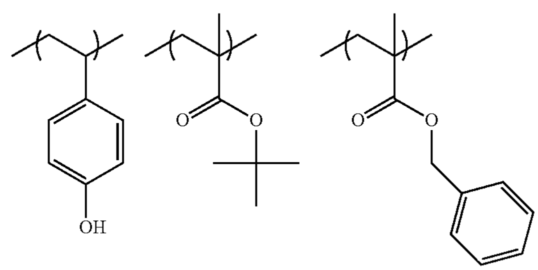
(Ab-97)
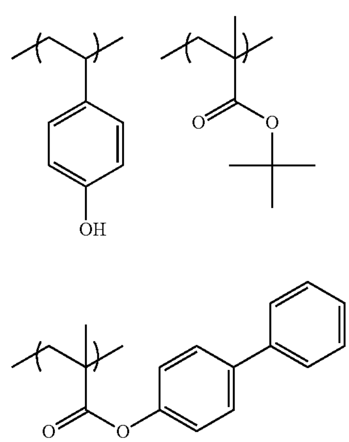

-continued
(Ab-98)
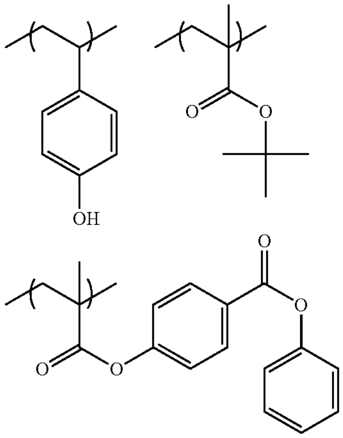
(Ab-99)
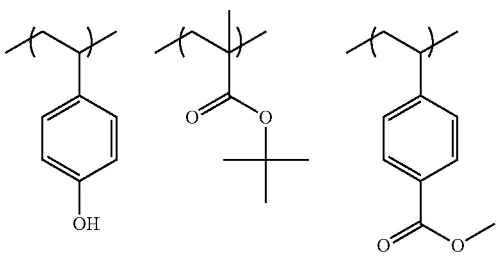
(Ab-100)
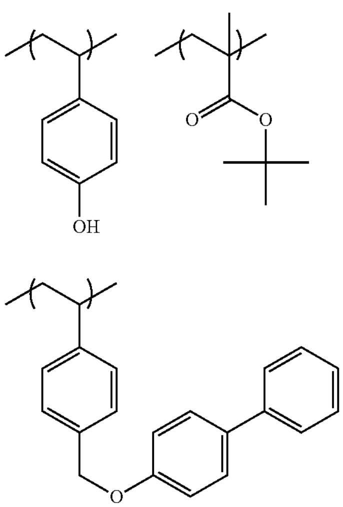
(Ab-101)
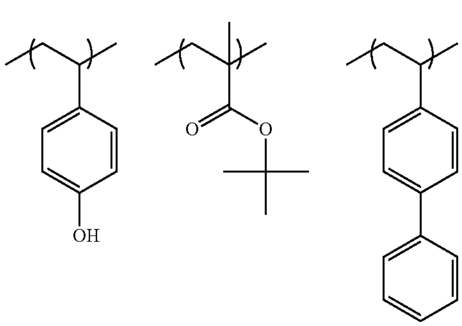
-continued
(Ab-102)
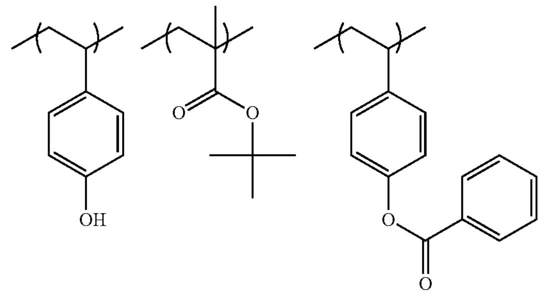
(Ab-103)
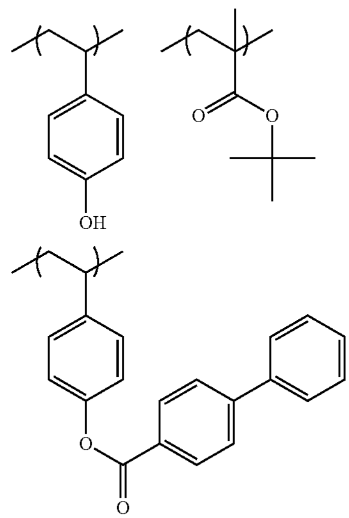
(Ab-104)
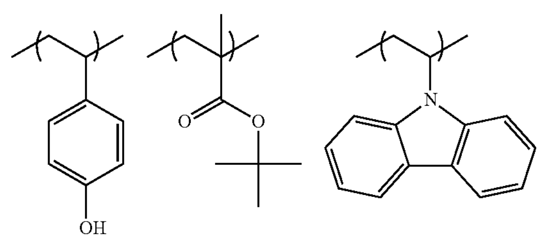
(Ab-105)
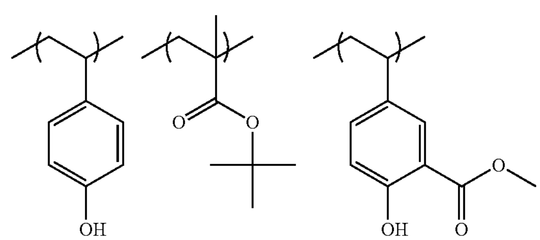
(Ab-106)
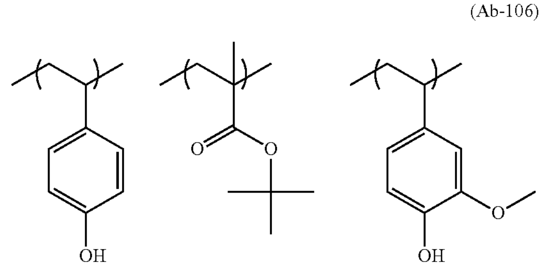

-continued
(Ab-107)
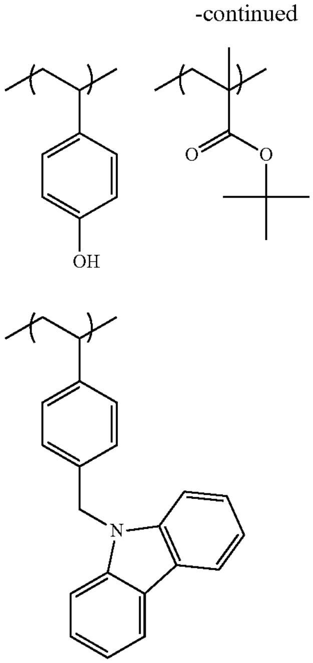
(Ab-108)
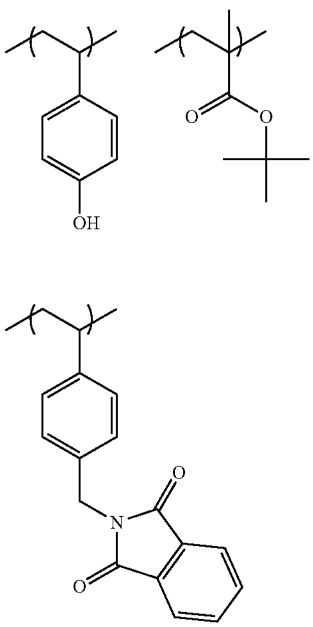
(Ab-109)
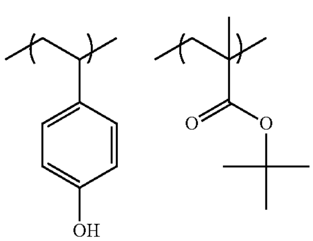
-continued
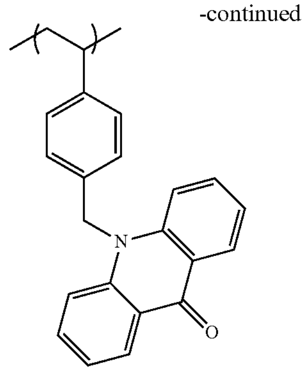
(Ab-110)
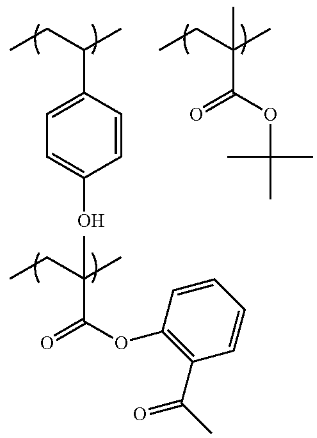
(Ab-111)
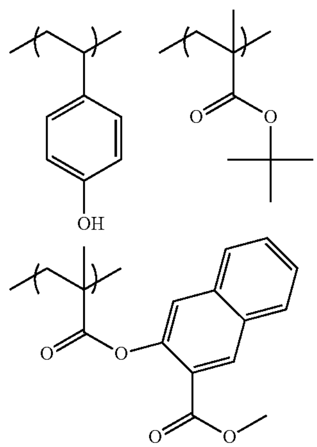
(Ab-112)
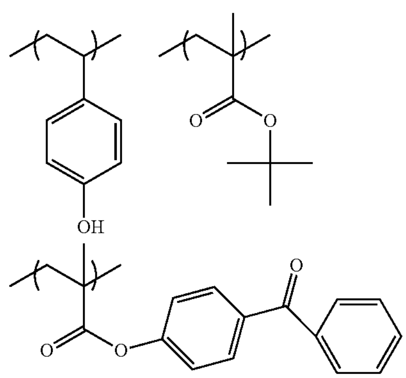

-continued
(Ab-113)
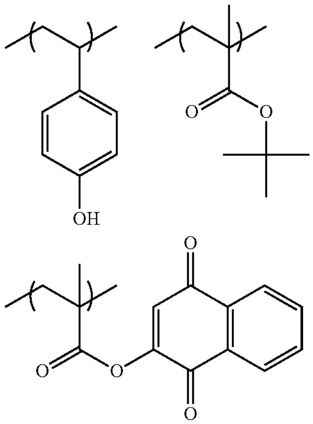
(Ab-114)
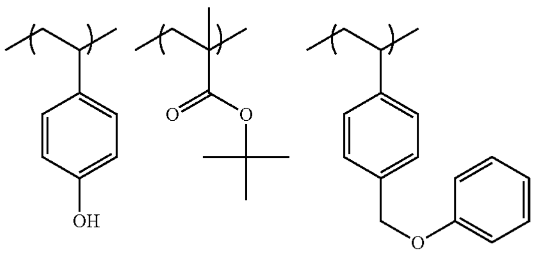
(Ab-115)
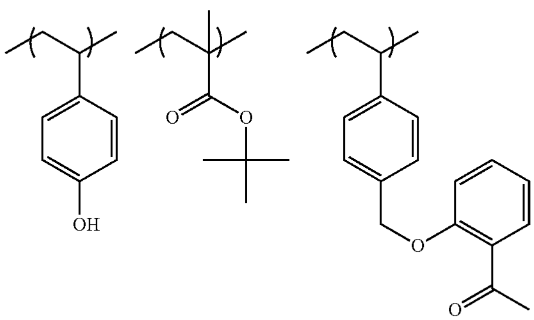
(Ab-116)
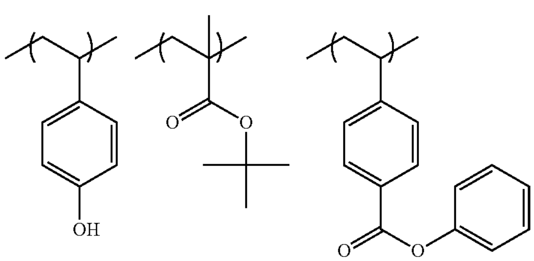
(Ab-117)
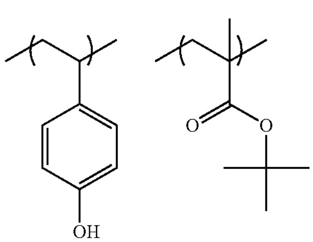
-continued
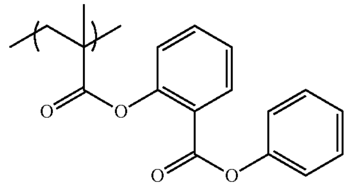
(Ab-118)
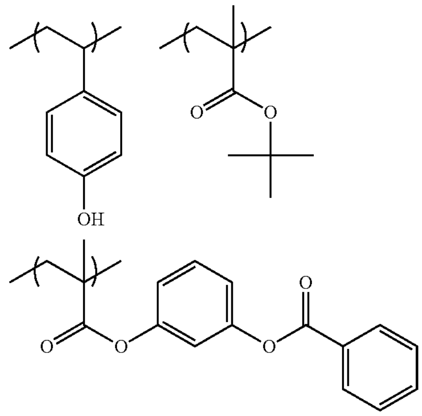
(Ab-119)
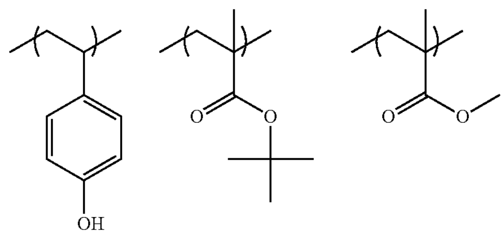
(Ab-120)
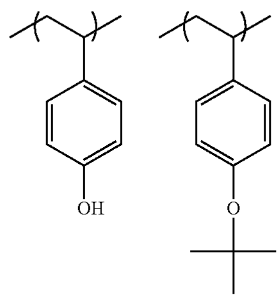
(Ab-121)
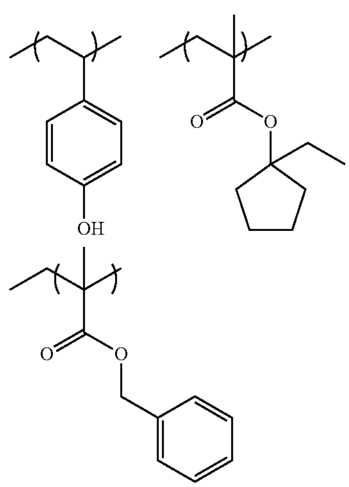

-continued
(Ab-122)
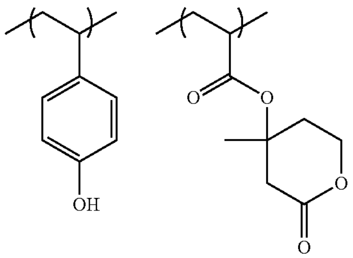
(Ab-123)
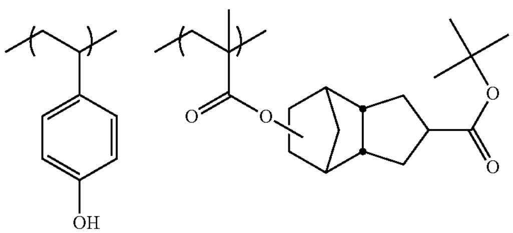
(Av-124)
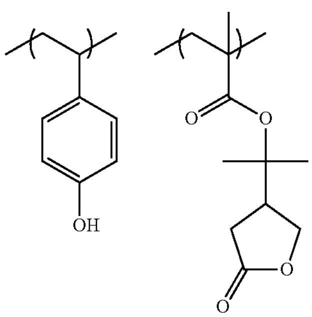
(Ab-125)
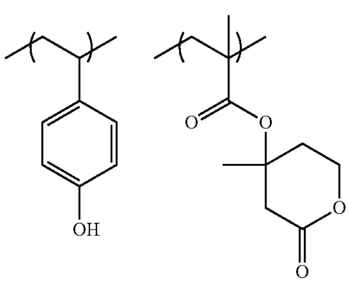
(Ab-126)
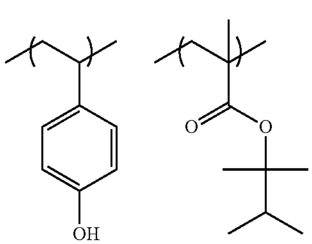
-continued
(Ab-127)
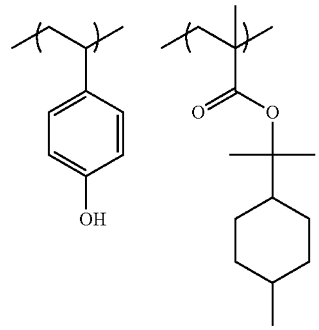
(Ab-128)
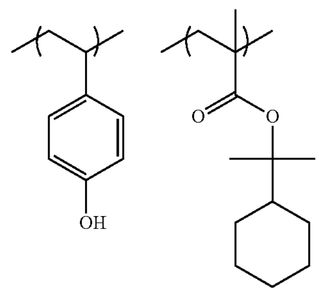
(Ab-129)
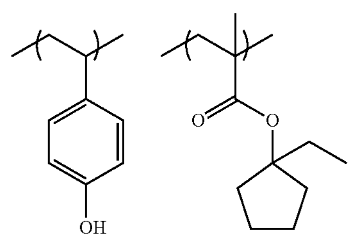
(Ab-130)
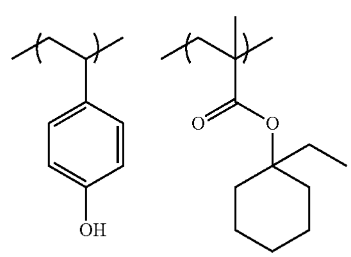
(Ab-131)
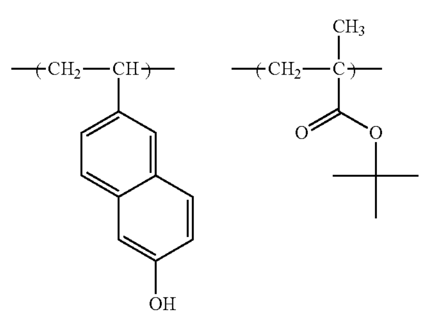

-continued
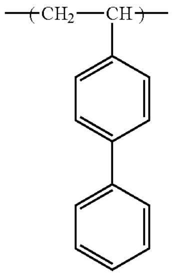
(Ab-132)
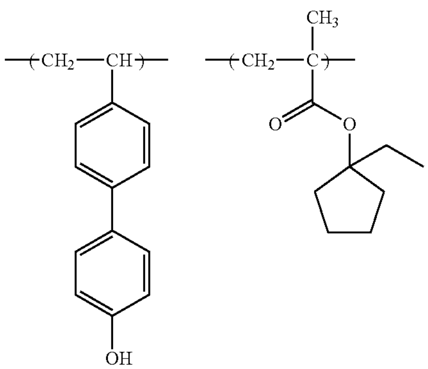
(Ab-133)
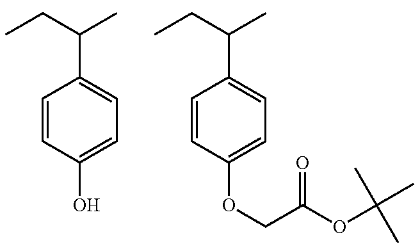
(Ab-134)
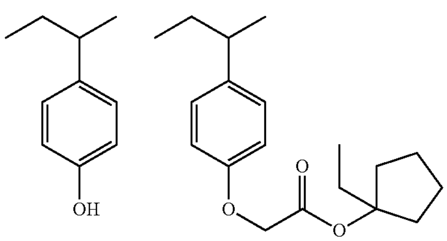
(Ab-135)
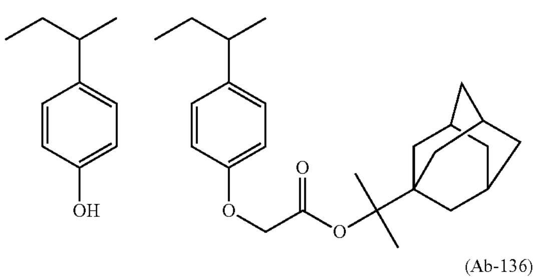
(Ab-136)
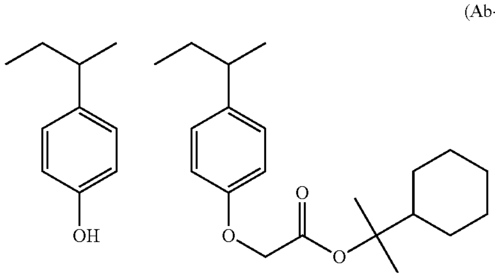
-continued
(Ab-137)
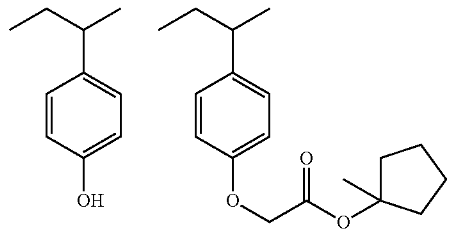
(Ab-138)
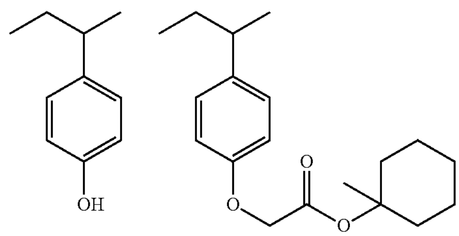
(Ab-139)
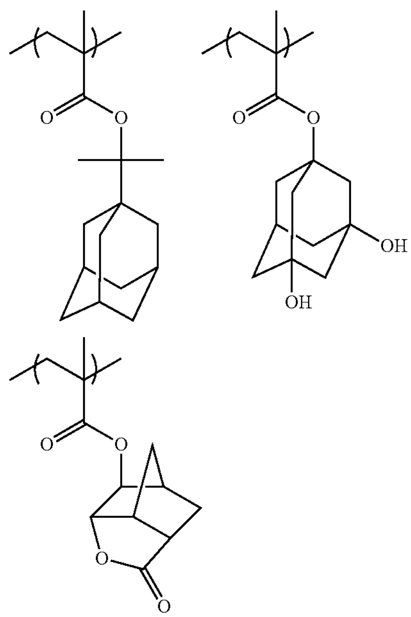
(Ab-140)
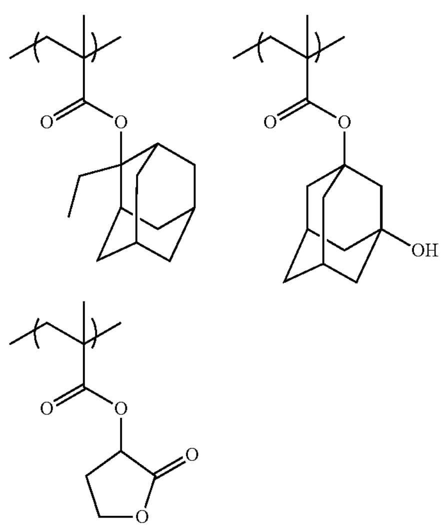

-continued
(Ab-141)
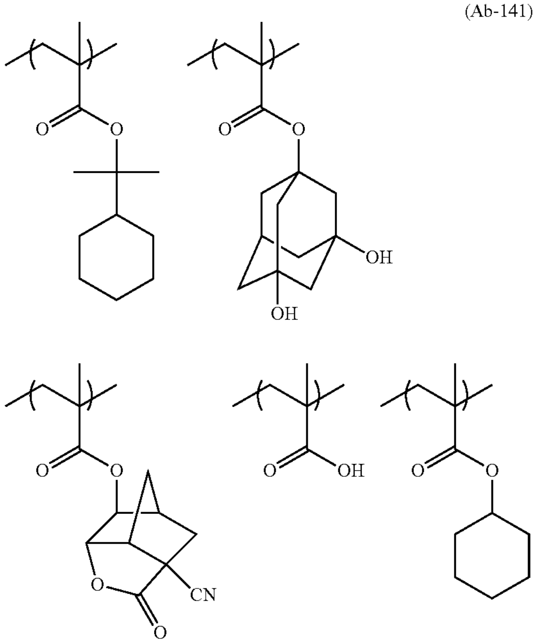
(Ab-142)
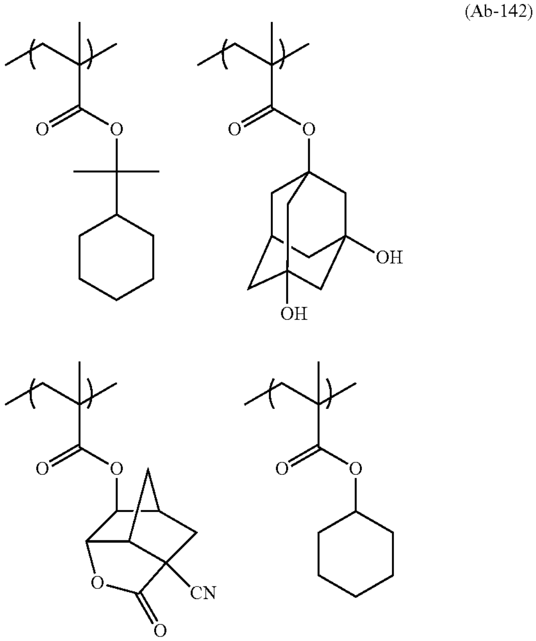
(Ab-143)
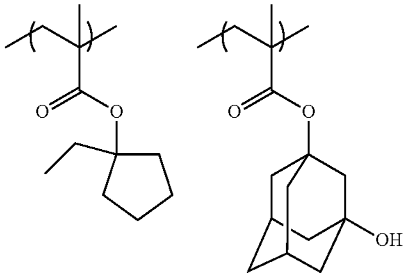
-continued
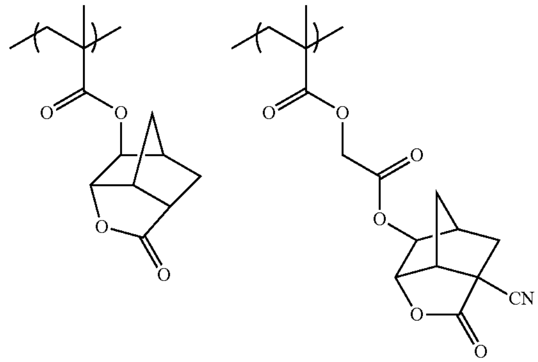
(Ab-144)
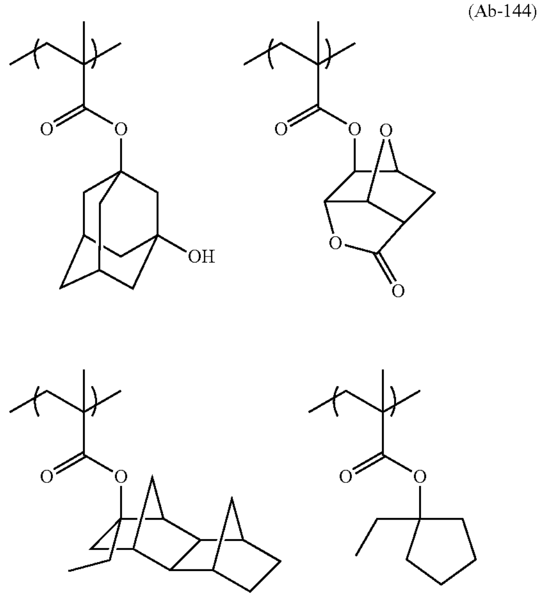
(Ab-145
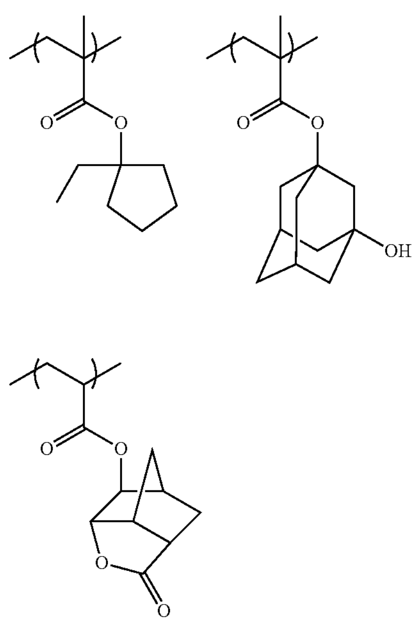

(Ab-146)
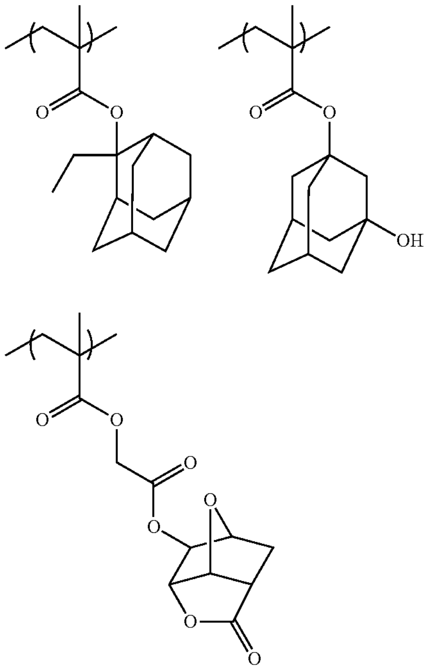
(Ab-147)
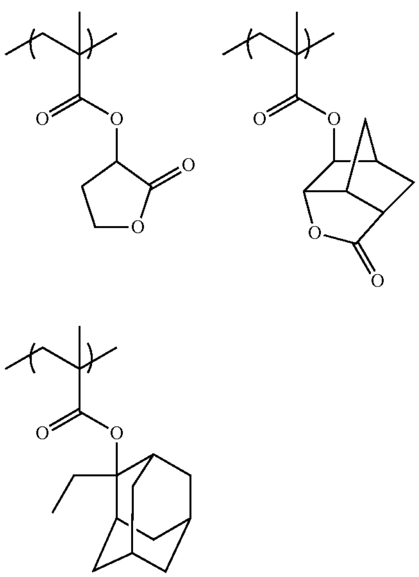
(Ab-148)
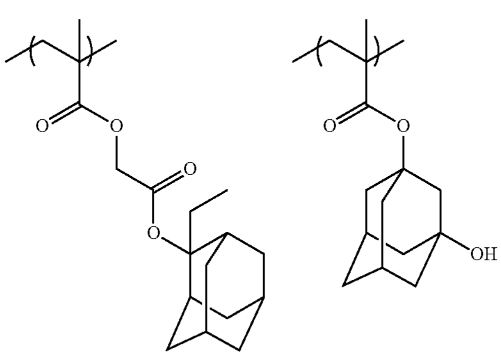
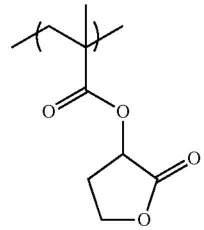
(Ab-149)
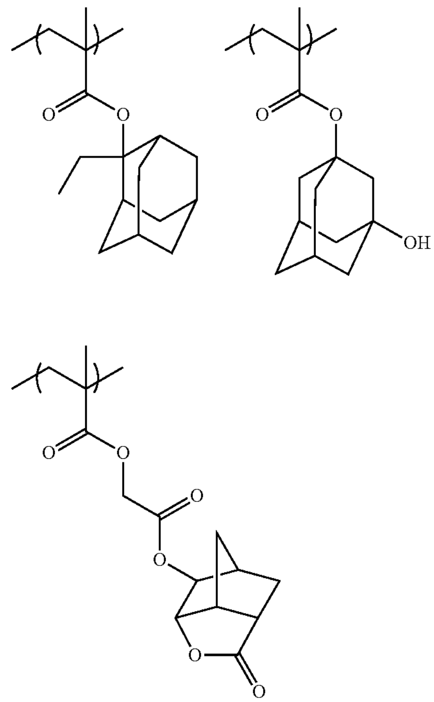
(Ab-150)
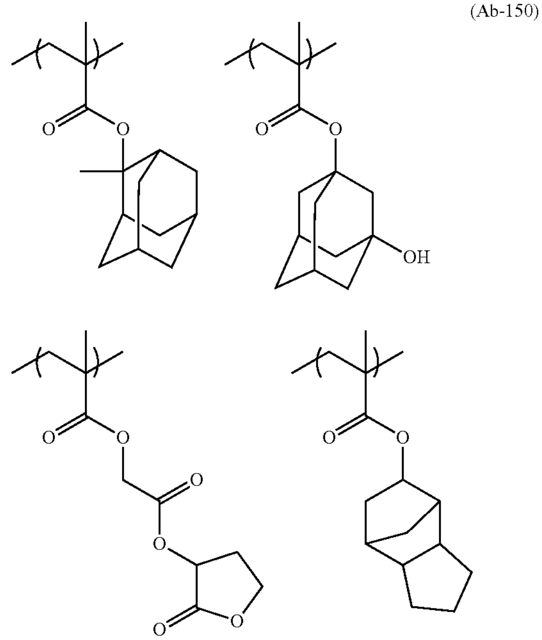

(Ab-151)
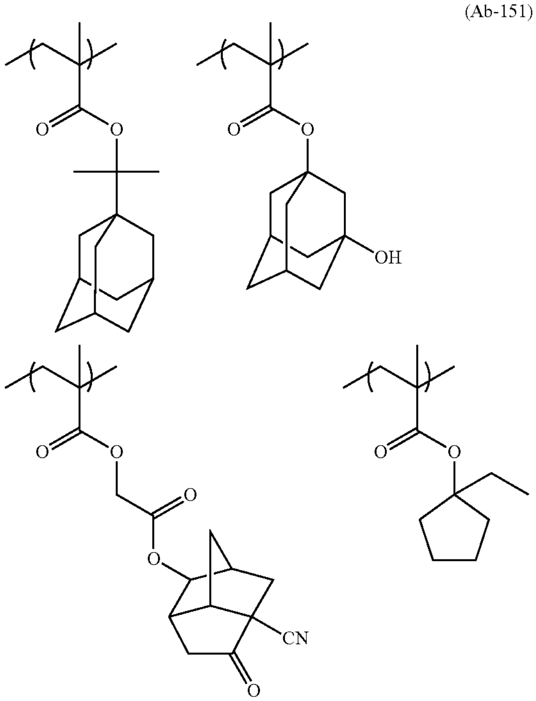
(Ab-152)
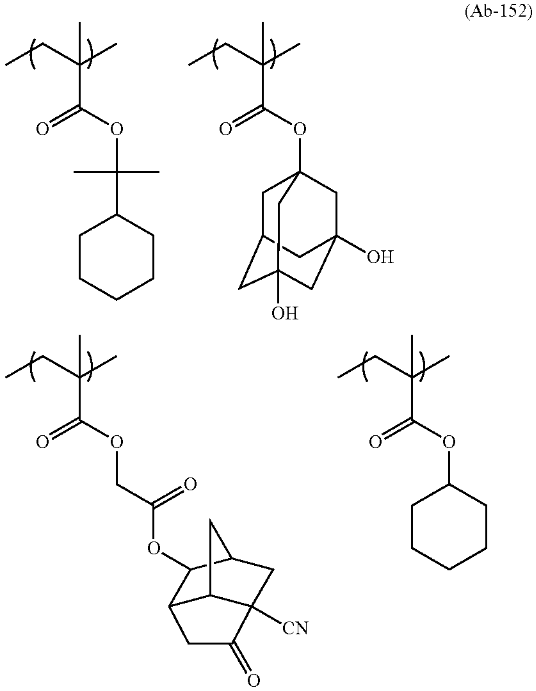
(Ab-153)
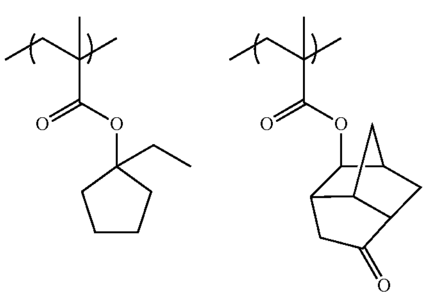
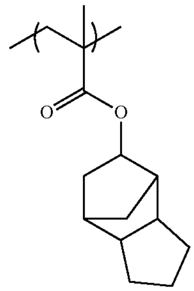
(Ab-154)
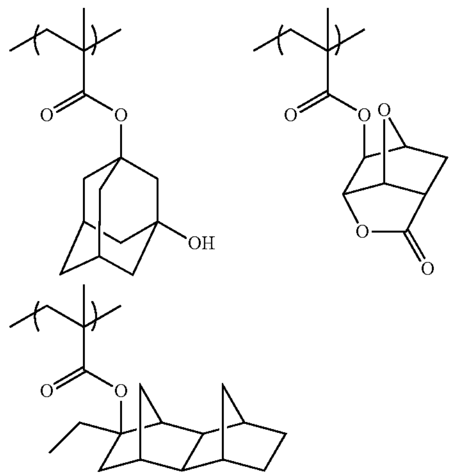
(Ab-155)
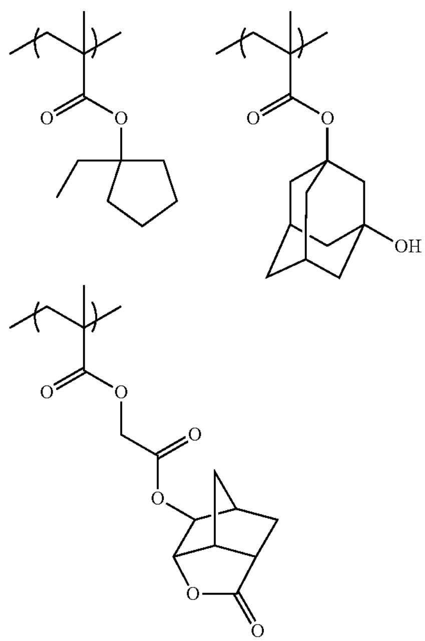
(Ab-156)
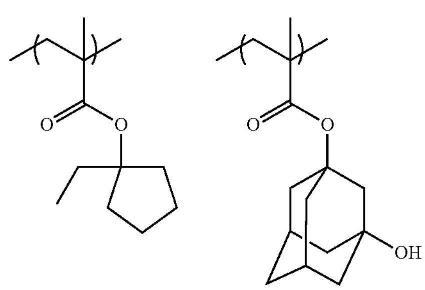

-continued
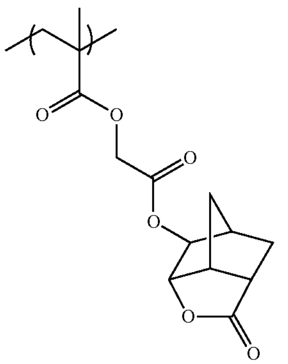
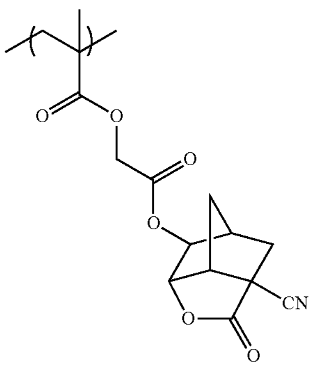
(Ab-157)
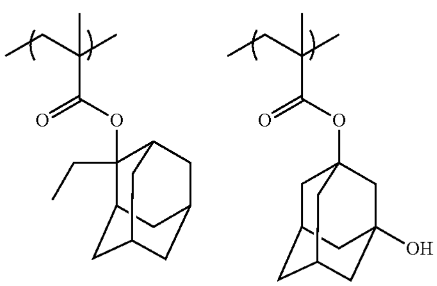
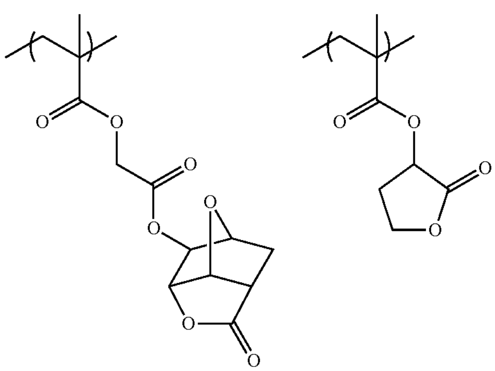
(Ab-158)
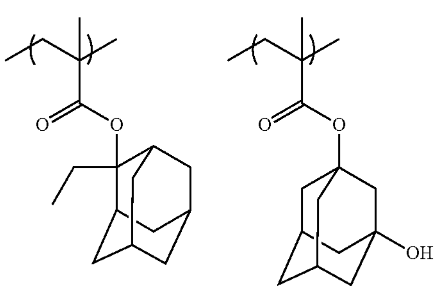
-continued
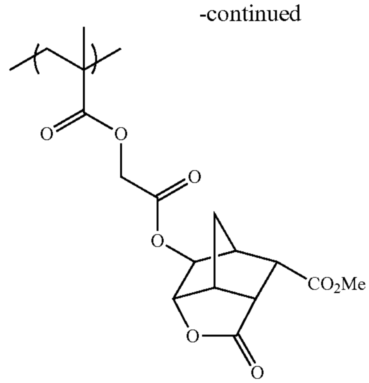
(Ab-159)
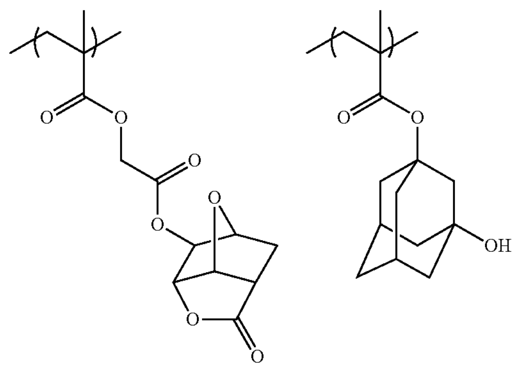
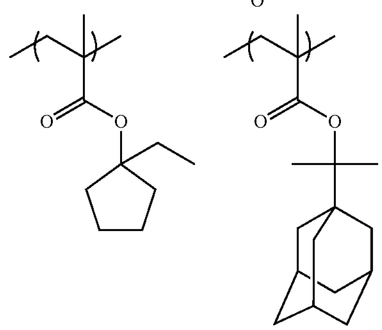
(Ab-160)
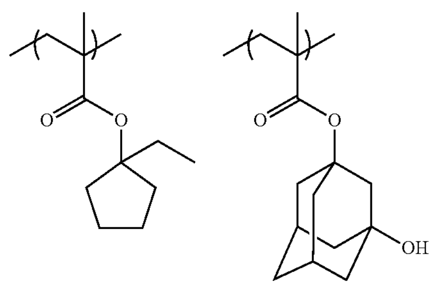
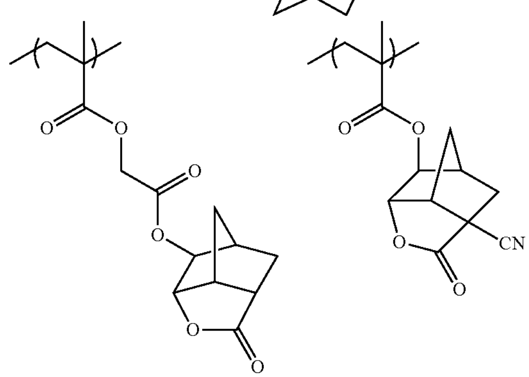

-continued
(Ab-161)
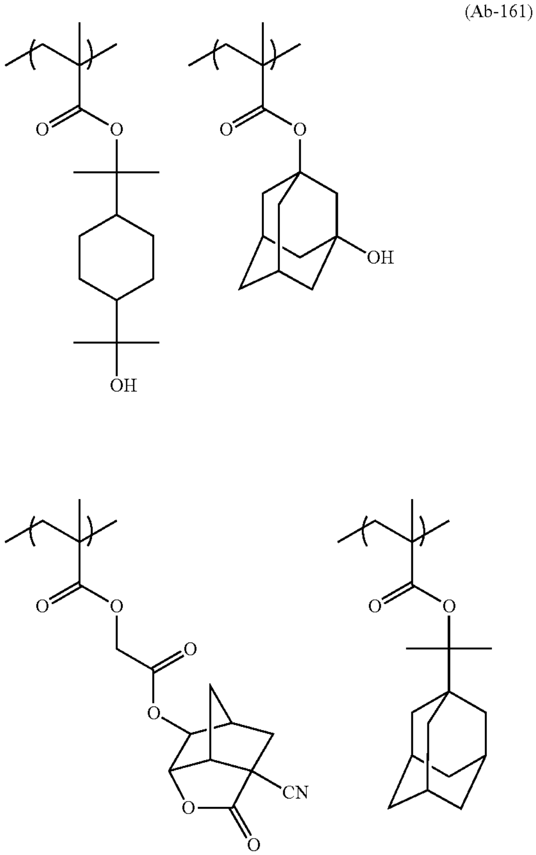
(Ab-162)
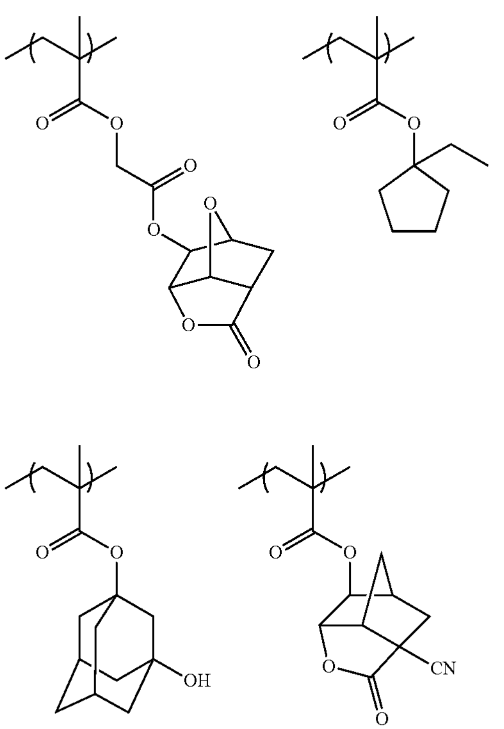
-continued
(Ab-163)
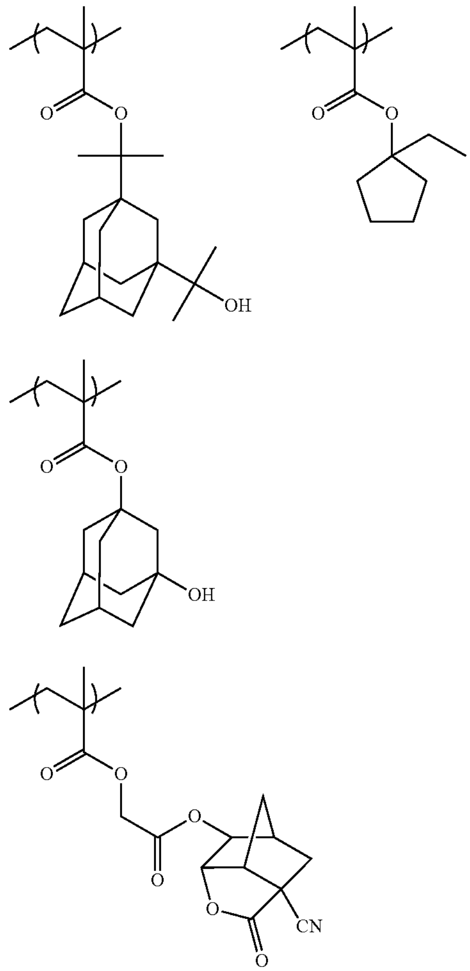
(Ab-164)
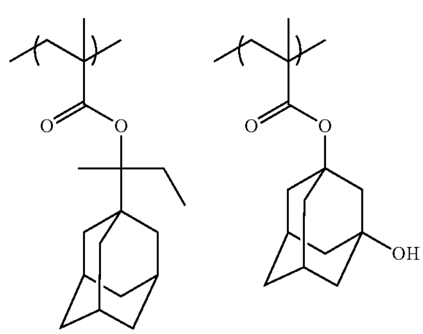

-continued
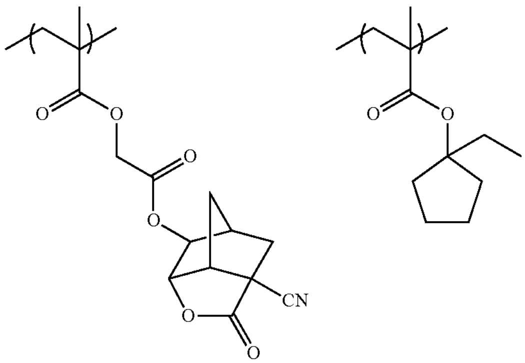
(Ab-165)
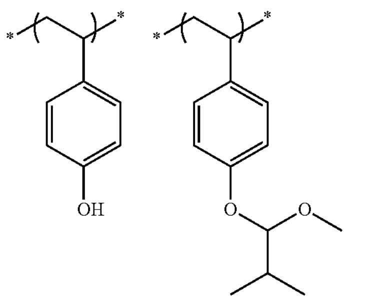
(Ab-166)
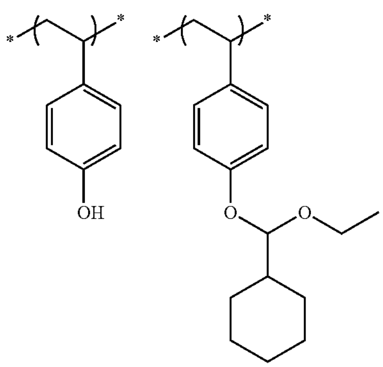
(Ab-167)
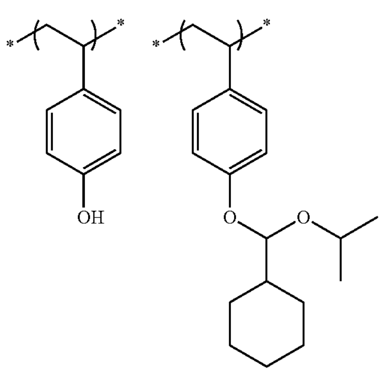
-continued
(Ab-168)
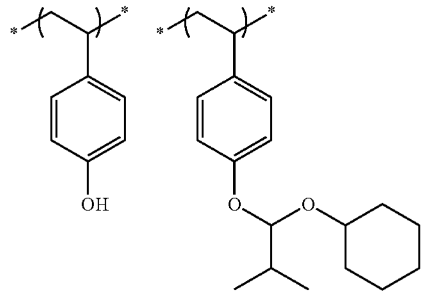
(Ab-169)
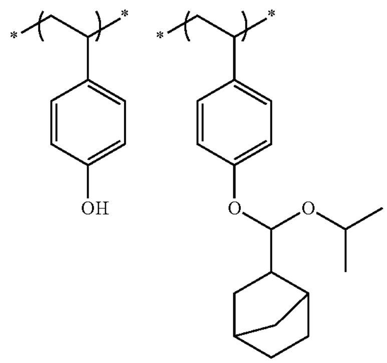
(Ab-170)
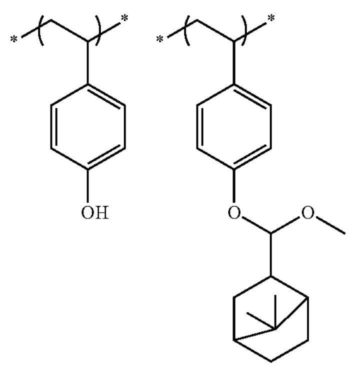
(Ab-171)
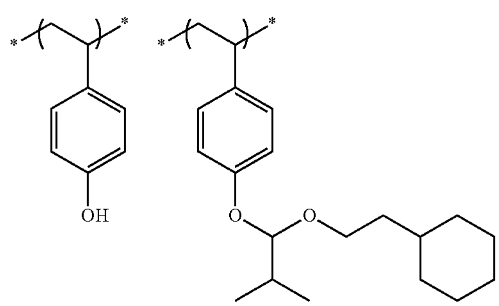

-continued
(Ab-172)
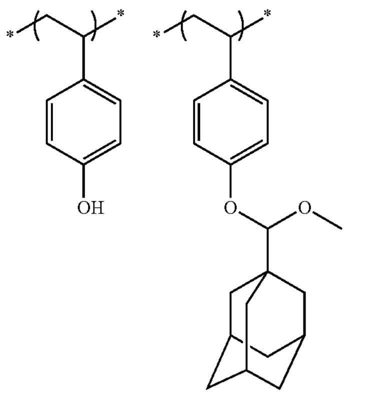
(Ab-173)
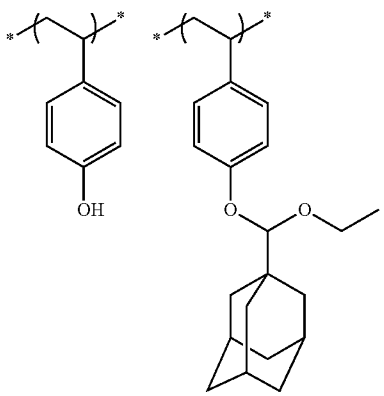
(Ab-174)
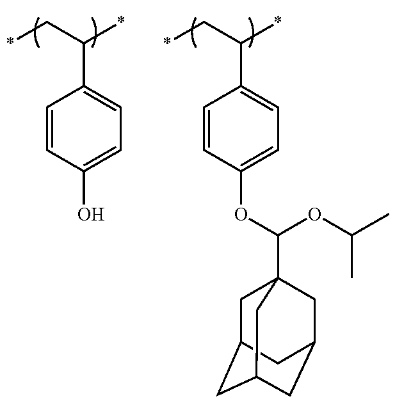
(Ab-175)
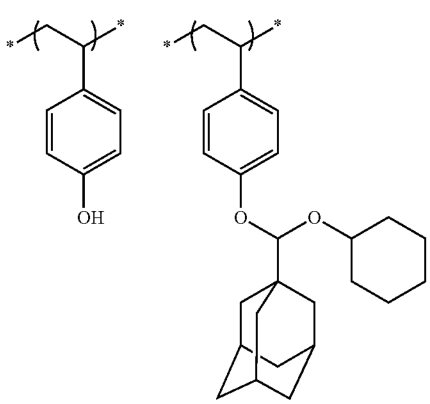
-continued
(Ab-176)
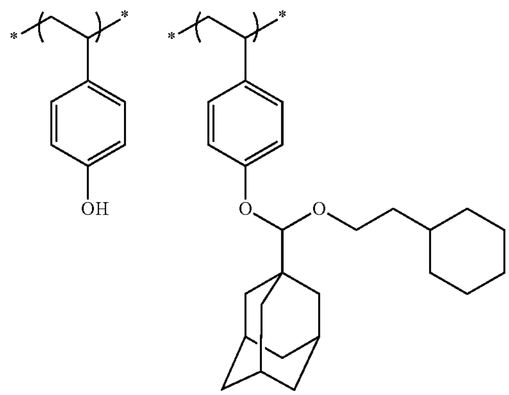
Ab-177
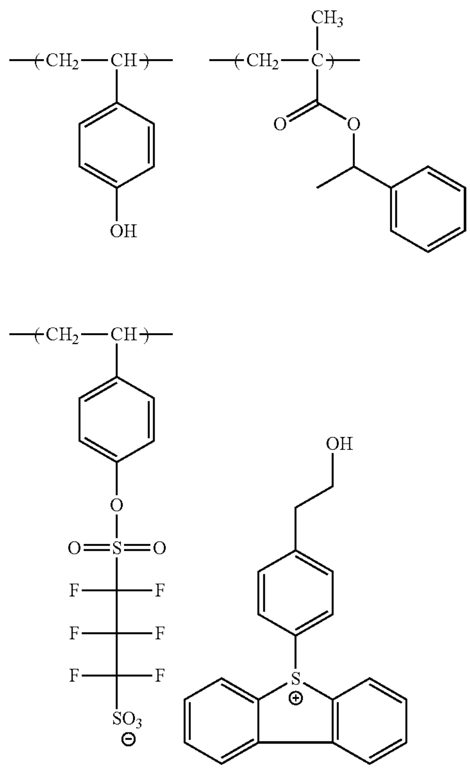
Ab-178
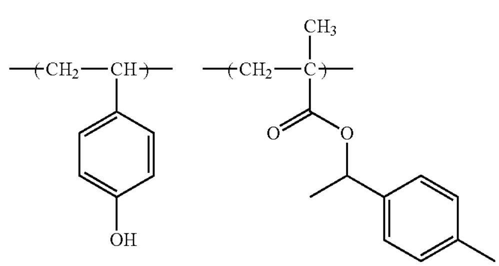

-continued
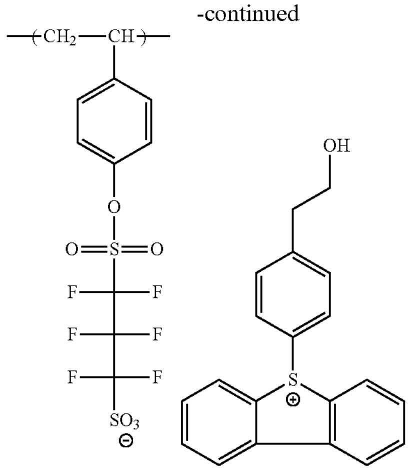
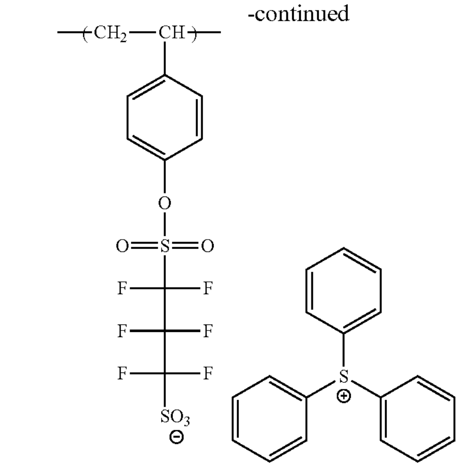
Ab-179
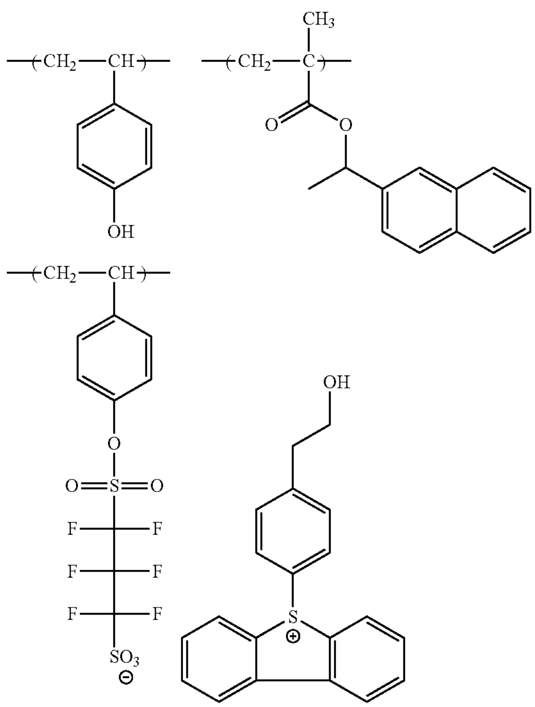
Ab-180
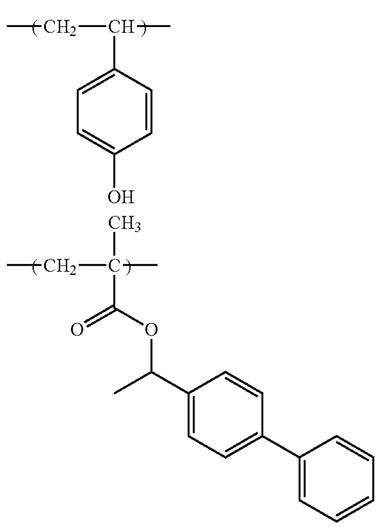
-continued
Ab-181
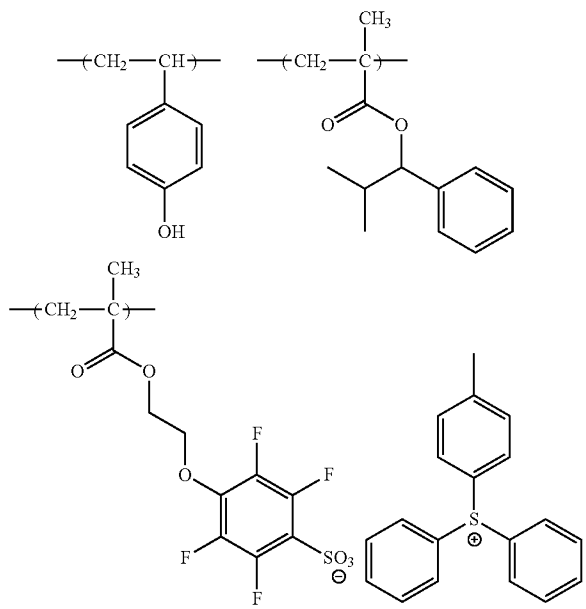
Ab-182
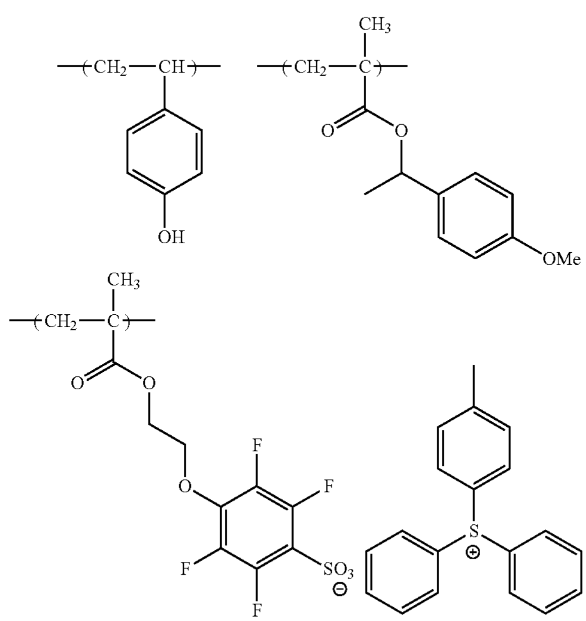

-continued
Ab-183
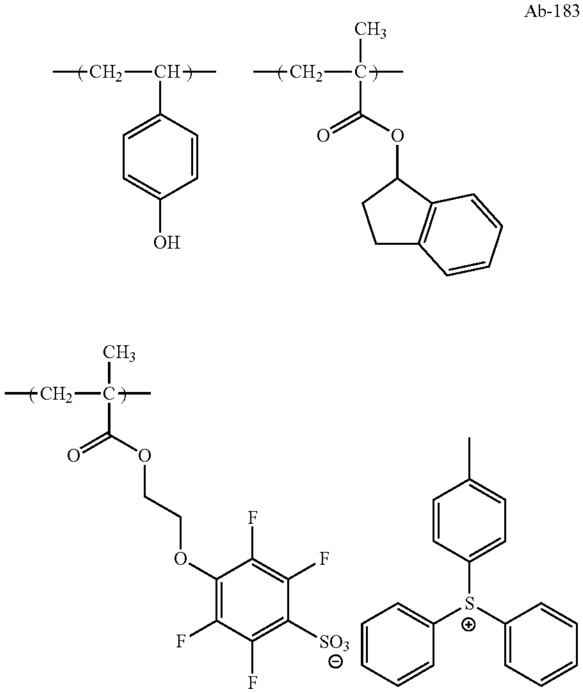
Ab-184
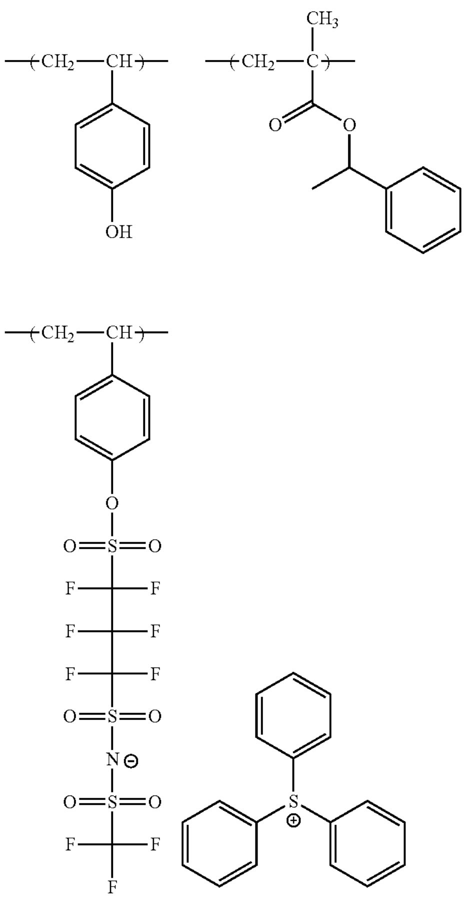
-continued
Ab-185
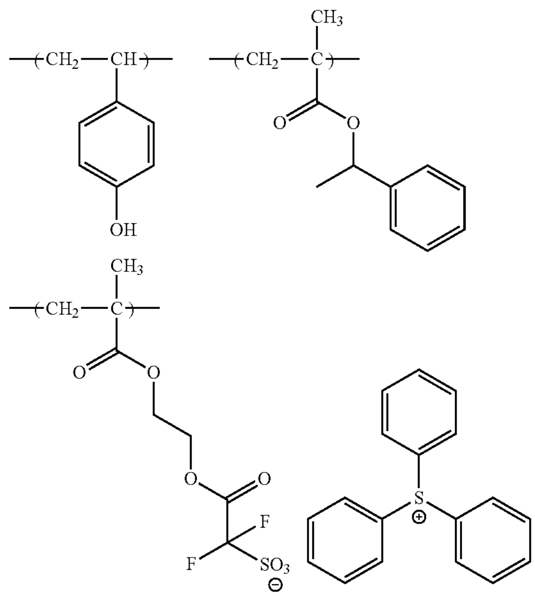
Ab-186
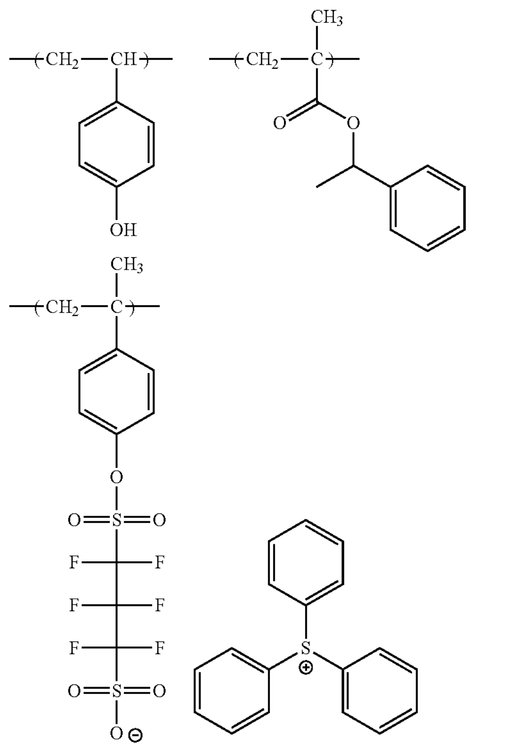
Ab-187
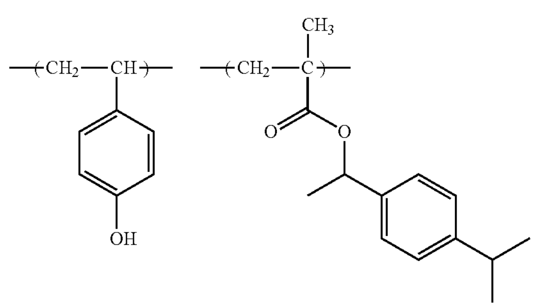

-continued
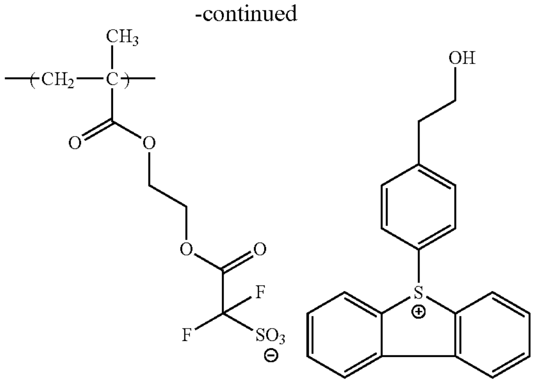
Ab-188
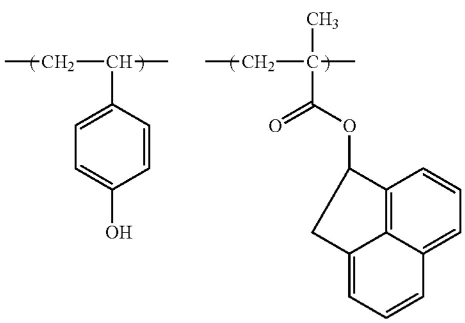
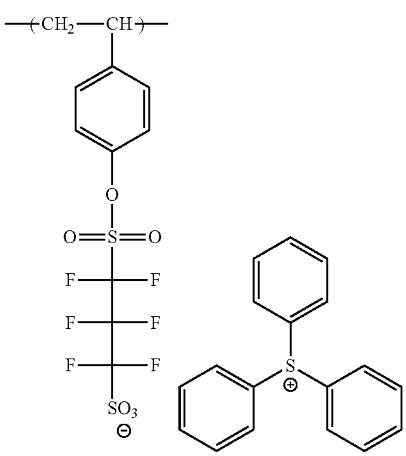
Ab-189
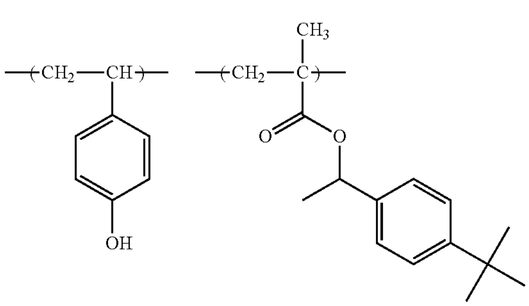
-continued
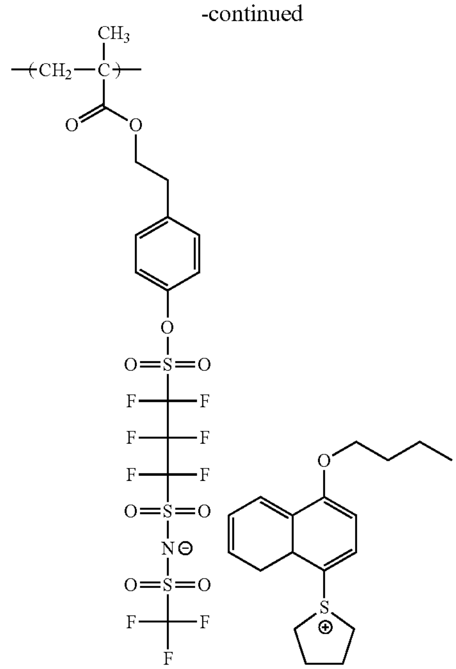
Ab-190
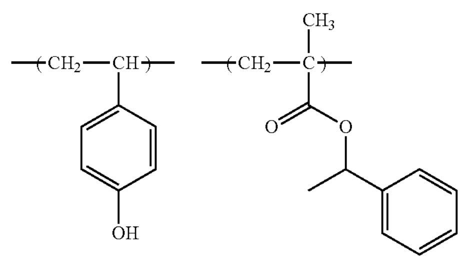
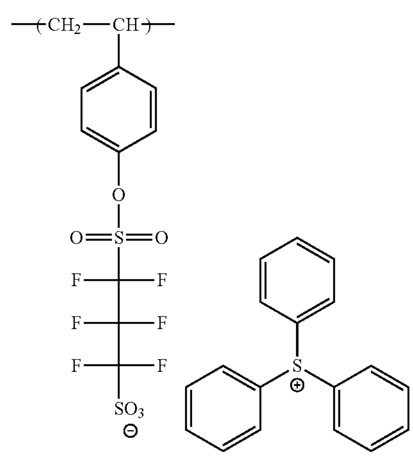
Ab-191
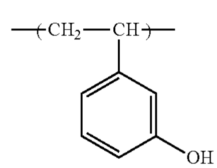

-continued
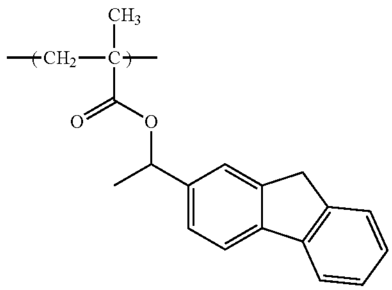
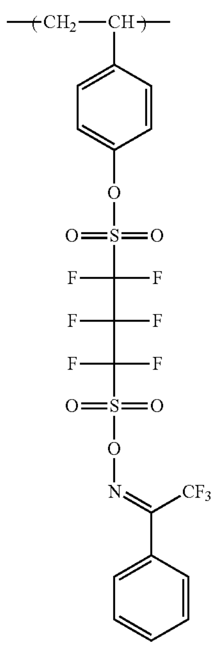
Ab-192
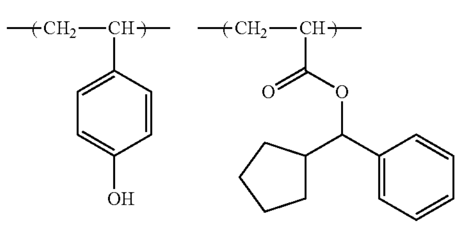
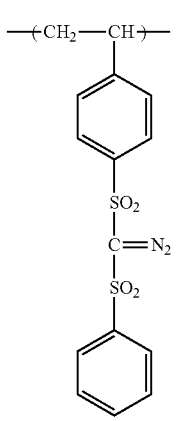
-continued
Ab-193
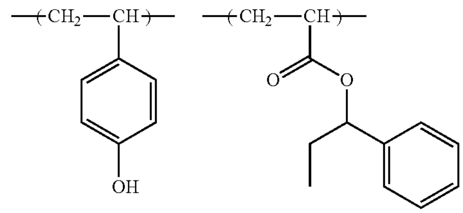
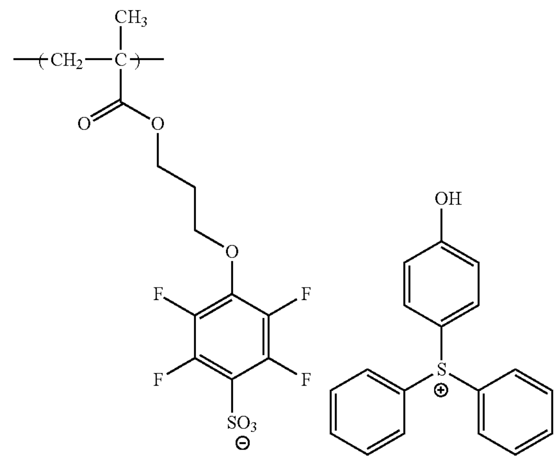
Ab-194
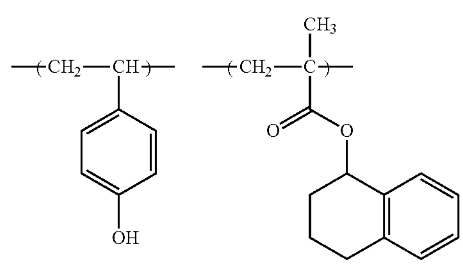
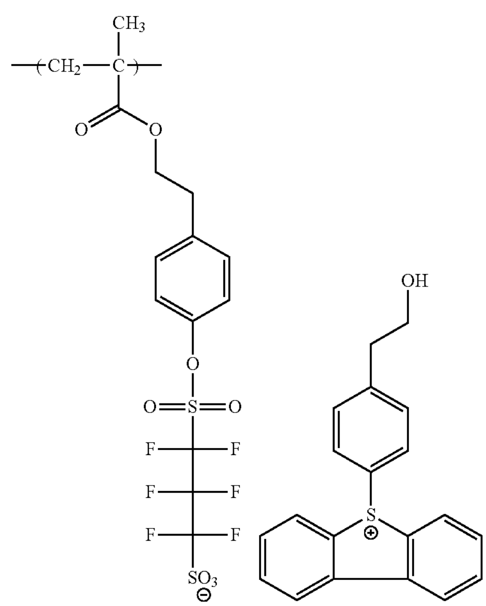

Ab-195
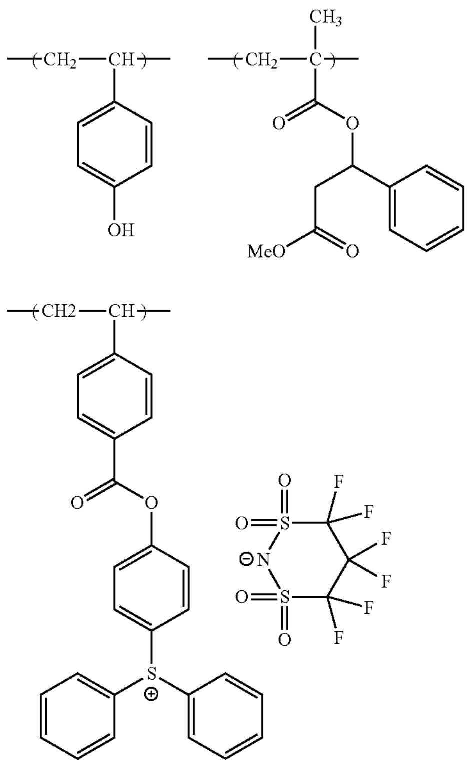
Ab-196
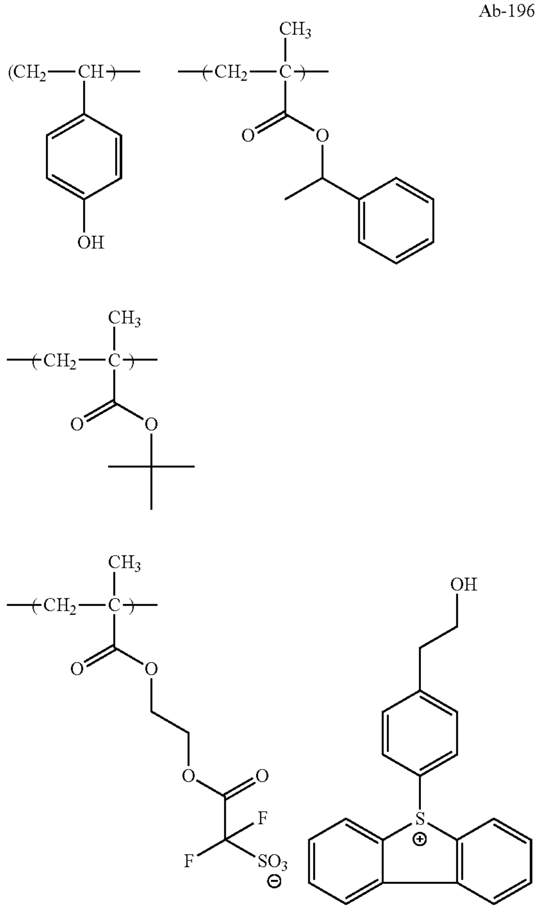
Ab-197
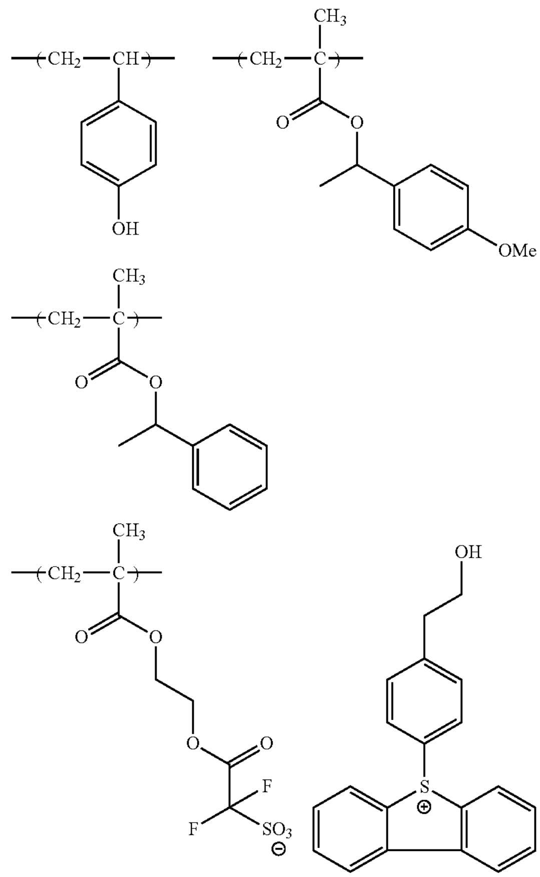
Ab-198
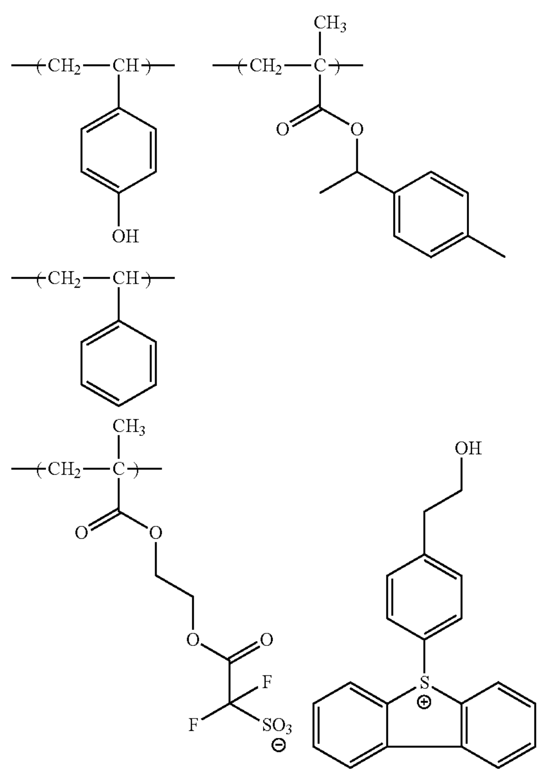

-continued
Ab-199
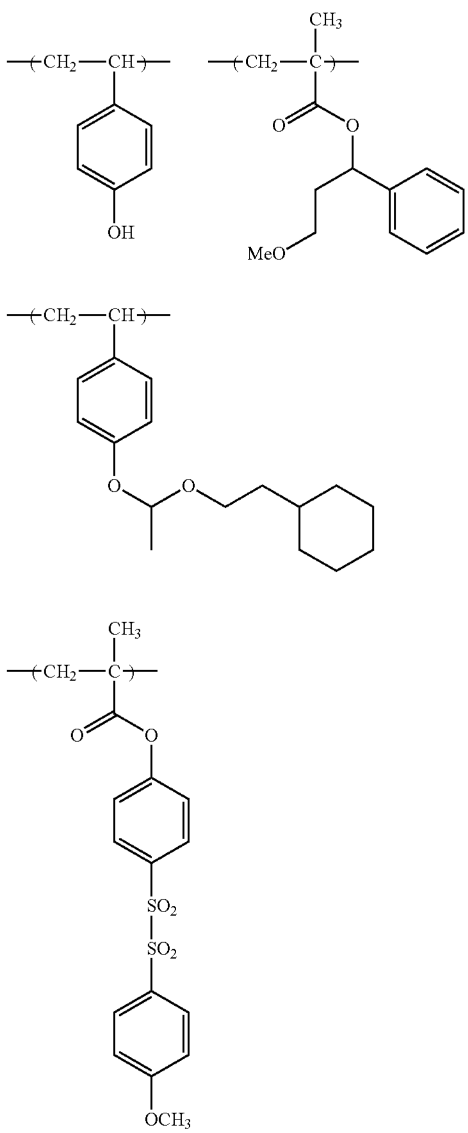
Ab-200
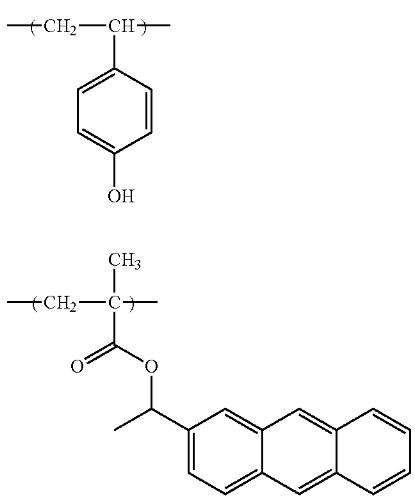
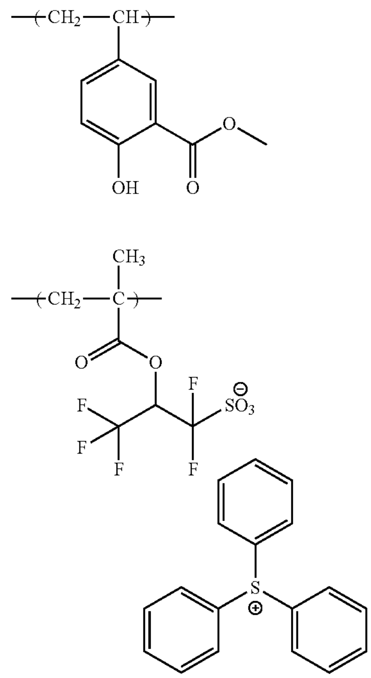
Ab-201
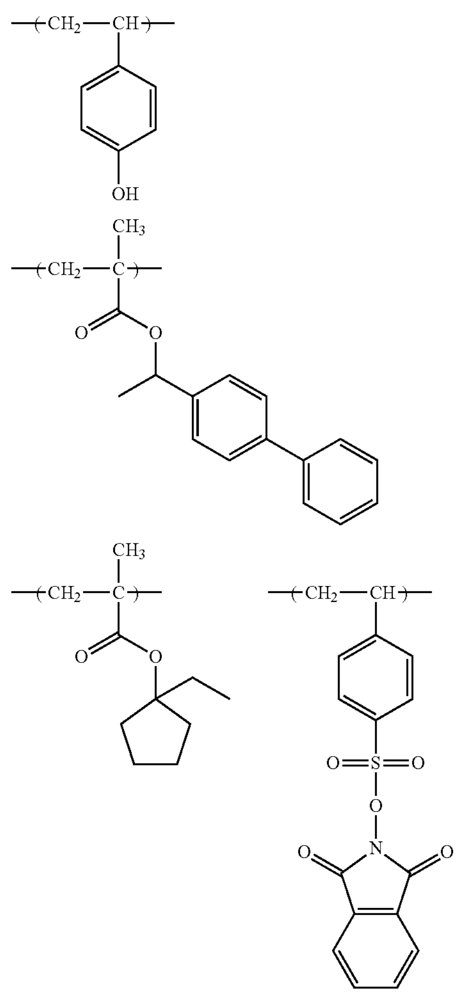

-continued
Ab-202
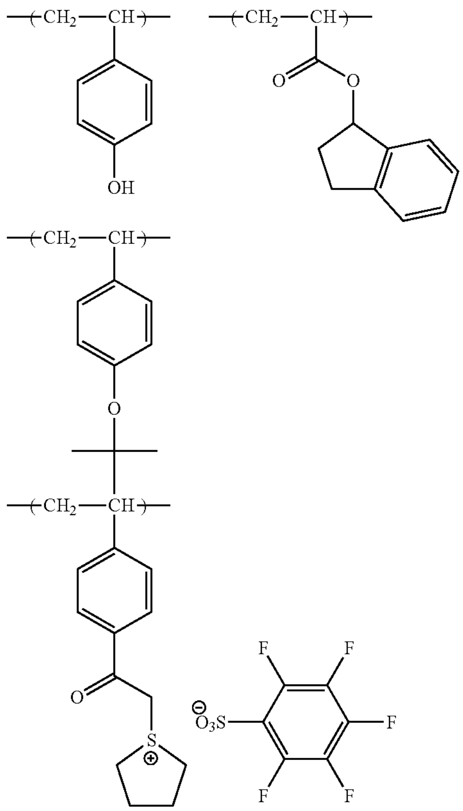
Ab-203
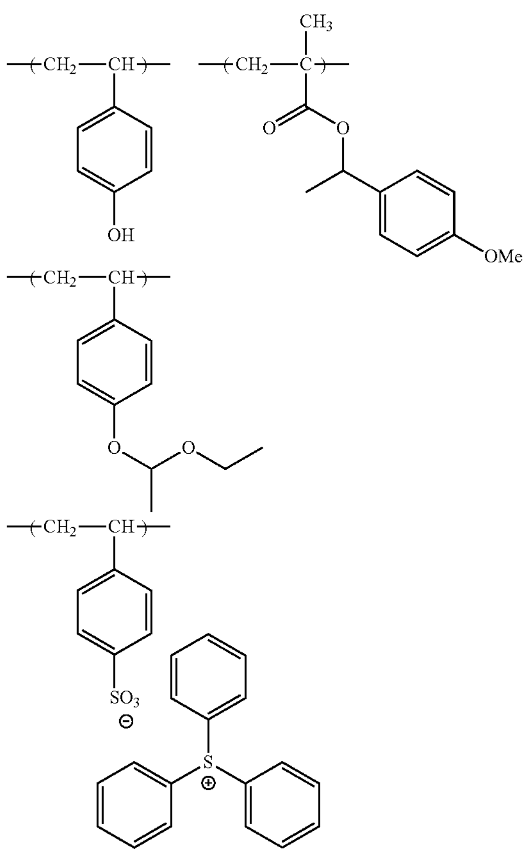
-continued
Ab-204
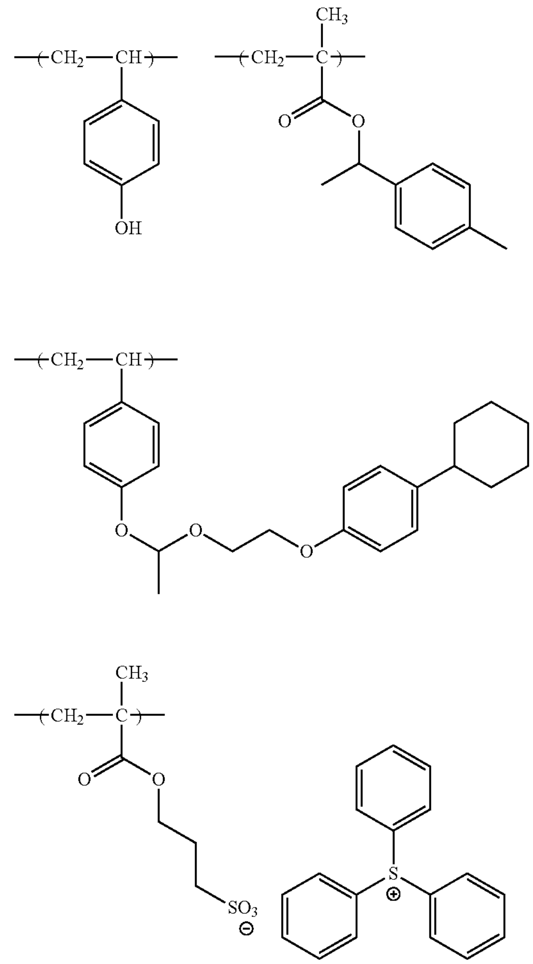
Ab-205
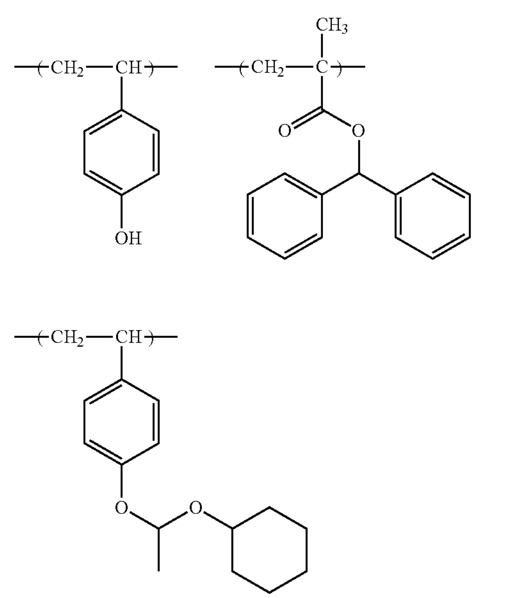

-continued
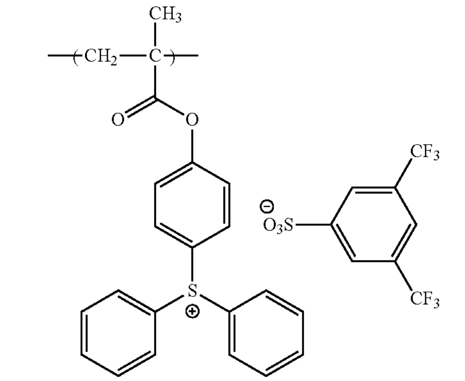
Ab-206
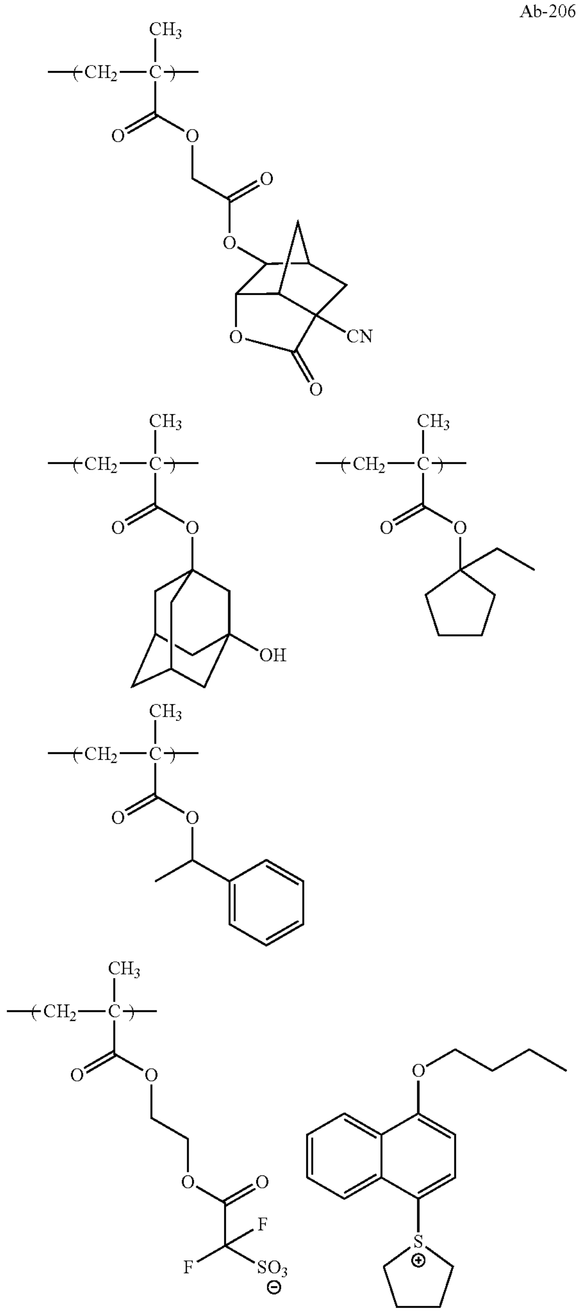
-continued
Ab-207
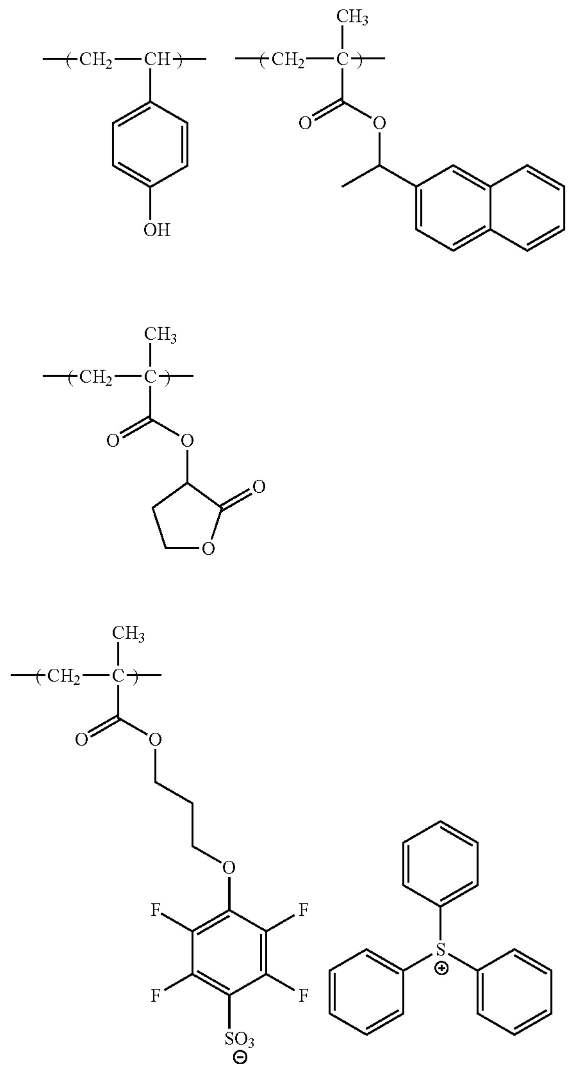
Ab-208
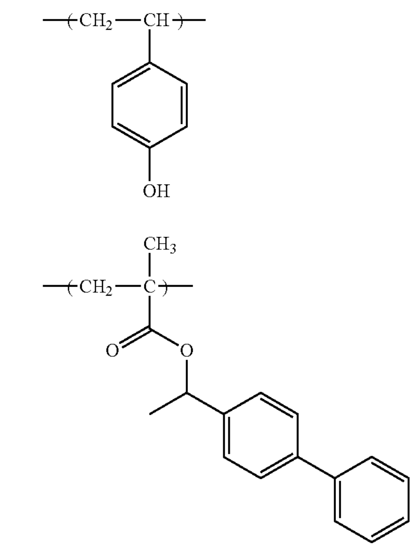

-continued
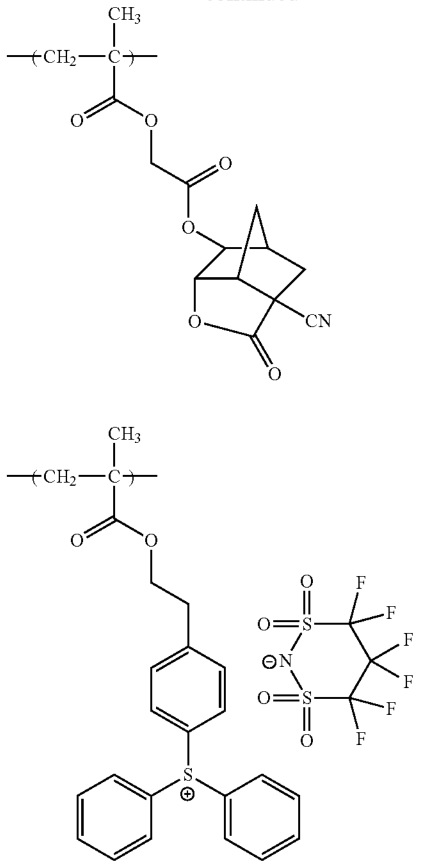
Ab-209
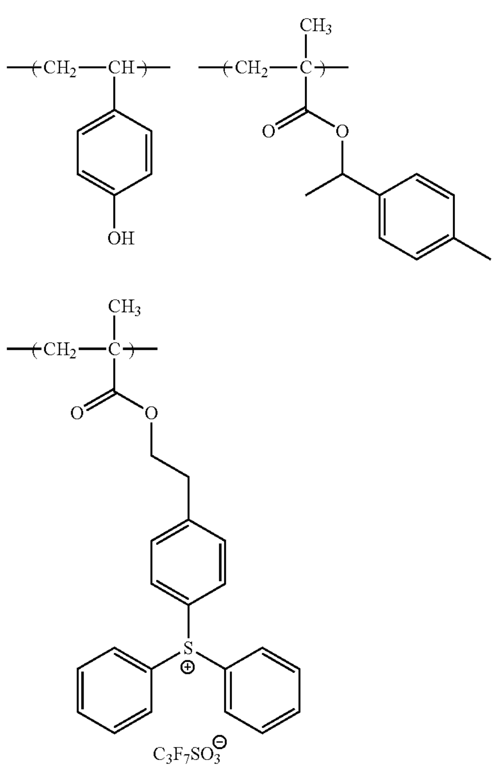
-continued
Ab-210
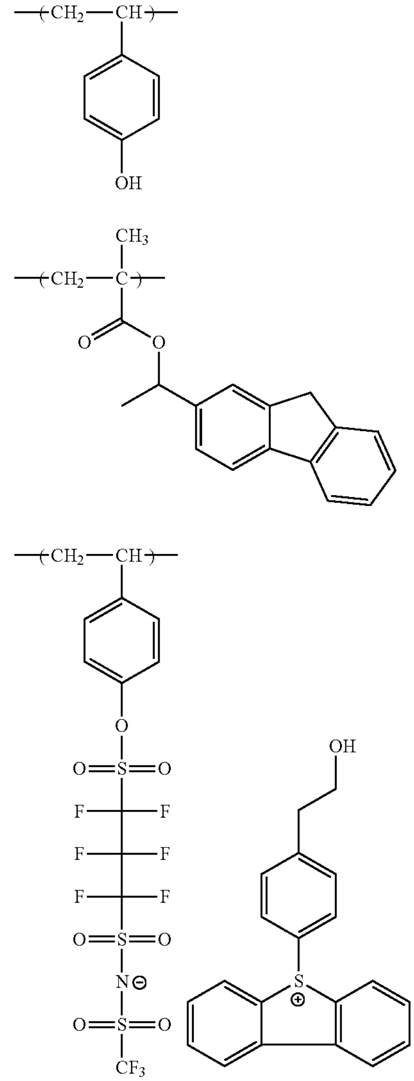
Ab-211
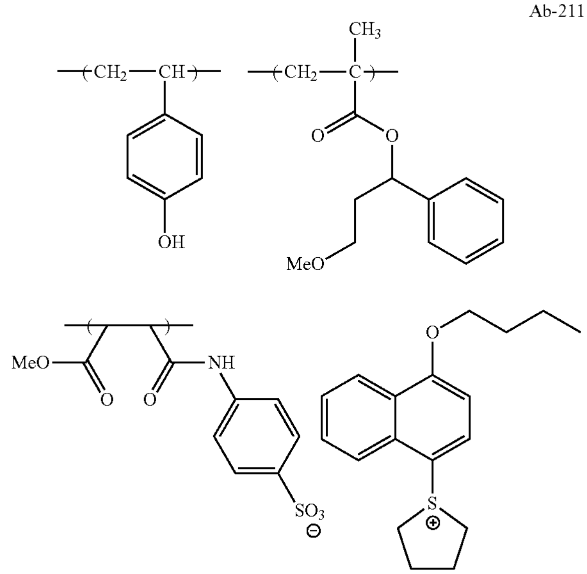

-continued
Ab-212
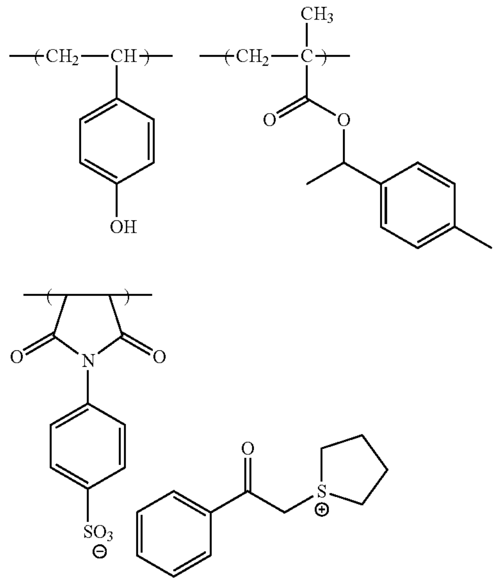
Ab-213
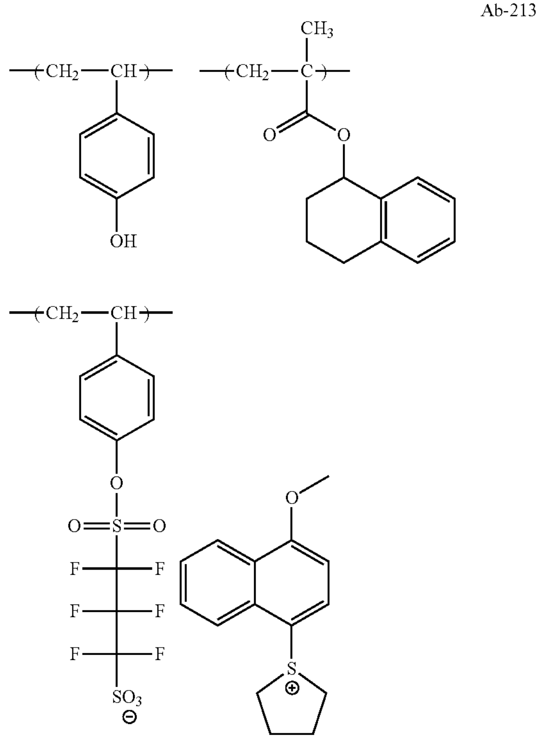
Ab-214
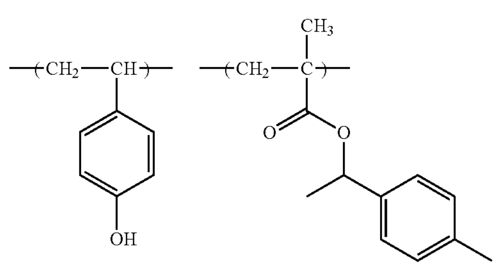
-continued
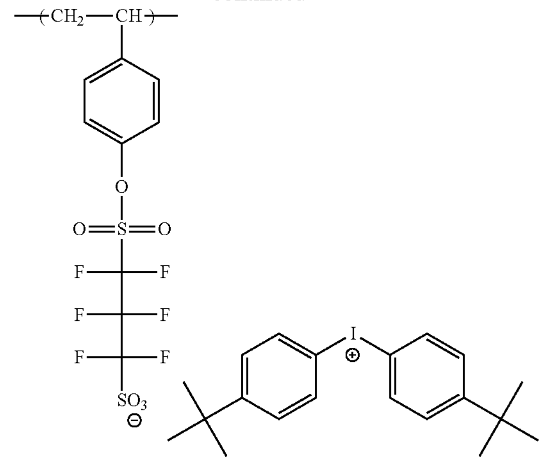
Ab-215
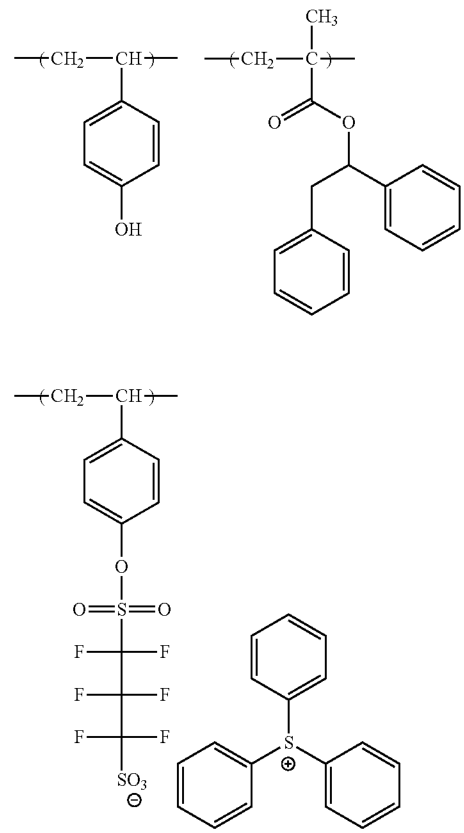
Ab-216
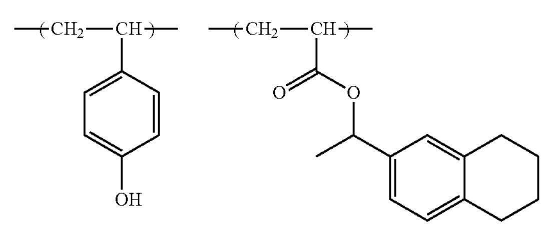

-continued
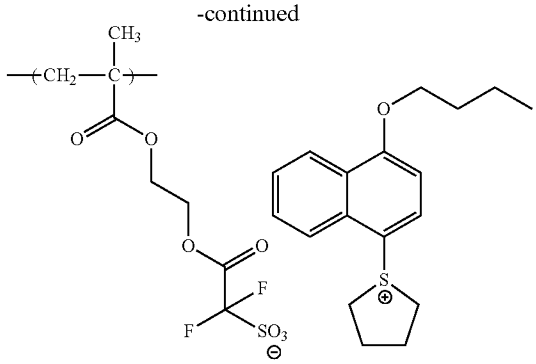
Ab-217
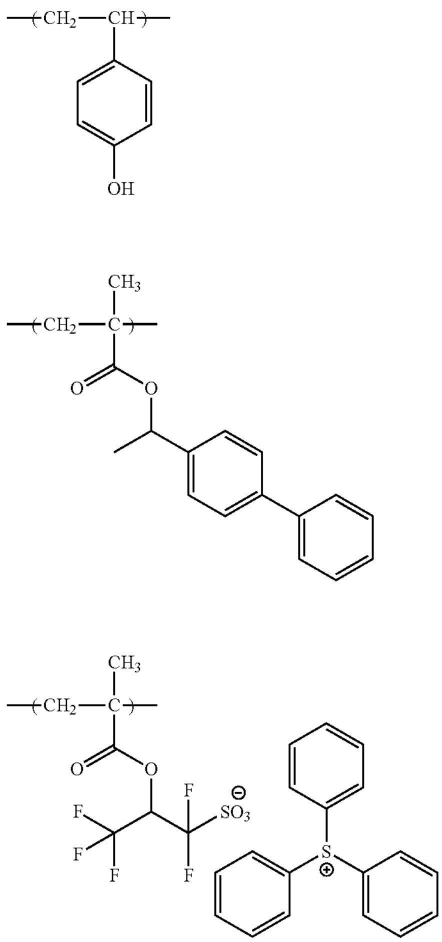
Ab-218
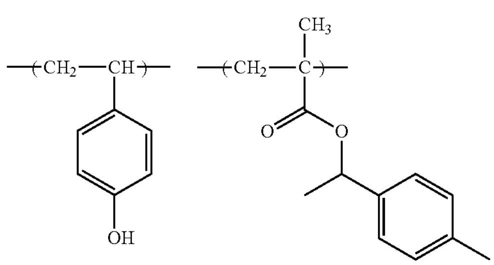
-continued
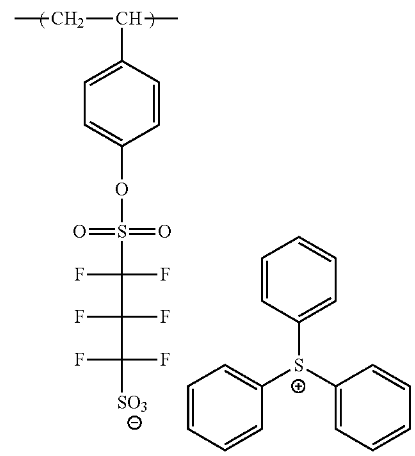
Ab-219
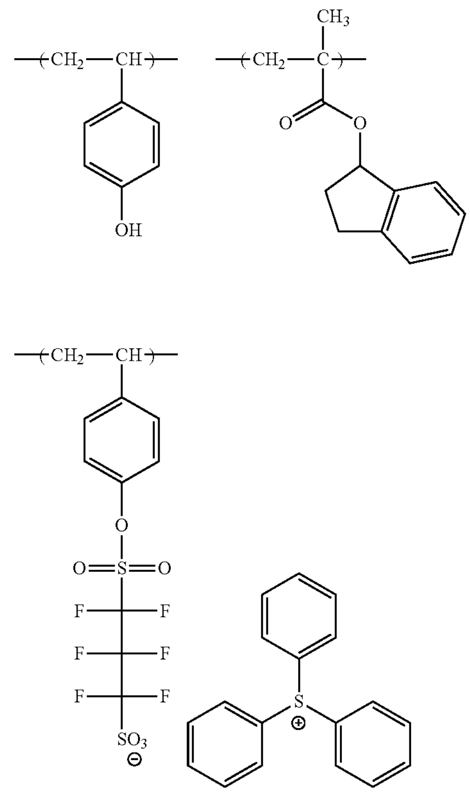
Ab-220
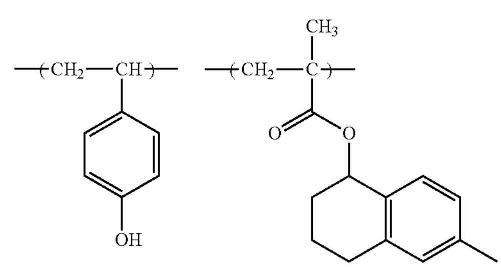

-continued
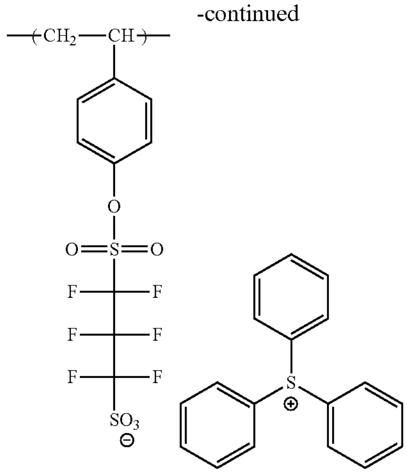
Ab-221
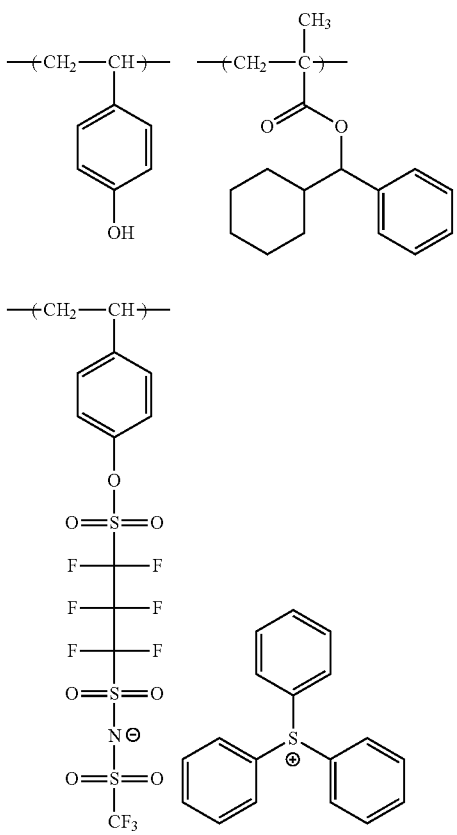
Ab-222
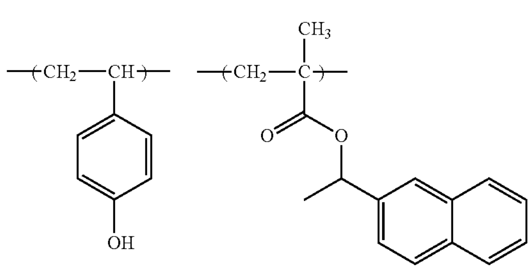
-continued
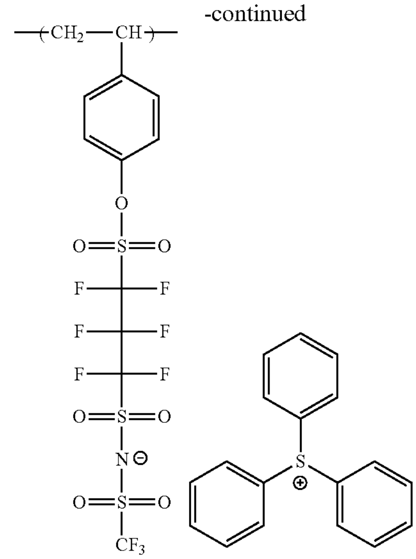
Ab-223
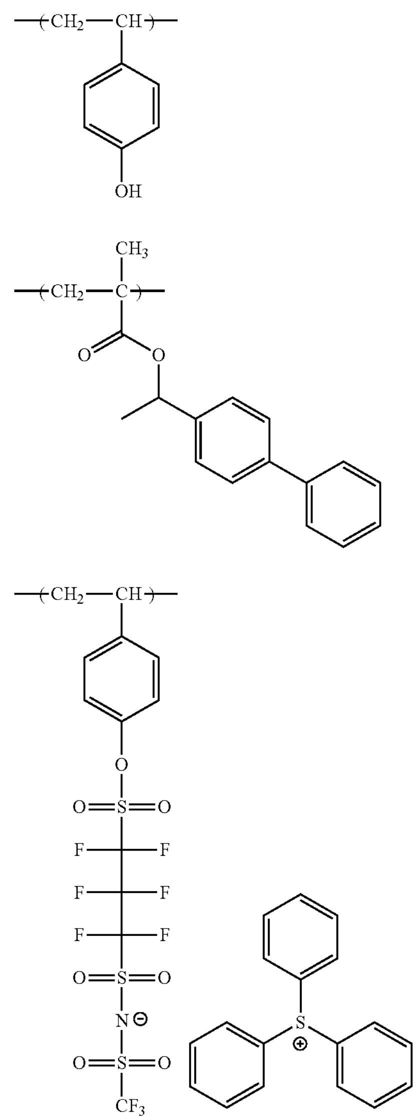

-continued
Ab-224
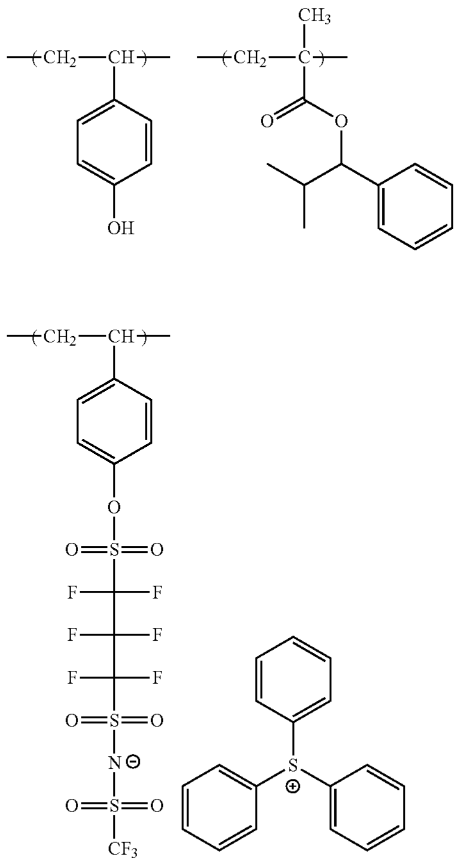
Ab-225
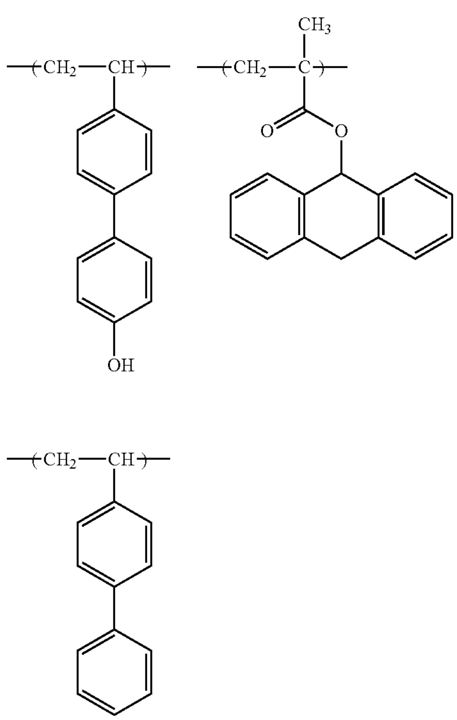
-continued
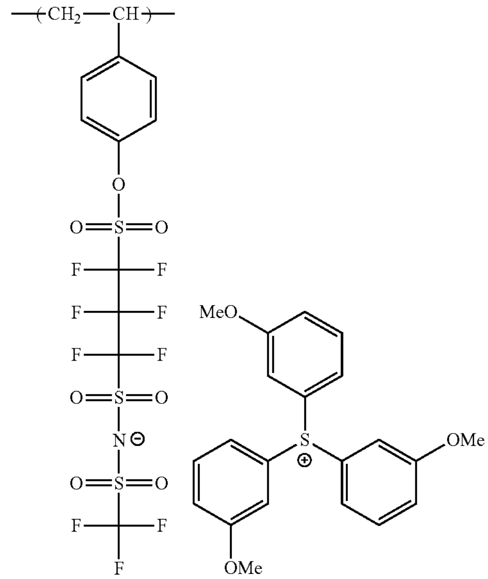
Ab-226
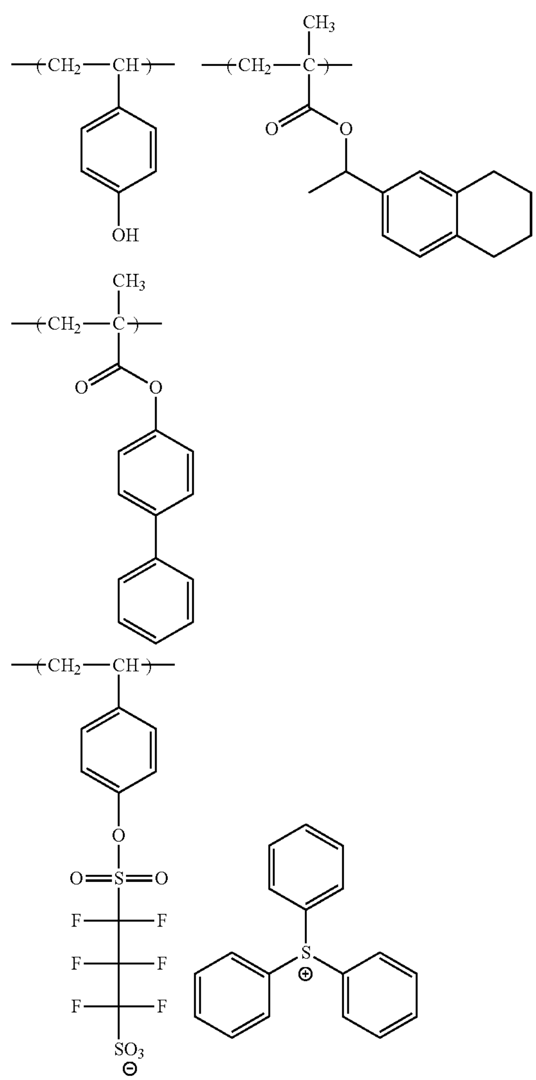

-continued
Ab-227
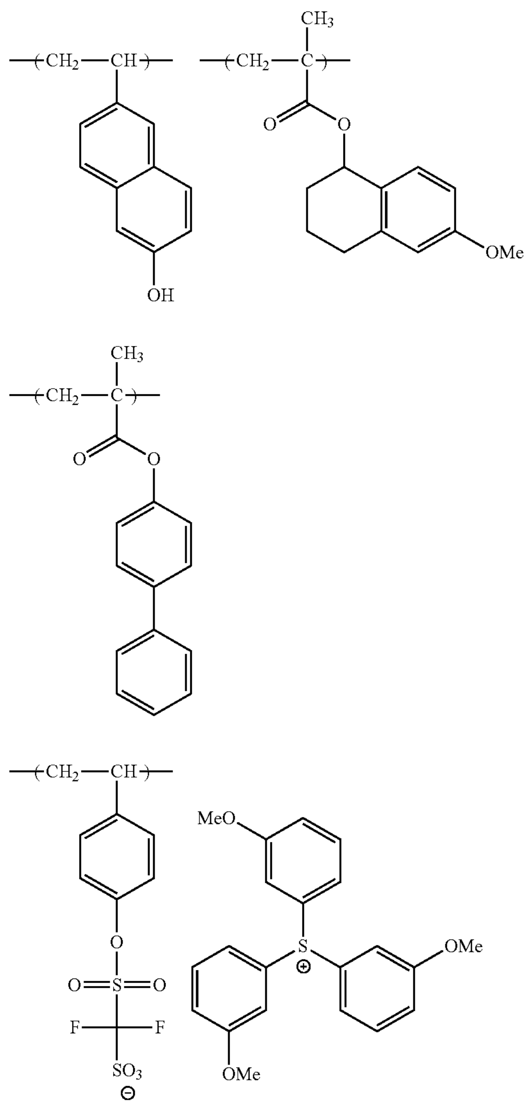
Ab-228
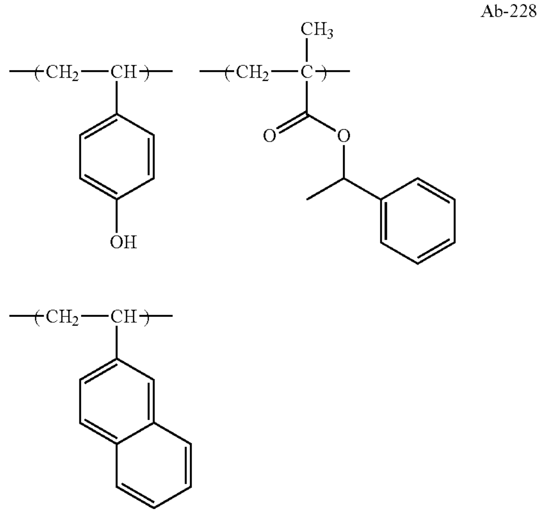
-continued
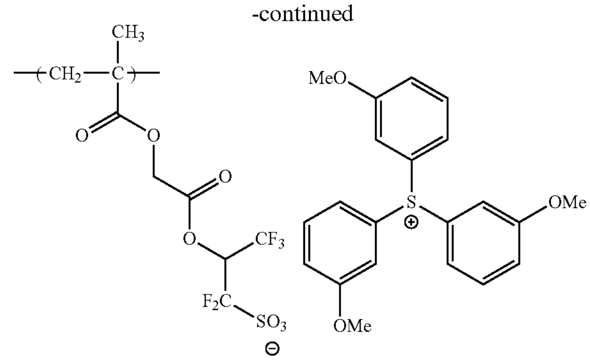
Ab-229
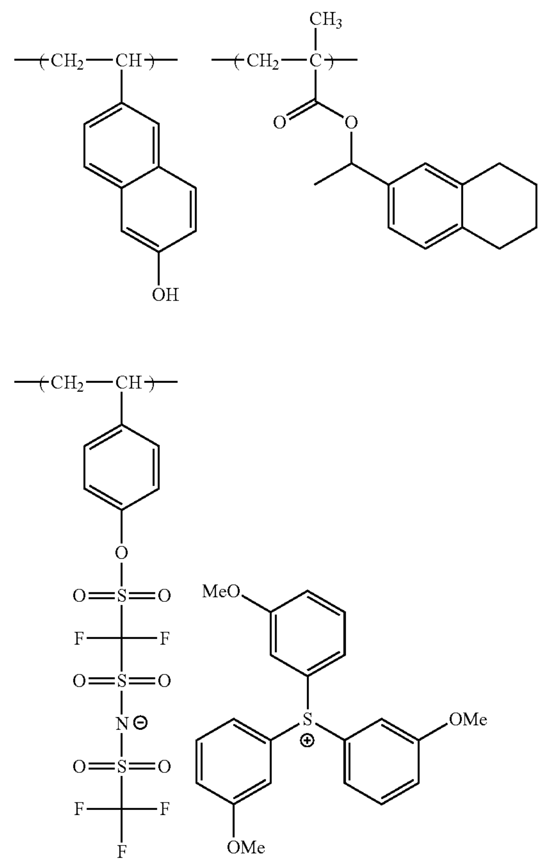
Ab-230
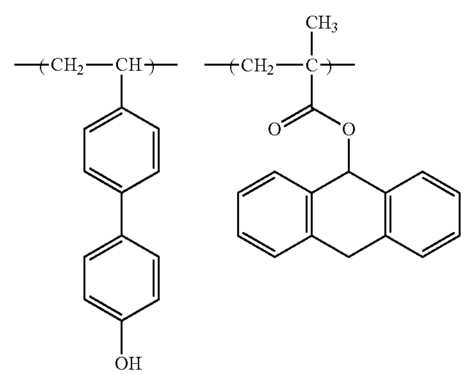

-continued
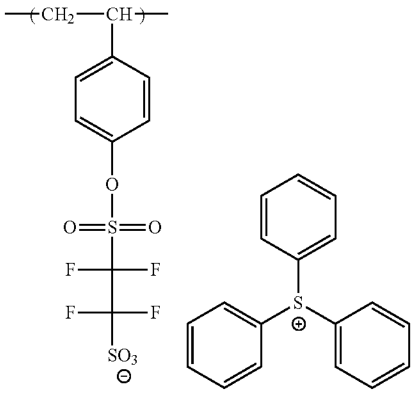
Ab-231
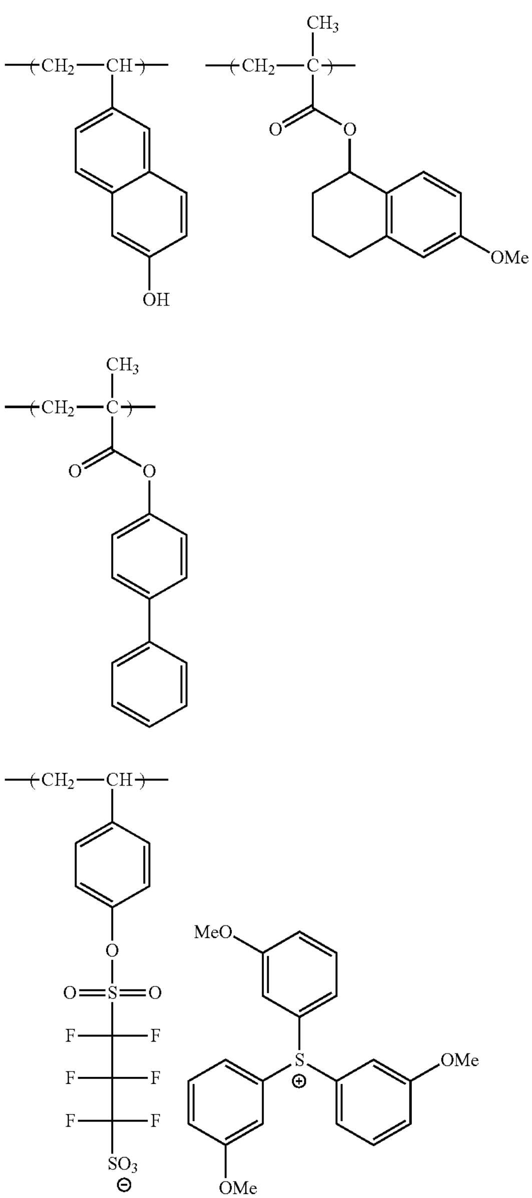
-continued
Ab-232
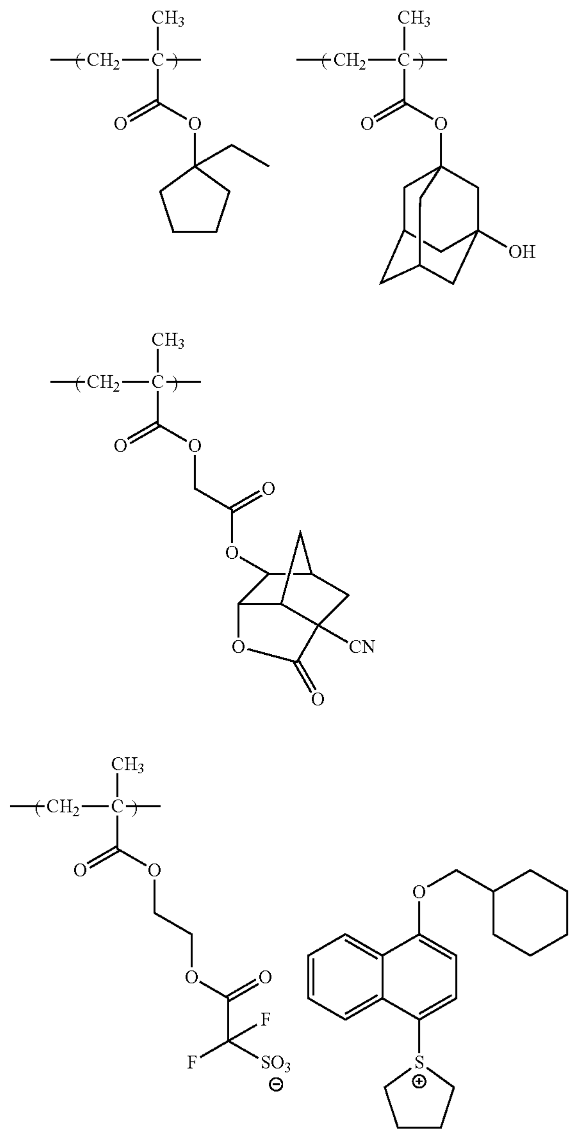
Ab-233
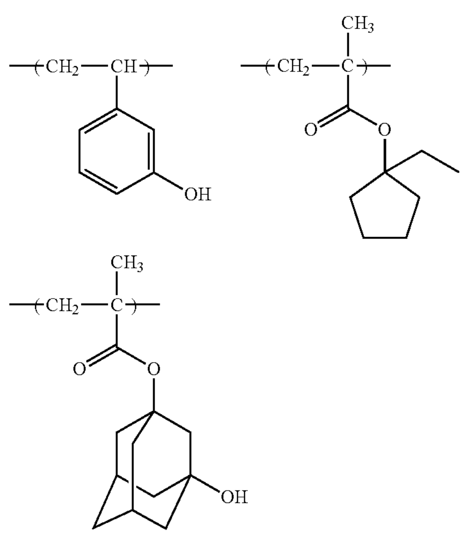

-continued
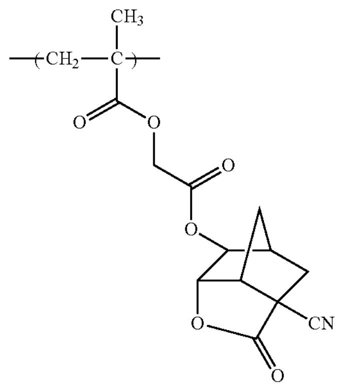
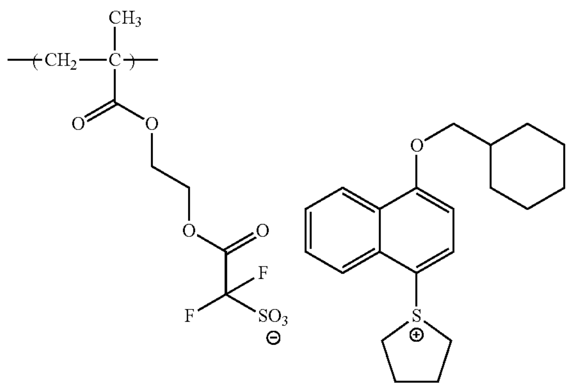
Ab-234
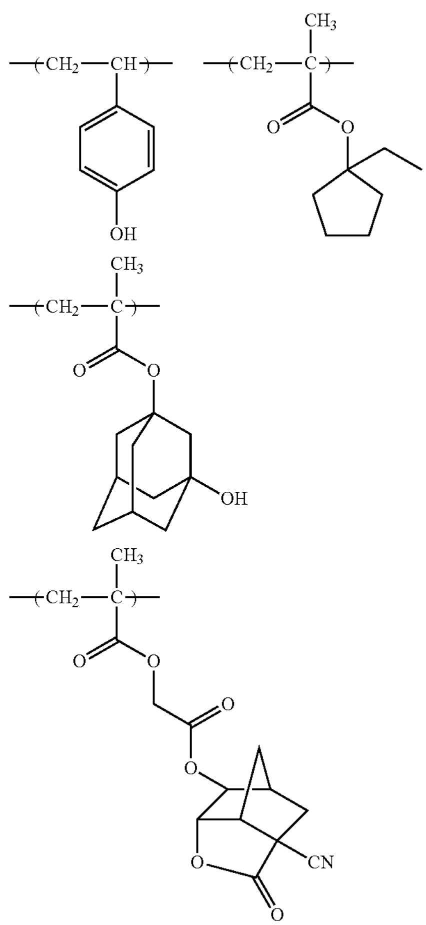
-continued
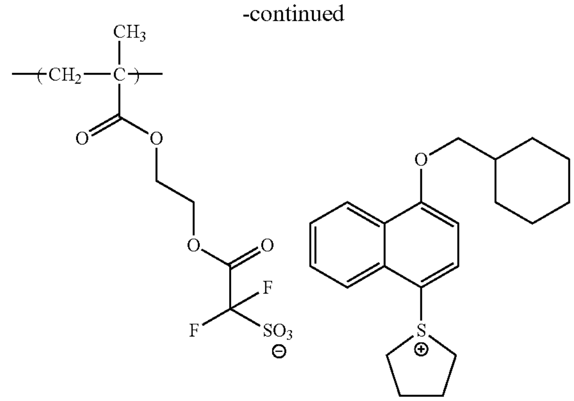
Ab-235
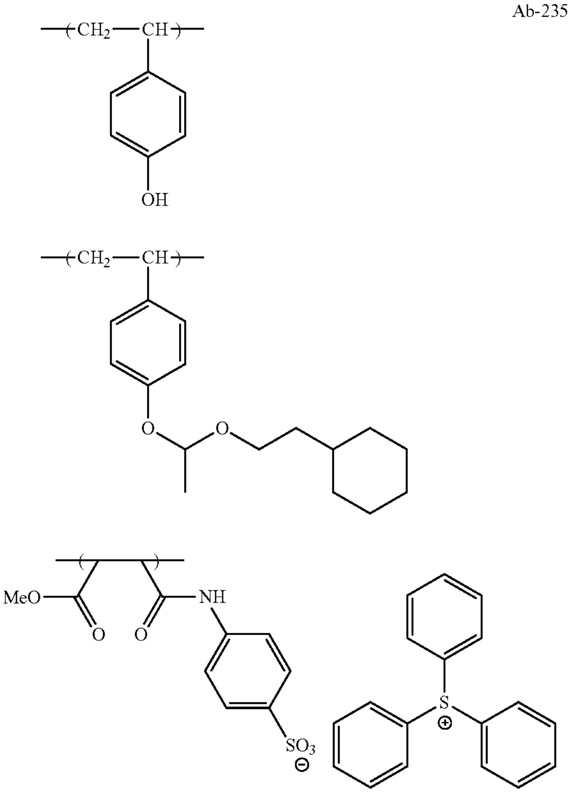
Ab-236
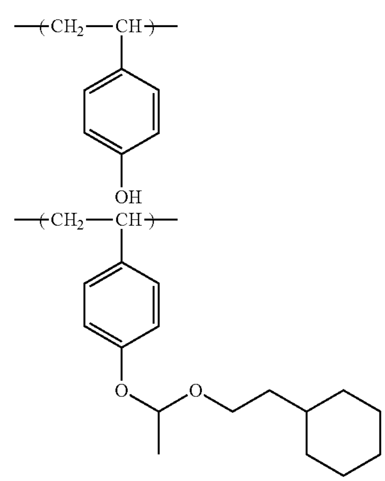

-continued
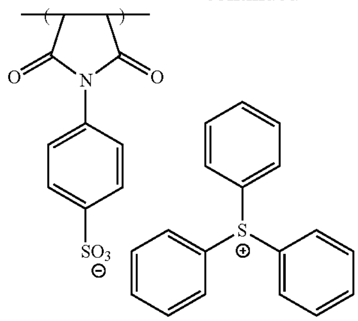
Ab-237
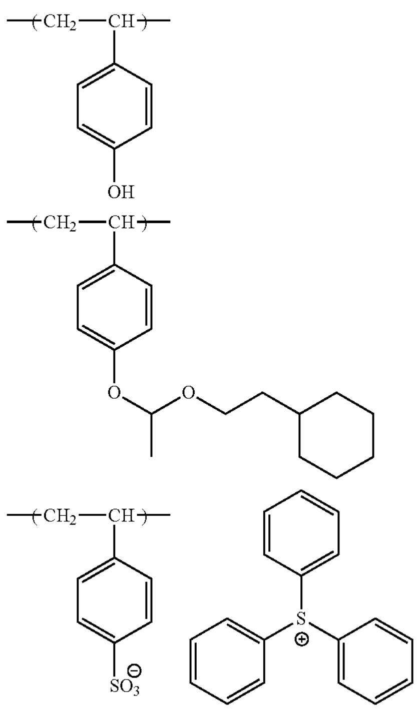
Ab-238
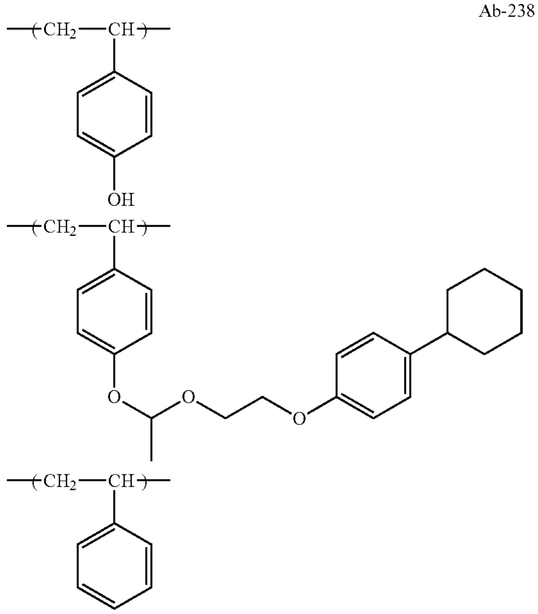
-continued
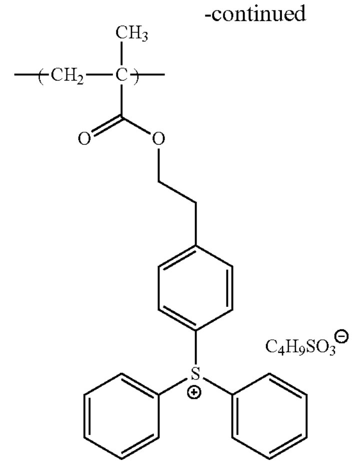
Ab-239
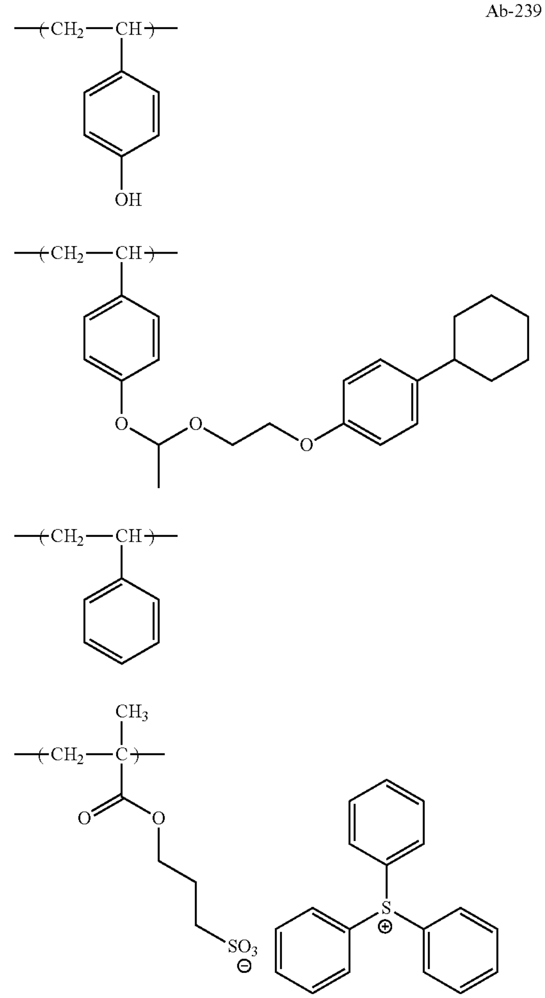
Ab-240
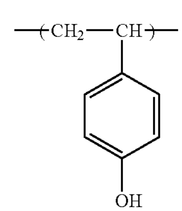

-continued
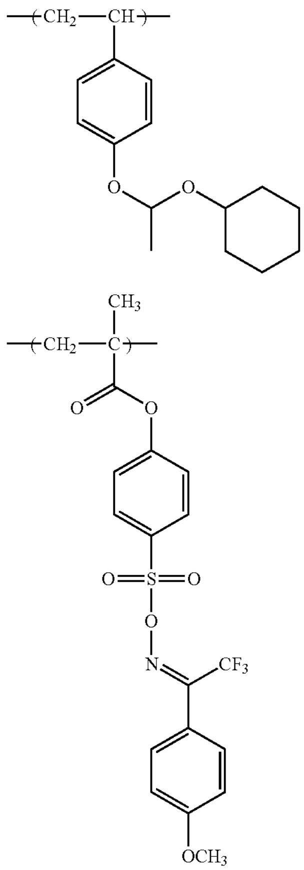
Ab-241
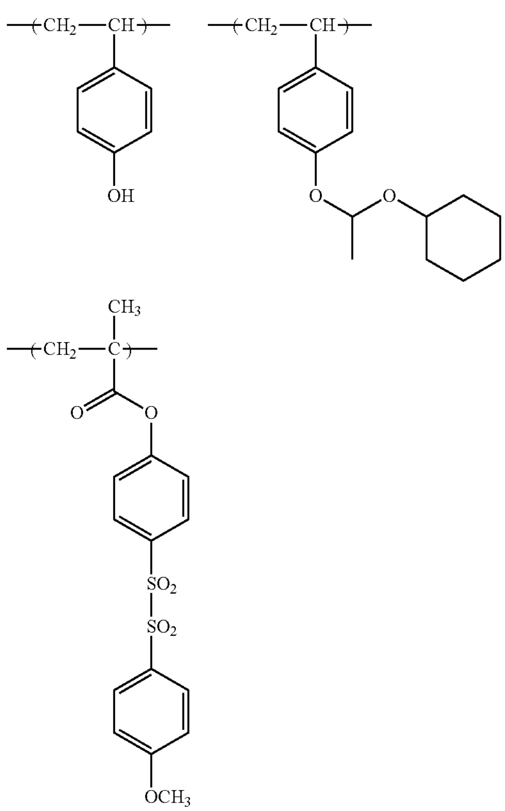
-continued
Ab-242
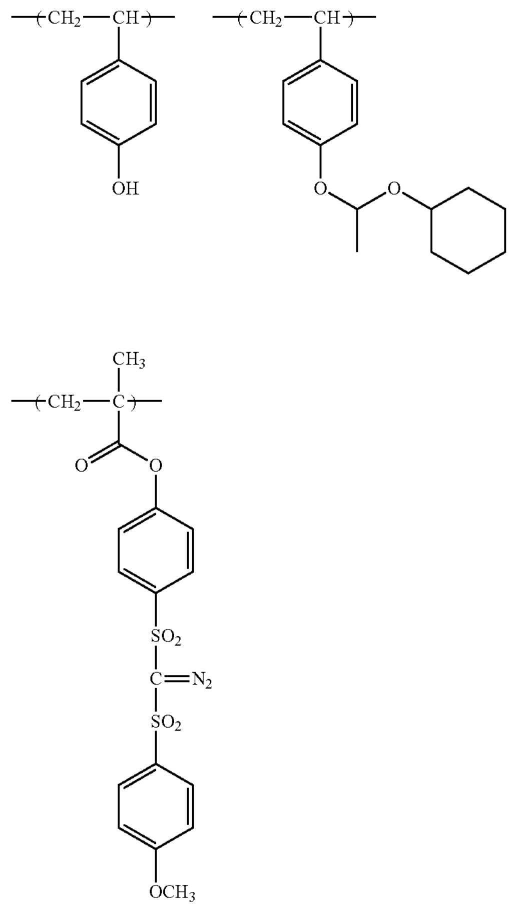
Ab-243
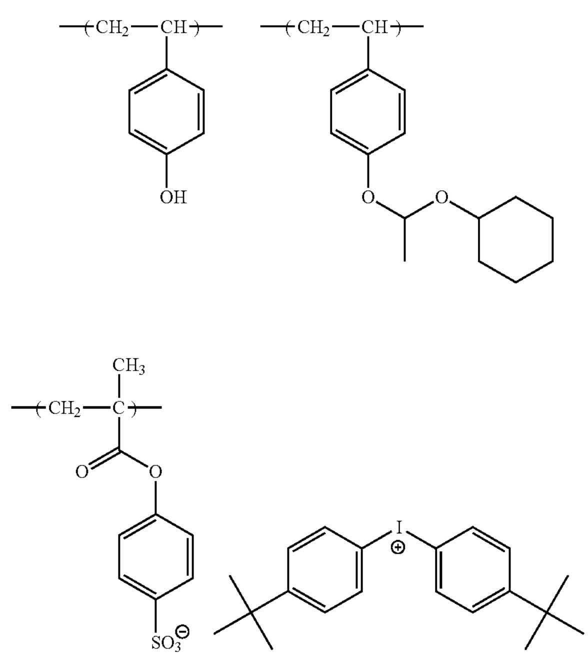

-continued
Ab-244
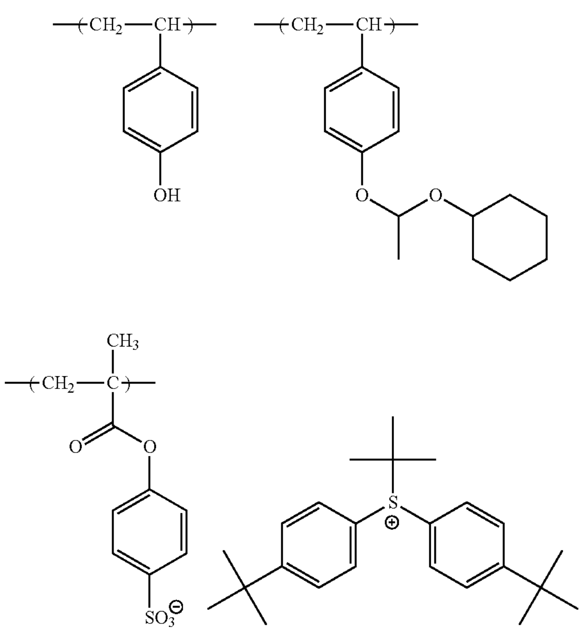
Ab-245
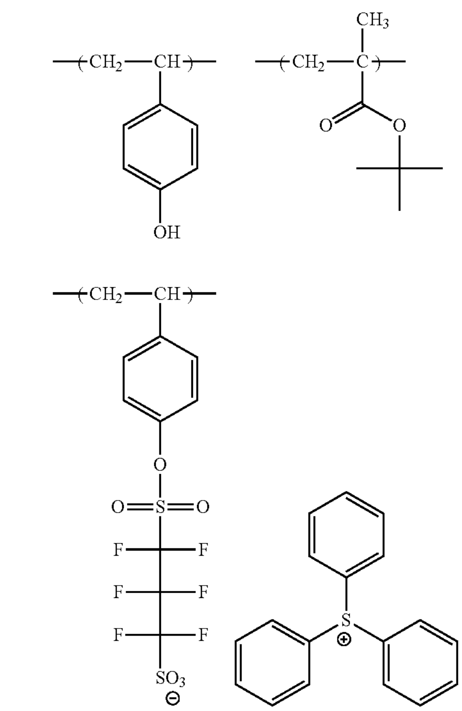
Ab-246
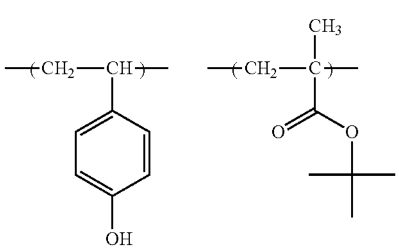
-continued
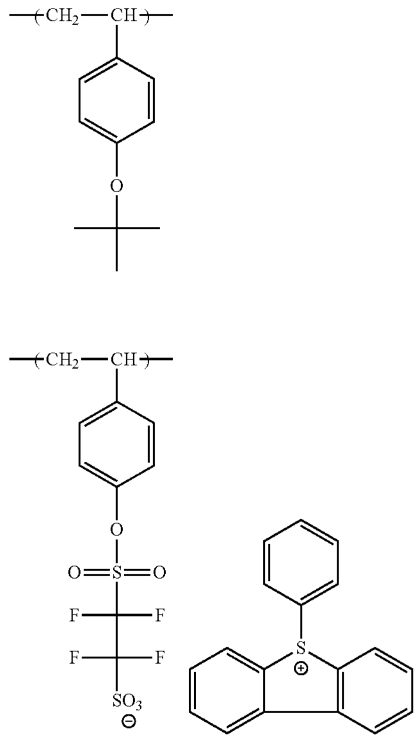
Ab-247
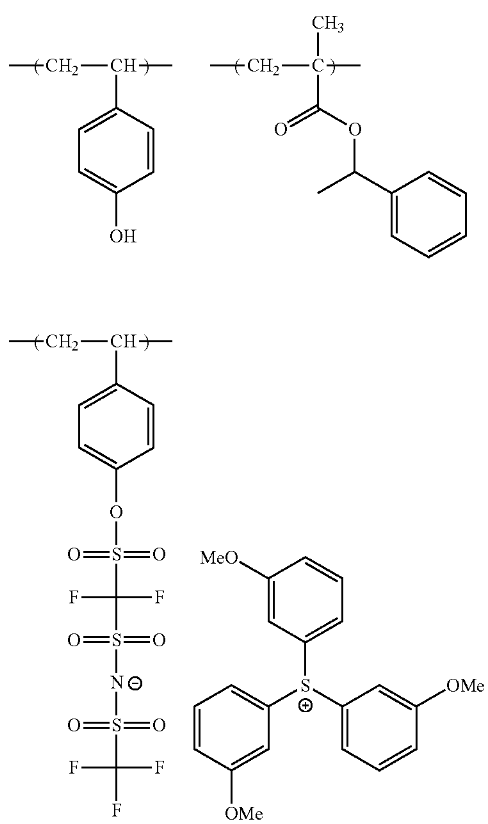

-continued
Ab-248
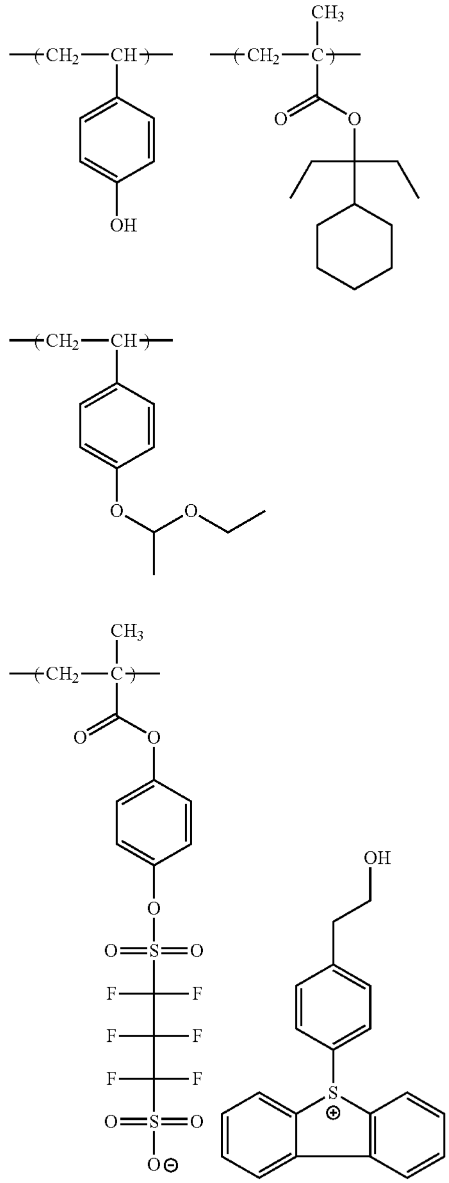
Ab-249
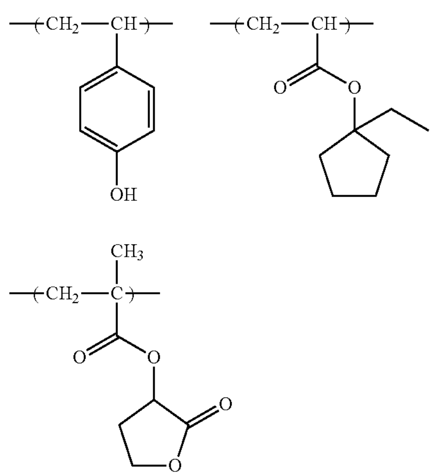
-continued
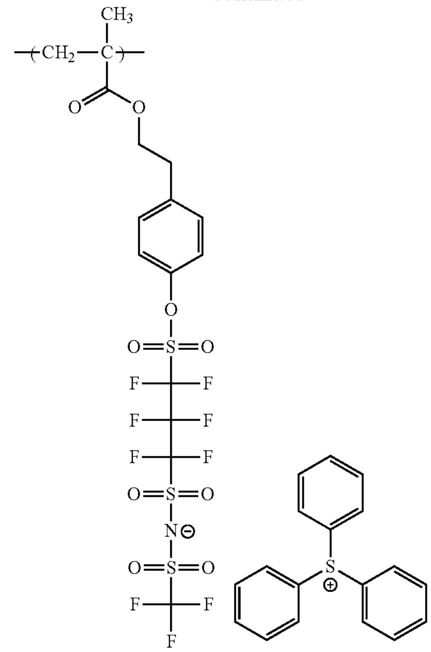
Ab-250
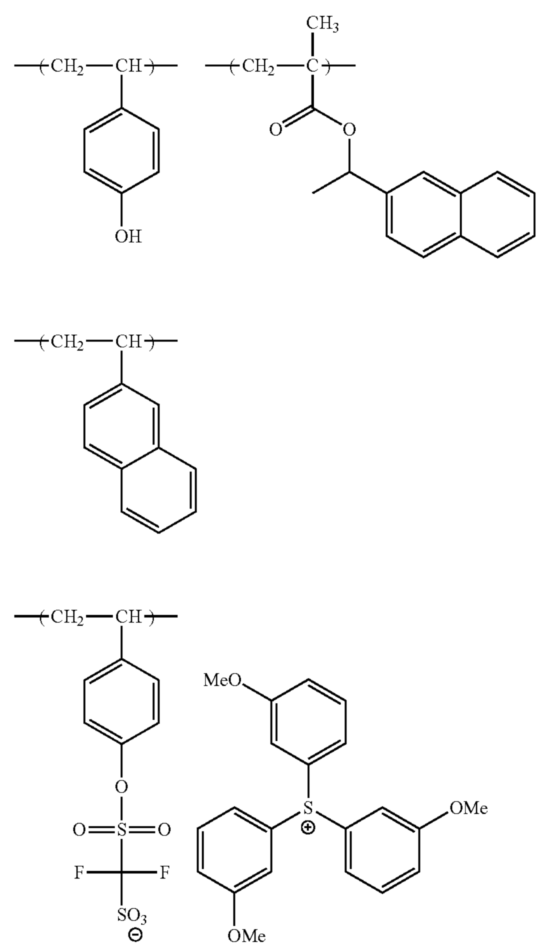

-continued
Ab-251
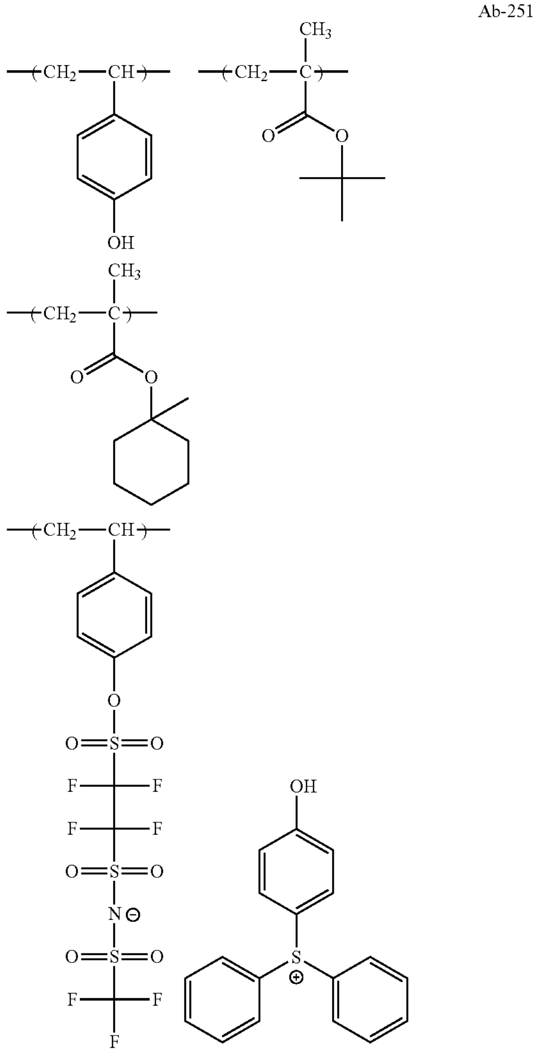
Ab-252
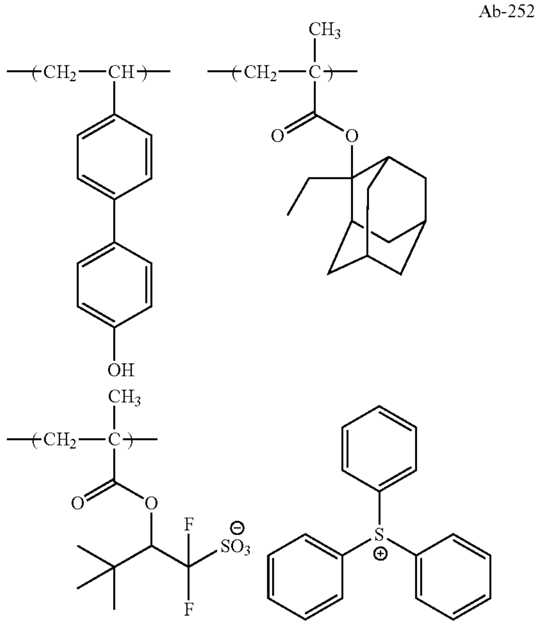
-continued
Ab-253
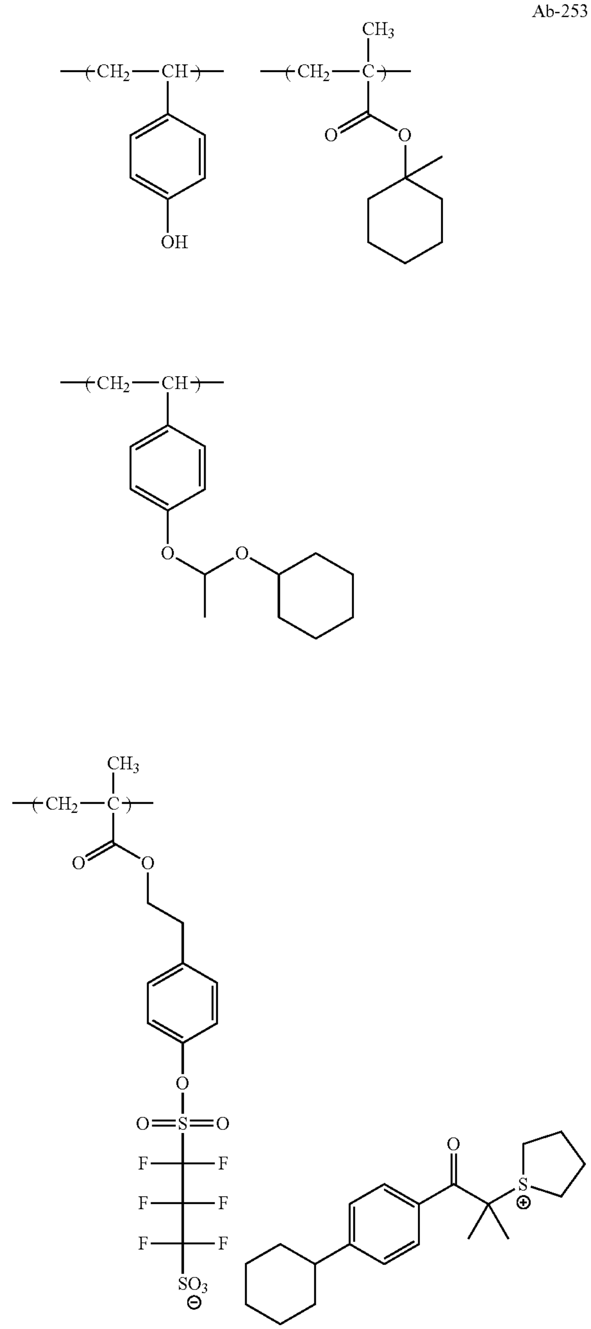
Ab-254
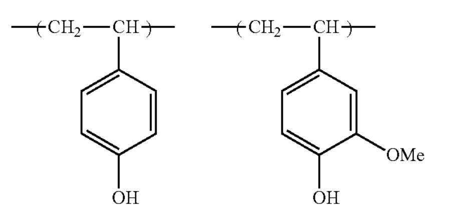

-continued
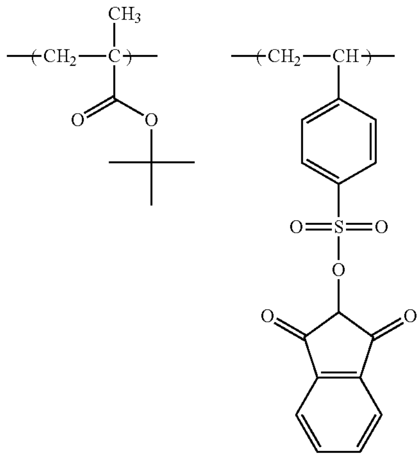
Ab-255
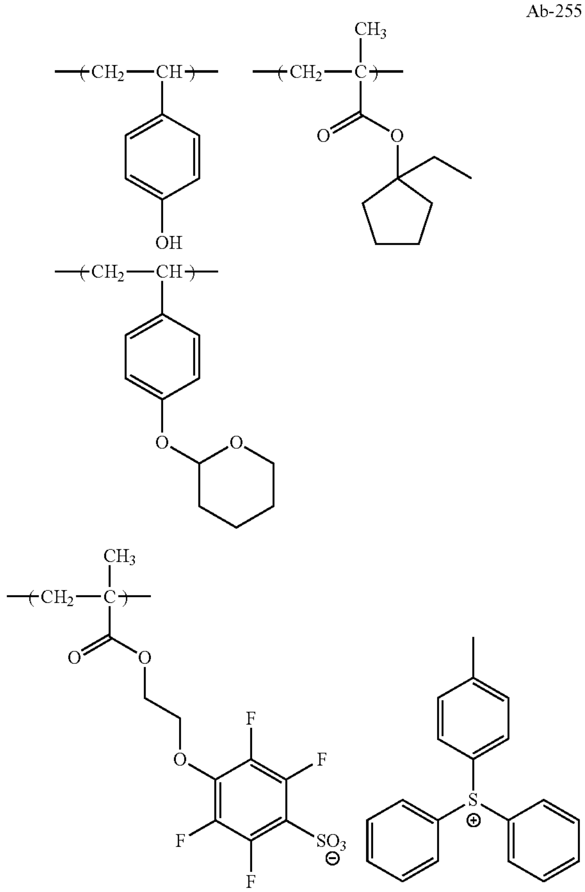
Ab-256
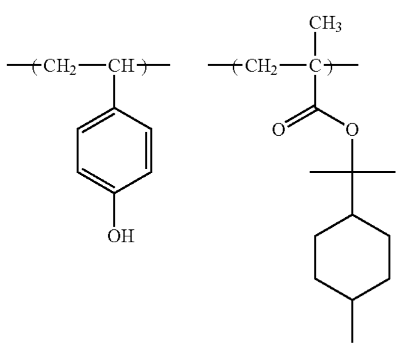
-continued
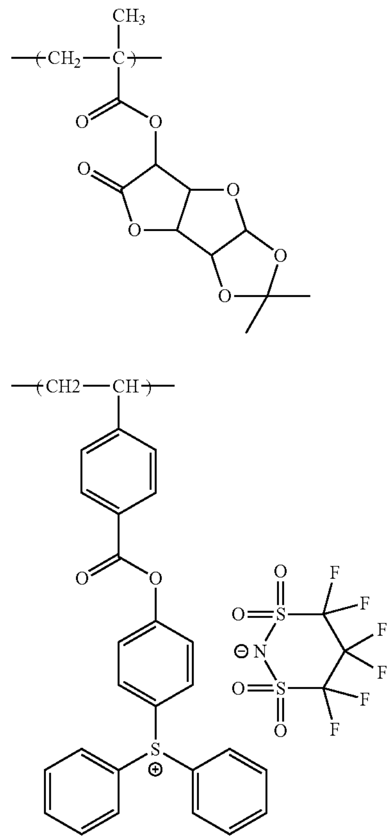
Ab-257
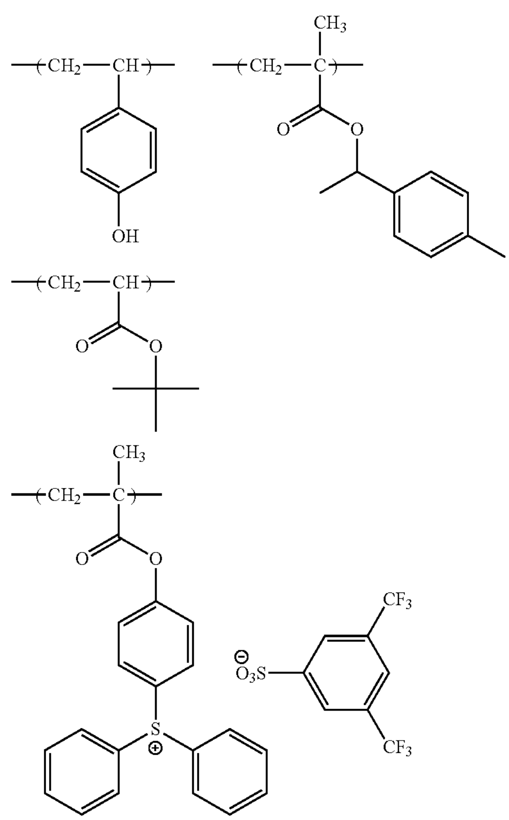

-continued
Ab-258
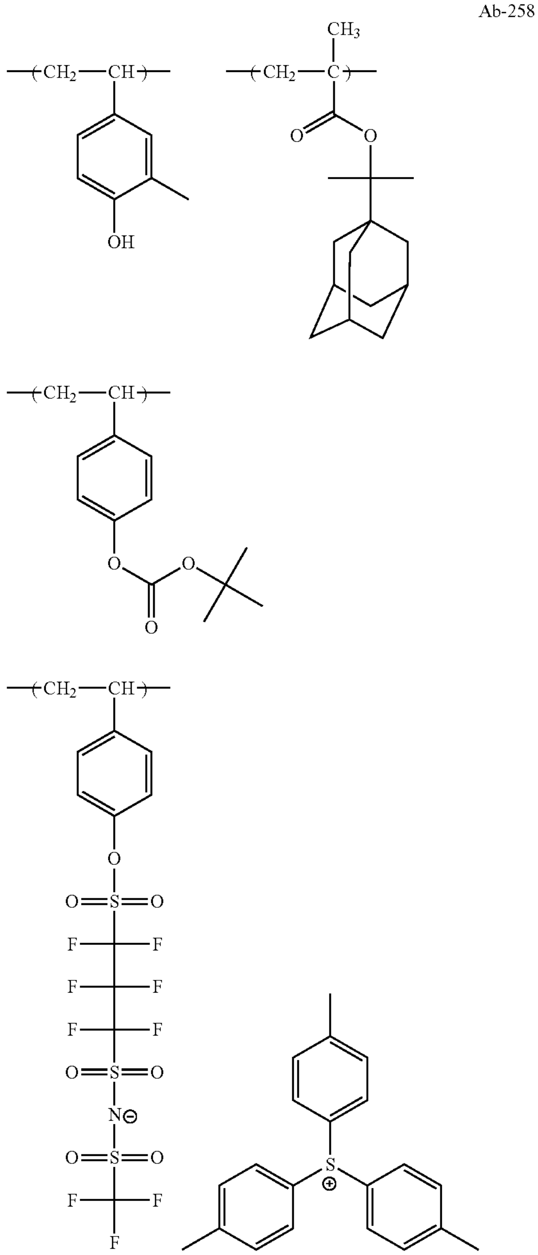
Ab-259
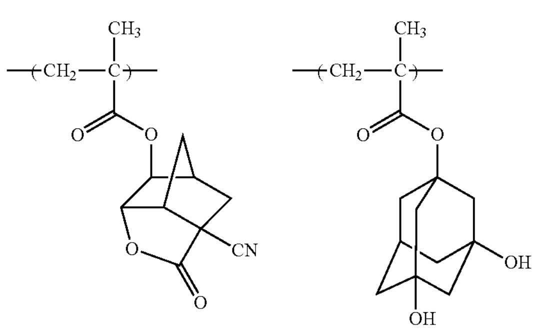
-continued
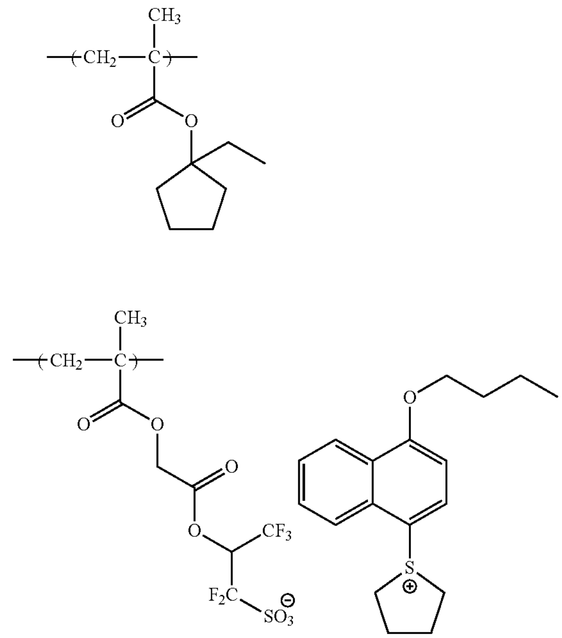
Ab-260
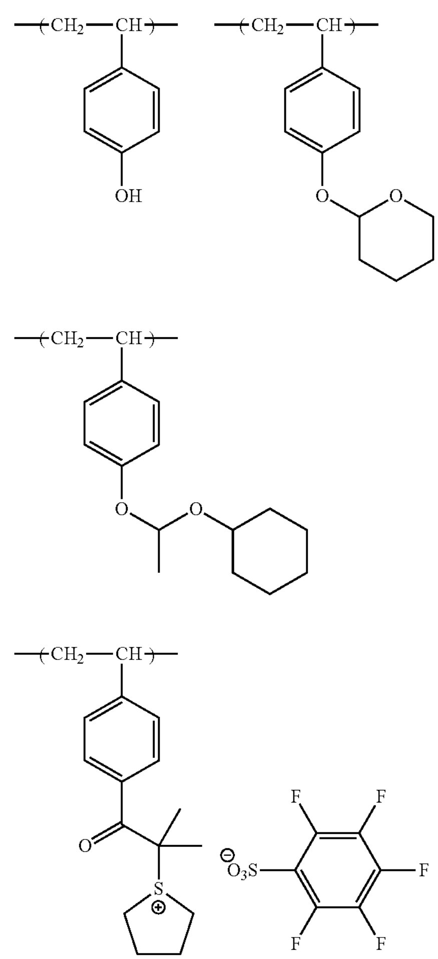

-continued
Ab-261
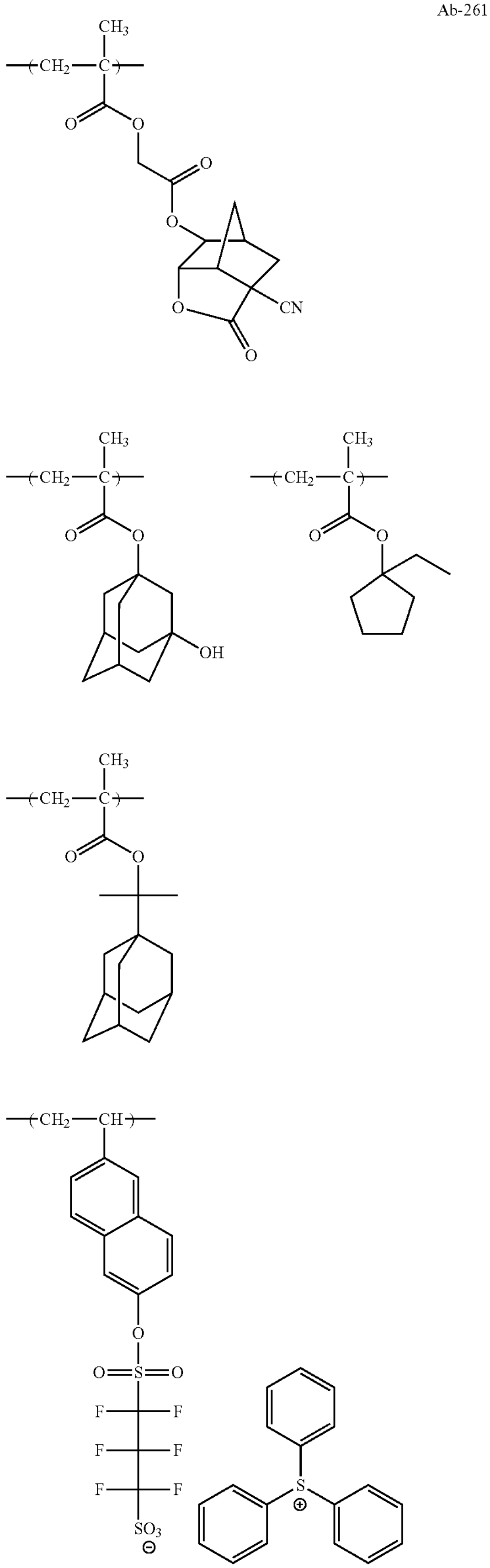
-continued
Ab-262
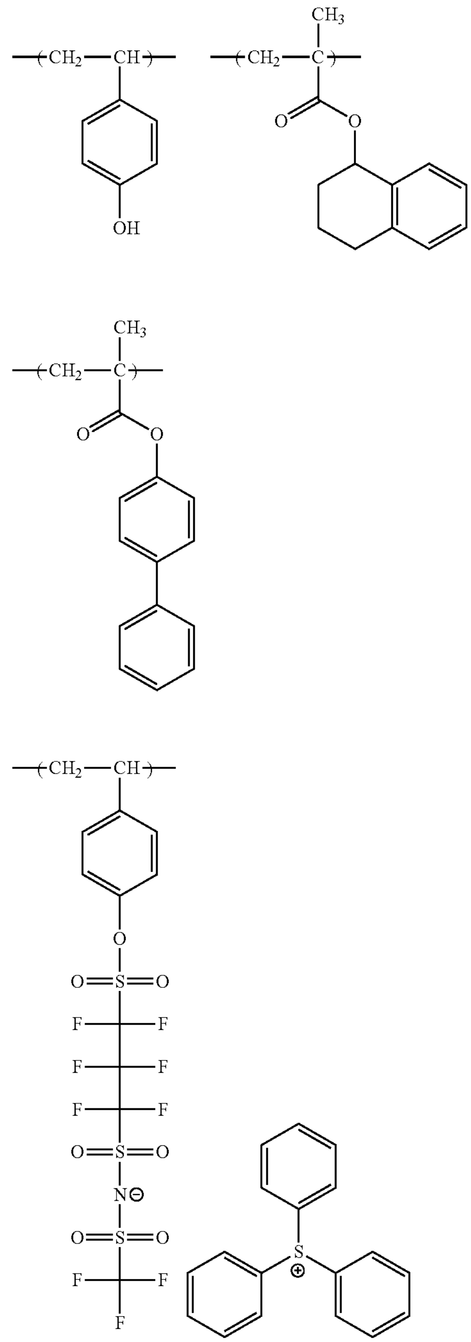
Ab-263
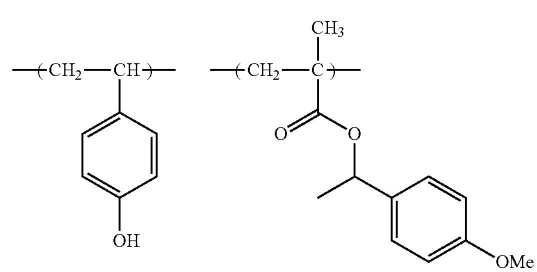

-continued
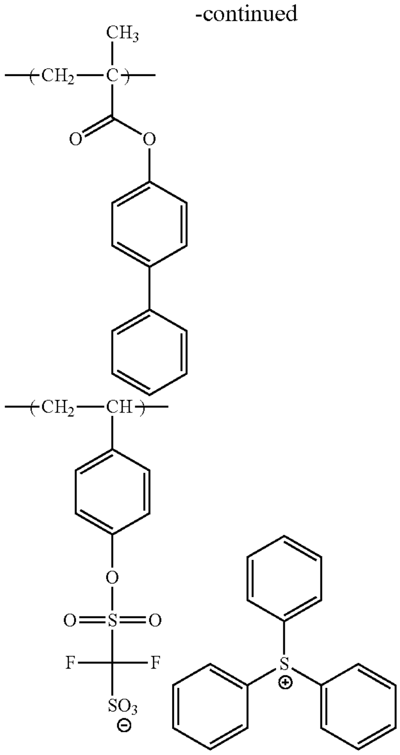
Ab-264
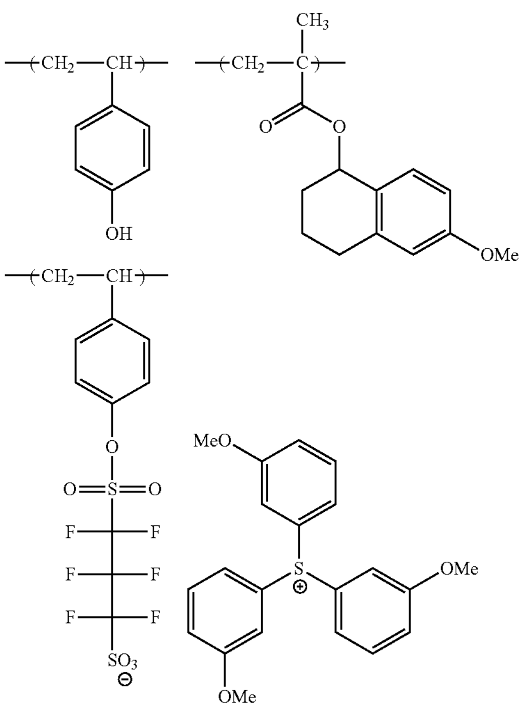
Ab-265
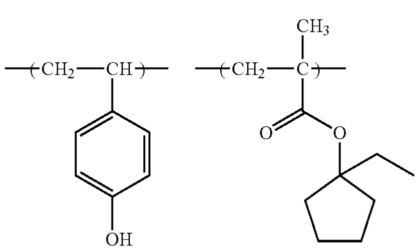
-continued
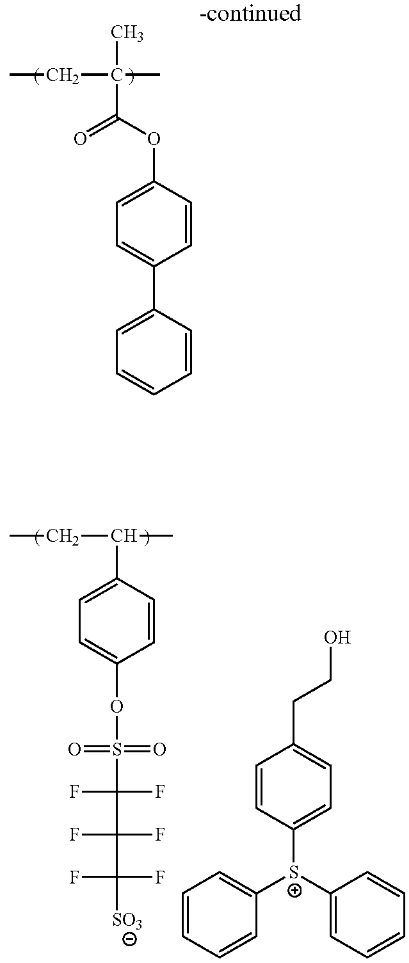
Ab-266
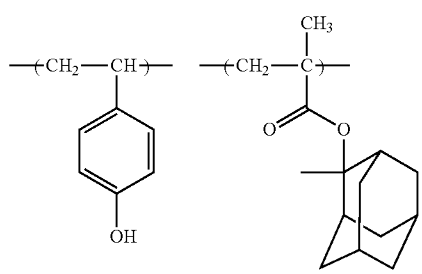
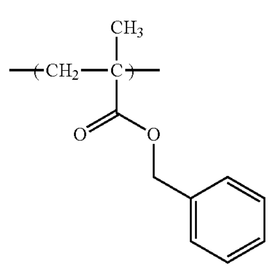

-continued
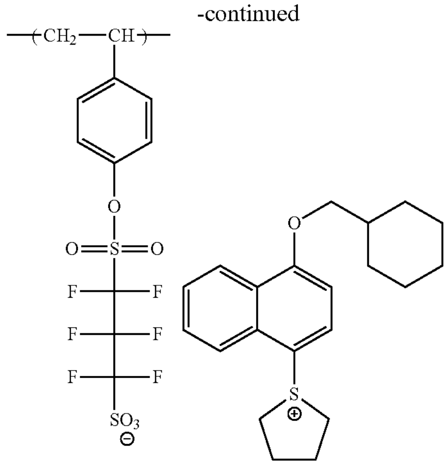
Ab-267
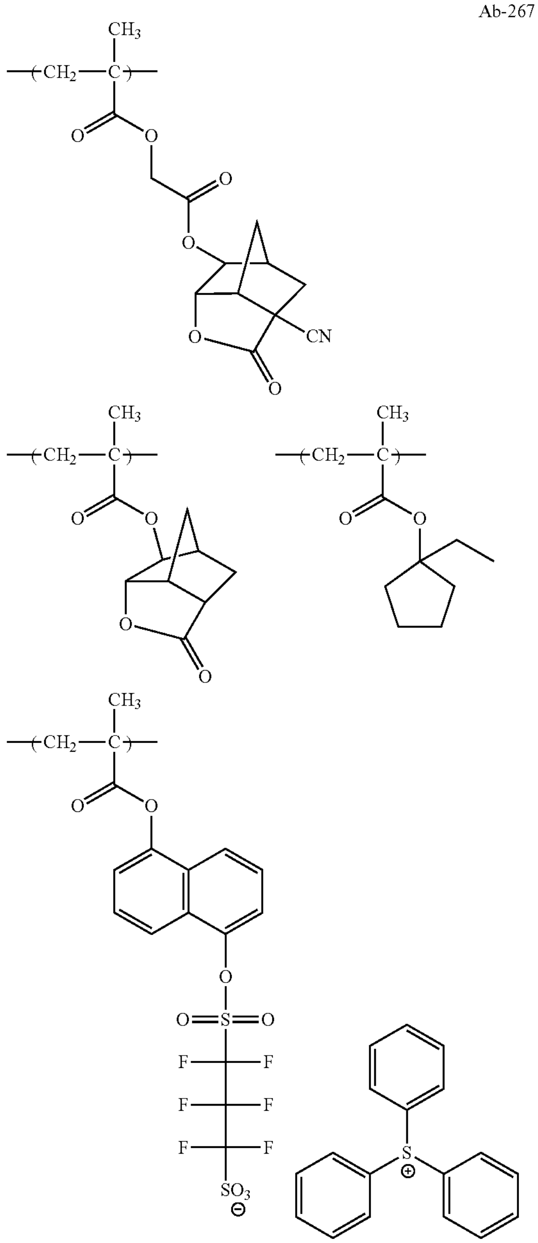
-continued
Ab-268
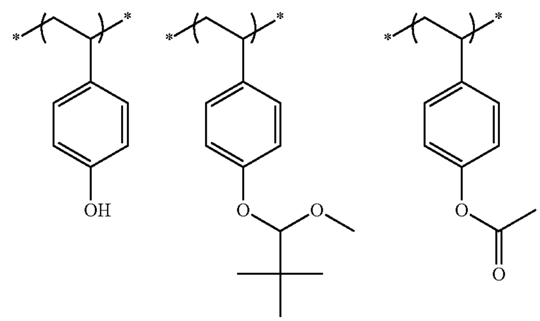
Ab-269
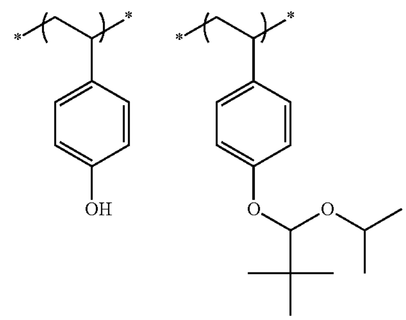
Ab-270
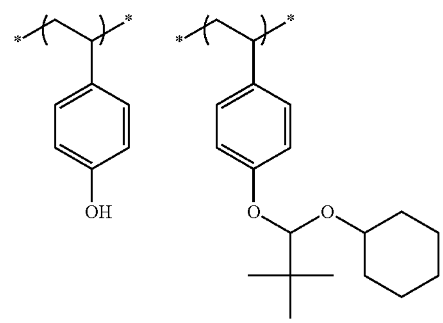
Ab-271
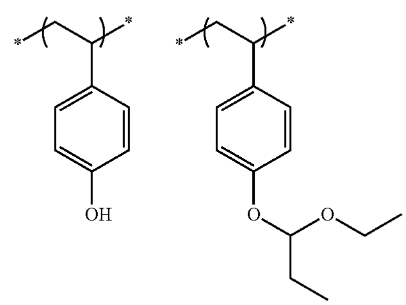
Ab-272
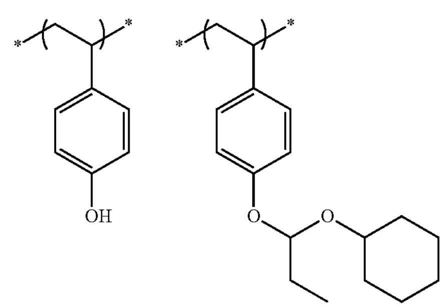

-continued
Ab-273
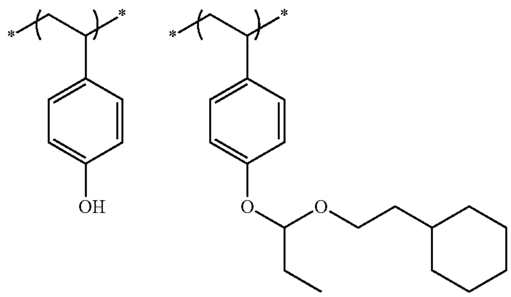
Ab-274
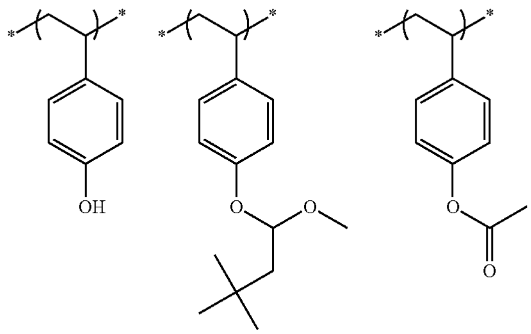
Ab-275
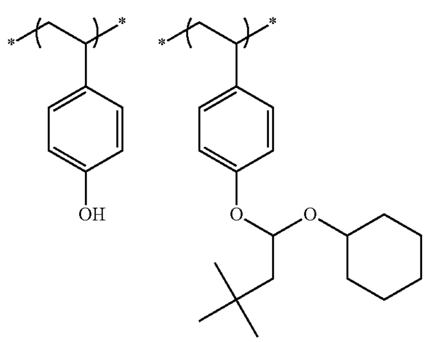
Ab-276
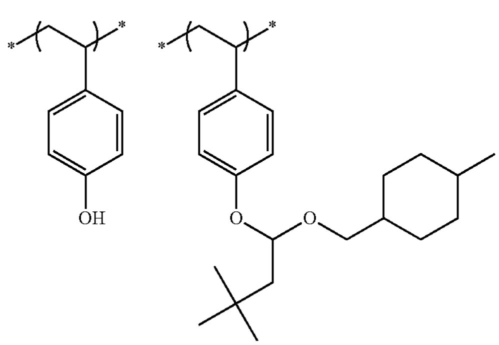
-continued
Ab-277
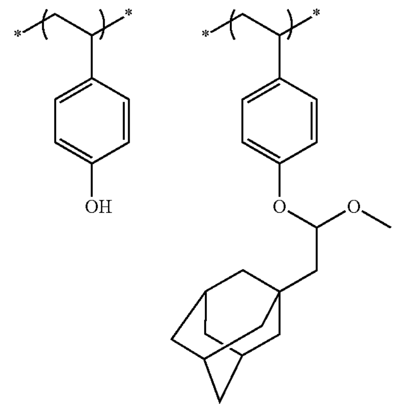
Ab-278
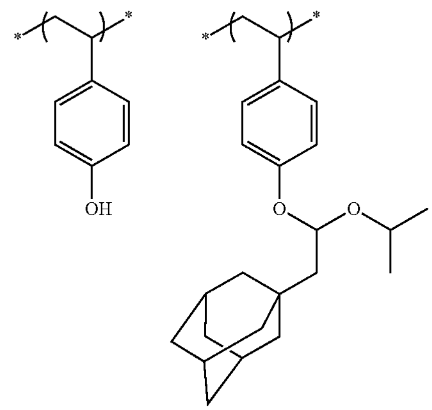
Ab-279
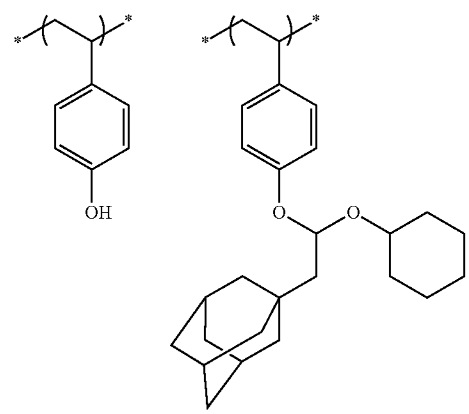
Ab-280
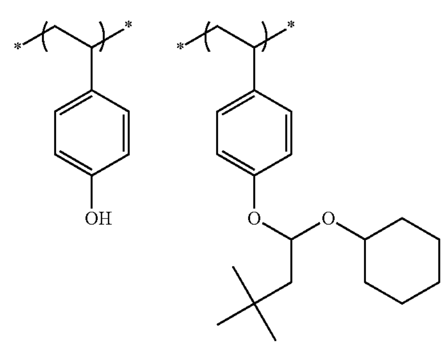

-continued

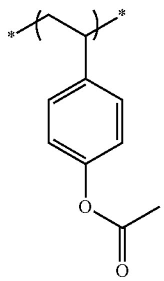

Ab-281

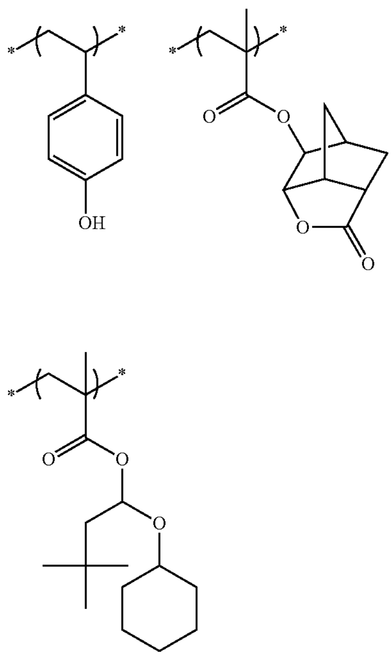

Ab-282

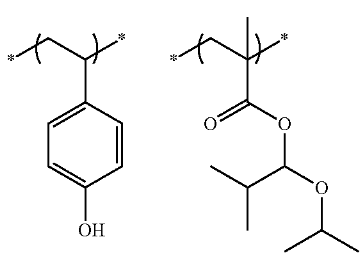

Ab-283

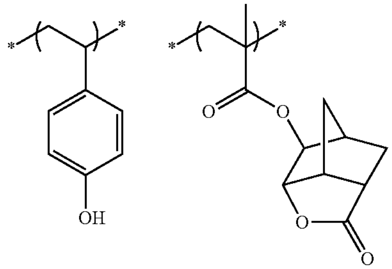

-continued

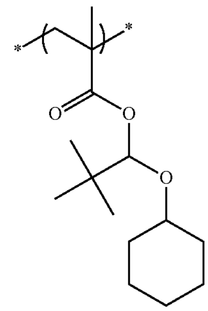

When the resin (Ab) does not contain the acid-generating repeating unit (B), the content of repeating unit containing a fluorine atom is preferably up to 1 mol %. More preferably, the content of fluorine atom is nil. When the resin (Ab) contains the repeating unit (B), the content of repeating unit containing a fluorine atom, which repeating unit is other than the repeating unit (B), is preferably up to 1 mol %. Most preferably, the content of fluorine atom is nil.

[Compound that when Exposed to Actinic Rays or Radiation, Generates an Acid]

The composition of the present invention may further contain a compound that when exposed to actinic rays or radiation, generates an acid (hereinafter also referred to as an "photoacid generator").

As the photoacid generator, use can be made of a member appropriately selected from among a photoinitiator for photocationic polymerization, a photoinitiator for photoradical polymerization, a photo-achromatic agent, a photo-discoloring agent, any of publicly known compounds that when irradiated with actinic rays or radiation, generate an acid, employed in a microresist, etc., and mixtures thereof. As examples of the photoacid generators, there can be mentioned an onium salt, such as a sulfonium salt or an iodonium salt, and a diazodisulfone compound, such as a bis(alkylsulfonyl-diazomethane).

As preferred compounds among the photoacid generators, those represented by general formulae (ZI), (ZII) and (ZIII) below can be exemplified.

$$R_{201}-S^{+}(R_{202})-R_{203} \quad X^{-} \tag{ZI}$$

$$R_{204}-I^{+}-R_{205} \quad X^{-} \tag{ZII}$$

$$R_{206}-S(=O)_2-C(=N_2)-S(=O)_2-R_{207} \tag{ZIII}$$

In general formula (ZI), each of $R_{201}$, $R_{202}$ and $R_{203}$ independently represents an organic group. The number of carbon atoms of each of the organic groups represented by $R_{201}$, $R_{202}$ and $R_{203}$ is generally in the range of 1 to 30, preferably 1 to 20.

Two selected from among $R_{201}$, $R_{202}$ and $R_{203}$ may be bonded via a single bond or a connecting group to each other to thereby form a ring. The connecting group may be any of an ether bond, a thioether bond, an ester bond, an amido bond, a carbonyl group, a methylene group or an ethylene group. As the group formed by bonding of two of $R_{201}$ to $R_{203}$, there can be mentioned an alkylene group (for example, a butylene group or a pentylene group).

As the specific examples of $R_{201}$, $R_{202}$ and $R_{203}$, there can be mentioned, for example, corresponding groups of compounds (ZI-1), (ZI-2) and (ZI-3) to be described hereinafter.

$X^-$ represents a normucleophilic anion. As a preferred such normucleophilic anion, there can be mentioned sulfonate anion, bis(alkylsulfonyl)amido anion or tris(alkylsulfonyl) methide anion, $BF_4^-$, $PF_6^-$, $SbF_6^-$, etc. Especially preferably, such normucleophilic anion is an organic anion having a carbon atom.

As preferred organic anions, there can be mentioned those of formulae AN1 to AN3 below.

AN1

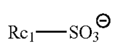

AN2

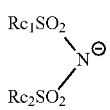

AN3

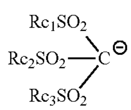

In the formulae AN1 to AN3, each of $R_{C1}$ to $R_{C3}$ independently represents an organic group. As the organic groups represented by $R_{C1}$ to $R_{C3}$, there can be mentioned those having 1 to 30 carbon atoms. As preferred examples, there can be mentioned an alkyl group, an aryl group, or groups derived from linkage of two or more thereof by means of a single bond or a connecting group such as —O—, $—CO_2—$, —S—, $—SO_3—$ or $—SO_2N(Rd_1)$-. $Rd_1$ represents a hydrogen atom or an alkyl group, and may form a ring structure in cooperation with a bonded alkyl group or aryl group.

The organic groups represented by $R_{C1}$ to $R_{C3}$ may be alkyl groups substituted at the 1-position thereof with a fluorine atom or a fluoroalkyl group or phenyl groups substituted with a fluorine atom or a fluoroalkyl group. The acidity of the acid generated upon exposure to light can be enhanced by introducing a fluorine atom or a fluoroalkyl group. Accordingly, the sensitivity of the actinic-ray- or radiation-sensitive resin composition can be enhanced. In this connection, $Rc_1$ to $Rc_3$ may be bonded to another alkyl group or aryl group or the like to thereby form a ring structure.

$X^-$ is preferably any of sulfonate anions of general formulae (SA1) and (SA2) below:

(SA1)

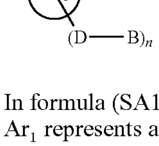

In formula (SA1), $Ar_1$ represents an aryl group, in which a substituent other than -(D-B) groups may further be introduced.

In the formula, n is an integer of 1 or greater, preferably in the range of 1 to 4, more preferably 2 or 3 and most preferably 3.

D represents a single bond or a bivalent connecting group. As the bivalent connecting group, there can be mentioned an ether group, a thioether group, a carbonyl group, a sulfoxide group, a sulfon group, a sulfonic ester group, an ester group, or the like.

B represents a hydrocarbon group.

(SA2)

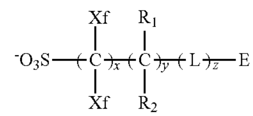

In formula (SA2), each of Xf's independently represents a fluorine atom or an alkyl group substituted with at least one fluorine atom.

Each of $R_1$ and $R_2$ independently represents a hydrogen atom, a fluorine atom, an alkyl group or an alkyl group substituted with at least one fluorine atom. Two or more $R_{1s}$, and $R_{2s}$ may be identical to or different from each other.

L represents a single bond or a bivalent connecting group. Two or more L's may be identical to or different from each other.

E represents a group having a cyclic structure, and x is an integer of 1 to 20, y an integer of 0 to 10, and z an integer of 0 to 10.

First, the sulfonate anions of formula (SA1) will be described in detail below.

In formula (SA1), $Ar_1$ is preferably an aromatic ring having 6 to 30 carbon atoms. In particular, $Ar_1$ is, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring. Of these, a benzene ring, a naphthalene ring and an anthracene ring are preferred from the viewpoint of the simultaneous attainment of roughness and sensitivity enhancements. A benzene ring is more preferred.

When a substituent other than the -(D-B) groups is further introduced in $Ar_1$, the substituent is, for example, as follows. Namely, as the substituent, there can be mentioned a halogen atom, such as a fluorine atom, a chlorine atom, a bromine atom or an iodine atom; an alkoxy group, such as a methoxy group, an ethoxy group or a tert-butoxy group; an aryloxy group, such as a phenoxy group or a p-tolyloxy group; an alkylthioxy group, such as a methylthioxy group, an ethylthioxy group or a tert-butylthioxy group; an arylthioxy group, such as a phenylthioxy group or a p-tolylthioxy group; an alkoxy- or aryloxycarbonyl group, such as a methoxycarbonyl group, a butoxycarbonyl group or a phenoxycarbonyl group; an acetoxy group; a linear or branched alkyl group, such as a methyl group, an ethyl group, a propyl group, a butyl group, a heptyl group, a hexyl group, a dodecyl group or a 2-ethylhexyl group; an alkenyl group, such as a vinyl group, a propenyl group or a hexenyl group; an alkynyl group, such as an acetylene group, a propynyl group or a hexynyl group; an aryl group, such as a phenyl group or a tolyl group; a hydroxyl group; a carboxyl group; or a sulfonic acid group. Of these, a linear or branched alkyl group is preferred from the viewpoint of roughness improvement.

In formula (SA1), D is preferably a single bond or an ether or ester group. More preferably, D is a single bond.

In formula (SA1), B is, for example, an alkyl group, an alkenyl group, an alkynyl group, an aryl group or a cycloalkyl group. B is preferably an alkyl group or a cycloalkyl group. A substituent may be introduced in each of the alkyl group, alkenyl group, alkynyl group, aryl group and cycloalkyl group represented by B.

The alkyl group represented by B is preferably a branched alkyl group. As the branched alkyl group, there can be mentioned, for example, an isopropyl group, a tert-butyl group, a tert-pentyl group, a neopentyl group, a sec-butyl group, an isobutyl group, an isohexyl group, a 3,3-dimethylpentyl group or a 2-ethylhexyl group.

The cycloalkyl group represented by B may be a monocycloalkyl group or a polycycloalkyl group. As the monocycloalkyl group, there can be mentioned, for example, a cyclopropyl group, a cyclobutyl group, a cyclopentyl group, a cyclohexyl group, a cycloheptyl group or a cyclooctyl group. As the polycycloalkyl group, there can be mentioned, for example, an adamantyl group, a norbornyl group, a bornyl group, a camphenyl group, a decahydronaphthyl group, a tricyclodecanyl group, a tetracyclodecanyl group, a camphoroyl group, a dicyclohexyl group or a pinenyl group.

When a substituent is introduced in each of the alkyl group, alkenyl group, alkynyl group, aryl group and cycloalkyl group represented by B, the substituent is, for example, as follows. Namely, as the substituent, there can be mentioned a halogen atom, such as a fluorine atom, a chlorine atom, a bromine atom or an iodine atom; an alkoxy group, such as a methoxy group, an ethoxy group or a tert-butoxy group; an aryloxy group, such as a phenoxy group or a p-tolyloxy group; an alkylthioxy group, such as a methylthioxy group, an ethylthioxy group or a tert-butylthioxy group; an arylthioxy group, such as a phenylthioxy group or a p-tolylthioxy group; an alkoxy- or aryloxycarbonyl group, such as a methoxycarbonyl group, a butoxycarbonyl group or a phenoxycarbonyl group; an acetoxy group; a linear or branched alkyl group, such as a methyl group, an ethyl group, a propyl group, a butyl group, a heptyl group, a hexyl group, a dodecyl group or a 2-ethylhexyl group; a cycloalkyl group, such as a cyclohexyl group; an alkenyl group, such as a vinyl group, a propenyl group or a hexenyl group; an alkynyl group, such as an acetylene group, a propynyl group or a hexynyl group; an aryl group, such as a phenyl group or a tolyl group; a hydroxyl group; a carboxyl group; a sulfonic acid group; a carbonyl group; or the like. Of these, a linear or branched alkyl group is preferred from the viewpoint of the simultaneous attainment of roughness and sensitivity enhancements.

Now, the sulfonate anions of formula (SA2) will be described in detail below.

In formula (SA2), Xf represents a fluorine atom or an alkyl group substituted with at least one fluorine atom. This alkyl group preferably contains 1 to 10 carbon atoms, more preferably 1 to 4 carbon atoms. The alkyl group substituted with a fluorine atom is preferably a perfluoroalkyl group.

Xf is preferably a fluorine atom or a perfluoroalkyl group having 1 to 4 carbon atoms. In particular, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, a fluorine atom and $CF_3$ are preferred. A fluorine atom is most preferred.

In formula (SA2), each of $R_1$ and $R_2$ independently represents a hydrogen atom, a fluorine atom, an alkyl group or an alkyl group substituted with at least one fluorine atom. The alkyl group substituted with at least one fluorine atom preferably has 1 to 4 carbon atoms. The alkyl group substituted with at least one fluorine atom is most preferably a perfluoroalkyl group having 1 to 4 carbon atoms. In particular, as the alkyl group substituted with at least one fluorine atom, there can be mentioned $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, $CF_3$ is preferred.

In formula (SA2), x is preferably 1 to 8, more preferably 1 to 4; y is preferably 0 to 4, more preferably 0; and z is preferably 0 to 8, more preferably 0 to 4.

In formula (SA2), L represents a single bond or a bivalent connecting group. As the bivalent connecting group, there can be mentioned, for example, —COO—, —OCO—, —CO—, —O—, —S—, —SO—, —$SO_2$—, an alkylene group, a cycloalkylene group or an alkenylene group. Of these, —COO—, —OCO—, —CO—, —O—, —S—, —SO— and —$SO_2$— are preferred. —COO—, —OCO— and —$SO_2$— are more preferred.

In formula (SA2), E represents a group having a cyclic structure. E is, for example, a cycloaliphatic group, an aryl group or a group having a heterocyclic structure.

The cycloaliphatic group represented by E may have a monocyclic structure or a polycyclic structure. The cycloaliphatic group with a monocyclic structure is preferably a monocycloalkyl group, such as a cyclopentyl group, a cyclohexyl group or a cyclooctyl group. The cycloaliphatic group with a polycyclic structure is preferably a polycycloalkyl group, such as a norbornyl group, a tricyclodecanyl group, a tetracyclodecanyl group, a tetracyclododecanyl group or an adamantyl group. In particular, when a cycloaliphatic group with a bulky structure of 6 or more-membered ring is employed as E, any in-film diffusion in the PEB (post-exposure bake) operation can be suppressed, and the resolving power and EL (exposure latitude) can be enhanced.

The aryl group represented by E is, for example, a benzene ring, a naphthalene ring, a phenanthrene ring or an anthracene ring.

It is optional for the group having a heterocyclic structure represented by E to have any aromaticity. The heteroatom contained in this group is preferably a nitrogen atom or an oxygen atom. As particular examples of the heterocyclic structures, there can be mentioned a furan ring, a thiophene ring, a benzofuran ring, a benzothiophene ring, a dibenzofuran ring, a dibenzothiophene ring, a pyridine ring, a piperidine ring, a morpholine ring and the like. Of these, a furan ring, a thiophene ring, a pyridine ring, a piperidine ring and a morpholine ring are preferred.

A substituent may be introduced in E. As the substituent, there can be mentioned, for example, an alkyl group (may be any of linear, branched and cyclic forms, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group or a sulfonic ester group.

Specific examples of the sulfonate anions of general formula (SA1) or (SA2) will be shown below.

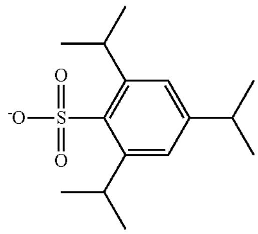
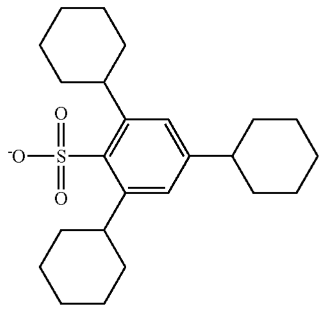
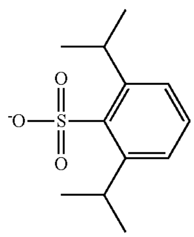
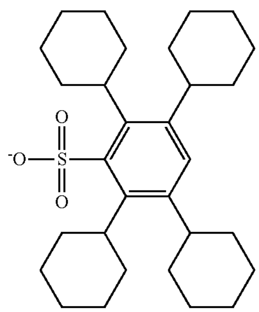
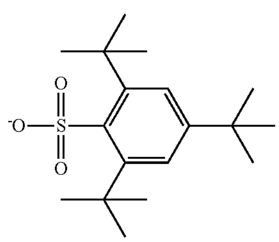
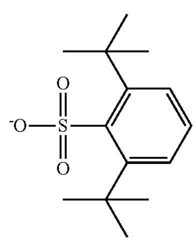
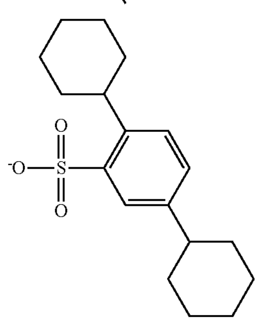
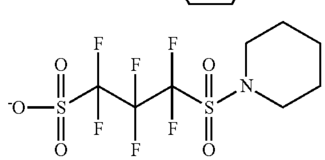
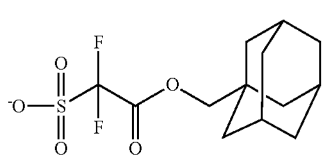
-continued
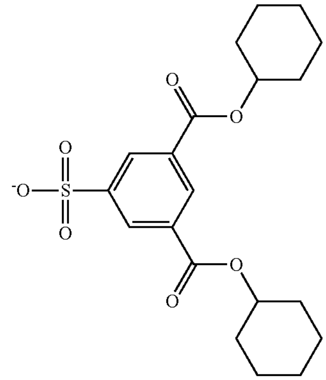
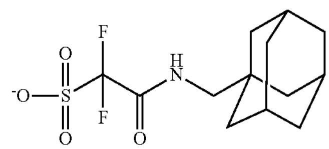
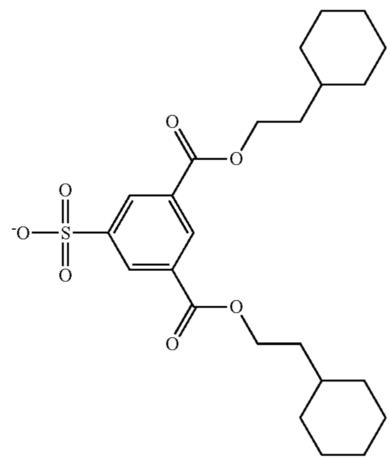
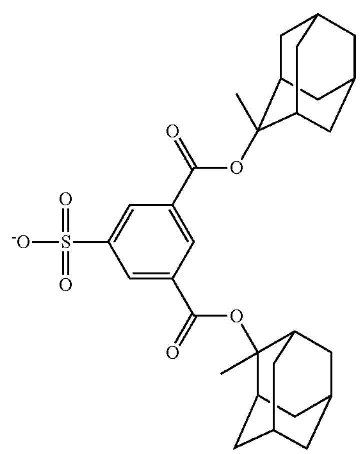
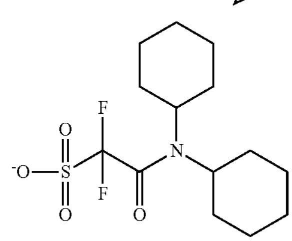

-continued

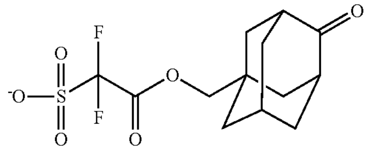

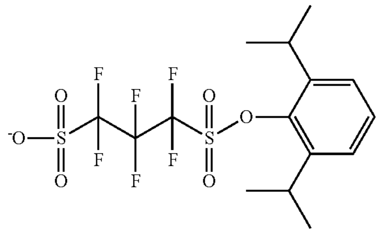

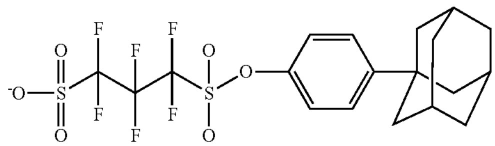

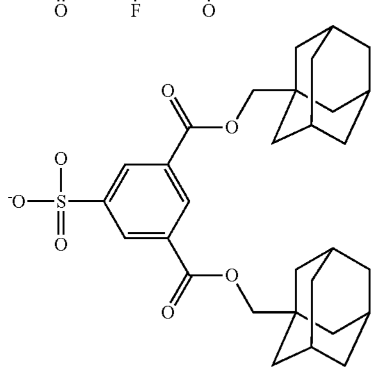

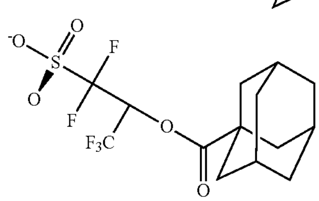

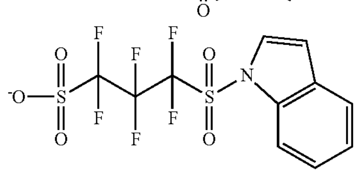

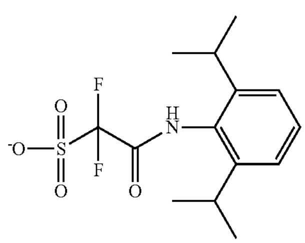

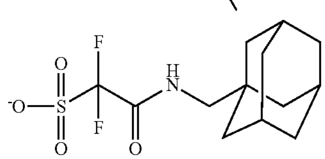

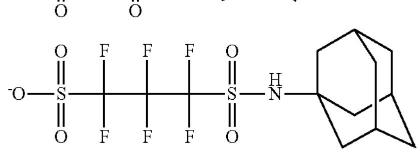

-continued

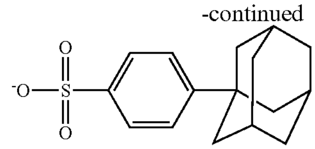

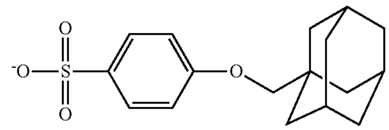

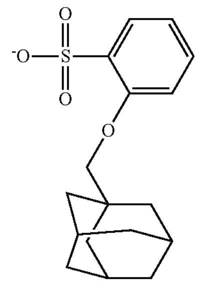

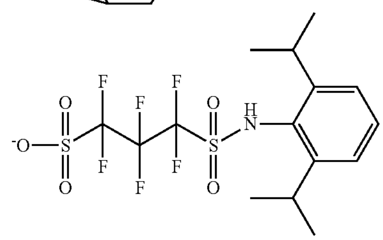

Compounds each having two or more of the structures of general formula (ZI) may be used as photoacid generators. For example, use may be made of a compound with a structure in which at least one of $R_{201}$ to $R_{203}$ of any of the compounds of general formula (ZI) is bonded to at least one of $R_{201}$ to $R_{203}$ of another of the compounds of general formula (ZI).

As further preferred (ZI) components, there can be mentioned the following compounds (ZI-1) to (ZI-4).

Compounds (ZI-1) are compounds of general formula (ZI) above wherein at least one of $R_{201}$ to $R_{203}$ is an aryl group. Namely, compounds (ZI-1) are arylsulfonium compounds, i.e., compounds each containing an arylsulfonium as a cation.

With respect to the compounds (ZI-1), all of $R_{201}$ to $R_{203}$ may be aryl groups. It is also appropriate that $R_{201}$ to $R_{203}$ are partially an aryl group and the remainder is an alkyl group. When any of the compounds (ZI-1) contains a plurality of aryl groups, the aryl groups may be identical to or different from each other.

As the compounds (ZI-1), there can be mentioned, for example, a triarylsulfonium compound, a diarylalkylsulfonium compound and an aryldialkylsulfonium compound.

The aryl group contained in the compounds (ZI-1) is preferably a phenyl group, a naphthyl group, or a heteroaryl group, such as an indole residue or a pyrrole residue. A phenyl group, a naphthyl group and an indole residue are especially preferred.

The alkyl group contained in the compounds (ZI-1) according to necessity is preferably a linear, branched or cyclic alkyl group having 1 to 15 carbon atoms. As such, there can be mentioned, for example, a methyl group, an ethyl group, a propyl group, an n-butyl group, a sec-butyl group, a t-butyl group, a cyclopropyl group, a cyclobutyl group or a cyclohexyl group.

Substituents may be introduced in these aryl and alkyl groups. As the substituents, there can be mentioned, for example, an alkyl group (preferably 1 to 15 carbon atoms), an aryl group (preferably 6 to 14 carbon atoms), an alkoxy group (preferably 1 to 15 carbon atoms), a halogen atom, a hydroxyl group and a phenylthio group.

Preferred substituents are a linear, branched or cyclic alkyl group having 1 to 12 carbon atoms and a linear, branched or cyclic alkoxy group having 1 to 12 carbon atoms. Most preferred substituents are an alkyl group having 1 to 6 carbon atoms and an alkoxy group having 1 to 6 carbon atoms. The substituents may be introduced in any one of three $R_{201}$ to $R_{203}$, or alternatively may be introduced in all three of $R_{201}$ to $R_{203}$. When $R_{201}$ to $R_{203}$ are phenyl groups, the substituent preferably lies at the p-position of the aryl group.

Further, forms in which one or two of $R_{201}$, $R_{202}$ and $R_{203}$ are optionally substituted aryl groups and the remainder is a linear, branched or cyclic alkyl group are preferred. As particular examples of such structures, there can be mentioned those described in sections 0141 to 0153 of JP-A-2004-210670.

The above aryl groups are, for example, the same as mentioned above in connection with $R_{201}$, $R_{202}$ and $R_{203}$, preferably a phenyl group and a naphthyl group. The aryl groups preferably contain any of a hydroxyl group, an alkoxy group and an alkyl group as a substituent. The substituent is preferably an alkoxy group having 1 to 12 carbon atoms, more preferably an alkoxy group having 1 to 6 carbon atoms.

The above linear, branched or cyclic alkyl group as the remainder is preferably an alkyl group having 1 to 6 carbon atoms. A substituent may further be introduced in the group. When there are two remainder groups, these two may be bonded to each other to thereby form a ring structure.

The compounds (ZI-1) are, for example, those of general formula (ZI-1A) below.

(ZI-1A)

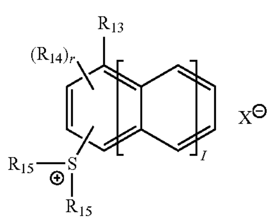

In general formula (ZI-1A), $R_{13}$ represents a hydrogen atom, a fluorine atom, a hydroxyl group, an alkyl group, a cycloalkyl group, an alkoxy group or an alkoxycarbonyl group.

$R_{14}$, each independently in the instance of $R_{14}$s, represents any of an alkyl group, a cycloalkyl group, an alkoxy group, an alkylsulfonyl group or a cycloalkylsulfonyl group.

Each of $R_{15}$s independently represents an alkyl group or a cycloalkyl group, provided that the two $R_{15}$s may be bonded to each other to thereby form a ring structure.

In the formula, 1 is an integer of 0 to 2, and r is an integer of 0 to 8.

$X^-$ represents a normucleophilic anion. As such, there can be mentioned, for example, any of the same normucleophilic anions as mentioned with respect to the $X^-$ of general formula (ZI).

The alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are especially preferred.

As the cycloalkyl groups represented by $R_{13}$, $R_{14}$ and $R_{15}$, there can be mentioned, for example, a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, a cyclooctadienyl group and the like. Of these cycloalkyl groups, a cyclopropyl group, a cyclopentyl group, a cyclohexyl group, a cycloheptyl group and cyclooctyl group are especially preferred.

As the alkyl moieties in the alkoxy groups represented by $R_{13}$ and $R_{14}$, those explained for the alkyl groups represented by $R_{13}$, $R_{14}$ and $R_{15}$ can be exemplified. As the alkoxy group, a methoxy group, an ethoxy group, an n-propoxy group, and an n-butoxy group are especially preferred.

As the cycloalkyl moieties in the cycloalkoxy groups represented by $R_{13}$ and $R_{14}$, those explained for the cycloalkyl groups represented by $R_{13}$, $R_{14}$ and $R_{15}$ can be exemplified. As the cycloalkoxy group, a cyclopentyloxy group and a cyclohexyloxy group are especially preferred.

As the alkoxy moieties in the alkoxycarbonyl groups represented by $R_{13}$, those explained for the alkoxy groups represented by $R_{13}$, $R_{14}$ and $R_{15}$ can be exemplified. As the alkoxycarbonyl group, a methoxycarbonyl group, an ethoxycarbonyl group, and an n-butoxycarbonyl group are especially preferred.

As the alkyl moieties in the alkylsulfonyl groups represented by $R_{14}$, those explained for the alkyl groups represented by $R_{13}$, $R_{14}$ and $R_{15}$ can be exemplified. As the alkyl moieties in the cycloalkylsulfonyl groups represented by $R_{14}$, those explained for the cycloalkyl groups represented by $R_{13}$, $R_{14}$ and $R_{15}$ can be exemplified. As the alkylsulfonyl group and the cycloalkylsulfonyl group, a methylsulfonyl group, an ethylsulfonyl group, an n-propylsulfonyl group, an n-butylsulfonyl group, a cyclopentylsulfonyl group, and a cyclohexyl sulfonyl group are especially preferred.

l preferably is 0 or 1, and more preferably is 1. r preferably is an integer of 0 to 2.

Each of the groups may have one or more substituents. As such substituent, there can be mentioned, for example, a halogen atom (e.g., a fluorine atom), a hydroxyl group, a carboxyl group, a cyano group, a nitro group, an alkoxy group, a cycloalkyloxy group, an alkoxyalkyl group, a cycloalkoxyalkyl group, an alkoxycarbonyl group, a cycloalkoxycarbonyl group, an alkoxycarbonyloxy group, a cycloalkoxycarbonyloxy group, or the like.

As the alkoxy group, there can be mentioned, for example, a linear or branched alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, and a t-butoxy group.

As the cycloalkoxy group, there can be mentioned, for example, those having 3 to 20 carbon atoms, such as a cyclopentyloxy group and a cyclohexyloxy group.

As the alkoxyalkyl group, there can be mentioned, for example, a linear or branched alkoxyalkyl group having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

As the cycloalkoxyalkyl group, there can be mentioned, for example, those having 4 to 21 carbon atoms, such as a cyclopentyloxyethyl group, a cyclopentyloxypethyl group, a cyclohexyloxyethyl group, and a cyclohexyloxypethyl group.

As the alkoxycarbonyl group, there can be mentioned, for example, a linear or branched alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, and a t-butoxycarbonyl group.

As the cycloalkoxycarbonyl group, there can be mentioned, for example, those having 4 to 21 carbon atoms, such as a cyclopentyloxycarbonyl group and a cyclohexyloxycarbonyl group.

As the alkoxycarbonyloxy group, there can be mentioned, for example, a linear or branched alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, and a t-butoxycarbonyloxy group.

As the cycloalkoxycarbonyloxy group, there can be mentioned, for example, those having 4 to 21 carbon atoms, such as a cyclopentyloxycarbonyloxy group and a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-1A).

The cyclic structure may have substituents. As such substituents, there can be mentioned, for example, a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group and the like. A plurality of such a substituents may be introduced in this ring structure. The plurality of such substituents may be bonded to each other to thereby form a ring (for example, any of aromatic or nonaromatic hydrocarbon rings, aromatic or nonaromatic heterocycles, and polycyclic condensed rings each comprised of a combination of two or more of these).

It is especially preferred for the $R_{15}$ to be a methyl group, an ethyl group, or the bivalent group allowing two $R_{15}$s to be bonded to each other so as to form a tetrahydrothiophene ring structure in cooperation with the sulfur atom of the general formula (ZI-1A).

Substituents may further be introduced in the alkyl group, cycloalkyl group, alkoxy group and alkoxycarbonyl group represented by $R_{13}$, and the alkyl group, cycloalkyl group, alkoxy group, alkylsulfonyl group and cycloalkylsulfonyl group represented by $R_{14}$. As such a substituent, there can be mentioned, for example, a hydroxyl group, an alkoxy group, an alkoxycarbonyl group, a halogen atom (especially, a fluorine atom) or the like.

Specific examples of the cation moieties in the compounds represented by general formula (ZI-1A) will be given below.

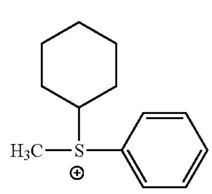

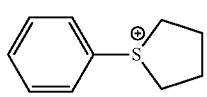

-continued

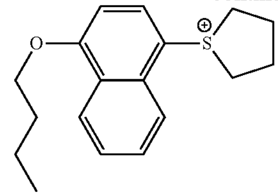

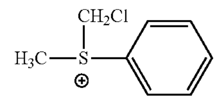

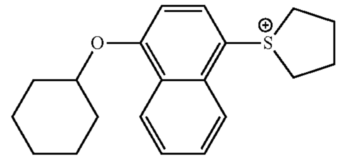

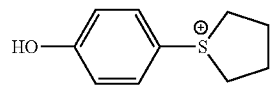

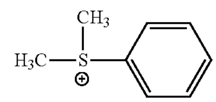

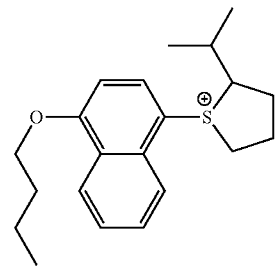

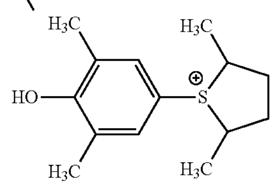

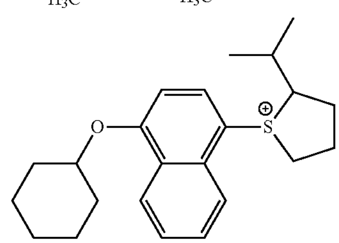

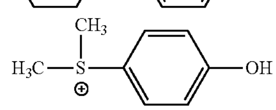

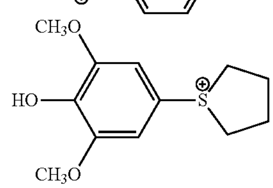

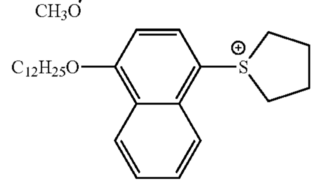

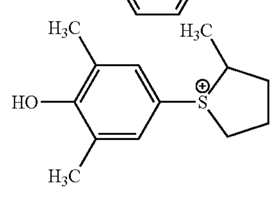

-continued

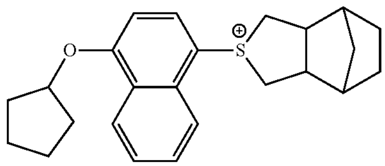

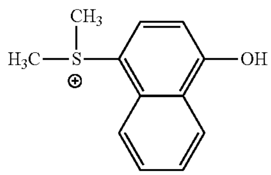

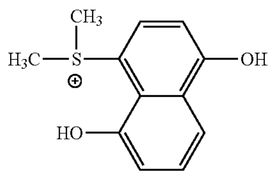

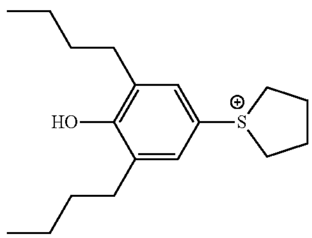

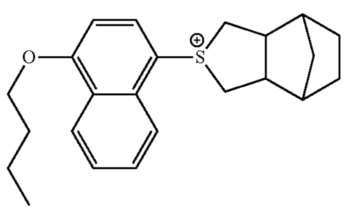

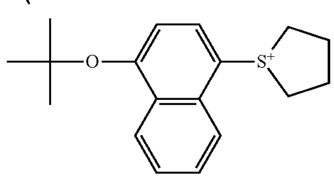

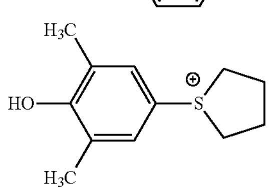

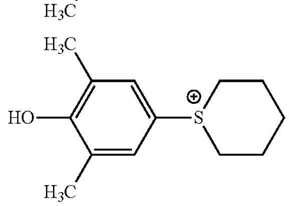

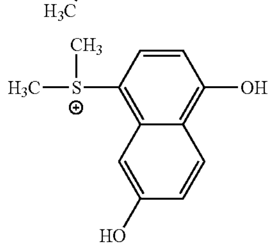

-continued

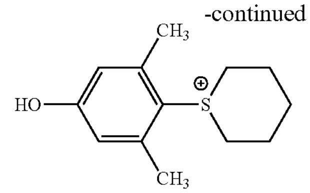

Now, compounds (ZI-2) will be described.

Compounds (ZI-2) are compounds of formula (ZI) wherein each of $R_{201}$ to $R_{203}$ independently represents an organic group containing no aromatic ring. The aromatic rings include an aromatic ring containing a heteroatom.

Each of the organic groups containing no aromatic ring represented by $R_{201}$ to $R_{203}$ has, for example, 1 to 30 carbon atoms, preferably 1 to 20 carbon atoms.

Preferably, each of $R_{201}$ to $R_{203}$ independently represents an alkyl group, a 2-oxoalkyl group, an alkoxycarbonylmethyl group, an allyl group or a vinyl group. A linear, branched or cyclic 2-oxoalkyl group and an alkoxycarbonylmethyl group are more preferred. A linear or branched 2-oxoalkyl group is most preferred.

The alkyl groups represented by $R_{201}$ to $R_{203}$ may be linear, branched or cyclic. As preferred alkyl groups, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group).

The 2-oxoalkyl groups represented by $R_{201}$ to $R_{203}$ may be linear, branched or cyclic. A group having >C═O at the 2-position of any of the above alkyl groups is preferred.

As preferred examples of the alkoxy groups contained in the alkoxycarbonylmethyl groups represented by $R_{201}$ to $R_{203}$, there can be mentioned alkoxy groups each having 1 to 5 carbon atoms (a methoxy group, an ethoxy group, a propoxy group, a butoxy group and a pentoxy group).

$R_{201}$ to $R_{203}$ may be further substituted with, for example, a halogen atom, an alkoxy group (for example, 1 to 5 carbon atoms), a hydroxyl group, a cyano group and/or a nitro group.

Two of $R_{201}$ to $R_{203}$ may be bonded to each other to thereby form a ring structure. With respect to the ring structure, an oxygen atom, a sulfur atom, an ester bond, an amido bond and/or a carbonyl group may be contained in the ring. As the group formed by the mutual bonding of two of $R_{201}$ to $R_{203}$, there can be mentioned, for example, an alkylene group (e.g., a butylene group or a pentylene group).

Below, compounds (ZI-3) will be described.

Compounds (ZI-3) are compounds of general formula (ZI-3) below, being compounds with a phenacylsulfonium salt structure.

(ZI-3)

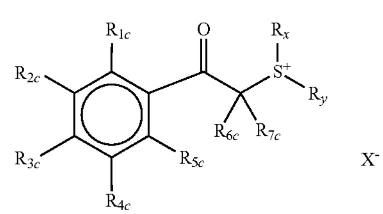

In the formula, each of $R_{1c}$ to $R_{5c}$ independently represents a hydrogen atom, an alkyl group, an alkoxy group or a halogen atom. Each of the alkyl group and alkoxy group preferably has 1 to 6 carbon atoms.

Each of $R_{6c}$ and $R_{7c}$ represents a hydrogen atom or an alkyl group. The alkyl group preferably has 1 to 6 carbon atoms.

Each of $R_x$ and $R_y$ independently represents an alkyl group, a 2-oxoalkyl group, an alkoxycarbonylmethyl group, an allyl group or a vinyl group. Each of these atomic groups preferably has 1 to 6 carbon atoms.

Any two or more of $R_{1c}$ to $R_{7c}$ may be bonded to each other to thereby form a ring structure. $R_x$ and $R_y$ may be bonded to each other to thereby form a ring structure. Each of these ring structures may contain an oxygen atom, a sulfur atom, an ester bond and/or an amido bond.

$X^-$ as a moiety of general formula (ZI-3) is as defined above in connection with general formula (ZI).

As particular examples of the compounds (ZI-3), there can be mentioned compounds shown as examples in sections 0047 and 0048 of JP-A-2004-233661 and sections 0040 to 0046 of JP-A-2003-35948.

Further, compounds (ZI-4) will be described below.

Compounds (ZI-4) are compounds containing any of cations of general formula (ZI-4) below. The compounds (ZI-4) are effective in the suppression of outgassing.

(ZI-4)

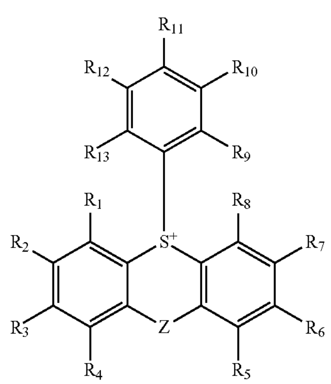

In general formula (ZI-4), each of $R^1$ to $R^{13}$ independently represents a hydrogen atom or a substituent. It is preferred for at least one of $R^1$ to $R^{13}$ to be a substituent containing an alcoholic hydroxyl group. Herein, the term "alcoholic hydroxyl group" means a hydroxyl group bonded to a carbon atom of an alkyl group.

Z represents a single bond or a bivalent connecting group.

When $R^1$ to $R^{13}$ are substituents containing an alcoholic hydroxyl group, it is preferred for $R^1$ to $R^{13}$ to represent the groups of the formula —(W—Y), wherein Y represents a hydroxyl-substituted alkyl group and W represents a single bond or a bivalent connecting group.

As preferred examples of the alkyl groups represented by Y, there can be mentioned an ethyl group, a propyl group and an isopropyl group. Most preferably, Y contains the structure of $—CH_2CH_2OH$.

The bivalent connecting group represented by W is not particularly limited. Preferably, W is a single bond or a bivalent group as obtained by replacing with a single bond any hydrogen atom of an alkoxy group, an acyloxy group, an acylamino group, an alkyl- or arylsulfonylamino group, an alkylthio group, an alkylsulfonyl group, an acyl group, an alkoxycarbonyl group or a carbamoyl group. More preferably, W is a single bond, or a bivalent group as obtained by replacing with a single bond any hydrogen atom of an acyloxy group, an alkylsulfonyl group, an acyl group or an alkoxycarbonyl group.

When $R^1$ to $R^{13}$ represent substituents containing an alcoholic hydroxyl group, the number of carbon atoms contained in each of the substituents is preferably in the range of 2 to 10, more preferably 2 to 6 and most preferably 2 to 4.

Each of the substituents containing an alcoholic hydroxyl group represented by $R^1$ to $R^{13}$ may contain two or more alcoholic hydroxyl groups. The number of alcoholic hydroxyl groups contained in each of the substituents containing an alcoholic hydroxyl group represented by $R^1$ to $R^{13}$ is in the range of 1 to 6, preferably 1 to 3 and more preferably 1.

The number of alcoholic hydroxyl groups contained in each of the compounds of general formula (ZI-4) as the sum of those of $R^1$ to $R^{13}$ is in the range of 1 to 10, preferably 1 to 6 and more preferably 1 to 3.

When $R^1$ to $R^{13}$ do not contain any alcoholic hydroxyl group, as the substituents represented by $R^1$ to $R^{13}$, there can be mentioned, for example, a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a phosphono group, a silyl group, a hydrazino group, a ureido group, a boronic acid group ($—B(OH)_2$), a phosphato group ($—OPO(OH)_2$), a sulfato group ($—OSO_3H$) and any of other substituents known in the art.

When $R^1$ to $R^{13}$ do not contain any alcoholic hydroxyl group, each of $R^1$ to $R^{13}$ preferably represents a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^1$ to $R^{13}$ do not contain any alcoholic hydroxyl group, each of $R^1$ to $R^{13}$ more preferably represents a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^1$ to $R^{13}$ do not contain any alcoholic hydroxyl group, each of $R^1$ to $R^{13}$ most preferably represents a hydrogen atom, an alkyl group, a cycloalkyl group, a halogen atom or an alkoxy group.

Any two adjacent to each other of $R^1$ to $R^{13}$ may be bonded to each other to thereby form a ring. The thus formed rings include an aromatic or nonaromatic hydrocarbon ring and heterocycle. These rings may be further combined to thereby form condensed rings.

With respect to the compounds (ZI-4), preferably, at least one of $R^1$ to $R^{13}$ has a structure containing an alcoholic hydroxyl group. More preferably, at least one of $R^9$ to $R^{13}$ has a structure containing an alcoholic hydroxyl group.

As mentioned above, Z represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, an aminocarbonylamino group or an aminosulfonylamino group.

A substituent may be introduced in the bivalent connecting group. The substituent is, for example, the same as any of those set forth above in connection with $R^1$ to $R^{13}$.

Preferably, Z is a bond or group exhibiting no electron withdrawing properties, such as a single bond, an alkylene group, an arylene group, an ether group, a thioether group, an amino group, —CH═CH—, an aminocarbonylamino group or an aminosulfonylamino group. More preferably, Z is a single bond, an ether group or a thioether group. Most preferably, Z is a single bond.

General formulae (ZII) and (ZIII) will be described below.

In general formulae (ZII) and (ZIII), each of $R_{204}$, $R_{205}$, $R_{206}$ and $R_{207}$ independently represents an aryl group, an alkyl group or a cycloalkyl group. Substituents may be introduced in these aryl, alkyl and cycloalkyl groups.

As preferred examples of the aryl groups represented by $R_{204}$, $R_{205}$, $R_{206}$ and $R_{207}$, there can be mentioned the same groups as set forth above in connection with $R_{201}$ to $R_{203}$ of compounds (ZI-1).

As preferred examples of the alkyl and cycloalkyl groups represented by $R_{204}$, $R_{205}$, $R_{206}$ and $R_{207}$, there can be mentioned the same linear, branched or cyclic alkyl groups as set forth above in connection with $R_{201}$ to $R_{203}$ of compounds (ZI-2).

$X^-$ of general formulae (ZII) and (ZIII) is as defined above in connection with general formula (ZI).

As other preferred examples of photoacid generators, there can be mentioned the compounds of general formulae (ZIV), (ZV) and (ZVI).

ZIV $$Ar_3—SO_2—SO_2—Ar_4$$

-continued

ZV

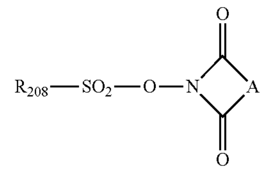

ZVI

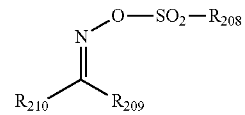

In general formulae (ZIV) to (ZVI), each of $Ar_3$ and $Ar_4$ independently represents a substituted or unsubstituted aryl group.

Each of $R_{208}$'s of general formulae (ZV) and (ZVI) independently represents an alkyl group, a cycloalkyl group or an aryl group. These alkyl, cycloalkyl and aryl groups may be substituted or unsubstituted.

These groups are preferably substituted with a fluorine atom. If so, the strength of the acid generated by the photoacid generator can be enhanced.

Each of $R_{209}$ and $R_{210}$ independently represents an alkyl group, a cycloalkyl group, an aryl group or an electron withdrawing group. These alkyl, cycloalkyl, aryl and electron withdrawing groups may be substituted or unsubstituted.

$R_{209}$ is preferably a substituted or unsubstituted aryl group.

$R_{210}$ is preferably an electron withdrawing group. The electron withdrawing group is preferably a cyano group or a fluoroalkyl group.

A represents an alkylene group, an alkenylene group or an arylene group. Substituents may be introduced in these alkylene, alkenylene and arylene groups.

A compound with a plurality of structures of general formula (ZVI) is also preferred as a photoacid generator. As such a compound, there can be mentioned, for example, a compound with a structure wherein $R_{209}$ or $R_{210}$ of any of compounds of general formula (ZVI) is bonded to $R_{209}$ or $R_{210}$ of another of compounds of general formula (ZVI).

As a photoacid generator, the compounds of general formulae (ZI) to (ZIII) are preferred. The compounds of general formulae (ZI) are more preferred. The compounds (ZI-1) to (ZI-3) are most preferred.

Compounds containing a group that when acted on by an acid, is decomposed to thereby increase its solubility in an alkali developer can be preferably used as the acid generators in the present invention. As examples of such acid generators, there can be mentioned, for example, the compounds described in JP-A-2005-97254, JP-A-2007-199692, etc.

Particular examples of the photoacid generators are shown below, which in no way limit the scope of the present invention.

B-1

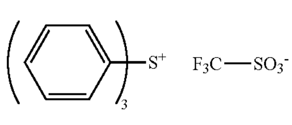

B-2

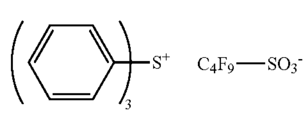

-continued
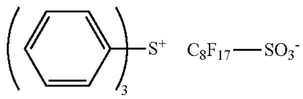
B-3
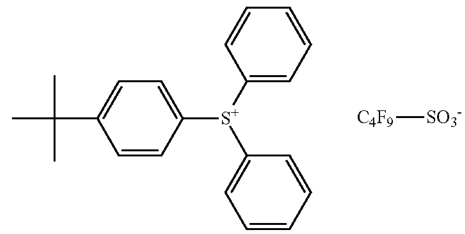
B-4
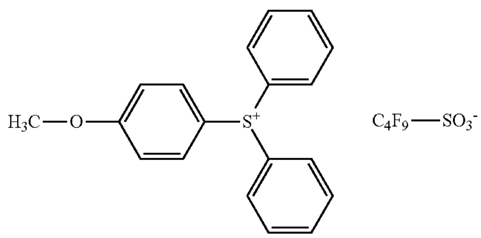
B-5
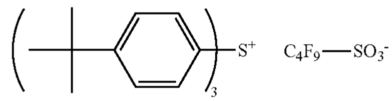
B-6
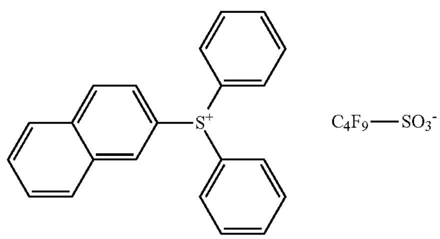
B-7
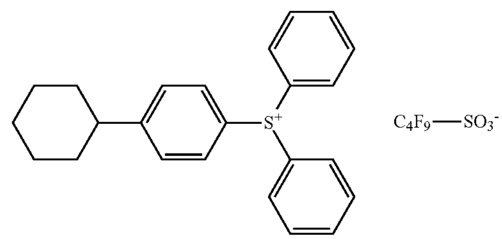
B-8
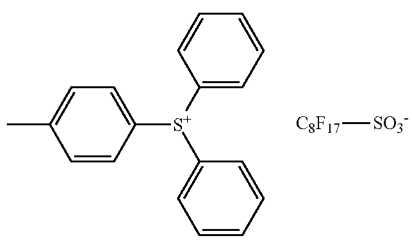
B-9
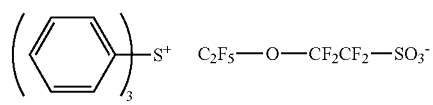
B-10
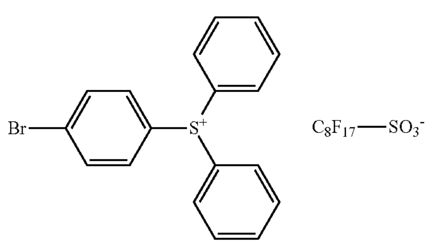
B-11
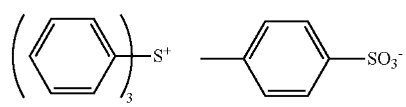
B-12
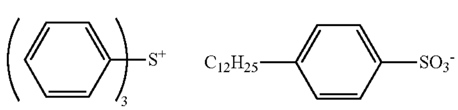
B-13
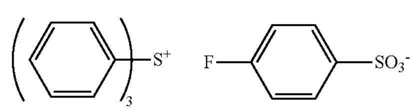
B-14
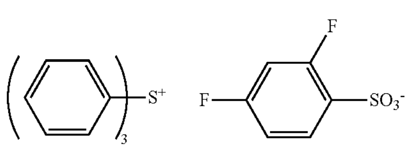
B-15
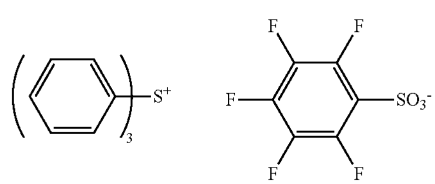
B-16

-continued
B-17
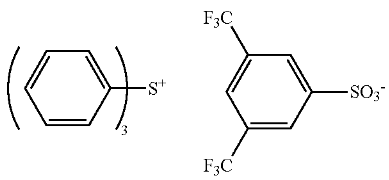
B-18
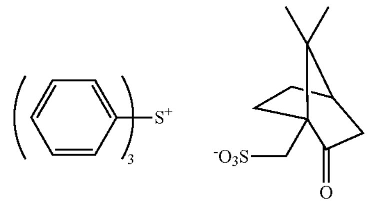
B-19
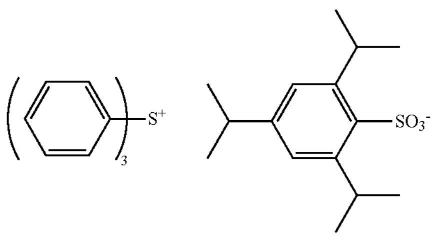
B-20
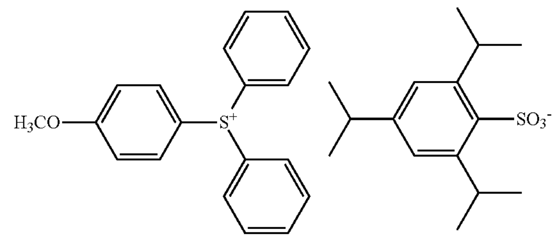
B-21
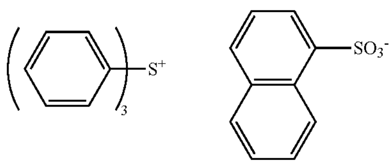
B-22
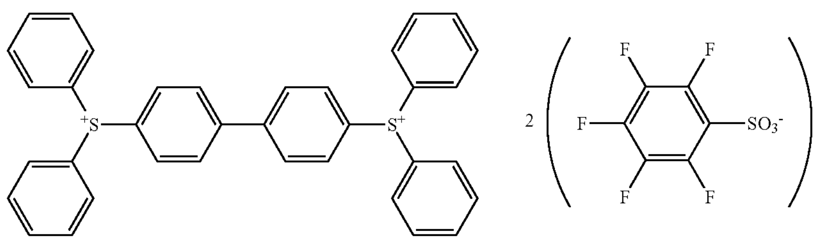
B-23
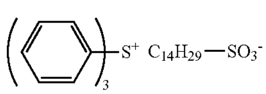
B-24
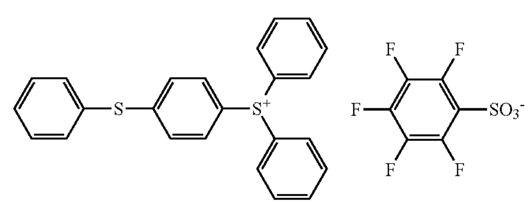
B-25
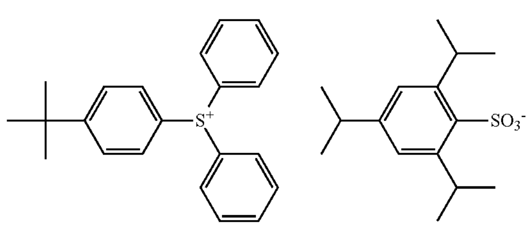
B-26
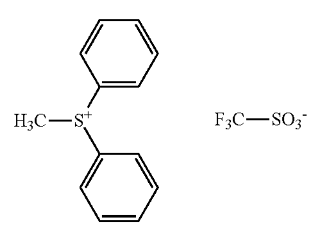
B-27
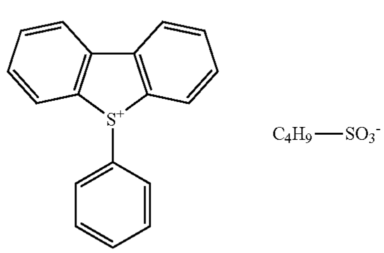
B-28
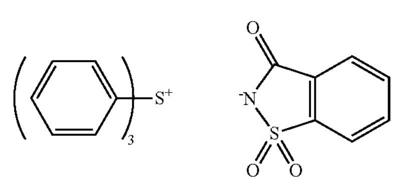

-continued
B-29
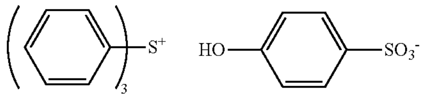
B-30
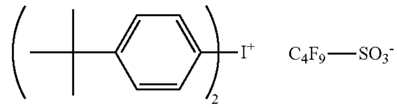
B-31
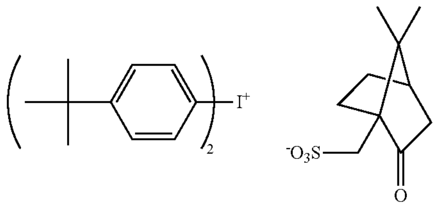
B-32
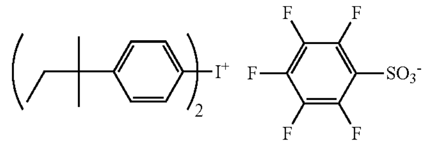
B-33
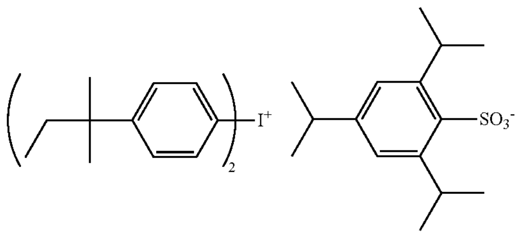
B-34
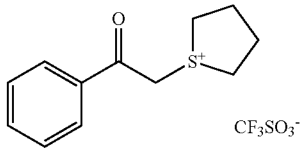
B-35
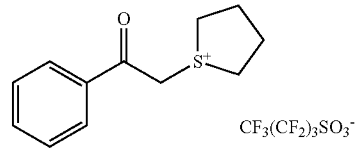
B-36
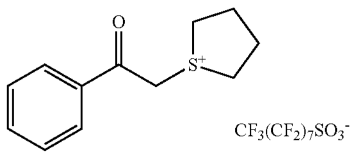
B-37
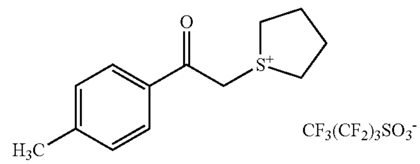
B-38
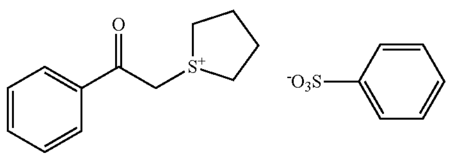
B-39
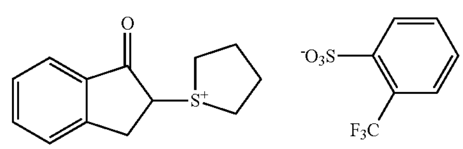
B-40
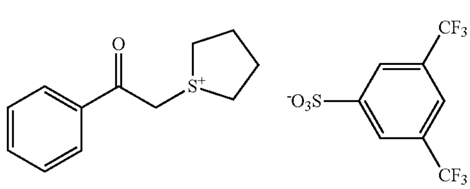
B-41
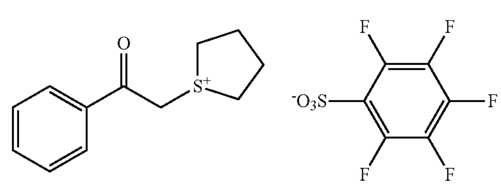
B-42
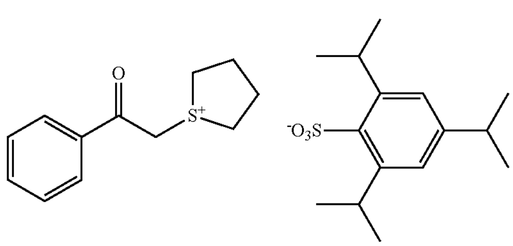
B-43
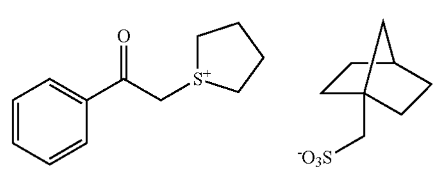

-continued
B-44
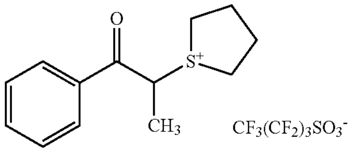
B-45
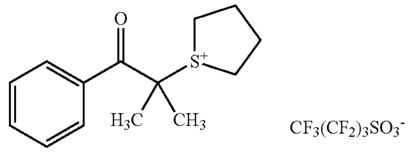
B-46
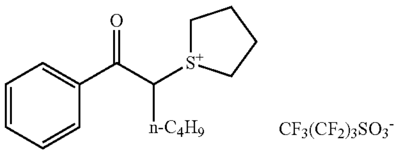
B-47
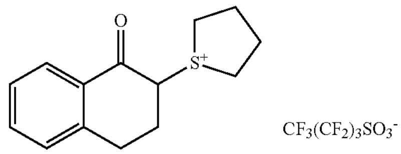
B-48
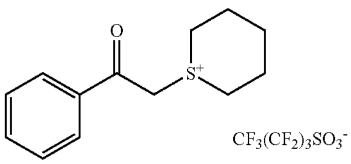
B-49
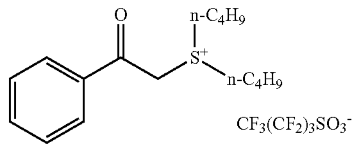
B-50
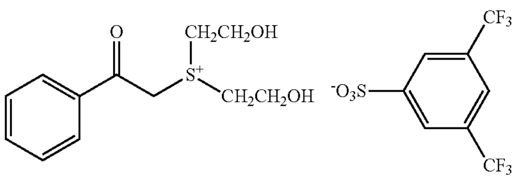
B-51
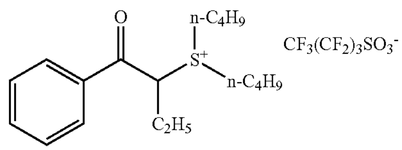
B-52
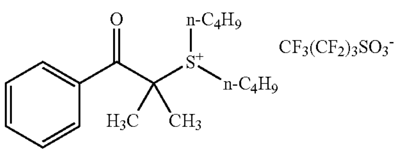
B-53
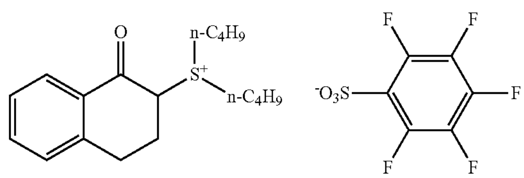
B-54
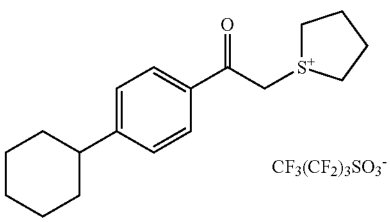
B-55
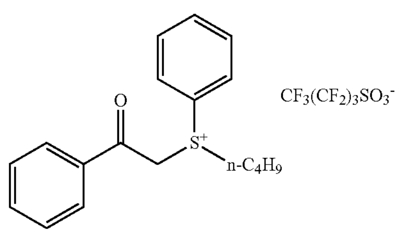
B-56
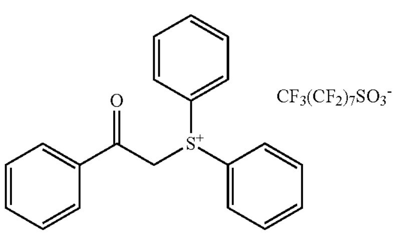
B-57
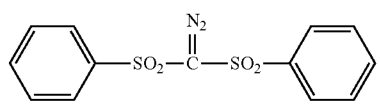
B-58
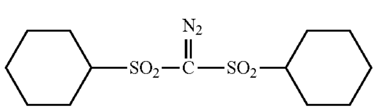
B-59
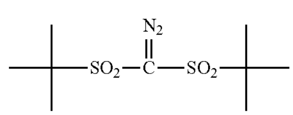
B-60
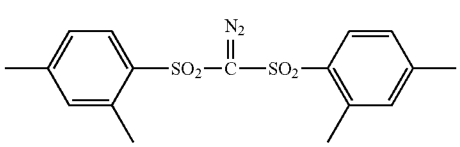
B-61
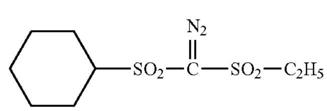

-continued
B-62
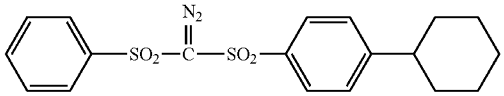
B-63
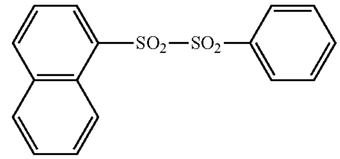
B-64
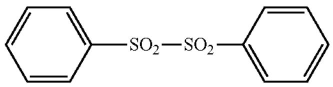
B-65
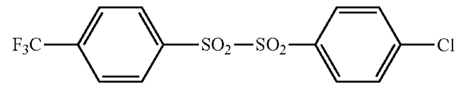
B-66
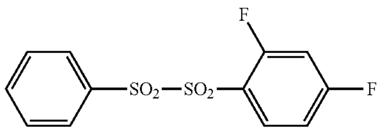
B-67
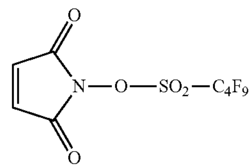
B-68
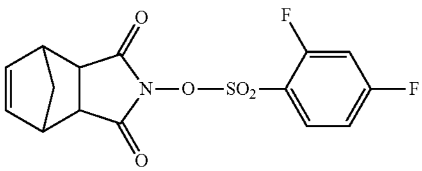
B-69
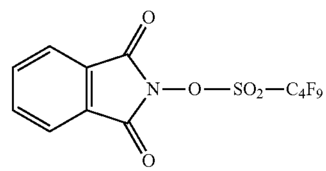
B-70
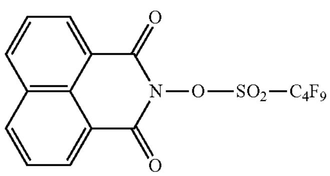
B-71
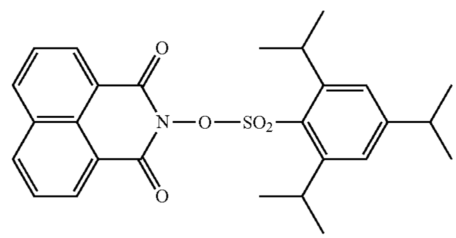
B-72
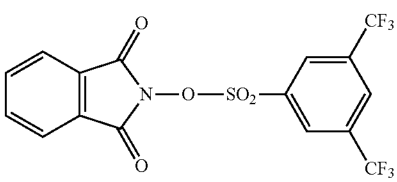
B-73
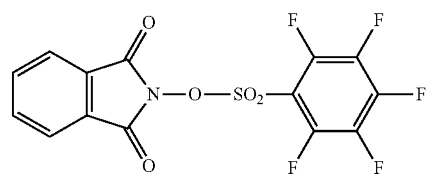
B-74
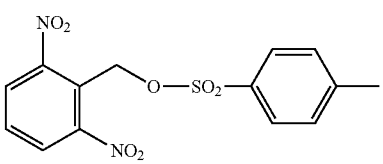
B-75
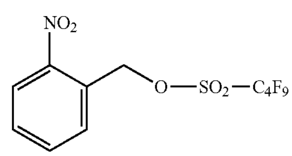
B-76
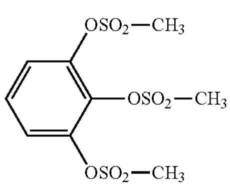
B-77
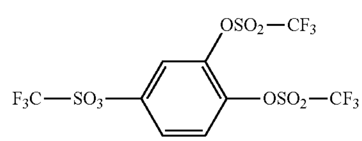
B-78
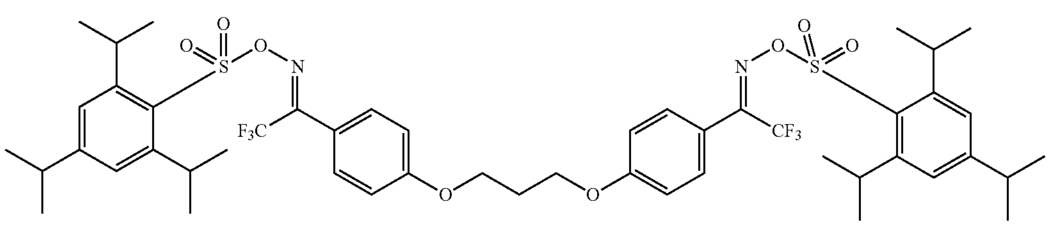

-continued
B-79
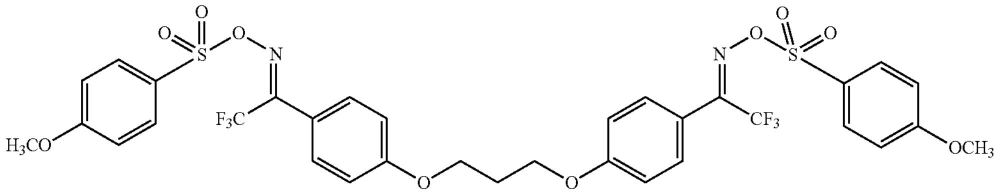
B-80
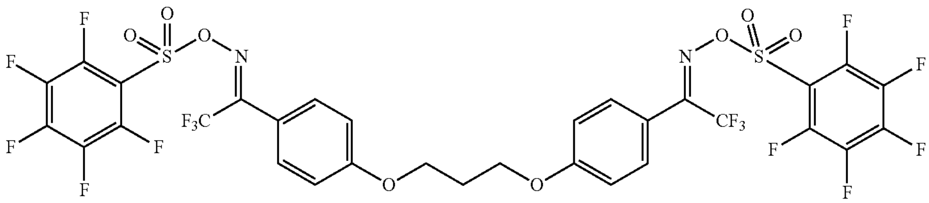
B-81
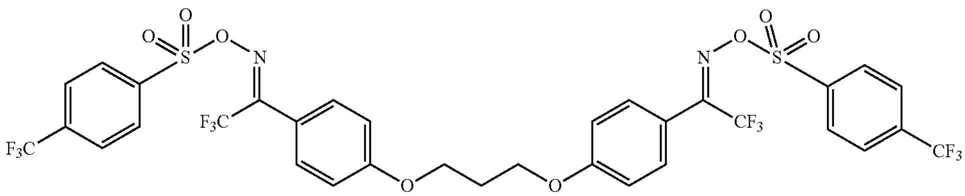
B-82
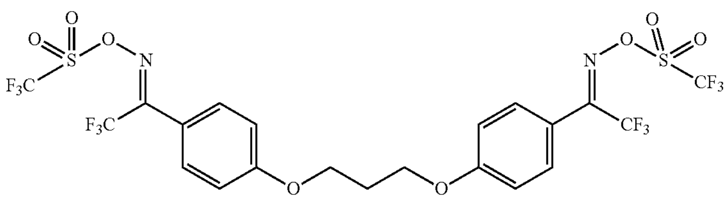
B-83
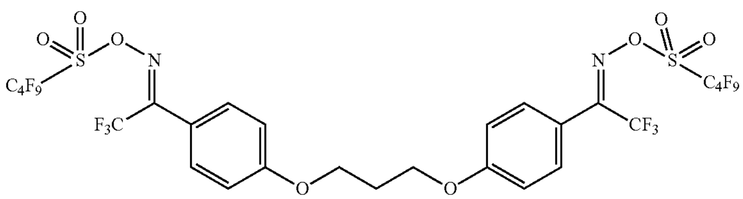
B-84
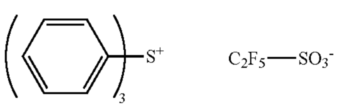
B-85
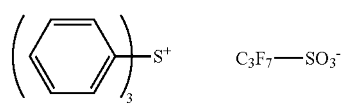
B-86
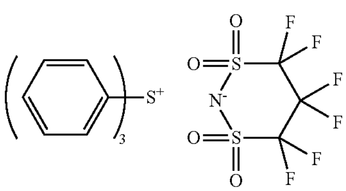
B-87
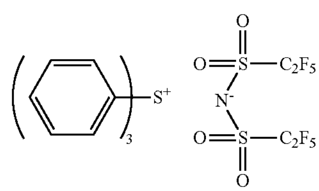
B-88
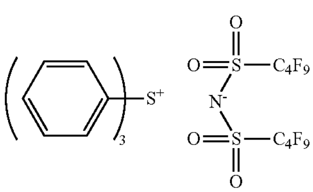
B-89
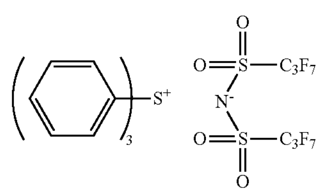
B-90
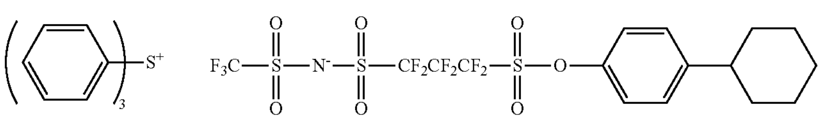

-continued
B-91
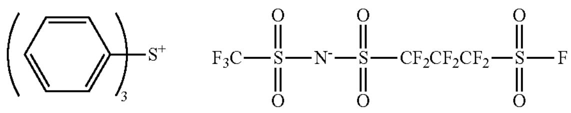
B-92
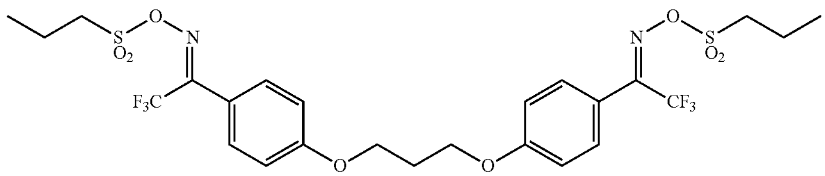
B-93
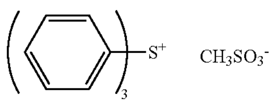
B-94
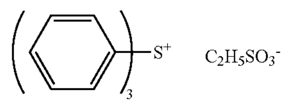
B-95
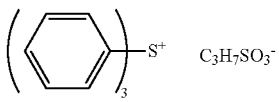
B-96
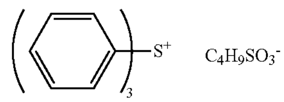
B-97
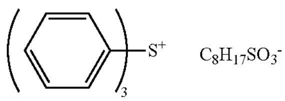
B-98
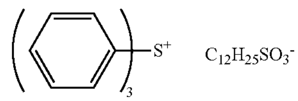
B-99
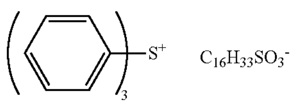
B-100
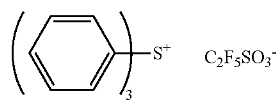
B-101
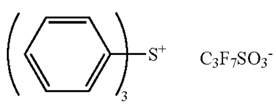
B-102
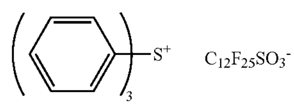
B-103
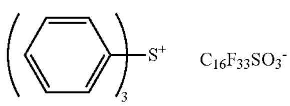
B-104
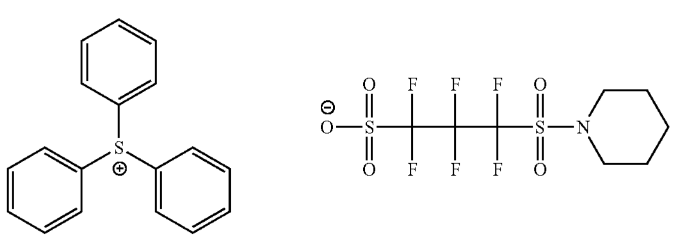
B-105
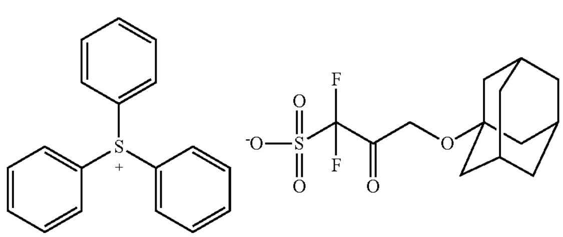
B-106
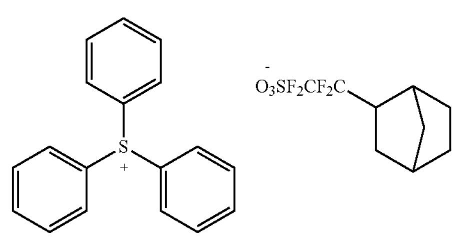

-continued
B-107
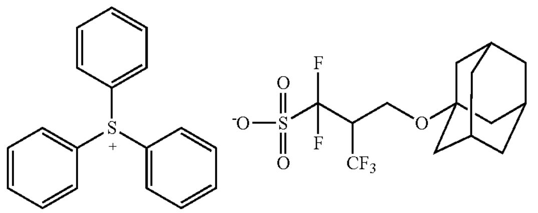
B-108
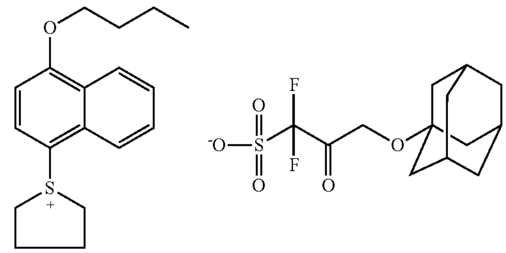
B-109
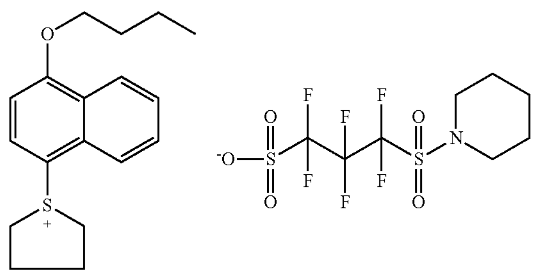
B-110
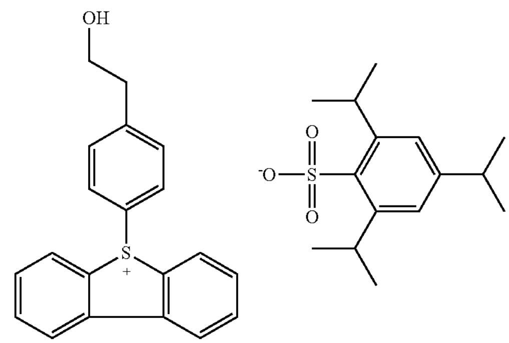
B-111
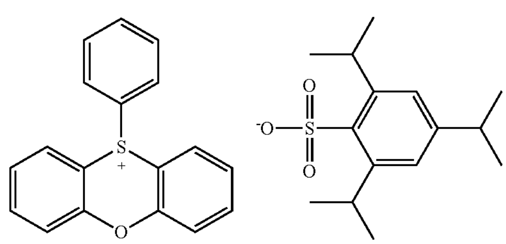
B-112
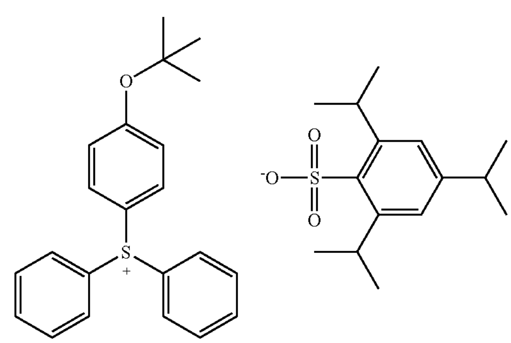
B-113
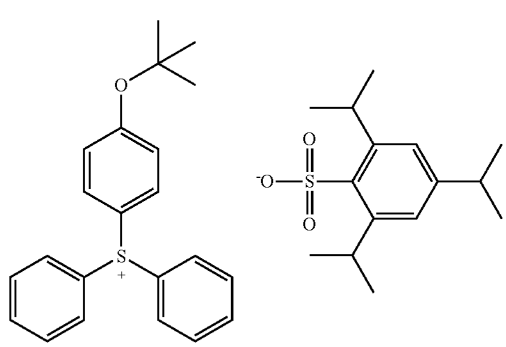
B-114
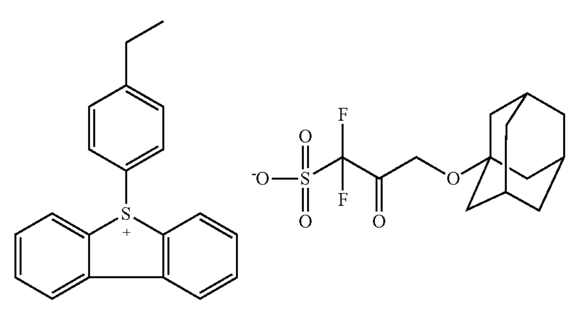

-continued
B-115
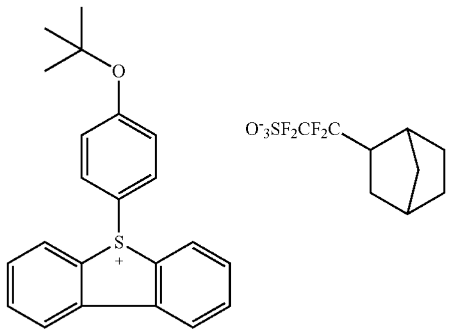
B-116
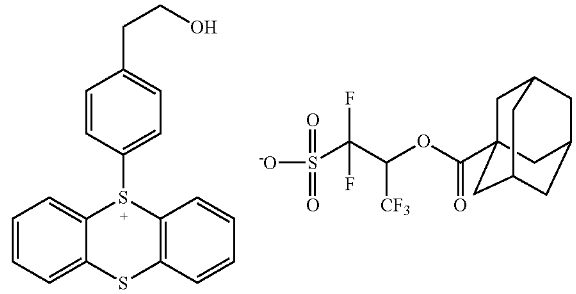
B-117
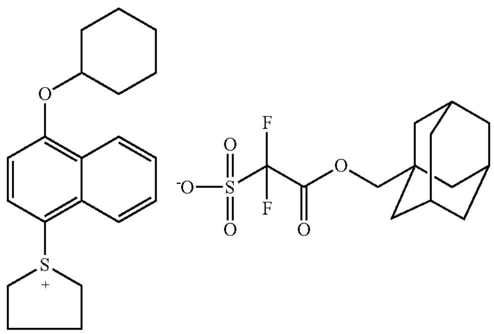
B-118
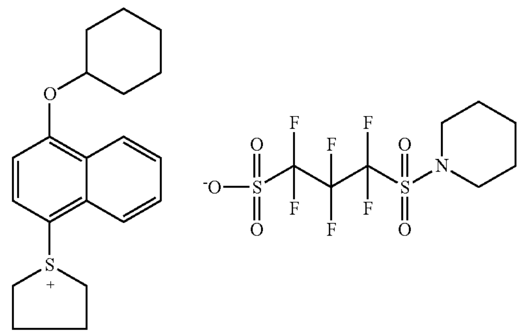
B-119
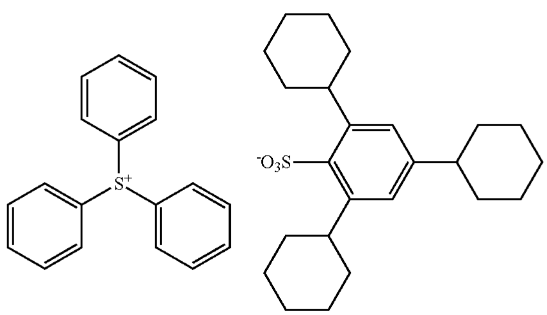
B-120
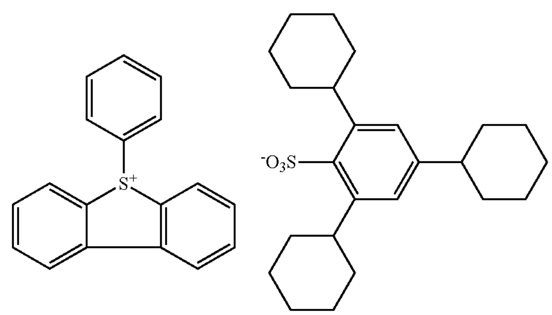
B-121
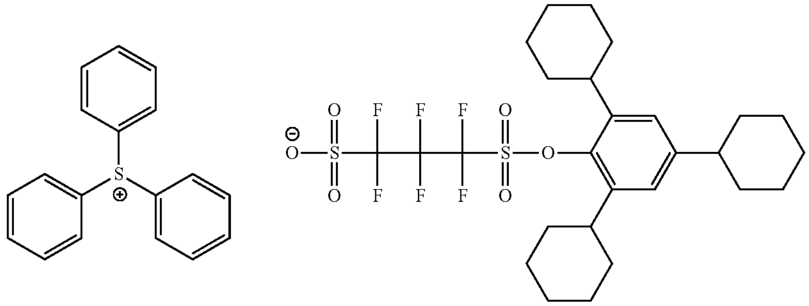

-continued
B-122
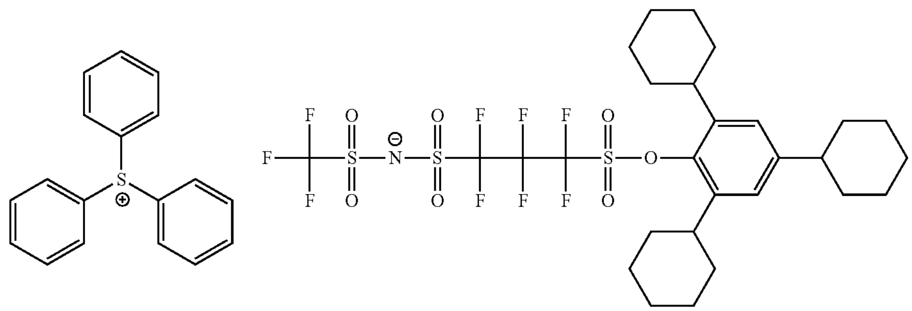
B-123
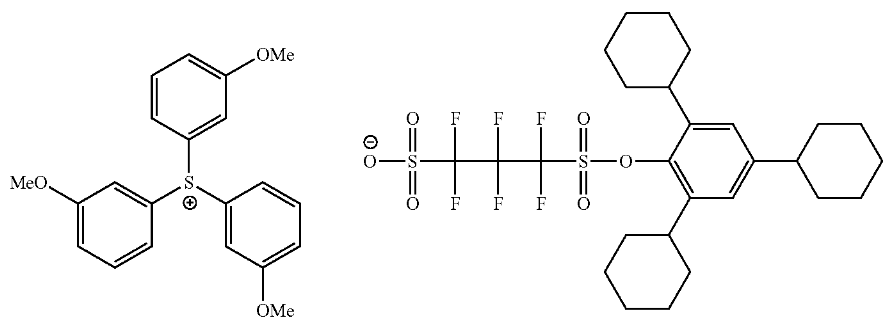
B-124
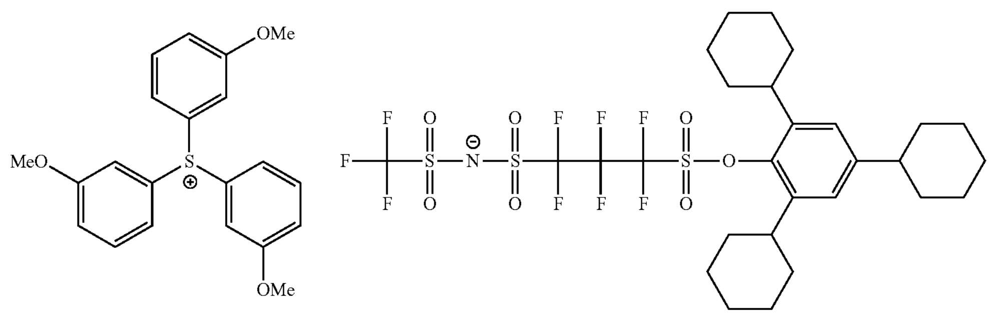
B-125
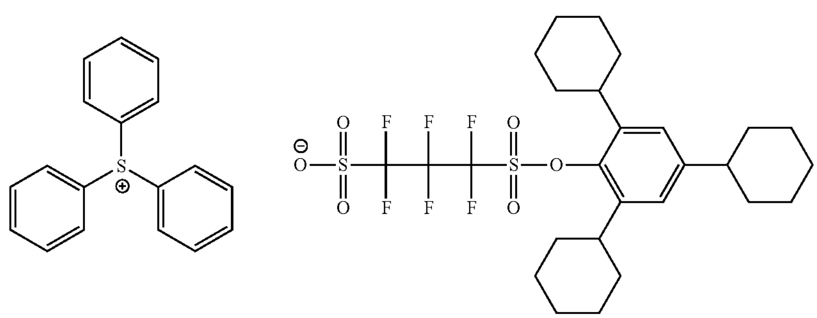
B-126
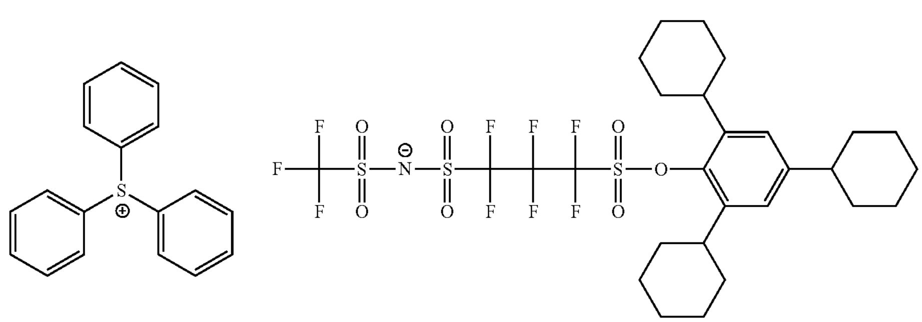

-continued
B-127
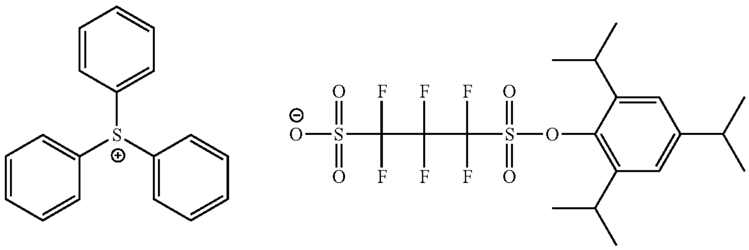
B-128
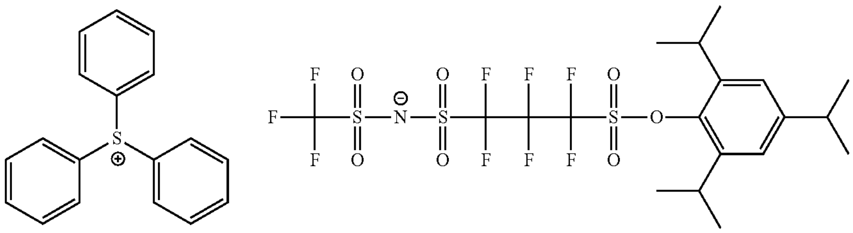
B-129
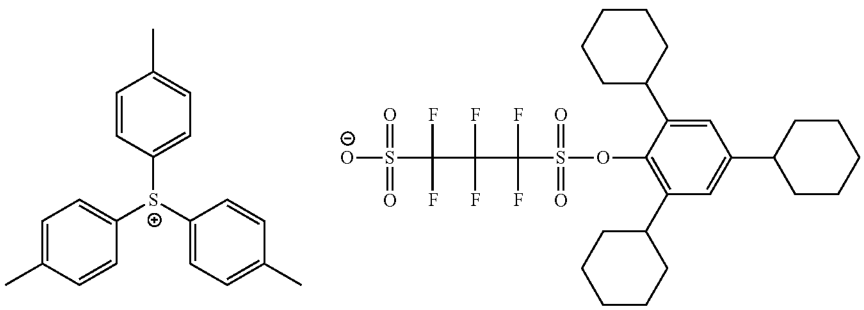
B-130
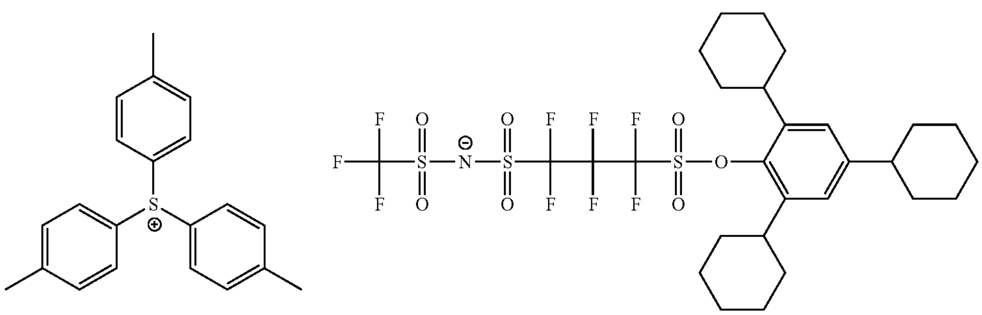
B-131
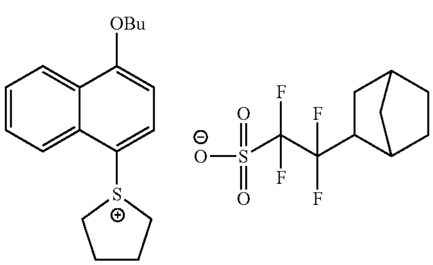
B-132
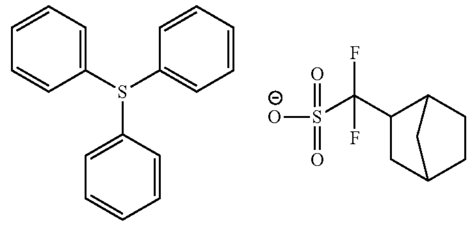
B-133
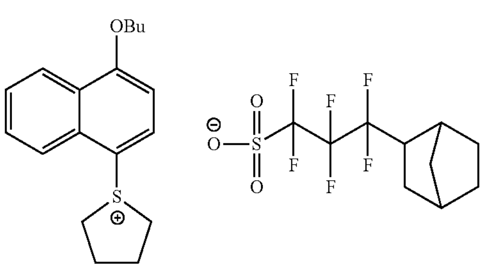
B-134
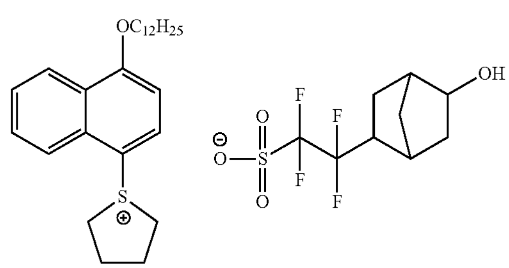

-continued
B-135
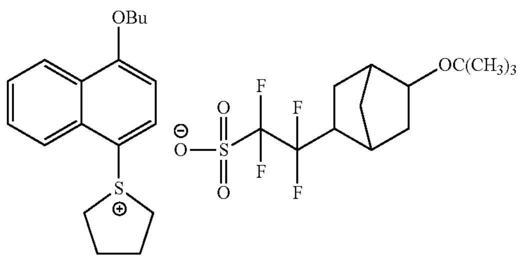
B-136
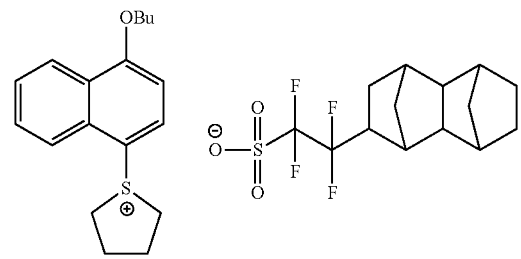
B-137
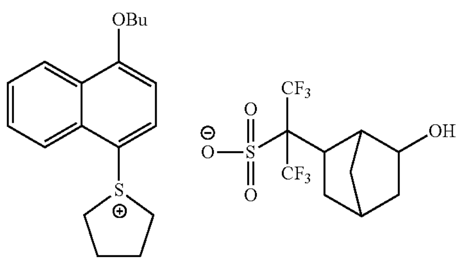
B-138
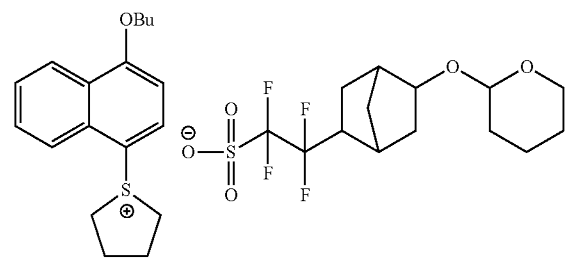
B-139
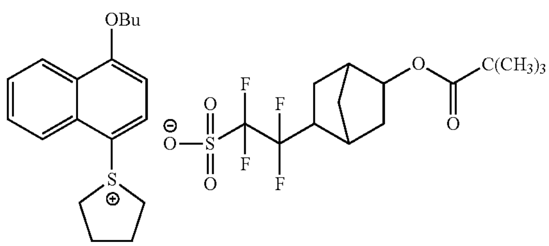
B-140
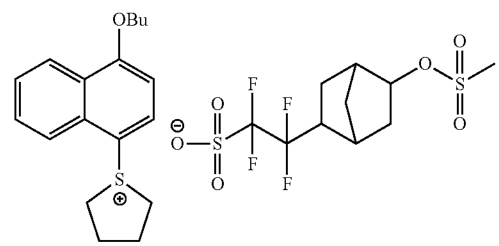
B-141
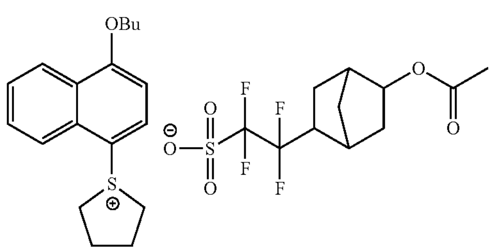
B-142
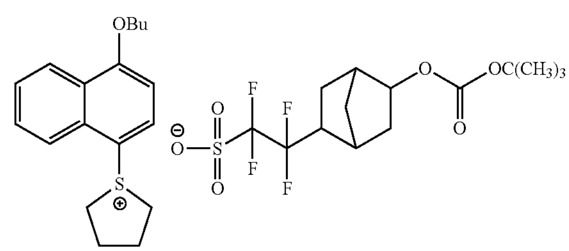
B-143
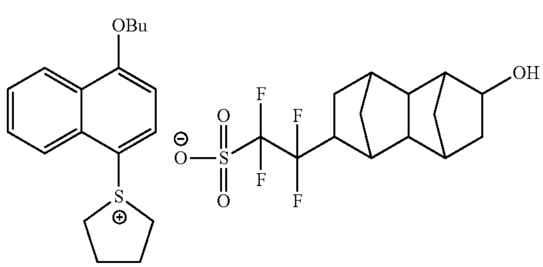
B-144
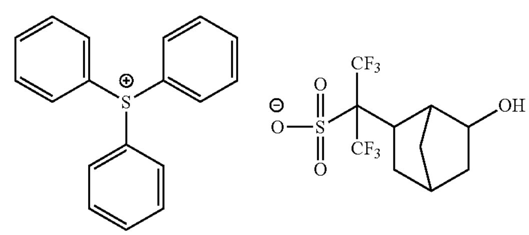
B-145
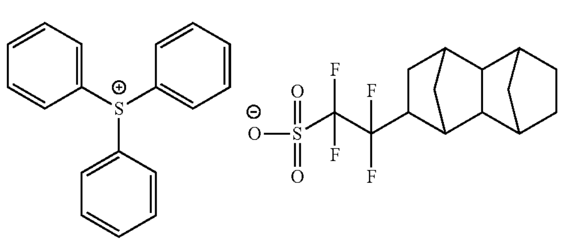
B-146
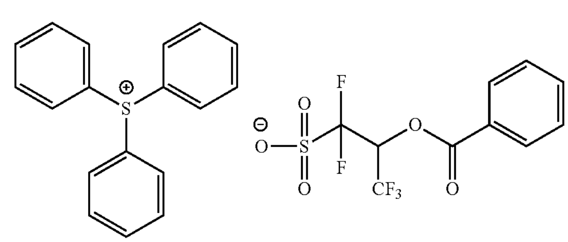

-continued
B-147
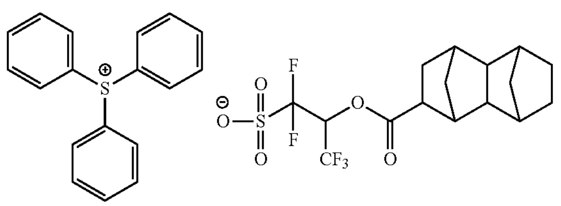
B-148
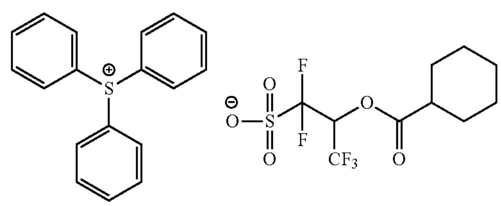
B-149
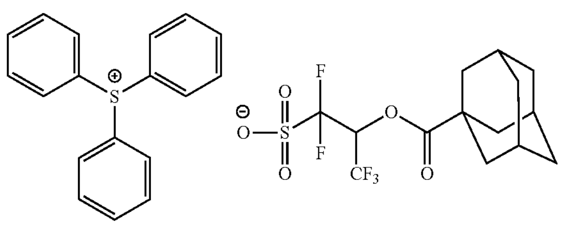
B-150
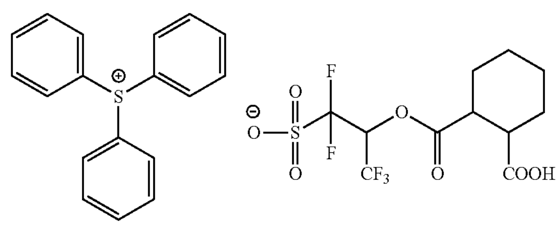
B-151
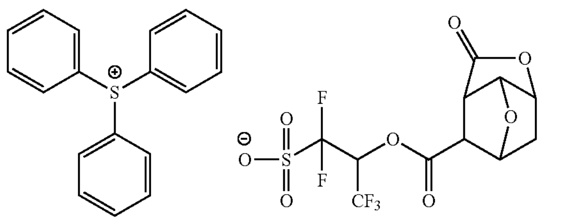
B-152
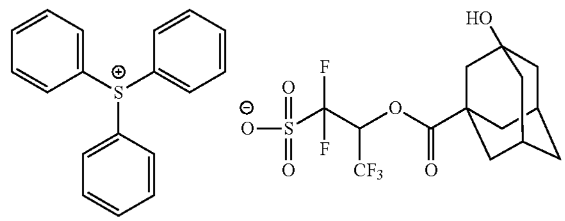
B-153
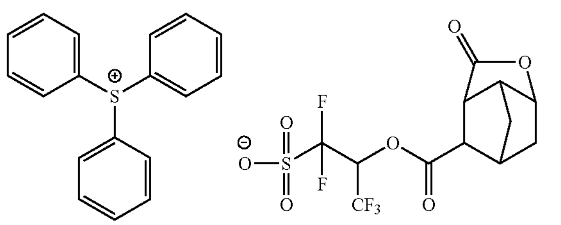
B-154
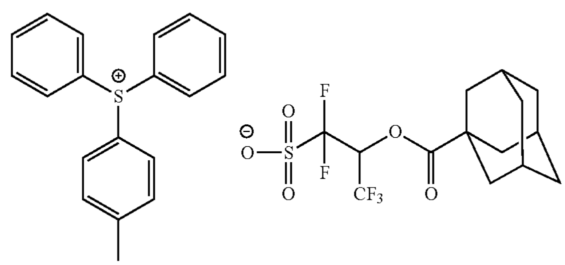
B-155
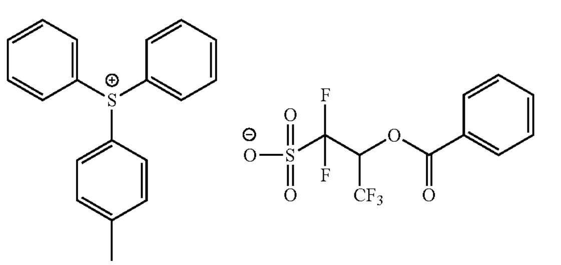
B-156
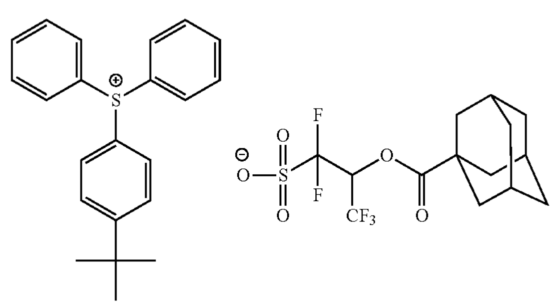
B-157
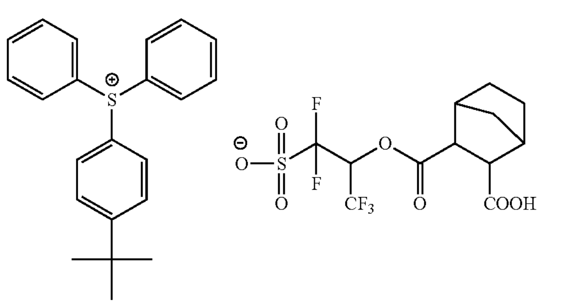
B-158
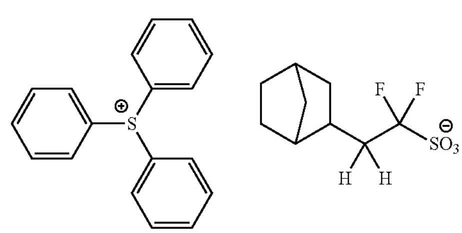

-continued
B-159
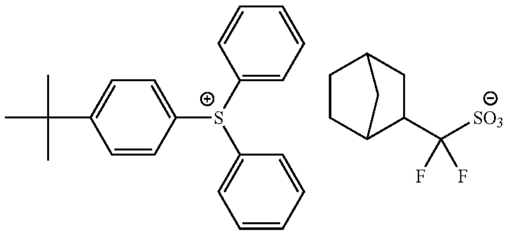
B-160
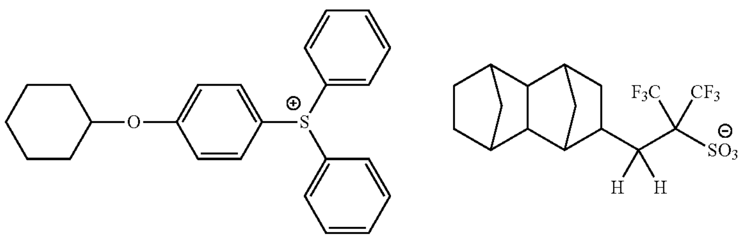
B-161
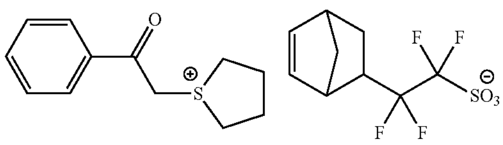
B-162
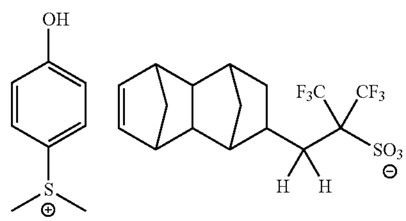
B-163
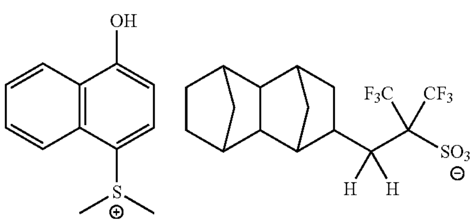
B-164
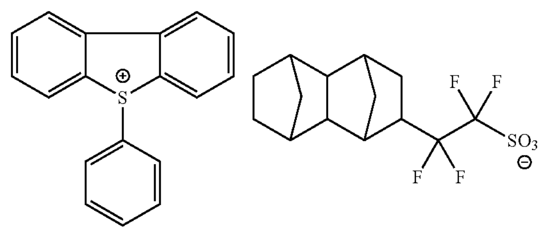
B-165
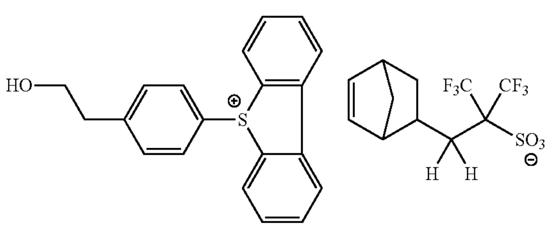
B-166
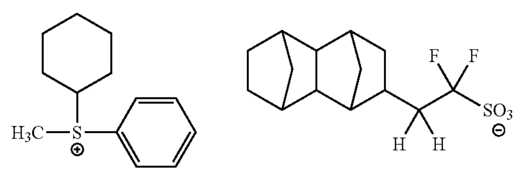
B-167
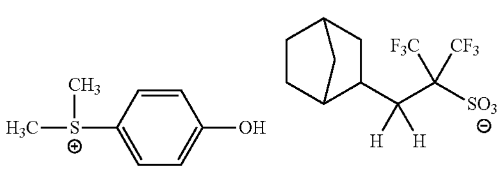
B-168
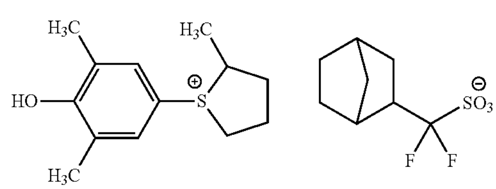
B-169
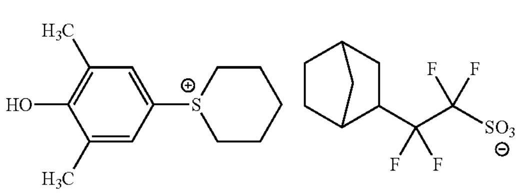
B-170
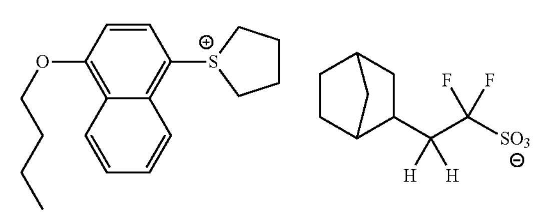

-continued
B-171
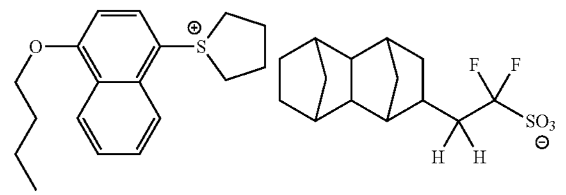
B-172
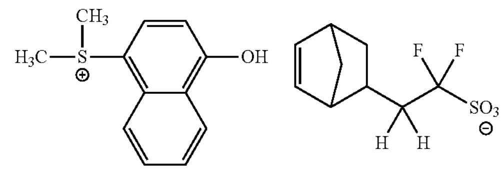
B-173
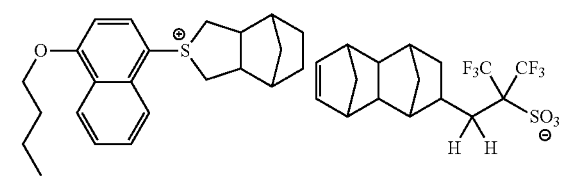
B-174
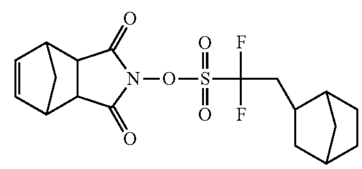
B-175
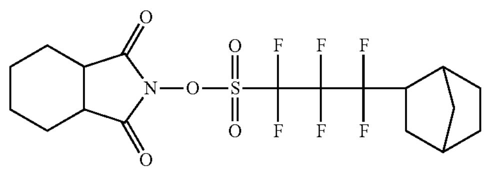
B-176
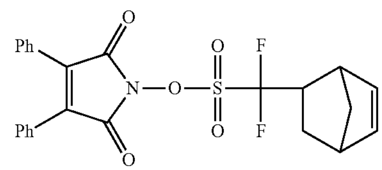
B-177
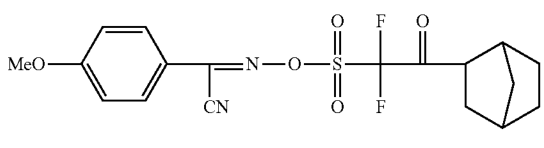
B-178
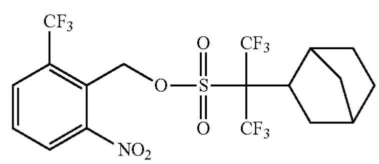
B-179
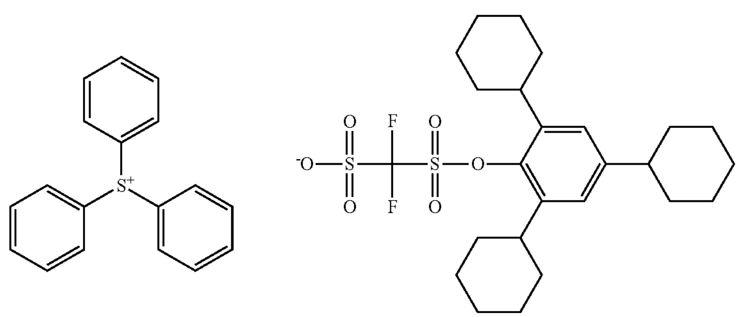
B-180
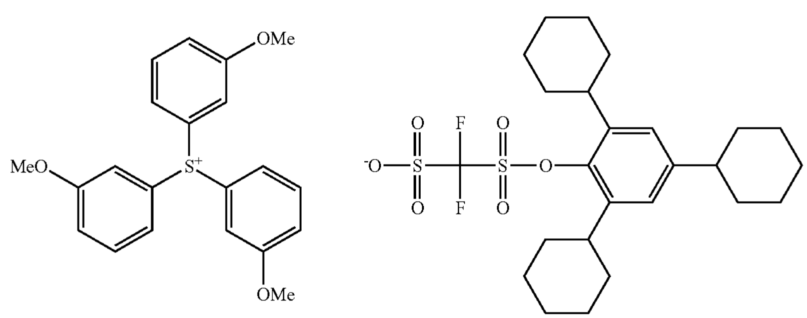

-continued
B-181
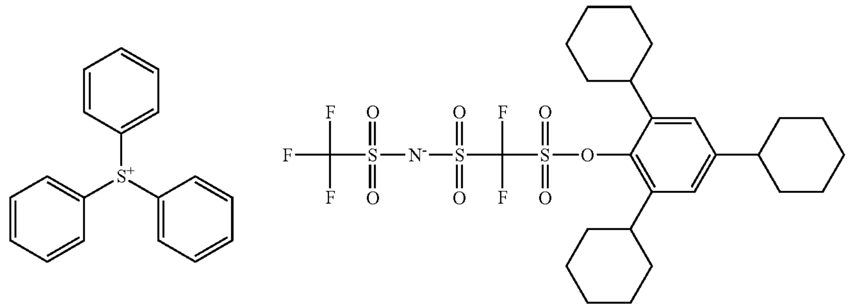
B-182
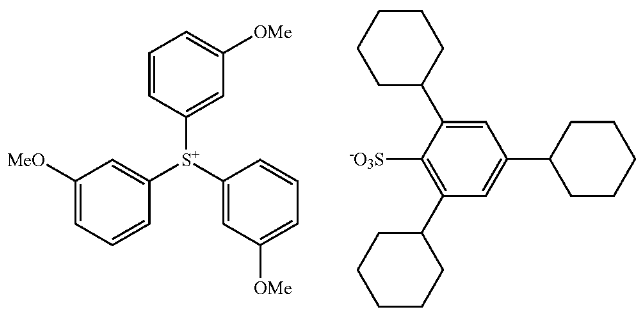
B-183
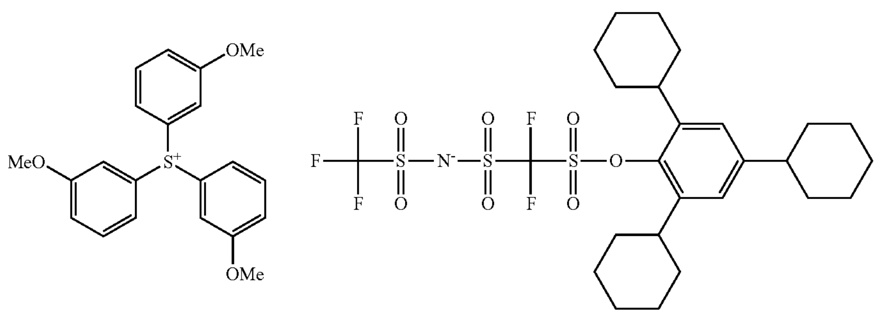
(Y-1)
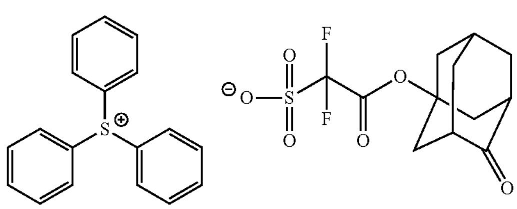
(Y-2)
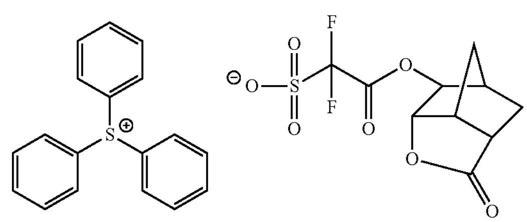
(Y-3)
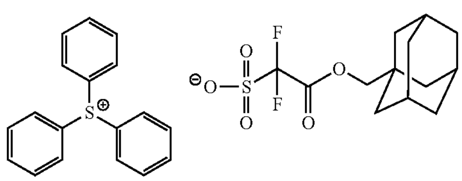
(Y-4)
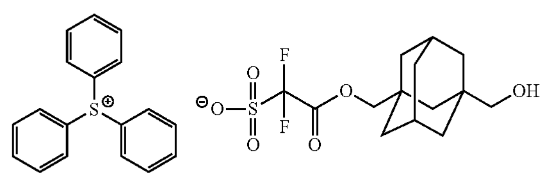
(Y-5)
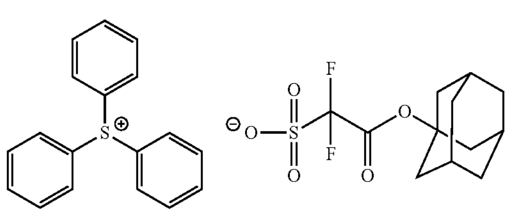
(Y-6)
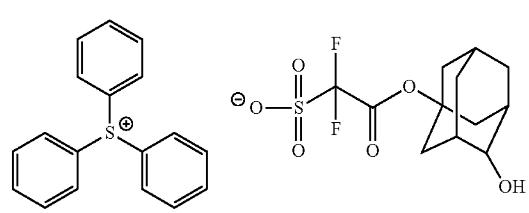

-continued
(Y-7)
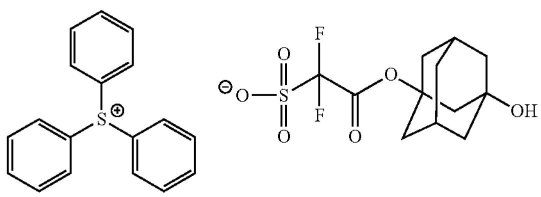
(Y-8)
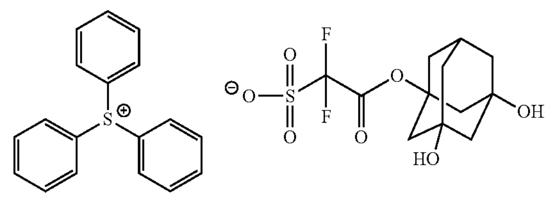
(Y-9)
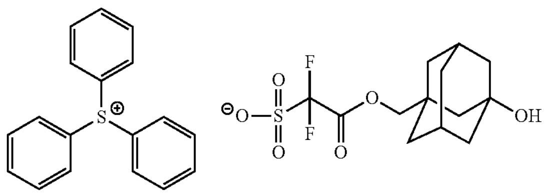
(Y-10)
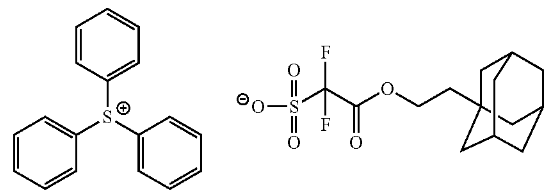
(Y-11)
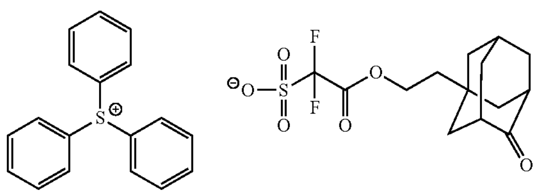
(Y-12)
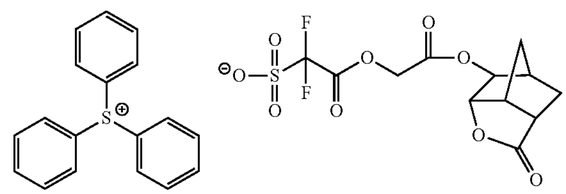
(Y-13)
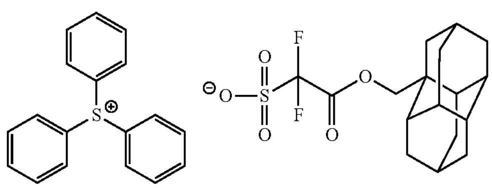
(Y-14)
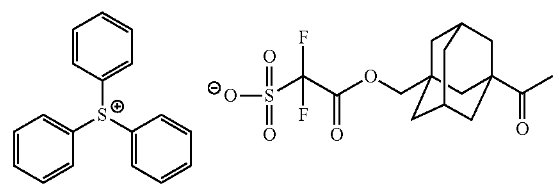
(Y-15)
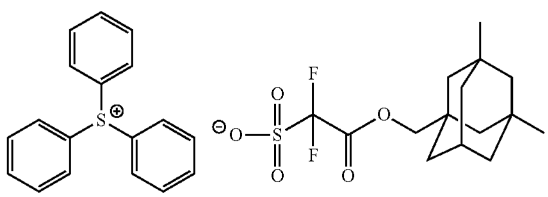
(Y-16)
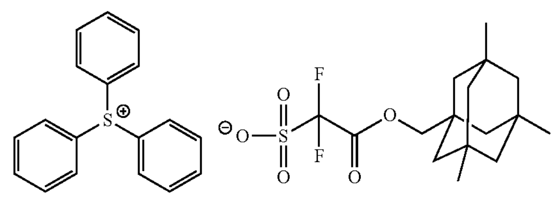
(Y-17)
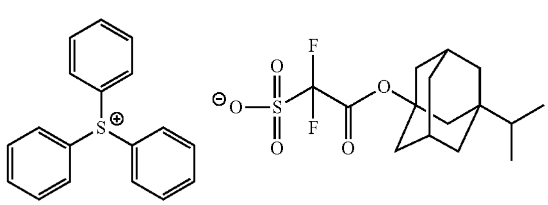
(Y-18)
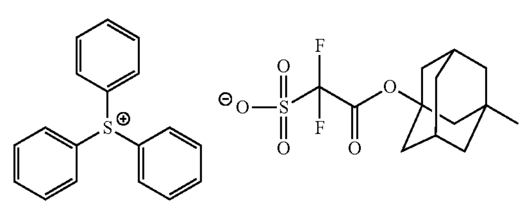
(Y-19)
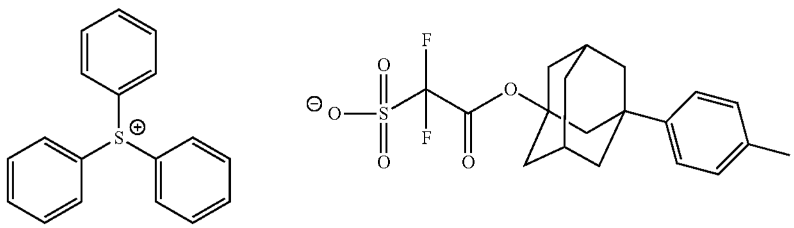

-continued
(Y-20)
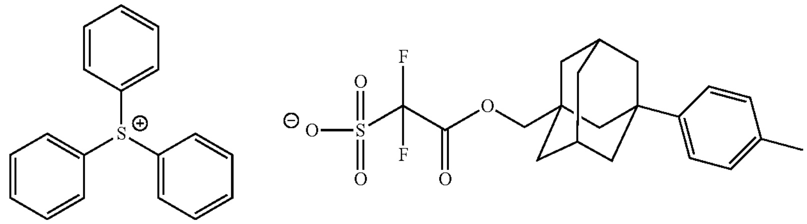
(Y-21)
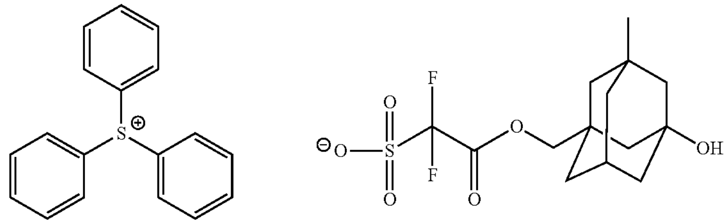
(Y-22)
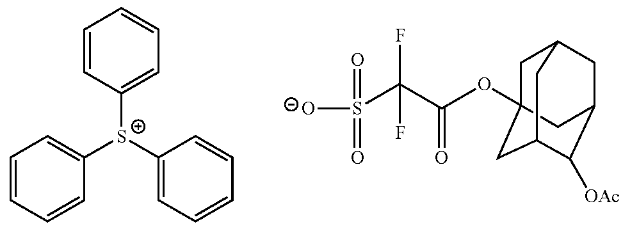
(Y-23)
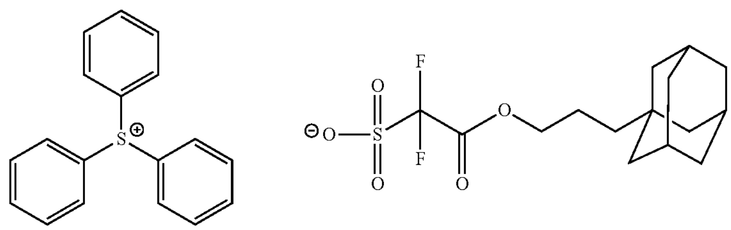
(Y-24)
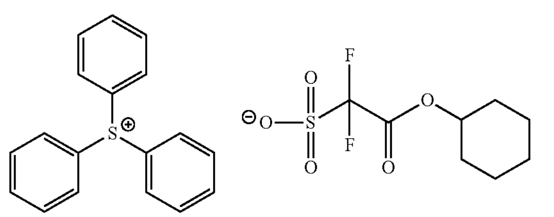
(Y-25)
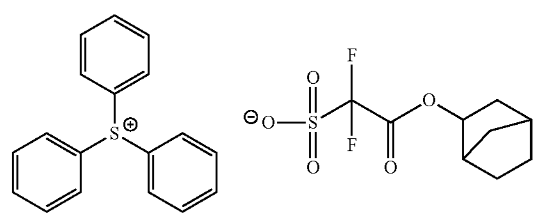
(Y-26)
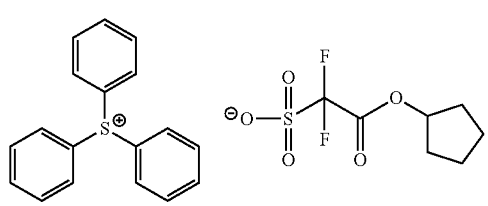
(Y-27)
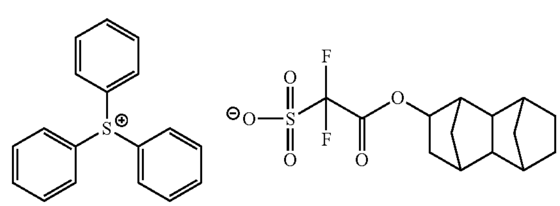
(Y-28)
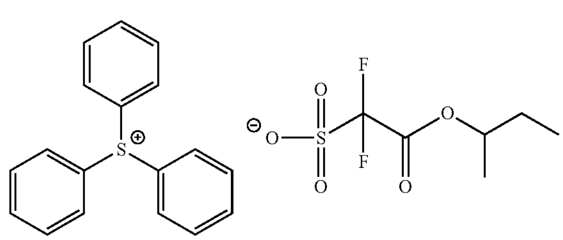
(Y-29)
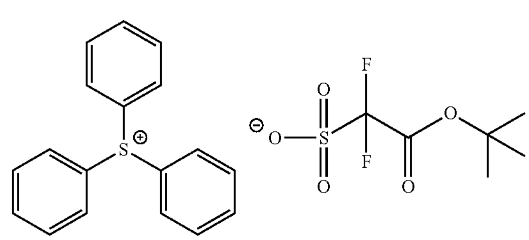

-continued
(Y-30)
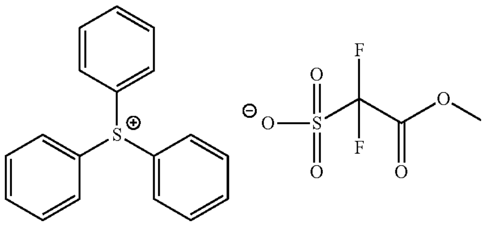
(Y-31)
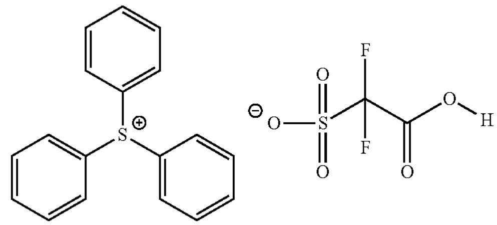
(Y-32)
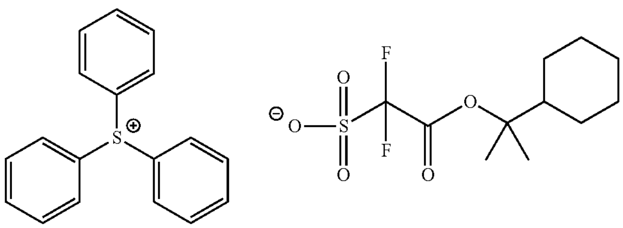
(Y-33)
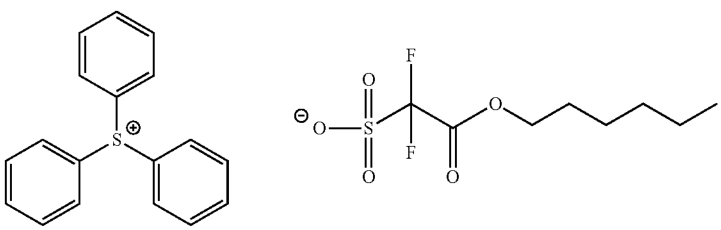
(Y-34)
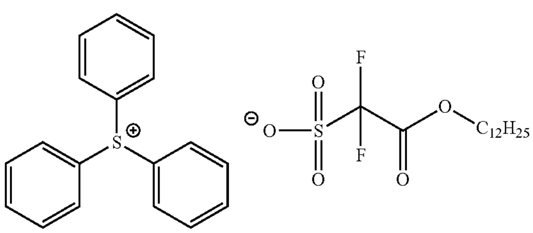
(Y-35)
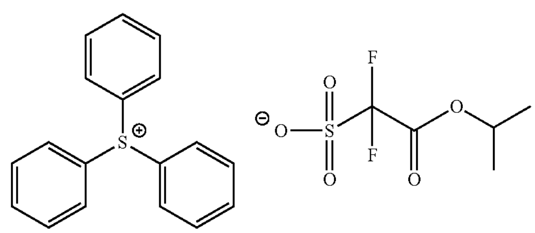
(Y-36)
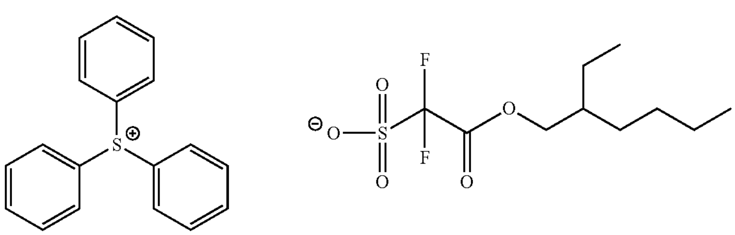
(Y-37)
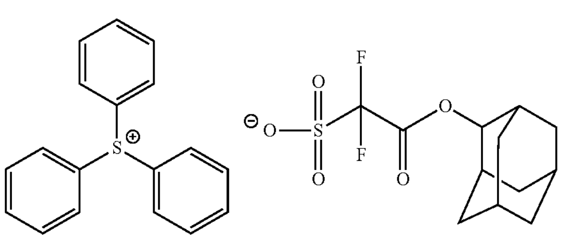
(Y-38)
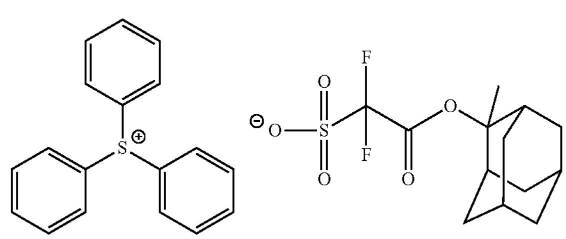

-continued
(Y-39)
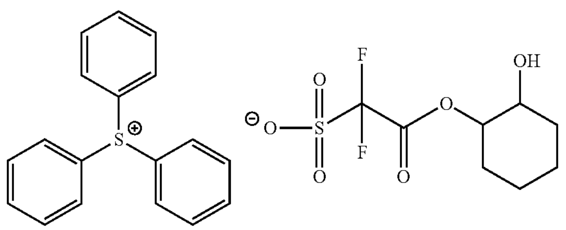
(Y-40)
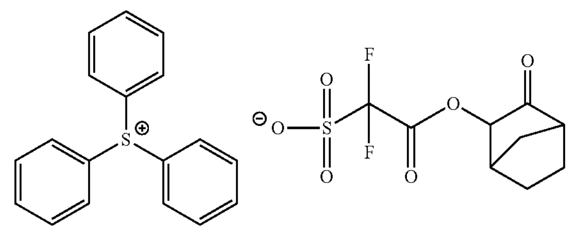
(Y-41)
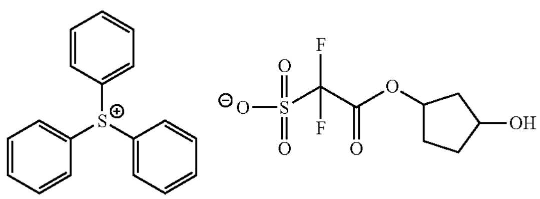
(Y-42)
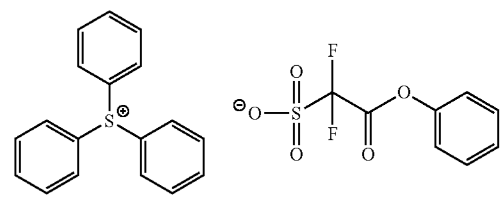
(Y-43)
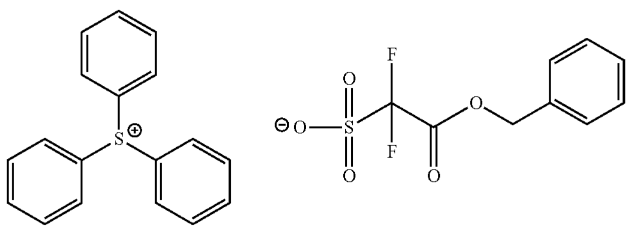
(Y-44)
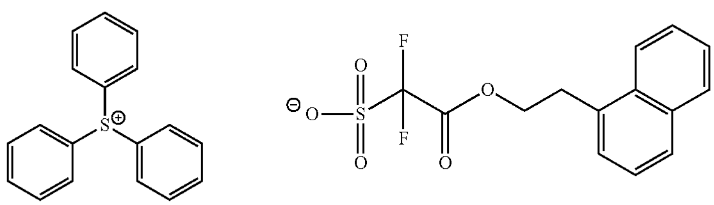
(Y-45)
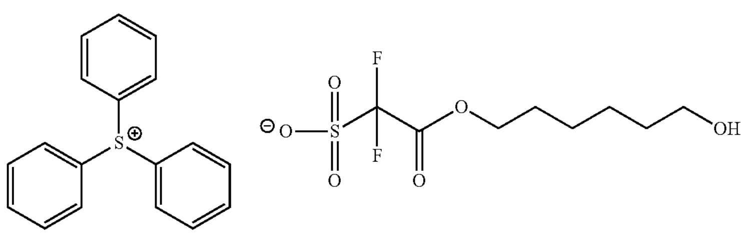
(Y-46)
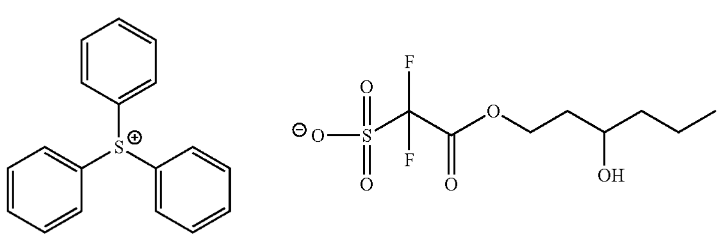
(Y-47)
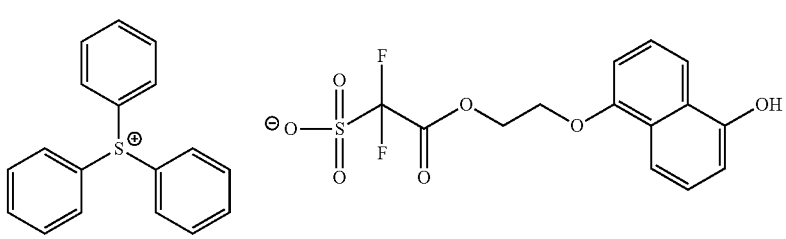

-continued
(Y-48)
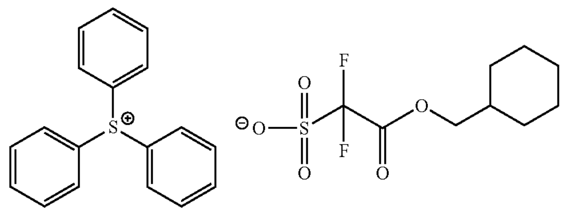
(Y-49)
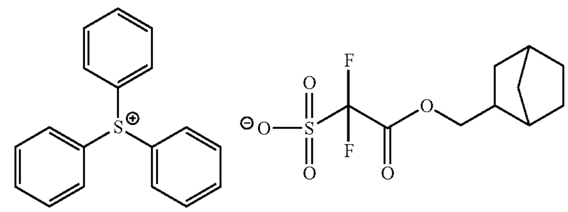
(Y-50)
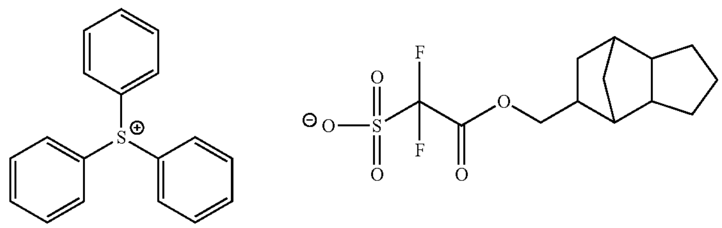
(Y-51)
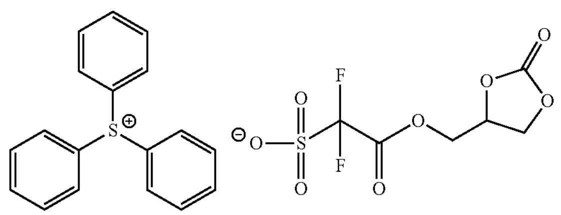
(Y-52)
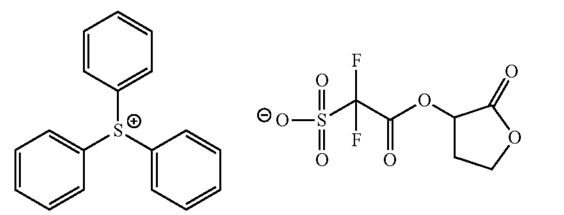
(Y-53)
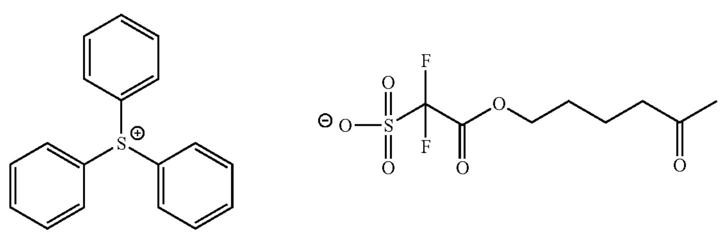
(Y-54)
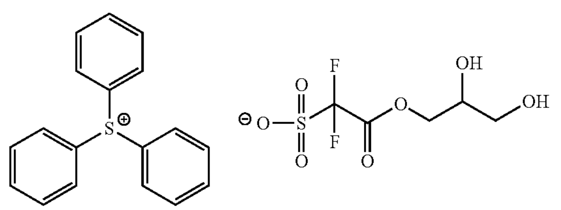
(Y-55)
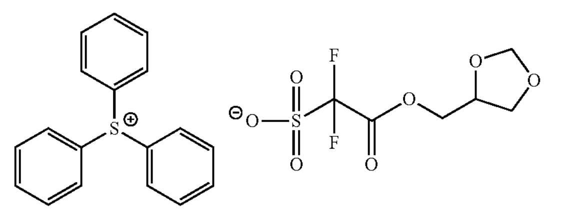
(Y-56)
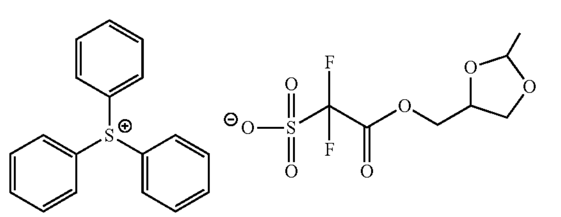
(Y-57)
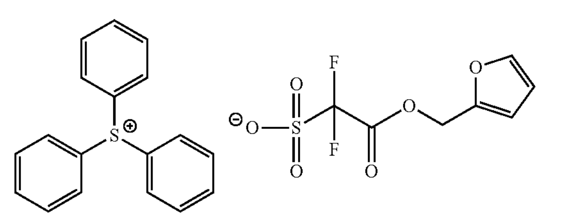
(Y-58)
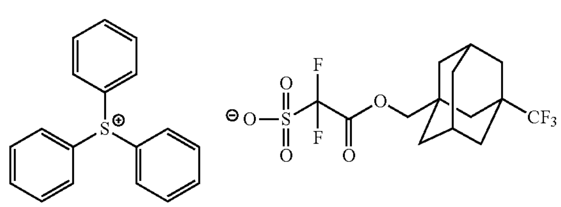
(Y-59)
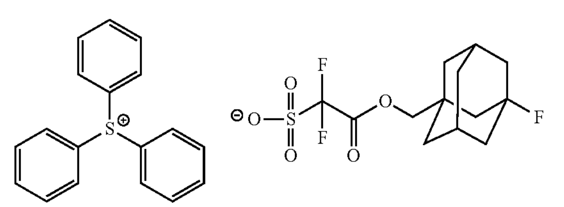

-continued
(Y-60)
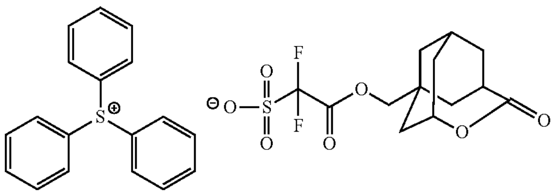
(Y-61)
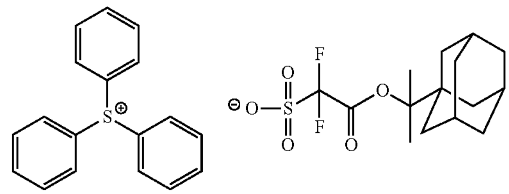
(Y-62)
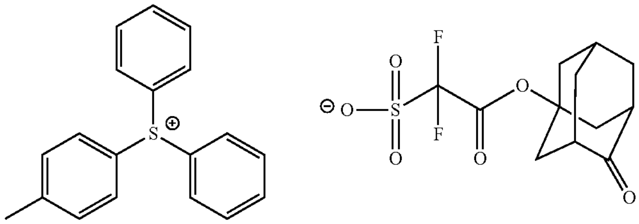
(Y-63)
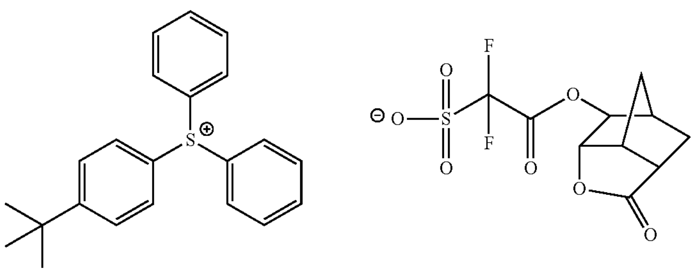
(Y-64)
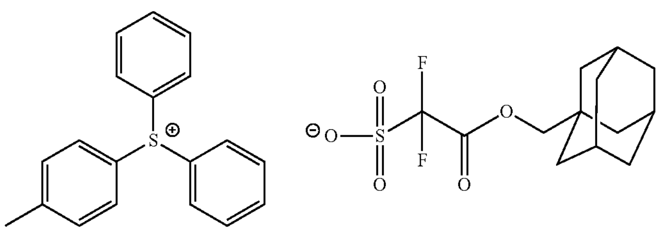
(Y-65)
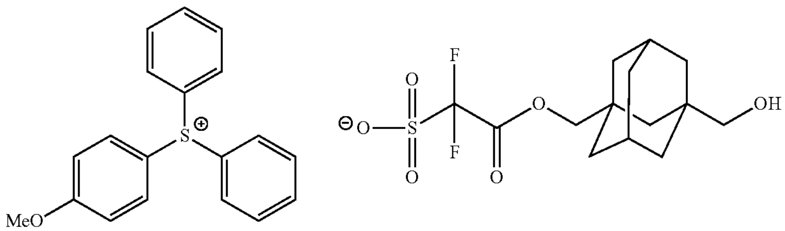
(Y-66)
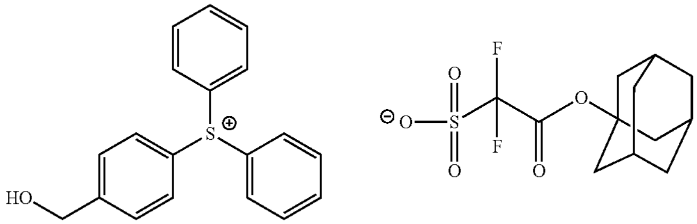

-continued (Y-67)

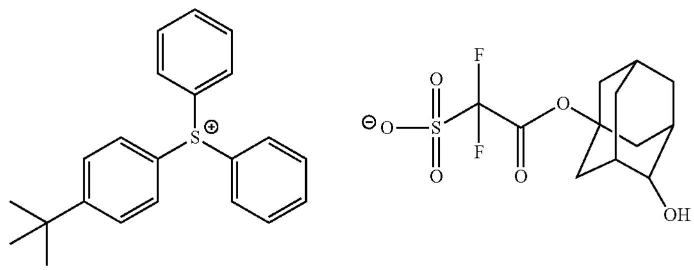

(Y-68)

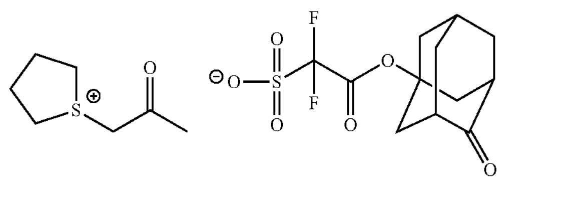

(Y-69)

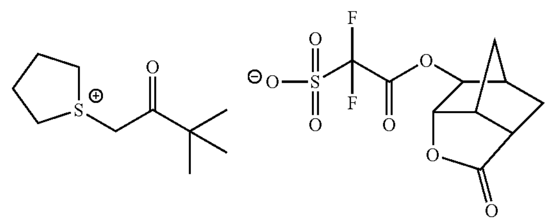

(Y-70)

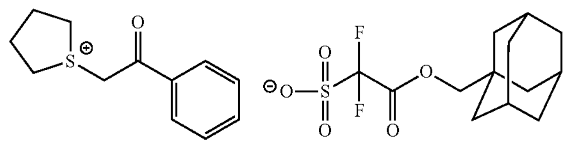

(Y-71)

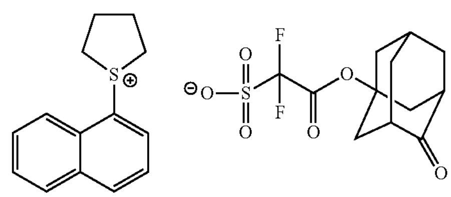

(Y-72)

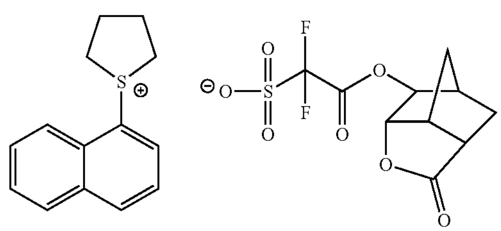

(Y-73)

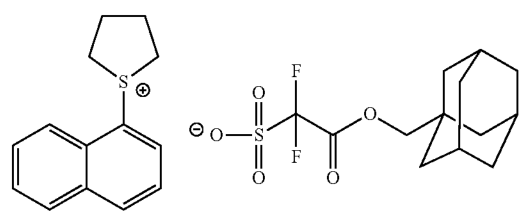

(Y-74)

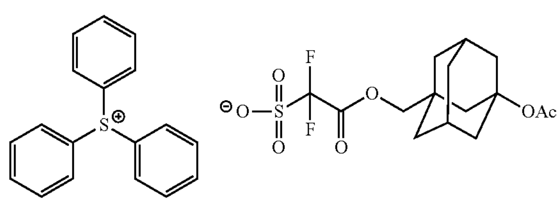

(Y-75)

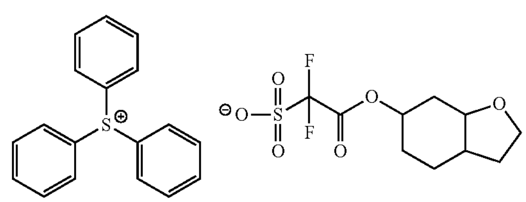

One type of photoacid generator may be used alone, or two or more types of photoacid generators may be used in combination. In the latter instance, it is preferred to combine compounds from which two types of organic acids being different from each other by 2 or greater in the total number of atoms excluding hydrogen atoms are generated.

The content of a photoacid generator based on the total solids of the composition is preferably in the range of 0.1 to 50 mass %, more preferably 0.5 to 40 mass % and further more preferably 1 to 30 mass %.

The actinic-ray- or radiation-sensitive resin composition of the present invention may comprise at least one type of compound (hereinafter also referred to as an acid amplifier) that when acted on by an acid, is decomposed to thereby generate an acid. It is preferred for the acid generated by the acid amplifier to be a sulfonic acid, a methide acid or an imidic acid. The content of acid amplifier, based on the total solids of the composition, is preferably in the range of 0.1 to 50 mass %, more preferably 0.5 to 30 mass % and further more preferably 1.0 to 20 mass %.

The ratio of amount between added acid amplifier and acid generator (solid amount of acid amplifier based on the total solids of the composition/solid amount of acid generator based on the total solids of the composition) is not particularly limited. However, 0.01 to 50 is preferred, 0.1 to 20 is more preferred, and 0.2 to 1.0 is most preferred.

Nonlimiting examples of compounds that can be used in the present invention are shown below.
(PB-1)
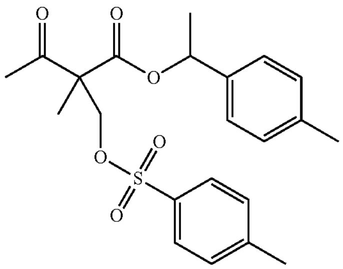
(PB-2)
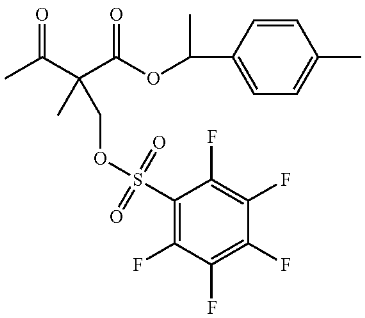
(PB-3)
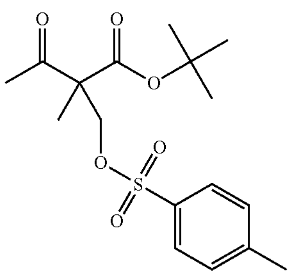
(PB-4)
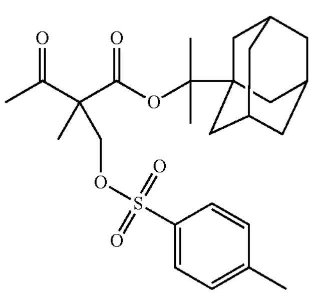
(PB-5)
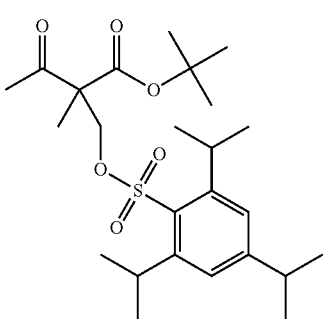
-continued
(PB-6)
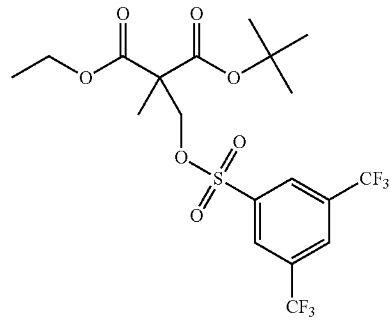
(PB-7)
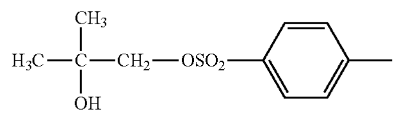
(PB-8)
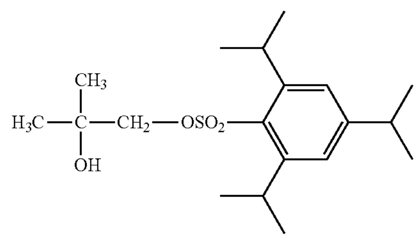
(PB-9)
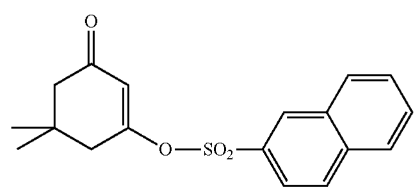
(PB-10)
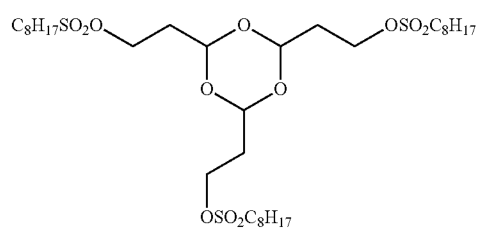
(PB-11)
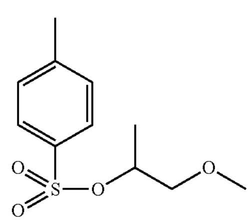
(PB-12)
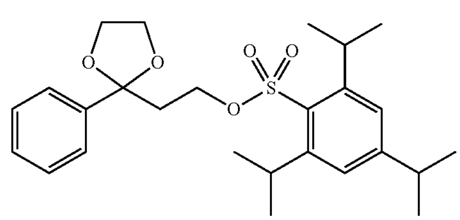

-continued (PB-13)

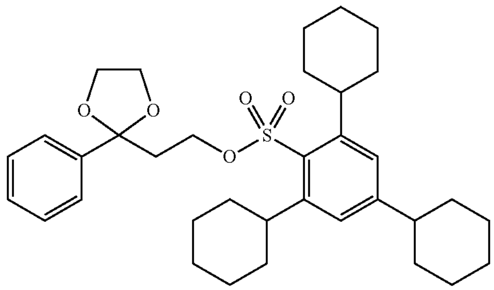

(PB-14)

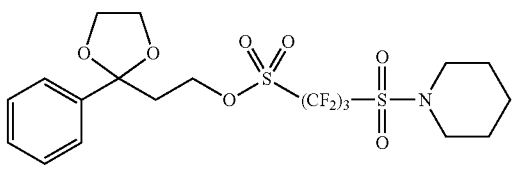

(PB-15)

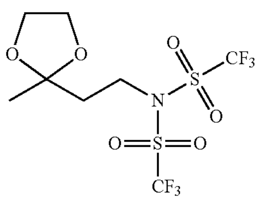

(PB-16)

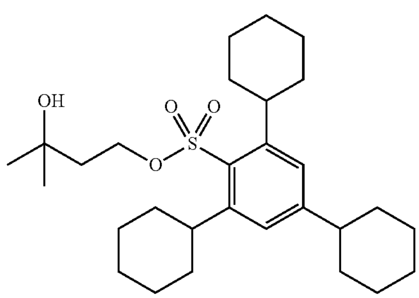

(PB-17)

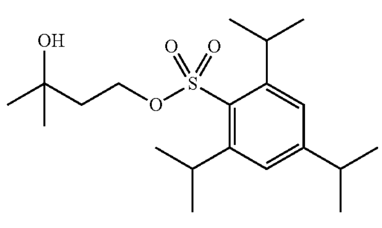

(PB-18)

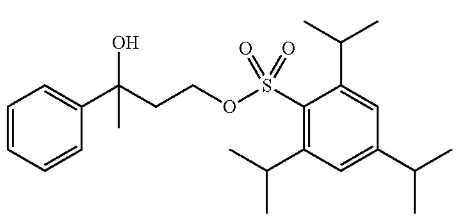

[Basic Compound]

The composition of the present invention may further comprise a basic compound. It is preferred for the basic compound to be a compound whose basicity is stronger than that of phenol. This basic compound is preferably an organic basic compound, more preferably a nitrogen-atom-containing basic compound.

Useful nitrogen-atom-containing basic compounds are not particularly limited. For example, use can be made of the compounds of categories (1) to (7) below.

(1) Compounds of general formula (BS-1) below (BS-1)

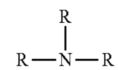

In general formula (BS-1), each of Rs independently represents a hydrogen atom or an organic group, provided that in no event all the three Rs are hydrogen atoms. As the organic group, there can be mentioned a linear or branched alkyl group, a cycloalkyl group (monocyclic or polycyclic), an aryl group and an aralkyl group.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

The compounds represented by general formula (BS-1) in which the at least two Rs are the organic groups are preferred.

Specific examples of the compounds of general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline and the like.

The compounds represented by general formula (BS-1) in which at least one of Rs is a hydroxylated alkyl group are also preferred. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —$CH_2CH_2O$—. As particular examples thereof, there can be mentioned tris(methoxyethoxyethyl)amine, compounds shown in column 3 line 60 et seq. of U.S. Pat. No. 6,040,112 and the like.

Specific examples of the basic compounds of general formula (BS-1) are shown below.

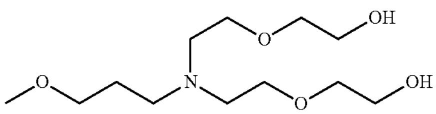
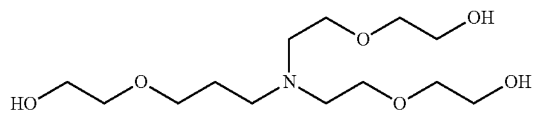
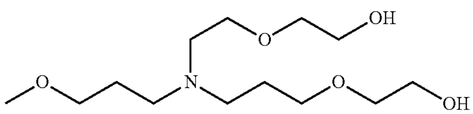
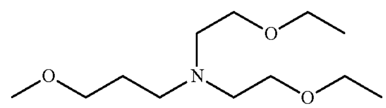
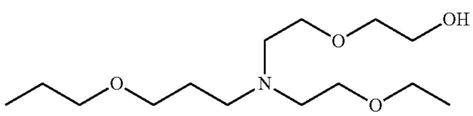
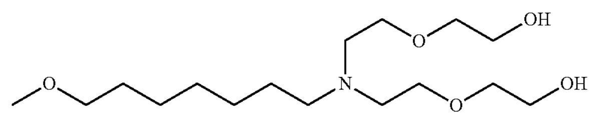
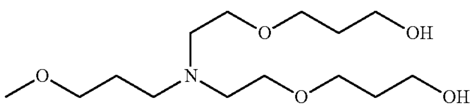
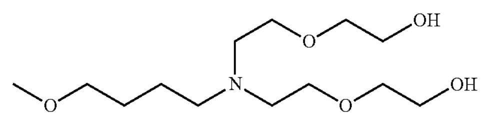
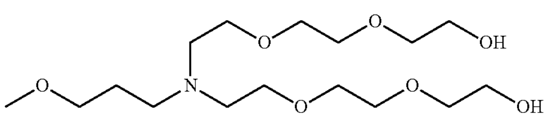
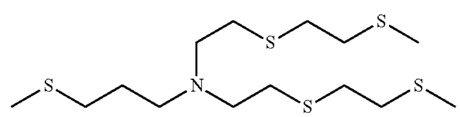
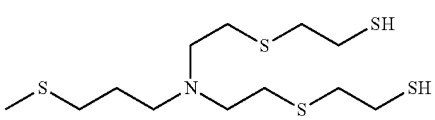
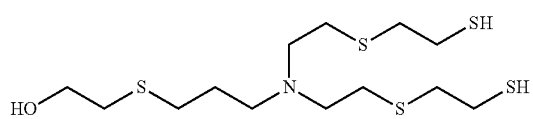
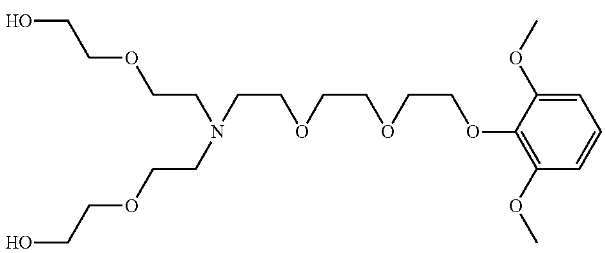
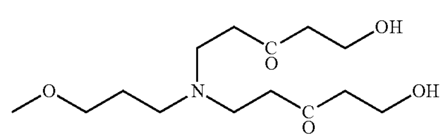
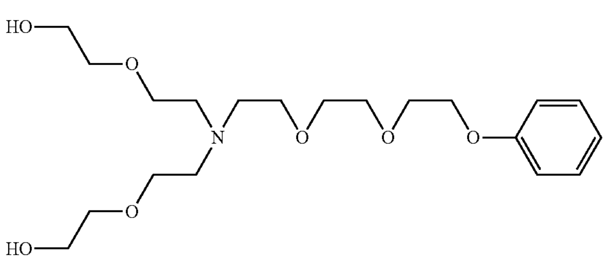
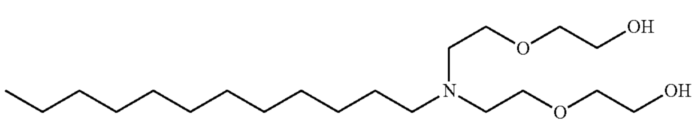
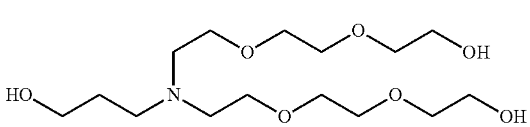

-continued

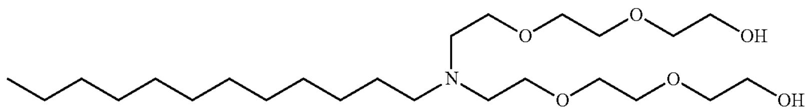

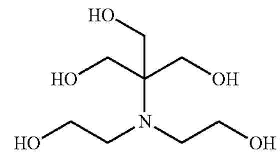

(2) Compounds with Nitrogen-Atom-Containing Heterocyclic Structure

The nitrogen-atom-containing heterocyclic structure optionally may have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]-undec-7-ene and the like.

(3) Amine Compounds with Phenoxy Group

The amine compounds with a phenoxy group are those having a phenoxy group at the end of the alkyl group of each amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —$CH_2CH_2O$— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown in section [0066] of US 2007/0224539 A1 and the like.

The amine compound having a phenoxy group can be obtained by, for example, first heating a primary or secondary amine having a phenoxy group and a haloalkyl ether so as to effect a reaction therebetween, subsequently adding an aqueous solution of a strong base, such as sodium hydroxide, potassium hydroxide or a tetraalkylammonium, and thereafter carrying out an extraction with an organic solvent, such as ethyl acetate or chloroform. Alternatively, the amine compound having a phenoxy group can be obtained by first heating a primary or secondary amine and a haloalkyl ether having a phenoxy group at its terminus so as to effect a reaction therebetween, subsequently adding an aqueous solution of a strong base, such as sodium hydroxide, potassium hydroxide or a tetraalkylammonium, and thereafter carrying out an extraction with an organic solvent, such as ethyl acetate or chloroform.

(4) Ammonium Salts

As the basic compound, use can be made of ammonium salts. As the anion of the ammonium salts, there can be mentioned a halide atom, a sulfonate, a borate, a phosphate or the like. Of these, a halide and a sulfonate are preferred.

Among halides, chloride, bromide and iodide are especially preferred.

Among sulfonates, an organic sulfonate having 1 to 20 carbon atoms is especially preferred. As the organic sulfonate, there can be mentioned an aryl sulfonate and an alkyl sulfonate having 1 to 20 carbon atoms.

The alkyl group of the alkyl sulfonate may have a substituent. As the substituent, there can be mentioned, for example, fluorine, chlorine, bromine, an alkoxy group, an acyl group, an aryl group or the like. As specific examples of the alkyl sulfonates, there can be mentioned methane sulfonate, ethane sulfonate, butane sulfonate, hexane sulfonate, octane sulfonate, benzyl sulfonate, trifluoromethane sulfonate, pentafluoroethane sulfonate, nonafluorobutane sulfonate and the like.

As the aryl group of the aryl sulfonate, there can be mentioned a benzene ring, a naphthalene ring or an anthracene ring. The benzene ring, naphthalene ring or anthracene ring may have a substituent. As preferred substituents, there can be mentioned a linear or branched alkyl group having 1 to 6 carbon atoms and a cycloalkyl group having 3 to 6 carbon atoms. As specific examples of the linear or branched alkyl groups and cycloalkyl groups, there can be mentioned methyl, ethyl, n-propyl, isopropyl, n-butyl, i-butyl, t-butyl, n-hexyl, cyclohexyl and the like. As other substituents, there can be mentioned an alkoxy group having 1 to 6 carbon atoms, a halogen atom, cyano, nitro, an acyl group, an acyloxy group and the like.

The ammonium salt may be in the form of a hydroxide or carboxylate. If so, it is especially preferred for the ammonium salt to be a tetraalkylammonium hydroxide having 1 to 8 carbon atoms, such as tetramethylammonium hydroxide, tetraethylammonium hydroxide and tetra-(n-butyl)ammonium hydroxide.

As preferred basic compounds, there can be mentioned, for example, a guanidine, an aminopyridine, an aminoalkylpyridine, an aminopyrrolidine, an indazole, an imidazole, a pyrazole, a pyrazine, a pyrimidine, a purine, an imidazoline, a pyrazoline, a piperazine, an aminomorpholine and an aminoalkylmorpholine. A substituent may further be introduced in each of these.

As preferred substituents, there can be mentioned, for example, an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

As especially preferred basic compounds, there can be mentioned, for example, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

(5) Compound (PA) containing a functional group with proton acceptor properties, which compound (PA) when exposed to actinic rays or radiation, is decomposed to thereby produce a compound exhibiting proton acceptor properties lower than, or no proton acceptor properties due to dissipation of, the proton acceptor properties of the compound (PA), or exhibiting acid properties derived from the proton acceptor properties of the compound (PA)

The composition of the present invention may contain, as a basic compound, a compound (hereinafter also referred to as compound (PA)) containing a functional group with proton acceptor properties, which compound (PA) when exposed to actinic rays or radiation, is decomposed to thereby produce a compound exhibiting proton acceptor properties lower than, or no proton acceptor properties due to dissipation of, the proton acceptor properties of the compound (PA), or exhibiting acid properties derived from the proton acceptor properties of the compound (PA).

The functional group with proton acceptor properties refers to a functional group having a group, or an electron, capable of electrostatic interaction with a proton, and, for example, means a functional group with a macrocyclic structure, such as a cyclopolyether, or a functional group containing a nitrogen atom with an unshared electron pair not contributing to π-conjugation. The nitrogen atom with an unshared electron pair not contributing to π-conjugation is, for example, a nitrogen atom with any of the partial structures of the following general formula.

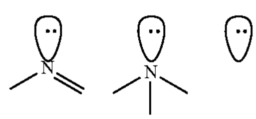

Unshared Electron Pair

As preferred partial structures of the functional groups with proton acceptor properties, there can be mentioned, for example, crown ether, azacrown ether, primary to tertiary amine, pyridine, imidazole and pyrazine structures and the like.

The compound (PA) when exposed to actinic rays or radiation is decomposed to thereby produce a compound exhibiting proton acceptor properties lower than, or no proton acceptor properties due to dissipation of, the proton acceptor properties of the compound (PA), or exhibiting acid properties derived from the proton acceptor properties of the compound (PA). The expression "exhibiting proton acceptor properties lower than, or no proton acceptor properties due to dissipation of, the proton acceptor properties of the compound (PA), or exhibiting acid properties derived from the proton acceptor properties of the compound (PA)" refers to a change of proton acceptor properties caused by the addition of a proton to the functional group with proton acceptor properties. In particular, the expression means that when a proton adduct is formed from the compound (PA) containing a functional group with proton acceptor properties and a proton, the equilibrium constant of the chemical equilibrium thereof is decreased.

The proton acceptor properties can be ascertained by performing pH measurement. In the present invention, it is preferred for the acid dissociation constant pKa of the compound produced by the decomposition of the compound (PA) when exposed to actinic rays or radiation to satisfy the relationship $pKa<-1$. Satisfying the relationship $-13<pKa<-1$ is more preferred, and satisfying the relationship $-13<pKa<-3$ is further more preferred.

In the present invention, the acid dissociation constant pKa refers to the acid dissociation constant pKa in an aqueous solution, for example, any of those listed in kagaku Binran (Chemical Handbook) (II) (Revised 4th Edition, 1993, edited by The Chemical Society of Japan, published by Maruzen Co., Ltd.). The lower the value of acid dissociation constant, the greater the acid strength. For example, the acid dissociation constant pKa in an aqueous solution can be actually measured through the determination of the acid dissociation constant at 25° C. using an infinitely diluted aqueous solution. Alternatively, the values based on a data base of heretofore known literature values and Hammett's substituent constants can be determined by calculation by means of the following software package 1. All the pKa values appearing in this description are those determined by calculation by means of this software package.

Software package 1: Advanced Chemistry Development (ACD/Labs) Software V8.14 for Solaris (1994-2007 ACD/Labs).

The compound (PA) produces, for example, any of the compounds of general formula (PA-1) below as the above proton adduct produced by the decomposition thereof when exposed to actinic rays or radiation. Each of the compounds of general formula (PA-1) contains not only a functional group with proton acceptor properties but also an acidic group, thereby being a compound exhibiting proton acceptor properties lower than, or no proton acceptor properties due to dissipation of, the proton acceptor properties of the compound (PA), or exhibiting acid properties derived from the proton acceptor properties of the compound (PA).

$$Q\text{-}A\text{-}(X)_n\text{—}B\text{—}R \qquad \text{(PA-1)}$$

In general formula (PA-1),

Q represents —$SO_3H$, —$CO_2H$ or —$X_1NHX_2Rf$, in which Rf represents an alkyl group, a cycloalkyl group or an aryl group, and each of $X_1$ and $X_2$ independently represents —$SO_2$— or —CO—.

A represents a single bond or a bivalent connecting group.

X represents —$SO_2$— or —CO—.

n is 0 or 1.

B represents a single bond, an oxygen atom or —N(Rx)Ry-, in which Rx represents a hydrogen atom or a monovalent organic group, and Ry represents a single bond or a bivalent organic group, provided that Rx may be bonded to Ry to thereby form a ring or may be bonded to R to thereby form a ring.

R represents a monovalent organic group containing a functional group with proton acceptor properties.

General formula (PA-1) will be described in greater detail below.

The bivalent connecting group represented by A is preferably a bivalent connecting group having 2 to 12 carbon atoms. As such, there can be mentioned, for example, an alkylene group, a phenylene group or the like. An alkylene group containing at least one fluorine atom is more preferred, which has preferably 2 to 6 carbon atoms, more preferably 2 to 4 carbon atoms. A connecting group, such as an oxygen atom or a sulfur atom, may be introduced in the alkylene chain. In particular, an alkylene group, 30 to 100% of the hydrogen atoms of which are substituted with fluorine atoms, is preferred. It is more preferred for the carbon atom bonded to the Q-moiety to have a fluorine atom. Further, perfluoroalkylene groups are preferred. A perfluoroethylene group, a perfluoropropylene group and a perfluorobutylene group are more preferred.

The monovalent organic group represented by Rx preferably has 4 to 30 carbon atoms. As such, there can be mentioned, for example, an alkyl group, a cycloalkyl group, an aryl group, an aralkyl group, an alkenyl group or the like. Each of these groups may further have a substituent.

A substituent may be introduced in the alkyl group represented by Rx. The alkyl group is preferably a linear or branched alkyl group having 1 to 20 carbon atoms. An oxygen atom, a sulfur atom or a nitrogen atom may be introduced in the alkyl chain.

The bivalent organic group represented by Ry is preferably an alkylene group.

As the ring structure that may be formed by the mutual bonding of Rx and Ry, there can be mentioned a 5 to 10-membered, especially preferably 6-membered, ring containing a nitrogen atom.

As the substituted alkyl group, in particular, there can be mentioned a linear or branched alkyl group substituted with a cycloalkyl group (for example, an adamantylmethyl group, an adamantylethyl group, a cyclohexylethyl group, a camphor residue, or the like).

A substituent may be introduced in the cycloalkyl group represented by Rx. The cycloalkyl group preferably has 3 to 20 carbon atoms. An oxygen atom may be introduced in the ring.

A substituent may be introduced in the aryl group represented by Rx. The aryl group preferably has 6 to 14 carbon atoms.

A substituent may be introduced in the aralkyl group represented by Rx. The aralkyl group preferably has 7 to 20 carbon atoms.

A substituent may be introduced in the alkenyl group represented by Rx. For example, there can be mentioned groups each resulting from the introduction of a double bond at an arbitrary position of any of the alkyl groups mentioned above as being represented by Rx.

The functional group with proton acceptor properties represented by R is as mentioned above. There can be mentioned groups with, for example, a nitrogen-atom-containing heterocyclic aromatic structure, such as an azacrown ether, a primary to tertiary amine, pyridine or imidazole.

With respect to the organic group containing any of these structures, the organic group preferably has 4 to 30 carbon atoms. As such, there can be mentioned an alkyl group, a cycloalkyl group, an aryl group, an aralkyl group, an alkenyl group or the like.

The functional group with proton acceptor propertie or alkyl group containing an ammonium group, cycloalkyl group, aryl group, aralkyl group, and alkenyl group represented by R are the same as the alkyl group, cycloalkyl group, aryl group, aralkyl group and alkenyl group set forth above as being represented by Rx.

As substituents that may be introduced in these groups, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms) and the like. Further, with respect to the ring structure of the aryl group, cycloalkyl group, etc. and the aminoacyl group, an alkyl group (preferably 1 to 20 carbon atoms) can be mentioned as a substituent.

When B is —N(Rx)Ry-, it is preferred for R and Rx to be bonded to each other to thereby form a ring. When a ring structure is formed, the stability thereof is enhanced, and thus the storage stability of the composition containing the same is enhanced. The number of carbon atoms constituting the ring is preferably in the range of 4 to 20. The ring may be monocyclic or polycyclic, and an oxygen atom, a sulfur atom or a nitrogen atom may be introduced in the ring.

As the monocyclic structure, there can be mentioned a 4- to 8-membered ring containing a nitrogen atom, or the like. As the polycyclic structure, there can be mentioned structures each resulting from a combination of two, three or more monocyclic structures. Substituents may be introduced in the monocyclic structure and polycyclic structure. As preferred substituents, there can be mentioned, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms) and the like. Further, with respect to the ring structure of the aryl group, cycloalkyl group, etc., an alkyl group (preferably 1 to 15 carbon atoms) can be mentioned as a substituent. Further, with respect to the aminoacyl group, one or more alkyl groups (each preferably 1 to 15 carbon atoms) can be mentioned as substituents.

Rf of $—X_1NHX_2Rf$ represented by Q is preferably an alkyl group having 1 to 6 carbon atoms in which a fluorine atom is optionally contained, more preferably a perfluoroalkyl group having 1 to 6 carbon atoms. Preferably, at least one of $X_1$ and $X_2$ is $—SO_2—$. More preferably, both of $X_1$ and $X_2$ are $—SO_2—$.

Among the compounds of general formula (PA-1), the compounds wherein the Q-moiety is sulfonic acid can be synthesized by using a common sulfonamidation reaction. For example, these compounds can be synthesized by a method in which one sulfonyl halide moiety of a bissulfonyl halide compound is caused to selectively react with an amine compound to thereby form a sulfonamido bond and thereafter the other sulfonyl halide moiety is hydrolyzed, or alternatively by a method in which a cyclic sulfonic anhydride is caused to react with an amine compound to thereby effect a ring opening.

It is preferred for the compound (PA) to be an ionic compound. The functional group with proton acceptor properties may be contained in whichever moiety, an anion moiety or a cation moiety. Preferably, the functional group is contained in an anion moiety.

The compound (PA) is preferably any of the compounds of general formulae (4) to (6) below.

$$R_f—X_2—N^-—X_1\text{-}A\text{-}(X)_n—B—R[C]^+ \quad (4)$$

$$R—SO_3^-[C]^+ \quad (5)$$

$$R—CO_2^-[C]^+ \quad (6)$$

In general formulae (4) to (6), A, X, n, B, R, Rf, $X_1$ and $X_2$ are as defined above in connection with general formula (PA-1).

$C^+$ represents a counter cation.

The counter cation is preferably an onium cation. More particularly, as preferred examples thereof, there can be mentioned a sulfonium cation described above as being expressed by $S^+$ $(R_{201}')(R_{202}')(R_{203}')$ of general formula (ZI) and an iodonium cation described above as being expressed by $I^+$ $(R_{204}')(R_{205}')$ of general formula (ZII) in connection with photoacid generators.

Non-limiting specific examples of the compounds (PA) are given below.

(PA-1)

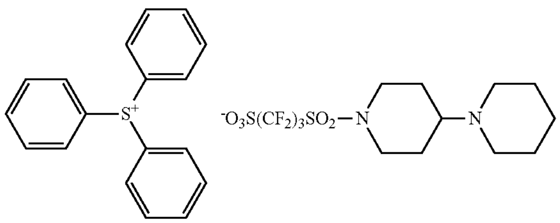

(PA-2)

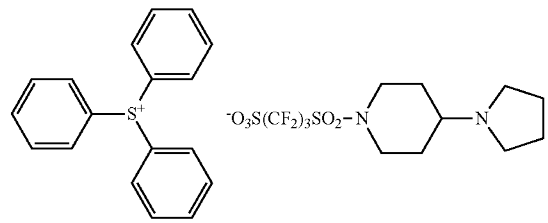

(PA-3)

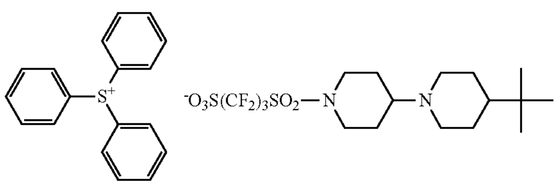

(PA-4)

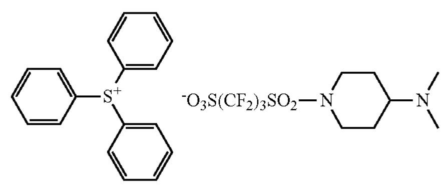

(PA-5)

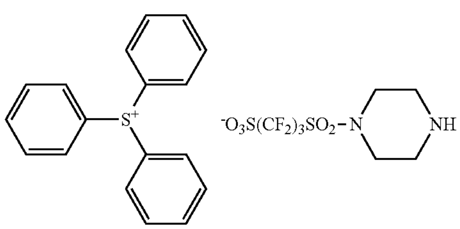

(PA-6)

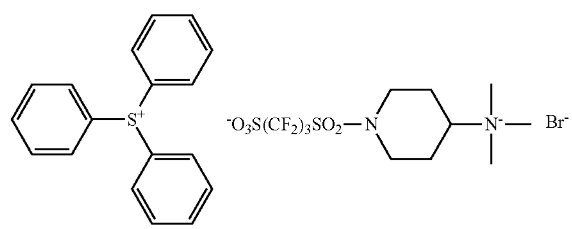

(PA-7)

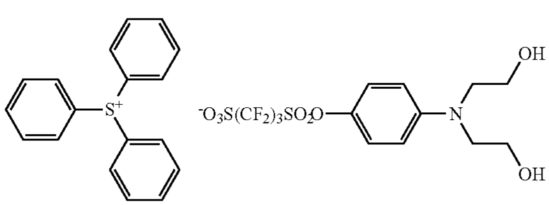

(PA-8)

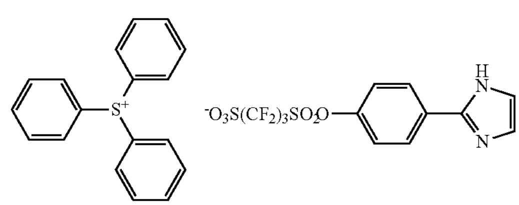

(PA-9)

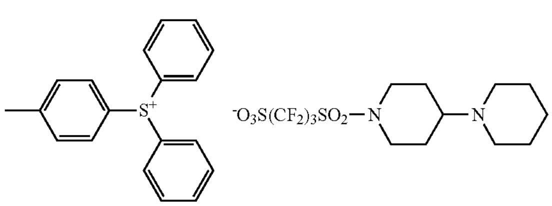

(PA-10)

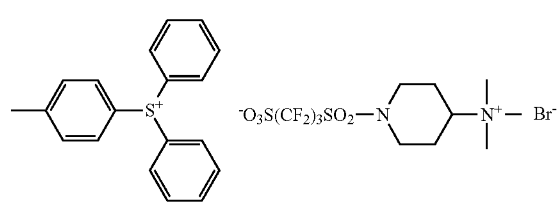

(PA-11)

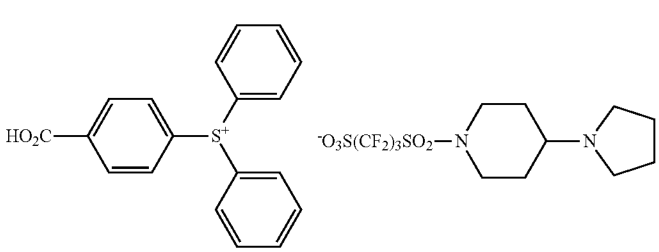

-continued
(PA-12)
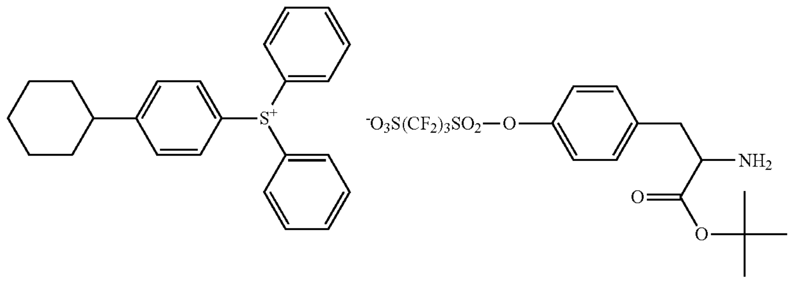
(PA-13)
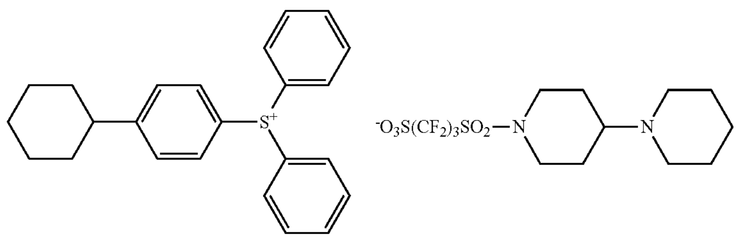
(PA-14)
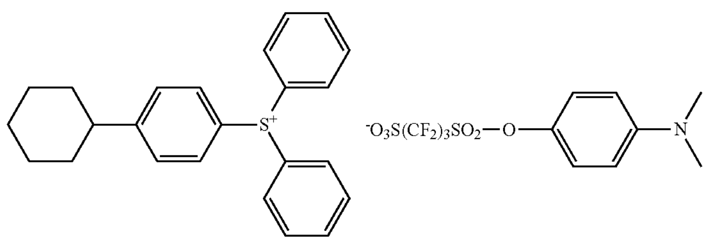
(PA-15)
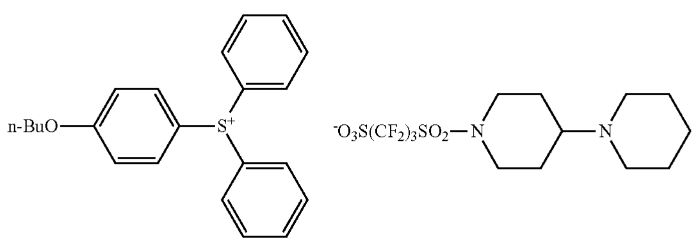
(PA-16)
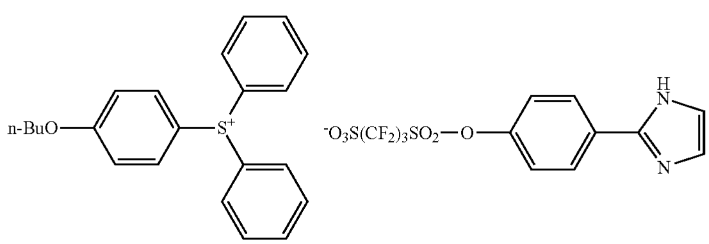
(PA-17)
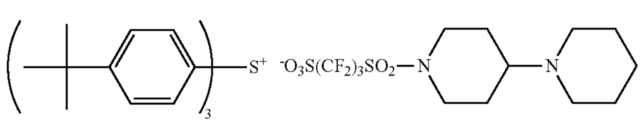
(PA-18)
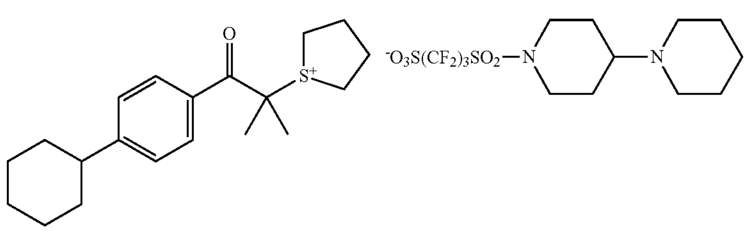

-continued
(PA-19)
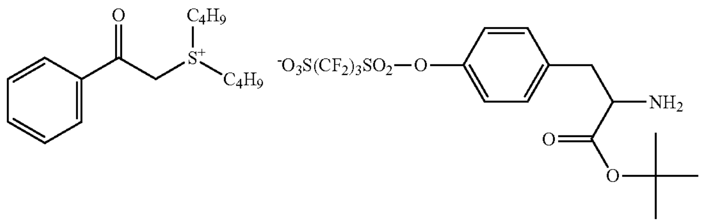
(PA-20)
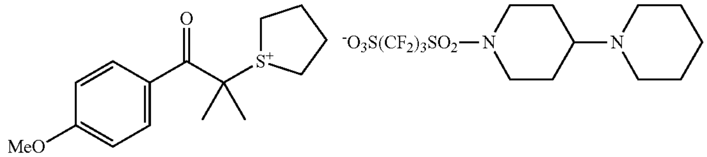
(PA-21)
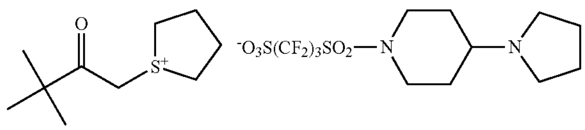
(PA-22)
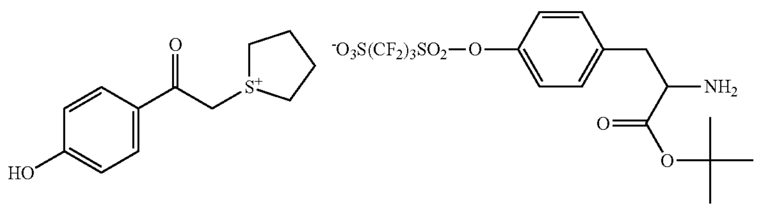
(PA-23)
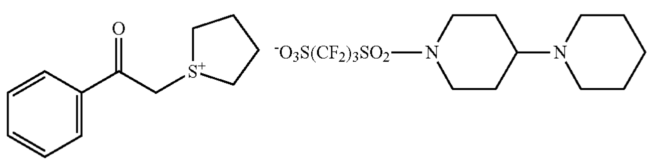
(PA-24)
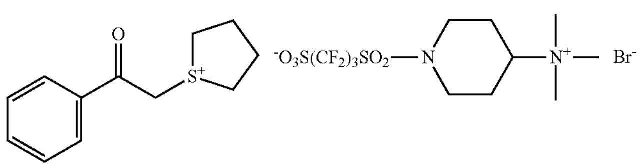
(PA-25)
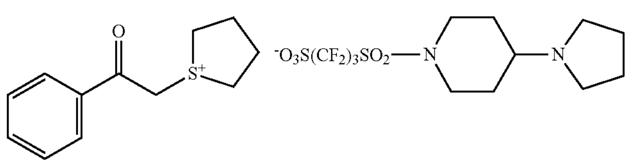
(PA-26)
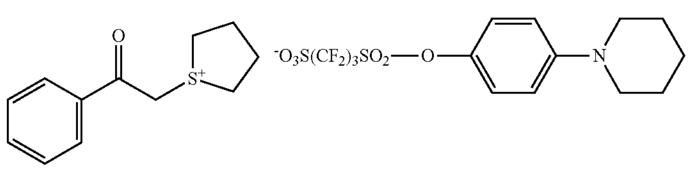

-continued
(PA-27)
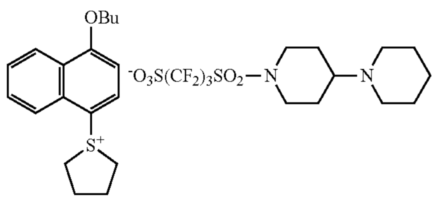
(PA-28)
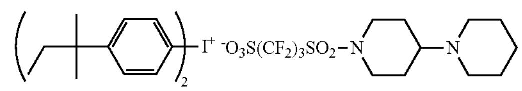
(PA-29)
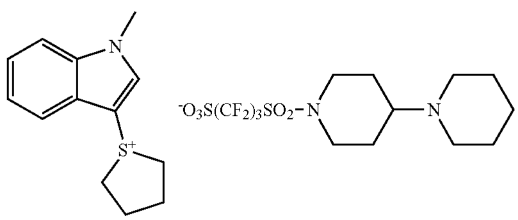
(PA-30)
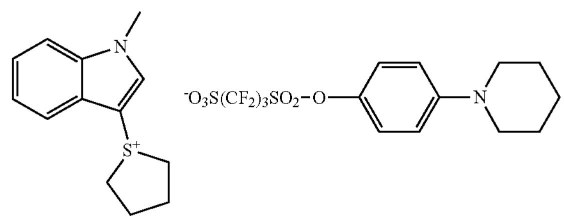
(PA-31)
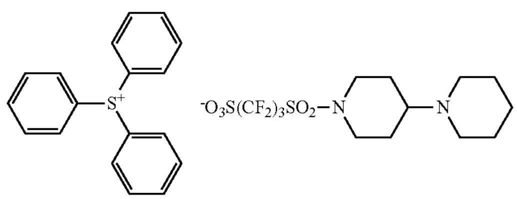
(PA-32)
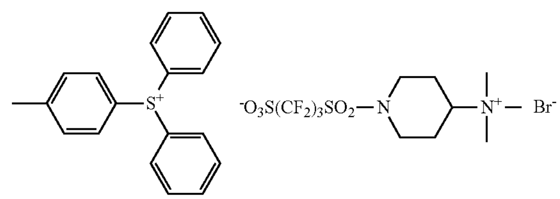
(PA-33)
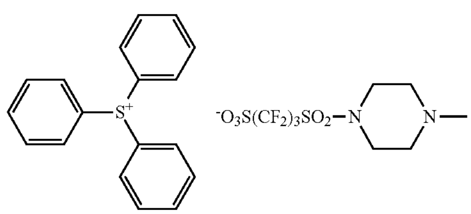
(PA-34)
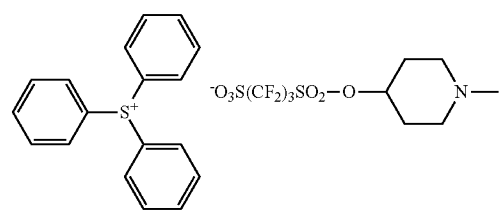
(PA-35)
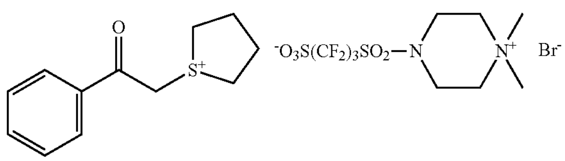
(PA-36)
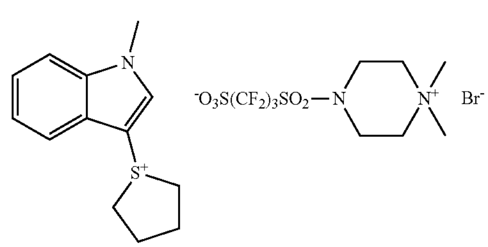
(PA-37)
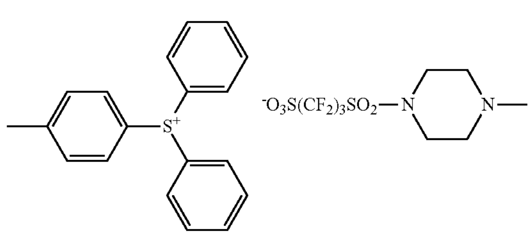
(PA-38)
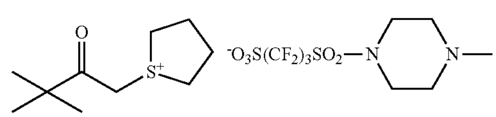

-continued
(PA-39)
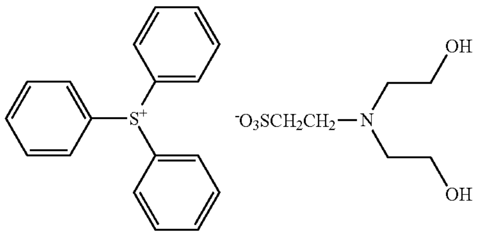
(PA-40)
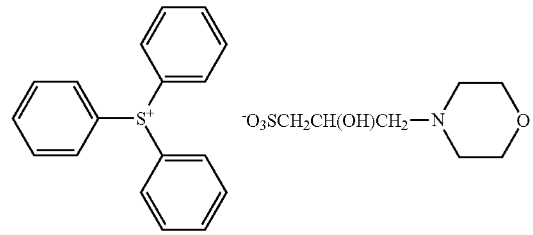
(PA-41)
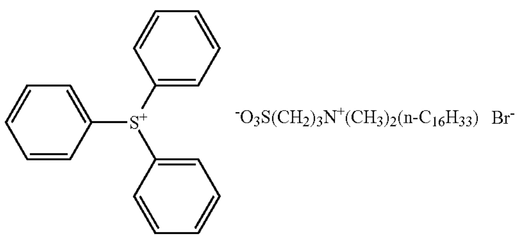
(PA-42)
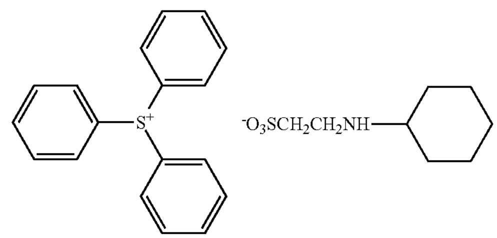
(PA-43)
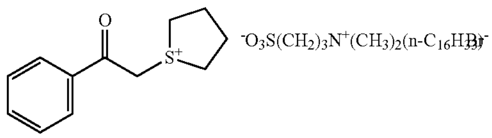
(PA-44)
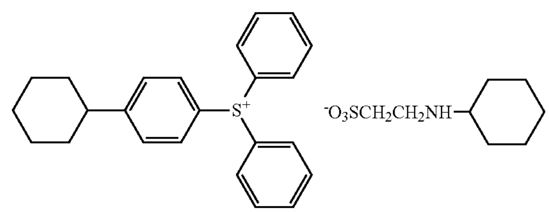
(PA-45)
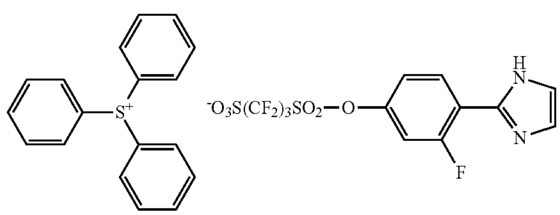
(PA-46)
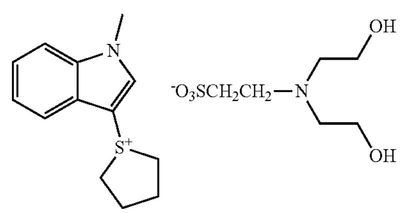
(PA-47)
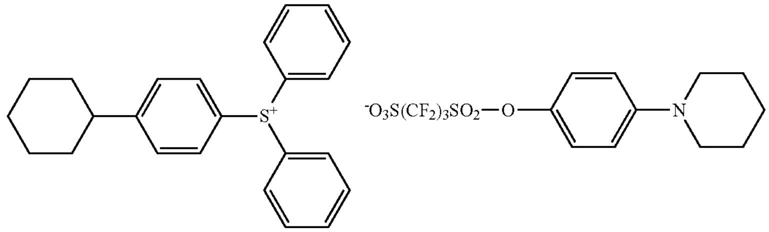
(PA-48)
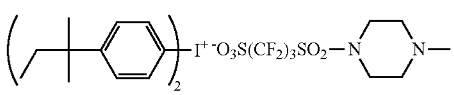
(PA-49)
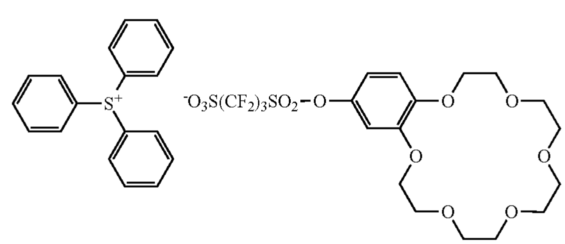

-continued
(PA-50)
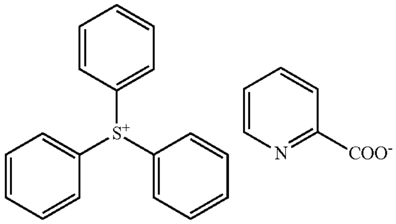
(PA-51)
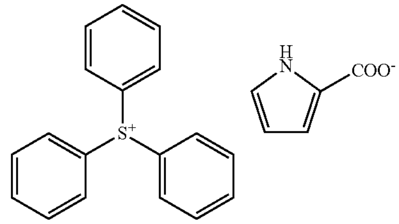
(PA-52)
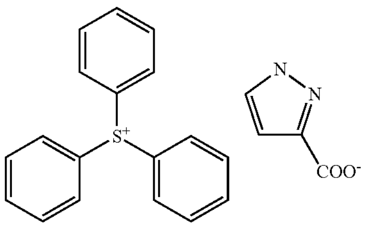
(PA-53)
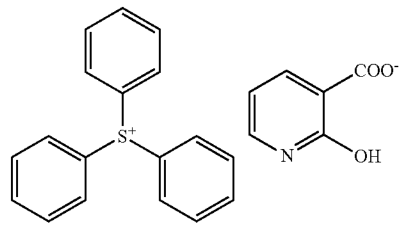
(PA-54)
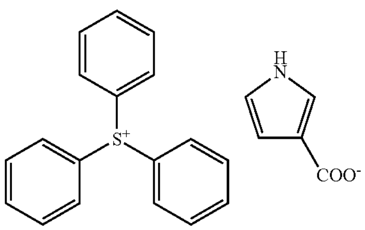
(PA-55)
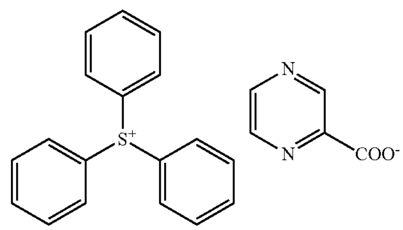
(PA-56)
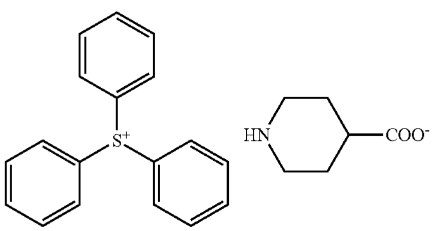
(PA-57)
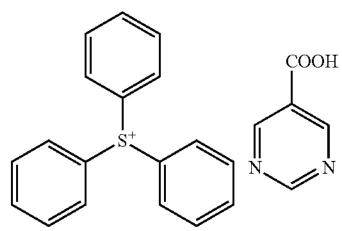
(PA-58)
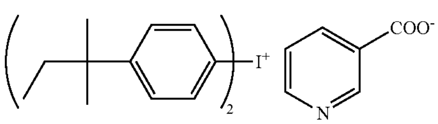
(PA-59)
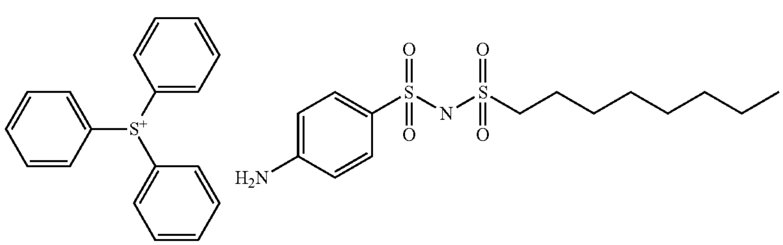
(PA-60)
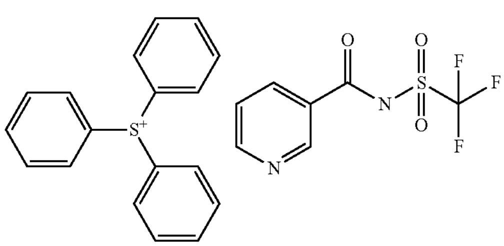

-continued
(PA-61)
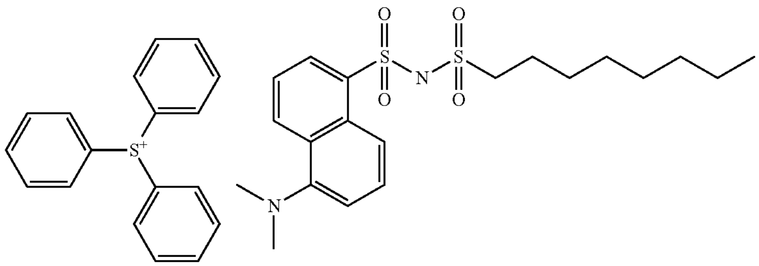
(PA-62)
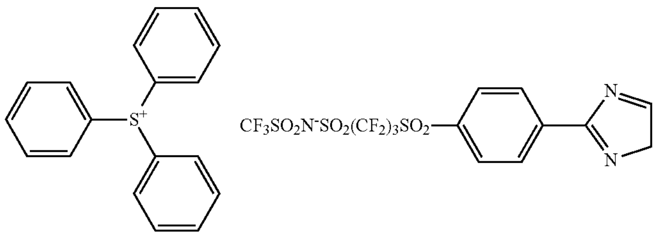
(PA-63)
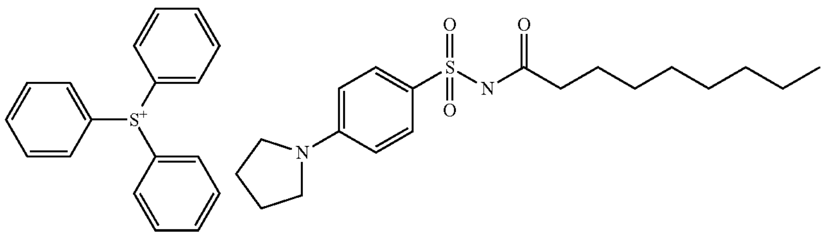
(PA-64)
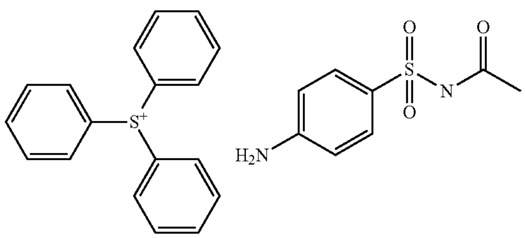
(PA-65)
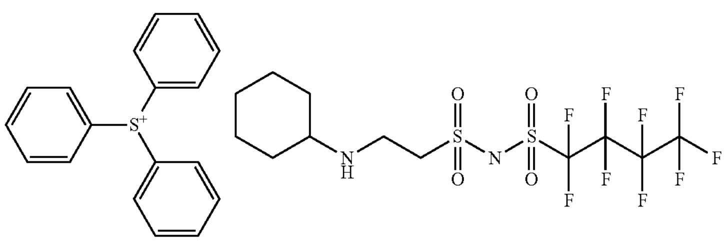
(PA-66)
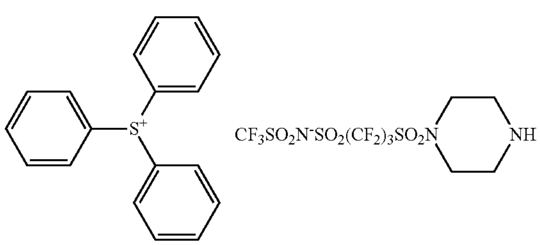

-continued
(PA-67)
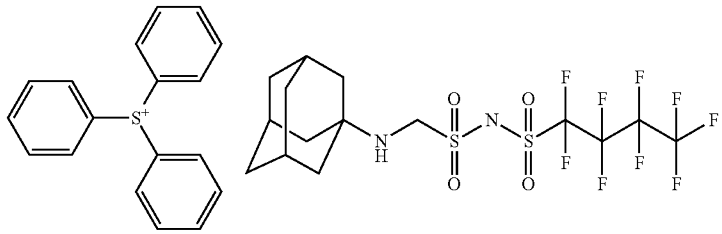
(PA-68)
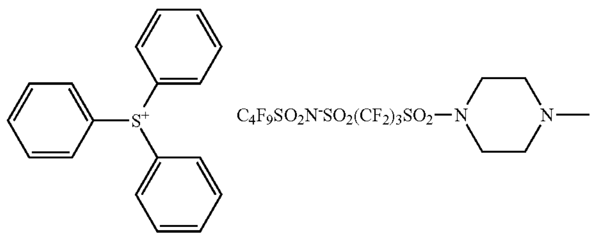
(PA-69)
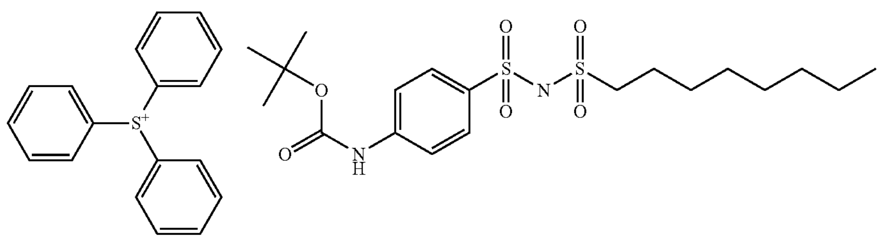
(PA-70)
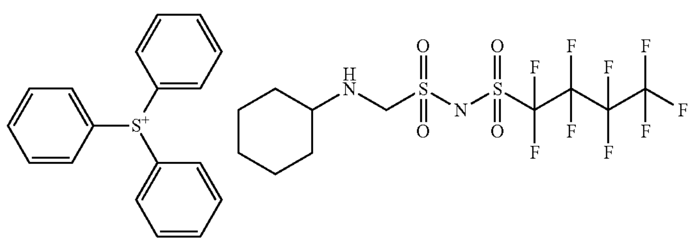
(PA-71)
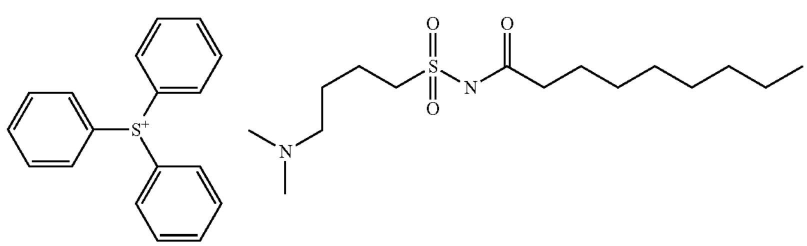
(PA-72)
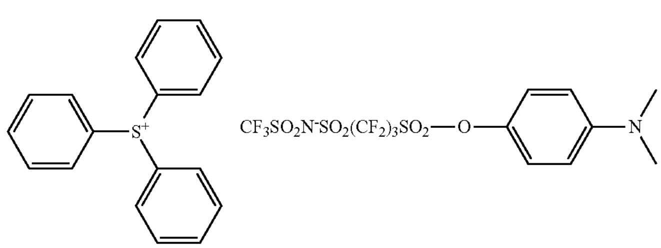

-continued
(PA-73)
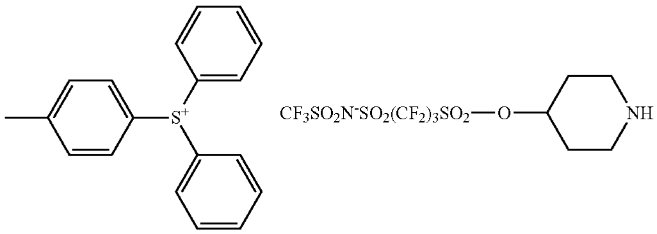
(PA-74)
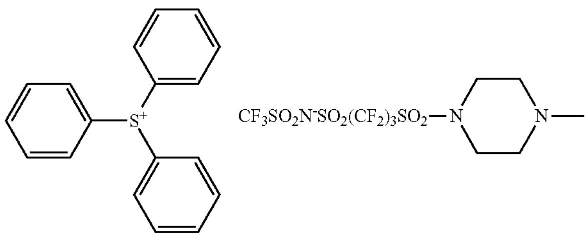
(PA-75)
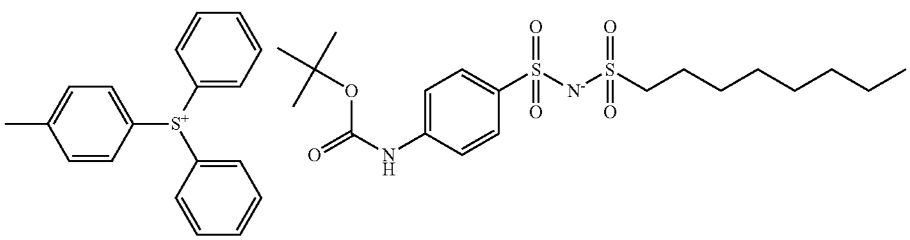
(PA-76)
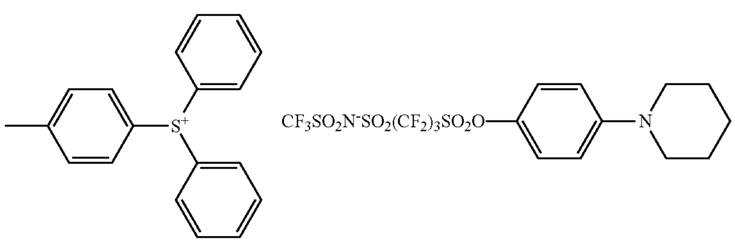
(PA-77)
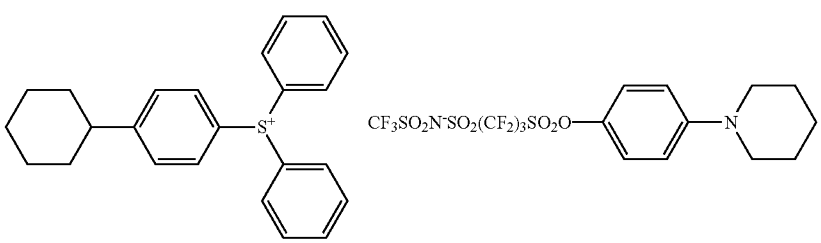
(PA-78)
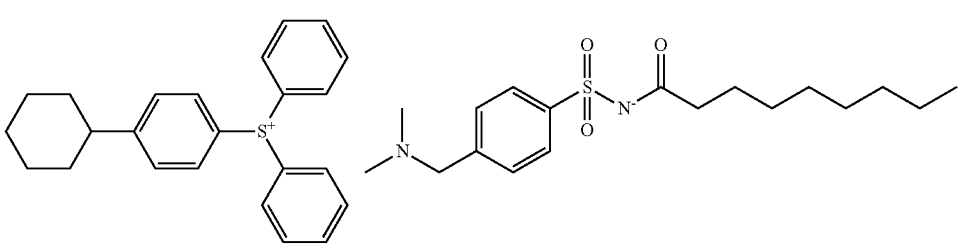

-continued
(PA-79)
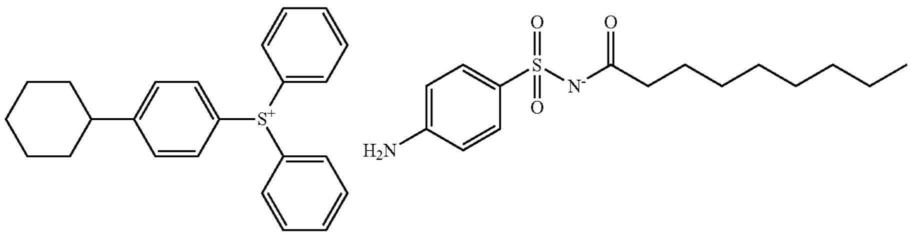
(PA-80)
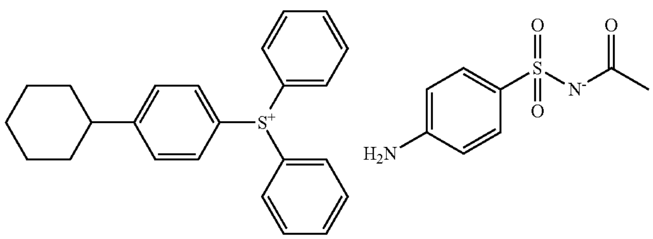
(PA-81)
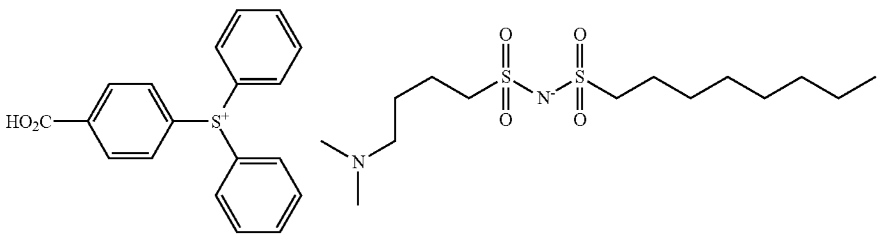
(PA-82)
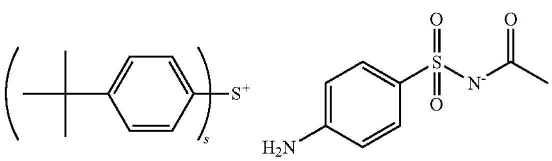
(PA-83)
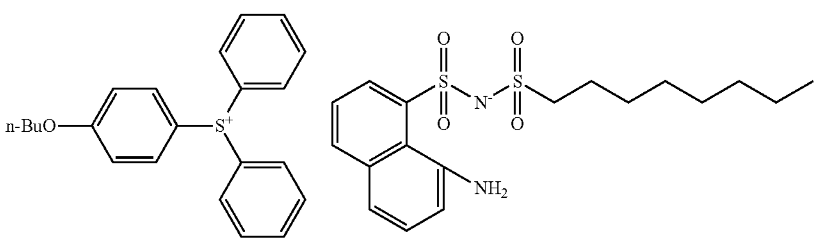
(PA-84)
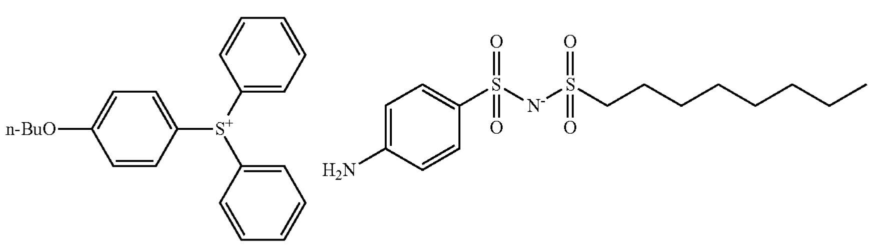
(PA-85)
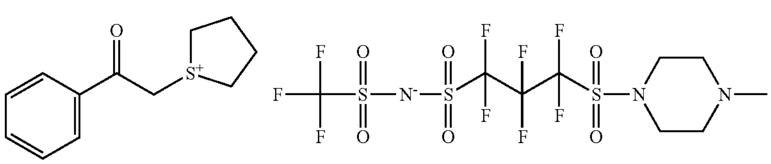

-continued
(PA-86)
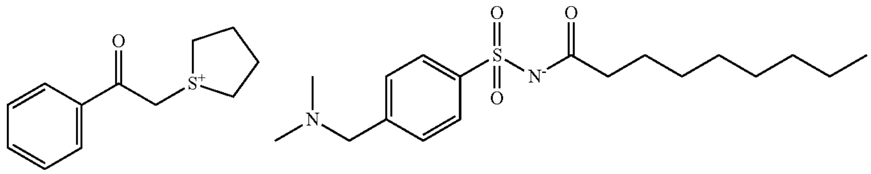
(PA-87)
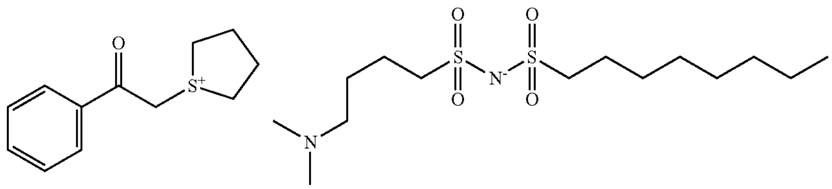
(PA-88)
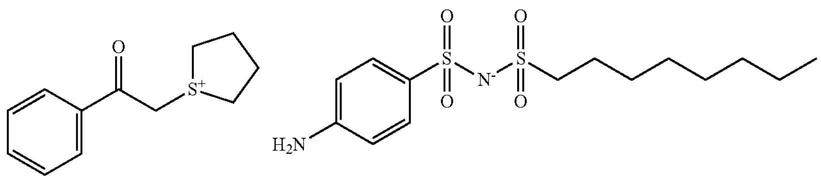
(PA-89)
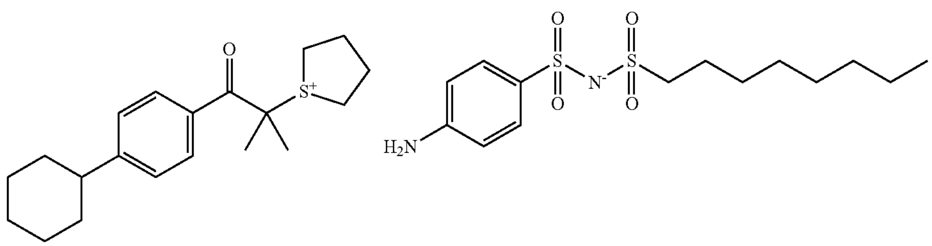
(PA-90)
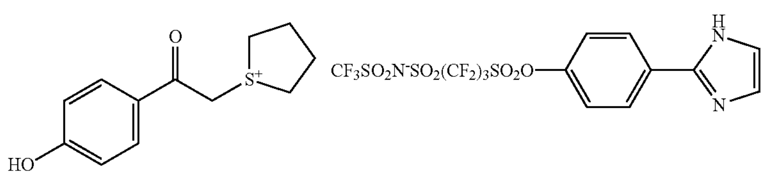
(PA-91)
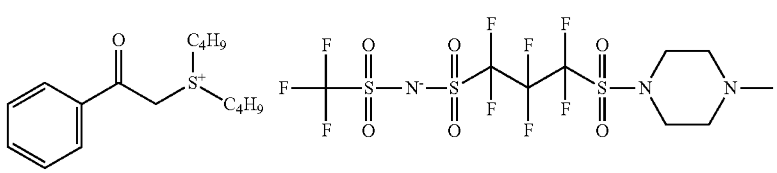
(PA-92)
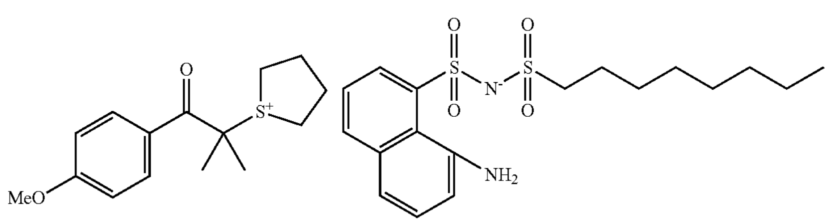
(PA-93)
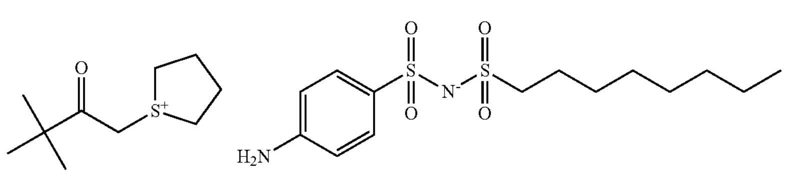

-continued
(PA-94)
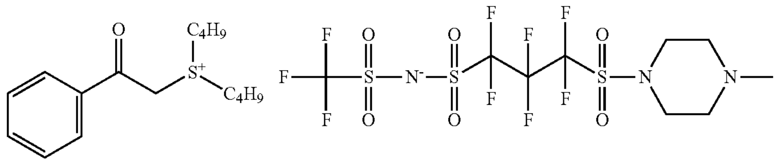
(PA-95)
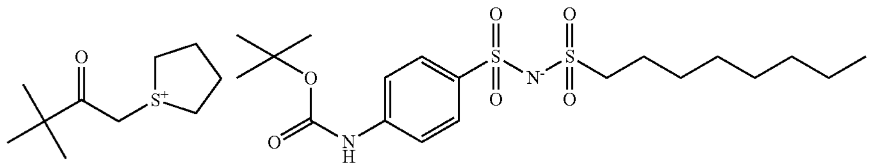
(PA-96)
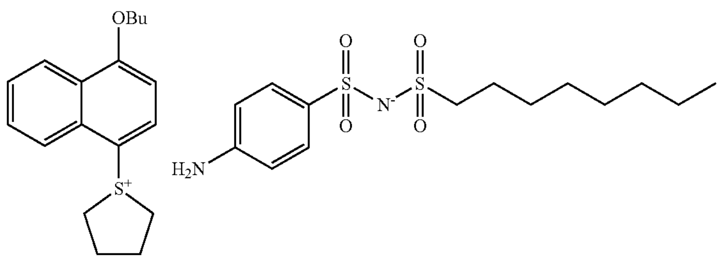
(PA-97)
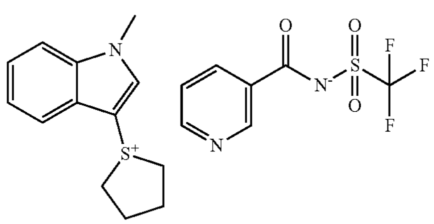
(PA-98)
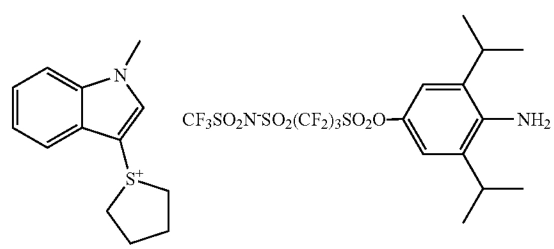
(PA-99)
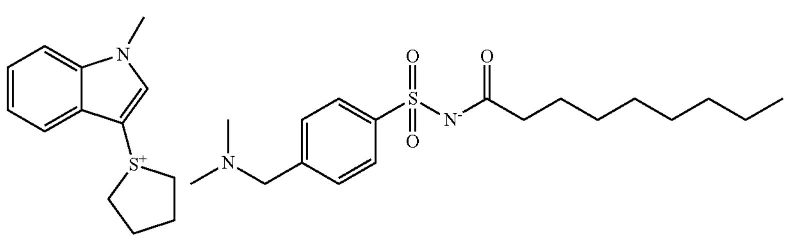
(PA-100)
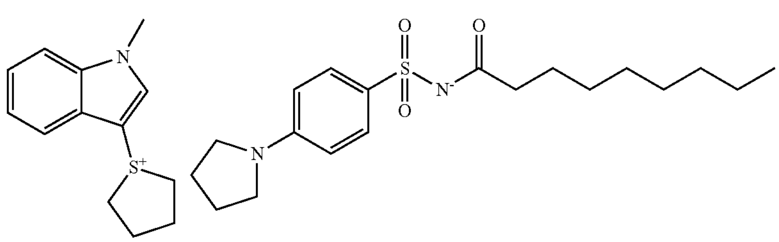
(PA-101)
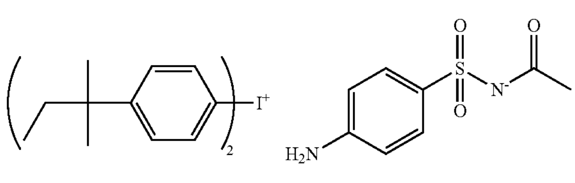

-continued (PA-102)

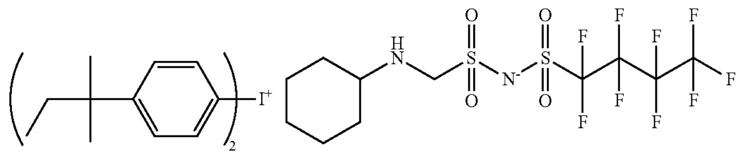

In the present invention, also, compounds (PA) other than those producing the compounds of general formula (PA-1) can be appropriately selected. For example, use can be made of ionic compounds each containing a proton acceptor moiety at its cation part. In particular, use can be made of the compounds of general formula (7) below and the like.

$$(R)_{m} \overset{X^-}{A^+} (R_N)_n \qquad (7)$$

In the formula, A represents a sulfur atom or an iodine atom, and m is 1 or 2, and n is 1 or 2, provided that when A is a sulfur atom, m+n=3, and that when A is an iodine atom, m+n=2.

R represents an aryl group.

$R_N$ represents an aryl group substituted with a functional group with proton acceptor properties.

$X^-$ represents a counter anion.

As particular examples of $X^-$ anions, there can be mentioned those set forth above in connection with general formula (ZI).

A preferred example of the aryl groups represented by R and $R_N$ is a phenyl group.

Specific examples of the functional groups with proton acceptor properties introduced in $R_N$ are the same as mentioned above in connection with formula (PA-1).

The content of the compound (PA) in the composition of the present invention is preferably in the range of 0.1 to 10 mass %, more preferably 1 to 8 mass % based on the total solids of the composition.

(6) Guanidine Compound

The composition of the present invention may further contain a guanidine compound with the structure of the formula below.

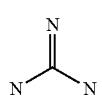

The guanidine compound exhibits a strong basicity since the positive charges of conjugate acid are dispersed and stabilized by three nitrogen atoms.

With respect to the basicity of the guanidine compound (A) according to the present invention, it is preferred for the pKa of conjugate acid to be 6.0 or higher. As the pKa value, 7.0 to 20.0 is more preferred from the viewpoint of high reactivity in the neutralization with an acid and excellence in roughness performance, and 8.0 to 16.0 is further more preferred.

This strong basicity suppresses the diffusion of an acid, thereby contributing to the formation of an excellent pattern shape.

Herein, the term "pKa" refers to the pKa in an aqueous solution, for example, any of those listed in kagaku Binran (Chemical Handbook) (II) (Revised 4th Edition, 1993, edited by The Chemical Society of Japan, published by Maruzen Co., Ltd.). The lower the value of pKa, the greater the acid strength. For example, the pKa in an aqueous solution can be actually measured through the determination of the acid dissociation constant at 25° C. using an infinitely diluted aqueous solution. Alternatively, the values based on a data base of heretofore known literature values and Hammett's substituent constants can be determined by calculation by means of the following software package 1. All the pKa values appearing in this description are those determined by calculation by means of this software package.

Software package 1: Advanced Chemistry Development (ACD/Labs) Software V8.14 for Solaris (1994-2007 ACD/Labs).

In the present invention, the term "log P" refers to the logarithm of n-octanol/water partition coefficient (P), which is an effective parameter capable of characterizing the hydrophilicity/hydrophobicity with respect to a vast variety of compounds. The partition coefficient is generally determined by calculation, not by experiment. In the present invention, the values calculated by CSChemDrawUltra Ver. 8.0 software package (Crippen's fragmentation method) are indicated.

It is preferred for the log P of the guanidine compound (A) to be 10 or less, by which the guanidine compound can be homogeneously introduced in the resist film.

In the present invention, in particular, the log P of the guanidine compound (A) is preferably in the range of 2 to 10, more preferably 3 to 8 and further more preferably 4 to 8.

The guanidine compound (A) according to the present invention preferably contains no nitrogen atom other than those of the guanidine structure.

Nonlimiting specific examples of the guanidine compounds are shown below.

Log P: 4.29

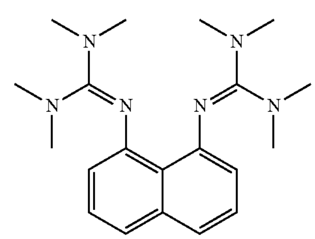

Log P: 3.32

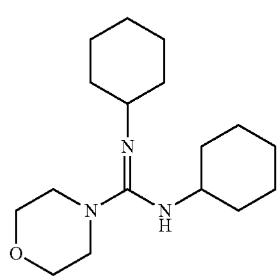

-continued
Log P: 5.66
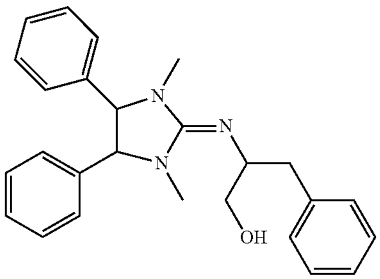
Log P: 5.24
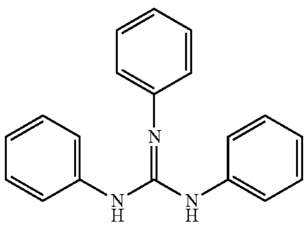
Log P: 4.89
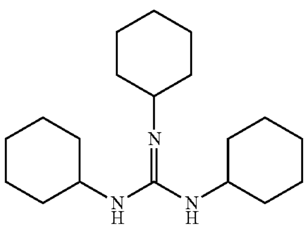
Log P: 5.17
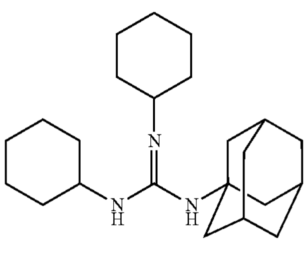
Log P: 5
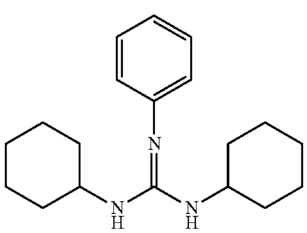
Log P: 3.1
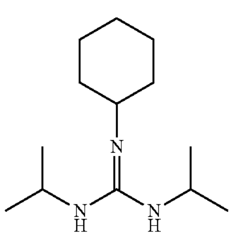
-continued
Log P: 3.1
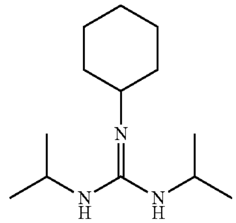
Log P: 5.12
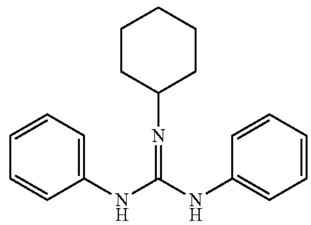
Log P: 5.4
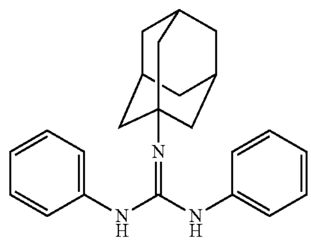
Log P: 3.54
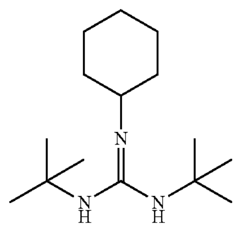
Log P: 6.21
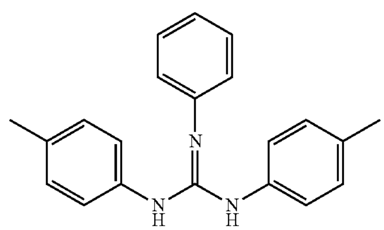
Log P: 3.38
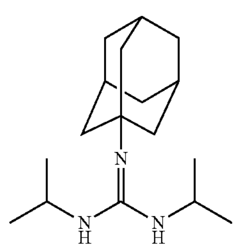
Log P: 6.23
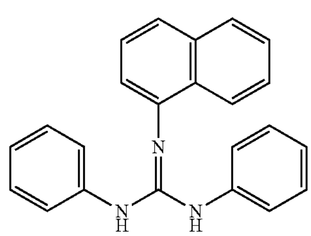

-continued
Log P: 5.11
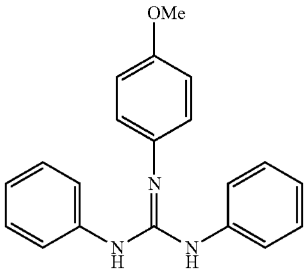
Log P: 3.55
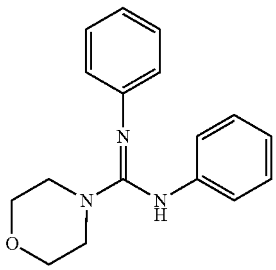
Log P: 2.21
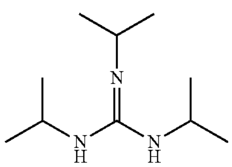
Log P: 3.72
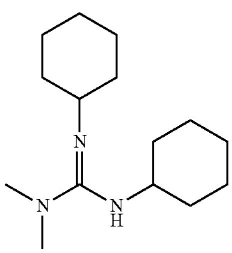
Log P: 7.21
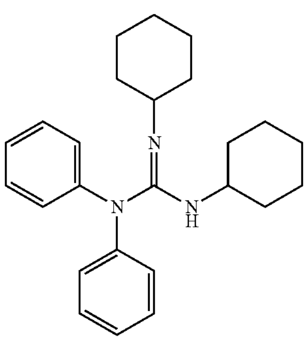
Log P: 6.81
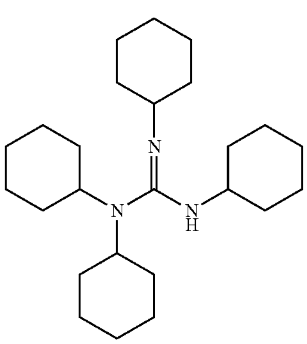
-continued
Log P: 8.74
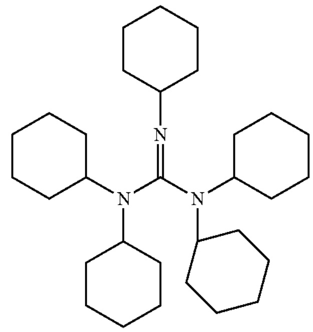
Log P: 2.61
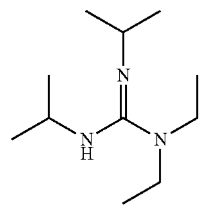
Log P: 3.34
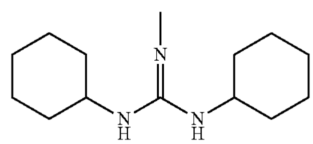
Log P: 3.1
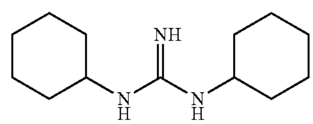
Log P: 3.34
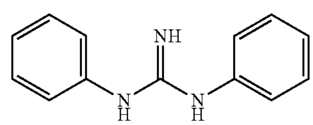
Log P: 5.42
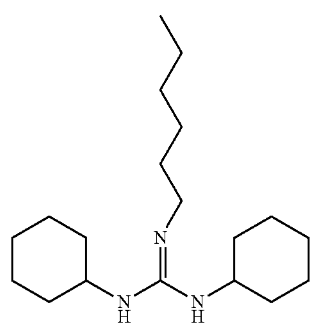
Log P: 4.05
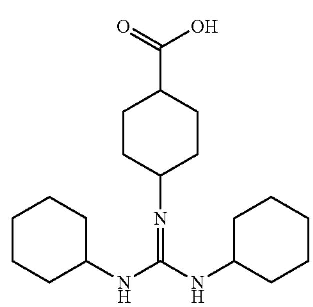

-continued
Log P: 5.19
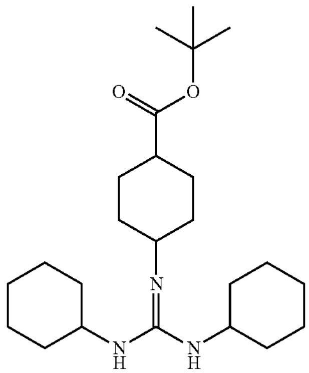
Log P: 5.66
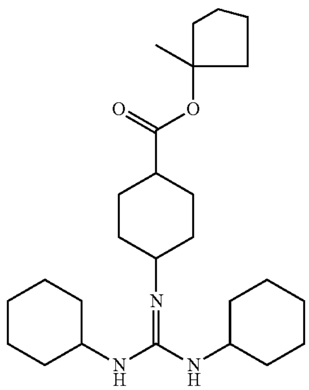
Log P: 6
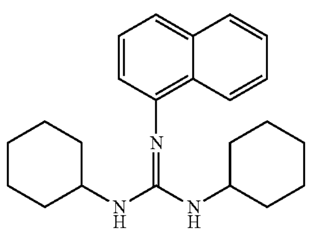
Log P: 4.61
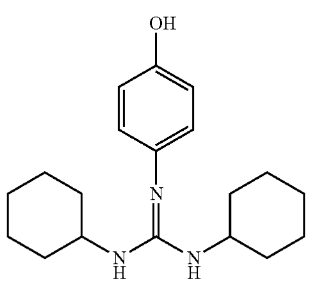
Log P: 5.83
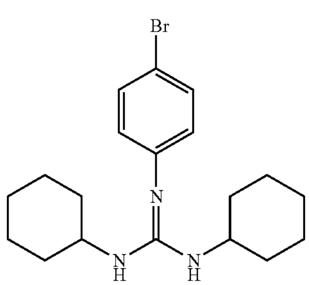
-continued
Log P: 6.53
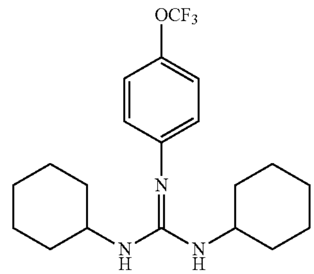
Log P: 6.25
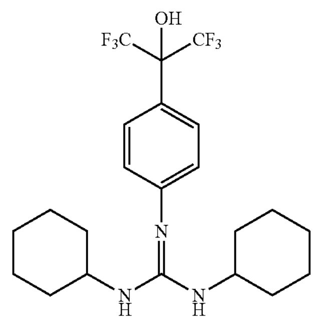
Log P: 6.25
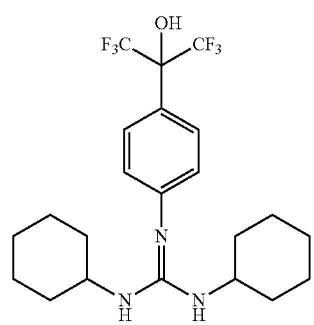
Log P: 5.66
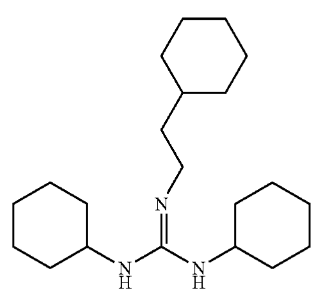
Log P: 5.79
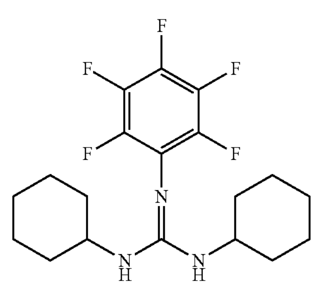

Log P: 5.04
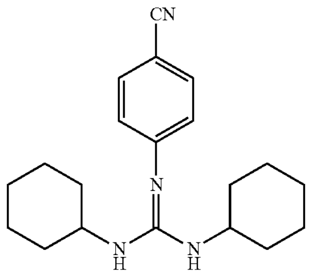
Log P: 5.04
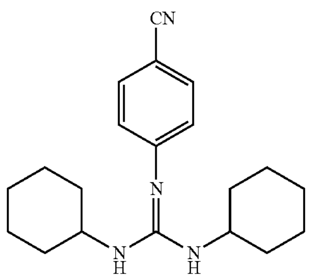
Log P: 4.56
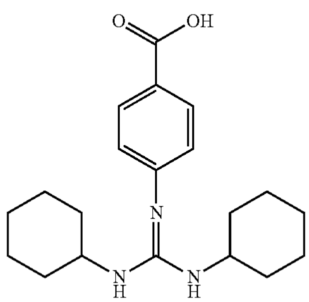
Log P: 4.79
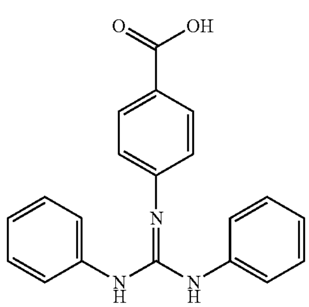
Log P: 3.66
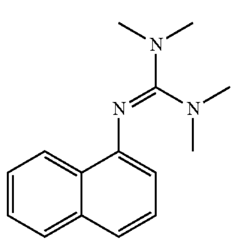
Log P: 1.56
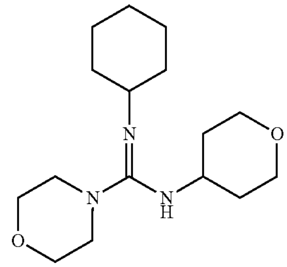
Log P: 5.84
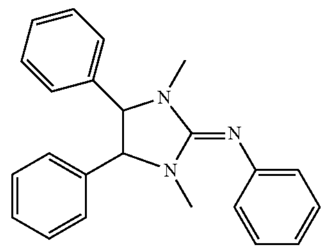
Log P: 3.28
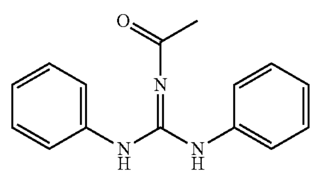
Log P: 1.75
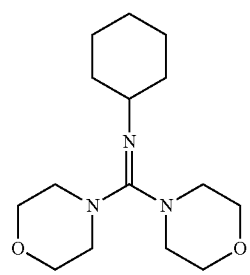
Log P: 4.89
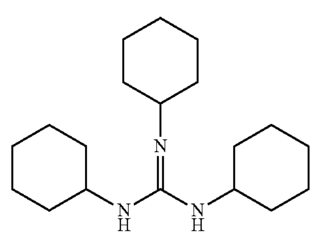
Log P: 5.73
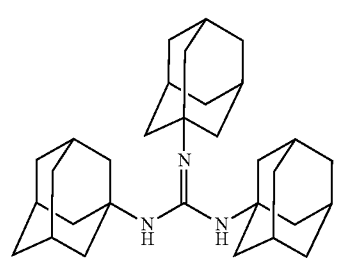

-continued
Log P: 5
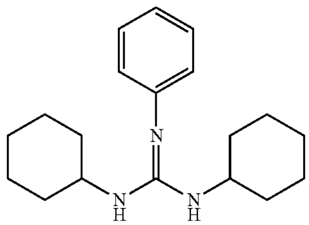
Log P: 5.26
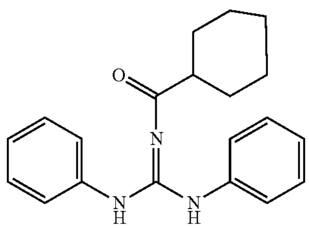
Log P: 4.95
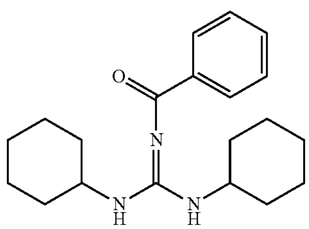
Log P: 4.51
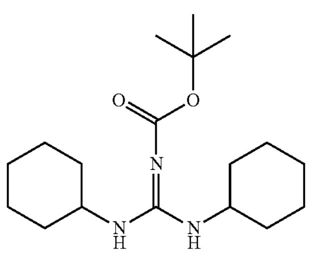
Log P: 3.83
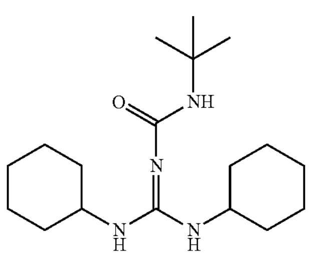
Log P: 2.31
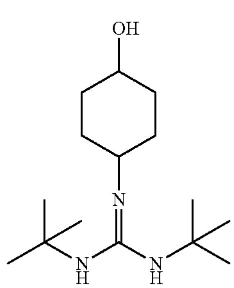
-continued
Log P: 4.46
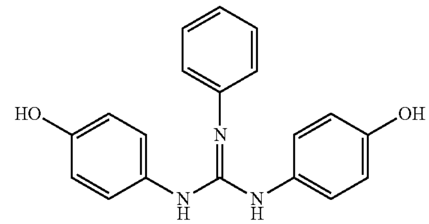
Log P: 3.38
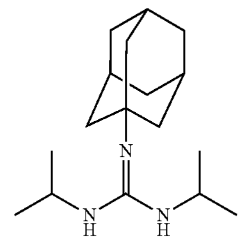
Log P: 7.23
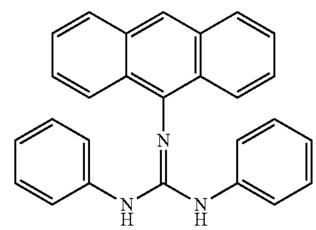
Log P: 4.55
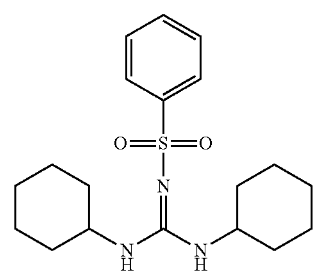
Log P: 5.04
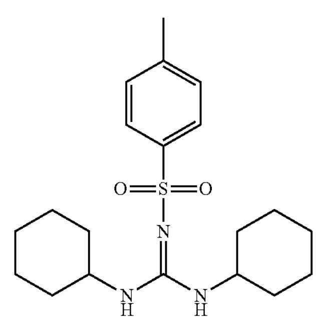
Log P: 2.36
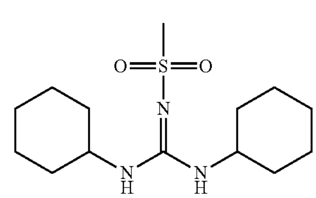

-continued
Log P: 4.54
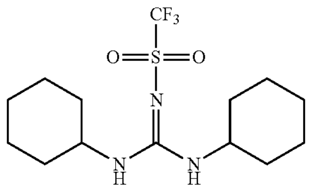
Log P: 6.08
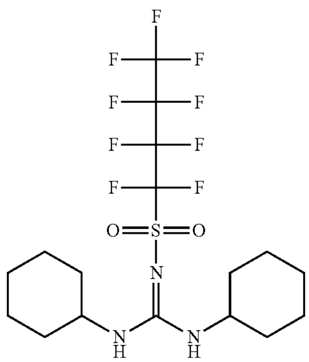
Log P: 4.43
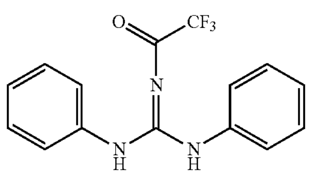
Log P: 4.62
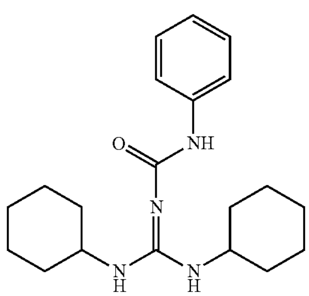
Log P: 3.19
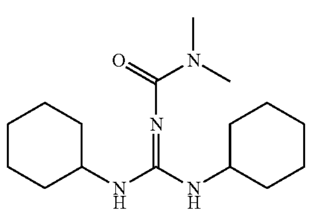
Log P: 2.67
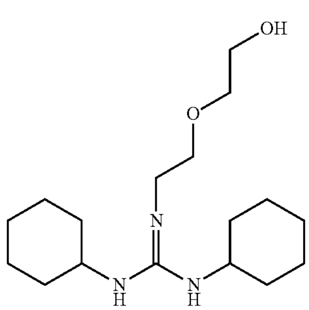
-continued
Log P: 3.18
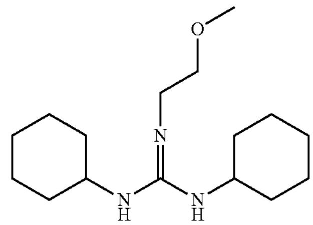
Log P: 1.44
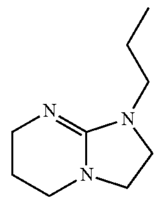
Log P: 1.67
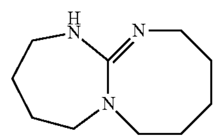
Log P: 6.44
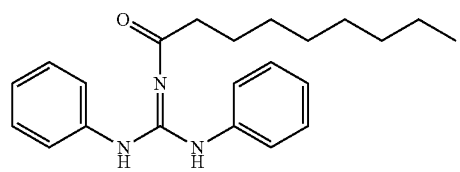
Log P: 1.34
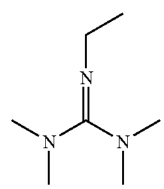
Log P: 4.4
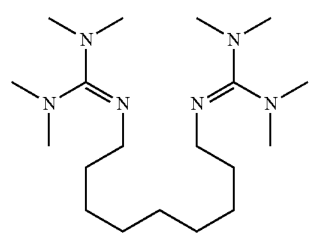
Log P: 3.7
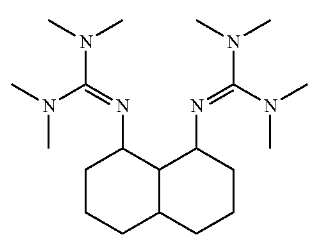
Log P: 3.38
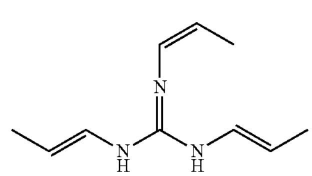

-continued

Log P: 3.91

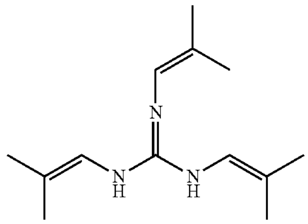

Log P: 4.47

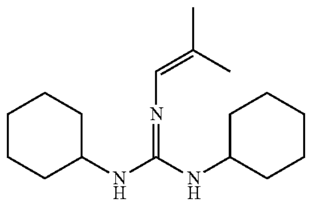

Log P: 5.3

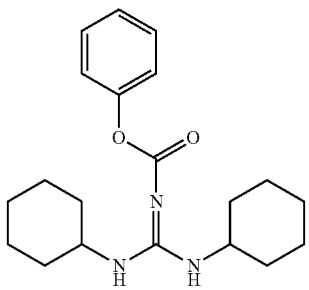

(7) Low-Molecular Compound Containing a Nitrogen Atom and a Group Cleaved by the Action of an Acid The composition of the present invention may be loaded with a low-molecular compound (hereinafter also referred to as "low-molecular compound (D)" or "compound (D)") containing a nitrogen atom and a group cleaved by the action of an acid. It is preferred for the low-molecular compound (D) to exhibit basicity upon the cleavage of the group cleaved by the action of an acid.

The group that is cleaved when acted on by an acid is not particularly limited. However, an acetal group, a carbonate group, a carbamate group, a tertiary ester group, a tertiary hydroxyl group and a hemiaminal ether group are preferably used. A carbamate group and a hemiaminal ether group are especially preferred.

The molecular weight of the low-molecular compound (D) is preferably in the range of 100 to 1000, more preferably 100 to 700 and most preferably 100 to 500.

As the compound (D), an amine derivative containing a group that is cleaved when acted on by an acid being connected to a nitrogen atom.

The compound (D) may contain a carbamate group with a protective group, the carbamate group being connected to a nitrogen atom. The protective group contained in the carbamate group can be represented, for example, by the following formula (d-1).

(d-1)

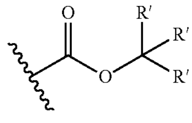

In formula (d-1),

Each of R's independently represents a hydrogen atom, a linear or branched alkyl group, a cycloalkyl group, an aryl group, an aralkyl group, or an alkoxyalkyl group. At least two of R's may be connected to each other to form a ring.

Preferably, R' represents a linear or branched alkyl group, a cycloalkyl group, or an aryl group. More preferably, R' represents a linear or branched alkyl group, or a cycloalkyl group.

Specific examples of the structures of the groups as described above are shown below.

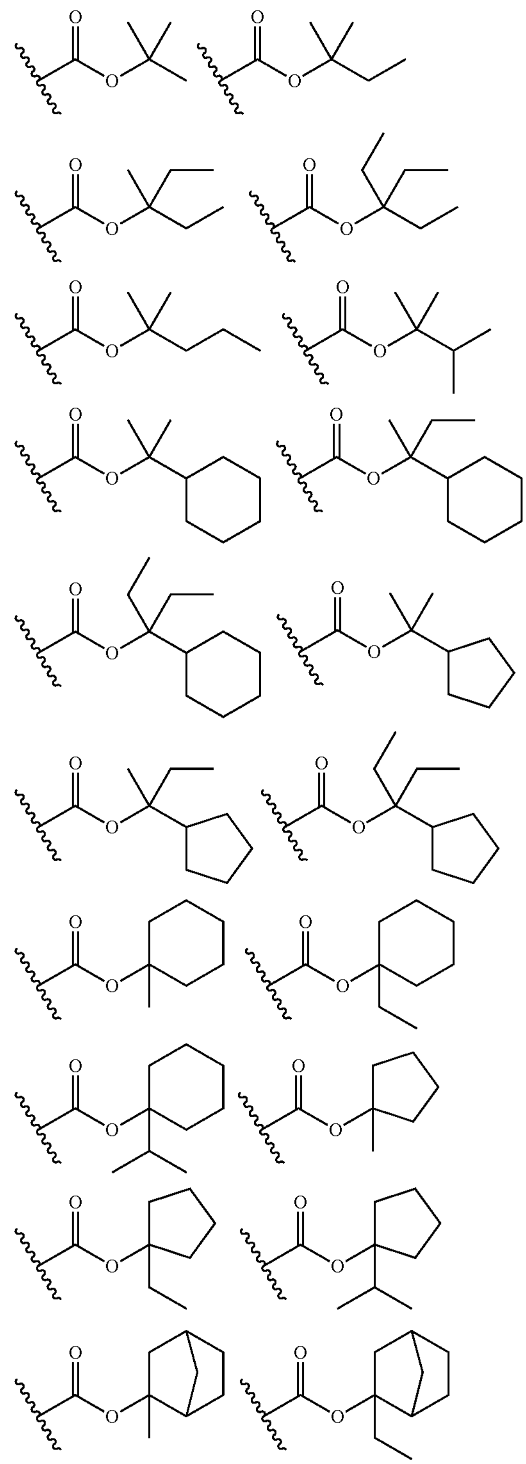

-continued
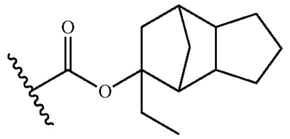
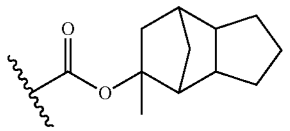
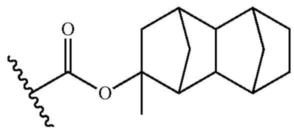
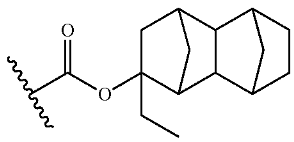
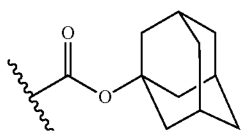
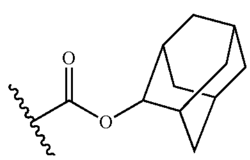
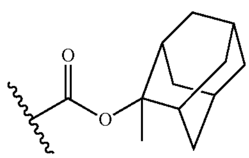
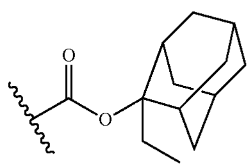
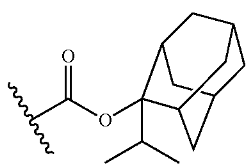
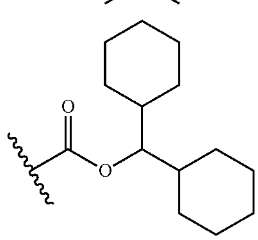
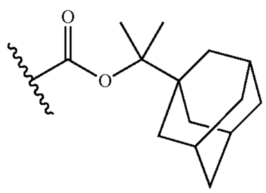
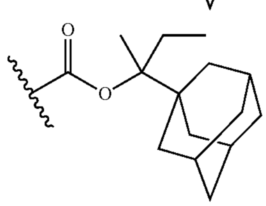
-continued
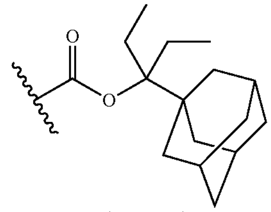
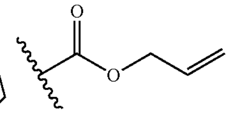
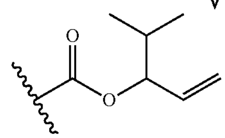
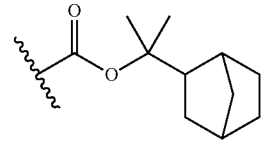
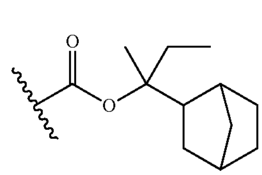
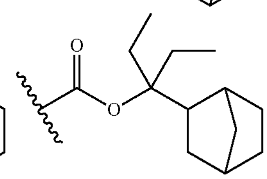
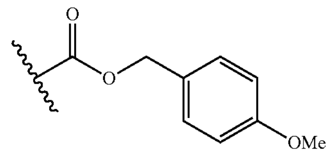
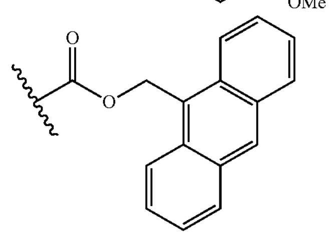
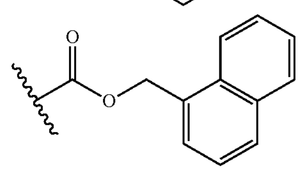
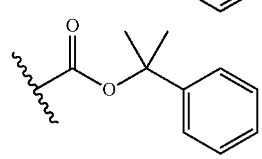
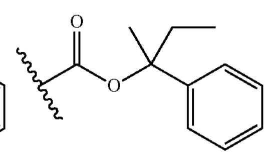
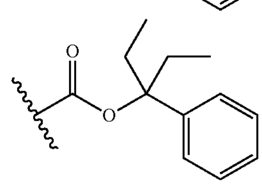
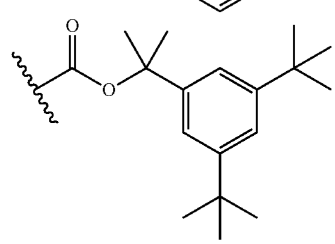
The compound (D) can also be constituted of an arbitrary combination of any of the basic compounds to be described hereinafter with any of the structures of general formula (d-1).

The compound (D) is especially preferred to be the one represented by general formula (A) below.

Note that, the compound (D) may be any of the basic compounds described above as long as it is a low-molecular compound containing a group that is cleaved when acted on by an acid.

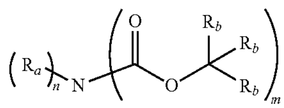

(A)

In the general formula (A), Ra represents a hydrogen atom, an alkyl group, a cycloalkyl group, an aryl group, or an aralkyl group. When n=2, two Ra's may be the same or different from each other, and may be connected to each other to form a bivalent heterocyclic hydrocarbon group (preferably having 20 or less carbon atoms) or its derivatives.

Each of Rb's independently represents a hydrogen atom, an alkyl group, a cycloalkyl group, an aryl group, an aralkyl group, or an alkoxyalkyl group, with the proviso that when at least one of Rb's are hydrogen atoms, at least one of the remainder represents a cyclopropyl group, 1-alkoxyalkyl group, or an aryl group.

At least two of Rb's may be connected to each other to form a alicyclic hydrocarbon group, an aromatic hydrocarbon group, a heterocyclic hydrocarbon group, or their derivatives.

In the formula (A), n represents an integer of 0 to 2, m represents an integer of 1 to 3, and n+m=3.

In the formula (A), the alkyl group, the cycloalkyl group, the aryl group, and the aralkyl group represented by Ra and Rb may be substituted with a functional group such as a hydroxyl group, a cyano group, an amino group, a pyrrolidino group, a piperidino group, a morpholino group, and an oxo group; an alkoxy group; or a halogen atom. The same applies to the alkoxyalkyl group represented by Rb.

As the alkyl group, the cycloalkyl group, the aryl group, and the aralkyl group (these groups may be substituted with the above functional group, an alkoxy group, or a halogen atom) represented by Ra and/or Rb, the following groups can be exemplified:

a group derived from a linear or branched alkane such as methane, ethane, propane, butane, pentane, hexane, heptane, octane, nonane, decane, undecane, or dodecane; and the group derived from the alkane and substituted with one or more cycloalkyl groups such as a cyclobutyl group, a cyclopentyl group, or a cyclohexyl group;

a group derived from cycloalkane such as cyclobutane, cyclopentane, cyclohexane, cycloheptane, cyclooctane, norbornane, adamantane, or noradamantane; and the group derived from the cycloalkane and substituted with one or more linear or branched alkyl group such as a methyl group, an ethyl group, a n-propyl group, an i-propyl group, a n-butyl group, a 2-methylpropyl group, a 1-methylpropyl group, or a t-butyl group;

a group derived from aromatic compound such as benzene, naphthalene, or anthracene; and the group derived from the atomatic compound and substituted with one or more linear or branched alkyl group such as a methyl group, an ethyl group, a n-propyl group, an i-propyl group, a n-butyl group, a 2-methylpropyl group, a 1-methylpropyl group, or a t-butyl group;

a group derived from heterocyclic compound such as pyrrolidine, piperidine, morpholine, tetrahydrofuran, tetrahydropyrane, indole, indoline, quinoline, perhydroquinoline, indazole, or benzimidazole; the group derived from heterocyclic compound and substituted with one or more linear or branched alkyl group or a group derived from the aromatic compound;

a group derived from linear or branched alkane and substituted with a group derived from aromatic compound such as a phenyl group, a naphthyl group, or an anthracenyl group;

a group derived from cycloalkane and substituted with a group derived from aromatic compound such as a phenyl group, a naphthyl group, or an anthracenyl group; or each of these groups substituted with a functional group such as a hydroroxyl group, a cyano group, an amino group, a pyrrolidino group, a piperidino group, a morpholino group, or an oxo group.

Further, as the bivalent heterocyclic hydrocarbon group (preferably having 1 to 20 carbon atoms) or its derivative, formed by mutual binding of Ra's, for example, the followings can be exemplified:

a group derived from heterocyclic compound such as pyrrolidine, piperidine, morpholine, 1,4,5,6-tetrahydropyrimidine, 1,2,3,4-tetrahydroquinoline, 1,2,3,6-tetrahydroquinoline, homopiperadine, 4-azabenzimidazole, benztriazole, 5-azabenztriazole, 1H-1,2,3-triazole, 1,4,7-triazacyclononane, tetrazole, 7-azaindole, indazole, benzimidazole, imidazo[1,2-a]pyridine, (1S,4S)-(+)2,5-azabicyclo[2.2.1]heptane, 1,5,7-triazabicyclo[4.4.0]dec-5-en, indole, indoline, 1,2,3,4-tetrahydroquinoxaline, perhydroquinoline, or 1,5,9-triazacyclododecane; or the group derived from heterocyclic compound and substituted with at least one of a group derived from linear or branched alkane, a group derived from cycloalkane, a group derived from aromatic compound, a group derived from heterocyclic compound, or a functional group such as a hydroxyl group, a cyano group, an amino group, a pyrrolidino group, a piperidino group, a morpholino group, or an oxo group.

Particularly preferred examples of the compound (D) will be shown below, which however in no way limit the scope of the present invention.

(D-1)

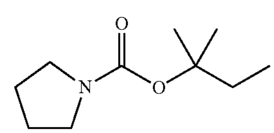

(D-2)

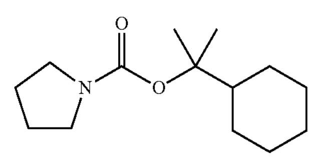

(D-3)

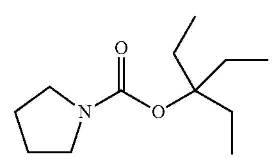

(D-4)

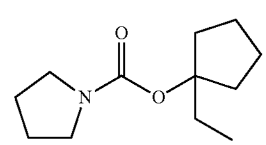

-continued
(D-5)
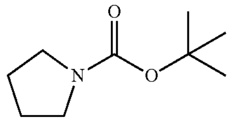
(D-6)
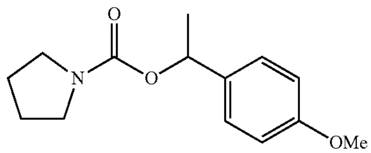
(D-7)
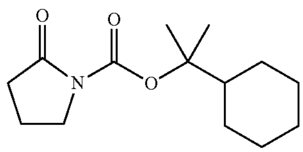
(D-8)
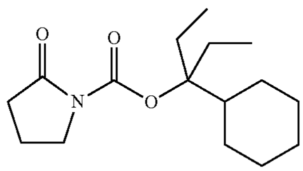
(D-9)
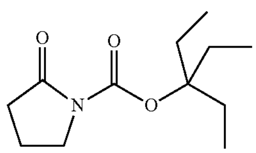
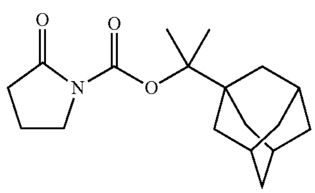
(D-11)
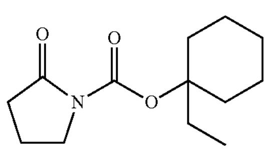
(D-12)
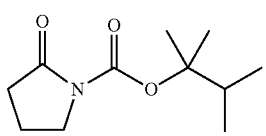
(D-13)
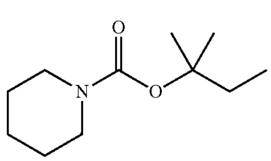
(D-14)
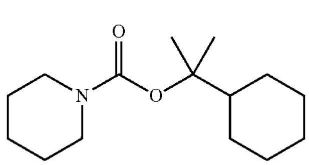
-continued
(D-15)
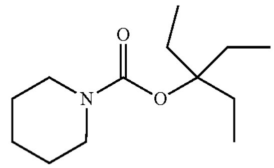
(D-16)
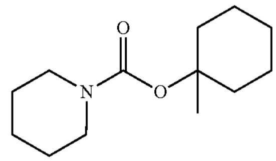
(D-17)
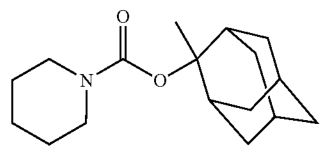
(D-18)
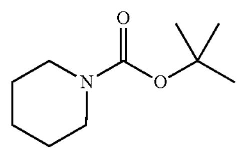
(D-19)
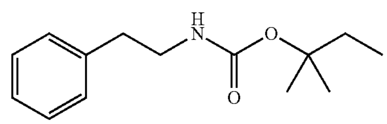
(D-20)
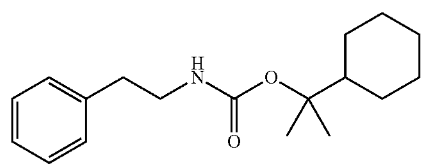
(D-21)
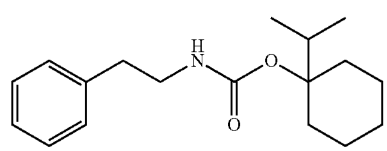
(D-22)
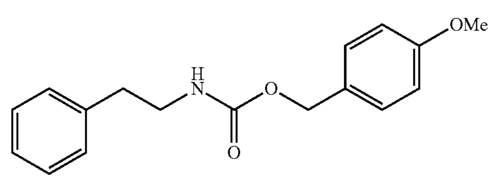
(D-23)
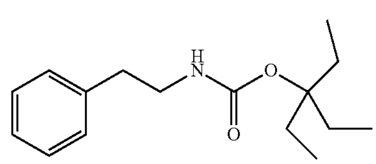

-continued
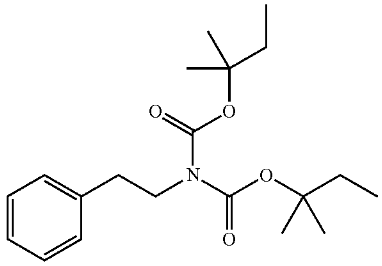
(D-24)
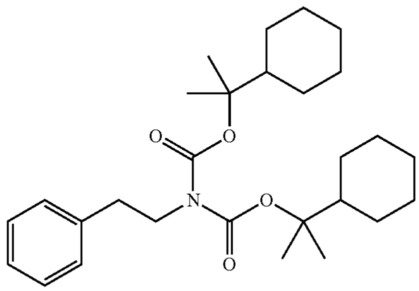
(D-25)
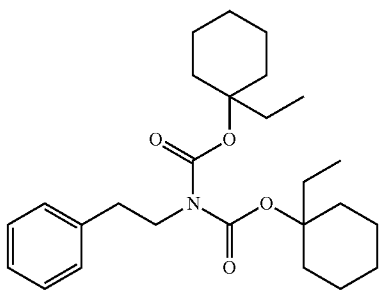
(D-26)
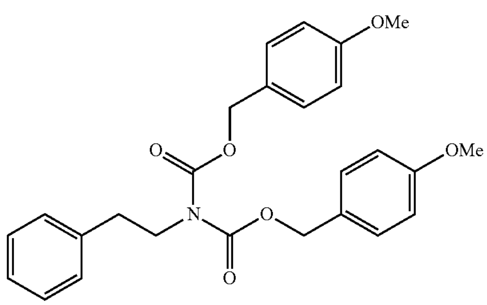
(D-27)
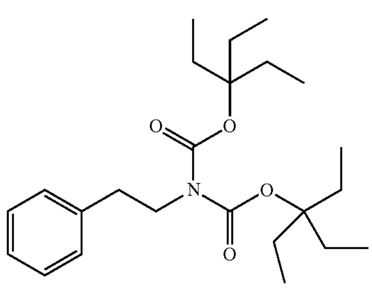
(D-28)
-continued
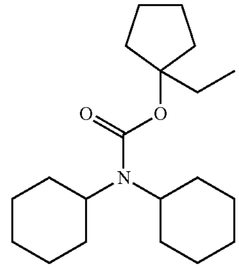
(D-29)
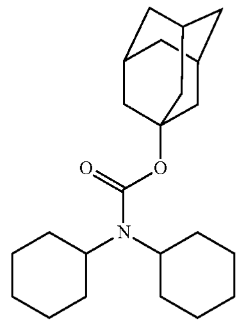
(D-30)
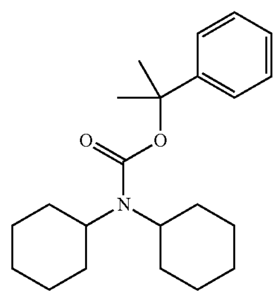
(D-31)
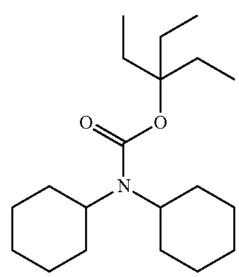
(D-32)
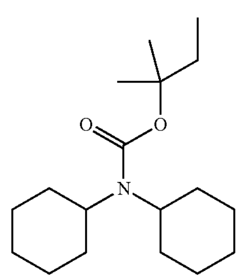
(D-33)

-continued
(D-34)
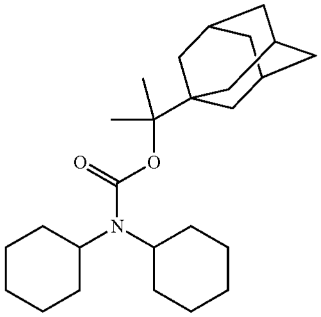
(D-35)
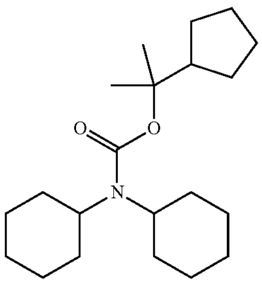
(D-36)
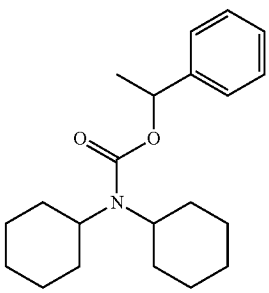
(D-37)
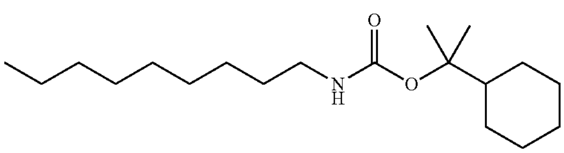
(D-38)
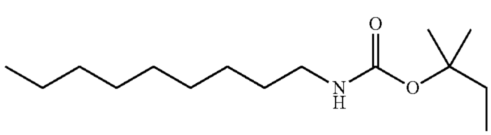
(D-39)
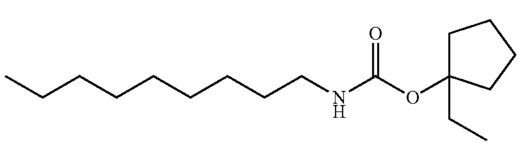
(D-40)
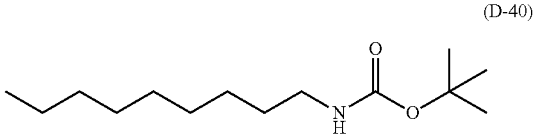
-continued
(D-41)
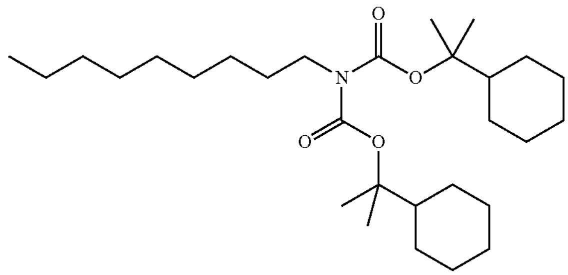
(D-42)
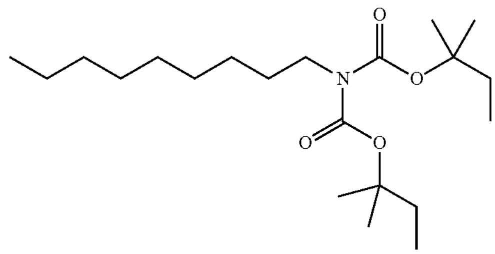
(D-43)
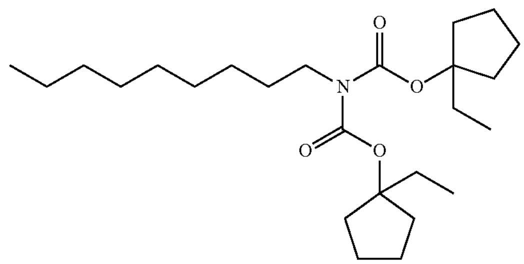
(D-44)
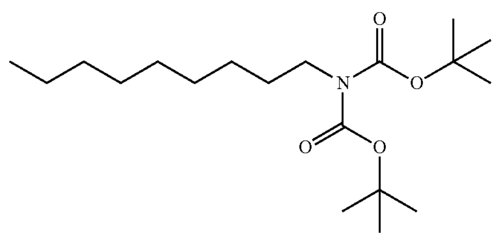
(D-45)
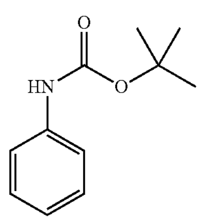
(D-46)
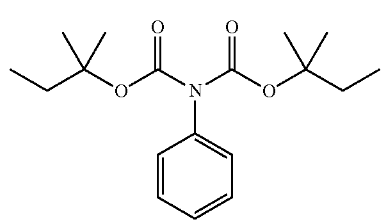

-continued
(D-47)
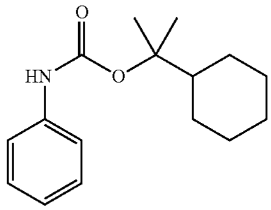
(D-48)
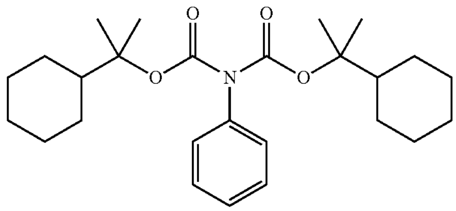
(D-49)
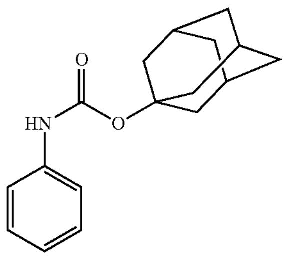
(D-50)
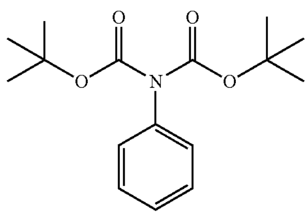
(D-51)
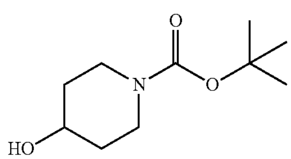
(D-52)
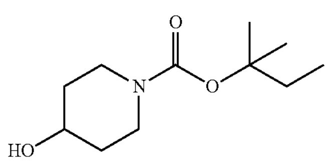
(D-53)
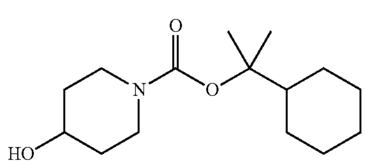
(D-54)
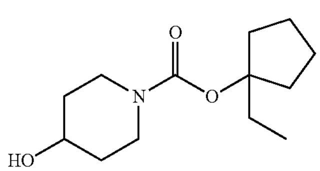
-continued
(D-55)
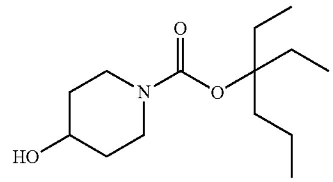
(D-56)
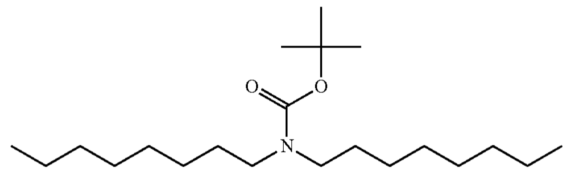
(D-57)
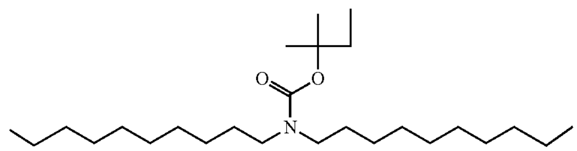
(D-58)
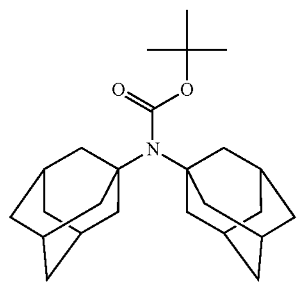
(D-59)
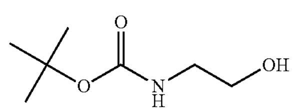
(D-60)
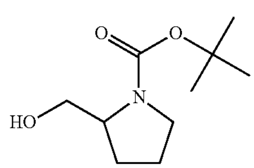
(D-61)
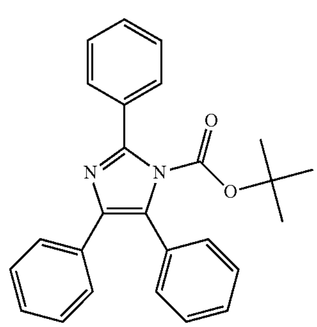

-continued (D-62)

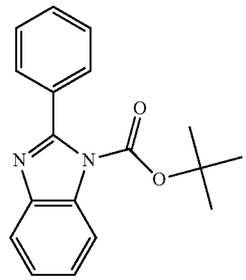

(D-63)

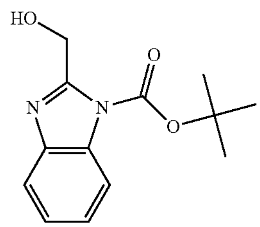

(D-64)

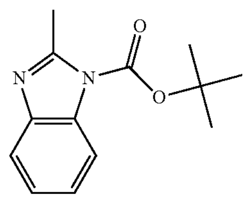

(D-65)

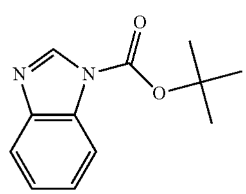

The compounds of general formula (A) can be synthesized by, for example, the method described in JP-A-2007-298569 or JP-A-2009-199021.

It is optional for the composition of the present invention to comprise low-molecular compound (D). When low-molecular compound (D) is comprised, the content of low-molecular compound (D), based on the total solids of the composition mixed with the above-mentioned basic compound, is generally in the range of 0.001 to 20 mass %, preferably 0.001 to 10 mass % and more preferably 0.01 to 5 mass %.

When the composition of the present invention comprises a acid generator, with respect to the ratio between acid generator and compound (D), it is preferred for the molar ratio of acid generator/[compound (D)+above-mentioned basic compound] to be in the range of 2.5 to 300. Namely, the molar ratio is preferred to be 2.5 or higher from the viewpoint of sensitivity and resolution, and the molar ratio is preferred to be 300 or below from the viewpoint of inhibiting the lowering of resolution by thickening of resist pattern over time from exposure to baking treatment. The molar ratio of acid generator/[compound (D)+above-mentioned basic compound] is more preferably in the range of 5.0 to 200, further more preferably 7.0 to 150.

Specific examples of the functional groups with proton acceptor properties introduced in $R_N$ are the same as mentioned above in connection with formula (PA-1). As other compounds usable in the composition of the present invention, there can be mentioned the basic compounds synthesized in Examples of JP-A-2002-363146, the compounds described in Paragraph 0108 of JP-A-2007-298569, and the like.

Further, photosensitive basic compounds may be used as basic compounds. As photosensitive basic compounds, use can be made of, for example, the compounds described in Jpn. PCT National Publication No. 2003-524799, J. Photopolym. Sci & Tech. Vol. 8, p. 543-553 (1995), etc.

The molecular weight of each of these basic compounds is generally in the range of 100 to 1500, preferably 150 to 1300 and more preferably 200 to 1000.

One type of the basic compounds may be used alone, or two or more types thereof may be used in combination.

When the composition of the present invention comprises a basic compound, the content of the basic compound in the composition is preferably in the range of 0.01 to 8.0 mass %, more preferably 0.1 to 5.0 mass % and still more preferably 0.2 to 4.0 mass % based on the total solids of the composition.

The molar ratio of basic compound to photoacid generator is preferably in the range of 0.01 to 10, more preferably 0.05 to 5 and further more preferably 0.1 to 3. When this molar ratio is extremely high, the possibility of sensitivity and/or resolution deterioration is invited. On the other hand, when the molar ratio is extremely low, any pattern thickening might occur during the period between exposure and postbake. In this molar ratio, the amount of photoacid generator is based on the sum of the amounts of repeating unit (B) of the resin and photoacid generator optionally further contained in the composition of the present invention.

[Surfactant]

The composition of the present invention may further contain a surfactant. The surfactant is preferably a fluorinated and/or siliconized surfactant.

As such a surfactant, there can be mentioned Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., polysiloxane polymer KP-341 produced by Shin-Etsu Chemical Co., Ltd., or the like.

Surfactants other than these fluorinated and/or siliconized surfactants can also be used. In particular, the other surfactants include a nonionic surfactant, such as polyoxyethylene alkyl ethers, polyoxyethylene alkyl aryl ethers and the like.

Moreover, generally known surfactants can also be appropriately used. As useful surfactants, there can be mentioned, for example, those described in section [0273] et seq of US 2008/0248425 A1.

These surfactants may be used alone or in combination.

When the composition of the present invention comprises a surfactant, the content thereof is preferably in the range of 0.0001 to 2 mass %, more preferably 0.001 to 1 mass %, based on the total solids of the composition.

[Dye]

The composition of the present invention may further comprise a dye.

Suitable dyes are, for example, oil dyes and basic dyes. Particular examples of such dyes include Oil Yellow #101, Oil Yellow #103, Oil Pink #312, Oil Green BG, Oil Blue BOS, Oil Blue #603, Oil Black BY, Oil Black BS and Oil Black T-505 (all of which are products of Orient Chemical Industries, Ltd.), Crystal Violet (CI42555), Methyl Violet (CI42535), Rhodamine B (CI45170B), Malachite Green (CI42000) and Methylene Blue (CI52015).

[Photobase Generator]

The composition of the present invention may further comprise a photobase generator. More favorable patterns can be formed by incorporating a photobase generator.

As photobase generators, there can be mentioned, for example, the compounds described in JP-A's H4-151156, H4-162040, H5-197148, H5-5995, H6-194834, H8-146608 and H10-83079 and European Patent No. 622,682.

As preferred photobase generators, there can be mentioned, for example, 2-nitrobenzyl carbamate, 2,5-dinitrobenzylcyclohexyl carbamate, N-cyclohexyl-4-methylphenylsulfonamide and 1,1-dimethyl-2-phenylethyl N-isopropylcarbamate.

[Antioxidant]

The composition of the present invention may further comprise an antioxidant. Any oxidation of organic material in the presence of oxygen can be inhibited by incorporating an antioxidant.

As the antioxidant, there can be mentioned a phenolic antioxidant, an antioxidant of organic acid derivative, a sulfurous antioxidant, a phosphorus antioxidant, an amine antioxidant, an amine-aldehyde condensate antioxidant or the like. From the viewpoint of exerting of the effects of the antioxidant without any deterioration of resist functions, it is preferred to use a phenolic antioxidant or an antioxidant of organic acid derivative among the above antioxidants.

As the phenolic antioxidant, there can be mentioned, for example, substituted phenols, or bis-, tris or polyphenols.

As the substituted phenols, there can be mentioned, for example, 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butylhydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butylanilino)-2,4-bisoctylthio-1,3,5-triazine, n-octadecyl-3-(4'-hydroxy-3',5'-di-3,5-tert-butylphenyl) propionate, octylated phenol, aralkyl-substituted phenols, alkylated p-cresols and hindered phenols.

As the bis-, tris- and polyphenols, there can be mentioned, for example, 4,4'-dihydroxydiphenyl, methylenebis(dimethyl-4,6-phenol), 2,2'-methylene-bis(4-methyl-6-tert-butylphenol), 2,2'-methylene-bis(4-methyl-6-cyclohexylphenol), 2,2'-methylene-bis(4-ethyl-6-tert-butylphenol), 4,4'-methylene-bis(2,6-di-tert-butylphenol), 2,2'-methylene-bis (6-alphamethyl-benzyl-p-cresol), methylene-crosslinked polyhydric alkylphenols, 4,4'-butylidenebis(3-methyl-6-tert-butylphenol), 1,1-bis(4-hydroxyphenyl)cyclohexane, 2,2'-dihydroxy-3,3'-di(α-methylcyclohexyl)-5,5'-dimethyldiphenylmethane, alkylated bisphenols, hindered bisphenols, 1,3,5-trimethyl-2,4,6-tris(3,5-di-tert-butyl-4-hydroxybenzyl) benzene, tris(2-methyl-4-hydroxy-5-tert-butylphenyl)butane and tetrakis[methylene-3-(3',5'-di-tert-butyl-4'-hydroxyphenyl)propionato]methane.

As specific preferred examples of the antioxidants that can be used in the present invention, there can be mentioned 2,6-di-t-butyl-4-methylphenol, 4-hydroxymethyl-2,6-di-t-butylphenol, 2,2'-methylenebis(4-methyl-6-t-butylphenol), butylhydroxyanisole, t-butylhydroquinone, 2,4,5-trihydroxybutyrophenone, nordihydroguaiaretic acid, propyl gallate, octyl gallate, lauryl gallate, isopropyl citrate and the like. Of these, 2,6-di-t-butyl-4-methylphenol, 4-hydroxymethyl-2,6-di-t-butylphenol, butylhydroxyanisole and t-butylhydroquinone are preferred, and 2,6-di-t-butyl-4-methylphenol and 4-hydroxymethyl-2,6-di-t-butylphenol are more preferred.

These antioxidants may be used alone or in combination.

When the composition of the present invention comprises an antioxidant, the content of antioxidant in the composition of the present invention, based on the total solid mass, is preferably 1 ppm or more, more preferably 5 ppm or more, still more preferably 10 ppm or more, further more preferably 50 ppm or more and further preferably 100 ppm or more. The content of 100 to 1000 ppm is optimally preferred. Multiple antioxidants may be used as a mixture.

[Solvent]

The composition of the present invention may further contain a solvent. As the solvent, use can be made of an organic solvent. As the solvent, there can be mentioned, for example, an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

As preferred alkylene glycol monoalkyl ether carboxylates, there can be mentioned, for example, propylene glycol monomethyl ether acetate (PGMEA; also known as 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether (PGME; also known as 1-methoxy-2-propanol), propylene glycol monoethyl ether, propylene glycol monopropyl ether, propylene glycol monobutyl ether, ethylene glycol monomethyl ether and ethylene glycol monoethyl ether.

As alkyl lactates, there can be mentioned, for example, methyl lactate, ethyl lactate, propyl lactate and butyl lactate.

As alkyl alkoxypropionates, there can be mentioned, for example, ethyl 3-ethoxypropionate, methyl 3-methoxypropionate, methyl 3-ethoxypropionate and ethyl 3-methoxypropionate.

As cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As optionally cyclized monoketone compounds, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As alkylene carbonates, there can be mentioned, for example, propylene carbonate, vinylene carbonate, ethylene carbonate and butylene carbonate.

As alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As alkyl pyruvates, there can be mentioned, for example, methyl pyruvate, ethyl pyruvate and propyl pyruvate.

As a preferably employable solvent, there can be mentioned a solvent having a boiling point of 130° C. or above measured at ordinary temperature under ordinary pressure. For example, there can be mentioned cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, acetic acid 2-ethoxyethyl ester, acetic acid 2-(2-ethoxyethoxy)ethyl ester or propylene carbonate.

In the present invention, these solvents may be used either individually or in combination. When the solvent is used in combination, the mixed solvent preferably contains a solvent having a hydroxyl group and a solvent having no hydroxyl group.

As the hydroxylated solvent, there can be mentioned, for example, ethylene glycol, ethylene glycol monomethyl ether, ethylene glycol monoethyl ether, propylene glycol, PGME, propylene glycol monoethyl ether, ethyl lactate or the like. Of these, PGME and ethyl lactate are especially preferred.

As the nonhydroxylated solvent, there can be mentioned, for example, PGMEA, ethyl ethoxypropionate, 2-heptanone, γ-butyrolactone, cyclohexanone, butyl acetate, N-methylpyrrolidone, N,N-dimethylacetamide, dimethyl sulfoxide or the like. Of these, propylene glycol monomethyl ether acetate, ethyl ethoxypropionate, 2-heptanone, γ-butyrolactone, cyclohexanone and butyl acetate are especially preferred. PGMEA, ethyl ethoxypropionate and 2-heptanone are most preferred.

The mixing ratio (mass) of a solvent having a hydroxyl group and a solvent having no hydroxyl group is preferably in the range of 1/99 to 99/1, more preferably 10/90 to 90/10 and still more preferably 20/80 to 60/40.

The mixed solvent containing 50 mass % or more of a solvent having no hydroxyl group is especially preferred from the viewpoint of uniform applicability. Preferably, PGMEA and other types of solvents may be used in combination as a mixed solvent.

The content of solvent in the composition of the present invention can be appropriately regulated in accordance with the desired thickness of the film, etc. The solvent is used so that the total solid content of the composition falls within the range of generally 0.5 to 30 mass %, preferably 1.0 to 20 mass % and more preferably 1.5 to 10 mass %.

<Method of Forming Pattern>

The present invention also relates to an actinic-ray- or radiation-sensitive film formed from the foregoing composition of the present invention. Further, the method of forming a pattern according to the present invention comprises exposing this actinic-ray- or radiation-sensitive film to light and developing the exposed film.

The composition of the present invention is typically used in the following manner. Namely, the composition of the present invention is typically applied onto a support, such as a substrate, thereby forming a film. The thickness of the film is preferably in the range of 0.02 to 0.1 μm. The method of application onto a substrate is preferably a spin coating. The spin coating is performed at a rotating speed of preferably 1000 to 3000 rpm.

For example, the composition is applied onto, for example, any of substrates (e.g., silicon/silicon dioxide coating, silicon nitride and chromium-vapor-deposited quartz substrate, etc.) for use in, for example, the production of precision integrated circuit devices, imprint molds, etc. by appropriate application means, such as a spinner or a coater. The thus applied composition is dried, thereby obtaining an actinic-ray- or radiation-sensitive film (hereinafter also referred to as a resist film). The application of the composition can be preceded by the application of a heretofore known antireflection film.

The resultant actinic-ray- or radiation-sensitive film is exposed to actinic rays or radiation, preferably baked (generally 80 to 150° C., preferably 90 to 130° C.), and developed. Thus, a favorable pattern can be obtained. More favorable patterns can be formed by performing the baking.

As the actinic rays or radiation, there can be mentioned, for example, infrared light, visible light, ultraviolet light, far-ultraviolet light, X-rays or electron beams. It is preferred for the actinic rays or radiation to have, for example, a wavelength of 250 nm or shorter, especially 220 nm or shorter. As such actinic rays or radiation, there can be mentioned, for example, a KrF excimer laser (248 nm), an ArF excimer laser (193 nm), an $F_2$ excimer laser (157 nm), X-rays and electron beams. As preferred actinic rays or radiation, there can be mentioned, for example, a KrF excimer laser, electron beams, X-rays and EUV light. Electron beams, X-rays and EUV light are more preferred.

Namely, the present invention relates also to the actinic-ray- or radiation-sensitive resin composition for KrF excimer laser, electron beams, X-rays and EUV light (preferably electron beams, X-rays and EUV light).

In the development step, an alkali developer is generally used.

As the alkali developer, use can be made of any of alkaline aqueous solutions containing, for example, an inorganic alkali compound such as sodium hydroxide, potassium hydroxide, sodium carbonate, sodium silicate, sodium metasilicate or aqueous ammonia; a primary amine such as ethylamine or n-propylamine; a secondary amine such as diethylamine or di-n-butylamine; a tertiary amine such as triethylamine or methyldiethylamine; an alcoholamine such as dimethylethanolamine or triethanolamine; a quaternary ammonium salt such as tetramethylammonium hydroxide or tetraethylammonium hydroxide; or a cycloamine such as pyrrole or piperidine.

Appropriate amounts of an alcohol and/or a surfactant may be added to the alkali developer.

The concentration of alkali developer is generally in the range of 0.1 to 20 mass %. The pH value of the alkali developer is generally in the range of 10.0 to 15.0.

The composition of the present invention can also find application in the process in which after coating, film formation and exposure to light, development is performed with the use of a developer comprised mainly of an organic solvent to thereby obtain a negative pattern. As the process, use can be made of, for example, one described in JP-A-2010-217884.

As an organic developer, use can be made of a polar solvent, such as an ester solvent (butyl acetate, ethyl acetate, etc.), a ketone solvent (2-heptanone, cyclohexanone, etc.), an alcohol solvent, an amide solvent or an ether solvent, or a hydrocarbon solvent. The content of water in the whole organic developer is preferably less than 10 mass %, and containing substantially no water is more preferred.

With respect to the particulars of the process for fabricating an imprint mold using the composition according to the present invention, reference can be made to, for example, Japanese Patent No. 4109085, JP-A-2008-162101, "Fundamentals of nanoimprint and its technology development/application deployment-technology of nanoimprint substrate and its latest technology deployment" edited by Yoshihiko Hirai, published by Frontier Publishing, etc.

EXAMPLE

Embodiments of the present invention will be described in greater detail below by way of its examples. However, the gist of the present invention is in no way limited to these examples.

Synthetic Example 1

Resin (Aa-9)

The resin (Aa-9) mentioned above was synthesized in accordance with the following scheme.

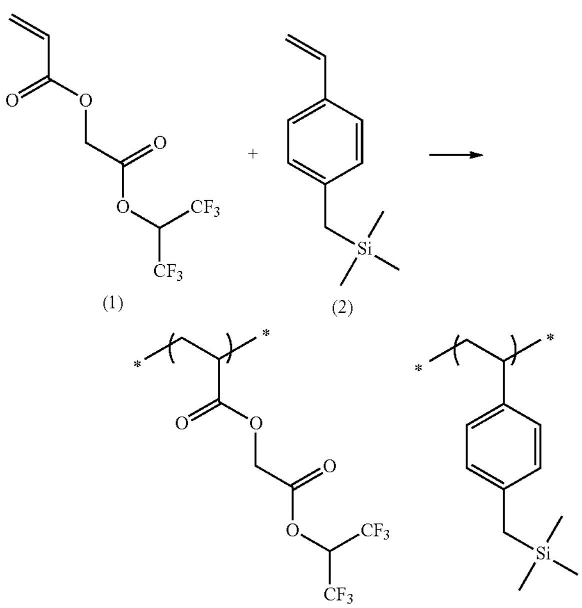

(1) (2)

(Aa-9)

First, 13.45 g of compound (1), 0.38 g of compound (2) and 1.15 g of polymerization initiator V-601 (produced by Wako Pure Chemical Industries, Ltd.) were dissolved in 16.59 g of cyclohexanone. Thereafter, 4.15 g of cyclohexanone was placed in a reaction vessel, and the solution was dropped into the system at 85° C. in a nitrogen gas atmosphere over a period of 4 hours. The resultant reaction solution was heated under agitation for 2 hours and was allowed to stand still to cool to room temperature.

The obtained reaction solution was diluted by adding acetone until the whole amount thereof became 69 g. The diluted solution was dropped into 700 g of heptane, thereby precipitating a polymer. The supernatant liquid was removed, and 300 g of propylene glycol monomethyl ether acetate (PGMEA) was added, thereby homogeneously dissolving the polymer. PGMEA was distilled off in vacuum until the solid content became 25 mass %. Thus, 39.38 g of resin (Aa-9) was obtained.

With respect to the obtained resin (Aa-9), the weight average molecular weight (Mw) and the polydispersity index (Mw/Mn) were determined by means of GPC (HLC-8120 manufactured by Tosoh Corporation, Tsk gel Multipore HXL-M). The results together with the component ratios are given in Table 1. In the GPC measurement, THF was used as a solvent.

[Other Resin (Aa)]

Each of the resins indicated in Table 1 among the above-mentioned resins (Aa-1) to (Aa-70) was synthesized in the same manner as described in Synthetic Example 1. Further, for comparative purposes, the below shown resins (Aa'-1), (Aa'-2) and (Aa'-3) were synthesized. With respect to these resins, the weight average molecular weights and the polydispersity indexes (Mw/Mn) were measured in the same manner as described in Synthetic Example 1. The results together with the component ratios are given in Table 1.

(Aa'-1)

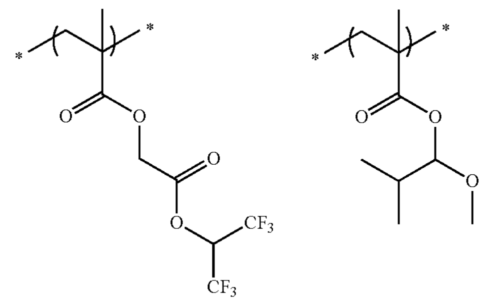

(Aa'-2)

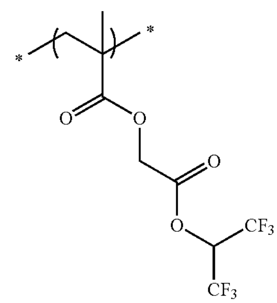

(Aa'-3)

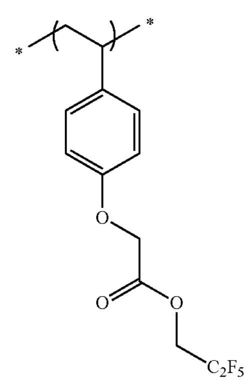

TABLE 1

| | Weight average molecular weight | Composition ratio | | | | Mw/Mn |
|---|---|---|---|---|---|---|
| Aa-3 | 5000 | 95 | 5 | — | — | 1.55 |
| Aa-5 | 10000 | 90 | 10 | — | — | 1.53 |
| Aa-7 | 6000 | 95 | 5 | — | — | 1.53 |
| Aa-9 | 16000 | 96 | 4 | — | — | 1.47 |
| Aa-10 | 3000 | 93 | 7 | — | — | 1.49 |
| Aa-12 | 10000 | 90 | 10 | — | — | 1.52 |
| Aa-13 | 15000 | 82 | 18 | — | — | 1.60 |
| Aa-15 | 3000 | 90 | 5 | 5 | — | 1.58 |

TABLE 1-continued

| | Weight average molecular weight | Composition ratio | | | | Mw/Mn |
|---|---|---|---|---|---|---|
| Aa-16 | 12000 | 92 | 8 | — | — | 1.50 |
| Aa-20 | 19000 | 85 | 15 | — | — | 1.58 |
| Aa-22 | 9000 | 90 | 10 | — | — | 1.53 |
| Aa-24 | 15000 | 96 | 4 | — | — | 1.46 |
| Aa-25 | 4000 | 93 | 7 | — | — | 1.50 |
| Aa-26 | 20000 | 85 | 15 | — | — | 1.57 |
| Aa-28 | 15000 | 82 | 18 | — | — | 1.61 |
| Aa-29 | 11000 | 92 | 8 | — | — | 1.48 |
| Aa-32 | 8000 | 97 | 3 | — | — | 1.52 |
| Aa-35 | 9000 | 97 | 3 | — | — | 1.54 |
| Aa-37 | 12000 | 90 | 8 | 2 | — | 1.55 |
| Aa-38 | 25000 | 45 | 45 | 8 | — | 1.60 |
| Aa-39 | 16000 | 82 | 18 | — | — | 1.62 |
| Aa-40 | 23000 | 96 | 2 | 2 | — | 1.63 |
| Aa-41 | 15000 | 96 | 4 | — | — | 1.48 |
| Aa-42 | 5000 | 95 | 5 | — | — | 1.58 |
| Aa-44 | 22000 | 50 | 50 | — | — | 1.70 |
| Aa-46 | 28000 | 50 | 50 | — | — | 1.75 |
| Aa-47 | 19000 | 50 | 50 | — | — | 1.81 |
| Aa-50 | 12000 | 85 | 5 | 10 | — | 1.56 |
| Aa-51 | 5000 | 70 | 5 | 25 | — | 1.48 |
| Aa-52 | 13000 | 70 | 10 | 20 | — | 1.45 |
| Aa-53 | 10000 | 73 | 7 | 20 | — | 1.44 |
| Aa-54 | 9000 | 67 | 8 | 25 | — | 1.51 |
| Aa-60 | 12000 | 91 | 4 | 5 | — | 1.57 |
| Aa-62 | 5000 | 80 | 5 | 15 | — | 1.62 |
| Aa-63 | 15000 | 84 | 6 | 10 | — | 1.50 |
| Aa-65 | 8000 | 87 | 3 | 10 | — | 1.51 |
| Aa-66 | 8000 | 87 | 3 | 10 | — | 1.52 |
| Aa-67 | 5000 | 15 | 65 | 7 | 13 | 1.57 |
| Aa-68 | 7000 | 12 | 35 | 3 | 50 | 1.60 |
| Aa-69 | 15000 | 20 | 45 | 5 | 30 | 1.48 |
| Aa-70 | 12000 | 30 | 50 | 5 | 15 | 1.55 |
| Aa'-1 | 9000 | 97 | 3 | — | — | 1.54 |
| Aa'-2 | 8000 | 100 | — | — | — | 1.55 |
| Aa'-3 | 10000 | 100 | — | — | — | 1.51 |

Synthetic Example 2

Resin (Ab-14)

The synthesis was performed in the same manner as described for the synthesis of polymer (B-2) in Section 0153 of JP-A-2007-052193.

Synthetic Example 3

Resin (Ab-97)

The synthesis was performed in the same manner as described for the synthesis of polymer (A-1) in Section 0357 of JP-A-2009-86358.

Synthetic Example 4

Resin (Ab-245)

Resin (Ab-245) was synthesized in accordance with the following scheme.

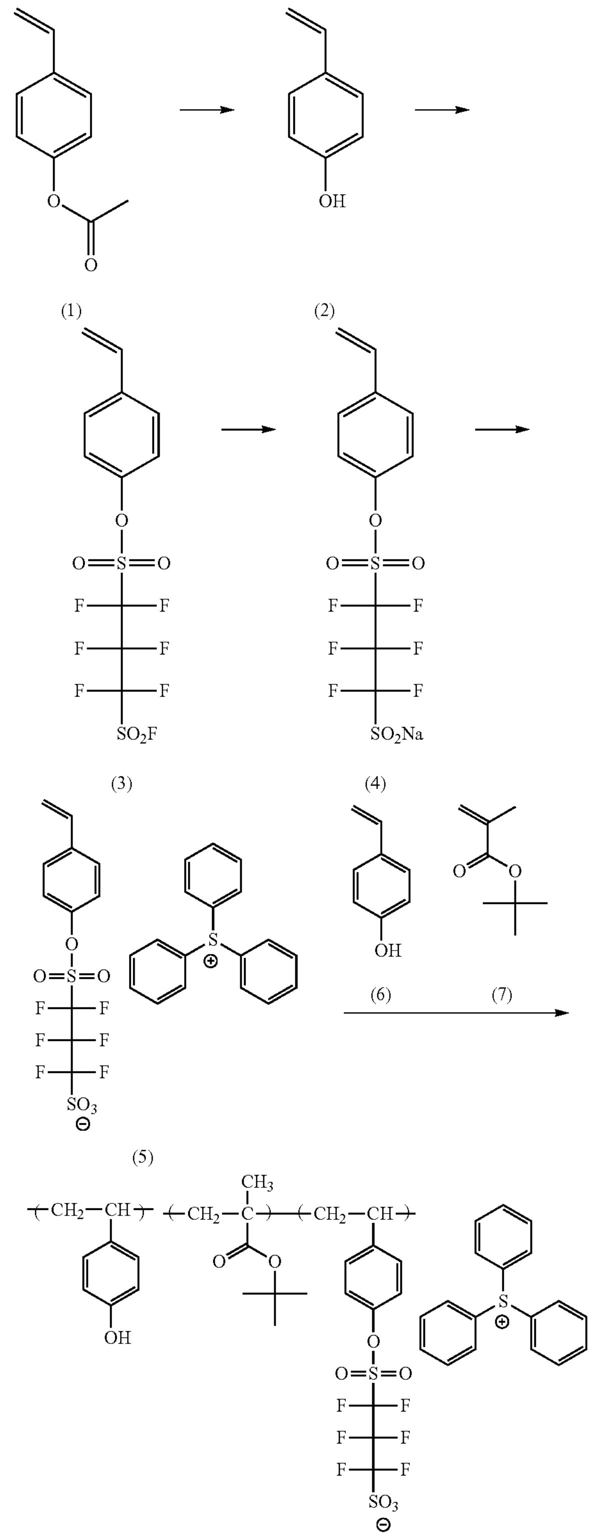

Ab-245

<Synthesis of Compound (5)>

First, 100.00 g of compound (1) was dissolved in 400 g of ethyl acetate, and the obtained solution was cooled to 0° C. Subsequently, 47.60 g of sodium methoxide (28 mass % methanol solution) was dropped into the cooled solution over a period of 30 minutes, and agitated at room temperature for five hours. Ethyl acetate was added to the reaction solution, and the resultant organic phase was washed with distilled water thrice. The washed organic phase was dried over anhydrous sodium sulfate, and the solvent was distilled off. Thus, 131.70 g of compound (2) (54 mass % ethyl acetate solution) was obtained.

Ethyl acetate amounting to 56.00 g was added to 18.52 g of compound (2) (54 mass % ethyl acetate solution). Subsequently, 31.58 g of 1,1,2,2,3,3-hexafluoropropane-1,3-disulfonyl difluoride was added to the mixture and cooled to 0° C. A solution obtained by dissolving 12.63 g of triethylamine in 25.00 g of ethyl acetate was dropped into the mixture over a period of 30 minutes, and agitated while maintaining the liquid temperature at 0° C. for four hours. Ethyl acetate was added, and the resultant organic phase was washed with saturated saline thrice. The washed organic phase was dried over anhydrous sodium sulfate, and the solvent was distilled off. Thus, 32.90 g of compound (3) was obtained.

Thereafter, 35.00 g of compound (3) was dissolved in 315 g of methanol and cooled to 0° C., and 245 g of 1N aqueous sodium hydroxide solution was added to the cooled solution. The mixture was agitated at room temperature for two hours, and the solvent was distilled off. Ethyl acetate was added, and the resultant organic phase was washed with saturated saline thrice. The washed organic phase was dried over anhydrous sodium sulfate, and the solvent was distilled off, thereby obtaining 34.46 g of compound (4).

Finally, 28.25 g of obtained compound (4) was dissolved in 254.25 g of methanol, and 23.34 g of triphenylsulfonium bromide was added to the solution. The mixture was agitated at room temperature for three hours. The solvent was distilled off, and distilled water was added to the residue and extracted with chloroform three times. The thus obtained organic phase was washed with distilled water three times. The solvent was distilled off, thereby obtaining 42.07 g of compound (5).

<Synthesis of Resin (Ab-245)>

First, 8.15 g of compound (6) (53.1 mass % propylene glycol monomethyl ether solution), 6.14 g of compound (7), 7.31 g of compound (5) and 2.07 g of polymerization initiator V-601 (produced by Wako Pure Chemical Industries, Ltd.) were dissolved in 30.13 g of propylene glycol monomethyl ether (PGME). Subsequently, 7.53 g of PGME was placed in a reaction vessel, and in a nitrogen gas atmosphere the solution was dropped into the system at 85° C. over a period of 2 hours. The thus obtained reaction solution was heated under agitation for 4 hours, and allowed to stand still to cool to room temperature.

The obtained reaction solution was diluted by adding 40 g of acetone. The diluted solution was dropped into 1000 g of 8/2 hexane/ethyl acetate mixture, thereby precipitating a polymer. The polymer was collected by filtration, and the obtained solid was washed by dashing 250 g of 8/2 hexane/ethyl acetate mixture thereover. The resultant solid was dissolved in 70 g of acetone, and dropped into 700 g of 1/9 methanol/distilled water mixture, thereby precipitating a polymer. The polymer was collected by filtration, and the obtained solid was washed by dashing 150 g of 1/9 methanol/distilled water mixture thereover. The resultant washed solid was dried in vacuum, thereby obtaining 13.87 g of resin (Ab-245).

[Other Resin (Ab)]

Each of the resins indicated in Table 2 among the above-mentioned resins (Ab-1) to (Ab-283) was synthesized in the same manner as described in Synthetic Examples 2 to 4. With respect to these resins, the weight average molecular weights and the polydispersity indexes were determined in the same manner as described in Synthetic Example 1. The results together with the component ratios are given in Table 2.

TABLE 2

| | Weight average molecular weight | Composition ratio | | | | | Mw/Mn |
|---|---|---|---|---|---|---|---|
| Ab-14 | 3000 | 70 | 30 | — | — | — | 1.10 |
| Ab-17 | 12000 | 10 | 65 | 25 | — | — | 1.12 |
| Ab-21 | 8000 | 50 | 50 | — | — | — | 1.59 |
| Ab-37 | 8500 | 50 | 50 | — | — | — | 1.60 |
| Ab-41 | 15000 | 70 | 30 | — | — | — | 1.58 |
| Ab-73 | 14000 | 70 | 30 | — | — | — | 1.59 |
| Ab-96 | 28000 | 60 | 30 | 10 | — | — | 1.55 |
| Ab-97 | 18000 | 50 | 40 | 10 | — | — | 1.61 |
| Ab-120 | 7000 | 60 | 40 | — | — | — | 1.45 |
| Ab-143 | 8500 | 40 | 15 | 20 | 25 | — | 1.69 |
| Ab-173 | 4000 | 60 | 40 | — | — | — | 1.15 |
| Ab-167 | 3500 | 55 | 45 | — | — | — | 1.12 |
| Ab-178 | 24000 | 50 | 35 | 15 | — | — | 1.65 |
| Ab-232 | 10000 | 45 | 10 | 35 | 10 | — | 1.55 |
| Ab-233 | 11000 | 10 | 35 | 10 | 35 | 10 | 1.53 |
| Ab-234 | 10000 | 10 | 35 | 10 | 35 | 10 | 1.56 |
| Ab-238 | 5000 | 45 | 25 | 5 | 25 | — | 1.73 |
| Ab-240 | 20000 | 55 | 40 | 5 | — | — | 1.50 |
| Ab-245 | 9000 | 40 | 48 | 12 | — | — | 1.38 |
| Ab-253 | 15000 | 40 | 20 | 20 | 20 | — | 1.80 |
| Ab-270 | 10000 | 65 | 35 | — | — | — | 1.13 |
| Ab-273 | 17000 | 70 | 30 | — | — | — | 1.15 |
| Ab-274 | 10000 | 60 | 30 | 10 | — | — | 1.11 |
| Ab-275 | 5000 | 60 | 40 | — | — | — | 1.16 |
| Ab-276 | 6000 | 70 | 30 | — | — | — | 1.14 |
| Ab-277 | 7000 | 75 | 25 | — | — | — | 1.16 |
| Ab-280 | 5000 | 60 | 35 | 5 | — | — | 1.18 |
| Ab-281 | 12000 | 30 | 10 | 60 | — | — | 1.55 |
| Ab-282 | 15000 | 45 | 55 | — | — | — | 1.58 |

<Photoacid Generator>

As photoacid generators, use was made of the compounds indicated in Tables 3 and 4 among the above-mentioned compounds (B-1) to (B-183) and (Y-1) to (Y-75).

<Basic Compound>

As a basic compound, use was made of any of the following compounds N-1 to N-10. Among these, compound N-7 corresponds to the above-mentioned compound (PA).

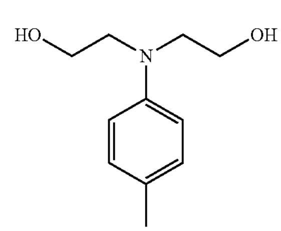

N-1

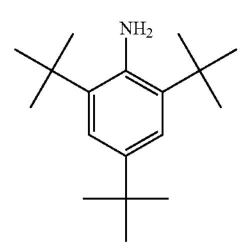

N-2

-continued

N-3

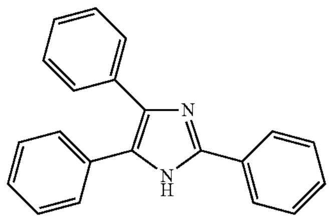

N-4

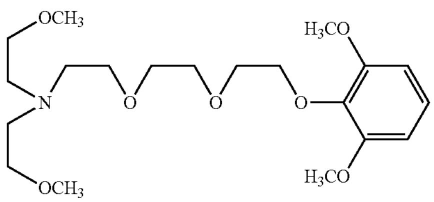

N-5

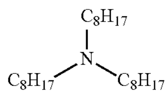

N-6

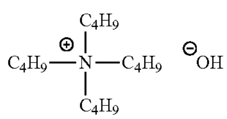

N-7

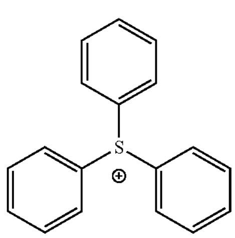

N-8

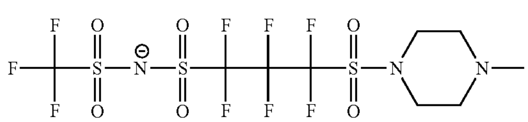

N-9

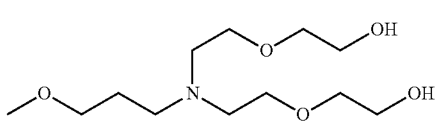

-continued

N-10

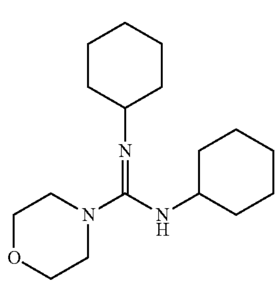

Synthetic Example 5

Compound N-7

Compound N-7 was synthesized in the manner as described in Section [0354] of JP-A-2006-330098.

<Surfactant>

Use was made of any of the following surfactants W-1 to W-4.

W-1: Megafac R08 (produced by Dainippon Ink & Chemicals, Inc.; fluorinated and siliconized), W-2: polysiloxane polymer KP-341 (produced by Shin-Etsu Chemical Co., Ltd.; siliconized), W-3: Troy Sol S-366 (produced by Troy Chemical Co., Ltd.; fluorinated), and W-4: PF6320 (produced by OMNOVA SOLUTIONS, INC.; fluorinated).

<Solvent>

Use was made of appropriate mixtures of the following solvents S-1 to S-4.

S-1: PGMEA (b.p.=146° C.),

S-2: PGME (b.p.=120° C.),

S-3: methyl lactate (b.p.=145° C.), and

S-4: cyclohexanone (b.p.=157° C.).

<Evaluation of Resist (EB): Exposed to EB or KrF>

Components of Table 3 below were dissolved in solvents of the same table, thereby obtaining solutions of 3.0 mass % solid content. The solutions were each passed through a polytetrafluoroethylene filter of 0.1 μm pore size, thereby obtaining positive resist solutions.

The numeric value "mass %" appearing in Table 3 is based on the total solids excluding surfactants of the composition. The content of surfactant was set at 0.01 mass % based on the total solids excluding surfactants of the composition.

Each of the above positive resist solutions was applied onto a silicon substrate having undergone a hexamethyldisilazane treatment by means of a spin coater, and dried by heating on a hot plate at 110° C. for 90 seconds. Thus, resist films of 100 nm average thickness were obtained.

[Sensitivity, Pattern Shape, Roughness Characteristic, and Dry Etching Resistance: Exposed to EB]

Each of the resist films was irradiated with electron beams by means of an electron beam lithography system (HL750 manufactured by Hitachi, Ltd., acceleration voltage 50 KeV). Immediately after the irradiation, the film was baked on a hot plate at 130° C. for 90 seconds. The baked film was developed with a 2.38 mass % aqueous tetramethylammonium hydroxide solution at 23° C. for 60 seconds. After the development, the film was rinsed with pure water for 30 seconds, and dried. Thus, a line and space pattern (line:space=1:1) was formed.

(Sensitivity)

The shape of cross section of the obtained line and space pattern was observed by means of a scanning electron microscope (model S-4800 manufactured by Hitachi, Ltd.). The minimum irradiation energy in which a line of 100 nm width was resolved was determined, and the value thereof was denoted as "sensitivity (μC/cm$^2$)." Evaluation results are given in Table 3.

(Pattern Shape)

With respect to the 100 nm line pattern (line:space=1:1) in the irradiation amount exhibiting the above sensitivity, the shape of cross section thereof was observed by means of a scanning electron microscope (model S-4800 manufactured by Hitachi, Ltd.). The observed shape was evaluated in two grades, "rectangle" and "taper." Evaluation results are given in Table 3.

(Roughness Characteristic; Line Edge Roughness (LER))

The above 100 nm line pattern (line:space=1:1) was observed by means of a scanning electron microscope (model S-9260, manufactured by Hitachi, Ltd.). The distance between actual edge and a reference line on which edges were to be present was measured at 30 points of equal intervals within 50 μm in the longitudinal direction of the pattern. The standard deviation of measured distances was determined, and 36 was computed therefrom. This 36 was denoted as "LER (nm)." Evaluation results are given in Table 3.

(Etching Resistance)

A 200 nm thick positive resist film was formed on a wafer. Plasma etching thereof was carried out using a mixed gas comprised of $C_4F_6$ (20 ml/min) and $O_2$ (40 ml/min) at 23° C. for 30 seconds. Thereafter, the amount of remaining film was determined, and the etching rate was calculated therefrom. The etching resistance was evaluated on the following judgment criteria. Evaluation results are given in Table 3.

(Judgment Criteria)

A(good): when the etching rate was less than 1.5 nm/sec, and

B (insufficient): when the etching rate was 1.5 nm/sec or greater.

[Development Defect: Exposed to KrF]

Each of the above prepared positive resist solutions was uniformly applied onto a substrate coated with a 60 nm anti-reflection film (DUV44 produced by Brewer Science Inc.) by the use of a spin coater Mark 8, manufactured by Tokyo Electron Limited, and dried by baking at 130° C. for 60 seconds, thereby forming a positive resist film of 60 nm average thickness. Using a KrF excimer laser scanner (PAS5500/850C wavelength 248 nm, manufactured by ASML), the resist film was subjected to a checkered-flag exposure comprising alternate exposure for open-frame exposed portions and unexposed portions each with an area of 15 mm square on the entire surface of the wafer (exposure conditions: NA=0.80 σ=0.89, 20 mJ). The exposed resist film was baked at 110° C. for 60 seconds, immersed in a 2.38 mass % aqueous tetramethylammonium hydroxide (TMAH) solution for 60 seconds, rinsed with water for 30 seconds and dried. The thus obtained patterns were evaluated by the following methods.

Sensitivity $E_0$ at which the thickness of the resist film became zero was measured.

At the above effective sensitivity $E_0$, a mask size 0.15 μm pattern exposure was carried out at 78 points within the wafer surface. On the thus obtained patterned wafer, the number of development defects was measured by the use of KLA-2360 manufactured by KLA-Tencor Corporation. In the measurement, the inspected area was a total of 205 cm$^2$, the pixel size 0.25 μm and the threshold 30, and visible light was used as the inspection light. Evaluation was made by the number of defects (count/cm$^2$), namely, the quotient of the obtained count divided by the inspected area. The evaluation marks A, B, C and D were given when the calculated value was less than 1.0, 1.0 to less than 5.0, 5.0 to less than 10.0 and 10.0 or greater, respectively. The smaller the value, the more favorable the performance exhibited. Evaluation results are given in Table 3.

TABLE 3

| | Resist composition | | | | | | Evaluation result | | | | |
|---|---|---|---|---|---|---|---|---|---|---|---|
| | Resin (Aa) (5 mass %) | Resin (Ab) (58 mass %) | Solvent (mass ratio) | Photoacid generator (35 mass %) | Basic compound (2 mass %) | Surfactant (0.01 mass %) | Sensitivity (μC/cm$^2$) | Pattern shape | LER (nm) | Dry etching resistance | Development defect |
| Ex. 1 | Aa-3 | Ab-17 | S-4/S-3 (80/20) | B-110 | N-7 | W-3 | 24 | Rectangle | 6.1 | A | C |
| Ex. 2 | Aa-7 | Ab-17 | S-4/S-3 (80/20) | B-110 | N-7 | W-3 | 11 | Rectangle | 4.4 | A | A |
| *[4]Ex. 3 | Aa-29 | Ab-178 | S-2 | B-122 | N-6 | W-3 | 20 | Rectangle | 5.7 | A | B |
| *[4]Ex. 4 | Aa-16 | Ab-178 | S-2 | B-122 | N-6 | W-3 | 15 | Rectangle | 4.9 | A | B |
| *[5]Ex. 5 | Aa-25 | Ab-240 | S-2/S-3 (80/20) | — | N-2 | W-4 | 17 | Rectangle | 5.0 | A | B |
| *[5]Ex. 6 | Aa-10 | Ab-240 | S-2/S-3 (80/20) | — | N-2 | W-4 | 13 | Rectangle | 4.5 | A | A |
| Ex. 7 | Aa-24 | Ab-173 | S-1/S-2 (70/30) | B-123 | N-1 | W-4 | 21 | Rectangle | 5.6 | A | B |
| Ex. 8 | Aa-41 | Ab-173 | S-1/S-2 (70/30) | B-123 | N-1 | W-4 | 16 | Rectangle | 5.0 | A | B |
| Ex. 9 | Aa-9 | Ab-173 | S-1/S-2 (70/30) | B-123 | N-1 | W-4 | 12 | Rectangle | 4.3 | A | A |
| Ex. 10 | Aa-35 | Ab-120 | S-1/S-3 (70/30) | Y-5 | N-8 | W-3 | 15 | Rectangle | 5.1 | A | B |
| Ex. 11 | Aa-32 | Ab-120 | S-1/S-3 (70/30) | Y-5 | N-8 | W-3 | 11 | Rectangle | 4.4 | A | A |
| Ex. 12 | Aa-37 | Ab-14 | S-1/S-2 (80/20) | B-119 | N-10 | W-4 | 12 | Rectangle | 4.3 | A | A |
| *[1]Ex. 13 | Aa-37 | Ab-14 | S-1/S-2 (80/20) | B-119 | N-10 | W-4 | 16 | Rectangle | 4.9 | A | B |
| *[2]Ex. 14 | Aa-37 | Ab-14 | S-1/S-2 (80/20) | B-119 | N-10 | W-4 | 20 | Rectangle | 5.6 | A | B |

TABLE 3-continued

| | Resist composition | | | | | | Evaluation result | | | | |
|---|---|---|---|---|---|---|---|---|---|---|---|
| | Resin (Aa) (5 mass %) | Resin (Ab) (58 mass %) | Solvent (mass ratio) | Photoacid generator (35 mass %) | Basic compound (2 mass %) | Surfactant (0.01 mass %) | Sensitivity ($\mu C/cm^2$) | Pattern shape | LER (nm) | Dry etching resistance | Development defect |
| *[5]Ex. 15 | Aa-40 | Ab-232 | S-2/S-4 (70/30) | — | N-4 | W-2 | 19 | Rectangle | 5.4 | A | B |
| *[5]Ex. 16 | Aa-40 | Ab-233 | S-2/S-4 (70/30) | — | N-4 | W-2 | 14 | Rectangle | 4.8 | A | B |
| *[5]Ex. 17 | Aa-40 | Ab-234 | S-2/S-4 (70/30) | — | N-4 | W-2 | 10 | Rectangle | 4.4 | A | A |
| *[5]Ex. 18 | Aa-5 | Ab-245 | S-2/S-1 (90/10) | — | N-7 | W-1 | 25 | Rectangle | 6.2 | A | C |
| *[5]Ex. 19 | Aa-12 | Ab-245 | S-2/S-1 (90/10) | — | N-7 | W-1 | 22 | Rectangle | 5.8 | A | C |
| *[5]Ex. 20 | Aa-22 | Ab-245 | S-2/S-1 (90/10) | — | N-7 | W-1 | 14 | Rectangle | 5.0 | A | B |
| Ex. 21 | Aa-20 | Ab-143 | S-4/S-1 (90/10) | B-118 | N-9 | W-3 | 30 | Rectangle | 6.8 | A | C |
| Ex. 22 | Aa-26 | Ab-143 | S-4/S-1 (90/10) | B-118 | N-9 | W-3 | 28 | Rectangle | 6.6 | A | C |
| Ex. 23 | Aa-38 | Ab-73 | S-1 | B-131 | N-3 | W-1 | 19 | Rectangle | 5.4 | A | B |
| Ex. 24 | Aa-38 | Ab-41 | S-1 | B-131 | N-3 | W-1 | 13 | Rectangle | 4.5 | A | A |
| Ex. 25 | Aa-15 | Ab-37 | S-3/S-2 (90/10) | Y-70 | N-10 | W-2 | 26 | Rectangle | 6.3 | A | C |
| Ex. 26 | Aa-15 | Ab-21 | S-3/S-2 (90/10) | Y-70 | N-10 | W-2 | 23 | Rectangle | 5.8 | A | C |
| Ex. 27 | Aa-13 | Ab-97 | S-1/S-2 (90/10) | B-149 | N-5 | W-4 | 21 | Rectangle | 5.7 | A | B |
| Ex. 28 | Aa-39 | Ab-97 | S-1/S-2 (90/10) | B-149 | N-5 | W-4 | 18 | Rectangle | 5.3 | A | B |
| Ex. 29 | Aa-28 | Ab-97 | S-1/S-2 (90/10) | B-149 | N-5 | W-4 | 14 | Rectangle | 4.9 | A | B |
| Ex. 30 | Aa-42 | Ab-96 | S-1/S-2 (50/50) | B-45 | N-8 | W-4 | 12 | Rectangle | 4.5 | A | A |
| Ex. 31 | Aa-44 | Ab-167 | S-1/S-4 (80/20) | Y-61 | N-10 | W-3 | 29 | Rectangle | 6.6 | A | C |
| *[5]Ex. 32 | Aa-46 | Ab-253 | S-2/S-4 (90/10) | — | N-7 | W-4 | 27 | Rectangle | 6.5 | A | C |
| *[5]Ex. 33 | Aa-47 | Ab-238 | S-3/S-4 (80/20) | — | N-3 | W-3 | 22 | Rectangle | 5.8 | A | C |
| Ex. 34 | Aa-65 | Ab-120 | S-1/S-3 (70/30) | Y-5 | N-8 | W-3 | 10 | Rectangle | 4.2 | A | A |
| Ex. 35 | Aa-66 | Ab-120 | S-1/S-3 (70/30) | Y-5 | N-8 | W-3 | 10 | Rectangle | 4.0 | A | A |
| *[1]Ex. 36 | Aa-50 | Ab-275 | S1-S-2 (80/20) | B-182 | N-10 | W-3 | 15 | Rectangle | 4.3 | A | A |
| *[1]Ex. 37 | Aa-51 | Ab-276 | S-1/S-2 (70/30) | B-182 | N-9 | W-1 | 13 | Rectangle | 5.1 | A | A |
| Ex. 38 | Aa-52 | Ab-276 | S-1/S-2 (60/40) | B-181 | N-7 | W-2 | 16 | Rectangle | 5.3 | A | A |
| Ex. 39 | Aa-53 | Ab-270 | S-1/S-2 (90/10) | B-121 | N-8 | W-2 | 17 | Rectangle | 5.2 | A | A |
| Ex. 40 | Aa-54 | Ab-273 | S-1/S-2 (70/30) | B-179 | N-4 | W-4 | 12 | Rectangle | 4.9 | A | A |
| Ex. 41 | Aa-60 | Ab-277 | S-1/S-2 (50/50) | B-180 | N-3 | W-2 | 13 | Rectangle | 5.0 | A | A |
| *[1]Ex. 42 | Aa-62 | Ab-275 | S-1/S-2 (80/20) | B-124 | N-5 | W-3 | 14 | Rectangle | 4.5 | A | A |
| *[1]Ex. 43 | Aa-63 | Ab-274 | S-1/S-2 (90/10) | B-183 | N-10 | W-1 | 12 | Rectangle | 4.7 | A | A |
| *[1]Ex. 44 | Aa-67 | Ab-280 | S-1/S-2 (70/30) | B-122 | N-8 | W-1 | 16 | Rectangle | 4.6 | A | A |
| *[1]Ex. 45 | Aa-68 | Ab-275 | S-1/S-2 (80/20) | B-182 | N-10 | W-4 | 17 | Rectangle | 4.3 | A | A |
| *[1]Ex. 46 | Aa-69 | Ab-282 | S-1/S-2 (60/40) | B-119 | N-3 | W-4 | 18 | Rectangle | 4.2 | A | A |
| Ex. 47 | Aa-70 | Ab-281 | S-1/S-2 (80/20) | B-121 | N-10 | W-3 | 14 | Rectangle | 4.4 | A | A |
| *[3]Comp. Ex. 1 | — | Ab-14 | S-1/S-2 (80/20) | B-119 | N-10 | W-4 | 32 | Taper | 7.0 | B | D |
| Comp. Ex. 2 | Aa'-1 | Ab-120 | S-1/S-3 (70/30) | Y-5 | N-8 | W-3 | 34 | Taper | 7.5 | B | D |
| Comp. Ex. 3 | Aa'-2 | Ab-120 | S-1/S-3 (70/30) | Y-5 | N-8 | W-3 | 35 | Taper | 7.8 | B | D |

TABLE 3-continued

| | Resist composition | | | | | | Evaluation result | | | | |
|---|---|---|---|---|---|---|---|---|---|---|---|
| | Resin (Aa) (5 mass %) | Resin (Ab) (58 mass %) | Solvent (mass ratio) | Photoacid generator (35 mass %) | Basic compound (2 mass %) | Surfactant (0.01 mass %) | Sensitivity ($\mu C/cm^2$) | Pattern shape | LER (nm) | Dry etching resistance | Development defect |
| *5Comp. Ex. 4 | Aa'-3 | Ab-245 | S-2/S-1 (90/10) | — | N-7 | W-1 | 33 | Taper | 8.0 | B | D |

*1In the soln. preparation of Examples 13, 36, 37, and 42 to 46, resin (Aa) was used in an amt. of 10 mass % and resin (Ab) in an amt. of 53 mass %.
*2In the soln. preparation of Example 14, resin (Aa) was used in an amt. of 20 mass % and resin (Ab) in an amt. of 43 mass %.
*3In the soln. preparation of Comp. Ex. 1, resin (Ab) was used in an amt. of 63 mass %.
*4In the soln. preparation of Examples 3 and 4, resin (Ab) was used in an amt. of 83 mass % and photoacid generator in an amt. of 10 mass %.
*5In the soln. preparation of Examples 5, 6, 15 to 20, 32 and 33 and Comp. Ex. 4, resin (Ab) was used in an amt. of 93 mass %.

As apparent from Table 3, the compositions of the Examples excelled the compositions of the Comparative Examples in all of the sensitivity, pattern shape, LER, dry etching resistance and development defects.

<Evaluation of Resist: Exposed to EUV>

Components of Table 4 below were dissolved in solvents of the same table, thereby obtaining solutions of 1.5 mass % solid content. The solutions were each passed through a polytetrafluoroethylene filter of 0.1 μm pore size, thereby obtaining positive resist solutions.

The numeric value "mass %" appearing in Table 4 is based on the total solids excluding surfactants of the composition. The content of surfactant was set at 0.01 mass % based on the total solids excluding surfactants of the composition.

Each of the above positive resist solutions was applied onto a silicon substrate having undergone a hexamethyldisilazane treatment by means of a spin coater, and dried by heating on a hot plate at 120° C. for 90 seconds. Thus, resist films of 50 nm average thickness were obtained.

[Sensitivity, Pattern Shape and Roughness Characteristic]

Each of the resist films was exposed to EUV light by means of an EUV exposure apparatus. Immediately after the exposure, the film was baked on a hot plate at 130° C. for 90 seconds. The baked film was developed with a 2.38 mass % aqueous tetramethylammonium hydroxide solution at 23° C. for 60 seconds. After the development, the film was rinsed with pure water for 30 seconds and dried. Thus, a line and space pattern (line:space=1:1) was formed.

(Sensitivity)

The shape of cross section of the obtained line and space pattern was observed by means of a scanning electron microscope (model S-4800 manufactured by Hitachi, Ltd.). The minimum exposure energy in which a line of 50 nm width was resolved was determined, and the value thereof was denoted as "sensitivity ($mJ/cm^2$)."

(Pattern Shape)

With respect to the 100 nm line pattern (line:space=1:1) in the exposure amount exhibiting the above sensitivity, the shape of cross section thereof was observed by means of a scanning electron microscope (model S-4800 manufactured by Hitachi, Ltd.). The observed shape was evaluated in two grades, "rectangle" and "taper."

(Roughness Characteristic; Line Edge Roughness (LER))

The above 100 nm line pattern (line:space=1:1) was observed by means of a scanning electron microscope (model S-9260, manufactured by Hitachi, Ltd.). The distance between actual edge and a reference line on which edges were to be present was measured at 30 points of equal intervals within 50 μm in the longitudinal direction of the pattern. The standard deviation of measured distances was determined, and 36 was computed therefrom. This 3σ was denoted as "LER (nm)."

Evaluation results are given in Table 4 below.

TABLE 4

| | Resist composition | | | | | | Evaluation result | | |
|---|---|---|---|---|---|---|---|---|---|
| | Resin (Aa) (5 mass %) | Resin (Ab) (58 mass %) | Solvent (mass ratio) | Photoacid generator (35 mass %) | Basic compound (2 mass %) | Surfactant (0.01 mass %) | Sensitivity $(mJ/cm)^2$ | Pattern shape | LER (nm) |
| Ex. 48 | Aa-3 | Ab-17 | S-4/S-3 (80/20) | B-110 | N-7 | W-3 | 20 | Rectangle | 4.8 |
| Ex. 49 | Aa-7 | Ab-17 | S-4/S-3 (80/20) | B-110 | N-7 | W-3 | 12 | Rectangle | 3.7 |
| *4Ex. 50 | Aa-29 | Ab-178 | S-2 | B-122 | N-6 | W-3 | 17 | Rectangle | 4.4 |
| *4Ex. 51 | Aa-16 | Ab-178 | S-2 | B-122 | N-6 | W-3 | 13 | Rectangle | 3.9 |
| *5Ex. 52 | Aa-25 | Ab-240 | S-2/S-3 (80/20) | — | N-2 | W-4 | 15 | Rectangle | 4.2 |
| *5Ex. 53 | Aa-10 | Ab-240 | S-2/S-3 (80/20) | — | N-2 | W-4 | 11 | Rectangle | 3. 7 |
| Ex. 54 | Aa-24 | Ab-173 | S-1/S-2 (70/30) | B-123 | N-1 | W-4 | 16 | Rectangle | 4.3 |
| Ex. 55 | Aa-41 | Ab-173 | S-1/S-2 (70/30) | B-123 | N-1 | W-4 | 14 | Rectangle | 4.0 |
| Ex. 56 | Aa-9 | Ab-173 | S-1/S-2 (70/30) | B-123 | N-1 | W-4 | 10 | Rectangle | 3.5 |
| Ex. 57 | Aa-35 | Ab-120 | S-1/S-3 (70/30) | Y-5 | N-8 | W-3 | 15 | Rectangle | 4.1 |

TABLE 4-continued

| | Resist composition | | | | | | Evaluation result | | |
|---|---|---|---|---|---|---|---|---|---|
| | Resin (Aa) (5 mass %) | Resin (Ab) (58 mass %) | Solvent (mass ratio) | Photoacid generator (35 mass %) | Basic compound (2 mass %) | Surfactant (0.01 mass %) | Sensitivity (mJ/cm)$^2$ | Pattern shape | LER (nm) |
| Ex. 58 | Aa-32 | Ab-120 | S-1/S-3 (70/30) | Y-5 | N-8 | W-3 | 11 | Rectangle | 3.6 |
| Ex. 59 | Aa-37 | Ab-14 | S-1/S-2 (80/20) | B-119 | N-10 | W-4 | 11 | Rectangle | 3.5 |
| *[1]Ex. 60 | Aa-37 | Ab-14 | S-1/S-2 (80/20) | B-119 | N-10 | W-4 | 14 | Rectangle | 4.1 |
| *[2]Ex. 61 | Aa-37 | Ab-14 | S-1/S-2 (80/20) | B-119 | N-10 | W-4 | 18 | Rectangle | 4.6 |
| *[5]Ex. 62 | Aa-40 | Ab-232 | S-2/S-4 (70/30) | — | N-4 | W-2 | 17 | Rectangle | 4.5 |
| *[5]Ex. 63 | Aa-40 | Ab-233 | S-2/S-4 (70/30) | — | N-4 | W-2 | 13 | Rectangle | 4. 1 |
| *[5]Ex. 64 | Aa-40 | Ab-234 | S-2/S-4 (70/30) | — | N-4 | W-2 | 10 | Rectangle | 3.5 |
| *[5]Ex. 65 | Aa-5 | Ab-245 | S-2/S-1 (90/10) | — | N-7 | W-1 | 21 | Rectangle | 5.0 |
| *[5]Ex. 66 | Aa-12 | Ab-245 | S-2/S-1 (90/10) | — | N-7 | W-1 | 19 | Rectangle | 4.7 |
| *[5]Ex. 67 | Aa-22 | Ab-245 | S-2/S-1 (90/10) | — | N-7 | W-1 | 13 | Rectangle | 3.9 |
| Ex. 68 | Aa-20 | Ab-143 | S-4/S-1 (90/10) | B-118 | N-9 | W-3 | 26 | Rectangle | 5.7 |
| Ex. 69 | Aa-26 | Ab-143 | S-4/S-1 (90/10) | B-118 | N-9 | W-3 | 24 | Rectangle | 5.5 |
| Ex. 70 | Aa-38 | Ab-73 | S-1 | B-131 | N-3 | W-1 | 17 | Rectangle | 4.5 |
| Ex. 71 | Aa-38 | Ab-41 | S-1 | B-131 | N-3 | W-1 | 12 | Rectangle | 3.7 |
| Ex. 72 | Aa-15 | Ab-37 | S-3/S-2 (90/10) | Y-70 | N-10 | W-2 | 22 | Rectangle | 5.3 |
| Ex. 73 | Aa-15 | Ab-21 | S-3/S-2 (90/10) | Y-70 | N-10 | W-2 | 19 | Rectangle | 4.8 |
| Ex. 74 | Aa-13 | Ab-97 | S-1/S-2 (90/10) | B-149 | N-5 | W-4 | 18 | Rectangle | 4.6 |
| Ex. 75 | Aa-39 | Ab-97 | S-1/S-2 (90/10) | B-149 | N-5 | W-4 | 16 | Rectangle | 4.3 |
| Ex. 76 | Aa-28 | Ab-97 | S-1/S-2 (90/10) | B-149 | N-5 | W-4 | 13 | Rectangle | 3.9 |
| Ex. 77 | Aa-42 | Ab-96 | S-1/S-2 (50/50) | B-45 | N-8 | W-4 | 11 | Rectangle | 3.6 |
| Ex. 78 | Aa-44 | Ab-167 | S-1/S-4 (80/20) | Y-61 | N-10 | W-3 | 25 | Rectangle | 5.6 |
| *[5]Ex. 79 | Aa-46 | Ab-253 | S-2/S-4 (90/10) | — | N-7 | W-4 | 23 | Rectangle | 5.4 |
| *[5]Ex. 80 | Aa-47 | Ab-238 | S-3/S-4 (80/20) | — | N-3 | W-3 | 20 | Rectangle | 4.9 |
| Ex. 81 | Aa-65 | Ab-120 | S-1/S-3 (70/30) | Y-5 | N-8 | W-3 | 10 | Rectangle | 3.4 |
| Ex. 82 | Aa-66 | Ab-120 | S-1/S-3 (70/30) | Y-5 | N-8 | W-3 | 10 | Rectangle | 3.1 |
| *[1]Ex. 83 | Aa-50 | Ab-275 | S-1/S-2 (80/20) | B-182 | N-10 | W-3 | 13 | Rectangle | 3.5 |
| *[1]Ex. 84 | Aa-51 | Ab-276 | S-1/S-2 (70/30) | B-182 | N-9 | W-1 | 12 | Rectangle | 4.0 |
| Ex. 85 | Aa-52 | Ab-276 | S-1/S-2 (60/40) | B-181 | N-7 | W-2 | 16 | Rectangle | 3.8 |
| Ex. 86 | Aa-53 | Ab-270 | S-1/S-2 (90/10) | B-121 | N-8 | W-2 | 15 | Rectangle | 3.6 |
| Ex. 87 | Aa-54 | Ab-273 | S-1/S-2 (70/30) | B-179 | N-4 | W-4 | 14 | Rectangle | 4.1 |
| Ex. 88 | Aa-60 | Ab-277 | S-1/S-2 (50/50) | B-180 | N-3 | W-2 | 17 | Rectangle | 4.2 |
| *[1]Ex. 89 | Aa-62 | Ab-275 | S-1/S-2 (80/20) | B-124 | N-5 | W-3 | 12 | Rectangle | 3.6 |
| *[1]Ex. 90 | Aa-63 | Ab-274 | S-1/S-2 (90/10) | B-183 | N-10 | W-1 | 13 | Rectangle | 3.9 |
| *[1]Ex. 91 | Aa-67 | Ab-280 | S-1/S-2 (70/30) | B-122 | N-8 | W-1 | 15 | Rectangle | 3.3 |
| *[1]Ex. 92 | Aa-68 | Ab-275 | S-1/S-2 (80/20) | B-182 | N-10 | W-4 | 16 | Rectangle | 3.8 |
| *[1]Ex. 93 | Aa-69 | Ab-282 | S-1/S-2 (60/40) | B-119 | N-3 | W-4 | 15 | Rectangle | 3.5 |
| Ex. 94 | Aa-70 | Ab-281 | S-1/S-2 (80/20) | B-121 | N-10 | W-3 | 13 | Rectangle | 3.2 |

TABLE 4-continued

| | Resist composition | | | | | | Evaluation result | | |
|---|---|---|---|---|---|---|---|---|---|
| | Resin (Aa) (5 mass %) | Resin (Ab) (58 mass %) | Solvent (mass ratio) | Photoacid generator (35 mass %) | Basic compound (2 mass %) | Surfactant (0.01 mass %) | Sensitivity (mJ/cm)$^2$ | Pattern shape | LER (nm) |
| *[3]Comp. Ex. 5 | — | Ab-14 | S-1/S-2 (80/20) | B-119 | N-10 | W-4 | 30 | Taper | 7.1 |
| Comp. Ex. 6 | Aa'-1 | Ab-120 | S-1/S-3 (70/30) | Y-5 | N-8 | W-3 | 34 | Taper | 7.7 |
| Comp. Ex. 7 | Aa'-2 | Ab-120 | S-1/S-3 (70/30) | Y-5 | N-8 | W-3 | 32 | Taper | 7.5 |
| *[5]Comp. Ex. 8 | Aa'-3 | Ab-245 | S-2/S-1 (90/10) | — | N-7 | W-1 | 33 | Taper | 7.3 |

*[1]In the soln. preparation of Examples 60, 83, 84, and 89 to 93, resin (Aa) was used in an amt. of 10 mass % and resin (Ab) in an amt. of 53 mass %.
*[2]In the soln. preparation of Example 61, resin (Aa) was used in an amt. of 20 mass % and resin (Ab) in an amt. of 43 mass %.
*[3]In the soln. preparation of Comp. Ex. 5, resin (Ab) was used in an amt. of 63 mass %.
*[4]In the soln. preparation of Examples 50 and 51, resin (Ab) was used in an amt. of 83 mass % and photoacid generator in an amt. of 10 mass %.
*[5]In the soln. preparation of Examples 52, 53, 62 to 67, 79 and 80 and Comp. Ex. 8, resin (Ab) was used in an amt. of 93 mass %.

As apparent from Table 4, the compositions of the Examples excelled the compositions of the Comparative Examples in all of the sensitivity, pattern shape and LER.

It is apparent from the foregoing results that the pattern forming method in which use is made of the composition of the present invention can find appropriate application in the lithography process employed in the manufacturing of various electronic devices, such as semiconductor elements and recording media.

With the use of the composition of the present invention, a favorable negative pattern could be obtained by applying butyl acetate being an organic solvent as a developer in place of an alkali developer.

What is claimed is:

1. An actinic-ray- or radiation-sensitive resin composition comprising:

a resin (Aa) containing at least one repeating unit (Aa1) derived from monomers of general formula (aa1-1) below and at least one repeating unit (Aa2) derived from monomers of general formula (aa2-1) below, the content of the resin (Aa) being in the range of 0.01 to 20 mass % based on the total solids of the composition;

a resin (Ab) that when acted on by an acid, changes its alkali solubility, the resin (Ab) comprising a repeating unit containing a phenolic hydroxyl group; and a compound that when exposed to actinic rays or radiation, generates an acid, (aa1-1)

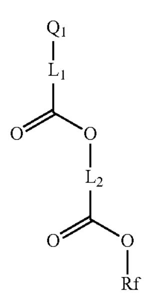

-continued (aa2-1)

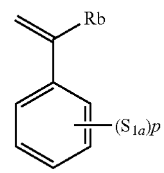

in general formula (aa1-1), $Q_1$ represents an organic group containing a polymerizable group, each of $L_1$ and $L_2$ independently represents a single bond or a bivalent connecting group, and Rf represents an organic group containing a fluorine atom, and in general formula (aa2-1), Rb represents a hydrogen atom, an optionally substituted alkyl group, or a halogen atom, $S_{1a}$, represents a group selected from the group consisting of an alkyl group, a cycloalkyl group, an alkoxy group, an acyl group, an acyloxy group, a halogen atom, a cyano group, an organic group containing a silicon atom, an aryl group, an aryloxy group, an aralkyl group, an aralkyloxy group, a hydroxyl group, a nitro group, a sulfonylamino group, an alkylthio group, an arylthio group and an aralkylthio group, or represents a group resulting from bonding of the selected group to a bivalent connecting group, provided that when two or more S1as exist, the S1as may be identical to or different from each other, and p is an integer of 0 to 5.

2. The composition according to claim 1, wherein the resin (Aa) contains at least one of repeating units of general formulae (aa1-2-1) and (aa1-3-1) below as the repeating unit (Aa1) derived from monomers of general formula (aa1-1) above, (aa1-2-1)

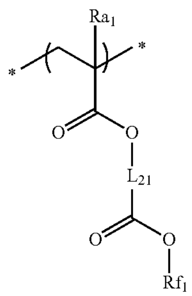

(aa1-3-1)

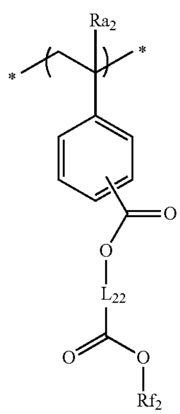

in general formulae (aa1-2-1) and (aa1-3-1), each of $Ra_1$ and $Ra_2$ independently represents a hydrogen atom or an alkyl group, each of $L_{21}$ and $L_{22}$ independently represents a single bond or a bivalent connecting group, and each of $Rf_1$ and $Rf_2$ independently represents an organic group containing a fluorine atom.

3. The composition according to claim 1, wherein the resin (Aa) contains at least one of repeating units of general formulae (aa1-2-2) and (aa1-3-2) below as the repeating unit (Aa1) derived from monomers of general formula (aa1-1) above, (aa1-2-2)

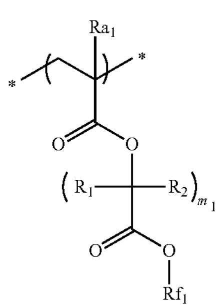

-continued (aa1-3-2)

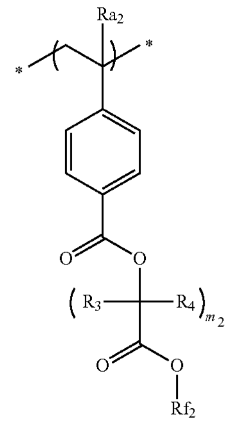

in general formulae (aa1-2-2) and (aa1-3-2), each of $Ra_1$ and Ra2 independently represents a hydrogen atom or an alkyl group, each of $R_1$, $R_2$, $R_3$ and $R_4$ independently represents a hydrogen atom or an alkyl group, each of $m_1$ and $m_2$ independently is an integer of 0 to 5, and each of $Rf_1$ and $Rf_2$ independently represents an organic group containing a fluorine atom.

4. The composition according to claim 1, wherein the resin (Aa) contains at least one of repeating units of general formulae (aa1-2-3) and (aa1-3-3) below as the repeating unit (Aa1) derived from monomers of general formula (aa1-1) above, (aa1-2-3)

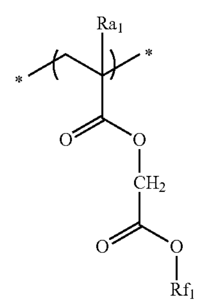

(aa1-3-3)

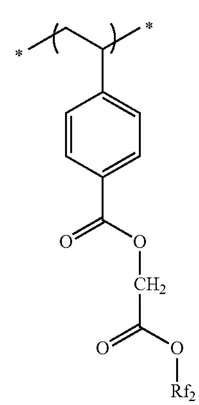

in general formulae (aa1-2-3) and (aa1-3-3), $Ra_1$ represents a hydrogen atom or a methyl group, and each of $Rf_1$ and $Rf_2$ independently represents an organic group containing a fluorine atom.

5. The composition according to claim 1, wherein in general formula (aa2-1) above, Rb represents a hydrogen atom; $S_{1a}$ represents an optionally substituted alkyl group, an organic group containing a silicon atom, or a halogen atom; and p is an integer of 1 to 5.

6. The composition according to claim 1, wherein in general formula (aa2-1) above, $S_{1a}$ represents an alkyl group, an alkyl group substituted with a halogen atom or an organic group containing a silicon atom.

7. The composition according to claim 1, wherein in general formula (aa2-1) above, S1a represents an alkyl group or any of groups of general formula (S-1) below, (S-1)

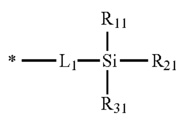

in which each of $R_{11}$, $R_{21}$ and $R_{31}$ independently represents an alkyl group, and $L_1$ represents a single bond or a bivalent connecting group.

8. The composition according to claim 1, wherein the resin (Ab) comprises a repeating unit (B) containing a structural moiety that when exposed to actinic rays or radiation, generates an acid.

9. The composition according to claim 1, wherein the resin (Ab) comprises at least one of repeating units (A) of general formula (A) below, (A)

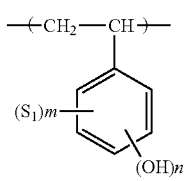

in which n is an integer of 1 to 5, and m is an integer of 0 to 4 satisfying the relationship $1 \leq m+n \leq 5$, and $S_1$ represents a group selected from the group consisting of an alkyl group, an alkoxy group, an acyl group, an acyloxy group, an aryl group, an aryloxy group, an aralkyl group, an aralkyloxy group, a hydroxyl group, a halogen atom, a cyano group, a nitro group, a sulfonylamino group, an alkylthio group, an arylthio group and an aralkylthio group, provided that when m is 2 or greater, two or more $S_1$s may be identical to or different from each other.

10. The composition according to claim 9, wherein the resin (Ab) comprises at least a repeating unit of formula below as the at least one of repeating units (A) of general formula (A) above.

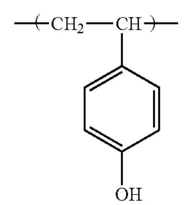

11. The composition according to claim 1, wherein the resin (Aa) is contained in an amount of 0.01 to 20 mass % based on total solids of the composition.

12. The composition according to claim 11, wherein the resin (Aa) is contained in an amount of 0.01 to 10 mass % based on total solids of the composition.

13. The composition according to claim 12, wherein the resin (Aa) is contained in an amount of 0.01 to 5 mass % based on total solids of the composition.

14. The composition according to claim 1, wherein the resin (Ab) comprises at least one of repeating units of general formulae (A1) and (A2) below, (A1)

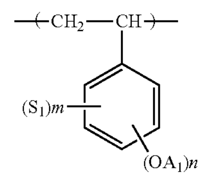

(A2)

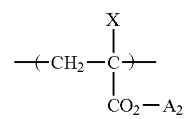

in general formula (A1)

n is an integer of 1 to 5, and m is an integer of 0 to 4 satisfying the relationship $1 \leq m+n \leq 5$, $S_1$ represents a group selected from the group consisting of an alkyl group, an alkoxy group, an acyl group, an acyloxy group, an aryl group, an aryloxy group, an aralkyl group, an aralkyloxy group, a hydroxyl group, a halogen atom, a cyano group, a nitro group, a sulfonylamino group, an alkylthio group, an arylthio group and an aralkylthio group, provided that when m is 2 or greater, two or more $S_1$s may be identical to or different from each other, and $A_1$ represents a hydrogen atom or a group that when acted on by an acid, is cleaved, provided that at least one $A_1$ represents a group that when acted on by an acid, is cleaved, and that when n is 2 or greater, two or more $A_1$s may be identical to or different from each other, and in general formula (A2)

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group or an aralkyl group, and $A_2$ represents a group that when acted on by an acid, is cleaved.

15. The composition according to claim 14, wherein the resin (Ab) comprises any of groups of formula —$C(L_1)(L_2)$-O—$Z_2$ as the group that when acted on by an acid, is cleaved, in which each of $L_1$ and $L_2$ independently represents a hydrogen atom, an alkyl group, a cycloalkyl group or an aralkyl group, and $Z_2$ represents an alkyl group, a cycloalkyl group or an aralkyl group, provided that $Z_2$ and $L_1$ may be bonded to each other to thereby form a 5-membered or 6-membered ring.

16. The composition according to claim 14, wherein the resin (Ab) comprises any of repeating units of general formula (A1).

17. An actinic-ray- or radiation-sensitive film formed from the composition according to claim 1.

18. A method of forming a pattern, comprising forming the composition according to claim 1 into a film, exposing the film to light, and developing the exposed film.

19. The method according to claim 18, wherein the exposure is performed using EUV.

20. An actinic-ray- or radiation-sensitive resin composition comprising:

a resin (Aa) containing at least one repeating unit (Aa1) derived from monomers of general formula (aa1-1) below and at least one repeating unit (Aa2) derived from monomers of general formula (aa2-1) below;

a resin (Ab) that when acted on by an acid, changes its alkali solubility; and a compound that when exposed to actinic rays or radiation, generates an acid, (aa1-1)

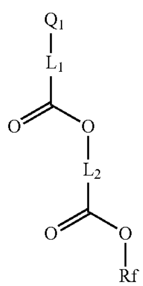

(aa2-1)

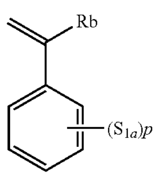

in general formula (aa1-1), $Q_1$ represents an organic group containing a polymerizable group, each of $L_1$ and $L_2$ independently represents a single bond or a bivalent connecting group, and Rf represents an organic group containing a fluorine atom, and in general formula (aa2-1), Rb represents a hydrogen atom, an optionally substituted alkyl group, or a halogen atom, $S_{1a}$ represents any of groups of general formula (S-1) below and when two or more $S_{1a}$s exist, the $S_{1a}$s may be identical to or different from each other, and p is an integer of 0 to 5, (S-1)

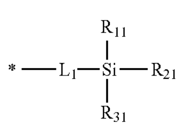

in which each of $R_{11}$, $R_{21}$ and $R_{31}$ independently represents an alkyl group, and $L_1$ represents a single bond or a bivalent connecting group.

21. An actinic-ray- or radiation-sensitive resin composition comprising:

a resin (Aa) containing at least one repeating unit (Aa1) derived from monomers of general formula (aa1-1) below and at least one repeating unit (Aa2) derived from monomers of general formula (aa2-1) below, and a resin (Ab) that when acted on by an acid, changes its alkali solubility, the resin (Ab) comprising a repeating unit (B) containing a structural moiety that when exposed to actinic rays or radiation, generates an acid, (aa1-1)

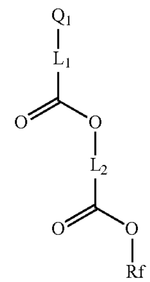

(aa2-1)

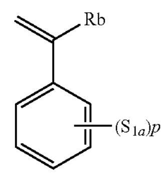

in general formula (aa1-1), $Q_1$ represents an organic group containing a polymerizable group, each of $L_1$ and $L_2$ independently represents a single bond or a bivalent connecting group, and Rf represents an organic group containing a fluorine atom, and in general formula (aa2-1), Rb represents a hydrogen atom, an optionally substituted alkyl group, or a halogen atom, $S_{1a}$ represents any of groups of general formula (S-1) below and when two or more $S_{1a}$s exist, the $S_{1a}$s may be identical to or different from each other, and p is an integer of 0 to 5, (S-1)

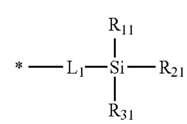

in which each of $R_{11}$, $R_{21}$ and $R_{31}$ independently represents an alkyl group, and $L_1$ represents a single bond or a bivalent connecting group.

22. An actinic-ray- or radiation-sensitive resin composition comprising:

a resin (Aa) containing at least one repeating unit (Aa1) derived from monomers of general formula (aa1-1) below and at least one repeating unit (Aa2) derived from monomers of general formula (aa2-1) below, the content of the resin (Aa) being in the range of 0.01 to 20 mass % based on the total solids of the composition; and a resin (Ab) that when acted on by an acid, changes its alkali solubility, the resin (Ab) comprising a repeating unit (B) containing a structural moiety that when exposed to actinic rays or radiation, generates an acid, (aa1-1)

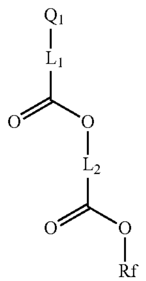

(aa2-1)

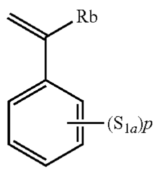

in general formula (aa1-1), $Q_1$ represents an organic group containing a polymerizable group, each of $L_1$ and $L_2$ independently represents a single bond or a bivalent connecting group, and Rf represents an organic group containing a fluorine atom, and in general formula (aa2-1), Rb represents a hydrogen atom, an optionally substituted alkyl group, or a halogen atom, $S_{1a}$ represents a group selected from the group consisting of an alkyl group, a cycloalkyl group, an alkoxy group, an acyl group, an acyloxy group, a halogen atom, a cyano group, an organic group containing a silicon atom, an aryl group, an aryloxy group, an aralkyl group, an aralkyloxy group, a hydroxyl group, a nitro group, a sulfonylamino group, an alkylthio group, an arylthio group and an aralkylthio group, or represents a group resulting from bonding of the selected group to a bivalent connecting group, and when two or more $S_{1a}$s exist, the $S_{1a}$s may be identical to or different from each other, and p is an integer of 0 to 5.

* * * * *